US005287511A

United States Patent [19]

Robinson et al.

[11] Patent Number: 5,287,511

[45] Date of Patent: Feb. 15, 1994

[54] ARCHITECTURES AND METHODS FOR DIVIDING PROCESSING TASKS INTO TASKS FOR A PROGRAMMABLE REAL TIME SIGNAL PROCESSOR AND TASKS FOR A DECISION MAKING MICROPROCESSOR INTERFACING THEREWITH

[75] Inventors: Jeffrey I. Robinson, New Fairfield, Conn.; Keith Rouse, Lebanon; Andrew J. Krassowski, Long Valley, both of N.J.; Terry F. Montlick, Bethlehem, Conn.

[73] Assignee: Star Semiconductor Corporation, Warren, N.J.

[21] Appl. No.: 776,161

[22] Filed: Oct. 15, 1991

Related U.S. Application Data

[63] Continuation-in-part of Ser. No. 217,616, Jul. 11, 1988, Pat. No. 5,068,823, and a continuation-in-part of Ser. No. 474,742, Jul. 10, 1989, and a continuation-in-part of Ser. No. 525,977, May 18, 1990, abandoned, and a continuation-in-part of Ser. No. 583,508, Sep. 17, 1990, and a continuation-in-part of Ser. No. 34,586, Mar. 22, 1993.

[51] Int. Cl.[5] .......................... G06F 9/44; G06F 9/45

[52] U.S. Cl. ............................ 395/700; 364/DIG. 2; 364/280.4; 364/281.3; 364/281.1

[58] Field of Search .............. 364/280.4, 231.3, 281.1; 395/700

[56] References Cited

U.S. PATENT DOCUMENTS

| | | | |
|---|---|---|---|
| 3,815,104 | 6/1974 | Goldman | 364/200 |
| 4,193,123 | 3/1980 | Meinke | 364/900 |
| 4,231,087 | 10/1980 | Hunsberger et al. | 364/200 |
| 4,315,313 | 2/1982 | Armstrong et al. | 371/16.2 |
| 4,371,952 | 2/1983 | Schuck | 371/16.1 |
| 4,410,984 | 10/1983 | Negi et al. | 371/16.1 |
| 4,414,665 | 11/1983 | Kimura et al. | 371/21.2 |
| 4,435,759 | 3/1984 | Baum | 364/200 |
| 4,439,839 | 3/1984 | Kneib et al. | 364/900 |
| 4,464,750 | 8/1984 | Tatematsu | 371/21.2 |
| 4,467,409 | 8/1984 | Potash et al. | 364/200 |
| 4,581,738 | 4/1986 | Miller et al. | 371/16.1 |
| 4,604,683 | 8/1986 | Russ et al. | 364/200 |
| 4,608,693 | 8/1986 | Baranyai et al. | 371/49.2 |
| 4,611,281 | 9/1986 | Suko et al. | 371/16.1 |
| 4,626,985 | 12/1986 | Briggs | 364/200 |
| 4,641,238 | 2/1987 | Kneib | 364/200 |
| 4,674,089 | 6/1987 | Poret et al. | 364/200 |
| 4,677,873 | 10/1984 | McCarley | 364/200 |
| 4,740,894 | 4/1988 | Lyon | 364/200 |
| 4,748,573 | 5/1988 | Saradrea et al. | 364/551 |
| 4,750,111 | 6/1988 | Crosby, Jr. et al. | 364/200 |

(List continued on next page.)

*Primary Examiner*—Gareth D. Shaw
*Assistant Examiner*—A. Katbab
*Attorney, Agent, or Firm*—David P. Gordon

[57] ABSTRACT

Architectures and methods are provided for efficiently dividing a processing task into tasks for a programmable real time signal processor (SPROC) and tasks for a decision-making microprocessor. The SPROC is provided with a non-interrupt structure where data flow is through a multiported central memory. The SPROC is also programmed in an environment which requires nothing more than graphic entry of a block diagram of the user's design. In automatically implementing the block diagram into silicon, the SPROC programming-/development environment accounts for and provides software connection and interfaces with a host microprocessor. The programming environment preferably includes: a high-level computer screen entry system which permits choosing, entry, parameterization, and connection of a plurality of functional blocks; a functional block cell library which provides source code representing the functional blocks; and a signal processor scheduler/compiler which uses the functional block cell library and the information entered into the high-level entry system to compile a program and to output source program code for a program memory and source data code for the data memory of the (SPROC), as well as a symbol table which provides a memory map which maps SPROC addresses to variable names which the microprocessor will refer to in separately compiling its program.

32 Claims, 13 Drawing Sheets

U.S. PATENT DOCUMENTS

| | | | |
|---|---|---|---|
| 4,783,782 | 11/1988 | Morton | 371/11.3 |
| 4,788,684 | 11/1988 | Kawaguchi et al. | 371/21.2 |
| 4,835,774 | 5/1989 | Ooshima et al. | 371/21.2 |
| 4,860,192 | 8/1989 | Sachs et al. | 364/200 |
| 4,868,785 | 9/1989 | Jordan et al. | 364/900 |
| 4,873,630 | 8/1989 | Rusterholz et al. | 364/200 |
| 4,888,772 | 12/1989 | Tanigawa | 371/21.2 |
| 4,965,718 | 10/1990 | George et al. | 364/200 |
| 4,967,340 | 10/1990 | Dawes | 364/200 |
| 4,985,830 | 1/1991 | Atac et al. | 364/200 |
| 5,031,111 | 7/1991 | Chao et al. | 364/491 |
| 5,042,000 | 8/1991 | Baldwin | 364/726 |
| 5,068,823 | 11/1991 | Robinson | 395/500 |
| 5,151,984 | 9/1992 | Newman et al. | 395/500 |

| CYCLE | 1 | 2 | 3 | 4 | 5 |
|---|---|---|---|---|---|
| gsp 1 | p-rd | | d-rd/wr (p-wr) BOOT MODE | | |
| gsp 2 | | p-rd | | d-rd/wr | |
| gsp 3 | | | p-rd | | d-rd/wr |
| gsp 4 | d-rd/wr | | | p-rd | |
| HOST/<br>ACCESSPORT/<br>SERIAL INPUTS/<br>SERIAL OUTPUTS/<br>da INPUT/<br>da OUTPUT | | d-rd/wr<br>d-rd/wr<br>d-wr<br>d-rd<br>d-wr<br>d-rd | | | p-rd/wr<br>p-rd/wr |

ARCHITECTURES AND METHODS FOR DIVIDING PROCESSING TASKS INTO TASKS FOR A PROGRAMMABLE REAL TIME SIGNAL PROCESSOR AND TASKS FOR A DECISION MAKING MICROPROCESSOR INTERFACING THEREWITH

RELATED PATENT APPLICATIONS

This is a continuation-in-part of copending Ser. No. 07/217,616 filed Jul. 11, 1988 now U.S. Pat. No. 5,068,823 issued Nov. 26, 1991 which is hereby incorporated by reference in its entirety herein.

This is a continuation-in-part of copending Ser. No. 07/474,742 (also PCT/US89/02986) filed Jul. 10, 1989 which is hereby incorporated by reference in its entirety herein.

This is a continuation-in-part of copending Ser. No. 07/525,977 filed May 18, 1990 now abandoned.

This is a continuation-in-part of copending Ser. No. 07/583,508 filed Sep. 17, 1990 which is hereby incorporated by reference in its entirety herein.

This is a continuation-in-part of copending Ser. No. 08/034,586 filed Mar. 2, 1993 which is hereby incorporated by reference in its entirety herein.

INDEX OF CONTENTS

Related Patent Applications

Background of the Invention

1. Field of the Invention
2. State of the Art

Summary of the Invention

Brief Description of the Drawings

Detailed Description of the Preferred Embodiments

Figure 1:
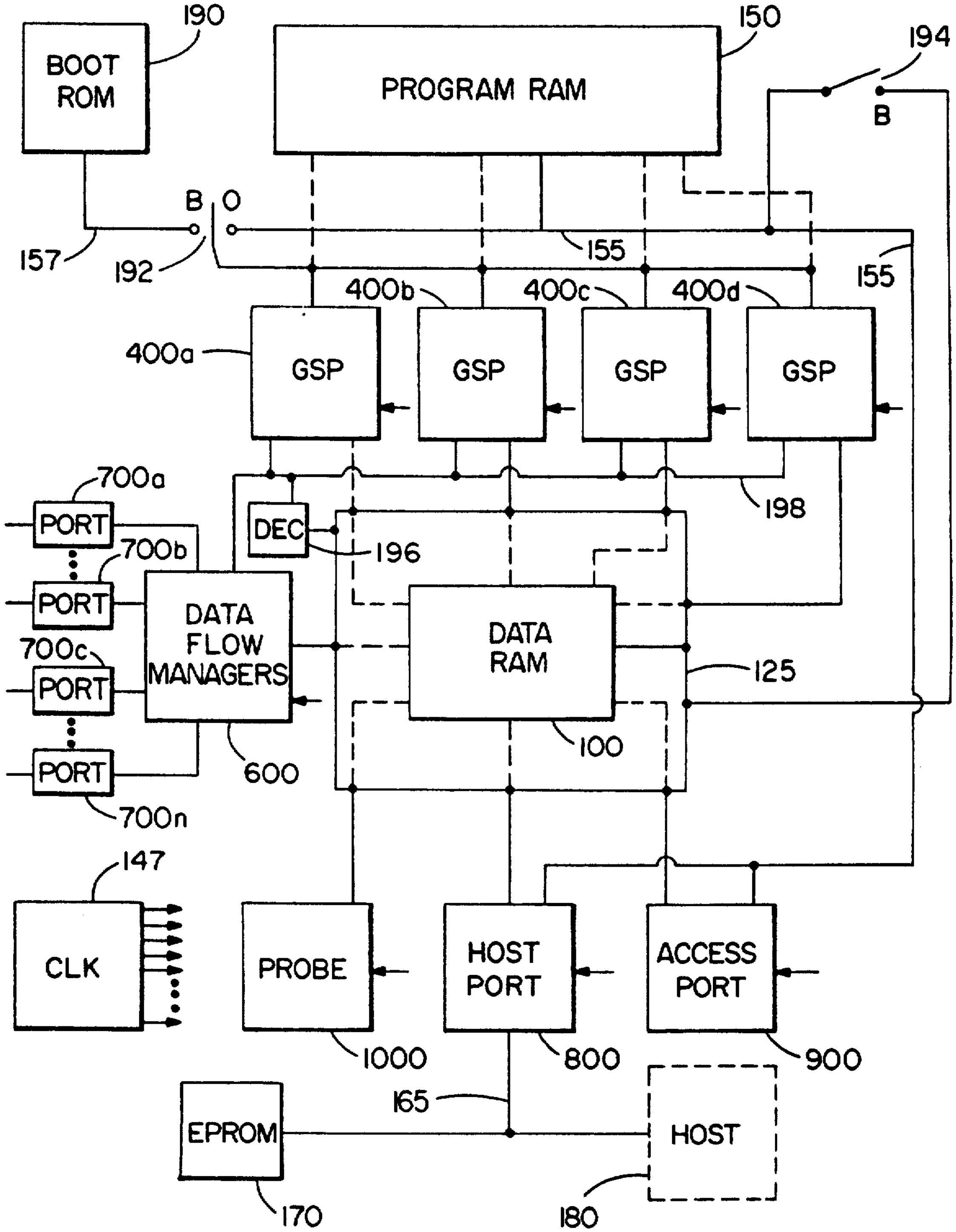

A. The Signal Processor (SPROC)
A.1 Functional description of The Parallel Port
A.2 Master SPROC Chip Read from Slave SPROC Chip or Peripheral
A.3 Master SPROC Chip Write to Slave SPROC Chip or Peripheral
A.4 Read from Slave SPROC Chip by an External Controller
A.5 Write to Slave SPROC Chip by an External Controller
A.6 Data Transfer Modes
A.7 Boot Mode
A.8 Watchdog Timer
A.9 Multiple I/O Lockout
A.10 Input/Output Flags and Lines
A.11 Parallel Port Registers
B. SPROC Development and Software
B.1 Overview
B.1.1 The SPROCcells Function Library
B.2 Entering a Diagram
B.3 Defining a Filter
B.4 Defining a Transfer Function
B.5 Converting a Block Diagram
B.6 The MakeSDL Module
B.7 The Schedule Module
B.8 The MakeLoad Module
B.9 Loading and Running a Design
B.10 Using the Micro Keyword
B.11 Using a Listing File
B.12 Using Subroutines
B.13 Using Time Zones
B.14 Summary
C. SPROC Description Language
C.1 Overview of SDL
C.2 Compiling SDL Files
C.3 Concepts and Definitions
C.4 Rules for Creating Asmblocks
C.5 Asmblock Structure
C.6 SPROC Chip Architecture, Instructions and Registers
D. The SPROC Compiler
E. The Microprocessor
E.1 SPROClink Microprocessor Interface
E.2 SMI Components
E.3 The Development Process
E.4 Input Requirements
E.5 Signal Processing Design Considerations
E.6 Embedded System Development Considerations
E.7 Using the SPROC Configuration File
E.8 Using the Symbol Translator
E.9 Using the SPROC C Function Library
E.10 Accessing SPROC Chip Memory Values
F. Low Frequency Impedance Analyzer Example

Claims

Abstract of the Disclosure

Appendix A—MakeSDL Source Code (pgs. 1-73)
Appendix B—Selections from SPROCcells Function Library Source Code (pgs. 1-17)
Appendix C—Symbol Translator Source Code (pgs. 1-26)
Appendix D—MakeLoad Source Code (pgs. 1-21)
Appendix E—SPROC Scheduler/Compiler Phantom Block Source Code (pgs. 1-22)
Appendix F—Program File yhpdual.spp Generated for FIG. 11 Example (pgs. 1-7)
Appendix G—Data File yhpdual.spd Generated for FIG. 11 Example (pgs. 1-27)
Appendix H—Symbol File yhpdual.sps Generated for FIG. 11 Example (pgs. 1-11)
Appendix I—Boot File hypdual.blk Generated for FIG. 11 Example (pgs. 1-8)
Appendix J—Maintest.c File Generated to Accompany FIG. 11 Example and for Compilation by Microprocessor (pgs. 1-7)
Appendix K—yhpdual.c File Generated by Symbol Translator for FIG. 11 Example (pgs. 1-3)
Appendix L—yhpdual.h File Generated by Symbol Translator for FIG. 11 Example (pgs. 1-6)
Appendix M—SPROC Scheduler/Compiler Source Code (pgs. 1-673)

SPROC, SPROCbox, SPROCboard, SPROCcells, SPROCdrive, SPROClab, and SPROClink are all trademarks of the assignee hereof

BACKGROUND OF THE INVENTION

1. Field of the Invention

The present invention generally relates to programmable real time signal processor devices and methods utilizing such devices. More particularly, the present invention relates to architectures and methods for efficiently dividing a processing task into tasks for a real time signal processor and tasks for a decision-making microprocessor, wherein the real time signal processor is programmable in an environment which accounts for and provides software connection and interfaces with a host microprocessor.

2. State of the Art

Digital signal processing has evolved from being an expensive, esoteric science used primarily in military applications such as radar systems, image recognition, and the like, to a high growth technology which is used in consumer products such as digital audio and the compact disk. Single chip digital signal processors (SCDSPs) were introduced in the early 1980's to specifically address these markets. However, SCDSPs are complex to design and use, and have significant performance limitations. In particular, SCDSPs are limited to a frequency spectrum from DC to the low tens of KHz. Moreover, most SCDSPs have other development environment and hardware performance problems which stem from their Von Neuman, microprocessor origins. In an attempt to overcome these limitations, attempts have been made to use parallel processors and math coprocessors. However, these "solutions" have required considerable expertise on the part of the software engineer and have typically yielded minimal gain; particularly in the real-time environment.

Generic signal processing based products can be segmented as shown in FIG. 1 and described as follows: analog input/output (I/O), and A/D and/or D/A conversion; signal conditioning and processing; sample rate decision processing; and logic, decision, and control processing. The analog interface (I/O) typically performs preamplification and anti-alias filtering prior to A/D conversion in the input direction, as well as D/A conversion, reconstitution filtering, and power amplification in the output direction. The signal conditioning and processing circuitry conducts precision signal processing functions such as filtering, amplification, rectification, etc., as well as fast Fourier transforms and the like. The sample rate decision circuitry includes window comparators, quantizers, companders, expanders, etc. which make simple logic decisions on each and every sample forwarded to it. Finally, the logic, decision, and control processing circuitry in the incoming direction uses the signals emerging from the signal conditioning and processing and the sample rate decision processing circuitry, and makes decisions to control external equipment in some useful manner. In order to control the external equipment, in the outgoing direction, the logic, decision, and control processing circuitry generates signals which require further signal processing to drive or interact with some analog device or equipment. In making decisions, the logic, decision, and control processing circuitry typically utilizes highly data dependent code which runs asynchronously from the signals it utilizes. Examples of such circuitry include speech and image recognition algorithms, disk drive controllers, speech generation algorithms, numerically controlled machine tool controllers, etc.

Based on the above break-down of tasks it can be seen that SCDSPs are called upon to do both of what may be termed "signal processing" and "logic processing". Signal processing is typically computationally intensive, requires low latency and low parasitic overhead for real time I/O, must efficiently execute multiple asynchronous deterministic processes, and be controllable. Real time signal processors are typically controllable processors which have very large I/O bandwidths, are required to conduct many millions of computations per second, and can conduct several processing functions in parallel. In contrast to signal processing, logic processing is usually memory intensive (as opposed to computationally intensive), must efficiently handle multiple interrupts (particularly in a multiprocessor system), and acts as a controller (as opposed to being controllable). A common type of logic processor is the microprocessor which relies on extensive decision oriented software to conduct its processes. This software is typically written in a high level language such as "C". The code often contains numerous "if . . . then . . . else" like constructs which can result in highly variable execution times which are readily dealt with in nonreal time applications, but present highly problematical scheduling problems for efficient real time systems.

Comparing the signal and logic processing requirements, it is seen that they are far from similar. Nevertheless, depending upon the circumstances, it is common for logic processors to be called upon to do signal processing, and vice versa. Since the microprocessor art is the older and more developed art, it is not surprising that the architectures of many DSPs have broadly borrowed from the architectures of the microprocessors. Thus, DSPs are often constructed as controllers having an interrupt structure. This type of architecture, however, is not properly suited for the primary functions of digital signal processing.

SUMMARY OF THE INVENTION

It is therefore the primary object of the invention to provide architectures and methods for efficiently dividing a processing task into tasks for a real time signal processor and tasks for a decision-making host microprocessor, wherein the real time signal processor is programmable in an environment which accounts for and provides connection and interfaces with the host microprocessor.

It is another object of the invention to provide a programmable, configurable, real time signal processor which is particularly suited to the requirements of signal processing and which conducts deterministic real time signal processing and interfaces with a microprocessor which conducts logic processing.

It is a further object of the invention to provide a graphic user interface system for a real time signal processor interfacing with a host microprocessor where the real time signal processor program is compiled separately from the program of the microprocessor but, as part of the compiling procedure provides a microprocessor-related file to the microprocessor which then translates the file and incorporates the translated file into its compilation, and thereby automatically provides for the signal processor - microprocessor interface.

Yet another object of the invention is to provide a user interface system incorporating a real time signal processor and a microprocessor which automatically share processing tasks in an efficient manner and which automatically compile and interface to accomplish the desired processing task.

In accord with the objects of the invention a development system for the microprocessor-interfacing signal processor is provided. For purposes of clarity and simplicity, the signal processor which interfaces with the microprocessor is referred to hereinafter as a SPROC (a trademark of the assignee hereof). Details of the SPROC are set forth in parent application Ser. No. 07/525,977. The development system (hereinafter referred to as SPROClab—a trademark of the assignee hereof) which is provided to permit a user to simply program and use the SPROC generally includes:

a high-level computer screen entry system (graphic user interface) which permits choosing, entry, parameterization, and connection of a plurality of functional blocks;

a functional block library which provides source code representing the functional blocks; and a signal processor compiler for incorporating the parameters of the functional blocks as variables into the functional block library code and for compiling the library code as well as other code which accounts for scheduling and functional block connection matters, etc., whereby the signal processor compiler outputs source program code for a program memory of the signal processor (SPROC), source data code for the data memory of the SPROC, and a symbol table which provides a memory map which maps variable names which the microprocessor will refer to in separately compiling its program to SPROC addresses.

Besides the symbol table which is used by the microprocessor for interfacing with the SPROC, the SPROClab preferably provides means for generating a boot file which is compatible for storage in the microprocessor and which is provided by the microprocessor to the SPROC in order to boot up the SPROC. In this manner, the microprocessor can act as the host for the SPROC.

Figure 10:
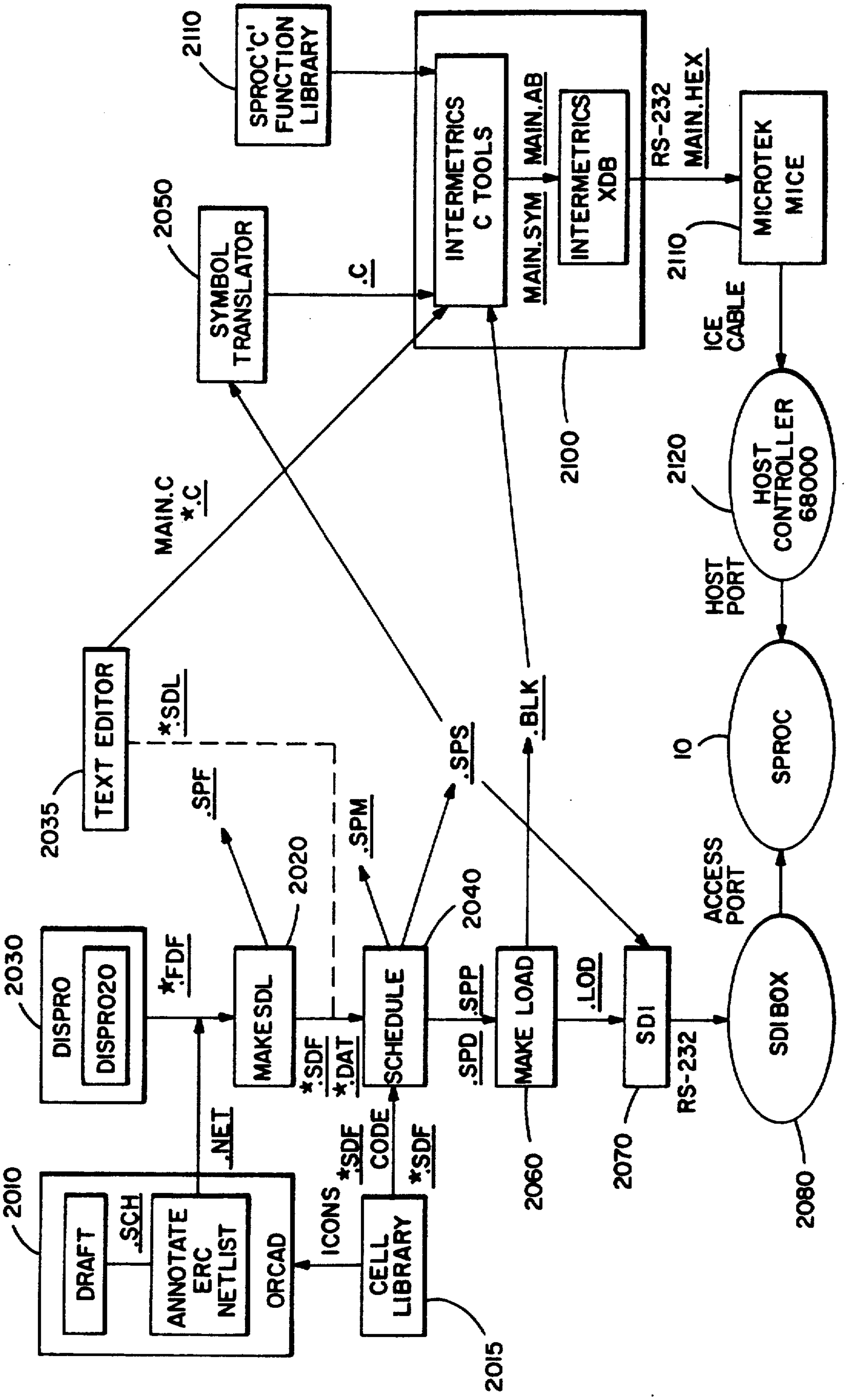

With the signal processing and logic processing aspects of tasks being divided (with the SPROC handling the signal processing, and the microprocessor handling the logic processing), the compiling of the SPROC and the microprocessor are handled separately. In order to accomplish the separate handling while still providing the graphic entry system, at least two schemes are provided. A first scheme effectively provides graphic entry for the signal processing circuit only. If desired, in the first scheme limited graphic entry for the microprocessor can be used to provide SPROC interfaces with the microprocessor (as shown in FIG. 10). With the first scheme, the user must provide suitable code for the microprocessor separately, and the symbol table generated by the SPROClab compiler is provided together with the code hand-generated by the user for microprocessor compiling. A second scheme permits graphic entry for both the signal processing and logic processing (microprocessor) circuits, and uses any of several methods for distinguishing between the two. Among the methods for distinguishing between which portion of the circuit is intended for signal processing and which for logic processing are: user entry (e.g., defining a block as block.spr or block.mic); hierarchical block entry which is programmed to allow entry of both logic processing and signal processing blocks; and the sample rate of the block (with slow sampling rates being handled by the microprocessor). Of course, if all blocks are predefined (i.e., are contained in a library), the precoded library code divides the code into code intended for the SPROC and code intended for the microprocessor. Regardless, where graphic entry for both signal processing and logic processing is permitted, the graphic entry eventually results in separate automatic compilation for both the SPROC and the microprocessor, with the SPROClab compiler again providing the necessary symbol table for incorporation during compilation of the microprocessor code.

Additional objects and advantages of the invention will become apparent to those skilled in the art upon reference to the detailed description taken in conjunction with the provided figures.

BRIEF DESCRIPTION OF THE DRAWINGS

Figure 2:
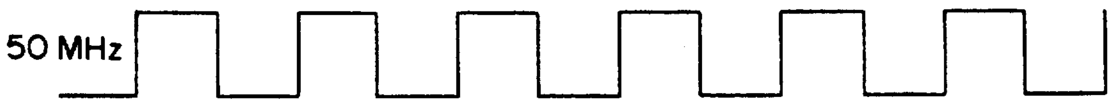
Figure 3A:
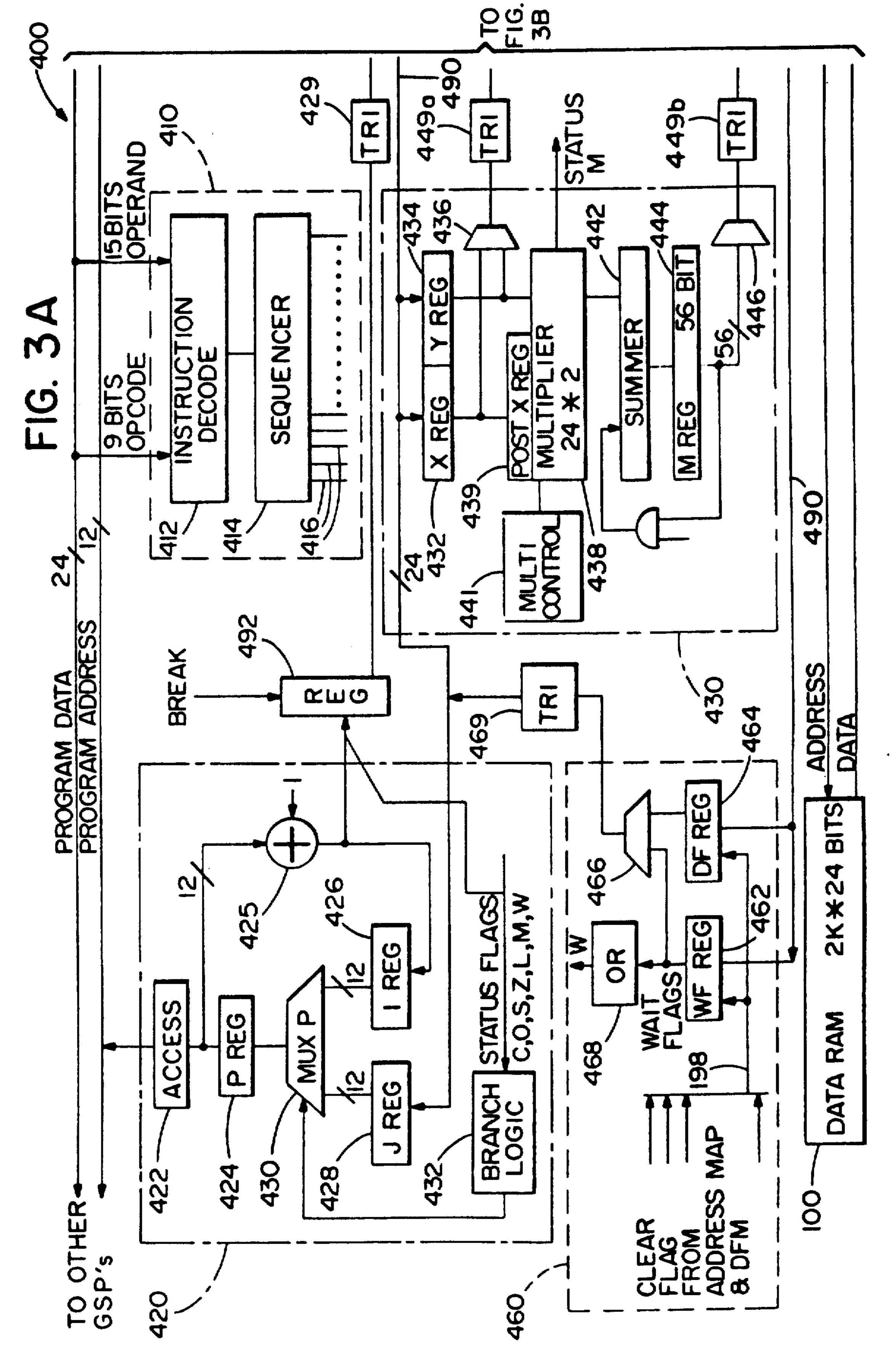
Figure 3B:
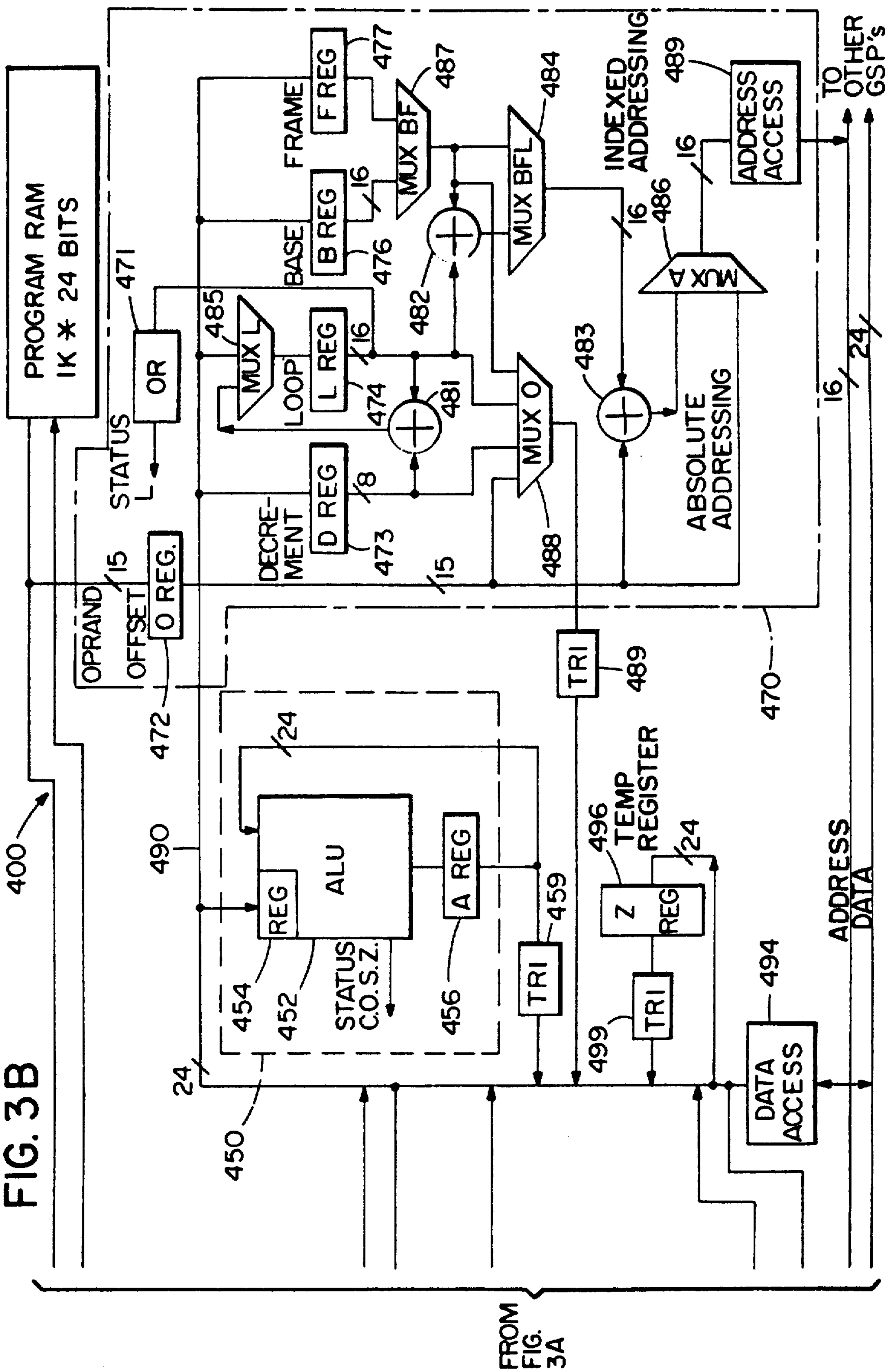
Figure 4A:
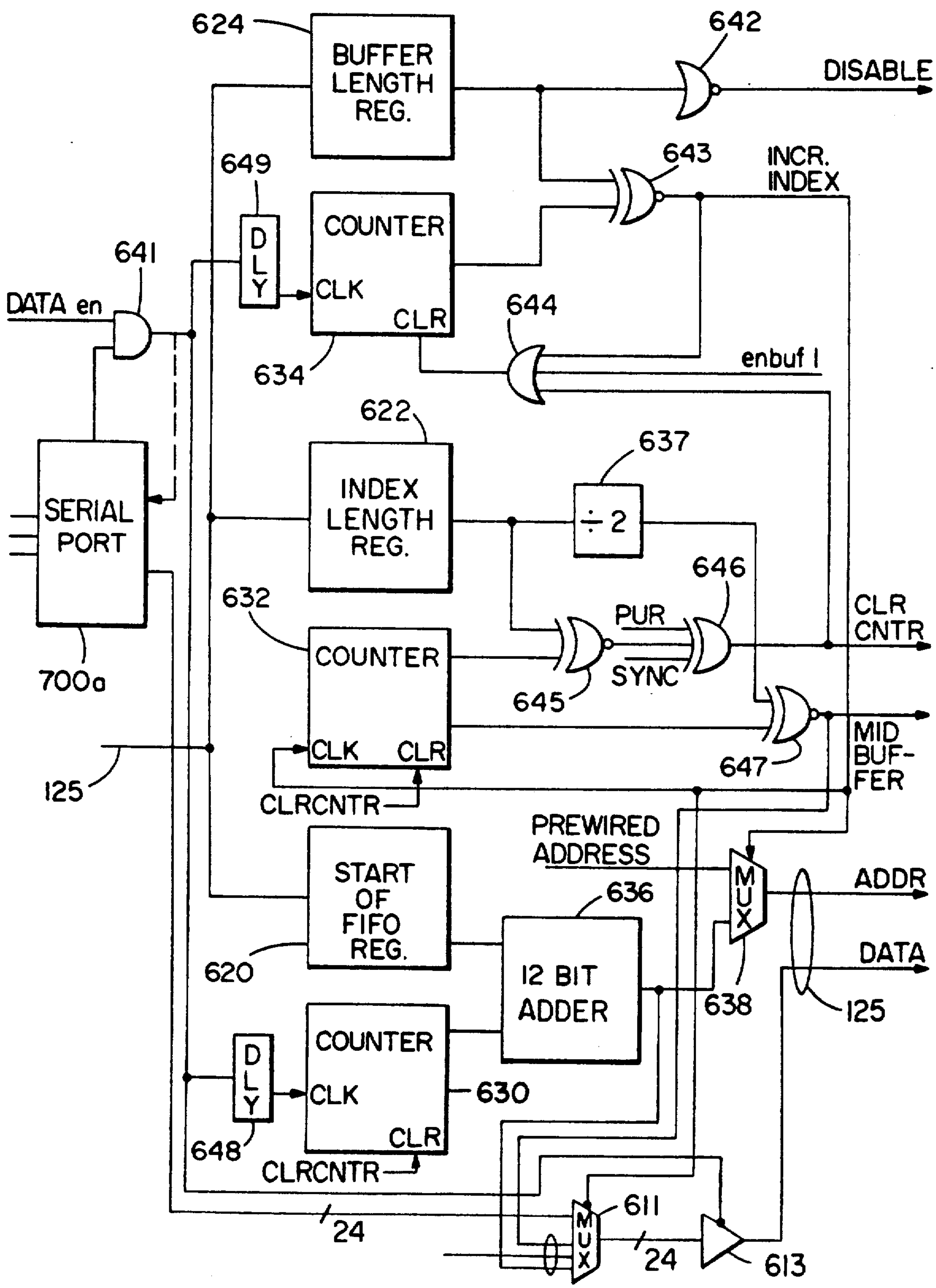
Figure 4B:
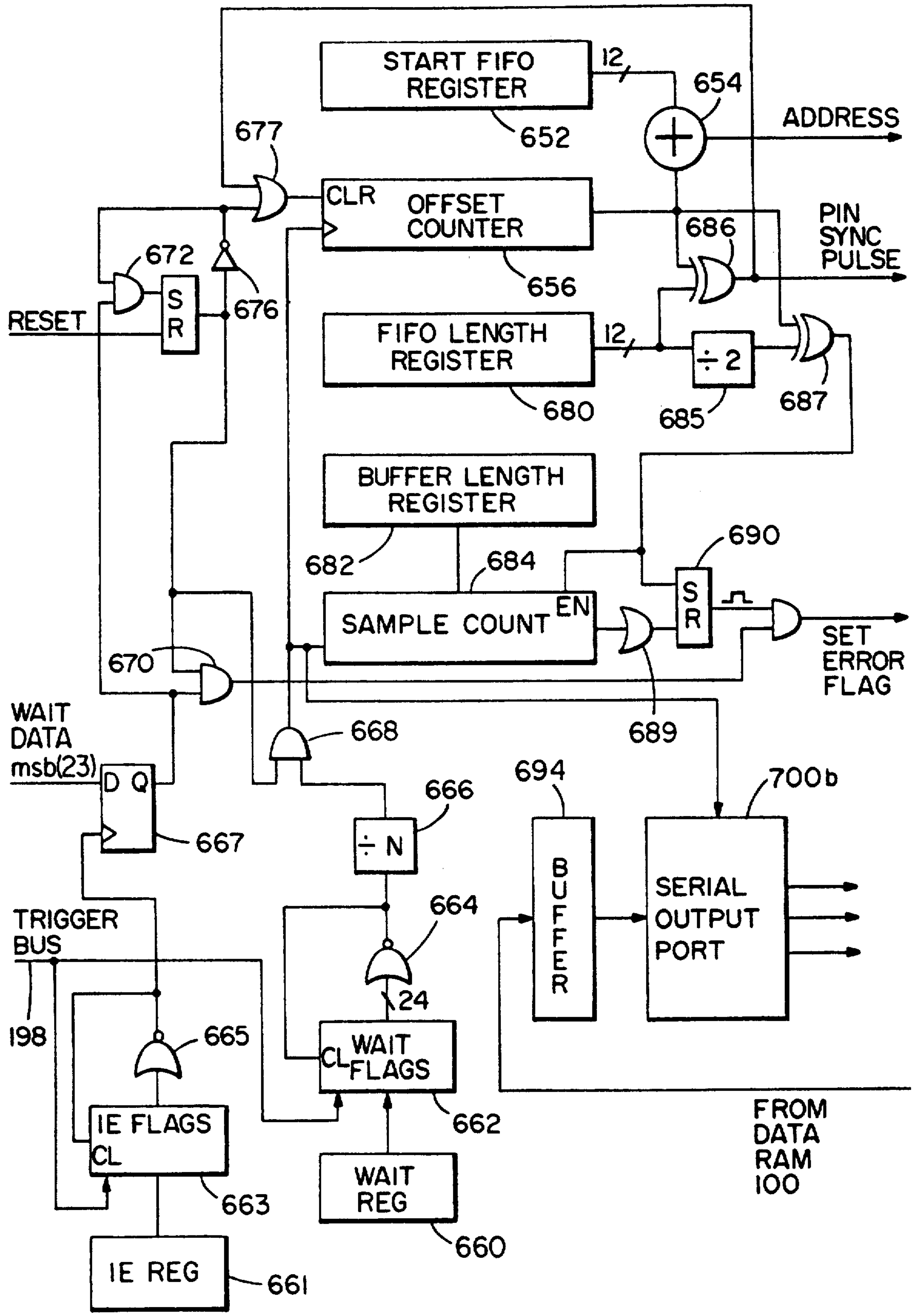
Figure 4C:
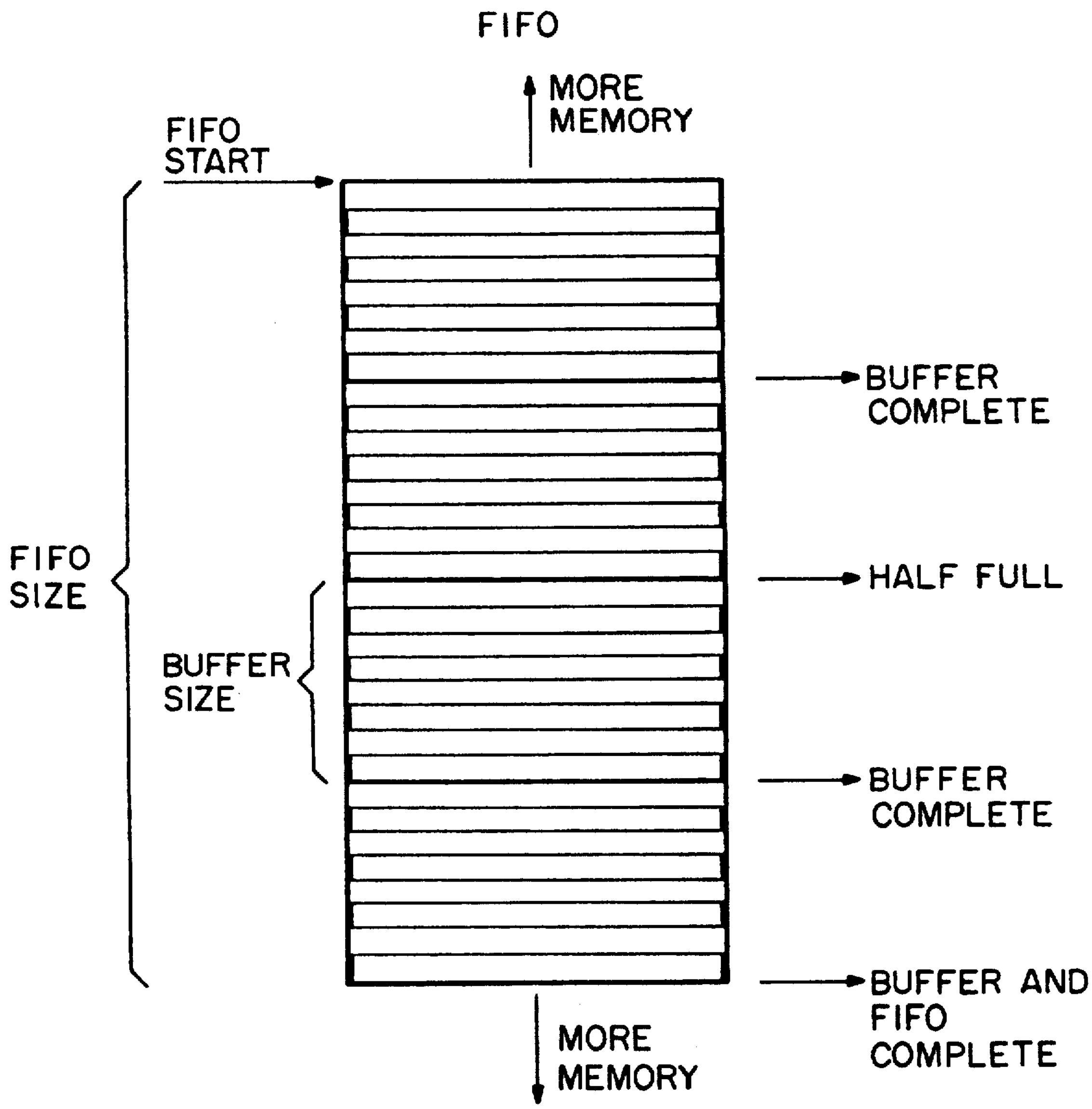
Figure 5A:
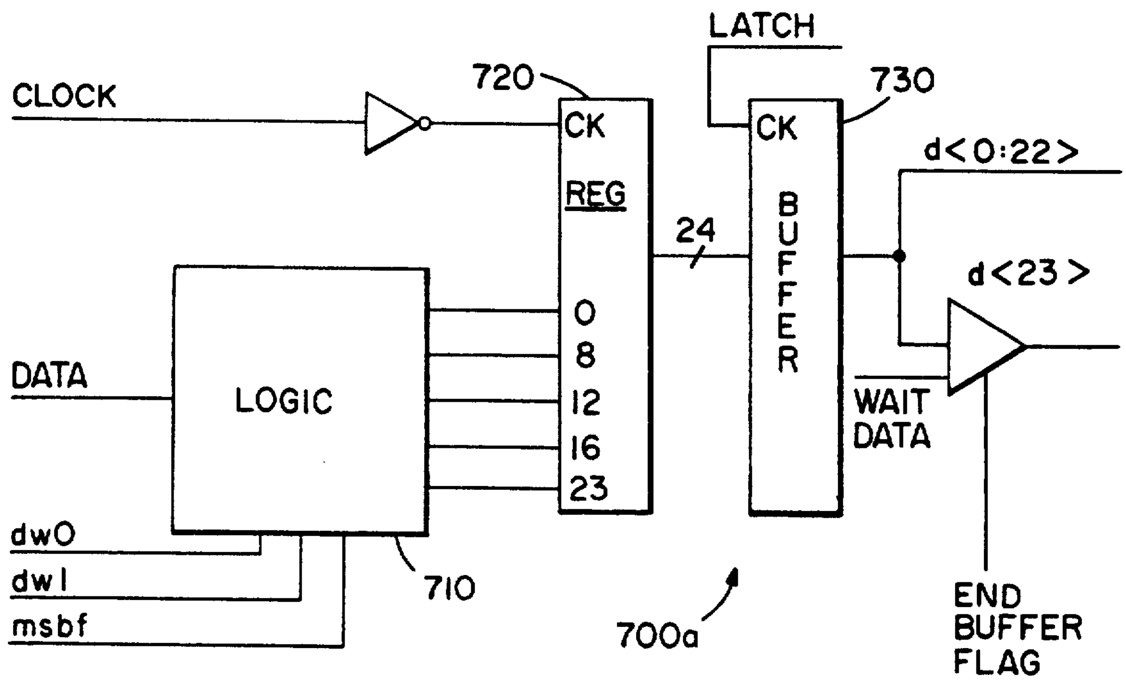
Figure 5B:
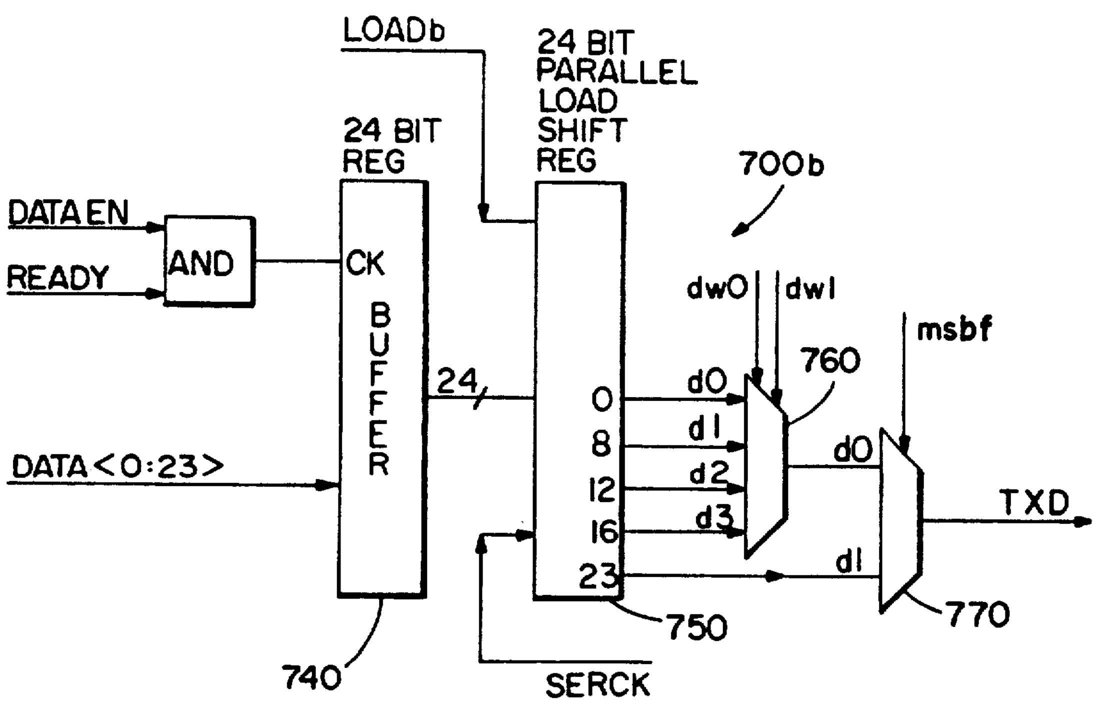
Figure 6:
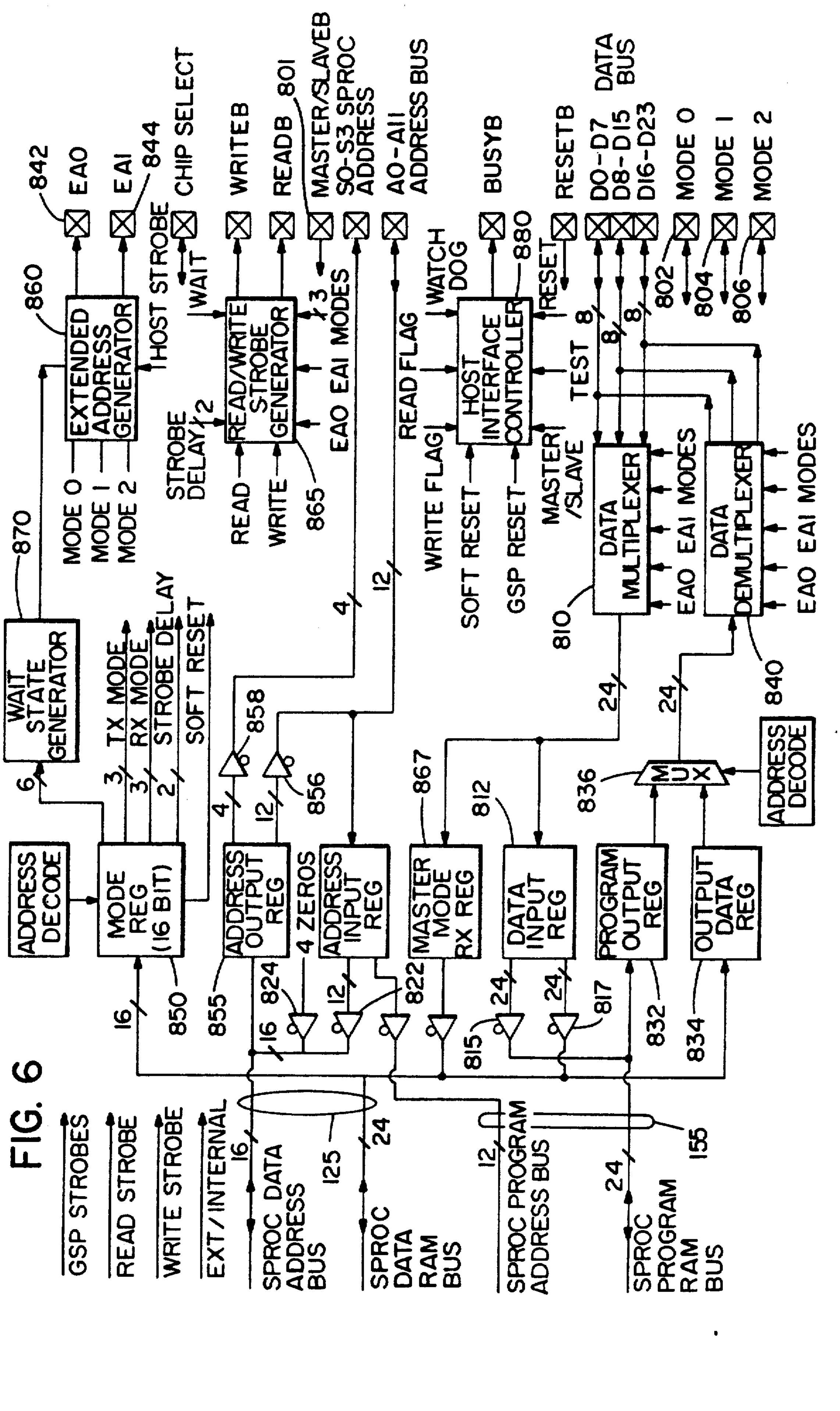
Figure 7:
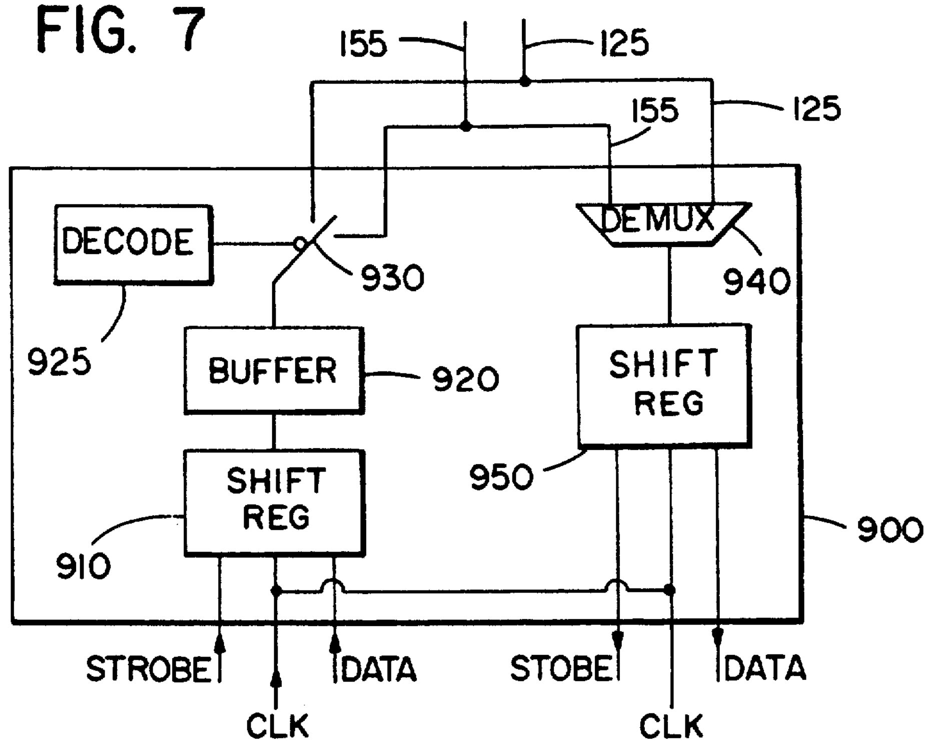
Figure 8:
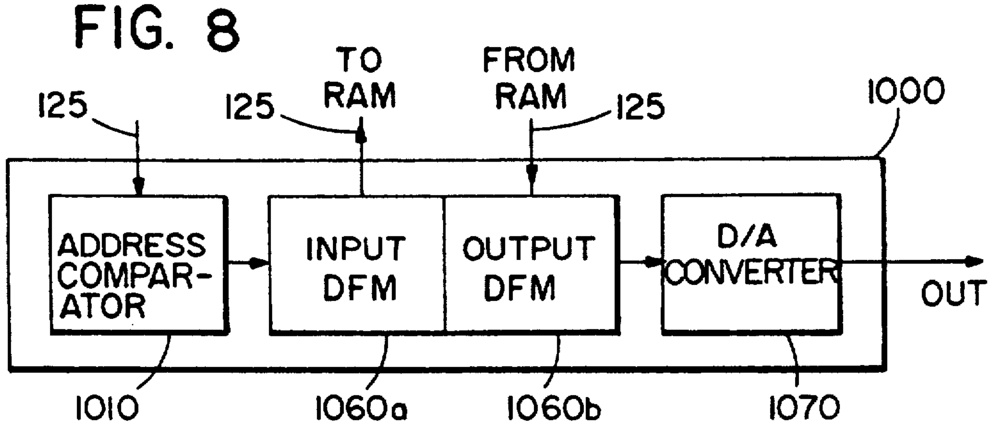
Figure 9:
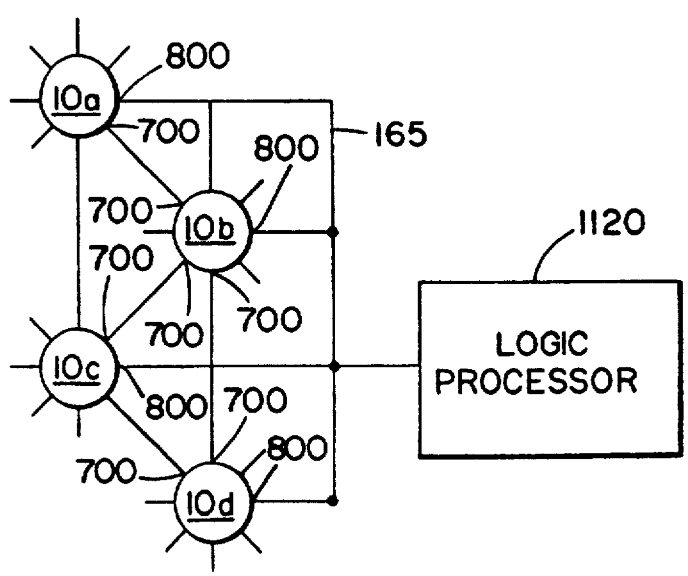

FIG. 1 is a high level block diagram of the SPROC device of the invention, and its connection to an external host or memory;

FIG. 2 is a timing diagram of the access of the various components and ports of the SPROC to the data RAM of the SPROC;

FIGS. 3*a* and 3*b* together comprise a block diagram of the internal processors of the SPROC device of the invention;

FIGS. 4*a* and 4*b* are block diagrams of the input and output sides of the data flow manager of the invention;

FIG. 4*c* is a representation of a FIFO which is implemented in the multiported data RAM, and which is utilized by the data flow manager of the invention;

FIGS. 5*a* and 5*b* are block diagrams of the serial input and serial output ports of the invention;

FIG. 6 is a simplified block diagram of the host port of the invention;

FIG. 7 is a block diagram of the access port of the invention;

FIG. 8 is a block diagram of the probe of the invention;

FIG. 9 is a simplified diagram illustrating the coupling of a plurality of SPROC devices of the invention into a system acting as the front end to a logic processor, FIG. 10 is a flow diagram of the development system of the invention where the SPROC code and microprocessor code are compiled separately.

Figure 11:
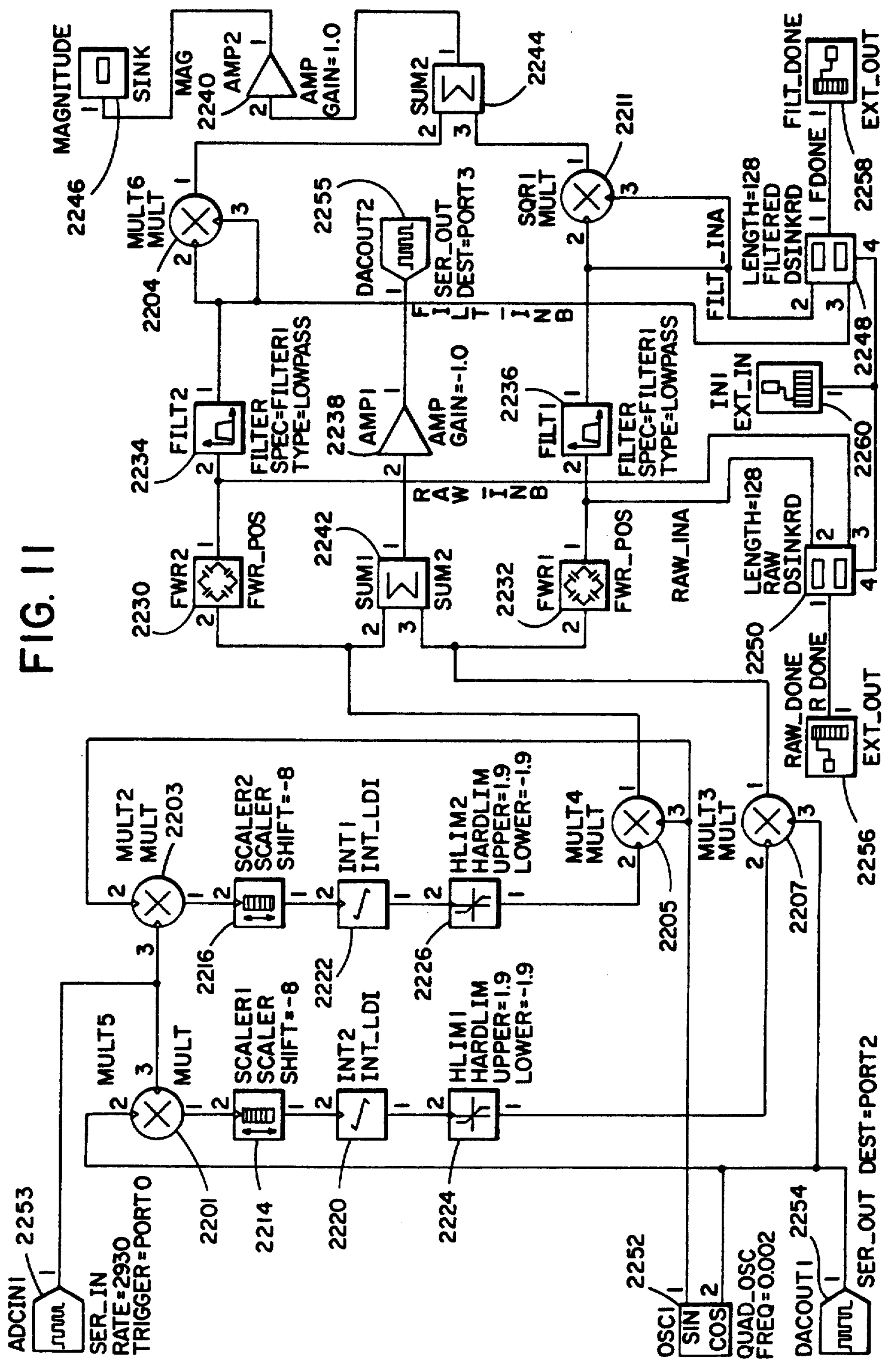
Figure 12:
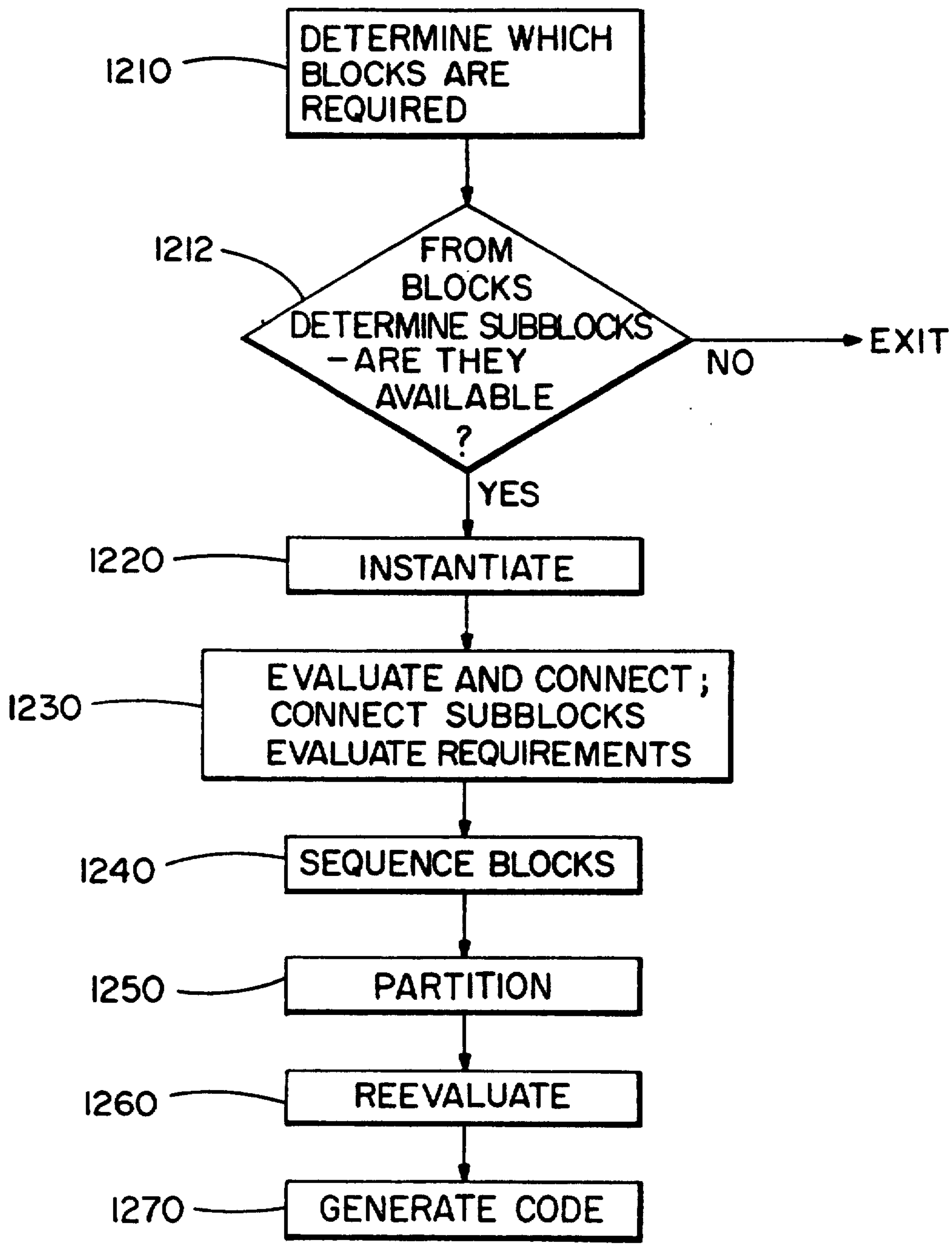

FIG. 11 is a block diagram of a low frequency impedance analyzer example entered into a graphic user entry system and programmed onto a SPROC for use in conjunction with a microprocessor; and FIG. 12 is a high level flow chart of the compiler utilized in the development system of the invention.

DETAILED DESCRIPTION OF THE PREFERRED EMBODIMENTS

A. The Signal Processor (SPROC)

A high level block diagram of the preferred SPROC subsystem 10 of the invention is seen in FIG. 1. The preferred SPROC 10 preferably includes: a central "multiported" (as broadly understood) data RAM 100 accessed via data RAM bus 125; a multiported program RAM 150 accessed via program RAM bus 155; a plurality of internal processors (GSP) 400 coupled to the data RAM bus 125 and the program RAM bus 155 and which perform general processing functions; a data flow manager (DFM) 600 which is coupled to the data RAM bus 125 and which generally controls the flow of data into and out of the SPROC and relieves the GSPs from dealing with that data flow; a plurality of serial data ports 700 coupled to the DFM 600; a host port 800 coupled to both the data RAM bus 125 and the program RAM bus 155, the host port serving to couple the SPROC via the host bus 165 to either an EPROM 170 in stand-alone mode or to a host processor 180 in host mode; an access port 900 coupled to both the data RAM bus 125 and the program RAM bus 155; a probe 1000 coupled to the data RAM bus 125; and an internal boot ROM 190 with boot ROM bus 157 coupled via switch 192 to a GSP 400, the boot ROM 190 being used to control a master SPROC 10 in start-up mode, as well as to control the GSPs 400 of a SPROC 10 when the GSPs are in break mode; and a flag generating decoder 196 coupled via flag bus 198 to the DFM 600 and the GSPs 400 for flagging the DFM and GSPs when particular addresses of the data RAM 100 are being addressed (as determined by values on the data RAM bus 125).

The SPROC 10 of the invention can function in several different modes, some of which are determined by externally set pins (not shown). In particular, the SPROC 10 has a boot mode, an operational mode, and a development mode which includes a "break" mode. In addition, the SPROC may be a master SPROC or a slave SPROC which is either coupled to a master SPROC (see FIG. 9) or a host 180 such as a microprocessor. In the boot mode (powering up), where the SPROC 10 is a master, the SPROC 10 is required to program both itself and any other slave SPROCs which might be part of the system. To do that, upon power up, switches 192 and 194 are toggled to connect to the B (boot) nodes. With switches 192 and 194 so set, the boot ROM is coupled to a GSP 400 such as GSP 400*a*, and the program RAM 150 is coupled to the data RAM bus 125. As boot ROM 190 is coupled to the GSP 400*a*, the GSP 400*a* is able to read the boot code in boot ROM 190. The code is arranged to cause the GSP to seize control of the host port 800 and to load information into the SPROC from EPROM 170 via the host port 800. The information contained in EPROM 170 includes the program code for the program RAM 150 (which is sent via data RAM bus 125), configuration information for the DFM 600 and the serial, host, and access ports 700, 800, 900, and parameter information including initialization information for the data RAM 100. This information, which was compiled by the development system of the invention (as discussed in more detail hereinafter) and stored in the EPROM, causes the SPROC to perform the desired functions on data typically received via serial ports 700.

In boot mode, after the master SPROC is programmed, the remaining (slave) SPROCs of the system (see FIG. 9) are programmed by having the master SPROC 10 read the EPROM 170 and forward the information via the common host bus 165 to the other SPROCs which reside in different address spaces. The slave SPROCs do not require a boot ROM for boot mode purposes, although the boot ROM 190 is also used to control the break mode operation of the SPROC (as described with reference to FIGS. 4).

After initialization is completed, boot mode is exited by the writing of a predetermined value (fOH) to a predetermined memory address (0401H) which causes switch 192 to toggle to node O (operation), and switch 194 to toggle to an open position. Then the SPROC is ready to operate for its intended signal processing purposes.

Although slave SPROCs may be programmed in boot mode by a master SPROC, a slave SPROC may also be programmed by a microprocessor host such as host 180 of FIG. 1. In slave mode where a host such as host 180 is coupled to the host bus 165, the internal boot ROM 190 is not active. In fact, switches 192 and 194 are set in the operating mode position. In order to program the SPROC, the host 180 preferably utilizes the host bus 165 and sends program data via host port 800, and program RAM bus 155 to the program RAM, and data RAM data via host port 800 and the data RAM bus 125 to the data RAM. Configuration information for the serial ports 700 and data flow manager 600, is sent by the host 180 via host port 800 and the data RAM bus 125 as hereinafter described. As will be described hereinafter with reference to the development system (SPROClab), where a microprocessor is the host for a SPROC, the program, data, and configuration information is typically generated by SPROClab in a microprocessor readable and storable format.

In operational mode, serial data flow into and out of the SPROC 10 is primarily through the serial ports 700, while parallel data flows through the host port 800. Serial data which is to be processed is sent into an input port 700 which is coupled to the data flow manager 600, which in turn forwards the data to appropriate locations (buffers) in the data RAM 100. In certain circumstances, described below, the DFM 600 will also write additional information to particular data RAM locations which are monitored by flag generating decoder 196. Decoder 196, in turn, causes the flags to be triggered over trigger or flag bus 198 as described in detail in previously incorporated U.S. Ser. No. 07/583,508. Other flags are triggered by pulsing hardware pins (not shown) via lines called "compute lines". The hardware pins are particularly useful in providing external timing information to the GSPs 400 and the DFM 600 of the SPROC.

Once the data has been sent to the data RAM 100, and typically after the GSPs 400 have been apprised via the flag bus 198 of the arrival of the information, the GSPs 400 can process the data. The processing of the data is conducted in accord with one or more programs stored in the multiported program RAM 150 which in turn represents the functions, topology, and parameters of a schematic diagram generated by the user of the development system. In processing the data, the GSPs 400 can read from and write to the data RAM 100. However, in order to shield the GSPs from I/O functions which would interrupt and burden the GSPs, the GSPs do not address each other directly, and do not read from or write to the DFM 600 or the input or output serial ports 700. Similarly, the GSPs do not have direct access to the host port 800 or the access port 900. Thus, in order for the processed data to be output from the SPROC 10, the processed data must be sent by the GSP 400 to the data RAM 100. The data in the data RAM is then either read by the DFM 600 and sent out serially via an output port 700, or is sent out over the host bus 165 in a parallel form via the host port 800.

The development mode of the SPROC device (which will be discussed in more detail hereinafter with reference to the development system) is used prior to the final programming of the EPROM 170 and is basically utilized in conjunction with a host 180. The development mode permits a user to easily and advantageously develop an integrated circuit signal processor by permitting the user access to the internals of the SPROC device. For example, if during a test operational mode it is desirable to obtain a data "dump" of the registers of the GSPs, the GSPs 400 can be flat into break mode by causing a GSP to write to memory address 406H. As a result of writing to that address, a decoder (not shown) causes switch 192 to toggle, and instructions from the break section of the boot ROM 190 are used by the GSP 400 via bus 157. While boot ROM 190 is coupled to the GSP 400 in this manner, the GSP runs a routine which causes each register of the GSP to dump its contents to predetermined locations in the data RAM 100. That data may then be accessed by the user and changed if desired via the access port 900 or host port 800. Then, the break section of boot ROM 190 reloads the data into the GSP, writes to memory address 407H, and another decoder (not shown) causes switch 192 to toggle again such that the program RAM 150 is coupled to GSP 400, and the program continues.

Other tools useful in the development mode of the SPROC device are the access port 900 and the probe 1000. The access port permits the user to make changes to the program held in program RAM 150, and/or changes to parameters stored in the program RAM 150 or the data RAM 100 while the SPROC is operating. The probe 1000, which is described in greater detail in previously incorporated U.S. Ser. No 07/663,395 permits the user to see internal signals generated by the SPROC in analog or digital form by monitoring the values of data written to any particular data RAM location. By using the access port 900 and the probe 1000 together, the effect of a change of a parameter value entered via the access port 900 may be immediately monitored by probe 1000.

Before turning to the details of each of the blocks which comprise FIG. 1, it should be appreciated that central to functioning of the SPROC is a multiported data RAM 100 and a multiported program RAM 150. As aforementioned, the RAMs may either be multiported by time division multiplexing a single access to the RAMs (as seen by the solid lines of FIG. 1) or by providing true multiported RAMs (as suggested by the dashed lines of FIG. 1). As indicated in FIG. 2, in the preferred embodiment hereof, access to the program RAM 150 by the GSPs 400 and the host port 800 and access port 900 is via time division multiplexing of a single input. Similarly, access to the data RAM 100 by the GSPs 400, the DFM 600, the host port 800, the access port 900, and the probe 1000 is also via time division multiplexing of a single input.

As seen in FIG. 2, in the preferred embodiment of the invention, there are five principle time slots of the basic 50 MHz SPROC clock 147 (shown in FIG. 1): one for each GSP: and one shared by all of the other blocks of the SPROC. Each GSP 400 is able to read from the program RAM (p-rd) once over five clock cycles, effectively providing each GSP with a 10 MHz access to the program RAM 150. In the fifth clock cycle, the host is given preferred access to either read from or write to the program RAM. If the host does not need to read or write to the program RAM, the access port is given access. Alternatively, the host and access ports can be given 50/50 access to the fifth time slot by additional time division multiplexing.

In the boot mode, only one GSP of the SPROC (e.g. GSP 400*a*) accesses the boot ROM 190. Because boot mode is used to program the program RAM 150 with program data from EPROM 170,, the program RAM bus 155 must be used by the GSP 400*a* for writing to the program RAM 150 (via data RAM bus 125 and switch 194). Thus, a program RAM write (p-wr) is provided as shown in FIG. 2 to allow for this situation (as previously discussed with reference to FIG. 1).

The data RAM 100 is similarly multiported via time division multiplexing. As indicated in FIG. 2, each GSP 400 is given a single time slot to either read or write from the data RAM 100. The fifth time slot (time slot 2) is subdivided in time as follows: 50% for the host interface; and the remaining fifty percent equally divided among the access port 900, each of eight sections of the DFM 600 relating to eight serial ports 700, and the probe 1000.

The RAMs 100 and 150 of the invention are preferably separate RAM devices and do not share memory space. For example, the program RAM 150 is preferably a 1K by 24 bit RAM which is assigned address locations 0000 to 03 ff Hex. The data RAM 100, on the other hand is preferably a 3K by 24 bit data RAM with primary data RAM space of 2K assigned address 0800 to 0 fff Hex, and auxiliary register based space of 1K assigned addresses 0400 to 07 ff Hex. Of the primary data RAM addresses, addresses 0800 through 0813 Hex relate to the trigger bus flags as is discussed hereinafter, while addresses 0814 through 0 fff are used as data buffers, scratch pad locations, etc. Of the auxiliary space, certain addresses are used as follows:

| | |
|---|---|
| 0401H | Exit boot mode (write f0H) (generate GSP hard reset) |
| 0405H | Serial port reset (write) |
| 0406H | Global break entry (write) (generate GSP soft reset) |
| 0407H | Global break exit (write) (generate GSP soft reset) |
| 0408H | GSP1 break entry (write) (generate GSP soft reset) |
| 0409H | GSP2 break entry (write) (generate GSP soft reset) |
| 040aH | GSP3 break entry (write) (generate GSP soft reset) |
| 040bH | GSP4 break entry (write) (generate GSP soft reset) |
| 040cH | GSP1 break exit (write) (generate GSP soft reset) |
| 040dH | GSP2 break exit (write) (generate GSP soft reset) |
| 040eH | GSP3 break exit (write) (generate GSP soft reset) |
| 040fH | GSP4 break exit (write) (generate GSP soft reset) |
| 0410H | Serial Port 1 internal clock rate select (write 00 = CK/2048) (write 01 = CK/1024) (write 02 = CK/512) (write 03 = CK/256) (write 04 = CK/128) (write 05 = CK/64) (write 06 = CK/32) (write 07 = CK/16) where CK is the SPROC clock (50 MHz) |
| 0411H | Serial Port 2 internal clock rate select |
| 0412H | Serial Port 3 internal clock rate select |
| 0413H | Serial Port 4 internal clock rate select |
| 0414H | Serial Port 5 internal clock rate select |
| 0415H | Serial Port 6 internal clock rate select |
| 0416H | Serial Port 7 internal clock rate select |
| 0417H | Serial Port 8 internal clock rate select |
| 0440H to 0447H | Serial Port 1 (pradd = 0800H) |
| 0448H to 044fH | Serial Port 2 (pradd = 0801H) |
| 0450H to 0447H | Serial Port 3 (pradd = 0802H) |
| 0458H to 045fH | Serial Port 4 (pradd = 0803H) |
| 0460H to 0467H | Serial Port 5 (pradd = 0804H) |
| 0468H to 046fH | Serial Port 6 (pradd = 0805H) |
| 0470H to 0477H | Serial Port 7 (pradd = 0806H) |
| 0478H to 047fH | Serial Port 8 (pradd = 0807H) |
| 0480H to 0487H | DAC (probe) input port (pradd = 0808H) |
| 0488H to 048fH | DAC (probe) serial output port |
| 04fcH to 04ffH | Host interface registers |

Memory locations 1000 to ffff Hex refers to external address space (e.g. slave SPROCs, other devices, or memory).

Of the auxiliary memory locations in the data RAM 100, it should be noted that each GSP is given a break entry and break exit data address. While the embodiment of FIG. 1 causes bus 155 to be connected to the boot/break ROM 190 when a break is implemented such that all GSPs must break together, different circuitry would allow for individual GSP breaks.

The eight twenty-four bit locations provided for each serial port are used to configure the serial ports as well as the DFM section associated with each serial port as hereinafter described. Similarly, the eight words of memory assigned the input and output pons of the probe are used to configure the probe, while the eight words of memory assigned the host port are used to configure the host port as described hereinafter.

Further, with regard to the memory locations, it is noted that when information is written to any of the serial port locations indicated, another address (pradd), which turns out to be a trigger flag address is generated by the DFM 600 (as discussed in more detail hereinafter) and written to the data RAM bus 125. The writing of particular addresses to the data RAM bus 125 is monitored by decoder 196 which is discussed in more detail in Ser. No. 07/583,508.

Turning to FIGS. 3*a* and 3*b*, a block diagram of the preferred general signal processor (GSP) 400 of the invention is seen. The GSP is coupled to a program RAM 150 via program RAM bus 155. Because the program RAM 150 is preferably shared by a plurality of GSPs 400, access to the program RAM bus is time division multiplexed as indicated in FIG. 2. The program RAM bus 155 is comprised of a data bus of width twenty-four bits, and an address bus of ten bit width where a 1K program RAM is utilized. Of course, if a larger program RAM is desired, additional bits are required to address the same, and the program RAM bus would be wider. As indicated in FIGS. 3*a* and 3*b*, the GSP 400 writes to the address section of the program RAM bus to indicate which instruction (RAM location) is desired. However, under ordinary operating conditions the GSP 400 is not capable of writing data to the program RAM 150. Under ordinary operating conditions, data is written into the program RAM 150 only via the host or access ports shown in FIG. 1 which are also coupled to the program RAM bus 155 in a time division multiplexed manner.

The GSP 400 is also coupled to the multiported data RAM 100 via a data RAM bus 125. Because the data RAM 100 is central to the processor architecture, and because non-arbitrated access to the data RAM 100 is desired, the data RAM 100 must either be a true multiported data RAM, or access to the data RAM 100 via the data RAM bus 125 must be time division multiplexed so as to effectively create a multiported RAM. The data RAM bus preferably comprises a data RAM address bus of sixteen bit width, an a data RAM data bus of twenty-four bit width. As indicated in FIGS. 3*a*, 3*b* and 4, the GSP may write to the address section of the program RAM 100. Also, the GSP may both read and write to the data section of the data RAM bus.

The GSP is substantially described by the details and functioning of six sections: a block controller 410; a program control logic block 420; a multiplier block 430; an ALU block 450; a flag block 460; and a data RAM address generator block 470. Coupling all six sections, as well as a break register 492, a data access register 494, and a temporary register 496 is an internal twenty-four bit bus 490. All access from any of the sections or from the registers 492, 494, or 496 onto the internal bus 490 is via tristate drivers 429, 449*a*, 449*b*, 459, 469, 489, and 499.

Block controller 410 is comprised of instruction decoder 412, and sequencer 414. The instruction decoder 412, when enabled, takes fourteen bits (nine bits of opcode, and five bits of operand) off of the data portion of the program RAM bus. Six of the nine opcode bits are used to indicate the operation (instruction) which the GSP is to perform (e.g. add, shift, jump, etc.), with up to sixty-four instructions being accommodated. In the preferred embodiment an additional three bits of opcode are utilized to specify the addressing mode the GSP is to use. In particular, in the "absolute" mode (code 000), the fifteen bits in the O register 472 of the address generator block 470 are used to select an address in the data RAM 100, and the data in that address of data RAM is used for the operation. In the "register" mode (code 001), the five operand bits obtained by the instruction decoder 412 are used to specify which register of the numerous registers of the GSP is to place its contents onto the internal bus 490. In the "immediate left" mode (code 010), the fifteen bits of data in the O register are to be put into the fifteen msb slots of the internal bus 490, while in the "immediate right" mode (code 011), the fifteen bits are put into the fifteen lsb slots of the internal bus. In the remaining four modes, "BL indexed" (code 100), "B indexed" (code 101), "FL indexed" (code 110), and "F indexed" (code 111), as described in more detail hereinafter, values in base registers B or F are added to the value of the fifteen bit operand stored in the O register and, where appropriate, to the value in the L (loop) register, and are output onto the data RAM bus 125.

Instruction decoder 412 is not only coupled to the program RAM bus, but to the numerous multiplexers, tristate drivers, registers, etc. of the GSP via lines 416. Based on the instruction which is decoded by instruction decoder 412, various of those lines 416 are enabled in a sequence as determined by the sequencer 414. In effect, instruction decoder 412, and sequencer 414 are simply look-up charts, with instruction decoder 412 looking up which lines 416 must be enabled based on the code found in the nine bits of opcode, and sequencer 414 looking up the sequence to which the enabled lines must subscribe.

While instruction decoder 412 decodes whatever instruction is on the program RAM bus 155 when the GSP 400 is granted access to that bus, the instruction which is on the bus is generated and dictated by the program logic block 420. Program control logic block 420 is comprised of a tristate driver 422, a program address value register 424 (also called the "P" register), an incrementer 425, an increment (I) register 426, a jump (J) register 428, a multiplexer 430, and a, branch logic block 432. The P register 424 contains the location of the program RAM 150 which, contains the microinstructions which are to be used by the GSP 400. P register 424 writes that address onto the program RAM bus 155 by sending it to tristate driver 412 which acts as the bus interface.

Updating of the P register 424 is accomplished via muxP 430 which chooses one of the twelve bit addresses stored in the I register 426 or the J register 428 based on information from branch logic block 432. The address stored in the I register is simply the next numerical address after the address stored in the P register, as a value of one is added at incrementer 425 to the value stored in P register 424. In most situations, muxP 430 will permit the P register 424 to be updated by the I register, and the sequential addressing of the program RAM will continue. However, in some situations, such as where a jump in the routine is desired, the multiplexer 430 will permit the address in the J register 428 to be loaded into the P register 424. The decision to jump is made by the branch logic block 432 which reads the status of a plurality of status flags as is hereinafter discussed. The address to which the jump is made is obtained by the J reg 428 from the internal bus 490, which may obtain the address from any of the sections of the GSP 400 (or from the data RAM 100).

Coupled to the program control logic block 420 is a break register 492 in which upon the execution of a break instruction is loaded status flag information as well as the value of the P register plus one. The status flag and P register information is stored in the break register 492 which is coupled to internal bus 490 via tristate driver 429 because it is otherwise not available for placement on to the internal bus 490. A program break is typically executed when an information dump is desired by the system user, and is accomplished by putting an instruction in the program RAM 150 which causes the GSP 400 to write to a certain address (e.g. 0406 H) of the data RAM 100. A decoder (not shown) on the data RAM bus 125 is used to determine that the program break is to be executed (based on the location to be written to), and a control signal is provided by the decoder to the break register 492. The program break instruction in the program RAM 150 causes instructions in a boot/break ROM 190 (shown in FIG. 1) which is coupled to the program RAM bus 155 to be accessed by the program control logic block 420. The instruction code in the boot/break ROM 190 in turn causes the values of each of the registers in the GSP 400 to be written into desired locations in the data RAM 100. Then the GSP 400 is kept waiting until the wait flag stored in its wait flag register (discussed below) is cleared. During the wait period, if desired, the user can change the values of data in the data RAM as described in more detail below with reference to the access port 900. Then, when the wait cycle is terminated, the instructions in the boot/break ROM 190 causes the values in the data RAM, including any new values, to be written back to their appropriate registers in the GSP. The location of the next desired microinstruction contained in a program RAM 150 location is loaded into the P register, so that the GSP can continue in its normal fashion.

The multiplier block 430 and the ALU block 450 of the GSP perform the numerical computations for the GSP. The multiplier block 430 is comprised of two input registers Xreg 432 and Yreg 434, a multiplexer 436 which is coupled to the internal bus 490 via tristate driver 449*a*, a multiplier 438 with a post Xreg 439, and a multiplier control 441, a summer 442, an output register Mreg 444, and a second multiplexer 446 which selects which of six words is to be output onto internal bus 490 via tristate driver 449*b*. Typically, the multiplicand is loaded into Xreg 432. Then the multiplier is loaded into Yreg 434 while the multiplicand is loaded into post Xreg 439. The multiplier control 441 permits the multiplier 438 to function over several machine clock cycles (e.g. three clock cycles totaling 300 nanoseconds = fifteen internal GSP cycles). If in multiplying, the multiplier overflows, a status flag M is set, and this information is conveyed to the branch logic block 432 of the program logic section 420. Regardless, the product of the multiplier and multiplicand is forwarded to summer 442 which, in a multiply with accumulate mode, adds the new product to the sum of previous products and forwards the sum to the multiply register M 444. In a pure multiply mode, the contents of the summer are cleared so that the product is forwarded through the summer which adds zero and send the product to the M register.

The contents of the M register 444 are available to the internal bus 490. However, because the M register can accommodate a fifty-six bit word, and the internal bus 490 is a twenty-four bit bus, only a portion of the M register word may be placed on the bus at one time. Thus, multiplexer 446 is provided to either select the twenty-four least significant bits (lsb's) in the M register, the twenty-four next lsb's in the M register, or the eight most significant bits (msb's) in the M register. If the eight msb's are chosen, the eight msb's are placed in the eight lsb slots of the internal bus 490, and the msb of the eight bits is extended through to the msb slot on the bus (e.g. if the msb is a "1", the first seventeen msb's on the bus will be "1"). The multiplexer 446 is also capable of selecting a left shifted by two (zero filling the right) twenty-four or eight bit word. Thus, in all, multiplexer 446 can provide six different outputs based on the product in the M register 444.

The ALU block 450 of the processor is basically a standard ALU, having an arithmetic-logic unit 452 with input register 454, and an output accumulator register 456. The arithmetic-logic unit 452 is capable of the standard functions of similar units, such as adding, subtracting, etc., and produces values for Areg 456, as well as status flags including carry (C), overflow (0), sign bit (S), and zero (Z). The status flags are used by the branch logic block 432 of the program logic block 420 to determine whether a conditional jump in the microcode program should be executed. The Areg contents are output onto internal bus 490 via tristate driver 459.

Wait flag block 460 is comprised of two wait flag registers WFreg 462 and DFreg 464, a multiplexer 466, and OR gate 468. The bits of the wait flag registers may be set (i.e. written to) by data sent over the internal bus 490. Also, registers WFreg 462 and DFreg 464 are coupled to a flag bus 198 which is written to each time predetermined locations in the data RAM 125 are addressed as hereinbefore described with reference to FIGS. 2 and 13. In this manner, each bit of the wait flag registers 462 and 464 may be selectively cleared. When all of the bits in register WFreg 462 have been cleared due to the occurrences of specified events (e.g. the data RAM has received all the information which is required for another computation), OR gate 468 is used to provide a status flag W which indicates the same. Status flag W is read by the branch logic block 432. In this manner, "jump on wait flag" commands may be executed.

The DFreg 464 of the wait flag block 460 functions similarly to the the WFreg 462, except that no signals indicating the presence of all zeros (or ones) are output by the DFreg. In order to check the contents of the DFreg (or the WFreg, if all values in the WFreg are not zero), the register must be selected to put its contents on the internal bus 490. The selection of one of the registers is made by the instruction decode 412 and sequencer 414, and the contents are forwarded via multiplexer 466 and the tristate driver 469. An easy manner of determining whether the DFreg 464 has all zeros is to forward the contents of the DFreg 464 to the ALU 452, which will provide a status flag Z if the contents are zero.

The final large block of the general signal processor is the data RAM address generator block 470 which includes bus wide OR gate 471, registers Oreg 472, Dreg 473, Lreg 474, Breg 476, Freg 477, adders 481, 482, and 483, multiplexers muxBFL 484, muxL 485, muxA 486, muxBF 487, muxO 488, and an address access block 489. As previously indicated, the Oreg 472 obtains the fifteen least significant bits of the instruction on the program RAM bus. If "absolute" addressing is desired, i.e. the address to be written onto the data RAM bus is included in the program RAM microinstruction itself, the address is written into the Oreg 472, and then forwarded to the data RAM bus (a sixteenth bit having been added by a zero extender, not shown) via muxA 486 and the address access block 489. The sixteen bit address is then placed on the data RAM bus at the appropriate time. All other situations constitute "indexed" addressing, where the address to be put out on the data RAM bus is generated internally by the data RAM address generator block 470.

Addresses are generated by adding the values in the various registers. In particular, and as indicated in FIG. 4, the Oreg 472 is the offset register, the Dreg 473 is a decrement register, the Lreg 474 is a loop register which sets the length of a loop, the Breg 476 is a base address register, and the Freg 477 is a frame address register which acts as a second base address register. The O register obtains its data off of the program RAM bus, while registers D, L, B and F obtain their data from the internal bus 490. If it is desired to add some offset value to the value in the base or frame register (i.e. the "B indexed mode" or "F indexed mode") in order to generate an address, muxBF 487 selects appropriately the Breg 476 or the Freg 477, muxBFL 484 selects the value coming from muxBF 487, and the Breg or Freg value is added to the offset value of the Oreg by the adder 483. That value is then selected by muxA 486 for output over the data RAM bus via the address access block 489. Similarly, if it is desired to add some offset value and some loop value to the value in the base or frame register (i.e. the "BL indexed mode" or the "FL indexed mode"), the value in the L register is added to the value in the B or F registers at adder 482, and the sum is passed via muxBFL 484 to adder 483 which adds the value to the value in the O register.

By providing adder 481, and by coupling the decrement register Dreg and the loop register Lreg to the adder 481, registers an address loop is effectuated. In particular, the Lreg sets the length of the loop, while the Dreg sets the value by which the loop is decremented. Each time the Dreg is subtracted from the Lreg 475 at adder 481, the new value is fed back into the Lreg 475 via muxL 485. Thus, each time a DJNE instruction is executed (as discussed below), the resulting value in the Lreg is decreased by the value of the Dreg. If added to the Breg or Freg, by adder 482, the address generated is a sequentially decrementing address where the value in the Dreg is positive, and a sequentially incrementing address where the value in the Dreg is negative.

The ability to loop is utilized not only to provide a decrementing (or incrementing) address for the data RAM bus, but is also utilized to effect changes in the program RAM address generation by providing a "decrement and jump on not equal" (DJNE) ability. The output from the adder 481 is read by OR gate 471 which provides a status flag L (loop) to branch logic block 432. The status flag L maintains its value until the L register has looped around enough times to be decremented to the value zero. Before that point, when the Lreg is not zero, the next instruction of the GSP is dictated by the instruction indicated by the Jreg 428. In other words, the program jumps to the location of the Jreg instruction instead of continuing with the next instruction located in the I register. However, when the Lreg does decrement to the value zero, the OR gate 471 goes low and toggles flag L. On the next DJNE instruction, since the "not equal" state does not exist (i.e. the Lreg is zero), branch logic 432 causes muxP 430 of the program logic block 420 to return to obtaining values from the Ireg 426 instead of from the Jreg 428, and the program continues.

The values of any of the O, D, L, B, or F registers may be placed on the internal bus 490, by having muxO 488 (and where appropriate mux BF 487) select the appropriate register and forward its contents via tristate driver 489 to the internal bus.

Coupled to the internal bus 490, and interfacing the internal bus 490 with the data slots on the data RAM bus is the data access port 494. The data access port 494 is capable of reading data from and writing data to the data RAM and is given access to the data RAM in a time division multiplexed manner as previously described. In writing to the data RAM, the data access port 494 and the address access port 489 are activated simultaneously. In reading data from the RAM, the address access port 489 first places on the data RAM bus the data RAM address in which the desired data is stored. The data is then placed on the data RAM bus by the data RAM, and the data access port 494 which is essentially a dual tristate driver, receives the data and passes it onto the internal bus 490 for storage in the desired GSP register.

If desired, additional registers such as Z register 496 may also be coupled to the internal bus 490, and may be used as temporary storage. The contents of Zreg 496 are output onto the internal bus 490 via tristate driver 499.

Details of the functioning of the GSP as well as example microcode may be seen with reference to previously incorporated U.S. Ser. No. 07/525,977.

Turning to FIGS. 4*a*, 4*b*, and 4*c*, block diagrams of the input and output circuitry of the data flow manager (DFM) 600 of the invention, and an example FIFO related to the DFM are seen. As previously described, the DFM serves the important function of handling the flow of data into and out of the processor apparatus so that GSPs of the processor apparatus need not be interrupted in their processing tasks. In accomplishing this function, the DFM takes data received by the serial port from the "world" outside of the particular processor apparatus and organizes it inside a FIFO such as the FIFO of FIG. 4*c* which is implemented in desired locations of the data RAM 100 of the SPROC apparatus 10. Also, the DFM 600 takes data in a FIFO, and organizes it for output to a serial output port of the SPROC apparatus. The DFM is also capable of directing data into a FIFO and drawing data from a FIFO at desired speeds so as to accommodate a decimation operation performed by the SPROC. Further, the DFM causes decoder 196 to write flags to the flag bus 198 (and hence to the GSPs 400) of the SPROC apparatus 10 regarding the status of the buffers.

The DFM 600 of the SPROC apparatus may either be central to the apparatus, or distributed among the serial input and output ports 700 of the apparatus, with a single DFM serving each port 700. Where distributed, the circuitry seen in block diagram form in FIGS. 4*a*, and 4*b* is duplicated for each serial input and output port 700 of the SPROC apparatus, although certain circuitry could be common if desired.

The circuitry for receiving data from a serial port and organizing it for storage in a FIFO of the data RAM 100 is seen in FIG. 4*a*. The data flow itself is simple, with the data being sent from the serial port 700, via multiplexer 611 and tri-state driver 613 to the data slots of the data RAM bus 125. Multiplexer 611 permits either data coming from serial port 700*a* or data generated as hereinafter described to be forwarded to driver 613. Driver 613 is controlled as indicated such that data is only output on the data RAM bus 125 when the DFM 600 is enabled by the system-wide multiplexer clock scheme. The organization of the data for output onto the data RAM bus as a twenty-four bit word is conducted by the serial port 700, as hereinafter described.

Besides the data flow circuitry, each DFM is arranged with buffers, counters, gates, etc. to generate data RAM FIFO addresses for the incoming data. As shown in FIG. 4a, the DFM 600 has three registers 620, 622, 624, three counters 630, 632, and 634 associated with the three registers, an adder 636, a divide by two block 637, a multiplexer 638, seven logic gates 641, 642, 643, 644, 645, 646, and 647 (gates 642, 643, 645, and 647 being bus wide gates), and two delay blocks 648 and 649. The three registers are respectively: the start of FIFO register 620 which stores the start location in the data RAM for the FIFO to be addressed by the particular serial port coupled to the particular part of the DFM; the index length register 622 which stores the number of buffers which comprise the FIFO (for the FIFO of FIG. 4c, the index length register would be set at four), and the buffer length register 624 which stores the length of each buffer, i.e. the number of words that may be stored in each buffer (for the FIFO of FIG. 4c, the buffer length register would be set at eight). When a data word (twenty-four bits) is ready for sending to the data RAM for storage in a FIFO, the serial port 700a provides a ready signal which is used as a first input to AND gate 641. The second input to AND gate 641 is a data enable signal which is the time division multiplexed signal which permits the DFM to place a word on the data RAM bus. With the data enable and ready signals high, a high signal is output from the AND gate which causes driver 613 to output the data on the data RAM bus along with an address. The address is that which is computed by the twelve bit adder 636, or a prewired address, as will be described hereinafter.

When AND gate 641 provides a high output, the high output is delayed by delay blocks 648 and 649 before being input into clock counters 630 and 634. As a result, counters 630 and 634 increase their counts after an address has been output on the data RAM bus. When counter 630 increases its count, its count is added by the twelve bit adder 636 to the FIFO start location stored in register 620. If selected by multiplexer 638, the generated address will be the next address output in the address slots of the data RAM bus in conjunction with the data provided by driver 613. Thus, as data words continue to be sent by the serial port for storing in the data RAM FIFO, they are sent to incremental addresses of the data RAM, as the counter 630 increasingly sends a higher value which is being added to the FIFO start location. As is hereinafter discussed, the counter 630 continues to increase its count until a clear counter signal is received from circuitry associated with the index length register 622. When the clear counter signal is received, the counter starts counting again from zero.

As aforementioned, each time the AND gate 641 provides a high output, the counter 634 associated with the buffer length register 624 is also incremented (after delay). The outputs of the buffer length register 624 and its associated counter 634 are provided to bus wide XNOR gate 643 which compares the values. When the counter 634 reaches the value stored in the buffer length register 624, a buffer in the data RAM FIFO has been filled. As a result, the output of XNOR gate 643 goes high, causing three input OR gate 644 to pass a high signal to the reset of counter 634. The high signal from bus wide XNOR gate 643 is also fed to the counter 632 associated with the index length register 622, to the multiplexer 638, and to the multiplexer 61 1. As a result of the buffer being filled, multiplexer 638 enables the prewired address to be placed in the address slots of the data RAM bus 125, along with one of two predetermined (or generated) data words which are generated as discussed below. The placement of the prewired address and a data word on the bus at the end of buffer signal occurs upon the next data enable signal received by the DFM, which is before another word is assembled by the serial port 700a for sending to the data RAM 100. Also, the placement of the prewired address and data word is used for signalling purposes, as a decoder 196 (see in FIG. 1) monitors the data RAM bus 125 for the particular prewired addresses of the DFMs; the triggering of these addresses occurring because of conditions in the DFM, i.e. the filling of buffers. The decoder 196 in turn, can set a flag (the setting of the flag can be dependent on the value of the data accompanying the prewired address) on the trigger bus 198 which signals the GSPs 400 of the SPROC of the occurrence. In this manner, the GSPs 400 can determine that the data required to conduct an operation is available to the GSP, thereby causing the GSP to exit a wait loop.

The predetermined or generated data word placed on the bus after a FIFO buffer has been filled preferably uses a "1" as the msb of the data word if the FIFO buffer that has been filled causes the FIFO to be half filled (as described hereinafter), or a "0" as the msb otherwise. The remainder of the data word may be null information. Or, if desired, the data word may include the next location to which the DFM will write (i.e. the location computed by the twelve bit adder 636) which is inserted in appropriate locations of the data word. This predetermined or generated data word is then passed via multiplier 611 to driver 613 which places the data word on the bus at the same time the prewired address is placed on the data RAM bus 125.

As aforementioned, when an indication of a full buffer is output by bus wide XNOR gate 643, counter 632 is incremented. Counter 632 therefore tracks the number of the buffer in the FIFO that is being filled. When the number of the FIFO buffer being addressed (as determined by counter 632) is half of the FIFO length (as determined by the length stored in register 622, divided by divide by two block 637), a flag is raised by the DFM via the bus wide XNOR gate 647. The "mid buffer" flag indicates that the buffer in the FIFO being written to is halfway through the FIFO. Hence, if all previous buffers in the FIFO are still full with data, the FIFO is half full. In addition, the mid buffer flag causes the generated data input to multiplexer 611 to be changed, such that the msb of the data is a "1" instead of a zero. Thus, upon filling the buffer which causes the FIFO to be half filled, a slightly differently coded data word is placed in the data slots of the data RAM bus.

When the value of counter 632 is incremented to the value stored in the index length register 622, the last location in the FIFO has been addressed. Accordingly, it is desirable to recirculate; i.e. to continue by addressing the first location in the FIFO. With the value of counter 632 equal to the value of register 622, bus wide XNOR gate 645 provides a high signal which is passed through three input OR gate 646. As a result, counters 630, 632, and 634 are reset. As indicated in FIG. 4*a*, a "clear counter" signal may also be generated by a power up reset (PUR) signal which is generated by applying a signal to a predetermined pin (not shown) of the SPROC, and by a SYNC signal which is generated by writing to address 0405 H of the data RAM 100. The SYNC signal permits different DFMs to be synchronized to each other.

If desired, the input section of one DFM can be synchronized to the output section of the same or another DFM. This synchronization is accomplished via a pin (not shown) on the SPROC which generates the "en buf" input into OR gate 644. In turn, OR gate 644 provides a high signal which resets counter 634 in synchronization with the resetting of a similar counter in a DFM output section such as described with reference to FIG. 4*b*.

Turning to FIG. 4*b*, the serial output section of the DFM 600 is seen. The function of the output section of the DFM is to take data in the FIFO, and organize it for output to a serial output port 700*b* of the SPROC apparatus.

The output section of the DFM is preferably comprised of several registers and counters, logic elements including AND gates, comparators, and inverters, divide and add blocks, flip-flops, a buffer and a parallel to serial converter. Basically, the data flow through the serial output section of the DFM is simple. An address generated by the the start address register 652 is added by adder 654 to the value in the offset counter 656, and that address is output onto the address section of the data RAM bus. The data RAM receives the address information and then places the data located at that data RAM address on the data RAM bus. That data is received by the DFM and latched and stored in buffer 694 prior to being forwarded to the serial output port 700*b*.

The remaining circuitry of FIG. 4*b* serves the functions of not permitting the data to be forwarded to the serial output port 700*b* unless certain conditions (i.e. triggers) are met, as well as generating synch pulses and error flags depending on internal logic and received signals. In particular, each DFM has a wait register 660 which holds flag information which must be cleared in the wait flag register 662 before a signal will be generated. The bits in the wait flag register are only cleared upon receipt of appropriate trigger bits received from the trigger bus 198. When the appropriate flags are cleared, bus wide NOR gate 664 resets the wait flag register 662 by permitting it to be reloaded from wait register 660. The NOR gate 664 also passes the signal on to divide by N (N=0, 1, . . . , n) block. Upon the divide by N block 666 receiving N pulses from NOR gate 664, it outputs a pulse to AND gate 668. If N is one, no clock decimation occurs. However, if N is greater than one, decimation is effected; i.e. the clock is reduced to match the decimation of data which occurred in the GSP. If the other input to AND gate 668, is also high (which occurs when the DFM is running as hereinafter described), a pulse is sent to offset counter 656 which increases its count. In this manner the address output by adder 654 is changed to the next address. Likewise, when the output of AND gate 668 is high, a pulse is sent to the serial output port 700*b* which outputs a data signal from the DFM, and to the sample counter 684 which increases its count.

The DFM also includes a IE (initiation/error) register 661 which supplies the flag data which must be cleared by the trigger bits to the LF flag register 663. The outputs from IE flag register 663 are fed to bus wide NOR gate 665 which is used in a feedback manner to reset the IE flag register 663 so that it can be reloaded by IE register 661. The output from bus wide NOR gate 665 is also sent as the clock input into a D type flip-flop 667. The data (D) input into the D type flip-flop 667 should be the msb (bit twenty-three) of the data word being input into the DFM's data RAM buffer by the input side of the DFM, which is arranged to be a value "1" only when the word is being taken from the half-full location of the data RAM buffer. The value of the msb input to the D input, is then clocked over to the Q output of the flip-flop which is forwarded as the first of two inputs to each of two AND gates 670 and 672. As will be discussed hereinafter, AND gate 670 is used to set an error flag. AND gate 672, on the other hand, is used to set block 675 which is used to indicate the state of the DFM (i.e. is it presently running). If the DFM is presently causing data to be read from the data RAM and output via the DFM to a serial port, the DFM is in the running mode, and the output from block 675 is already high. As a result, inverter 676 provides a low signal to AND gate 672 which is not affected by the output from flip-flop 667. On the other hand, if the DFM is not running, the output from block 675 is low, and inverter 676 provides a high value to AND gate 672. Thus, if flip-flop 667 provides a low signal (which will happen until the buffer in the data RAM for the DFM has received enough data to be half full), the DFM will not start running. On the other hand, if flip-flop 667 provides a high signal indicating that the data RAM has now been filled halfway, block 675 changes its output and the DFM starts running.

It should be noted that when the DFM is not running, the high output from inverter 676 is forwarded via OR gate 677 to the clearing input of offset counter 656, thereby causing the address count to be generated by adder 654 to be initialized upon start-up of the DFM.

As aforementioned, AND gate 670 is used to set an error flag. Thus, if D type flip-flop 667 provides a high output while the DFM is running (as indicated by the output from block 675), AND gate 670 passes a high value to AND gate 698, which in turn will generate an error flag if other criteria are met, as hereinafter described.

The remaining blocks of the DFM output section include a FIFO length register 680, a buffer length register 682, a sample counter 684, a divide by two block 685, comparators 686 and 687, a bus wide OR gate 689, and a set/reset block 690. The FIFO length register 682 stores the full length of the FIFO. When the value of the offset counter 656 is equal to the FIFO length stored in buffer 680, a sync pulse is generated by bus wide XNOR gate 686 which is used to synchronize the incoming data signal into an input section of a DFM with the outgoing data signal from the described output DFM. The sync pulse generated is received by the input section of the DFM (seen in FIG. 4*a*) as the signal enbufl, previously described. In addition the sync pulse may be used to reinitialize the DFM by clearing the offset counter 656 and reloading the registers. When the value in the offset counter 656 is equal to one-half the value of the FIFO length register 680 (as determined by divide by two block 685), comparator 687 provides a pulse to set/reset block 690 which is indicative of the fact that the address placed on the data RAM bus is the address half-way through the data RAM buffer associated with the particular DFM. When the data RAM address is the half-full address, the data being written into the data RAM buffer should not be written into the half-full address (i.e. there should never exist a situation where the address is being written to and read from at the same time). Thus, if D type flip-flop 667 provides a high signal to AND gate 670 while the DFM is running, and the output from set/reset block 690 is also, high, AND gate 698 provides a high output which sets an error flag for the DFM.

Finally, with respect to the output side of the DFM, the buffer length register 682 stores a value equal to the length of each buffer in the data RAM FIFO associated with the DFM. The sample counter 684 is a down counter which is preloaded with the buffer length stored in register 682. When a high pulse is received from XNOR gate 687 (i.e. the offset counter is half of the FIFO length), RS flip-flop 690 is set and the down counter of sample counter 684 is enabled. Each time sample counter 684 receives a pulse from AND gate 668, the count is decremented. When the sample count goes to zero, the RS flip-flop 690 is reset. However, while the RS flip-flop 690 is set and outputs a high pulse to AND gate 698, the DFM is looking for an error. If before being reset a high msb value is seen by flip-flop 667, the DFM is apparently attempting to read and write to the same buffer location at the same rime. As a result, AND gate 698 provides a high signal which sets an error flag for the DFM.

Turning to FIG. 4c, an example of a FIFO associated with the DFM is seen. The FIFOs associated with DFMs are contained in a preferably predetermined portion of the data RAM of the processor apparatus. The FIFO of FIG. 4c, as shown contains four buffers. Also as shown, each buffer contains storage for eight data samples. Thus, as shown, the FIFO of FIG. 4c has storage for thirty-two data samples. Of course, a FIFO can contain a different number of buffers, and the buffers can store different numbers of data samples. The size of the each FIFO associated with a DFM and the size of its buffers is either set automatically by intelligent software which calculates the requirements of the particular DFM, or by the user of the processor system during initial programming of the processor system.

Turning to FIG. 5a, a block diagram of the serial input port 700a of the invention is seen. The basic function of the serial input port is to receive any of many forms of serial data and to convert the received serial data into parallel data synchronous with the internals of the SPROC and suitable for receipt by the DFM 600 and for transfer onto the data RAM bus 125. To accomplish the basic function, the serial input port has a logic block 710, a data accumulation register 720, and a latched buffer 730. The logic block 710 and the data register 720 are governed by seven bits of information programmed into the serial input port 700a upon configuration during boot-up of the SPROC 10. The seven bits are defined as follows:

| | | dw1 | dw0 | | |
|---|---|---|---|---|---|
| 0 | dw0 | 0 | 0 | 24 bits data width | |
| 1 | dw1 | 0 | 1 | 16 bits data width | |
| | | 1 | 0 | 12 bits data width | |
| | | 1 | 1 | 8 bits data width | |
| 2 | | | | High: msb first | Low: lsb first |
| 3 | | | | High: short strobe | Low: long strobe |
| 4 | | | | High: gated clock | Low: continuous clock |
| 5 | | | | High: internal clock | Low: external clock |
| 6 | | | | High: output port | Low: input port |

Bits 0, 1, and 2 are used to govern the logic block 710. If the incoming data is a twenty-four bit word, the logic block takes the bits in a bit by bit fashion and forwards them to the data accumulation register 720. If the incoming data is a sixteen bit, twelve bit, or eight bit word, the logic block takes the bits of the word in a bit by bit fashion and zero fills them to extend them into a twenty-four bit word. Which bit of the received serial data is forwarded into the msb slot of the register 720 is governed by control bit 2.

Once the data is properly accumulated in register 720, it is latched into buffer 730 where it is held until it can be forwarded through the input section of the DFM 600 for storage in the multiported RAM 100. The holding of the data in the buffer 730 until the appropriate signal is received effectively causes data which is asynchronous with the SPROC 10 to become synchronized within the SPROC system.

Bits 3, 4, and 5 governing logic block 710 are respectively used to control the type of strobe, the type of clock, and the location of clock control for the input port 700, all of which are necessary for the proper communication between the SPROC and an external device. Because port 700 preferably includes the circuitry of both an input port 700a and an output port 700b (described in more detail hereinafter), an extra bit (bit 6) is used to control the functioning of port 700 as one or the other.

The serial data output port 700b seen in FIG. 5b is similar to the data input port 700a in many ways, except that its function is the converse. The serial output port 700b includes a buffer 740, an parallel load shift register 750, and controlled multiplexers 760 and 770. The data to be written from the SPROC via the output port 700b is received by the buffer 740 from buffer 694 of the DFM 600. The twenty-four bits received are then loaded in parallel into the parallel load shift register 750 which functions as a parallel to serial converter. The twenty-four bits are then forwarded in a bit serial fashion via multiplexer 760 which receives the control signals dwO and dwl, and via multiplexer 770 which receives the msb control signal to the transmit data line. Multiplexers 760 and 770 effectively transform the twenty-four bit word received by the parallel load shift register into the desired format for communication with a desired device external the SPROC. The twenty-four bits may be transformed into an eight bit word (e.g. the eight msb's), a twelve bit word, or a sixteen bit word (the eight lsb's being truncated), with either the lsb or the msb being transmitted first. A twenty-four bit word may similarly be sent lsb or msb first. Where the SPROC is communicating with another SPROC (i.e. output port 700b of one SPROC is communicating with the input port 700a of another SPROC), multiplexers 760 and 770 are preferably controlled to send a twenty-four bit word, msb first.

Turning to FIG. 6, details of the host port 800 are seen. Under most circumstances the host port 800 serves to interface the SPROC 10 with a host 180 (see FIG. 2), although where the SPROC 10 is a master SPROC which is in boot mode, host port 800 serves to interface the SPROC 10 with an EPROM and with any slave SPROCs which are part of the system. As indicated in FIG. 8, the host port 800 is coupled to the data RAM bus 125 as well as to the program RAM bus 155 on the SPROC side, while on the host side, the host port 800 is coupled to the host bus. The host bus includes three data sections D0-D7, D8-D15, and D16-D23, and three address sections A0-A11, S0-S3, and EA0-EA1. The remaining interfaces shown on the host side are pins (e.g. master/slave, reset, mode) which control the functioning of the SPROC 10 and the host port 800, and the read/write strobes for the host bus 165.

In slave mode (master/slave pin 801 set to slave mode), the SPROC 10 appears to other apparatus, including host microprocessors or DSPs as a RAM. Because it is desirable that the SPROC interface with as many different types processors as possible, the host port 800 is a bit parallel port and is arranged to interface with eight, sixteen, twenty-four, and thirty-two bit microprocessors and DSPs. The mode pins 802, 804, and 806 are used to inform the host port 800 as to whether the host processor is an eight, sixteen, twenty-four bit, or thirty-two bit processor, and whether the word being sent first is the most or least significant word.

For sending data from the host processor to the SPROC in slave mode, a data multiplexer 810, a data input register 812, and two drivers 815 and 817 are provided. The data multiplexer 810 receives three eight bit data inputs (D0-D7, D8-D15, and D16-D23) from the data bus section of host bus 165 and causes the data to be properly arranged in the data input register 812 according to the control of mode pins 802, 804, and 806. If the host processor is a thirty-two bit processor, the host port 800 of the SPROC takes two sixteen bit words and processes them in a manner described below with reference to a sixteen bit processor. Where the host processor is a twenty-four bit processor as indicated by mode pins 802 and 804, data is passed directly to the data input register 812 without adding bits or dividing bytes into segments. Where the host processor is a sixteen bit processor as indicated by mode pins 802 and 804, the host port takes sequentially takes two sixteen bits from two of the three eight bit data input lines (D0-D7, D8-D15, D16-D23), discards the eight lsb's of the least significant word, and uses the remaining bits to provide a twenty-four bit word to the data RAM bus 125 or the program RAM bus 155 of the SPROC. Where the host processor is an eight bit processor as indicated by mode pins 802 and 804, three eight bit bytes are received over the D0-D7 data input line and are concatenated in the data input register 812 in order to provide the SPROC with a twenty-four bit signal.

Regardless of how the data input register 812 is filled, after the data is assembled, the host port 800 awaits an enabling signal from the SPROC timing so that it can write its twenty-four bit word to the data RAM bus 125 via driver 817 or the program RAM bus 155 via driver 815. In this manner, the host port 800 synchronizes data to the SPROC 10 which was received in a manner asynchronous to the SPROC 10. The address to which the data is written is obtained from the twelve bit address section A0-A11 of the host bus 165. The twelve bit address is forwarded from host bus 165 to the address input register 820. When the host port 800 is enabled, if the address contained in the address input register 820 is indicative of a data RAM location, the address is placed via driver 822 on the sixteen bit address section of the data RAM bus 125. Because the address bus is a sixteen bit bus, while the address in address input register 820 is a twelve bit address, four zeros are added as the msbs of the address via driver 824 when the address and data are put on the data RAM bus. If the address contained in the address input register 820 is indicative of a program RAM location (address location 1K and below), the address is placed via driver 826 on the twelve bit address section of the program RAM bus 155.

In the slave mode, when the host processor wishes to read information from the SPROC, the host processor causes the read strobe to go low. The address received by the host port over address lines A0-A11 is read by the host port 800 and latched into the address input register 820. When the host port 800 is allowed access to the data or program RAM buses, the address is placed on the appropriate bus, and the twenty-four bit data word located at the data or program RAM address which was placed on the appropriate bus is read and latched either into the program data output register 832 or the output data register 834. That information is then forwarded via multiplexer 836 to data demultiplexer 840 arranges the twenty-four bits of information onto locations D0-D23 of the host bus 165. Demultiplexer 840 serves the opposite function of multiplexer 810. When sending data to the twenty-four bit host processor, the demultiplexer 840 simply takes its twenty-four bits and passes them unchanged. When sending data to a sixteen bit host processor, the SPROC 10 divides its twenty-four bit word into two sixteen bit words (with zero filling as appropriate). Similarly, when sending data to an eight bit host processor, the SPROC 10 divides its twenty-four bit word into three eight bit bytes.

In the master mode, on the "host" side of the host port 800 is located either an EPROM or one or more slave SPROCs. In the boot mode of master mode, data from the internal boot ROM 190 of the SPROC is written into the sixteen bit mode register 850 which is used to configure the internals of the host port 800. Then the GSP of the SPROC, which executes the program in the internal boot ROM, writes the sixteen bit addresses of the EPROM it wants to read in order to initialize the SPROC. Each address is received by the address output register 855 of the host port. The host port then sends a read strobe onto the host bus 165 and places via drivers 856 and 858 the address of the EPROM address it wishes to read. If the EPROM is an eight bit EPROM, the desired address is extended by extended address generator 860, and three read strobes are generated by the strobe generator 865 so that three eight bit bytes of the EPROM can be accessed. When the EPROM places its data onto the data locations of the host bus 165, that data is forwarded through data multiplexer 8 1 0, and is placed in a master mode receive register 867. The assembled twenty-four bit data word may then be read by the controlling GSP of the SPROC. After the word is read, the entire sequence repeats until all of the desired information stored in the EPROM is read into the SPROC.

Where the master SPROC is acting to boot up slave SPROCs as well as itself, the master SPROC follows the same boot-up procedure just described. However, upon the host port 800 receiving information in the master mode receive register 867 which is bound for a slave SPROC as determined from information previously obtained from the EPROM, the master SPROC causes that data to be written to the host bus 165 (via bus 125, GSP 400, bus 125 again, register 834 . . . as previously described) along with a sixteen bit address generated by the GSP 400 and sent to address output register 855 and then onto lines A0-A11, and S0-S3. In this manner, the data is forwarded to the appropriate SPROC so that it may be booted in a slave mode. It will be appreciated by those skilled in the art, that if the EPROM is wide enough to contain data and address information, that information can be written to host bus 165 and read directly by a slave SPROC or other device outside the memory space of the master SPROC.

Because external memories vary in speed, the host port 800 is provided with a wait state generator 870 which can lengthen the read or write strobe generated by strobe generator 865. The host port 800 is also provided with a host interface controller 880 which is essentially distributed circuitry which controls the internal timing of the host port 800.

A.1 Functional description of The Parallel Port

The parallel port (PPORTO) is a 24-bit asynchronous, bidirectional port with a 16-bit (64K) address bus. The port allows for 8-,16-, or 24-bit parallel data transfers between the SPROC chip and an external controller, memory-mapped peripheral, or external memory. The port has programmable WAIT states to allow for slow memory access. A data acknowledge signal is also generated for this interface.

Two operating modes—master and slave—allow the SPROC chip to operate either as a system controller (master mode), or as a memory-mapped peripheral to an external controller (slave mode). An input pin, MASTER, is dedicated to setting master or slave mode operation. In master mode, the SPROC chip automatically up-loads its configuration program from an external 8-bit PROM into internal RAM, at the initiation of boot. In slave mode, the chip relies on an external controller for its configuration.

A system using multiple SPROC chips should have a single bus controller. This may be an external controller or a master SPROC chip. All other SPROC chips in the system should be configured in slave mode. The bus controller should individually enable the chip select input, $\overline{CS}$, of each slave SPROC chip while the slave chip is being configured.

The 16-bit address field (ADDRESS[15:0]) supports up to 16 SPROC chips interconnected in the same system.

The external controller, memory-mapped peripheral, or memory may communicate with a SPROC chip in 8-, 16-, or 24-bit format. Format selection is accomplished with the MODE[2:0] pins. In 8- or 16-bit formats, the data may be most significant (msb) or least significant (lsb) byte or word first. In 16- and 24-bit modes, data is preferably always msb-justified within the word being transferred, and the lsb byte is zero-filled for 32-bit data transfer (i.e., in the second 16-bit word). To accommodate 8- and 16-bit modes, two extended address bits are included. These bits (EADDRESS[1:0]) are located at the lsb-end of the address bus. In master mode, these are driven output lines. In slave mode, they are configured as inputs and are driven by the external controller.

The following subsections describe data transfers via the parallel port for different sources and destinations. In all types of parallel port data transfers, signal values at the slave SPROC chip's mode (MODE[2:0]) and address (ADDRESS[15:0]) inputs must be stable before the chip select ($\overline{CS}$) and read ($\overline{RD}$), or chip select and write ($\overline{WR}$) request goes LOW. At that time, the address is latched into the slave SPROC chip. Subsequently, after values on the data bus (DATA[23:0]) become valid, data is latched at the destination on the rising edge of the request.

To allow asynchronous communication with slow peripherals in master mode, the parallel port supports programmable WAIT states. In a preferred embodiment, a maximum of seven WAIT states are possible, where each state corresponds to one SPROC chip machine cycle, or five master clock pulses.

The parallel port also generates a handshaking signal, $\overline{DTACK}$ (data transfer acknowledge) in slave mode. This normally-HIGH signal goes LOW when the SPROC chip presents valid data in a read operation, or is ready to accept data in a write operation. $\overline{DTACK}$ is cleared when the external $\overline{RD}$ or $\overline{WR}$ strobe goes HIGH.

If enabled, a watchdog timer monitors all data transfers, and resets the parallel port if the transaction time is greater than 256 machine cycles.

A.2 Master SPROC Chip Read from Slave SPROC Chip or Peripheral

A master SPROC chip initiates a read operation from a memory-mapped peripheral or external memory by reading an off-chip memory location. Prior to initiating the READ, the master SPROC chip should set up the communication mode. This includes 8-, 16-, or 24-bit data select, msb/lsb byte order, and number of WAIT states required for the peripheral. The master's internal parallel port mode register controls these options, and therefore should have been previously written to. In master mode, three bits of the parallel port mode register determine number and order of bytes transferred and are output at pins MODE[2:0]. These pins should be connected to the corresponding slave SPROC chip pins, which function as inputs in slave mode, to ensure the slave's communication mode matches the master's.

After a read cycle is initiated by the master SPROC chip, no further read or write requests to the parallel port are possible until the current read cycle has been completed. The parallel port will set up a stable address and then drive the $\overline{RD}$ strobe LOW. The strobe will remain LOW for the number of WAIT states configured in the master's parallel port mode register, and will then be driven HIGH. The data resident on the data bus will be latched into the master SPROC chip on the rising edge of the $\overline{RD}$ strobe.

If the transmission mode is 8- or 16-bit format, the read cycle will be repeated with the next extended address-output, as determined by the state of EADDRESS[1:0], until 24 bits of data have been received. The master's parallel port input register is then updated, and the read cycle is complete. The GSP in the master that initiated the read operation must then read the contents of the parallel port input register. With the read cycle completed, the data bus I/O drivers will be reconfigured as output drivers to prevent the data bus from floating. The address bus will be driven with the last address.

A.3 Master SPROC Chip Write to Slave SPROC Chip or Peripheral

A master SPROC chip initiates a write operation to a memory-mapped peripheral or external memory by writing to an off-chip memory location. Prior to initiating the WRITE, the master SPROC chip should set up the communication mode. This includes 8-, 16-, or 24-bit data select, msb/lsb byte order, and number of WAIT states required for the peripheral. The master's internal parallel port mode register controls these options, and therefore should have been previously written to. In master mode, three bits of the parallel port mode register determine number and order of bytes transferred and are output at pins MODE[2:0]. These pins should be connected to the corresponding slave SPROC chip pins, which function as inputs in this mode, to make the slave's communication mode match the master's.

After a write cycle is initiated by the master SPROC chip, in the preferred embodiment no further read or write requests to the parallel port are possible until the current write cycle is complete. The parallel port will output a stable address and then chive the $\overline{WR}$ strobe LOW. The strobe will remain LOW for the number of WAIT states configured in the master's parallel port mode register. Valid data will be setup on the data bus, and the $\overline{WR}$ strobe will be driven HIGH after the WAIT interval, latching the data into the slave SPROC chip or peripheral. If the interface is configured in 8- or 16-bit mode, the cycle will be repeated until all bytes have been in output. After transmission of the last byte or word, the address bus and data bus will remain driven.

A.4 Read from Slave SPROC Chip by an External Controller

The external controller will set up address, extended address, and mode inputs, and drive the SPROC chip's chip select input LOW. (If the communication mode will never change, the SPROC chip's MODE[2:0] inputs could be tied to the appropriate logic levels.) The external controller will then drive $\overline{RD}$ LOW, which will latch the address, extended address (EADDRESS[1:0]), and mode inputs into the slave SPROC chip. The SPROC chip will asynchronously fetch data from the requested internal RAM location. Data will be latched into the external controller when it drives the $\overline{RD}$ line HIGH again. The controller must ensure that enough time has been given to the slave SPROC chip to fetch the data, given the asynchronous nature of the interface. Alteratively, the SPROC chip drives its nominally-high $\overline{DTACK}$ (data transfer acknowledge) LOW after it has completed the READ, and the controller need only wait for this event before raising X TO(RD). At that time, the SPROC chip would correspondingly raise $\overline{DTACK}$.

If the interface is configured for 8- or 16-bit communication, the external controller must set up multiple extended addresses and $\overline{RD}$ strobes.

A.5 Write to Slave SPROC Chip by an External Controller

The external controller will set up address, extended address, and mode inputs, and drive the SPROC chip's chip select input LOW. (If the communication mode will never change, the SPROC chip's MODE[2:0] inputs could be tied to the appropriate logic levels.) The external controller will then drive $\overline{WR}$ LOW, which will latch the address, extended address, and mode inputs into the slave SPROC chip. When the controller returns $\overline{WR}$ to HIGH, the data present on the data bus will be latched into the SPROC chip.

If the interface is configured for 8- or 16-bit communication, the external controller must set up multiple extended addresses and $\overline{WR}$ strobes.

After the final byte or word has been transferred, the data will be asynchronously written to the requested address in SPROC chip RAM.

A.6 Data Transfer Modes

MODE[0] and MODE[1] determine the number of bytes transferred per $\overline{RD}/\overline{WR}$ strobe. MODE[0] distinguishes between a partial word of 8- or 16-bits, and a full 24-bit word. MODE[1] distinguishes between the partial transfers of 8- and 16-bits. All data transfers are aligned with the least significant byte of the data bus. For 16-and 24-bit modes, the most significant byte is left-justified within the data word, with descending order of significance in lower order data bus bytes.

| MODE[1] | MODE[0] | DATA |
|---|---|---|
| 0 | 0 | 8-bit |
| 1 | 0 | 16-bit |
| X | 1 | 24-bit |

MODE[2] determines the byte or word ordering for 8- and 16-bit modes:

| MODE[2] | BYTE/WORD ORDER |
|---|---|
| 0 | msb first |
| 1 | lsb first |

EADDRESS[1,0], the extended address, specifies which portion of the full 24-bit word is currently being output on the data bus for 8- and 16-bit modes:

| EADDRESS[1] | EADDRESS[0] | BYTE |
|---|---|---|
| | 8-BIT MODE, MODE[2] = 0 | |
| 0 | 0 | msb |
| 0 | 1 | mid |
| 1 | 0 | lsb |
| 1 | 1 | unused (write)<br>0 byte (read) |
| | 8-BIT MODE, MODE[2] = 1 | |
| 0 | 0 | unused (write)<br>0 byte (read) |
| 0 | 1 | lsb |
| 1 | 0 | mid |
| 1 | 1 | msb |

In receive data mode, the lower byte of the lsb 16-bit word is unused by the SPROC chip. Similarly, in transmit mode, the lower byte of the lsb 16-bit word is filled with zeros. All data is msb-justified. The word ordering for 16-bit data is determined by EADDRESS[1]:

| EADDRESS[1] | EADDRESS[0] | WORD |
|---|---|---|
| | 16-BIT MODE, MODE[2] = 0 | |
| 0 | X | msb |
| 1 | X | lsb |
| | 16-BIT MODE, MODE[2] = 1 | |
| 0 | X | lsb |
| 1 | X | msb |

Data transfer in 8- and 16-bit modes is completed when the EADDRESS lines designate the final byte or word, namely, the lsb when MODE[2] is LOW, or the msb when MODE[2 ]is HIGH.

A.7 Boot Mode

A SPROC chip enters boot mode when it is configured as a master SPROC chip (its MASTER input is HIGH) and the reset input ($\overline{RESET}$) executes a LOW to HIGH transition. During boot, the parallel port is set for 8-bit mode with the maximum number of WAIT states (seven). The master SPROC chip runs an internal program, stored in its control ROM, to upload its configuration from an external 8-bit EPROM into internal RAM. The master SPROC chip will then configure any slave SPROC chips present in the system. The EPROM will be selected by a HIGH on the master SPROC chip's chip select ($\overline{CS}$) pin, which is an output in master mode. Slave SPROC chips or memory-mapped peripherals will be selected by a LOW at this signal. In master mode, the value of the $\overline{CS}$ output is controlled by a bit set in the transmit mode register, which is the second byte of the parallel port mode register.

A.8 Watchdog Timer

The parallel port incorporates a simple watchdog timer circuit to prevent any undesirable lockup states in the interface. In both master and slave modes, a read or a write flag is set (in the parallel port status register) on the initiation of a read or write operation. This flag is reset on a successful completion of the operation. If, for some reason, the host controller hangs-up in slave mode, or an invalid condition occurs in master mode, the watchdog timer will detect the situation and clear the interface flags, allowing the next operation to be accepted and executed. The watchdog timer is fixed at 256 machine cycles (1280 master clock cycles).

The watchdog timer is enabled by setting bit 16 of the parallel port mode register. SPROC reset will disable the watchdog timer. If the watchdog timer is triggered, a flag is set in the parallel port status register.

A.9 Multiple I/O Lockout

If the parallel port is performing a read or write operation in master mode, and a second write or read operation is initiated before the first I/O operation is completed, the second I/O request is locked out. A lockout flag is set in the parallel port status register.

A.10 Input/Output Flags and Lines

The RTS and GPIO signals can be used for communication protocols between master and slave SPROC chips. These signals could be used as data-ready signals, requests for data, or microprocessor interrupt requests. RTS[3:0] (request to send) are four pins that function as inputs for a master SPROC chip and as outputs for a slave SPROC chip. The RTS signals of a slave SPROC can be individually set or cleared via the parallel port, as described below.

GP[3:0] are four general purpose pins that are individually configurable as either inputs or outputs. During reset, when $\overline{RESET}$ is LOW, all GPIO signals are set up as inputs. In addition to being subject to internal program control, the configuration of each GP pin, and the value of each GPIO signal configured as an output, are also individually controllable via the parallel port.

A.11 Parallel Port Registers

The parallel port utilizes five memory-mapped registers for status and control functions. The tables below list the registers and their bit definitions.

Parellel Port Registers

| REGISTER ADDRESS | REGISTER NAME | READ/WRITE |
|---|---|---|
| 4FB | Lockout and watchdog flag clear | write |
| 4FC | Parallel port status register | read |
| 4FD | Parallel port input register | read |
| 4FE | Parallel port GPIO/RTS control register | write |
| 4FF | Parallel port mode register | write |

Parallel Port Register Bit Definitions

| BIT | REGISTER 4FC | REGISTER 4FE | REGISTER 4FF |
|---|---|---|---|
| 0 | GP[0] INPUT | SETRTS[0]; | RX MODE[0] |
| 1 | GP[1] INPUT | SET RTS[1] | RX MODE[1] |
| 2 | GP[2] INPUT | SET RTS[2] | RX MODE[2] |
| 3 | GP[3] INPUT | SET RTS[3] | RX WAIT STATES [0] |
| 4 | MODE[0] | CLEAR RTS[0] | RX WAIT STATES [1] |
| 5 | MODE[1] | CLEAR RTS[1] | RX WAIT STATES [2] |
| 6 | MODE[2] | CLEAR RTS[2] | RX STROBE DELAY |
| 7 | PARALLEL PORT BUSY FLAG | CLEAR RTS[3] | PARALLEL PORT SOFT RESET |
| 8 | LOCK OUT FLAG | SET GPIO[0] | $\overline{CS}$ (master mode only) |
| 9 | WATCHDOG FLAG | SET GPIO[1] | TX MODE[0] |
| 10 | READ FLAG | SET GPIO[2] | TX MODE[1] |
| 11 | WRITE FLAG | SET GPIO[3] | TX MODE[2] |
| 12 | RTS[0] INPUT | CLEAR GPIO[0] | TX WAIT STATES [0] |
| 13 | RTS[1] INPUT | CLEAR GPIO[1] | TX WAIT STATES [1] |
| 14 | RTS[2] INPUT | CLEAR GPIO[2] | TX WAIT STATES [2] |
| 15 | RTS[3] INPUT | CLEAR GPIO[3] | TX STROBE DELAY |
| 16 | N/A | OUTPUT GPIO[0] | WATCHDOG ENABLE |
| 17 | N/A | OUTPUT GPIO[1] | N/A |
| 18 | N/A | OUTPUT GPIO[2] | N/A |
| 19 | N/A | OUTPUT GPIO[3] | N/A |
| 20 | NA/ | INPUT GPIO[0] | N/A |
| 21 | N/A | INPUT GPIO[1] | N/A |
| 22 | N/A | INPUT GPIO[2] | N/A |
| 23 | N/A | INPUT GPIO[3] | N/A |

The parallel port status register, a 16-bit register, contains signal values of selected SPROC chip pins and I/O status flags. This register is updated every machine cycle (5 master clock cycles). Bits 0 through 3 contain the current signal values at the GP pins, which could individually be configured either as inputs or outputs. Similarly, bits 12 through 15 contain the current values at the RTS pins, which are inputs for a master SPROC chip and outputs for a slave. Bits 4 through 6 contain the current value of the MODE configuration.

Parallel port status register bit 10 contains the read flag, which is set while the parallel port is performing a read operation. Similarly, bit 11 contains the write flag, which is set during a write operation. (For 8- and 16-bit modes, these flags remain set until the entire 24-bit data word has been transferred.)

Bit 7 is set while the parallel port is busy servicing an I/O transaction. Bit 8 is set if the parallel port is busy in master mode and another read or write request is received. The second request will be locked out and the lockout flag set. Bit 9 is set if the watchdog timer is enabled and it detects a timeout out condition. Bits 8 and 9 can only be cleared by a SPROC reset or any write to the lockout and watchdog flag clear register.

Any write to the Watchdog/Lockout Flag Clear Register clears watchdog and/or lockout flags set in the parallel poll status register.

The parallel port input register, a 24-bit register, holds the data word received during a read operation for subsequent storage at the destination address. This register also buffers and assembles the incoming data for 8- and 16-bit modes. This register must be read by a GSP or the access port.

The parallel port GPIO/RTS Control register, a 24-bit register, is used to independently configure each GP pin as either an input or an output. It is also used to individually set and clear GP pins that are outputs, and slave SPROC chip RTS pins.

Each RTS or GPIO signal has a dedicated pair of SET and CLEAR bits in the parallel port GPIO/RTS control register. SET and CLEAR bits for RTS signals are in the low byte; SET and CLEAR bits for GPIO signals are in the mid byte. LOW values written to both SET and CLEAR bits results in no change to the associated signal. A HIGH value at the SET bit sets the associated signal HIGH. A HIGH value at the CLEAR bit sets the associated signal LOW. If a HIGH value is written to both SET and CLEAR bits, the CLEAR dominates.

Each GPIO signal additionally has a dedicated pair of OUTPUT and INPUT bits in the high byte of the parallel port GPIO/RTS control register to configure the signal as either an output or an input. LOW values written to both OUTPUT and INPUT bits results in no change to the associated signal. A HIGH value at the OUTPUT bit configures the associated GPIO signal as an output. A HIGH value at the INPUT bit configures the associated GPIO signal as an input. If a HIGH value is written to both OUTPUT and INPUT bits, the INPUT dominates.

The master SPROC chip's parallel port mode register, a 16-bit register, controls the parallel port mode and timing.

When the master SPROC chip is reading from a slave SPROC chip or peripheral, bits 0 through 2 of the parallel port mode register (the RX MODE bits) are output at the master SPROC chip's MODE pins. Register bits 3 through 5 contain the number of WAIT states programmed for the read operation (i.e., they determine the duration of the read strobe LOW level generated by the master SPROC chip). The HIGH level between read strobes is 2 master clock cycles; this duration can be stretched to 5 master clock cycles for slower peripherals by setting bit 6 of the mode register (the RX strobe delay bit).

Similarly, when the master SPROC chip is writing to a slave SPROC chip or peripheral, bits 9 through 11 of the parallel port mode register (the TX MODE bits) are output at the master SPROC chip's MODE pins. Register bits 12 through 14 contain the number of WAIT states programmed for the write operation. The HIGH level between write strobes can be stretched for slower peripherals by setting bit 15 of the mode register (the TX strobe delay bit).

Bit 8 of the mode register is output at the master SPROC chip's $\overline{\text{CS}}$ pin. A soft reset of the parallel port, which resets the interface flags and RTS lines (but not the GPIO or MODE signals), can be initiated by setting bit 7 of this register.

Parallel Port Signal Definitions

| SIGNAL | TYPE* | DESCRIPTION |
|---|---|---|
| ADDRESS[15:0] | O(M)I(S) | ADDRESS BUS |
| $\overline{\text{BUSGRANT}}$ | I | BUS GRANT causes the SPROC chip to three-state the address and data buses, and MODE pins, when LOW. |
| $\overline{\text{BUSY}}$ | O | PARALLEL PORT BUSY is set LOW when an I/O operation is occurring, set HIGH when completed. Also reset HIGH by watchdog timer if a timeout occurs. |
| $\overline{\text{CRESET}}$ | | Tied LOW. |
| $\overline{\text{CS}}$ | O(M)I(S) | CHIP SELECT signal. A slave SPROC chip is selected by setting its $\overline{\text{CS}}$ input LOW. A master SPROC chip generates this signal as an output, expecting to select a slave SPROC chip by setting $\overline{\text{CS}}$ LOW, and an external ROM (containing every slave SPROC chip's configuration) by setting it HIGH. |
| DATA[23:0] | I/O | PARALLEL PORT DATA BUS—24-bit input/output/three-statable bidirectional bus. |
| $\overline{\text{DTACK}}$ | O | DATA TRANSFER ACKNOWLEDGE. In slave mode, set LOW by SPROC chip after $\overline{\text{RD}}$ or $\overline{\text{WR}}$ has gone LOW and the SPROC chip has completed the data transfer, set HIGH after $\overline{\text{RD}}$ or $\overline{\text{WR}}$ line goes HIGH. This output is always HIGH for a master SPROC chip. |
| EADDRESS[1:0] | O(M)I(S) | EXTENDED ADDRESS specifies which portion of the full 24-bit word is currently being transferred in 8- and 16-bit modes. |
| GP[3:0] | I/O | GENERAL PURPOSE I/O lines, individually configurable as either input or output. Can be used to |

-continued

Parallel Port Signal Definitions

| SIGNAL | TYPE* | DESCRIPTION |
|---|---|---|
| ADDRESS[15:0] | O(M)I(S) | ADDRESS BUS |
| | | interface SPROC chips with each other or with an external controller as data-ready, microprocessor interrupt requests, etc. Controlled and configured by a write to parallel port GPIO/RTS control register. |
| MASTER | I | MASTER causes SPROC chip to operate in master mode when HIGH, and in slave mode when LOW. |
| MODE[2:0] | O(M)I(S) | MODE[0] differentiates between full 24-bit mode (HIGH) and partial (8- or 1 6-bit) modes (LOW). MODE[1] differentiates between 8-bit mode (HIGH) and 16-bit mode (LOW) for partial data transfers. MODE[2] specifies whether the first 8- or 16-bit transmission contains the lsb (HIGH) or the msb (LOW). |
| $\overline{\text{RED}}$ | | Tied LOW. |
| $\overline{\text{RD}}$ | O(M)I(S) | READ strobe generated by master SPROC chip or external controller. A LOW value on $\overline{\text{RD}}$ initiates a READ operation. $\overline{\text{RD}}$ must remain LOW long enough to successfully complete the READ; programmed WAIT states or $\overline{\text{DTACK}}$ handshaking may be utilized for this purpose. Data latches at the destination when $\overline{\text{RD}}$ returns HIGH. |
| $\overline{\text{RESET}}$ | I | $\overline{\text{RESET}}$ must be held LOW for a minimum of 25 master clock cycles. after power and clock have stabilized. This input is a Schmitt trigger type which is suitable for use with an RC time constant to provide power-on reset. While $\overline{\text{RESET}}$ is LOW, a master mode SPROC chip will force address, extended address, and SPROC select address LOW, while driving $\overline{\text{CS}}$, $\overline{\text{RD}}$, and $\overline{\text{WR}}$ HIGH. Slave SPROC chips connected to the bus will then be deselected and have driven inputs. MODE[2:0] will be configured for 8-bit boot mode with msb byte first and zero WAIT states. The data bus will be driven. |
| RTS[3:0] | I(M)O(S) | REQUEST TO SEND flags. These pins are outputs for slave SPROC chips and inputs for master SPROC chips. Can be used to interface slave with master or external controller as data-ready, microprocessor interrupt requests, etc. Controlled and configured by write to parallel port GPIO/RTS control register. |
| $\overline{\text{WR}}$ | O(M)I(S) | WRITE strobe generated by master SPROC chip or external controller. A LOW value on $\overline{\text{WR}}$ initiates a WRITE operation. $\overline{\text{WR}}$ must remain LOW long enough to successfully complete the WRITE; programmed WAIT states or $\overline{\text{DTACK}}$ handshaking may be utilized for this purpose. Data latches at the destination when $\overline{\text{WR}}$ returns HIGH. |

*(M) = master mode,
(S) = slave mode,
I = input,
O = output

While the SPROC 10 aforedescribed with a data RAM 100, a program RAM 150, a boot ROM 190, gyps 400, DFMs 600, serial ports 700, and a host port 800, is a powerful programmable signal processor in its own right, it is preferable that the SPROC be able to be programmed in a "user friendly" manner. Toward that end, a compiler system which permits a sketch and realize function is provided, as described more particularly with reference to FIG. 12. In addition, an access port 900 and a probe 1000 are provided as tools useful in the development mode of the SPROC device.

As aforementioned, the access port 900 permits the user to make changes to the program data stored in RAM 150, and/or changes to other data stored in data RAM 100 while the SPROC is operating. In other words, the access port 900 permits memory contents to be modified while the SPROC is running. In its preferred form, and as seen in FIG. 9, the access port 900 is comprised of a shift register 910, a buffer 920, a decoder 925, and a switch 930 on its input side, and a multiplexer 940 and a parallel load shift register 950 on its output side. On its input side, the access port 900 receives serial data as well as a clock and strobe signal from the development host computer. The data is arranged by the shift register 910 and stored in buffer 920 until the access port is granted time division access to the data RAM bus 125 or the program RAM bus 155. A determination as to which bus the data is to be written is made by decode block 925 which decodes the msbs of the address data stored in buffer 920. The decode block 925 in turn controls switch 930 which connects the buffer 920 to the appropriate bus. The msbs of the address data in the buffer 920 are indicative of which RAM for which the data is destined, as the data RAM and program RAM are given distinct address spaces, as previously described.

On the output side, data received via the program RAM bus 155 or the data RAM bus 125 is forwarded via demultiplexer 940 to a shift register 950. The shift register 950 effects a parallel to serial conversion of the data so that serial data may be output together with an appropriate strobe and according to an external clock to a development host computer or the like.

By providing the ability to write and read data to the program and data RAMS, the access port 900 has several uses. First, by writing to a particular location (e.g. 406, or 408-40b Hex) in the data RAM, a program break can be initiated. The contents of the various registers of the GSPs which are written into data RAM as a result of the break can than be read. This information is particularly important in the debugging process. Second, if desired, the contents of the registers of the GSPs (as stored in the data RAM) can be modified prior to exiting the break mode by writing data to desired data RAM locations, thus providing an additional tool in the debugging process. Third, if desired, the program (including microinstructions and/or parameters stored as part of microinstructions) stored in the program RAM itself can be altered "on the fly", and can provide the developer with the ability to monitor (in conjunction with the probe 1000 hereinafter described) how a change in a parameter(s) or a change in the program could effect the functioning of the SPROC.

The probe 1000 seen in FIG. 8 permits the user to see internal signals generated by the SPROC by monitoring the data RAM bus 125 and capturing the values of data written to one or more data RAM locations. The probe 1 000 is generally comprised of a comparator 1010, a DFM 1060 with an input section 1060*a* and an output section 1060*b*, and a digital to analog converter 1070. The comparator 1010 is programmable such that any data RAM address may be monitored. The data RAM address is monitored by coupling the comparator 1010 to the data RAM bus 125 and comparing via XNOR gates (not shown) the programmed address to the addresses placed on the bus. When the addresses match, and it is determined that data is being written to the data RAM as opposed to being read from the data RAM, the data is read into the input DFM section 1060*a*, which stores the data until the probe is granted access for writing data to the data RAM 100. At that time, the probe 1000 writes the data to its own buffer in the data RAM. When the probe 1000 is granted access for reading data from the data RAM 100, the output DFM section 1060*b* of the data probe 1000 pulls the data from its data RAM buffer at the speed set by the output DFM section's divide by N block. The data is then forwarded to the D/A converter 1070 where it is converted into analog format so that it can be viewed on an oscilloscope. In this manner, signals which are being written to any data RAM location may be monitored in real time as desired. By using the access port 900 and the probe 1000 together, the affect of a change of a parameter value entered via the access port 900 may be immediately viewed as an analog signal via probe 1000. Additional details of the probe may be seen with reference to previously incorporated Ser. No. 07/663,395.

As seen in FIG. 9, a plurality of SPROC devices 10*a*, 10*b*, 10*c*, . . . may be coupled to together as desired to provide a system of increased signal processing capabilities. Typically, the SPROC devices are coupled and communicate with each other via their serial ports 700, although it is possible for the SPROCs to communicate via their parallel host ports 800. The system of SPROCs can act as a powerful signal processing front end to a logic processor (e.g., microprocessor) 1120, or if desired, can interface directly with electromechanical or electronic components.

B. SPROC Development System and Software

The above-disclosed SPROC devices 10 are preferably programmed via a development system (SPROClab). The SPROClab development system is a complete set of hardware and software tools for use with a PC to create, test, and debug digital signal processing designs. It was created as a design tool to support the development of code for the SPROC signal processing chip.

B.1 Overview

The development system provides an interactive design environment to create processing subsystems in graphical form, as signal flow diagrams, and implement those subsystems easily and efficiently on the SPROC chip. Using the system, one can develop efficient signal processing subsystems without having to manually write code or lay out and tune analog circuits.

Together with a PC and oscilloscope or other verification equipment, the development system supports the entire development process, including interactive debugging and design verification. Once the designer completes design development, the designer can easily include the signal processing subsystem in the actual application using a SPROC chip and the code generated by the development system.

The preferred process of programming a SPROC is as follows. The designer must first define the signal processing application and determine design requirements. The design is then preferably placed by the designer in a signal flow diagram (using a graphic user interface). Parameters for the various blocks of the design are defined by the designer, including parameters of filters (e.g., low-pass or high pass, and cut-off frequency) and, if desired, transfer functions. Once the signal flow diagram and parameters of the blocks in the signal flow diagram are set, the diagram and parameters are automatically converted into code by the software.

The development system's SPROCview graphical design interface enables a simple graphical approach to design capture. Capturing the design consists of entering the design as a signal flow diagram. To enter the diagram, the designer arranges and connects icons that represent processing functions into a schematic diagram defining the signal flow of the system. As the designer selects and places the icons, certain variables and parameters must also be entered that define how the functions represented by the icons will operate. For example, if a design includes an amplifier function, its gain value must be specified.

Some functions, like filters and transfer functions, are too complex to be defined using simple parameters. For these functions, one must create a separate data file that includes the detailed definition of the function. When using a filter or a transfer function in a diagram, one must enter a parameter to identify the data file that contains the definition of the function.

The schematic diagram and its associated definition data files are the representation of the design upon which all other steps of the process build. The designer should consider them the base record of the design, and always make sure they are current.

In designs that include filters or transfer functions, the designer must create the data files that specify the definition of the functions. The SPROCfil filter design interface provides an interactive environment for designing filters. The designer must define transfer functions using a text editor.

After the designer captures the design and defines any necessary filters or transfer functions, the diagram and definition data files must be converted into code and a configuration file must be generated to run on the chip. The SPROCbuild utility completes this for the designer by automatically converting the diagram and data files into code, scheduling and linking the code, and generating a configuration file for the chip.

Each time the designer modifies the diagram or the definition data files, the files must be converted again to produce an up-to-date configuration file.

To debug a design, the designer must transfer the configuration file onto the chip and run the design. The SPROCdrive interface (SDI) allows one to write the configuration to the chip and begin design execution. Using SDI, the designer can evaluate design performance by accessing the value of data in chip memory. If the development system is connected to an oscilloscope, one can view the waveforms represented by this data. If the development system is connected to a target analog subsystem, one can see how the design performs in the actual application.

To optimize the design, the designer can modify the values of data and observe the corresponding changes in design performance. If the development system is connected to a signal generator, one can simulate various input signals and evaluate how the design reacts.

Changes made to design parameters using SDI are temporary. The designer must modify the schematic diagram and/or definition data files, then convert the files again and generate a new configuration file to make design modifications permanent.

Once the designer has debugged and optimized the design, modified the diagram, and generated the final configuration file, the signal processing design can be ported for use in the end application.

If the application is to run from a self-booting chip, the configuration file can be used to burn an EPROM, and the chip and its EPROM can be placed on a specific printed circuit board.

If the application is to run from a microprocessor, the SPROClink microprocessor interface (SMI) helps the designer develop a microprocessor application that can use the signal processing design. The designer must generate a special version of the configuration file, create the microprocessor application, and memory map the chip into the microprocessor configuration.

The development system comprises both hardware and software tools designed to help the designer complete the development process. The tools are designed in parallel with the SPROC chip to extract maximum efficiency and performance from the chip without compromising ease-of-use.

The development system includes hardware and software. The hardware components are described as follows:

The SPROCboard evaluation board is a printed circuit board with one SPROC chip, digital-to-analog and analog-to-digital converters, and various communications interfaces and additional components and circuitry necessary to evaluate signal processing design performance during development. The designer can connect an oscilloscope, signal generator, or analog subsystem to the evaluation board to verify and evaluate the design. The SPROCbox interface unit provides an I/O connection between the SPROCboard evaluation board and the PC. It also connects the evaluation board to the power supply unit. The power supply unit converts AC power from a standard wall outlet to 5 VDC and 12 VDC power for use by the interface unit and evaluation board. An RS-232 cable connects the PC serial I/O port to the SPROCbox serial I/O port. A special access port cable connects the SPROCbox interface unit to the SPROCboard evaluation board. A security key connects to the PC parallel port. It enables use of the development system software. An integral power cord connects the power supply unit to the AC outlet. A positive-locking DC power cable connects the power supply to the SPROCbox interface unit. An auxiliary DC power cable daisy chains power from the interface unit to the SPROCboard evaluation board.

The software components of the development system are described as follows:

the SPROClab development system shell executes under MS-DOS and provides access to all development system software components from a selection menu. The shell controls function calls among development system software components and provides a means for the designer to change certain system defaults. The SPROCview graphical design interface provides for easy creation of signal flow block diagrams by supporting the import of designs created using several common schematic capture packages. The basic development system configuration supports version 4.04 of OrCAD software and its schematic capture tool, Draft.

The graphical design interface includes the library structure required to use the SPROCcells function library with OrCAD software. The SPROCcells function library includes cells containing DSP and analog signal processing functions for use in diagram creation. A cell is a design primitive that includes an icon required to place a function in a signal flow diagram, the code required to execute the function, and specifications for the parameters required to define the cell. The SPROCfil filter design interface supports the definition and analysis of custom digital filters. The filter design interface creates the custom code and definition data for filter cells placed in designs during diagram entry. The SPROCbuild utility converts signal flow block diagrams and their associated data files into the configuration file necessary to run on the chip. The utility interprets the output from schematic entry and incorporates associated code blocks and parameter data for cells, filter design definitions, and transfer function definitions, then schedules and links the instructions to best utilize resources on the chip. It automatically generates efficient code based on the designer's signal flow block diagram.

The SPROCdrive interface (SDI) loads the configuration file onto the chip and starts execution. SDI commands give the designer access, through the SPROCbox interface unit, to interactively test and debug the design while it runs on the chip. One can probe and modify signal values and design parameters to tune and optimize the processing subsystem.

B.1.1 The SPROCcells Function Library

The SPROCcells function library contains over fifty predefined functions which can be used through the graphical interface of the SPROClab development system. Some cells have predefined trigger keys that aid in defining cell parameters for designs captured using OrCAD® software. Most cells include code for both inline and subroutine forms. The subroutine form of a cell performs a function identical to the corresponding inline form but includes overhead instructions that make the code in the subroutine body block re-entrant. Other subroutine versions of the cell do not include the code in their body blocks, but call the code in the body block of the first subroutine version of the cell.

Several cells, including those used for microprocessor access, are described in detail below with reference to function, algorithm, terminals, parameters, macro keys, execution time, resource usage, and icon. The function provides a brief description of the operations or calculations performed by the cell. The algorithm (where applicable) details the methodology used to implement the cell function. Terminals are the inputs and outputs for a cell. Each terminal is associated with pin number on the cell's icon. The variable type, range of legal values, and default value are provided for each terminal. Parameters are specifications that define the function of a particular instance of a cell. Parameter names and default values (where applicable) are provided for each cell. Parameter descriptions use the exclusive OR character (|) in listings of legal parameter values. This character indicates that only one of the listed choices may be used. Execution rime is the maximum number of instruction cycles required to complete the code for a cell instance. Execution time differs for the in-line form and subroutine form (where applicable) of each cell. Resource usage is the number of memory locations required by @the cell. Resources include program memory allocations for instructions and data memory allocations for variables. Resource usage differs for the in-line form and subroutine form (where applicable) of each cell. Each cell is represented in the graphical display as an icon. Other examples of cell icons can be seen in FIG. 11 discussed in detail below. Source code for several of the cells described below is attached hereto as appendix B.

CMULT

Function: The complex multiplier cell performs multiplication of the form: $i+jq=(x+jy)*(\cos+j\sin)=(x*\cos-y*\sin)+j(x*\sin+y*\cos)$ Terminals:
pin 1:i $-2.0 \leqq \text{output} < 2.0$ (fixed point format)
pin 2:q $-2.0 \leqq \text{output} < 2.0$ (fixed point format)
pin 3:x $-2.0 \leqq \text{input} < 2.0$ (fixed point format)
pin 4:y $-2.0 \leqq \text{input} < 2.0$ (fixed point format)
pin 5:cos $-2.0 \leqq \text{input} < 2.0$ (fixed point format)
pin 6:sin $-2.0 \leqq \text{input} < 2.0$ (fixed point format).

Parameters:
Required: none
Optional: subr=off|on (default is determined by the Schedule module).
OrCAD Macro Keys: None defined
Execution Time:
In line: code duration is 16 cycles maximum
Subroutine: code duration is 22 cycles maximum.
Resource Usage:
In line:
16 program RAM locations
6 data RAM locations
Subroutine:
(5*#_of_instances)+17 program RAM locations
(11*#_of_instances) data RAM locations
Icon:

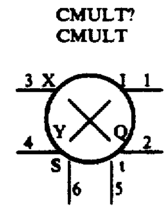

DSINK

Function: The dsink cell accumulates two series of input samples (each size determined by the length parameter) into two blocks of data RAM. The blocks are stored beginning at symbolic location 'instance_name.outvector1' and 'instance_name.outvector2'. Both blocks (vectors) are accessible from an external microprocessor.

Terminals:
pin 1:ina $-2.0 \leqq \text{input} < 2.0$ (fixed point format)
pin 2:inb $-2.0 \leqq \text{input} < 2.0$ (fixed point format).

Parameters:
Required: none
Optional:
length=$1 \leqq \text{length} \leqq 256$ (default: length=128)
subr=off|on (default is determined by the Schedule module).
OrCAD Macro Keys: <ALT>K.
Execution Time:
In line: code duration is 10 cycles maximum
Subroutine: code duration is 17 cycles maximum.
Resource Usage:
In line:
10 program RAM locations
2*length+3 data RAM locations
Subroutine:
(4*#_of_instances)+13 program RAM locations
((2*length+5)*#_of_instances) data RAM locations
Icon:

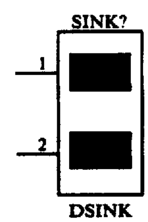

DSINKRD

Function: The dsinkrd cell accumulates two series of input samples (each size determined by the length parameter) into two blocks of data RAM. The blocks are stored beginning at symbolic location 'instance_name.outvector1' and 'instance_name.outvector2'. Both blocks (vectors) are accessible from an external microprocessor. A reset input is available: if≧0.5, the cell is held in reset, otherwise the cell can capture a series of input samples. The done output is zero if the cell is reset or capturing input samples, else the done output is one. The done output needs to be terminated, either by another block or by a dummy module. Reset is only effective when the sink block is full.

Terminals:

pin1:done O|1.0 (fixed point format)

pin 2:ina $-2.0 \leq$ input $< 2.0$ (fixed point format)

pin 3:inb $-2.0 \leq$ input $< 2.0$ (fixed point format)

pin 4: reset $-2.0 \leq$ input $< 2.0$ (fixed point format).

Parameters:

Required: none

Optional:

length $= 1 \leq$ length $\leq 256$ (default: length $= 128$)

subr=off|on (default is determined by the Schedule module).

OrCAD Macro Keys: <ALT>K.

Execution Time:

In line: code duration is 14 cycles maximum

Subroutine: code duration is 22 cycles maximum.

Resource Usage:

In line:

20 program RAM locations

2*length+5 data RAM locations

Subroutine:

(6 *#_of_instances)+23 program RAM locations ((2*length+8)*#_of_instances) data RAM locations Icon:

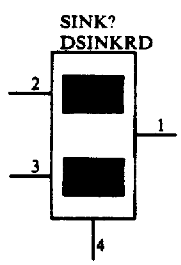

EXT_IN

Function: The ext_in cell provides an external (off chip) input into the SPROC device. Typically the external input cell is used in conjunction with an external microprocessor.

Terminals:

pin 1:out $-2.0 \leq$ output $< 2.0$ (fixed point format)

Parameters:

Required: trigger=SIPORT0|SIPORT1|c10|c11|c12|c13 rate=sample rate of trigger in Hz.

Optional: zone=alphanumeric name of timezone (default is null zone).

OrCAD Macro Keys: None defined.

Execution Time:

In line: code duration is 0 cycles.

Resource Usage:

In line:

0 program RAM locations 0 data RAM locations.

Icon:

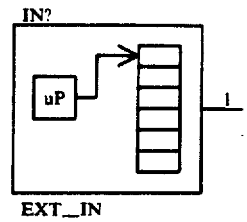

EXT_OUT

Function: The ext_out cell provides an external (off chip) output. Typically the external output cell is used in conjunction with an external microprocessor.

Terminals pin 1: in $-2.0 \leq$ output $< 2.0$ (fixed point format).

Parameters:

Required: none

Optional: none.

OrCAD Macro Keys: None defined.

Execution Time:

In line: code duration is 0 cycles.

Resource Usage:

In line:

0 program RAM locations 0 data RAM locations.

Icon:

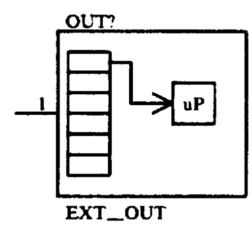

FILTER

Function: The filter cell is used for the implementation of filters designed with SPROCfil. For each instance of this cell there must be an associated filter data file produced by SPROCfil, an fdf file. This is identified with the spec parameter. An optional type parameter allows filter type verification during the compilation process.

Algorithm: Each IIR filter cell in a SPROCfil design is implemented as a cascade of biquad cells, plus a bilinear cell for odd order filters. An FIR filter cell in a SPROCfil design is split into blocks, with a default of 30 coefficients; this is a scheduler parameter.

Terminals:

pin 1:out $-2.0 \leq$ output $< 2.0$ (fixed point format)

pin 2:in $-2.0 \leq$ input $< 2.0$ (fixed point format).

Parameters:

Required: spec=file name (file stored in working directory .fdf)

Optional: type lowpass |highpass|bandpass|bandstop (allows the Schedule module to check that the filter file chosen matches the filter type desired).

OrCAD Macro Keys: <ALT>F.

Execution Time

In line: code duration is filter dependent.

Resource Usage

In line:

program RAM usage is filter dependent
data RAM usage is filter dependent.

Icon:

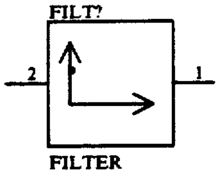

LN

Function: The natural logarithm is calculated using an eight term truncated series: $\ln(in)=\ln(1+x)=x-x^2/2+x^3/3-x^4/4+x^5/5"x^6/6+-x^7/7-x^8/8$. In order to increase accuracy at the ends of the range of the input the following compression approach is applied: if $in>1.375$, $in=in/2$ and $out=\ln(in)+\ln(2)$; if $0.1353\leqq in<0.6875$, $in=2*in$ and $out=\ln(in)-\ln(2)$; if $0.6875\leqq in \leqq 1.375$, $out=\ln(in)$. The percentage accuracy varies, with the highest error in the input range of 0.32 to <2.0 being 0.003%, and the highest error in the input range below 0.32 being 0.9%.

Terminals pin 1:out $-2.0\leqq output\leqq 0.6931$ (fixed point format)

pin 2:in $0.1353\leqq input<2.0$ (fixed point format).

Parameters:

Required: none

Optional: none.

OrCAD Macro Keys: None defined.

Execution Time:

In line: code duration is 47 cycles maximum

Subroutine: code duration is 50 cycles maximum.

Resource Usage

In line:

52 program RAM locations 8 data RAM locations

Subroutine:

(4*#_of_instances)+50 program RAM locations (4*#_of_instances)+5 data RAM locations Icon:

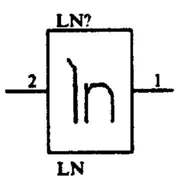

SINK

Function: The sink cell accumulates a series of input samples (size determined by the length parameter) into a block of data RAM. The block is stored beginning at symbolic location 'instance_name.outvector'. This block (vector) is accessible from an external microprocessor.

Terminals:

pin 1:in $-2.0\leqq input<2.0$ (fixed point format)

Parameters:

Required: none

Optional:

length=1≦length≦512 (default: length=128)

subr=off|on (default is determined by the Schedule module).

OrCAD Macro Keys: <ALT>K.

Execution Time:

In line: code duration is 8 cycles maximum.

Subroutine: code duration is 13 cycles maximum.

Resource Usage:

In line:

8 program RAM locations length+2 data RAM locations

Subroutine:

(3*#_of_instances)+11 program RAM locations ((length+4)*#_of_instances) data RAM locations.

Icon:

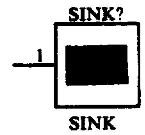

SINKRD

Function: The sinkrd cell accumulates a series of input samples (size determined by the length parameter) into a block of data RAM. The block is stored beginning at symbolic location 'instance_name.outvector'. This block (vector) is accessible from an external microprocessor. A reset input is available: if≧0.5, the cell is held in reset otherwise the cell can capture a series of input samples. The done output is zero if the cell is reset or capturing input samples, else the done output is one. Reset is only effective when the sink block is full.

Terminals:

pin 1:done 0|1.0. (fixed point format)

pin 2:in $-2.0\leqq input<2.0$ (fixed point format)

pin 3:reset $-2.0\leqq input<2.0$ (fixed point format).

Parameters:

Required: none

Optional:

length=1≦length ≦512 (default: length=128)

subr=off|on (default is determined by the Schedule module).

OrCAD Macro Keys: <ALT>K.

Execution Time:

In line: code duration is 12 cycles maximum

Subroutine: code duration is 18 cycles maximum.

Resource Usage

In line:

18 program RAM locations length+4 data RAM locations.

Subroutine:

(5*#_of_instances)+20 program RAM locations ((length+6)*#_of_instances) data RAM locations Icon

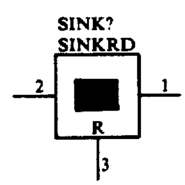

SOURCE

Function: The source cell repetitively reads a block of user specified sample values. The samples must be contained in a file, one sample per line, within the working directory, before scheduling. Source reads the samples one at a time from the block in data RAM, and the number of samples is specified by the length parameter. The block's position in RAM begins at symbolic location 'instance_name.invector'. This block (vector) is accessible from an external microprocessor. Values of the sample data must be in the range from $-2.0$ to $<2.0$ fixed point, but values can also be represented in hexadecimal and signed integer notation.

Terminals pin 1:out $-2.0 \leqq out < 2.0$ (fixed point format).

Parameters:

Required:

file=a file of data samples, e.g. "filblock.dat"

trigger=SIPORT0|SIPORT1|c10|c11|c12|c13 rate=sample rate of trigger in Hz.

Optional:

length=$1 \leqq length \leqq 512$ (default: length=128)

zone=alphanumeric name of time zone (default is null zone)

subr=off|on (default is determined by the Schedule module).

OrCAD Macro Keys: <ALT>R.

Execution Time:

In line: code duration is 9 cycles maximum.

Subroutine: code duration is 17 cycles maximum.

Resource Usage:

In line:

9 program RAM locations length+2 data RAM locations.

Subroutine:

(3*#_of_instances)+14 program RAM locations ((length+4)*#_of_instances) data RAM locations Icon:

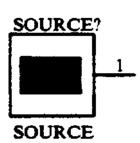

Other cells in the function library include: ACOMPRES, AEXPAND, AGC, AMP, ANTILN, BILINEAR, BIQUAD, DECIM, DIFFAMP, DIFFCOMP, DIFF_LDI, FIR, FWG_NEG, FWR_POS, GP_IN, GP_OUT, HARDLIM, HWR_NEG, HWR_POS, INTERP, INT_LDI, INT_RECT, INTR_LDI, INT_Z, MINUS, MULT, NOISE, PLL_SQR, PULSE, QUAD_OSC, RTS_IN, RTS_OUT, SCALER, SER_IN, SER_OUT, SINE, SINE_OSC, STEO_IN, STEO_OUT, SUM2 through SUM10, TRANSFNC, UCOMPRES, UEXPAND, VCO_SQR, and VOLTREF.

B.2 Entering a Diagram

The SPROClink microprocessor interface (SMI) provides software components necessary to develop microprocessor applications in ANSI C that include the SPROC chip as a memory-mapped device.

Using the development system the designer captures the signal processing subsystem design by creating a signal flow block diagram that represents it. The diagram is created by using a schematic capture package to arrange and connect signal processing functions, or cells, in an order representing the signal flow of the subsystem.

A cell is a design primitive corresponding to a specific block of SPROC description language (SDL) code. The SPROCcells function library includes many commonly used cells, and the designer can create additional cells in SDL to meet special needs. Each cell has a graphical symbol, or icon, that represents the cell and illustrates the number of inputs and outputs the cell uses. A function is inserted into the signal processing flow by placing the icon for that cell into the signal flow diagram and connecting, or wiring, the icon to other icons in the diagram.

In addition, each cell has a set of characteristics, called parameters, that identify the cell and allow its detailed operational specifications to be defined. Most cells have parameters that specify simple operational values, but some cells are more complex. For example, filter and transfer function cells require entire data files to completely define their operations. In such cases, the cell's parameter does not define a simple operational value, it specifies the name of a data file containing the complex definition.

When the icon for a cell is inserted into a signal flow diagram, the inputs and outputs are connected, and parameters for that occurrence of the cell are specified, the designer must create an instance of the cell. A cell instance includes the function, identification, connection, and parameter definition for a single occurrence of a cell within a diagram. Each instance of a cell in a signal flow diagram is identified by a specific and unique instance name. For example, if the signal processing subsystem requires four amplifiers, the diagram that represents that subsystem must include four amplifier cells (and their parameters and connections) with four different cell instance names.

A netlist is a listing of all cell instances (functions, instance names, parameters, and connections) included in a signal flow block diagram. It is a textual description corresponding to the graphical representation of a signal processing design. The development system uses the netlist to generate code and a chip configuration file for the design represented on the signal flow block diagram.

OrCAD software requires that icons for function cells be grouped into structures called libraries. The software uses these structures to organize the cells and create menus through which the designer can access them. A library contains all of the icons for a specific grouping of functions. The functions in the SPROCcells function library are organized into a single OrCAD library. In OrCAD, parameter specifications, including cell instance names, are recorded in part fields. All cell instances have at least one part field containing the instance name. If an instance name is not specified, a default name is created.

Parameter values are specified using the parameter names. As parameters are defined, the part fields containing those parameters are organized sequentially according to the order in which definitions are entered. (The instance name always occupies a special unnumbered part field.) To edit the contents of a part field once it has been defined, the part field's sequence number must be specified.

For example, inserting the icon for an amplifier cell into a diagram and specifying a value for the gain parameter, the default instance name for the cell occupies an unnumbered part field, and the gain specification occupies the first numbered part field. To edit the gain parameter after it is defined, part field number I must be accessed.

B.3 Defining a Filter

If a signal processing design includes one or more filters, the designer must create a data file, called a filter datafile, that defines the detailed specifications and coefficient data for each filter. A parameter in each filter cell instance entered on the signal flow block diagram identifies the name of the filter data file to use with that filter.

The SPROCbuild utility is used to convert the signal flow block diagram into code and generate a chip configuration file, the utility reads the filter data file for each filter cell instance and generates the appropriate code to implement the filter as specified. The generated code uses the coefficients from the filter data file and a cascade of special filter cells to implement the filter. The special cells are provided in the SPROCcells function library, but reserved for internal use by the SPROCbuild utility.

The SPROCfil filter design interface helps the designer create filter data files that specify the coefficients and processing order to use in implementing a filter design. The filter design interface provides an interactive design environment that lets the designer define a filter using a graphical representation of the filter shape. Other tools in the filter design interface automatically generate the coefficients corresponding to the filter design, and write these coefficients to the filter data file.

The filter design interface supports design of the following major categories of digital filters: Infinite Impulse Response (IIR) or recursive filters, and Finite Impulse Response (FIR) or nonrecursive filters. In the IIR category, four familiar analog types of filters are available: Butterworth, Chebyshev 1, Chebyshev II (or inverse Chebyshev), and Elliptic function (or Cauer parameter). In the FIR category, two filter types are available: Optimal Chebyshev approximation, commonly referred to as the Equiripple or Parks-McClellan-Remez (PMR) design, and Kaiser window design.

The designer can use these types to design lowpass (LP), highpass (HP), bandpass (BP), and bandstop (BS) filters.

All filter data files created using the filter design interface are in ASCII[format with the data clearly labeled; any file can thus be viewed using the DOS command type filename, or any word processor or editor.

The coefficients calculated by the filter design interface are written to the filter data file in floating point precision. Quantizing to the 24-bit word length of the SPROC chip is done automatically by the SPROCbuild utility.

The frequency-domain properties of a filter may be evaluated for any wordlength. Computation of a frequency response using quantized coefficients serves to illustrate the degree of sensitivity of the filter performance to the use of finite precision coefficients, i.e., the degree to which the poles of IIR filters, and the zeros of IIR and FIR filters, are modified by the finite-precision coefficient values.

The following limitations apply to filters designed using the filter design interface: Maximum order for IIR filters is 20. Maximum length for PMR (Equiripple) FIR filters is 200. Maximum length for Kaiser window FIR filters is 511. Frequency response for IIR and FIR filters is limited to up to 500 spectrum values covering any desired segment of the frequency range between d-c and one-half of the sampling frequency. The response computation may be specified either by the number of points in a frequency range or by the spacing between points on the frequency axis.

As an additional option for FIR filters, up to 512 spectrum values between d-c and one-half of the sampling frequency may be efficiently computed with up to a 1024-point FFI.

After the initial specifications are entered, modification of the design to meet certain program limitations may be performed by an interactive process.

For example, if the design is an IIR filter, it may be necessary to modify the design to produce a filter order that is an even integer, relax some specification to produce a filter order that is 20 or less, or modify the design to make transition ratios in BP and BS filters equal.

If the design is a PMR FIR filter, it may be necessary to relax some specification to produce a shorter filter length, or to modify the design to make the transition bands of BP or BS filters of equal width.

When the design has been modified to meet program limitations, the following steps are required to complete the design and write the filter data file:

For IIR filters, completing the design involves determining the sequence of biquad sections and scaling the design to avoid overflow.

For PMR FTR filters, completing the design involves computing the actual filter length. The estimated filter length can be increased or decreased.

All IIR designs are given by sets of coefficients of cascaded second order (or biquad) sections, with a first order section for odd-order filters (LP and HP only). When an IIR filter is designed the coefficients for each biquad section are displayed/printed as the set A, B, C, D, and E. The coefficients D and B can be as large as 2 in magnitude. For all four IIR filter types—Butterworth, Chebyshev I, Chebyshev 11, and Elliptic—the same user interface applies. Hence the discussion here applies equally well to any IIR filter design activity.

Several categories of IIR filters may be designed: lowpass, highpass, bandpass, or bandstop. Although all digital filters are properly characterized on a normalized frequency basis, for the user's convenience, the filter design interface allows specification of all critical frequencies in Hz, KHz, MHz, or GHz.

Values must be provided for the passband and stopband edge frequencies, and for the attenuations in the passbands and stopbands. The filter response has a maximum value of unity (0 dB) in the passband.

It is not unusual to approach the design of a filter without specific values for all of the critical frequencies, having only a general idea of passband and stopband locations. To aid in the design process, the filter design interface provides full capability for adjusting all parameters of the filter to achieve a best compromise between performance and complexity (as measured by filter order). The procedure is fully interactive; all computations are done by the filter design interface.

Before discussing this interactive process it may prove helpful to review the way in which the order of IIR digital (and analog) filters depends upon the filter specifications.

Filter order is proportional to Amin and inversely proportional to Amax; i.e., small passband ripple and large stopband attenuation mean high order. In addition, the filter order is inversely proportional to the transition ratio, which measures the relative narrowness of the transition band—the region between passband and stopband.

Because the filter design interface uses the technique of bilinear-z mapping to convert analog prototypes to digital designs, the transition ratio is not FP/FA (for lowpass), or FA/FP (for highpass). Instead, one must use the ratio of the pre-warped critical frequencies: tan(πFP/Fs) and tan(πFA/Fs) where Fs is the sampling frequency.

For bandpass and bandstop filters the critical frequencies for the pass- and stopbands are denoted by FP1, FP2, FA1, FA2. Here there are two possible transition ratios. The values for a bandpass filter are: Lower transition ratio=tan(πFA1/Fs)/tan(πFP1/Fs); Upper transition ratio=tan(πFP2/Fs)/tan(πFA2/Fs).

The filter design interface uses the standard lowpass-to-bandpass transformation method which requires that these two ratios—using pre-warped values—be equal. This is called the geometric symmetry constraint. It is not necessary to precompute these ratios; the filter design interface will perform all necessary adjustments.

After the initial specifications are entered there follows an interactive process which has the goal of modifying the design to meet program limitations. It may be necessary to find an integer-valued filter order which satisfies the design specifications. It may be necessary to adjust transition ratios to meet the requirements for geometrical symmetry in transition ratios.

After developing an acceptable set of specifications and value for filter order there follows another module for the purpose of completing the design by establishing a sequence for the biquad sections, optionally scaling for 0 dB transmissions, and creating a filter data file which will hold the specifications and floating-point precision coefficients. The sequencing and scaling steps are intended to guard against overflow in fixed-point arithmetic.

Before the order for bandpass and bandstop filters is computed it is necessary that the geometric symmetry constraint be satisfied. If the values of FP1, FP2, FA1, and FA2 do not yield equal upper and lower transition ratios, the transition ratios (IIR) or transition bands (FIR) are unequal. They can be easily adjusted in the selected design module. The filter order/length values shown below are for the smaller transition ratio, or band width, value.

This indicates that the input band edge values do not exactly satisfy the equal transition ratio requirement for IIR, but these values can be adjusted in a number of ways. It is almost impossible to enter values which do satisfy the IIR filter requirement unless the values are calculated beforehand.

The designer has three choices: use the upper transition ratio; use the lower transition ratio; use the mean of the upper and lower transition ratios.

These choices are presented in terms of new values for certain of the critical frequencies, and the computed filter order associated with each choice. For a bandpass filter the passband edge frequencies are preserved as originally specified, and the stopband edge frequencies are adjusted in value. The adjusted values for the bandstop filter will be the passband edge frequencies, with the stopband edges remaining as specified.

If the stopband edges are to be adjusted to obtain equal transition ratios, then the set of choices may look something like the following: 1. End of lower stopband (Hz)=255.702 (Order=14.6); 2. Beginning of upper stopband (Order=11.1) (Hz)=3.52793E+03; 3. End of lower stopband (Hz)=227.878 (Order=12.6), Beginning of upper stopband (Hz)=3.46362E+03.

The designer has the choice of adjusting either the lower or upper transition ratio—choices 1 and 2—or using the mean of the transition ratios—choice 3. In some cases the difference in filter order is substantial. In most software for filter design the highest order filter is automatically chosen—the designer has no control. Here, all trade-offs between filter order and specifications are under the designer's control.

If the filter order determined by the initial filter specifications is not an integer, select an order that is an integer. The designer will have the opportunity to improve the filter performance if a higher filter order is chosen, some performance specification is relaxed in order to obtain a lower filter order.

The choice of a value for filter order sets the stage for adjusting filter specifications in conformity with the selected order. For each choice of filter order there are three possibilities for parameter adjustment, relating to stopband and passband attenuations and to band edge frequencies.

The operating rule is that passband frequencies should not be adjusted for lowpass and bandpass filters, and that stopband frequencies should not be modified for highpass and bandstop filters. The designer may decide to do otherwise—the choice of adjusting either the passband or stopband is always available. Either of the attenuation values can be adjusted. The designer may try all three parameter adjustments, for any choice of filter order.

If none of these adjustments results in a satisfactory set of specifications the designer may try another value for filter order, or can go back to the beginning and modify the set of initial specifications. This interactive process of iteration should give the designer a good idea of the quantitative range of trade-offs between filter performance and order that is available.

Realization of high performance filters—by which is usually meant sharp cutoff—is restricted in the analog domain by component precision and tolerance. For digital filters, precision refers to the wordlength of the computation used in implementing the filter. There is no direct counterpart to component tolerance; clock stability is a possible analogy. The SPROC chip uses a 24-bit computational word, which is equivalent to a resolution of better than 1 part in 106. The development system's crystal controlled clock provides superior stability. All of this gives digital filters on the SPROC chip a performance level that is far better than any analog implementation. Because this high performance is so seemingly easy to achieve, the designer is often seduced into overspecifying filter performance, with the penalty being increased computational load and increased memory usage. In some cases there will be additional signal-to-noise ratio degradation due to an accumulation of quantization noise originating in the arithmetic rounding process; this effect is significant only for IIR filters, because it is their inherent feedback operation which can lead to an amplification of quantization noise.

If a filter on the SPROC chip is overdriven there may be an arithmetic overflow internal to the filter cell. This is most likely with IIR filters. Although all IIR filters designed by the filter design interface can be scaled so as to protect against overflow, the scaling process is based upon a sine wave input signal. For almost all designs, the filter design interface can achieve a maximum level of 0 dB for all internal signals based upon an input sine wave at a 0 dB level. In actual operation with real input signals it is possible for phase distortion in the IIR filter to cause "signal pile-up" so that an internal signal, or even the filter output, can slightly exceed the 0 dB level. In such cases one will have to scale down the input to the filter. Experience has shown a 2 to 3 dB decrease in signal level (a gain of 0.8 to 0.7) is all that is needed should an overflow problem occur.

Each IIR filter is first designed as a normalized low-pass analog prototype. The appropriate band transformation, incorporating bilinear-z mapping, is performed in order to get a initial set of digital filter coefficients from which the poles and zeros of the filter are determined. As a first step in the process of minimizing overflow problems in fixed-point, or integer, arithmetic these poles and zeros are automatically grouped so as to minimize the peak gain of each biquad section. The next steps are to establish a sequence for cascading the biquads, and then to select the multiplier coefficient for each biquad so that the transmissions from the input of the filter to the output of each biquad have a peak that is less than ore equal to 0 dB. When these steps have been performed satisfactorily then the filter data file name is created and the filter specifications and coefficients are written to the file. More than one ordering and/or scaling may be performed and each set of coefficients saved to a different filter data file. (Note that different orderings and scalings affect only the A coefficients . . . the numerator and denominator coefficients are determined by the filter's poles and zeros which do not change.)

The pairing of poles and zeros, and the establishing of a sequence for the biquad sections in an IIR filter realization, are of great importance in fixed-point arithmetic. The filter design interface uses a standard procedure for pairing poles and zeros to form the biquad sections, and allows the user complete freedom in choosing the sequence for the cascaded biquad sections.

Problems associated with roundoff noise buildup and accumulator overflow can be substantially reduced by ensuring that the peak gain for each biquad is as small as possible. The greatest peak is associated with the complex-conjugate pole pair having the highest Q (i.e., greatest magnitude, or closest to the unit circle). In fact this is a resonance peak. As the first step in reducing the peak of each biquad frequency response as much as possible one begins with the largest magnitude pole pair and groups it with the complex zero pair that is closest in frequency—which is angle in the z-plane. One then successively applies the same rule of combination—largest magnitude pole pair with closest-infrequency zero pair—to the remaining poles and zeros until all assignments are done. Although this procedure reduces the largest peaks as much as possible, the gains of biquads with large magnitude poles may sill reach levels as high as 10 to 12 dB.

If the cascade of biquads is sequenced with the largest magnitude poles first then the roundoff noise which is generated and amplified in these biquads will be substantially filtered by the lower gain biquads which follow. This reduction in roundoff noise accumulation (and zero-input limit cycle amplitude) at the output of the filter may, however, be accompanied by severe overflow problems at the input stages of the filter. This overflow problem is due to placing the largest magnitude pole pairs (and thus the highest-Q resonances) in the first biquads. If one elects to scale for 0 dB transmissions from the input to each biquad's output then the A coefficients will generally be small for the initial biquads in the cascade. In effect the input signal is scaled down in order to avoid overflow; this can degrade signal-to-noise ratio.

As an alternative one can sequence the cascade of biquads so that the smallest magnitude pole pairs are first. This will result in less scaling down of the initial A coefficients, and thus the signal, but it is often not possible for the scaling algorithm in the filter design interface to achieve 0 dB transmission for each biquad. Another problem with this sequence is that the roundoff noise in the output is greater, and the ZILC amplitude can be greater. If either of these biquad sequences is unacceptable the designer is free to establish any biquad sequence. Note that for odd-order filters the first-order section is always placed after all of the biquad sections.

A new filter data file can be created for each biquad ordering specified. Thus, if three orderings are specified for a fifth-order Butterworth filter then the default file names are buttr05a.fdf, buttr05b.fdf, and buttr05c.fdf.

The incidence of accumulator overflow in IIR filter operation may be reduced through the proper ordering of the cascade of biquad sections. For relatively high order filters there are many possible orderings that can be tried; low order filters give fewer opportunities for ordering of biquads, but usually do not present serious overflow problems anyway.

When the filter is designed one is given the option of specifying the order in which the biquads are placed. In addition one has the option of scaling the A coefficients so that the transmission from the filter input to the output of each biquad is less than or equal to 0 dB. Experience shows that the algorithm implemented in the filter design interface achieves this 0 dB transmission goal most often when the biquad sequence has the largest magnitude poles first. If this is not true for a particular design then one can try the reverse sequence—smallest magnitude poles first or specify one's own sequence.

If one elects to specify an arbitrary biquad sequence, then to strike a balance between overflow problems, roundoff noise accumulation, and ZILC oscillation amplitude, it may be desirable to have the largest magnitude poles in the middle of the cascade, with lower magnitude poles at the beginning and end of the cascade. Obviously this is possible only if the filter is of order 6 or greater, so that there are at least three biquad sections. This sequence can reduce the probability of overflow in the first stages, and often reduces the magnitude of signal frequency components that fall at the peaks of the responses of the biquads with large magnitude poles. Also, if the one of the biquads with large magnitude poles does exhibit a ZILC oscillation, there will be some attenuation of the oscillation by the lower gain biquads which are at the end of the cascade. Nevertheless, there are filter designs for which no ordering of biquads alone is sufficient to prevent overflow, and for which the scaling of A coefficients between sections does not achieve 0 dB transmission for all biquads. Because the filter design interface displays the actual peak responses after the "scaling for 0 dB transmissions" message one can see the effectiveness of alternative biquad sequences and choose the best.

From the standpoint of having the filter perform the function that it was designed for, overflow should never be permitted. IIR filter behavior after a 2's-complement overflow is totally erratic, and can degenerate into an overflow-induced oscillation; should this occur the filter must be reset in order to stop the oscillation. The best design is that in which scaling of data and gain coefficients guarantees that overflow will not occur.

B.4 Defining a Transfer Function

Although the SPROClab development system does not provide a tool for defining transfer functions, the SPROCbuild utility can implement user-defined transfer functions of two types: s-domain, transfer functions and z-domain transfer functions when generating code and creating a SPROC chip configuration file.

The SPROCcells function library includes a transfer function cell so that the designer can include transfer functions in the signal processing designs. When placing this cell in a diagram, one must specify a parameter that names the file defining the transfer function.

The SPROCbuild utility uses z-domain transfer functions directly, and automatically converts s-domain transfer functions into z-domain transfer functions. It implements the transfer function as a cascade of 1st-order or 2nd-order sections using the coefficients you define.

When creating transfer function files, one must not mix 2nd-order and 1st-order sections in one file. To implement a 5th-order transfer function, one must use two transfer function cells in cascade in the signal flow block diagram—with two 2nd-order sections, and the other with a single 1st-order section—and define separate transfer function files for each cell. If all the poles and zeroes are real-valued, one can use a single transfer function cell with five 1st-order sections.)

An s-plane transfer function file may be composed of either a number of 2nd-order sections in cascade, or a number of 1st-order sections in cascade.

One must use a text editor to create an ASCII file containing the definitions for the coefficients for the transfer function. In addition to the coefficient values, one must specify the number of 1st- or 2nd-order sections, and also supply the sampling frequency and a critical frequency. These two parameters are needed for the bilinear-z mapping procedure which converts the s-plane transfer function to a z-plane transfer function.

The bilinear-z conversion method is used because it eliminates spectrum aliasing. However, in accordance with the well known principle of conservation of difficulty, it introduces a warping of the frequency axis. With F denoting frequency in the s-plane, Fs the sampling frequency, Fc the critical frequency, and f representing frequency in the z-plane, the relationship between s-plane and z-plane frequencies is $2\pi f = K\tan(\pi F/Fs)$ where $K = 2\pi Fc/\tan(\pi Fc/Fs)$.

Clearly, when F=Fc, f=Fc. Thus, the role of the critical frequency is to serve as a fixed point in the mapping of the F axis into the f axis.

Experience has shown that picking a critical frequency which is near the center of the frequency region of interest is a good choice. The difference between the magnitude response of the s-plane transfer function and the z-plane transfer function is usually negligible, except near the Nyquist frequency, Fs/2. The bilinear-z mapping tends to add one or more zeroes at Fs/2 in order to restrict the signal spectrum, and thus avoid aliasing distortion.

B.5 Converting a Block Diagram

The SPROCbuild utility provides a set of software modules that automatically converts one's design into SPROC description language (SDL) code, then uses that code to generate a configuration file for the SPROC chip and a table of symbolic references to chip memory locations. To create these files, the utility uses files produced by the SPROCview graphical design interface, the SPROCcells function library, and the SPROCfil filter design interface in the development system, and user-defined cells and transfer functions of the proper form created outside the development system.

The SPROCbuild utility includes three modules: MakeSDL, Schedule, and MakeLoad. Each module performs a unique function in the process of converting the signal flow block diagram and associated files into SDL code and then into a SPROC chip configuration file and a symbol file for the design.

The development system shell begins the conversion process by issuing an invocation command to the MakeSDL module. When that module is complete, the shell invokes the next module in the process, until all modules have been called and completed or an error occurs. The invocation command for each module has a set of command line switches that determines how the module functions.

The conversion process comprises the sequential execution of all modules of the SPROCbuild utility. Each module performs its specific function in the process and produces an output file (or files) required by the next module. The general process is as follows:

1. The MakeSDL module integrates the output from the graphical design interface with data files from the filter design interface and user-defined transfer functions to produce a partial code package containing SDL code and data files. The module also generates instances of certain special cells to implement filter and transfer function cells. These cells are included in the SPROCcells function library but reserved for internal use.

2. The Schedule module takes the files produced by MakeSDL and adds the code blocks for the cells used in the design (from the function library or user-defined cells) and any data files required in addition to those included in the partial code package obtained from MakeSDL. Then the Schedule module schedules the code according to on-chip resource availability and adds special "glue" cells called phantoms that provide control and synchronization functions for the general signal processors (GSPs) on the chip. These cells are included in the SPROCcells function library, but reserved for internal use. The Schedule module produces binary program and data files for the design. It also produces a file of symbolic references to chip memory locations.

3. The MakeLoad module takes the binary program and data files produced by Schedule and packages them into a configuration file for downloading to the chip.

B.6 The MakeSDL Module

The MakeSDL module takes the basic files that capture and define the signal processing design and converts them into a format that the Schedule module can use. The MakeSDL module takes the following input files:

The netlist, mydesign.net, created from the signal flow block diagram in the graphical design interface (where mydesign is the design name). This input is required.

The filter data file (or files), filtname.fdf, produced by the filter design interface (where filtname identifies the filter and matches the name specified in a parameter of the filter cell instance on the block diagram). This input is conditional, depending on the design.

The transfer function file (or files), transname.tff, created using a text editor (where transname identifies the transfer function and matches the name specified in a parameter of the transfer function cell instance on the block diagram). This input is conditional, depending on the design.

Internal reserved cells included in the function library and used for special functions (i.e., to implement filters and transfer functions). This input is required.

and produces the following output files:

mydesign.sdl, a partial SDL code package that corresponds to the functions noted in the netlist and filter and transfer function definitions. This output is always produced.

data files containing the parameters and coefficients noted in the netlist and filter and transfer function definitions. This output is conditional, depending on the design.

In addition, the MakeSDL module produces a dependency check file, mydesign.spf, that the development system shell uses to determine which files must be created or updated by the SPROCbuild utility.

For some signal processing functions, like filters and transfer functions, the MakeSDL module internally inserts instances of special function cells into a design to implement the function defined by the designer. Thus, a filter cell instance on a signal flow diagram might be implemented as several automatically generated internal filter cells. All internally inserted cells that implement filters and transfer functions are integrated into the SDL code package and converted into the file, mydesign.sdl.

B.7 The Schedule Module

The Schedule module takes the partial SDL code package produced by the MakeSDL module and integrates the code blocks for all necessary functions to form a complete SDL code package. It also collects all necessary data files. Then the module determines the appropriate order in which to run the code, calculates the chip resources required, and inserts the necessary phantom cells to glue the design together. Then the module converts the code package into a binary program file containing executable instructions, and an associated data file.

The Schedule module takes the following files as input: mydesign.sdl, produced by the MakeSDL module; the data files produced by the MakeSDL module; any additional data files; the SDL code blocks for function cells, function.sdl, supplied in the function library or created by the user (where function is the name of an individual signal processing function cell) and produces the following files as outputs: mydesign.spp, the binary program file and mydesign.spd, the associated data file. In addition, the Schedule module produces the symbol file (mydesign.sps) containing a table of symbolic references to SPROC chip memory locations.

B.8 The MakeLoad Module

The MakeLoad module packages the program and data files produced by the Schedule module into a configuration file for the SPROC chip. Depending on how the MakeLoad module is invoked, it can produce a configuration file in any of the following formats: a load file in modified Motorola s-record format for downloading to the chip via the SPROCdrive interface software and the SPROCbox interface unit; a PROM file in Motorola s-record format for burning into an EPROM; a blockfile containing an initialized array of data for downloading to the chip via a microprocessor.

The MakeLoad module takes the following files as input: mydesign.spp, produced by the Schedule module mydesign.spd, produced by the Schedule module and produces the following types of configuration files (depending on command line switch settings): a load file, mydesign.lod; a PROM file, mydesign.pro; and a block file, mydesign.blk.

B.9 Loading and Running a Design

The SDI software uses a command-driven user interface with a prompt line to enter SDI commands. The SDI user interface supports the entry of multiple commands on one command line, the use of command files, and the use of function keys as shortcuts for entering some commands. One can specify definitions for most function keys, and some function key definitions are provided with the SDI software. Certain function keys are reserved and may not be user-defined.

SDI uses the load file produced by the MakeLoad module of the SPROCbuild utility. This file includes the program that will execute on the SPROC chip and the data associated with that program. The load file represents the signal processing design specified by the designer using the graphical design interface and filter and transfer function definitions, all packaged in a format that can be downloaded to the chip by the SDI software through the SPROCbox interface unit.

The symbol file produced by the Schedule module of the SPROCbuild utility includes symbolic references to on-chip memory addresses that correspond to specific nodes and wires in the signal processing design. When the symbol file is loaded into host memory, the SDI software allows the user to monitor and modify the values stored at various on-chip memory locations by accessing their symbolic names. SDI also supports access to on-chip memory locations using direct memory references to addresses.

The SDI software provides two operating modes: normal and expert. Both modes support interactive modification and debugging of a design while it runs on the chip, but they provide different levels of debug functionality. In normal mode, the user has access to the design's data space only and can modify signal and parameter values, but cannot modify the actual program. In expert mode, the user has access to program and control space in addition to data space, enabling halt and restart design execution, set breakpoints, and modification of the design running on the chip at assembly level.

The symbol file contains a specification of data type for each symbol. Data types may be integer, fixed point, hexadecimal, or undefined. SDI commands are sensitive to the data types of symbols when accessing memory values using symbolic names. In general, SDI commands display values for addresses accessed by their symbolic names using the data type defined in the symbol file. However, some SDI commands allow the user to specify a display format (integer, hexadecimal, etc.) that may differ from the symbols data type. In addition, the mode command allows the user to specify a display for-mat for values accessed by direct memory reference, and for symbolically accessed values for which the symbol file data type is undefined.

SDI provides several methods to access the values stored in SPROC chip memory locations. The commands read and probe allow the user to view the value of a given memory location, either by accessing it directly by address or symbolically by symbol name. The read command displays the value on the screen, and the probe command directs the value to the software-directed probe for display on an oscilloscope. The write command allows the user to modify the value of a given memory location.

Depending on the SDI operating mode, the user can access data memory locations corresponding to inputs, outputs, and parameters for cells included in your signal flow block diagram, program memory space, and control memory space.

The symbol file includes symbolic names for all SPROC memory addresses. The symbol file provides a hierarchical structure that uniquely identifies nodes and attributes of all cell instances in a signal processing design. In addition, the address for a node or attribute is saved in the symbol file along with its symbol name, so that the symbol file comprises an address map of the symbol names for all nodes and attributes in the design. Levels of hierarchy in symbol names are separated by a dot (.) character. For example, in the symbol name ampl.gain, ampl is the amplifier cell that contains the specific attribute (gain) named by the symbol.

Some nodes and attributes can be referenced by multiple symbols (or aliases). For example, a wire that connects two cells is both the output of the first cell and the input of the second. In addition, a label may be specified for the wire. All three symbols, for the output of the first cell, the input of the second cell, and the label for the wire, refer to the same node on the design and to the same location in SPROC chip memory. When such aliases are translated, the symbol translator ensures that all aliases for a symbol refer to the same location in SPROC chip memory.

The probe command probes any signal corresponding to a location in the SPROC chip data RAM. The user can examine the values of the inputs and/or outputs for each cell in the signal flow block diagram. In addition, the user can probe all of the internal signals for any cell in the diagram that the SPROCbuild utility implements as a combination of cells.

For example, if the signal processing design includes a filter that is sixth order, the SPROCbuild utility will have cascaded three biquad sections; if eighth order, then four biquad sections. The user can use the probe command to access the outputs—and hence the inputs—of each biquad section even though the individual biquad sections were internally generated cells that do not appear on the signal flow block diagram. In fact, the user could view all of the signals that are internal to each biquad.

In the current hardware implementation of the software-directed probe, values accessed using the probe command are made available as output from an on-chip, 8-bit, digital-to-analog converter (DAC). Note that there is a discrepancy between the 24-bit wordlength of SPROC chip memory values and the 8-bit wordlength of the probing DAC. To counter this disparity in wordlength, the probe command supports specification of a scale factor to scale up the input to the probing DAC by as much as 15 bits (215). This provides probe access to low-level signals.

B.10 Using the Micro Keyword

When using the SPROC chip as a memory-mapped device in a microprocessor application, the microprocessor can only access cells that include a micro keyword in the cell definition code block. This keyword identifies the variables in the cell that are available for microprocessor access. Cells that do not include this keyword cannot be accessed by a microprocessor.

The following definition code block for a sink cell illustrates the use of the micro keyword:

```
asmblock msink {%subr=default, %length=128] (in;)
verify (%length>0 && %length<=512),
'Specify length in range 1 to 512.';
variable integer ptr=outvector
micro variable outvector[%length];
begin
                //code here
end
```

The definition of outvector is micro variable outvector[% length]. The micro keyword identifies the variable, outvector[% length], as available for access from a microprocessor.

The micro keyword can also be used for inputs and outputs. For example, in a sink cell with the following reset and done inputs: asmblock msinkrd (% subr=default, % length=128) (in, micro reset; micro done)

The micro keyword defines the interface between the microprocessor and the reset and done inputs of the msinkrd cell and is used to identify only those variables that must be available to the microprocessor.

B.11 Using a Listing File

A listing file can be used to verify cells. It consists of a listing of the source input and the hexadecimal Codes for corresponding data and program locations. The user can produce a listing file by invoking the SPROCbuild utility's Schedule module directly from DOS, using the invocation command line switch -1 and specifying the input source file. Because the listing file is generated at compile time, outside the context of a particular instantiation of an assembly language block, it cannot include any data that is not known before the block is instantiated, i.e., any data that must come from a parameter value of a cell instance. For example, if a parameter used in the calculation of an operand value has no default value, then it cannot be known until the block is instantiated. For such operands, the operand field of the instruction is left zero, and a question mark (?) is placed immediately after. The question mark indicates that the operand value is unknown at this time. On the other hand, if a default for the parameter value has been specified, then this value is used for the instruction, and no question mark is added. Similarly, absolute addresses for instruction jumps and relocatable data references cannot be known at compile time. Whenever such an address is encountered as an operand, its absolute address with respect to the start of the block is used, and an apostrophe (') is placed immediately after. The apostrophe indicates that the address operand will be relocated.

B.12 Using Subroutines

Most cells in the SPROCcells function library include both in-line and a subroutine form code. When a cell instance occurs with the in-line form specified, the instructions for the function are instantiated as one piece of code, along with associated variable allocations. When a cell instance occurs with the subroutine form specified, the instructions for the function are instantiated as two pieces of code: one as a call block, and one as a subroutine body block. (Each piece of code may have associated variable allocations.) When subsequent instances of the same cell are specified with the subroutine form, only the call block, i.e., the piece of code necessary to call the subroutine body block, is instantiated. Only one instance of the subroutine body block is instantiated, no matter how may times the subroutine version of the cell appears in a design. For example, if five subroutine versions of a particular cell are used in one design, the design will include five call blocks for that function, and one subroutine body block.

The subroutine form of a cell performs a function identical to the corresponding in-line form, but includes overhead instructions that make the code in the subroutine body block re-entrant. The use of subroutine versions of cells provides a savings in the number of lines of code used in a design, but requires increased execution overhead. This overhead causes an increase in cell duration. In general, use of subroutines requires a trade-off of program speed for a savings in program and data memory space.

For example, consider five instances of a sine oscillator function (sine_osc cell) in a design. The in-line form of this cell includes 47 lines of code. Five instantiations of the in-line form require a minimum of $5\times47=235$ locations in program memory space, and $5\times9=45$ locations of data (variable) memory space. Duration for each instance of the in-line form is 45 cycles, for $5\times45=225$ total cycles. By contrast, five instantiations of the subroutine form require five call block segments (3 lines each), one subroutine body block (47 lines), for $(5\times3)+47=62$ locations of program memory space. Each call block uses five locations of data space, and the subroutine body block uses five locations of data space, for $(5\times5)+5=30$ locations of data memory space. Duration for each instance of the subroutine form is 48 cycles, for $5\times48=240$ total cycles. Use of the subroutine form in this example consumes only 26 percent of the program space and 67 percent of the data space required for the in-line form. However, use of the subroutine form creates a 7 percent increase in code duration.

The Schedule module of the SPROCbuild utility determines whether to use the in-line or subroutine form for each cell instance in a design when it instantiates the cell instance. This determination is based on two factors: The command line switch settings used in the Schedule module invocation command, and the specification of parameters in individual cell instances. As an default, the Schedule module uses the subroutine form of a cell if three or more instances of that cell are used in the design. Under this condition, if a design includes four sine oscillator cell instances, all four are instantiated in subroutine form.

A command line switch in the Schedule module invocation command allows the user to specify a threshold, subrcount, that triggers the module to use the subroutine form of default cells.

The subr=parameter allows the user to specify whether the subroutine form should be used for a specific cell instance. If the parameter is specified as subr=ON for a cell instance, the Schedule module uses the subroutine form when instantiating that cell instance. If the parameter is specified as subr=OFF for a cell instance, the Schedule module uses the in-line form when instantiating that cell instance. The Schedule module does not count cell instances with the subr=parameter set when it evaluates whether the number of default cell instances has passed the threshold.

Although most cells include code in both in-line and subroutine forms, some cells include only the in-line form. If the subr=parameter is specified for a cell that does not include subroutine form code, the cell is instantiated in in-line form.

B.13 Using Time Zones

A time zone is a slice of time particular to a logical partition of operations on the SPROC chip. A time zone can contain any number of operations, up to the bandwidth limitations of the chip. A design may contain any number of independent time zones, up to the bandwidth limitations of the chip. Sets of operations that occur along the same logical wire (serial data path) in a design occupy the same time zone. This is analogous to the physical notion of time division multiplexing, where within a particular slice of time, anything can be accomplished so long as it does not take longer than the length of the time slice. In time division multiplexing, specific time slices are allotted to specific operations, so that a given operation can only be performed in its assigned time slice or number of time slices. Operations that require longer than the length of one time slice must be completed over multiple time slices allotted to that operation.

In the same way that time slices are allotted to operations performed under a time division multiplexing scheme, several operations in cascade are related to a particular time zone on the SPROC chip. Only during the time allotted to a particular time zone can operations associated with that time zone be performed.

The SPROC chip and the development system tools are very flexible in the structuring of time zones. Essentially, the user can specify time zones using any combination of alphanumeric characters. There is no logical Emit to the number of time zones specified for operations. The only restriction on the number of independent time channels through which operations can be performed is determined by the bandwidth limitations of the chip.

Consider a design in which four filters, each on an independent channel, must operate on a SPROC chip with four GSPs, and each filter uses one complete GSP. Such a design requires four time zones. To determine the maximum sample rate for each of the time zones, consider a 20 Mhz SPROC chip operating each GSP at 4 MIPS. The two serial ports on the chip have access to memory every 70 clock cycles, meaning that each channel can get samples at a rate of $70/20\times10^6=3.5$ μs. Therefore, each time zone has the capacity of $2\times4$ MIPS$\times3.5$ μs$=28$ GSP instructions, because each time zone has an entire GSP allocated to it. (The factor of two at the front of the last equation is due to the fact that one channel will service two GSPs in an equal fashion for this example.) Considering all of the above figures, we see that each channel (or time zone) will be a total of 7 μs in length.

B.14 Summary

Turning to FIG. 10, a flow diagram of the SPROC and microprocessor development environment is seen. At 2010, using graphic entry packages such as "Draft", "Annotate", "ERC" and "Netlist" which are available from OrCad in conjunction with cell library icons such are provided from a cell library 2015 , a block diagram such as FIG. 11 is produced by the user to represent a desired system to be implemented. The OrCAD programs permit the user to draw boxes, describe instance names (e.g., multiplier 1, multiplier 2, etc. such as seen in FIG. 11 as MULT1, MULT2, . . . ), describe parameters of the boxes (e.g., spec=filter 1; or upper limit=1.9, lower limit 1.9 such as seen in FIG. 11) and provide topology (line) connections. The output of the OrCad programs is a netlist (a text file which describes the instantiation, interconnect and parameterization of the blocks) which is fed to a program MakeSDL 2020 which converts or translates the netlist output from OrCad into a netlist format more suitable and appropriate for the scheduling and programming of the SPROC. Source code for MakeSDL is attached hereto as Appendix A. It will be appreciated that a program such as MakeSDL is not required, and that the netlist obtained from the OrCad programs (or any other schematic package program) can be used directly.

As seen in FIG. 10, a complex filter design package program such as is available from DisPro is preferably provided at 2030. The filter design package permits high level entry of filter parameters and automatically generates coefficients for the provided design. The output of the filter design package is a filter definition file which is also sent to MakeSDL. MakeSDL effectively merges the information being provided by the filter design package with instances of filters contained in the netlist to provide a more complete netlist. In addition, MakeSDL further merges transfer function files provided by the user to parameterize a block into the netlist.

MakeSDL outputs SDL (SPROC description language) netlist files and data files. The data files represent data values which are intended for the SPROC data RAM and which essentially provide initial values for, e.g., filter coefficients and source blocks. For functions not located in the cell library, a text editor 2035 can be used to generate appropriate SDL and data files. Those skilled in the art will appreciate that any text editor can be used. What is required is that the output of the text editor be compatible with the format of what the scheduler/compiler 2040 expects to see.

Both the netlist and data files output by the MakeSDL program are input to a scheduling/compiling program as indicated at 2040. In addition, a cell library 2015 containing other SDL files are provided to enable the scheduler/compiler to generate desired code. Among the signal processing functions provided in the cell library are a multiplier, a summing junction, an amplifier, an integrator, a phase locked loop, an IIR filter, a FIR filter, an FFT, rectifiers, comparators, limiters, oscillators, waveform generators, etc. Details of the scheduler/compiler are described in more detail hereinafter, and source code for the scheduler/compiler is attached hereto as Appendix M.

The output of the scheduler/compiler contains at least three files: the .spd (SPROC data) file; the .spp (SPROC program) file; and the .sps (SPROC symbol) file. The SPROC data file contains initialization values for the data locations of the SPROC (e.g., 0400 through ffff), which data locations can relate to specific aspects of the SPROC as discussed above with reference to the SPROC hardware. The SPROC program file contains the program code for the SPROC which is held in SPROC program RAM (addresses 0000 to 03 ff) and which is described in detail above with reference to the SPROC hardware. The SPROC symbol file is a correspondence map between SPROC addresses and variable names, and is used as hereinafter described by the microprocessor for establishing the ability of the microprocessor to control and/or communicate with the SPROC. If desired, the scheduler/compiler can produce other files as shown in FIG. 10. One example is a .spm file which lists the full file names of all included files.

As aforementioned, the scheduler/compiler produces a symbol file (.sps) for use by the microprocessor. Depending upon the type of microprocessor which will act as a host for the SPROC, the symbol file will be translated into appropriate file formats. Thus, as shown in FIG. 10, symbol translation is accomplished at 2050. Source code in accord with the preferred embodiment of the invention is provided in Appendix C for a symbol translator which translates the .sps file generated by the scheduler/compiler 2040 to files which can be compiled for use by a Motorola 68000 microprocessor. In accord with the preferred embodiment, the symbol translator 2050 generates to files: a .c (code) file, and a .h (header) file. The code file contains functions which can be called by a C program language application. The header file contains prototypes and symbol definitions for the microprocessor compiler hereinafter described.

Returning to the outputs of the scheduler/compiler 2040, the data and program files are preferably fed to a program MakeLoad 2060 (the source code of which is provided as Appendix D hereto. The MakeLoad program merges the spp and spd into a file (.blk) which is in a format for the microprocessor compiler and which can be used to initialize (boot) the SPROC. Of course, if desired, the .blk file can be loaded directly into a microprocessor if the microprocessor is provided with specific memory for that purpose and a program which will access that memory for the purpose of booting the SPROC.

The Makeload program also preferably outputs another file .lod (load) which contains the same information as the .blk (block) code, but which is used by the SPROCdrive interface 2070 to boot the SPROC in stand-alone and development applications. Details regarding the SPROCdrive interface are discussed below. Another input into the SPROCdrive program is the symbol file (.sps) generated by the scheduler/compiler 2040. This allows the SPROCdrive program to configure the SPROC and control the SPROC symbolically. In particular, if it was desired to read the output of a particular block, a command "read blockname.out" can be used. The .sps file then provides the SPROC address corresponding to the symbol blockname.out, and the SPROCdrive interface then sends a read and return value command to the SPROC 10 via the SPROCbox 2080. The function of the SPROCbox is to provide an RS232 to SPROC access port protocol conversion, as would be evident to one skilled in the art.

C. SPROC Description Language

C.1 Overview of SDL

SPROC description language (SDL) is the language used to create high-level descriptions of arbitrarily complex signal processing systems to be implemented on the SPROC programmable signal processor.

SDL is a block-oriented language that supports hierarchical designs. Blocks may be either primitive or heirarchical.

Primitive blocks also called asmblocks contain hardware-specific coding analogous to the firmware in a microprocessor system. Primitive blocks are written in assembly language. They may not contain references to other blocks.

Code for signal processing functions is written at the primitive level. These primitive blocks comprise the SPROCcells function library. They are optimized for the hardware and efficiently implemented to extract maximum performance from the SPROC chip. Other primitive blocks include the glue blocks or phantoms required to provide control ;and synchronization functions for the multiple general signal processors (GSPs) on the SPROC chip.

Hierarchical blocks contain references to other blocks, either primitive or hierarchical. The sequence (i.e.,firing order) and partitioning (i.e., allocation over the GSPs and insertion of phantom blocks) of the referenced blocks in a hierarchical block is automatically determined.

A hierarchical block that is not referenced by any other block is a top-level block. There must be one and only one top-level block in a design.

Two types of special-purpose hierarchical blocks are also available: sequence blocks and manual blocks.

A sequence block is a hierarchical block that is not automatically sequenced. The order of the references contained in a sequence block specifies the firing order of the referenced blocks.

A manual block is a hierarchical block that is neither automatically sequenced nor partitioned. As with the sequence block, the order of block references in a manual block specifies the firing order of referenced blocks. In addition, referenced blocks are not partitioned, and no phantom blocks are inserted.

A block contains a block name, block definition, and block body. The block name identifies the block for reference by hierarchical blocks. The block definition contains an optional list of parameters; a port list declaring the block's input and output signals; optional general declarations for wires, variables, symbols, aliases, time zones, compute lines, and ports; optional verify statements; and optional duration statements (primitive blocks only)

The block body contains references to other blocks (hierarchical blocks only) or assembly lines (primitive blocks and manual blocks only).

C.2 Compiling SDL Files

SDL files are compiled by the SPROCbuild utility in the SPROClab development system. The utility includes three modules: the MakeSDL module, the Schedule module, and the MakeLoad module.

The MakeSDL module prepares a top-level SDL file that completely describes the signal processing design using the netlist of the signal flow block diagram, primitive blocks from the function library, and other code and data files The Schedule module takes the top-level SDL file and breaks the file apart based on the resource and synchronization requirements of the blocks within the file. Resource requirements include program memory usage, data memory usage, and GSP cycles. Synchronization requirements include the determination of how and when blocks communicate data, and whether a block is asynchronous and independent of other blocks in the design.

After breaking up the file to accommodate resource and synchronization requirements, the Schedule module partitions the file by blocks and locates the blocks to execute on the multiple GSPs on the SPROC chip using a proprietary partitioning algorithm. The module inserts phantom blocks as necessary to control the synchronization of the GSPs as they execute the design.

Then the Schedule module generates a symbol table file that lists the physical RAM addresses on the SPROC chip for all the parameters, variables, and other elements in the design.

The MakeLoad module converts the partitioned SDL file into a binary configuration file to run on the chip.

C.3 Concepts and Definitions

This subsection provides an alphabetical listing of various concepts and definitions used in SDL.

Aliases: An alias maps a new identifier to another existing identifier. Aliases are declared using alias statements. These are more restrictive than symbol declarations, since the translation must be an identifier, not an arbitrary expression. Alias translation is done before any other translation.

Data Types: The type of a variable or wire may be FIXED (fixed point), INTEGER (integer), and HEX (hexadecimal). FIXED type specifies a fixed-point representation of a number in the range of −2 to 1.999999762. FIXED type is the data type native to signals in the SPROC chip.

Expressions: An expression is a statement of a numerical value. An expression can be simply a number or identifier (like a register name), or a combination of numbers, symbols, and operators that evaluates to a numerical value. Expressions in a block are evaluated when the block is instantiated. Expressions may be used wherever a number is required. The operand field of most instructions may contain an expression. Initial values for variables may be declared as expressions. The table below lists the valid operators that may be used in expressions.

| OPERATOR | DESCRIPTION |
|---|---|
| + | plus |
| − | minus |
| * | multiply |
| / | divide |
| ~ | one's complement |
| & | bitwise AND |
| \| | bitwise OR |
| | bitwise exclusive OR |
| int | convert to INTEGER type |
| log | use base |
| | Ex. a log b identifies a as a base b number |
| exp | raise to the power of |
| | Ex. a exp b is a to the b power |
| fix | convert to FIXED type |
| && | logical AND |
| \|\| | logical OR |
| ! | logical NOT |
| == | EQUAL TO |
| != | NOT EQUAL TO |
| < | less than |
| > | greater than |
| <= | less than or equal to |
| >= | greater than or equal to |
| >> | right shift |
| | Ex. a >> b is "right shift a by b bits" |
| << | left shift |
| | Ex. a << b is "left shift a by b bits" |

Expressions may include identifiers, like parameter names, symbols, and variable, wire, or port names. When translating identifiers to evaluate an expression, if the identifier cannot be found in the current block instance, block instances in successively higher levels are searched until the identifier is found. The identifier is evaluated in the context of the block instance in which it is found.

Numbers used in expressions may be real, integer, hex, or binary numbers. An expression containing a real number evaluates to a real number and may be assigned to the FIXED data type. An expression containing no real numbers (only integer, hex, or binary numbers)

evaluates to an integer number and may be assigned to an INTEGER data type.

An expression must evaluate to a value within the range allowed for the data type of the variable or operand to which it is being applied.

Identifiers: An identifier is any series of characters chosen from the following sets: first character—A-Z, a-z, $, %, _, and subsequent characters—A-Z, a-z, $, %, period (.) 0-9.

Labels: A label is a special identifier used for a line of assembly code (asmline). An asmline may begin with a label followed by a colon; this specifies the label as the identifier for the asmline. Another asmline may use a jump instruction with the label as an operand to cause the GSP to jump to the memory location associated with the labeled instruction. A label for an asmline is optional and must start with an alphabetic character and be followed by a colon. Labels are case sensitive, so that XXX and Xxx are two unique labels.

Numbers: Numbers may be integer, real, hexadecimal, or binary. Numbers must begin with a digit (0 through 9) or a negative sign (−). Numbers containing a decimal point (.) are real, and may optionally include an exponent, using e or E optionally followed by a signed integer. Hexadecimal number must begin with a digit (0 through 9) and end with a letter H (capital or lower case). Binary numbers must begin with a digit (0 or 1) and end with a letter B (capital or lower case).

Opcodes: An opcode is an alphanumeric code that specifies an assembly instruction from the GSP instruction set. Opcodes entered in asmlines must be in lower case.

Operands: An operand is an expression that specifies the source or destination of an instruction. An operand is present only when required by the specified instruction. An operand can be a simple register identifier, a label, or an expression that evaluates to a specific address.

Parameters: A parameter is an identifier or string that provides a means of customizing an occurrence, or instance, of a block. Parameter values may be passed by a hierarchical block to a lower level hierarchical block. They can also provide immediate values and array sizes for primitive blocks. Parameters are declared in the optional parameter listing for a block. A default value for a parameter may be declared. When a block is instantiated, any parameter values supplied for the instance override the default values. Parameters reserve no storage. Parameter names should begin with a percent sign (%).

Registers: Registers can serve as source or destination operands for instructions. Registers that may only be read by an instruction are source only registers. Registers that may be read or written by an instruction are source/destination registers. Register names used in operand fields must be all upper case.

Strings: A string is a series of characters enclosed within single or double quotes. If the string is enclosed within single quotes, the single quote character is illegal within the string. If the string is enclosed within double quotes, the double quote character is illegal within the string.

Symbols: A symbol is a series of characters (an identifier or a string) that names an expression. The symbol for an expression may be used in other expressions. Appropriately chosen symbol names may be used to make SDL code more readable. Symbols are declared using symbol statements. Symbols may be used within blocks as an initial value for a variable or wire, for example. A symbol may also be passed via a parameter value assignment to an instance within a hierarchical block.

Time Zones: A time zone declaration is required for every signal source block, like the primitive block for a signal generator function, or a serial input port function. The time zone statement declares a time zone name for the block, and optionally, a sample rate for that zone, in samples per second. A sample rate need only be given in one such time zone statement of multiple blocks that declare the same time zone name. The time zone name is used to determine synchronization requirements of blocks. Time zones which have different names are taken to be asynchronous, even if they have the same sample rate.

Variables: Variables are declared using variable statements. Variables may be declared for hierarchical or primitive blocks. A variable may be declared, and an initial value for the variable may also be declared. The value may be a number (or expression) or a string (or an expression with no value assigned to it) that identifies a file containing the initial values for the variable. If the string (file name) entered as the value for a variable includes a period (.), it must be enclosed in single or double quotes. Numbers in the file must be delimited by spaces, tabs, or new lines, and may be real, hexadecimal, integer, or binary numbers. If the file contains fewer values than are required by the variable, any missing values are zero filled. Variables may be scalar or dimensioned as single-dimension arrays. If an initial value is declared as a number (or expression) that value is duplicated for array variables.

Wires: A wire is a signal between primitive blocks in a design. Wires are declared using the wire statement. Wires may be declared in hierarchical blocks only. A wire may be declared, and an initial value for the wire may also be declared. The value may be a number (or expression) or a string (or an expression with no value assigned to it) that identifies a file containing the initial value for the wire. The wire value is by default type FIXED. Wire values are scalar only.

C.4 Rules for Creating Asmblocks

1. Keep state information for asmblocks in variables, not in outputs. Output values are not necessarily maintained between successive calls of an asmblock.
2. Place the assembly code for each asmblock in a separate file unless the asmblock is purely local to another block and is only called by that block. The file name must be the same as the asmblock name defined in the asmblock header, and it must have the extension, .sdl.
3. System identifiers begin with the prefix_% (underscore percent sign). Do not begin identifiers with these characters.
4. Begin parameter names with a percent symbol (%).
5. Write the output of a block to memory each time the block is executed. The software-directed probe used for debug is triggered by writing block output to memory, and will not function properly if blocks are executed without their outputs being written to memory.
6. Enter opcodes in assembly lines in lower case.
7. Enter register names used as operands in assembly lines in upper case.

C.5 Asmblock Structure

Each asmblock includes a header called an asmblock_header, optional declaration statements, and the body of the asmblock containing assembly instructions, or asmlines, as follows:

```
asmblock_header
  optional declaration statements chosen from:
    Duration
    Variable
    Verify
    Symbol
begin
  body, composed of zero or more asmlines
end
```

The asmblock header (asmblock_header) marks the start of an asmblock definition. It identifies the name of the asmblock and includes optional listings for the parameter characteristics and I/O of the asmblock. An asmblock header must have the following format:

```
asmblock name
  [{[%paremeter[=expression][, %parameter[=expression]. . .]]}]
  [{[in[, in ...]]; [out[, out ,,.]]}]
```

where the name identifies the asmblock. (An asmblock name must be included in the asmblock header.) The parameter listing defines characteristics such as initial values that can be referenced by the assembly code appearing later in the body. When an asmblock is instantiated, any parameter values supplied for the instance override the default values set in the parameter listing.

The parameter listing is optional and must be included between braces.({}) if present. Zero or more parameters may be included between the braces; multiple parameters must be separated by commas, A parameter, may be an identifier or string. A parameter can be followed by an equals sign and a default value expression. Parameter names should begin with a percent sign (%).

The I/O listing defines the input and output arguments of the asmblock. The I/O listing is optional and must be enclosed in parentheses if present. Inputs are type INPUT and identify starting values. Outputs are type OUTPUT and identify results. (No type INPUT is allowed.) Both the input and output sections are made up of zero or more identifiers separated by commas. The input section must be separated from the output section by a semicolon.

An output section may have an expression declared for it to provide an initial value. This is useful when the initial state of a signal is important.

The keyword micro may be added to the declaration for any input or output of an asmblock. The keyword must precede the identifier in the appropriate section of the I/O listing. This keyword makes the tagged input or output available for access from a microprocessor for applications using the SPROClink microprocessor interface (SMI) software.

After the asmblock header, the asmblock may include any combination of zero or more of the following optional declaration statements: Duration, Symbol, Variable, Verify.

The duration statement has the format:

duration integer_expression;

A duration statement declares the maximum number of cycles required to execute the asmblock code. A duration statement is required for all asmblocks that have backward branches, and therefore may loop. If no duration statement is present, a duration for the asmblock is computed assuming that every instruction in the asmblock code will be executed.

An integer_expression is an expression that must evaluate to an integer value.

The symbol statement has the format:

```
symbol[micro]identifier=expression[, [micro]
     identifier=expression ...];
  or
symbol[micro]string=expression[, [micro]
  string=expression ...];
```

A symbol statement defines a symbol name for use in expressions. The optional micro keyword makes the symbol available for access from a microprocessor for applications using SMI.

The variable statement has the format:

```
variable[micro][type]identifier[[size]][=expression][.
[micro][type]identifier[[size]][=expression] ...];
```

The variable statement defines storage locations which may optionally be initialized. The micro keyword makes the variable available for access from a microprocessor in applications using SMI. A type specifier defines the type of the variable and must be compatible with the expression, if present. Type can be FIXED, INTEGER, or HEX. FIXED indicates SPROC chip fixed point; INTEGER indicates a base 10 value; and HEX indicates a base 16 value. A size qualifier is used to declare vectors. If present, it must be an integer expression enclosed in square brackets ([]).

The verify statement has the format:

verify expression;

or verify expression string;

The verify statement defines a check to be performed by the Schedule module of the SPROCbuild utility. The expression is evaluated and compared to zero. If nonzero, an error message will be generated. If string is present, it will be output as the error message. If no string is present, the failed expression will be expanded into English and presented. Verify statements should be used to check that parameter values lie within an acceptable range. Parameter values may come from the parameter list in the asmblock, or from a hierarchical block that references the asmblock.

The asmblock body contains the code that specifics operating instructions. The asmblock body includes the bean keyword, the asmlines, and the end keyword. An asmline includes a single assembly instruction for the SPROC chip's general signal processor (GSP). This instruction may be in the form of an opcode, a label, or a label and an opcode. An asmline must have the following format:

```
[LABEL:] [OPCODE] [OPERAND]where
```

LABEL followed by a colon is an identifier for the asmline. A label is optional and must start with an alphabetic character and be followed by a colon. Labels are case sensitive, so that XXX and Xxx arc two unique labels. OPCODE is an alphanumeric code that specifies an assembly instruction from the GSP instruction set. An opcode is optional. Opcodes entered in asmlines must be lower case. OPERAND is an expression that specifies the source or destination of the instruction specified by an opcode. An operand is present only when required by the specified instruction.

Any asmline can be terminated by a semicolon. The semicolon is optional and has no meaning; it is purely stylistic.

Comments may be included in any asmblock as separate comment lines, or they may be included within any other line in the asmblock. When comments are included as separate lines in an asmblock, each comment line must be introduced by the comment characters (//). When comments are included within another line in the asmblock, they must either be enclosed between delimiting characters (/* and */), as in the C language, or appear at the end of the line and be preceded by the comment characters (//).

C.6 SPROC Chip Architecture, Instructions and Registers

The instruction format for program ram is shown in the table below:

| | |
|---|---|
| Total Width | 24 bits |
| Opcode | 6 bits |
| Operand | 15 bits |
| Address mode | 3 bits, eight modes |

The data format is shown in the table below:

| | |
|---|---|
| Total Width | 24 bits |
| Range fractional | −2 to +1.999999762 |
| Code | OQ.22,2's complement with 22 bit fraction |

The multiplier format is as follows:

| | |
|---|---|
| Input registers | 24 bits |
| Output register | 56 bits including 8 bits of overflow protection |

The basic GSP instruction set is listed in the table below:

| OPCODE | OPERAND TYPE | DESCRIPTION |
|---|---|---|
| add | source | Add without carry. Load operand into ALU and sum with contents of accumulator. Result is stored in the accumulator |
| adc | source | Add with carry. |
| and | source | AND contents of accumulator with operand. Result is stored in accumulator. |
| asl | none | Arithmetically shift the accumulator contents 1 bit to the left and store the result in the accumulator. The most significant bit (msb) is shifted into the carry bit C and a zero is shifted in the least significant bit (lsb) of the accumulator. |
| asr | none | Arithmetically shift the accumulator contents 1 bit to the right and store the result in the accumulator. The lsb is shifted into the carry bit C, and the msb is held constant, (sign extended). |
| clc | none | Clear carry bit of status register. |
| cmp | source | Compare operand with accumulator contents and update the status register. Accumulator is unmodified by a compare instruction. |
| djne | source | Test loop flag, jump not equal to zero to specified operand address, then post decrement loop register. |
| jmp | source | Unconditional jump to operand address in the program RAM. Execution continues from the operand address. |
| jxx | source | Jump on condition code true. |

| xx | CONDITION | TRUE CONDITION |
|---|---|---|
| cc | Carry Clear | ~CF |
| cs | Carry Set | CF |
| lf | Loop Flag Set | LF |
| mf | Multiplier Overflow Flag Set | MF |
| ne | ZF Clear | ~ZF |
| ov | Overflow | OF |
| si | Sign | SF |
| eq | same as ZE | ZF |
| ge | >= | (OF & SF)\|(~OF & ~SF) |
| ze | Zero/Equal | ZF |
| le | <= | (~OF & SF)\|(OF & ~SF)\|ZF |
| gt | > | ~ZF & ((OF & SF)\|(~OF & ~SF)) |
| lt | < | (~OF & SF)\|(OF & ~SF) |
| wf | Wait Flag Set | WF |

| OPCODE | OPERAND TYPE | DESCRIPTION |
|---|---|---|
| ldr | source | Load destination register (r) with operand. |
| ldy | source | Alias for myp |
| mac | source | Load Y register of multiplier with operand value and execute the multiply/accumulate operation which adds the multiplication result to the contents of the M register. There is a two cycle latency before the result is available. The X register can be loaded with a new value during this two cycle period. |
| mpy | source | Load Y register of multiplier with operand value, and execute the multiplication operation, placing the result in the M register. There is a two cycle latency before the result is available. The X register can be loaded with a new value during this two cylce period. |
| nop | none | No operation. |

-continued

| OPCODE | OPERAND TYPE | DESCRIPTION |
|---|---|---|
| not | none | Perform a one's complement of accumulator. Result is stored in the accumulator. |
| ora | source | OR contents of accumulator with operand. Result is stored in accumulator. |
| rol | none | Rotate accumulator contents left 1 bit through carry. |
| ror | none | Rotate accumulator contents right 1 bit through carry. |
| sec | none | Set carry bit of status register. |
| str | destination | Store contents of register (r) at destination address. |
| sub | source | Subtract without carry. Load operand into ALU register and subtract from accumulator. Result is stored in the accumulator register. |
| subc | source | Subtract with carry. |
| xor | source | Exclusive OR contents of accumulator with operand. Result is stored in accumulator. |

The following instructions have restrictions:

| INSTRUCTION | RESTRICTION |
|---|---|
| djne | If the starting value placed in the D register is odd, and the decrement is an even value, this instruction can result in an endless loop. |
| str | This instruction cannot use immediate addressing. This instruction cannot use register addressing. For register to register "storing", use ldr. |

Privileged instructions, reserved for special purposes, are listed below. These instructions are available but intended solely for use during debug via the SPROCdrive interface (SDI) software using the SPROCbox interface unit. Do not use these instructions in asmblocks.

| INSTRUCTION | OPERAND | DESCRIPTION |
|---|---|---|
| lbsj | source | Load BS and jump. Load the program counter plus one and the condition codes into the BS register and jump to operand. |
| ldcc | source | Load condition codes. Replace 4 bits of condition code register with 4 bits of operand (CF, OF, SF, ZF). |
| xld | source | Load parallel port input register with contents of externally addressed memory location. The operand specifies an external address in the range of 0 through 64K. NOTE: This instruction alters the value in the A register. The state of the CF, SF, and ZF flags is unknown after this instruction. |

The following source/destination registers are provided:

| REGISTER NAME | FUNCTION | SIZE |
|---|---|---|
| A | accumulator | 24 bits |
| B | base | 16 bits |
| BS | break status | 24 bits |
| D | decrement | 8 bits |
| F | frame pointer | 16 bits |
| L | loop | 12 bits |
| WS | wait status | 24 bits |
| X | multiplier input x | 24 bits |
| Y | multiplier input y | 24 bits |

The break status register is a special purpose source/destination register. It holds a copy of both the program counter incremented by 1, and the GSP condition code flags, after a break is executed. This register is used only by the SPROCbox interface unit for debug. The bits of the break status register are defined as follows:

| BIT | CONTENTS | DEFINITION |
|---|---|---|
| 0 through 11 | PC+1 | copy of program counter + 1 at break event |
| 12 | 0 | unused |
| 13 | | current jump state |
| 14 and 15 | GSP | identity of GSP issuing the halt |
| 16 | CF | carry flag status |
| 17 | OF | overflow flag status |
| 18 | SF | sign flag status |
| 19 | ZF | zero flag status |
| 20 | LF | looping flag status |
| 21 | MF | multiplier overflow flag status |
| 22 | WF | wait flag status |
| 23 | 0 | unused |

The multiplier output register, M, is the sole source only register. The M register is a 56-bit register divided into three sections: guard; hi; and lo; that are assigned individual register identifiers. In addition, each of these three sections uses two different register identifiers to distinguish between integer and fixed point access modes.

The source only register identifiers for the sections of the multiplier output register are listed below:

| REGISTER NAME | FUNCTION | ACCESS MODE | SIZE |
|---|---|---|---|
| MG | multiplier guard bits | fixed point | 10 bits, sign extended to 24 bits |
| MH | multiplier hi | fixed point | 24 bits |
| ML | multiplier lo | fixed point | 24 bits |
| MGI | multiplier guard bits | integer | 8 bits, sign extended to 24 bits |
| MHI | multiplier hi | integer | 24 bits |
| MLI | multiplier lo | integer | 24 bits |

The result of an integer multiply will be found in the MLI register. The result of a fixed point multiply will be found in the NM register.

All flags are initially in an undefined state until affected by an instruction. The list below shows how each flag is affected by each instruction.

| | FLAG NAMES | | | | | | |
|---|---|---|---|---|---|---|---|
| OPCODE | CARRY (CF) | LOOPING (LF) | MULTIPLIER OVERFLOW (MF) | OVERFLOW (OF) | SIGN (SF) | WAIT (WF) | ZERO (ZF) |
| adc | U | — | — | U | U | — | U |
| add | U | — | — | U | U | — | U |
| and | — | — | — | O | U | — | U |
| asl | U | — | — | O | U | — | U |
| asr | U | — | — | O | U | — | U |
| clc | O | — | — | — | — | — | — |
| cmp | U | — | — | U | U | — | U |
| djne | — | U | — | — | — | — | — |
| jxx | — | — | — | — | — | — | — |
| lbsj | — | — | — | — | — | — | — |
| lda | — | — | — | O | U | — | U |
| ldcc | U | — | — | U | U | — | U |
| ldl | — | U | — | — | — | — | — |
| ldr(other) | — | — | — | — | — | — | — |
| ldws | — | — | — | — | — | U | — |
| mac | — | — | U | — | — | — | — |
| mpy | — | — | U | — | — | — | — |
| nop | — | — | — | — | — | — | — |
| not | — | — | — | O | U | — | U |
| ora | — | — | — | O | U | — | U |
| rol | U | — | — | O | U | — | U |
| ror | U | — | — | O | U | — | U |
| sec | 1 | — | — | — | — | — | — |
| str | — | — | — | — | — | — | — |
| sub | U | — | — | U | U | — | U |
| subc | U | — | — | U | U | — | U |
| xor | — | — | — | O | U | — | U |

where O means clear status flag; 1 means set status flag; U means update status flag; and — means do not change status flag Although the GSPs in the SPROC chip use a 24-bit data word, an instruction opcode can only hold an immediate value of 15 bits. Immediate addressing modes facilitate left or right justification of these 15 bits when forming an immediate data word. The immediate addressing modes differ for data operands and address operands. Eight modes are supported for data operand addressing, and seven modes are supported for address operand addressing.

The eight immediate addressing modes for data operands are listed below:

| MODE | FORMAT | DESCRIPTION |
|---|---|---|
| direct | xxx | Use the 15-bit operand as a data memory address. The address always accesses the data memory. |
| immediate left | #<xxx | Default for FIXED numbers. Take the 15-bit operand, left justify and zero fill low order bits to generate a 24-bit value for immediate use. This mode is used to represent fractional numbers. |
| immediate right | #>xxx | #xxx default. Take the 15-bit operand, right justify and sign extend high order bits to generate a 24-bit value for immediate use. This mode is used to represent immediate integer numbers. |
| register | sr | Source register. Use the 15-bit operand as a register identifier. |
| base indexed | [B + xxx] | Use the 15-bit operand as an offset to the base register (register B) to determine the data memory address. |
| base loop indexed | [B + L + xxx] | Use the 15-bit operand as an offset to the base register (register B) plus the loop register (register L) to determine the data memory address. |
| frame indexed | [F + xxx] | Use the 15-bit operand as an offset to the frame pointer register (register F) to determine the data memory address. |

-continued

| MODE | FORMAT | DESCRIPTION |
|---|---|---|
| frame loop indexed | [F + L + xxx] | Use the 15-bit operand as an offset to the frame pointer register (register F) plus the loop register (register L) to determine the data memory address. |

If offset is zero, +0 is optional.

For jmp and conditional jxx instructions, the operand field specifies the address at which program execution must proceed, when required by the instruction. The immediate addressing modes for address operands are listed as follows:

| MODE | DESCRIPTION |
|---|---|
| direct | Use the 15-bit operand as the destination address. The operand must be a relocatable LABEL; no absolute expression is allowed as the destination address. |
| indirect | The 15-bit operand, enclosed in square brackets ([ ]) points to a data memory location containing the destination address. |
| register | The specified source register contains the address. |
| indirect base indexed | Use the 15-bit operand as an offset to the base register (register B) to determine the data memory address containing the jump destination. |
| indirect base loop indexed | Use the 15-bit operand as an offset to the base register (register B) plus the loop register (register L) to determine the data memory address containing the jump destination. |
| indirect frame indexed | Use the 15-bit operand as an offset to the frame pointer register (register F) to determine the data memory address containing the jump destination. |
| indirect frame loop indexed | Use the 15-bit operand as an offset to the frame pointer register (register F) plus the loop register (register L) to determine the data memory address containing the jump destination. |

The following table lists the keywords and other reserved words in SDL.

| | | | | | |
|---|---|---|---|---|---|
| A | eor | jmp | MG | seqblock | upsample |
| adc | exp | jne | MGI | sta | variable |
| add | F | jov | MH | stb | verify |
| alias | fix | jsi | MHI | stbs | virtual |
| and | fixed | jwf | micro | std | wire |
| asl | gpio | jze | ML | stf | WS |
| asmblock | hex | L | MLI | stl | X |
| asr | init | label | mpy | stmg | xld |
| B | input | lbsj | nop | stmgi | xor |
| begin | int | lda | not | stmh | Y |
| block | integ | ldb | ora | stmhi | |
| BS | integer | ldcc | org | stml | |
| callblock | jcc | ldd | output | stmli | |
| clc | jcs | ldf | param | stws | |
| cmp | jeq | ldl | phantom | stx | |
| com-puteline | jge | ldws | port | sty | |
| D | jgt | ldx | real | sub | |
| djne | jle | ldy | rol | subc | |
| down-sample | jlf | log | ror | subrblock | |
| duration | jlt | mac | rts | symbol | |
| end | jmf | manblock | sec | timezone | |

D. The SPROC Compiler

Returning to details of the scheduler/compiler 2040, the basic function of the scheduler/compiler 2040 is to take the user's design which has been translated into a scheduler/compiler understandable format (e.g., SPROC Description Language), and to provide therefrom executable SPROC code (.spp), initial data values (.spd), and the symbol file (.sps). The preferred code for the scheduler/compiler is attached hereto as Appendix M, and will be instructive to those skilled in the art.

The scheduler/compiler does automatic timing analysis of each design provided by the user, allocating the necessary SPROC resources to guarantee real-rime execution at the required sample rate. In order to guarantee real-time execution, the scheduler/compiler preferably performs "temporal partitioning" (although other partitioning schemes can be used) which schedules processors in a round-robin fashion so as to evenly distribute the compute power of the multi-GSP SPROC. Each GSP picks up the next sample in turn, and executes the entirety of the code in a single time zone (i.e., that part of the user's design which runs at the same sample clock). Additional information regarding time zones can be obtained by reference to U.S. Pat. No. 4,796,179 to Lehman et al. which provides time zones for a microprocessor based system.

The scheduler/compiler 2040 also insert "phantom blocks" into the user's design which supply the necessary system "glue" to synchronize processors and input-/output, and turn the user's design specification into executable code to effect a custom operating system for the design. Preferred code for the phantom blocks is found attached hereto as Appendix E (Scheduler/Compiler Phantom Block Source Code).

Because it is possible for a block which the user has designated to have a varying execution time, the GSPs running common code under temporal partitioning could conceivably collide or get out of sequence. Phantom blocks called "turnstiles" are inserted at every sample period's worth of code to keep the GSPs properly staggered in time. By computing and using maximum and minimum durations rather than a maximum duration and an assumed minimum duration of zero, the turnstiles may be placed to optimize the code variability. The scheduler/compiler code provided in Appendix M, however, does not optimize in this manner. Also, output FIFOs are created whose size depends on code execution time variability. These output FIFOs can also be optimized.

In temporal partitioning, a GSP can overwrite a signal memory location with its new value before the old value has been used by another GSP which requires that value. In order to prevent this overwriting problem, phantom blocks which create "phantom copies" of signal values are inserted. A different manner of solving this problem is to cause each GSP to maintain its own private copies of signal values, with phantom blocks automatically added, which for each signal, writes successive values to an additional single memory location so that it may be probed at a single memory address.

The scheduler/compiler supports asynchronous timing as well as decimation and interpolation. Decimation and interpolation are accomplished within temporal partitioning by "blocking" the signal values into arrays, and operating on these arrays of values rather than on single signal values. Thus, for example, in decimating by four, four input samples are buffered up by the input data flow manager. The code blocks before the decimator are looped through four times, along with any filtering associated with the decimation, and then the code after the decimator is run once.

Various design integrity checks are performed by the scheduler, such as determining if multiple inputs to a cell have incompatible sample rates, or if any inputs have been left "floating". The scheduler/compiler supports feedback loops within a design, and automatically detects them.

A powerful parameter-passing mechanism in the scheduler/compiler allows each instance of a cell to be customized with different parameters. Parameter values need not be absolute, but can be arbitrary expressions utilizing parameters of higher level cells. The scheduler/compiler provides for cells to verify that their parameter values are legal, and to issue compile-time error messages if not.

Arbitrary design hierarchy is supported by the scheduler/compiler, including multiple sample rates within hierarchical blocks. Using only a schematic editor (e.g., the OrCad system), users may build their own hierarchical composite cells made up of any combination of library primitive cells and their own composite cells. Details of component cells may be hidden, while providing any necessary SPROCdrive interface/-SPROClink microprocessor interface access to selected internal memory locations. Composite cells may also be built which provide access to internal memory locations directly through the composite cell's input/output, allowing efficient, directly wire control of parameters.

A high level flow diagram of the compiler preferably used in conjunction with the SPROC 10 of the invention is seen in FIG. 12. When the user of the development system wishes to compile a design, the user runs the compiler with an input file containing the design. The compiler first determines at 1210 which of its various library blocks (cell library 2015) are needed. Because some of the library blocks will need sub-blocks, the compiler determines at 1212 which sub-blocks (also called child blocks) are required and whether all the necessary library block files can be read in. If they can, at 1220 the compiler creates individual instances of each block required, since the same block may be used more than once in a design. Such a block may be called with different parameters which would thereby create a different version of that block. The instances generated at step 1220 are represented within the compiler data structures as a tree, with the top level block of the user's design at the root of the tree. At 1230, the compiler evaluates the contents of each instance, and establishes logical connects between the inputs and outputs of child instances and storage locations in higher level instances. In evaluating an instance, the compiler determines code and data storage requirements of that instance, and assembles the assembly language instructions which comprise the lowest level child instances. At 1240, the compiler sequences the instances by reordering the list of child instances contained in each parent instance. This is the order in which the set of program instructions associated with each lowest level child instance will be placed in the program memory 150 of the SPROC 10. To do this, the compiler traces forward from the inputs of the top level instance at the root of the tree, descending through child blocks as they are encountered. When all inputs of an instance have been reached, the instance is set as the next child instance in the sequence of its parent instance. Feedback loops are detected and noted. At 1250, the compiler partitions the design over multiple GSPs. Successive child instances are assigned to a GSP until adding one more instance would require the GSP to take more than its allowed processing time; i.e. one sample period. Succeeding child instances are assigned to a new GSP, and the process continues until all the instances are assigned to respective GSPs. As part of the partitioning step 1250, the compiler inserts instances of phantom blocks at the correct points in a child sequence. Phantom blocks are blocks which are not designated by the user, but which are necessary for the correct functioning of the system; e.g. blocks to implement software FIFOs which pass signals form one GSP to the next GSP in the signal flow. At step 1260, the compiler re-evaluates the instances so that the phantom block instances added at step 1250 will be fully integrated into the instance tree data structure of the compiler. Then, at 1270, the compiler generates program code (.spp) by traversing the instance tree in the sequence determined at step 1240, and when each lowest level child instance is reached, by outputting to a file the sequence of SPROC instructions assembled for that instance. It also outputs to a second file desired initialization values (.spd) for the data storage required at each instance. It further outputs to a did file the program and data locations referenced by various symbolic names (.sps) which were either given by the user or generated automatically by the compiler to refer to particular aspects of the design. As aforementioned, additional details of the scheduler/compiler may be seen in the preferred code for the scheduler/compiler which is attached hereto as Appendix M.

E. The Microprocessor

Referring now to the microprocessor side of FIG. 10, a C compiler and linker available from Intermetrics (including a debugger "XDB" and a compiler/linker "C Tools") is shown for a microprocessor (logic processor). The inputs to the C compiler include the symbol translation files (.c and .h) provided by the symbol translator 2050, the SPROC boot file (.blk) provided by the MakeLoad software 2060, functions provided by the SPROC C library 2110 hereto, and either manually generated text editor inputs from text editor 2035 or automatically generated code such as might be generated according to the teachings of U.S. Pat. No. 4,796,179 from a block diagram. Because of the code provided by the symbol translator 2050, source code from the text editor can refer symbolically to variables (e.g., filt1.out) which have been compiled by the SPROClab system. This is critical for the ability of the microprocessor to interface with the SPROC; i.e., for the microprocessor to obtain information via the host or other port from various locations in the SPROC RAM.

The SPROC C function library routines are provided to convert SPROC data types to C compatible data types. The SPROC boot file provided to the C compiler and linker 2100 by the MakeLoad routine 2060 is not particularly processed by the compiler, but is fed into a memory block of the microprocessor's memory space.

The output of the compiler/linker 2100 can be used directly to program the microprocessor 2120, or as shown in FIG. 10 can be provided to a microprocessor emulator 2110. Microprocessor emulator 2110 available from Microtek helps in the debugging process of the microprocessor. As the emulator is not a required part of the system, additional details of the same are not provided herewith. As shown in FIG. 10, the programmed microprocessor 2120 interfaces with the SPROC 10 through the host (parallel) port of the SPROC, although information can be obtained in a serial fashion from a SPROC access port if desired.

As aforementioned, the compiler/linker 2100 for the microprocessor receives code from a text editor or an automatic code generating system. To read and write sample data values, icons are placed on the signal processor block diagram (an example of which is shown in FIG. 11), and the symbol names which might be read from or written to by the microprocessor are made known to the microprocessor compiler/linker by the symbol translator. If the user wishes to read or write signal processor block diagram parameter values (e.g., gain of ampl=x), the user references the symbol name in the microprocessor source code (i.e., the user uses the text editor).

In accord with another aspect of the invention, code for the microprocessor may be automatically generated rather than being generated by the user via the text editor. In automatically generating code for the microprocessor, a block diagram of the microprocessor functions can be entered in a manner similar to that described above with reference to the signal processor block diagram. Then, utilizing the teachings of U.S. Pat. No. 4,796,179, code may be generated automatically. Where automatic programming via block diagram entry of both the signal processor and microprocessor is utilized, reading and writing by the microprocessor of sample data values of the SPROC is accomplished as before (i.e., icons are placed on the signal processor block diagram and the symbol names which might be read from or written to by the microprocessor are made known to the microprocessor compiler/linker by the symbol translator.) However, the reading or writing by the microprocessor of signal processor parameter values is preferably accomplished by providing "virtual" wires between the microprocessor and SPROC blocks. Because the virtual wires are not real wires, no storage is allocated to the virtual wires by either the SPROC or the microprocessor during compilation. However, the location (e.g., ampl gain) to which the virtual wire refers is placed in the .sps file such that the symbol translator 2050 makes it known to the automatic microprocessor compiler. In this manner, the symbolic reference to the parameter is the same for both the SPROC and microprocessor compilers and this permits the microprocessor to read or write that parameter.

Where graphic entry and automatic programming are used for both the microprocessor and SPROC, some means for distinguishing what is to be processed by the microprocessor and what is to be processed by the SPROC is required. A simple manner of distinguishing between the two is to require user entry which will define a block as a block to be executed by the SPROC (e.g., block.spr) or a block to be executed by the microprocessor (e.g., block.mic). Where it is desired to provide blocks which will be executed by both the SPROC and the microprocessor (possibly also including virtual wires), a hierarchical block should be provided. The hierarchical block will contain child blocks which will be designated as .spr or .mic blocks as discussed above.

Another manner of distinguishing what is to be processed by the microprocessor and what is to be processed by the SPROC is to segment the tasks by the sample rate at which the block is functioning, with the relatively slow sampling rate tasks being handled by the microprocessor and the relatively fast sampling rate tasks being handled by the signal processor. Of course, if all blocks are predefined (i.e., are contained in a library), the precoded library code divides the code into code intended for the SPROC and code intended for the microprocessor. Regardless, where graphic entry for both signal processing and logic processing is permitted, the graphic entry eventually results in separate automatic compilation for both the SPROC and the microprocessor, with the SPROClab compiler again providing the necessary symbol table for incorporation during compilation of the microprocessor code.

E.1 SPROClink Microprocessor Interface

The SPROClink microprocessor interface (SMI) is a set of components used to develop microprocessor applications in ANSI C that include the SPROC chip as a memory mapped device. With the components of SMI, one can create microprocessor applications that separate the logic processing tasks that run best on a microprocessor from the real-time signal processing tasks that run best on the SPROC chip. Partitioning the design in this way increases the performance and efficiency of the application.

The SPROC chip communicates with the microprocessor at high speed via the SPROC chip parallel port and appears as a memory mapped device occupying 16K bytes of microprocessor memory space. SPROC chip memory is 4K of 24-bit words that map to the microprocessor as 32-bit words.

SMI supports applications using either Motorola-type (little endian) and Intel-type (big endian) byte ordering.

E.2 SMI Components

SMI includes a symbol translator (SymTran) and the SPROC C function library (sproclib.c).

The symbol translator converts the symbol file produced in the SPROClab development system into a data structure that mirrors the symbol file. This allows for external C references to SPROC chip memory addresses as if the SPROC chip's memory were a C structure.

The SPROC C function library contains the source code and header files for basic functions required to access the SPROC chip from a microprocessor. The library includes the SPROC chip load, reset, and start functions, as well as the data conversion functions required for the microprocessor to correctly access and interpret the 24-bit fixed-point data type native to the SPROC chip.

The components of SMI are not like other SPROClab software tools; they are not invoked from the development system environment. Instead, the components of SMI provide source code, in ANSI C, that is used outside of the SPROClab development system, in an embedded system development environment. By accessing these files using the tools in the embedded system development environment, one can create microprocessor applications in C that include the SPROC chip. Such applications require, however, that one hardware memory map the SPROC.

E.3 The Development Process

The process required to develop a microprocessor application that includes one or more SPROC chips as memory mapped devices requires work that must be done in the SPROClab development system, and work that must be done in the embedded system development environment.

In the SPROClab development system, one must create, debug, and tune the signal processing design using the SPROClab development system tools; and run the SPROCbuild utility to produce the configuration file that the microprocessor application will use to load the signal processing design onto the SPROC chip.

In the embedded system development environment, one must translate the symbol file produced by the SPROCbuild utility into the data structure needed to provide microprocessor access to SPROC chip memory addresses; copy the configuration file, the data structure, and all relevant file sections from the SPROC C function library into the applications work area; and create the microprocessor application. In addition, one must also map the SPROC chip(s) into the microprocessor's memory.

It should be noted that aspects of the microprocessor application depend on output from the signal processing design development process. If one develops the portion of the microprocessor application that deals with the SPROC chip in parallel with the signal processing design, it is important to understand the relationship between the two processes and the dependencies described herein. Otherwise, changes made to the signal processing design may require changes to the microprocessor application.

E.4 Input Requirements

Although SMI does not run under the SPROClab development system, it does require two input files from the development system: a configuration file, and a symbol file.

The configuration file is produced by MakeLoad, a module of the SPROCbuild utility in the SPROClab development system. It includes the program and data that comprise the signal processing design. As a default, the SPROCbuild utility produces a standard configuration file in Motorola S-record format that can be loaded to the SPROC chip from the SPROCdrive interface. This standard configuration file is called a load file and has the file extension .lod. Because the configuration file used by SMI will be compiled by a C compiler and loaded from a microprocessor, the standard S-record format configuration file cannot be used. A special configuration file, called a block file, is required. The block file contains the C code describing the SPROC chip load as an initialized array of data, and it has the file extension .blk. The SPROCbuild utility will produce the configuration file as a block file in addition to a load file if the invocation line switch for the MakeLoad module is entered when running the SPROCbuild utility.

The symbol file is produced by the Schedule module of the SPROCbuild utility. The standard symbol file has the file extension sps. It provides access to memory addresses on the SPROC chip using symbolic names instead of direct memory references. Because the symbol file used by SMI must be included in C programs and compiled by a C compiler, the file must be in a different format than the standard symbol file. To create this special version of the symbol file, the symbol translator (SymTran) takes as input the symbol file generated by the SPROCbuild utility and produces C header and code files that create a data structure mirroring the symbol file and including all necessary variable declarations. The symbol translator produces one header file and one code file for each signal processing design.

E.5 Signal Processing Design Considerations

In order for a signal processing design created in the SPROClab development system to be usable in a microprocessor application, the microprocessor must have access to the values of variables in the design running on the SPROC chip. Special cells in the SPROCcells function library provide this access by flagging specific nodes in the design for microprocessor visibility. This "micro" keyword triggers the symbol translator to make external C references to the associated symbols available. Only symbols with this micro keyword are available to the microprocessor.

E.6 Embedded System Development Considerations

The signal processing design must be completed and debugged using the SPROClab development system software. The SPROCdrive interface software is the primary tool for interactively debugging and tuning designs for the SPROC chip. In general, the signal processing design should be completed to a stable interface level before development of the microprocessor application begins. If the signal processor design is modified later, the symbol file and block file generated from it must be updated, and the microprocessor application using the files must also be modified to accommodate the change. It is advisable to use a dependency file and make facility to track inter-related design modifications and ensure consistent creation and use of up-to-date files.

E.7 Using the SPROC Configuration File

The SPROC configuration file contains the program and data that executes on the SPROC chip. It is produced by the MakeLoad module of the SPROCbuild utility in the SPROClab development system. The configuration file is nominally generated in Motorola S-record format for loading from the SPROCdrive interface. It must be generated as an initialized data array for loading from a microprocessor application. A switch setting in the invocation line of MakeLoad determines which format of the configuration file will be produced. The configuration file generated as an initialized array of data is called a block file, and has the file extension .blk. (The base of the file name matches the base of the signal flow diagram from which the configuration was generated.) This file includes the block-formatted data that comprises the load for the SPROC chip, and it declares a C variable that identifies that block of data. This C variable, the block variable, has the following form: mydesign_block where mydesign is the base name of the block file (the same base as the signal flow diagram of the design, and the same base as the symbol file input to the symbol translator).

In a microprocessor application, the block file is available as a block of data that can be downloaded to the memory mapped SPROC chip using a C function call and the block variable. The sproc_load function included in the SPROC C function library will download the block file to the SPROC chip.

E.8 Using the Symbol Translator

The symbol translator (SymTran) converts the symbol file produced by the SPROCbuild utility in the SPROClab development system into a data structure that declares C variables for SPROC memory addresses. Output from the symbol translator declares a global static variable that identifies the complete data structure. This data structure occupies 4K by 4 bytes of microprocessor memory. The variable declared to identify the structure is the sproc_id, and the variable name matches the base name of the symbol file. The symbol translator produces the header and code files needed to provide external C references for SPROC chip memory addresses. The header file makes the SPROC memory addresses available to the microprocessor for reference as C variables, and the code file locates the C variables at the appropriate places in the SPROC chip memory map.

The symbol file generated by the SPROCbuild utility in the development system has the file extension .sps. (The base of the file name matches the base of the signal flow diagram from which the symbol file was generated.) The symbol translator translates the symbol file into a header file (with, extension .h) and a code file (with extension .c) that use the same base file name as the input symbol file. For example, the SPROCbuild utility uses a signal flow block diagram named mydesign.sch to produce a symbol file named mydesign.sps. The symbol translator uses this symbol file (mydesign.sps) to produce the header file mydesign.h and the code file mydesign.c.

Not all of the SPROC memory addresses represented by symbols in the symbol file are available to the microprocessor. Only symbols that include the micro keyword are made visible to the microprocessor. This keyword is set as a characteristic of the specific cells used in the signal flow block diagram of the design.

Due to differences in syntax, some of the characters used in symbol names for the SPROC chip environment cannot be used in C. Symbols that use characters that are illegal in C are altered during translation to make them legal. For example, all symbols that contain the % character are converted to contain a capital P character. Symbols of this form typically identify SPROC chip register addresses.

The symbol file includes symbolic names for all SPROC memory addresses. The symbol file provides a hierarchical structure that uniquely identifies nodes and attributes of all cell instances in a signal processing design. Levels of hierarchy in symbol names are separated by a dot (.) character. For example, in the symbol name amp1.gain, amp1 is the amplifier cell that contains the specific attribute (gain) named by the symbol. In addition to determining the hierarchy of nodes and attributes, the SPROCbuild utility also determines the order in which these elements will be processed on the chip, and it assigns chip memory locations (addresses) based on this order. The address for a node or attribute is saved in the symbol file along with its symbol name, so that the symbol file comprises an address map of the symbol names for all nodes and attributes in the design.

Some nodes and attributes can be referenced by multiple symbols (or aliases). For example, a wire that connects two cells is both the output of the first cell and the input of the second. In addition, a label may be specified for the wire. All three symbols, for the output of the first cell, the input of the second cell, and the label for the wire, refer to the same node on the design and to the same location in SPROC chip memory. When such aliases are translated, the symbol translator ensures that all aliases for a symbol refer to the same location in SPROC chip memory.

Only the SPROCbuild utility can manipulate the order of the nodes and attributes represented by the address structure. This structure may change any time the utility is invoked to convert a block diagram and generate a configuration file and a symbol file, depending on what changes have been made to the design. If the order of nodes and attributes changes, the address assignments that represent that order change. Therefore, one must always be sure to work with a current version of the symbol file, and never make assumptions about the addresses assigned to symbols or the order of nodes and attributes relative to each other.

E.9 Using the SPROC C Function Library

The SPROC C function library (sproclib.c) includes the basic functions necessary to allow the microprocessor to control the SPROC chip. The SPROC C function library includes source modules that determine the byte ordering supported by SMI, define SPROC data types, provide functions to convert C's data types to and from SPROC data types, and provide functions for the microprocessor to load the SPROC chip and start execution of the signal processing design. All modules are supplied as source and must be compiled and linked in the embedded system development environment. Not all modules are, required for every application. The user may select the specific modules needed for a particular application and compile and link only those. If the embedded system design environment supports libraries, one may compile all modules and build them into a library from which one can reference selected modules for linking in a specific application.

Because the data type native to the SPROC chip is incompatible with C's intrinsic floating point data type, SMI defines specific SPROC data types for access from the microprocessor application. It also provides conversion functions to convert to and from the defined SPROC data types. The SPROC data types provided by SMI are:

FIX24_TYPE, the data type native to the SPROC chip, a fixed-point, 24-bit 2's compliment value in the range $-2 \leq x < 2$.

FIX16_TYPE, supports applications where precision can be sacrificed for increased speed of data transfer. It is the most significant 16 bits of the FIX24_TYPE data.

INT24_TYPE is a 24-bit integer data type.

All symbols are declared to be sdata, a union of all SPROC data types. The header file sprocdef.h defines the SPROC data types and function prototypes. It must be included in each C module that references SPROC data values.

SMI supports applications using both Motorola-type (little endian) and Intel-type (big endian) byte ordering. The default byte ordering is Motorola-type. To change the byte ordering, one must edit the file sprocdef.h, or use the #define INTEL statement or the define switch on the C compiler. To edit the file sprocdef.h, comment out the lines relating to Motorola-type byte ordering, and uncomment the lines that provide support for Intel-type byte ordering.

SMI provides three basic functions required for the microprocessor application to load the SPROC chip and start signal processing design execution: sproc_load, sproc_reset, and sproc_start.

The sproc_load function downloads the signal processing design onto the target SPROC chip. It writes the chip's code, control, and data space with data from the block file. The sproc_load function has the form: sproc_load(sproc_id, block) where sproc_id is the name of the data structure created by the symbol translator (i.e., the base name of the input symbol file), and block is the block variable declared in the SPROC configuration file. The block variable has the form mydesign_block.

The sproc_reset function issues a software reset to the target SPROC chip. The sproc_reset function has the form: sproc_reset (sproc_id) where sproc_id is the name of the data structure created by the symbol translator (i.e., the base name of the input symbol file).

The sproc_start function initiates execution of the signal processing design loaded on the SPROC chip. The sproc_start function has the form sproc_start (sproc_id) where sproc_id is the name of the data structure created by the symbol translator (i.e., the base name of the input symbol file).

E.10 Accessing SPROC Chip Memory Values

In the microprocessor application, one can read and write the SPROC chip memory value for any node or parameter whose symbol is visible to the microprocessor. However, there are several issues one must consider when determining how to incorporate access to the available SPROC chip memory values into the application. First, most values in SPROC chip memory locations are driven by the activity of the chip's general signal processors (GSPs), at signal processing speeds. Memory values are modified at speeds much higher than the relatively slow speed of the interface to the values provided by the microprocessor bus. Second, some values are dynamic and change during execution of the particular cell that contains them. For example, the coefficients of adaptive filters are modified by the filter algorithm defined for the cell.

Given the issues noted above, reading SPROC chip memory values is less risky than writing values. However, because of the slow microprocessor interface speed, microprocessor reads of SPROC chip data can be problematic. Any SPROC chip memory value read by the microprocessor may be obsolete by the time the microprocessor obtains it due to the relatively slow speed of the microprocessor interface. In addition, consecutive microprocessor reads of SPROC chip memory addresses will obtain values that were computed at different times, but not necessarily consecutively. Other values may have been written by the GSPs between microprocessor read accesses. To ensure obtaining consecutively computed values for use by the microprocessor, a sink cell is used to collect values at the signal processing rate.

Writing values from the microprocessor presents specific problems. As noted above, the values of many parameters are modified by the GSPs or by the cells that contain them as the signal processing design executes. Other parameters, like the gain of an amplifier, are usually defined on the signal processing block diagram and their values generally remain constant during design execution. Depending upon the specific signal processing design and SPROC chip memory address, a destination address written by the microprocessor may be overwritten by a GSP during design execution if the microprocessor write is not coordinated with the signal processing activity in the design. One way to ensure that values written by the microprocessor will not be overwritten before they are used in the signal processing design is to use a source cell with., reset. This cell allows the microprocessor to safely write into the cell's in vector, which cannot be written by any GSP, then write to the cell's reset line to pump out the values.

Writing a set of new filter coefficient parameters for a filter cell presents a difficult problem. Filter response may become unstable as the values are slowly changed from the old stable set to a new stable set. A workaround solution to allow filter coefficient changing is to instantiate two filters in the signal processing design and use a comparator cell functioning as a multiplexor to direct signal flow through one filter or the other. The microprocessor can change the coefficient set in the non-executing filter then switch the signal flow to that filter without producing an unstable filter response. This approach, however, results in "over allocation" of GSP resources. Resource requirements are calculated based on the existence of both filters, because the SPROCbuild utility has no information on the actual run-time signal flow.

F. Low Frequency Impedance Analyzer Example

Turning to FIG. 11, a block diagram is seen of a low frequency impedance analyzer. The analyzer includes several multipliers 2201, 2203, 2205, 2207, 2209, 2211, two scalers, 2214, 2216, two integrators 2220, 2222, two hard limiters 2224, 2226, two full wave rectifiers 2230, 2232, two filters 2234, 2236, two amplifiers 2238, 2240, two summers 2242, 2244, three arrays (sink blocks) 2246, 2248, 2250, an oscillator 2252, a serial input 2253, two serial outputs 2254, 2255 and two microprocessor software interface output cells 2256, 2258, and one microprocessor interface input cell 2260. Each block has a library name (e.g., SCALER, MULT, SUM2, FILTER, etc.), an instance name (e.g., SCALER1, MULT2, etc.), and at least one terminal, and many of the blocks include parameters (e.g., shift=, upper=, spec=, freq=, etc.). The wires between terminals of different blocks carry data sample values (as no virtual wires are shown in FIG. 11). The serial input 2253 receives data from external the SPROC at a high frequency sample data rate, and the data is processed in real time in accord with the block diagram. The SPROC outputs two values external to the SPROC and microprocessor (i.e., out the serial ports) as a result of the SPROC processing. Information to be provided to or received from the microprocessor is sent or received via the microprocessor software interface cells 2256, 2258, and 2260. In particular, when the microprocessor writes to the location of cell 2260, cell 2260 causes the arrays 2246, 2248 to collect data and to provide a signal to microprocessor software interface output cells 2256 and 2258 when filled.

With the block diagram so provided on an OrCad graphic interface, and in accord with the above description, after translation by the MakeSDL file, the scheduler/compiler provides a program file (yhpdual.spp) and a data file (yhpdual.spd) for the SPROC, and a symbol file (yhpdual.sps) for the symbol translator and microprocessor and for the SPROCdrive interface. The program, data, and symbol files are attached hereto as Appendices F, G, and H. In addition, the yhpdual.spp and yhpdual.spd files are processed by the MakeLoad program which generates the yhpdual.blk file which is attached hereto as Appendix I.

In order to completely implement the low frequency impedance analyzer such that it may be accessed by the microprocessor, the microprocessor is provided with C code. An example of C code (Maintest.C) for this purpose is attached hereto as Appendix J. Of course, similar code could be generated in an automatic fashion if an automatic microprocessor code generator were to be utilized. As provided, the C code attached as Appendix J calls yhpdual.c and yhpdual.h which are the translated files generated by the symbol translator from the yhpdual.spp file generated by the SPROC scheduler/compiler. Attached hereto as Appendices K and L are the yhpdual.h and yhpdual.c files. Thus, the Maintest.C as well as the yhpdual.h and hypdual.c files are provided in a format which can be compiled by the microprocessor compiler.

There have been described and illustrated herein architectures and methods for dividing processing tasks into tasks for a programmable real time signal processor and tasks for a decision-making microprocessor interfacing with the real time signal processor. While particular embodiments of the invention have been described, it is not intended that the invention be limited thereto, as it is intended that the invention be as broad in scope as the art will allow and that the specification be read likewise. Thus, while particular hardware and software have been described, it will be appreciated that the hardware and software are by way of example and not by way of limitation. In particular, while a 68000 microprocessor and C compiler for the 68000 microprocessor have been described, other processors (i.e., not only "microprocessors"), and/or other types of code (e.g., FORTRAN, PASCAL, etc.) could be utilized. AH that is required is that the symbol table code (.sps) generated by the SPROClab development system be in a format for compilation by the processor compiler, and that, where provided, the boot file (.blk) be in a format for compilation by the processor compiler or in a format for storage by the processor. Similarly, while a particular real time signal processor (the SPROC) has been described, it will be appreciated that other similar type signal processors can be utilized provided that the signal processor is directed to signal processing rather than logic processing; i.e., the signal processor should have a non-interrupt structure where dam flow is through central memory. Further, while a system which provides the realization of a high level circuit in a silicon chip from simply a sketch on a graphic user interface has been described for at least the real time signal processor, it will be appreciated that the text editor could be used to replace the graphic entry, and that while the system would not be as convenient, the graphic entry is not absolutely required. Similarly, the text editor could be eliminated and the system could work only from the graphic entry interface. Other readily evident changes include: an expanded or a different cell library; different graphic user interfaces; the provision of a scheduler/-compiler for the SPROC which is directly compatible with the graphic user interface (rather than using a translator such as MakeSDL); and the provision of different software packages. It will therefore be appreciated by those skilled in the art that yet other modifications could be made to the provided invention without deviating from its spirit and scope as so claimed.

APPENDIX A

```
/*
 Copyright (c) 1991 Star Semiconductor Corporation. All Rights Reserved.
 This material may not be copied or used without prior written permission.

 * $Id: makesdl.c,v 1.4 1991/10/01 16:24:10 ivan Exp $
 * $Log: makesdl.c,v $
 * Revision 1.4  1991/10/01  16:24:10  ivan
 * Fix wild address bug.
 *
 * Revision 1.3  1991/09/16  19:06:37  ivan
 * Changed error messages to Star format
 *
 * Revision 1.2  1991/09/11  15:20:52  ivan
 * Support 'blocklen' parameter on 'filter' blocks to control splitting
 * of filters longer than a sample period into seperate blocks.
 *
 * Revision 1.1  1991/09/06  18:47:50  ivan
 * Initial revision
 *
 */

/*************************************************************************

                              makesdl.c

**************************************************************************
FUTURENET/DISPRO to SDL file conversion.

   Convert a FUTURENET pinlist format netlist file into an SDL hierarchical
   file. Build a list of filters in the design and after completing the
   netlist conversion call the DISPRO to SDL converter successively for
   each filter. Thus a total of (1+N) ".sdl" files are created, where N is
   the number of filters in the design. Also a ".dat" file is created for
   each fir in the design. A ".spf" file is created containing a list of all
   filters successfully converted to sdl in this design, useful for "make".

*/


/*******************/
/*    requires     */
/*******************/

#include "sysfunct.h"
#include "strfunc.h"
#include <stdio.h>
#include <stdlib.h>
#include <string.h>
#include <ctype.h>

/*******************/
/*   exceptions    */
/*******************/


/*******************/
/*    constants    */
/*******************/

#define MAXCOMMAND 82           /* dos command line size                */
```

```
#define MAXNAME 32              /* dos filename name size            */
#define MAXEXT  8               /* dos filename extension size       */
#define MAXPARAM 10             /* number of command line params     */
#define MAXPARMS 8              /* number of cell parameters                */

#define MAXLINE 200             /* input file line size              */
#define MAXREF 32               /* ORCAD reference designator        */
#define MAXMODEL 32             /* ORCAD part name                   */
#define MAXFIELD 32             /* ORCAD part field                  */
#define TLEN 32

#define NOW 1000                /* max number of wires per schematic */
#define NOI 16                  /* max number of inputs per icon     */
#define NOO 16                  /* max number of outputs per icon    */
#define NOTK 12                 /* max number of tokens on line      */
#define NFILTER 30              /* max number of filters per design  */
#define NTFUNC 25               /* max number of tran fnc per design */
#define ARRAY_WIDTH 32          /* max length of wire name           */
#define SECTSIZE 30     /* for splitting FIR into blocks     */

/*******************/
/*     types     */
/*******************/

typedef enum(singleFilter, dualFilter, transferFunction)filterType;
typedef char maxfield[MAXFIELD];

typedef struct
                        {
                                int index;
                                char reference[MAXREF];
                                char model[MAXMODEL];
                                maxfield parms[MAXPARMS];
                        }       symbol;

/*******************/
/*      data     */
/*******************/

symbol sptr;

static char makesdl[] = "$Revision: 1.4 $";

/*********************************************************
allocate 2 dimensional character arrays for storage of lists
*********************************************************/

int wlc = 0,
    ilc = 0,
    olc = 0;
int flc = 0,
    tlc = 0;

char wire_list[NOW][ARRAY_WIDTH];
char input_list[NOI][ARRAY_WIDTH];
char output_list[NOO][ARRAY_WIDTH];
char token_list[NOTK][ARRAY_WIDTH];

char filter_list[NFILTER][ARRAY_WIDTH];
char struc_list[NFILTER][ARRAY_WIDTH];

int blockLen_list[NFILTER];
char tfunc_list[NTFUNC][ARRAY_WIDTH];
char tfunc_struc_list[NTFUNC][ARRAY_WIDTH];
```

```
/*******************/
/*    macros     */
/*******************/


/*******************/
/*    functions   */
/*******************/

int translate(FILE * src, FILE * dest, char *design_name);
int find_next_block(FILE * ifile, char loc_rec[]);
int get_block(FILE * fname);
int split_tokens(char *p1, char p2[][ARRAY_WIDTH]);
void format_error(const char *string);
int pr_array(FILE * dest, char list[][ARRAY_WIDTH]);
int row_not_sent(char list[][ARRAY_WIDTH], int index);
int convert_filter_block(filterType);
char *get_str(char *s);
int make_filter(char *name, char *struc, int maxtaps);
int not_in_array(char list[][ARRAY_WIDTH], int index, char *str);
int gettff(char *name);


/***********
main program
***********/

void main(int argc, char *argv[])
{
    FILE *infile,
        *outfile,
        *fltfile;
    char fname[MAXNAME],
         ext[MAXEXT];
    char inpath[MAXNAME],
         outpath[MAXNAME],
         fltpath[MAXNAME];
    int exit_code = 0;
 /*****************************
 process command line parameters
 *****************************/

    printf("\nMakesdl %s\n", makesdl);
    printf("Copyright (C) 1991 by STAR Semiconductor Corporation.\n");

    if (argc > 1)
    {
        strtolw(argv[1]);
        if ((strcmp(argv[1], "-h") == 0) || (strcmp(argv[1], "/h") == 0))
        {
            printf("Usage: makesdl filename[.net]\n");
            exit(-1);
        }
        else
            strcpy(inpath, argv[1]);


        }
    #ifdef DEBUG
        else
        {
        /* DEBUG only */
            strcpy(inpath, "ftest3");
        }

    #else
```

```
   else
   {
       printf("Usage: makesdl filename[.net]\n");
       exit(-1);
   }
#endif
 /*****************************
 make input and output filenames
 *****************************/

   splitname(inpath, fname, ext);

   if (strcmp(ext, ".sdl") == 0)
               {
               printf("ERROR -- mak001: input file cannot be \"%s\"\n", ext);
               exit(-1);
               }
   else if (strcmp(ext, ".dat") == 0)
               {
               printf("ERROR -- mak002: input file cannot be \"%s\"\n", ext);
               exit(-1);
               }
   else if (strcmp(ext, "") == 0)      /* append default extension */
               {
               strcpy(ext, ".net");
               mergename(inpath, fname, ext);
               };

   mergename(outpath, fname, ".sdl");
   mergename(fltpath, fname, ".spf");

 /*************************
 open input and output files
 *************************/

   if (check_open_rf(&infile, inpath) != 0)
               {
               printf("ERROR -- mak003: failed to open %s\n", inpath);
               exit(-1);
               };

   if ((outfile = fopen(outpath, "w")) == NULL)
               {
               printf("ERROR -- mak004: failed to open %s\n", outpath);
               exit(-1);
               };

   if ((fltfile = fopen(fltpath, "w")) == NULL)
               {
               printf("ERROR -- mak005: failed to open %s\n", fltpath);


               exit(-1);
               };

/********************************
translate the input to output file
********************************/

  printf("Creating %s from %s\n", outpath, inpath);

  if ((exit_code = translate(infile, outfile, fname)) != 0)
              {
              printf("ERROR -- mak006:  could not translate %s\n", inpath);
              exit(-1);
              };
```

```
/****************************
close netlist translator files
****************************/

   fclose(infile);
   fclose(outfile);

/*********************************************************************
Call filter translator to generate the hierarchical sdl files for
all filters in this design.
*********************************************************************/

  while (--flc >= 0)
          {
          int err,
                  temp;
          err = make_filter(filter_list[flc], struc_list[flc], blockLen_list[flc]);
          if (err < 0)
                  {
                  printf("ERROR -- mak007: problem with filter %s\n", filter_list[flc]);
                  exit_code = -1;
                  };

                  temp = fprintf(fltfile, "%s.fdf\n", filter_list[flc]);
          };

/*********************************************************************
Call transfer function translator to generate the hierarchical sdl files
for all transfer functions in this design.
*********************************************************************/

  while (--tlc >= 0)
          {
          int err,
                  temp;
          err = gettff(tfunc_list[tlc]);
          if (err < 0)
                  {
                  printf("ERROR -- mak008:  problem with transfer function %s\n", tfunc_list[tlc]);
                  exit_code = -1;
                  };
          temp = fprintf(fltfile, "%s.tff\n", tfunc_list[tlc]);
          };

  fclose(fltfile);


   exit(exit_code);
     }


/*****************************************************************
FUNCTION DEFINITION:    translate

Take the contents of a file in FUTURENET format and convert them
into another file in SDL format. Use given name to assign top level
design name. Do a basic check to validate the file contents are in
pinlist format.
*****************************************************************/

int translate(FILE * src, FILE * dest, char *name)
{
   int trl_status;
   FILE *tmpfile;
```

```
   char temp_rec[MAXLINE];
/*****************
check file validity
*****************/

   tri_status = 0;
   fgets(temp_rec, MAXLINE, src);
   if (strncmp(temp_rec, "PINLIST", 7) != 0)
       return (-1);

   tmpfile = fopen("$sdl1.tmp", "w");

/*************************
write header to output file
*************************/

   fprintf(dest, "block %s()\n\n", name);


/*****************
clear wire list
*****************/

      {
              int i;
              for (i = 0; i < NOW; i++)
                      wire_list[i][0] = '\0';
      };
   wlc = 0;


/*******************************************************************
process successive blocks copy each block into the structure sptr,
and update the lists of inputs, outputs and wires.
*******************************************************************/

   while ((find_next_block(src, temp_rec)) == 0)
              {
              get_block(src);         /* fill sptr, input, output, wire lists */

              /*****************************************************************
              write sdl for this block to a temporary file, since wire list must
              be at top of output file, but is not yet available




 *****************************************************************/

 /* kill all white space in parameter structure */

 strcpress(sptr.model);
 strcpress(sptr.reference);
 {
         int i;
         for (i = MAXPARMS - 1; i>=0; --i)
                 strcpress(sptr.parms[i]);
 };

 /* Now check if this block is a filter, extract the reserved parameters
    "spec=filename" and "struc=primitive_name". Add these parameters to
    the list of filters which will be translated when the netlist
    translation, including the modified hierarchical filters, is complete */
```

```
if (strcmp(sptr.model, "filter") == 0)              /* normal filter */
        tri_status = convert_filter_block(singleFilter);
else if (strcmp(sptr.model, "vcfilter") == 0)   /* vcfilter */
        tri_status = convert_filter_block(dualFilter);
else if (strcmp(sptr.model, "transfnc") == 0)   /* transfer function */
        tri_status = convert_filter_block(transferFunction);

fprintf(tmpfile, "%s %s\n", sptr.model, sptr.reference);
fprintf(tmpfile, "   {");

/* write parameter list for this block, skip blank fields */

{
        const char* delim = " ";
        int i;

        for (i = MAXPARMS - 1; i>=0; --i)
                {
                char* ptr = sptr.parms[i];
                strcpress(ptr);
                if (strcmp(ptr, "") != 0)
                        {
                        fprintf(tmpfile, "%s\n   %%%s", delim, ptr);
                        delim = ",";;
                        };
                };
};

fprintf(tmpfile, "\n   }\n");

/* write list of inputs and outputs for this block. Initialise the list
   delimiter first, after first entry is written update the delimiter to
   a comma. When input list is exhausted move on to output list. */

fprintf(tmpfile, "   (\n   ");

{
        const char* delim = "";
        int j;
        for (j = 0; j < NOI; j++)
                {
                if (strcmp(input_list[j], "") != 0)
                        {

                                        fprintf(tmpfile, "%s%s", delim, input_list[j]);
                                        delim = ",\n   ";
                                        };
                                };

                        for (j = 0; j < NOO; j++)
                                {
                                if (strcmp(output_list[j], "") != 0)
                                        {
                                        fprintf(tmpfile, "%s%s", delim, output_list[j]);
                                        delim = ",\n   ";
                                        };
                                };

                };
                fprintf(tmpfile, "\n   );\n\n");
                };

/*************************************************
all blocks now processed, terminate temporary file
*************************************************/
```

```
   fprintf(tmpfile, "end\n");


/****************************
write wire list to output file
****************************/

   fprintf(dest, "   wire\n");
   pr_array(dest, wire_list);
   fprintf(dest, ";\n\n");
   fprintf(dest, "begin\n");
/* printf("Processed %i blocks\n", i); */


/*****************************
close temporary file and return
*****************************/

   fclose(tmpfile);


/**************************************
now append temporary file to output file
**************************************/

   tmpfile = fopen("$sdl1.tmp", "r");
       forever
              {
              fgets(temp_rec, MAXLINE, tmpfile);
              if (feof(tmpfile) != 0)
                     break;
              fprintf(dest, "%s", temp_rec);
              };
   fclose(tmpfile);
       unlink("$sdl1.tmp");
   return (trl_status);
       }


/****************************************************
FUNCTION DEFINITION:    find_next_block

Advance to beginning of next block in file
****************************************************/

int find_next_block(FILE * ifile, char loc_rec[])
{
    strcpy(loc_rec, "\n");      /* flush record string */
    while (strncmp(loc_rec, "(SYM", 4) != 0 && feof(ifile) == 0)
        fgets(loc_rec, MAXLINE, ifile);
    return (feof(ifile));
}


/**********************************************************
FUNCTION DEFINITION:    get_block

Process all lines of a block into a form usable for generation
of SDL lines may be of the form:

       DATA,2 - instance info
       DATA,3 - symbol / parameter / verify info
       PIN    - wire info
       other  - garbage for now
**********************************************************/
```

```
int get_block(FILE * fname)
{
   int i = 0;
   char tmp_rec[MAXLINE];
/**************
reset structure
**************/

   sptr.index = 0;
   sptr.reference[0] = '\0';
   sptr.model[0] = '\0';
       {
              int i;
              for (i = MAXPARMS - 1; i>= 0; --i)
                     sptr.parms[i][0] = '\0';
       };

/****************************
clear input list, output list
****************************/

   for (i = 0; i < NOI; i++)
       input_list[i][0] = '\0';
   ilc = 0;

   for (i = 0; i < NOO; i++)
       output_list[i][0] = '\0';
   olc = 0;

/* fetch sucessive line records from file and extract tokens */

   do


{
    fgets(tmp_rec, MAXLINE, fname);
    split_tokens(tmp_rec, token_list);

/*****************
process DATA lines
*****************/

    if (strcmp(token_list[0], "data") == 0)
           {
       if (strcmp(token_list[1], "2") == 0)
                  strcpy(sptr.reference, token_list[2]);
       else if (strcmp(token_list[1], "3") == 0)
                  {
                  int i;
                  strcpy(sptr.model, token_list[2]);
                  for (i = MAXPARMS - 1; i>= 0; --i)
                         strcpy(sptr.parms[i], token_list[i+3]);
                  }
       else
                  format_error("ignoring unknown DATA statement");
           }

/****************
process PIN lines
****************/

   else if (strcmp(token_list[0], "pin") == 0)
           {
           /* Replace the *** characters from the wire number generated in
              futurenet netlist with something readable */
```

```
                        if (strncmp(token_list[2], "****", 3) == 0)
                                {
                                token_list[2][0] = '_';
                                token_list[2][1] = 'w';
                                token_list[2][2] = 'n';
                                };

                /* check lists are not full */

                        if (ilc >= NOI)
                                format_error("too many inputs on block");
                        if (olc > NOO)
                                format_error("too many outputs on block");
                        if (wlc > NOW)
                                format_error("too many wires in design");

                /* add an input to input and wire lists for this block */

                        if (strcmp(token_list[5], "23") == 0)
                                {
                                strcpy(input_list[ilc++], token_list[2]);
                                if (not_in_array(wire_list, wlc, token_list[2]) == 0)
                                        strcpy(wire_list[wlc++], token_list[2]);
                                }

                /* add an output to output and wire lists for this block */

                        else if (strcmp(token_list[5], "21") == 0)

                                {
                                strcpy(output_list[olc++], token_list[2]);
                                if (not_in_array(wire_list, wlc, token_list[2]) == 0)
                                        strcpy(wire_list[wlc++], token_list[2]);
                                }

                        else
                                format_error("bad pin statement");
                }

    /*****************
    process other lines
    *****************/

        else if (strcmp(token_list[0], ")") == 0)
            ;
        else
        {
            printf("WARNING -- mak010: ignoring unknown line: %s\n", token_list[0]);
        }
    } while (strcmp(token_list[0], ")") != 0);

    return (0);
}


/****************************************************
FUNCTION DEFINITION:    split_tokens

from a buffer p1 extract tokens to array of strings p2
****************************************************/

int split_tokens(char *p1, char p2[][ARRAY_WIDTH])
{
    int i,
        j,
        k;
```

```
   char c;
   char token[TLEN];
/*********************
flush token array first
*********************/

   for (i = 0; i < NOTK; i++)
       p2[i][0] = '\0';

/*********************
fetch new tokens
*********************/

   i = 0, j = 0;
       forever
   {
       k = 0;
       forever
       {
           c = p1[i];
           if (c == '\0' || c == ',' || c == '\n')
           {
           /* token complete, so null terminate, exit if too long */

                   token[k] = '\0';
                   i++;
                   if (k++ >= TLEN)
                   {
                       printf("ERROR - token too long\n");
                       exit(-1);
                   }
                   break;
               }

           /* token not complete yet, append another character */
               token[k] = (char)tolower(c);
               i++;
               k++;
           }

       /* move this token to token list */
           strcpy(p2[j], token);
           if (j++ >= NOTK)
           {
               printf("ERROR - too many tokens on line\n");
               exit(-1);
           }

       /* check for end of line */
           if (c == '\0' || c == '\n')
               break;
       }
       return (j);
}

void format_error(const char *string)
{
   printf("ERROR - %s", string);
   exit(-1);
}
```

```
/***********************************************************************
FUNCTION DEFINITION:    pr_array

print a comma separated list to a stream, terminates on a null
list entry, or the number of wires in a design is exhausted.
***********************************************************************/

int pr_array(FILE * dest, char list[][ARRAY_WIDTH])
{
    int i = 0;
    char loc_rec[ARRAY_WIDTH];
    if (strcmp(list[i], "\0") == 0)     /* check first one */
        return (i);
    strcpy(loc_rec, list[i]);
    fprintf(dest, "   %s", loc_rec);

    forever                         /* check the rest  */
    {
        if (strcmp(list[++i], "\0") == 0 || i > NOW)    /* check next one  */
            break;                  /* nothing left    */
        else

        {
            strcpy(loc_rec, list[i]);
        /* if( row_not_sent(list, i)==0 ) */
            fprintf(dest, ",\n   %s", loc_rec); /* always print it */
        }
    }
    return (i - 1);
}


/******************************************************************
FUNCTION DEFINITION:    row_not_sent

see if current row (string) in an array exists earlier in the array,
return 0 if current entry does not exist earlier. Used to prevent
duplication when creating a wire list.
******************************************************************/

int row_not_sent(char list[][ARRAY_WIDTH], int index)
{
    char loc_rec[TLEN];
    int k;
    strcpy(loc_rec, list[index]);       /* ok to corrupt local copy of index  */
    for (k = index - 1; k >= 0; k--)    /* step back one entry in list        */
    {
        if (strcmp(loc_rec, list[k]) == 0)
            return (-1);        /* if duplicate found earlier in list */
    }
    return (0);
}


/******************************************************************
FUNCTION DEFINITION:    not_in_array

See if a string exists in the array (list of strings),
return 0 if current entry does not exist earlier. Used to prevent
duplication when creating a wire list.
******************************************************************/

int not_in_array(char list[][ARRAY_WIDTH], int index, char *str)
{
    int k;
    for (k = index - 1; k >= 0; k--)    /* step back one entry in list        */
```

```
    {
        if (strcmp(str, list[k]) == 0)
            return (-1);        /* if duplicate found earlier in list */
    }
    return (0);
}

/***********************************************************************
FUNCTION DEFINITION:    convert_filter_block

Convert a filter block structure to a specific named instance of
a hierarchical block, add the specification file name and the required
filter structure name to lists for future filter translation.
Valid filter structures names: biquad, biqamp, vcf
***********************************************************************/


int convert_filter_block(filterType code)
{
    int cfb_status;
        char* specPtr;
        char* strucPtr;
        int* blockLenPtr;
/**************************************************************
Set default filter implementation, since the "struc" parameter
needs to be optional at the schematic entry time.

code=1, FILTER   - use single input filter primitives
code=2, VCFILTER - use dual input controlled filter primitives
code=3, TRANSFNC - use single input filter primitives

Valid FILTER struc's are:    biquad, biqint, biqamp
Valid VCFILTER struc's are:  biqvc
**************************************************************/

    cfb_status = 0;
        blockLenPtr = &blockLen_list[flc];
        *blockLenPtr = SECTSIZE;        /* default, overridden by blocklen */
    switch (code)
            {
    case singleFilter:  /* FILTER default structure   */
            strcpy(strucPtr = struc_list[flc], "biquad");
            specPtr = filter_list[flc++];
            break;
    case dualFilter:    /* VCFILTER default structure */
            strcpy(strucPtr = struc_list[flc], "biqvc");
            specPtr = filter_list[flc++];
            break;
        case transferFunction:
            strcpy(strucPtr = tfunc_struc_list[flc], "biquad");
            specPtr = tfunc_list[tlc++];
            break;
    default:
            cfb_status = -1;        /* ERROR condition      */
            break;
            };
        strcpy(specPtr, "");            /* null the spec first        */


/****************************
check filter list is not full
****************************/

    if (flc >= NFILTER)
            {
```

```
          printf("ERROR -- mak011:Too many filters to handle\n");
          cfb_status = -1;
          return (cfb_status);
          };

if (tlc >= NTFUNC)
          {
          printf("ERROR -- mak012: Too many transfer functions to handle\n");
          cfb_status = -1;
          return (cfb_status);
          };


  /**************************
  get spec and structure names
  **************************/
        {
        int i;
        for (i = MAXPARMS-1; i >= 0;i--)
                {
                if (strncmp(sptr.parms[i], "spec=", 5) == 0)
                        {
                        strcpy(specPtr, get_str(sptr.parms[i]));
                        sptr.parms[i][0] = '\0';       /* now delete spec parameter  */
                        }
                else if (strncmp(sptr.parms[i], "struc=", 6) == 0)
                        {
                        strcpy(strucPtr, get_str(sptr.parms[i]));
                        sptr.parms[i][0] = '\0';       /* now delete struc parameter */
                        }
                else if (code != transferFunction &&
                                strncmp(sptr.parms[i], "blocklen=", 9) == 0)
                        {
                        *blockLenPtr = atoi(get_str(sptr.parms[i]));
                        sptr.parms[i][0] = '\0';       /* now delete blocklen parameter */
                        }
                };
        };

 /****************************************************
 Modify the structure to reflect actual instance of filter
 ****************************************************/

   strcpy(sptr.model, specPtr);
   if (strcmp(sptr.model, "") == 0)
             {
             printf("ERROR -- mak013: spec parameter missing, instance %s\n", sptr.reference);
             cfb_status = -1;
             return (cfb_status);
             }

   return (cfb_status);
      }


/****************************
FUNCTION DEFINITION:    get_str

Get rhs of equality statement
****************************/

char *get_str(char *s)
{
```

```
        char temp[ARRAY_WIDTH];
        int i = 0,
            j = 0;
        while (s[i++] != '='):      /* skip through '=' sign */
        while (s[i] != '\0')        /* copy characters       */
            temp[j++] = s[i++];
        temp[j] = '\0';             /* terminate string      */
        return (temp);
/*
 Copyright (c) 1991 Star Semiconductor Corporation. All Rights Reserved.
 This material may not be copied or used without prior written permission.

 * $Id: makefil.c,v 1.3 1991/09/16 19:06:35 ivan Exp $
 * $Log: makefil.c,v $
 * Revision 1.3  1991/09/16  19:06:35  ivan
 * Changed error messages to Star format
 *
 * Revision 1.2  1991/09/11  15:20:50  ivan
 * Support `blocklen' parameter on `filter' blocks to control splitting
 * of filters longer than a sample period into seperate blocks.
 *
 * Revision 1.1  1991/09/06  18:47:47  ivan
 * Initial revision
 *
*/

/*************************************************************************

                                  makefil.c

**************************************************************************
Convert DISPRO filter to SDL file. This function is called from a main C
program to convert a single filter definition file (.FDF) to (.SDL).
returns 0 if filter is successfully translated.
*/


/******************/
/*   requires     */
/******************/

#include "sysfuncs.h"
#include <stdio.h>
#include <stdlib.h>
#include <string.h>
#include <math.h>
#include "strfunc.h"
#include "gensdl.h"

/******************/
/*   exceptions   */
/******************/


/******************/
/*   constants    */
/******************/

#define MAXNAME 32
#define MAXLINE 100
/**********************
sdl code formatting info
**********************/

#define MAXSECT 50              /* maximum number of sections for iir */
#define MAXTAPS 512             /* maximum number of taps for fir     */
#define IIR 0                   /* return code                        */
#define FIR 1                   /* return code                        */
```

```
/*******************/
/*     types       */
/*******************/

typedef unsigned char uchar;

/*******************/
/*      data       */
/*******************/


/*******************/
/*     macros      */
/*******************/


/*******************/
/*    functions    */
/*******************/


int get_dispro_fir_data(FILE * dis_file, double *coeffvec, char *t, int *iptr);
int get_dispro_iir_data(FILE * dis_file, double *coeffvec, char *t, int *iptr, int *oddflag);


/***********
main program
***********/

int make_filter(char *name, char *struc, int maxtaps)
{
   FILE *infile,
       *outfile;
   char inpath[MAXNAME],
        outpath[MAXNAME];
   char fname[MAXNAME];
   char mystruc[MAXNAME];
/* dispro variables */

   double fir_coef[MAXTAPS];
   double iir_coef[MAXSECT * 5];
   char type_str[20];
   char check_rec[MAXLINE];
   int err,
       ret_code;
   int numsect,
       oddflag;


/*************************
Get filename from invocation
*************************/

   strcpy(fname, name);
   strcpy(mystruc, struc);
   mergename(inpath, fname, ".fdf");
   mergename(outpath, fname, ".sdl");

/*** old style
mergename(datapath, fname, ".dat");
mergename(auxpath, fname, ".aux");
***/

/*************
open input file
*************/
```

```
   if ((infile = fopen(inpath, "r")) == NULL)
   {
      printf("ERROR -- mkf001: Cannot open filter spec file %s\n", inpath);
      return (-1);
   }


/****************************************
Read first line of file to check FIR or IIR
****************************************/

   fgets(check_rec, MAXLINE, infile);


/**********************************
check for DISPRO FIR format input file
**********************************/

   if (strncmp(check_rec, "\"<S>FIR", 7) == 0)
   {
      err = get_dispro_fir_data(infile, fir_coef, type_str, &numsect);
      if (err == -2)
      {
         printf("ERROR -- mkf002: no coefficients in filter spec file %s\n", inpath);
         return (-1);
      }
      else if (err != 0)
      {
         printf("ERROR -- mkf003: problem with filter spec file %s\n", inpath);
         return (-1);
      }

      printf("Creating %s from %s, FIR design\n", outpath, inpath);

   /*** old style no longer used
   auxfile = fopen( auxpath, "w" );
   datafile = fopen( datapath, "w" );
   write_fir_file(auxfile, fname, type_str, numsect );
   write_data_file(datafile, fir_coef, numsect );
   fclose(auxfile );
   fclose(datafile);
   ***/

   /* new style with split fir */
      outfile = fopen(outpath, "w");
      wfir(outfile, fname, type_str, numsect, maxtaps, fir_coef);
      fclose(outfile);

      ret_code = FIR;
   }
 /**********************************
 check for DISPRO IIR format input file
 **********************************/

   else if (strncmp(check_rec, "\"<S>IIR", 7) == 0)
   {
      err = get_dispro_iir_data(infile, iir_coef, type_str, &numsect, &oddflag);
      if (err == -2)
      {
         printf("ERROR -- mkf004: no coefficients in %s\n", inpath);
         return (-1);
      }
      else if (err != 0)
      {
         printf("ERROR -- mkf005: problem with %s\n", inpath);
         return (-1);
      }
```

```
        printf("Creating %s from %s, IIR design\n", outpath, inpath);
        outfile = fopen(outpath, "w");
        write_iir_file(outfile, fname, mystruc, type_str, iir_coef, numsect, oddflag);
        fclose(outfile);
        ret_code = IIR;
    }
                    :
                    .

 /****************************
 handle unrecognised file format
 *****************************/

    else
    {
        printf("ERROR -- mkf006: unrecognised filter file format %s\n", inpath);
        ret_code = -2;
    }

 /********************
 close files and return
 ********************/

    fclose(infile);
    return (ret_code);
}

/*
  Copyright (c) 1991 Star Semiconductor Corporation. All Rights Reserved.
  This material may not be copied or used without prior written permission.

 * $Id: gettff.c,v 1.4 1991/09/20 22:31:43 ivan Exp $
 * $Log: gettff.c,v $
 * Revision 1.4  1991/09/20  22:31:43  ivan
 * Output nine digits precision of filter coeffecients (had been 6)
 *
 * Revision 1.3  1991/09/16  19:06:33  ivan
 * Changed error messages to Star format
 *
 * Revision 1.2  1991/09/11  15:20:47  ivan
 * Support 'blocklen' parameter on 'filter' blocks to control splitting
 * of filters longer than a sample period into seperate blocks.
 *
 * Revision 1.1  1991/09/06  18:47:45  ivan
 * Initial revision
 *
*/

/************************************************************************

                                gettff.c

*************************************************************************
Read and process a *.tff transfer function file
*/


/*******************/
/*    requires     */
/*******************/

#include "sysfuncs.h"
#include <stdio.h>
#include <stdlib.h>
#include <string.h>
#include <math.h>
#include <ctype.h>
```

```
#include <float.h>
#include "gensdl.h"
#include "strfunc.h"

/*******************/
/*   exceptions    */
/*******************/


/*******************/
/*    constants    */
/*******************/

#define MAXLINE 100
#define MAXSECT 10
#define PI 3.1415926535

/*******************/
/*     types       */
/*******************/

/*******************/
/*      data       */
/*******************/


/*******************/
/*     macros      */
/*******************/


/*******************/
/*    functions    */
/*******************/

char *extract_param_str(char *rec);
int conv_stoz(int mode, double rate, double fcrit, double coef[], char *name);
int conv_quad_stoz(double rate, double vec[], int index);
int conv_lin_stoz(double rate, double vec[], int index);
double lim2(double var);

int gettff(char *name)
{
    FILE *infile,
        *outfile;
    char inpath[20],
         outpath[20];            /* for test only */
    char tmp_sec[MAXLINE];
    char tempstr[100];
    char plane;
    double sample_rate,
           crit_freq,
           pwrate,
           temp;
    double coef[6 * MAXSECT],
           packvec[5 * MAXSECT];
    int nsect,
        order;
    int i,
        j,
        coef_det,
        exit_code,
        index;


    strcpy(inpath, name);
    strcpy(outpath, name);
```

```
    strcat(inpath, ".tff");
    strcat(outpath, ".sdl");

    if ((infile = fopen(inpath, "r")) == NULL)
    {
        printf("ERROR -- gtf001: can't open input file %s\n", inpath);
        return (-1);
    }
    printf("Creating %s.sdl from %s.tff, transfer function design\n", name, name);

/**********************************************
Initialise filter parameters, before reading file

**********************************************/

    exit_code = 0;
    plane = 'n';                /* default plane */
    sample_rate = (double) 0;
    crit_freq = (double) 0;
    nsect = 0;
    order = 0;

/******************************
Process lines before coefficients
******************************/

    coef_det = 0;
    while (feof(infile) == 0)   /* rip through the file */
    {
        fgets(tmp_rec, MAXLINE, infile);
        strtolw(tmp_rec);
        if (strncmp(tmp_rec, "<c>", 3) == 0)
        {
            coef_det = 1;       /* found coefficients  */
            break;              /* go and process them */
        }
        else
        {
            if (strncmp(tmp_rec, "<s>", 3) == 0)
                plane = 's';
            if (strncmp(tmp_rec, "<z>", 3) == 0)
                plane = 'z';
            if (strncmp(tmp_rec, "sam", 3) == 0)
            {
                strcpy(tempstr, extract_param_str(tmp_rec));
                sample_rate = atof(tempstr);
            }
            if (strncmp(tmp_rec, "cri", 3) == 0)
            {
                strcpy(tempstr, extract_param_str(tmp_rec));
                crit_freq = atof(tempstr);
            }
            if (strncmp(tmp_rec, "num", 3) == 0)
                nsect = atoi(extract_param_str(tmp_rec));
            if (strncmp(tmp_rec, "ord", 3) == 0)
                order = atoi(extract_param_str(tmp_rec));
        }
    }

/******************
Parameter validation
******************/

    if (plane != 's' && plane != 'z')
    {
```

```
    printf("ERROR -- gtf002: no s-plane or z-plane specified\n");
    exit_code = -1;
}

if (plane == 's' && sample_rate <= (double) 0)
{
    printf("ERROR -- gtf003: sample rate must be greater than 0\n");
    exit_code = -1;
}

if (nsect < 1 || nsect > MAXSECT)
{
    printf("ERROR -- gtf004: number of sections must be between 1 and %d\n", MAXSECT);
    exit_code = -1;
}

if (order < 1 || order > 2)
{
    printf("ERROR -- gtf005: order must be specified as 1 or 2\n");
    exit_code = -1;
}
/******************
Process coefficients
******************/

  if (coef_det == 0)
  {
      printf("ERROR -- gtf006: no coefficients found\n");
      exit_code = -1;
  }

/*****************************************************************
check for all parameters and coefficients present before continuing
*****************************************************************/

  if (exit_code != 0)
      return (exit_code);

/*******************
Read all coefficients
*******************/

  if (order == 2)
  {
      for (i = 0; i < nsect; i++)
      {
          fscanf(infile, "%lf, %lf, %lf, %lf, %lf",
                 &coef[6 * i + 0], &coef[6 * i + 1], &coef[6 * i + 2], &coef[6 * i + 4], &coef[6 * i + 5]);
          coef[6 * i + 3] = (double) 1;
      }
  }

  else if (order == 1)
  {
      for (i = 0; i < nsect; i++)
      {
          fscanf(infile, "%lf, %lf, %lf", &coef[6 * i + 1], &coef[6 * i + 2], &coef[6 * i + 5]);
          coef[6 * i + 0] = (double) 0;
          coef[6 * i + 3] = (double) 0;
          coef[6 * i + 4] = (double) 1;
      }
  }

  fclose(infile);

/* DEBUG'S
```

```
printf("\n"); for (i=0; i<nsect; i++) { for(j=0; j<6; j++) { printf("%.9lf, ",
   coef[6*i+j]); } printf("\n"); } */


/*******************************************
*
*   Translate s-plane coefficients to z-plane
*
*******************************************/

/* prewarp s-plane to maintain response at a critical frequency by
   artificially shifting down the rate, avoid division by zero at fcrit = 0 */

   if (plane == 's')
   {
       if (crit_freq > (double) 0)
       {
           temp = tan(PI * crit_freq / sample_rate);
           temp = sample_rate / PI * temp;
           pwrate = sample_rate * crit_freq / temp;
       }
       else
       {
           pwrate = sample_rate;
       }

   /***************************************************
   Convert s-plane coefficients in the coefficient vector
   to z-plane via the bilinear transformation
   ***************************************************/

       if (order == 2)
       {
           for (i = 0; i < nsect; i++)
           {
               index = 6 * i;
               conv_quad_stoz(pwrate, coef, index);
           }
       }

       if (order == 1)
       {
           for (i = 0; i < nsect; i++)
           {
               index = 6 * i;
               conv_lin_stoz(pwrate, coef, index);
           }
       }
   }

/* End of s-plane conversion to z-plane */

/********** DEBUG Z *********

printf("\n");
for (i=0; i<nsect; i++)
{
   for(j=0; j<6; j++)
   {

      printf("%.9lf, ", coef[6*i+j]);
   }
   printf("\n");
}
*/
```

```
/*****************************************************************
Coefficients are now in z-plane, generate a hierarchical .sdl file
*****************************************************************/

/* first pack 6 entry format coefficient vector to 5 entry format, since it
   is assumed that a0=1.0 always in the generate sdl program and the biquad
   sdl primitive.

Pre-negate the a1, a2 coefficients for the biquad implementation during the
   packing.

input  = { b0, b1, b2, a0, a1, a2} ... output = { b0, b1, b2, -a1, -a2} ... */

   j = 0;

   for (i = 0; i < nsect * 6;)
   {
      packvec[j++] = lim2(coef[i++]);
      packvec[j++] = lim2(coef[i++]);
      packvec[j++] = lim2(coef[i++]);
      i++;                     /* skip all a0 coefficients */
      packvec[j++] = -lim2(coef[i++]);
      packvec[j++] = -lim2(coef[i++]);
   }

/*******************************
Generate a hierarchical .sdl file
*******************************/

   if ((outfile = fopen(outpath, "w")) == NULL)
   {
      printf("ERROR -- gtf007: can't open output file %s", outpath);
      return (-1);
   }

   if (order == 2)
   {
      write_iir_file(outfile, name, "biquad", "tranfunc", packvec, nsect, 0);
   }

   else if (order == 1)
   {
      write_iir_file(outfile, name, "bilinear", "tranfunc", packvec, nsect, 0);
   }

   fclose(outfile);
   return (exit_code);
}

/*****************************************************************
*
*  Conversion of S-plane quadratic into Z-plane.
*
*****************************************************************/

int conv_quad_stoz(double rate, double vec[], int index)
{
   int exit_code,
       i;
   double a,
          b,
          c,
          t,
          norm;
```

```
    exit_code = 0;
    t = 1 / rate;

    {
        a = vec[index + 0];
        b = vec[index + 1];
        c = vec[index + 2];

        vec[index + 0] = 4 * a / (t * t) + 2 * b / t + c;
        vec[index + 1] = 2 * c - 8 * a / (t * t);
        vec[index + 2] = 4 * a / (t * t) - 2 * b / t + c;

        a = vec[index + 3];
        b = vec[index + 4];
        c = vec[index + 5];

        vec[index + 3] = 4 * a / (t * t) + 2 * b / t + c;
        vec[index + 4] = 2 * c - 8 * a / (t * t);
        vec[index + 5] = 4 * a / (t * t) - 2 * b / t + c;
    }

/* Normalise array to numerator b0=1.0, denominator to a0=1.0 */

    norm = vec[index + 3];
    for (i = 0; i <= 2; i++)
    {
        vec[index + i] = vec[index + i] / norm;
    }

    norm = vec[index + 3];
    for (i = 3; i <= 5; i++)
    {
        vec[index + i] = vec[index + i] / norm;
    }

    return (exit_code);
}


/******************************************************************
*
*   In-place conversion of S-plane linear into Z-plane.
*
******************************************************************/

int conv_lin_stoz(double rate, double vec[], int index)
{
    int exit_code,

            i;
        double b,
               c,
               t,
               norm;
        exit_code = 0;
        t = 1 / rate;

        b = vec[index + 1];
        c = vec[index + 2];

        vec[index + 0] = (double) 0;
        vec[index + 1] = c + 2 * b / t;
        vec[index + 2] = c - 2 * b / t;

        b = vec[index + 4];
        c = vec[index + 5];
```

```
    vec[index + 3] = (double) 0;
    vec[index + 4] = c + 2 * b / t;
    vec[index + 5] = c - 2 * b / t;

  /* Normalise array to numerator b0=1.0, denominator to a0=1.0 */

    norm = vec[index + 4];
    for (i = 0; i <= 2; i++)
    {
        vec[index + i] = vec[index + i] / norm;
    }

    norm = vec[index + 4];
    for (i = 3; i <= 5; i++)
    {
        vec[index + i] = vec[index + i] / norm;
    }

    return (exit_code);
}


/******************************
Return rhs of equality statement
******************************/

char *extract_param_str(char *rec)
{
    int i = 0,
        j = 0;
    char text[20];
    char c = '\n';              /* initialise for test */
    while (c != '=')            /* eat lhs */
    {
        c = rec[i++];           /* advance pointer     */
    }

    while (c != '\0')
    {
        c = rec[i];
        if (isspace(c) == 0)
        {


            text[j] = c;        /* copy string */
            j++;
        }
        i++;
    }
    return (text);
}


double lim2(double var)
{
    if (var >= 2.0)
        var = 1.999999;
    else if (var < -2.0)
        var = -2.0;
    return (var);
}


/*********************************** JUNK **************************
```

```
make_lin(double vec[], char *name)
{
   FILE *outfile;
   char outpath[32];

   strcpy(outpath, name);
   strcat(outpath, ".sdl");
   outfile = fopen( outpath, "w" );

   fprintf( outfile, "block %s {} (in; out)\n", name );
   fprintf( outfile, "begin\nbilinear %s1\n   {\n", name );
   fprintf( outfile, "   %%b0=%.9lf,\n", vec[1] );
   fprintf( outfile, "   %%b1=%.9lf,\n", vec[2] );
   fprintf( outfile, "   %%a1=%.9lf\n", vec[5] );
   fprintf( outfile, "   }\n   (in, out);\nend\n" );

   fclose(outfile);
   return(0);
}
*/

/*
  Copyright (c) 1991 Star Semiconductor Corporation. All Rights Reserved.
  This material may not be copied or used without prior written permission.

 * $Id: genfdf.c,v 1.1 1991/09/06 18:47:35 ivan Exp $
 * $Log: genfdf.c,v $
 * Revision 1.1  1991/09/06  18:47:35  ivan
 * Initial revision
 *
*/

/**************************************************************************

                                   genfdf.c

***************************************************************************
Generate a .fdf file for DISPRO analysis of biquad stages
*/


/******************/
/*    requires    */
/******************/

#include <stdio.h>
#include <string.h>

/******************/
/*   exceptions   */
/******************/


/******************/
/*    constants   */
/******************/


/******************/
/*     types      */
/******************/


/******************/
/*      data      */
/******************/
```

```
/******************/
/*    macros     */
/******************/


/******************/
/*   functions    */
/******************/

genfdf(double vec[], char *name, double rate, int nsect)
{
    FILE *outfile;
    char outpath[32];

   strcpy(outpath, name);
   strcat(outpath, ".fdf");
   outfile = fopen(outpath, "w");

   fprintf(outfile, "\"<S>IIR Filter Specifications\"\n");
   fprintf(outfile, "\"   Type=\",\"LOWPASS\"\n");
   fprintf(outfile, "\"   Order= \",2\n");
   fprintf(outfile, "\"   Sampling frequency=\",%li\n", (long) rate);
   fprintf(outfile, "\"   Passband:\",1000,0\n");
   fprintf(outfile, "\"   Stopband:\",1200,0\n");
   fprintf(outfile, "\"   Passband ripple:\",.5\n");
   fprintf(outfile, "\"   Stopband loss:\",112\n");
   fprintf(outfile, "\"<C>Coefficients (A,D,E,B,C) for wordlength \",24\n");
   fprintf(outfile, "1,%lf,%lf,%lf,%lf,%lf\n", vec[0], vec[1], vec[2], vec[4], vec[5]);
   fclose(outfile);
   return (0);
}

   int _dummy=1;


  Copyright (c) 1991 Star Semiconductor Corporation. All Rights Reserved.
  This material may not be copied or used without prior written permission.

 * $Id: exspf.c,v 1.2 1991/09/16 19:06:29 ivan Exp $
 * $Log: exspf.c,v $
 * Revision 1.2  1991/09/16  19:06:29  ivan
 * Changed error messages to Star format
 *
 * Revision 1.1  1991/09/06  18:47:33  ivan
 * Initial revision
 *
*/

/*************************************************************************

                                  exspf.c

*************************************************************************
Open a ".spf" file which is expected to contain a list, one per line, of
filenames ".fdf" or ".tff". Depending on the extension call the appropriate
translator to make ".sdl" files for the Scompile. For filters a total of
(1+N) ".sdl" files are created, where N is the number of filters in the
list. Also a ".dat" or a number of ".d77" files are created for each fir
in the design.  For Transfer functions M ".sdl" files are made, where M is
the number of ".tff" files in the list.
*/


/******************/
/*   requires     */
/******************/
```

```
#include <stdio.h>
#include <stdlib.h>
#include <string.h>
#include <ctype.h>
#include "strfunc.h"
#include "exsdl.h"

/*******************/
/*   exceptions    */
/*******************/


/*******************/
/*   constants     */
/*******************/


/*******************/
/*     types       */
/*******************/


/*******************/
/*      data       */
/*******************/

static char exspf[] = "$Revision: 1.2 $";


/*******************/
/*     macros      */
/*******************/


/*******************/
/*   functions     */
/*******************/

int make_filter( char *name, char *struc );
int gettff( char *name );
#define MAXLINE 80

/***********
main program
***********/

void main(int argc, char *argv[])
{
   FILE *infile;
   char fname[MAXNAM], ext[MAXEXT];
   char inpath[MAXNAM];
   char line[MAXLINE], tmprec[MAXLINE];
   char c;
   int i, count;
   int exit_code=0;

   /*****************************
   process command line parameters
   *****************************/

   printf("\nExspf %s\n", exspf);
   printf("Copyright (C) 1991 by STAR Semiconductor Corporation.\n");

   if (argc > 1)
   {
```

```
    strtolw(argv[1]);
    if ((strcmp(argv[1], "-h")==0) || (strcmp(argv[1], "/h")==0))
    {
       printf("Usage: exspf filename[.spf]\n");
       exit( -1 );
    }
    else
    strcpy(inpath, argv[1]);
 }

 else
 {
    printf("Usage: makesdl filename[.net]\n");
    exit( -1 );
 }

 /******************************
 make input and output filenames
 ******************************/

 splitname( inpath, fname, ext);

 if (strcmp(ext, ".sdl")==0)
 {
   printf("ERROR -- exp001: input file cannot be \"%s\"\n",ext);
   exit( -1 );
 }

 else if (strcmp(ext, ".dat")==0)
 {
   printf("ERROR -- exp002: input file cannot be \"%s\"\n",ext);
   exit( -1 );
 }

 else if(strcmp(ext, "")==0)          /* append default extension */
 {
   strcpy(ext, ".spf");
   mergename(inpath, fname, ext);
 }

 /*****************
 Process input file
 *****************/
   if (check_open_rf( &infile, inpath ) != 0)
      exit(-1);

   while(1)
   {
      fgets( tmprec, MAXLINE, infile );
      if(feof(infile)!=0)
         break;
      strcpress(tmprec);
      splitname( tmprec, fname, ext);
      if(strncmp(ext, ".fdf", 4)==0)
      {
      make_filter( fname, "biquad");
      }
      if(strncmp(ext, ".tff", 4)==0)
      {
      gettff(fname);
      }
   }

   fclose( infile );
   exit( exit_code );
}
```

```
/*
  Copyright (c) 1991 Star Semiconductor Corporation. All Rights Reserved.
  This material may not be copied or used without prior written permission.

 * $Id: exsdl.c,v 1.3 1991/09/16 19:06:26 ivan Exp $
 * $Log: exsdl.c,v $
 * Revision 1.3  1991/09/16  19:06:26  ivan
 * Changed error messages to Star format
 *
 * Revision 1.2  1991/09/11  15:20:36  ivan
 * Support 'blocklen' parameter on 'filter' blocks to control splitting
 * of filters longer than a sample period into seperate blocks.
 *
 * Revision 1.1  1991/09/06  18:47:27  ivan
 * Initial revision
 *
*/

/************************************************************************

                              exsdl.c

*************************************************************************
Expand a pseudo sdl file to SDL by substituting the "spec" parameter
value for the keyword FILTER or TRANSFNC.
Write the list of filters and transfer functions to an SPF file.
*/


/*******************/
/*    requires     */
/*******************/
#include "sysfuncs.h"
#include "ex_parse.h"
#include <stdio.h>
#include <stdlib.h>
#include <string.h>
#include "strfunc.h"
#include "exsdl.h"

/*******************/
/*   exceptions    */
/*******************/


/*******************/
/*    constants    */
/*******************/


/*******************/
/*     types       */
/*******************/


/*******************/
/*      data       */
/*******************/

static char exsdl[] = "$Revision: 1.3 $";

/* GLOBAL STORAGE for interfacing to parser and lexical analyser */
char tmprec[MAXRL];             /* holds latest identifier */
char instrec[MAXRL],
    specrec[MAXRL];             /* current instance, spec  */
char typerec[MAXRL] = {""};     /* current type  */
```

```
char flist[NOF][MAXNAM];        /* filter list   */
char tlist[NOT][MAXNAM];        /* transfnc list */
int flc = 0,
    tlc = 0;                    /* counters      */
extern FILE *yyin,
    *yyout;


/*******************/
/*    macros       */
/*******************/


/*******************/
/*   functions     */
/*******************/


void main(int argc, char *argv[])
{
    FILE *listfile;
    char inpath[MAXNAM],
         outpath[MAXNAM],
         listpath[MAXNAM];
    char fname[MAXNAM],
         ext[MAXEXT];
 /***************************
 Check command line parameters
 ***************************/

    printf("\nExsdl %s\n", exsdl);
    printf("Copyright (C) 1991 by STAR Semiconductor Corporation.\n");

    if (argc > 1)
    {
        strtolw(argv[1]);
        if ((strcmp(argv[1], "-h") == 0) || (strcmp(argv[1], "/h") == 0))
        {
            printf("Usage: exsdl filename[.pdl]\n");
            exit(-1);
        }
        else
            strcpy(inpath, argv[1]);
    }
    else
    {
        printf("Usage: exsdl filename[.pdl]\n");
        exit(-1);
    }

/*****************************
make input and output filenames
*****************************/

    splitname(inpath, fname, ext);

    if (strcmp(ext, "") == 0)   /* append default extension */
    {
        strcpy(ext, ".pdl");
        mergename(inpath, fname, ext);
    }
    mergename(outpath, fname, ".sdl");
    mergename(listpath, fname, ".spf");

    /************************
    open input and output files
    ************************/
```

```
    if ((yyin = fopen(inpath, "r")) == NULL)
    {
        printf("ERROR -- exs001: failed to open %s\n", inpath);
        exit(-1);
    }

    if ((yyout = fopen(outpath, "w")) == NULL)
    {
        printf("ERROR -- exs002: failed to open %s\n", outpath);
        exit(-1);
    }

/*****************
Process input file
*****************/

    printf("Creating %s, %s from %s\n", outpath, listpath, inpath);
    yyparse();

    fclose(yyin);
    fclose(yyout);

/*****************
Write list to file
*****************/

    if ((listfile = fopen(listpath, "w")) == NULL)
    {
        printf("ERROR -- exs003: failed to open %s\n", listpath);
        exit(-1);
    }
    while (--flc >= 0)
        fprintf(listfile, "%s.fdf\n", flist[flc]);
    while (--tlc >= 0)
        fprintf(listfile, "%s.tff\n", tlist[tlc]);
    fclose(listfile);
}

/*
 Copyright (c) 1991 Star Semiconductor Corporation. All Rights Reserved.
 This material may not be copied or used without prior written permission.

 * $Id: exnet.c,v 1.4 1991/09/20 04:23:58 ivan Exp $
 * $Log: exnet.c,v $
 * Revision 1.4  1991/09/20  04:23:58  ivan
 * Minor fixes
 *
 * Revision 1.3  1991/09/16  19:06:20  ivan
 * Changed error messages to Star format
 *
 * Revision 1.2  1991/09/11  15:20:33  ivan
 * Support 'blocklen' parameter on 'filter' blocks to control splitting
 * of filters longer than a sample period into seperate blocks.
 *
 * Revision 1.1  1991/09/06  18:47:21  ivan
 * Initial revision
 *
 */

/************************************************************************

                                exnet.c

************************************************************************
```

```
Extracts pseudo sdl by scanning the viewlogic database which is created
when a schematic is saved. Actually the schematic must be saved then
annotated before this program is run.

This is a modifified version of the ViewLogic demonstration program
"flatnet.c". The following comment is from there.
*
*   Facility: VIEWBASE Demonstration Program
*
*   Functional Description:
*       This program demonstrates how to generate a simple flat
*       netlist using the VIEWBASE access routines.  Almost all
*       design types are accessed: components, nets, pins, and
*       attributes.  In addition, this program demonstrates how
*       to evaluate parameterized attributes, how to create a
*       synonym table, and how to build unique component and
*       net path names from the original hierarchical description.
*
*       A flat netlist consists of a single MODULE description
*       for an entire (possibly hierarchical) schematic design.
*       The basic format of the netlist is as follows:
*
*           MODULE module_name(symbol_attr ...) ;
*           INTERFACE
*            sympin_name(sympin_attr ...)=net_name ... ;
*           COMPONENTS
*            symbol_name comp_name(comp_attr ...)
*                   compin_name(compin_attr ...)=net_name ... ;
*           NETS
*            net_name(net_attr ...) comp_name.compin_name ... ;
*           END_MODULE
*
*       The MODULE statement defines the name of this module and contains
*       a optional list of symbol attributes.  A semicolon terminates
*       the module statement.
*
*       The INTERFACE section defines the interface to the module.  The
*       sympin_name=net_name format defines the connection between
*       the external view (symbol) of the module and the corresponding
*       nets on the underlying schematic.  An optional list of symbol
*       pin attributes may follow the sympin name.  The INTERFACE section
*       is terminated by a semicolon.
*
*       The COMPONENTS section defines a component orientated view of the
*       schematic.  Each component statement specifies the component type
*       (symbol name), the component name, and the net connected to each
*       component pin.  An optional list of component attributes may follow
*       the component name.  The COMPONENTS section is terminated by a
*       semicolon.
*
*       The NETS section defines a net orientated view of the schematic.
*       Each net statement lists the component pins connected to this net.
*       An optional list of net attributes may follow the net name.  The
*       NETS section is terminated by a semicolon.
*
*       Flattened netlists usually require that the full path name of each
*       component instance is used.  This path name is a concatenation
*       of the names of the components passed through while decending
*       the design hierarchy.  The full path name uniquely identifies
*       each component in the design's flattened representation.  This
*       program demonstrates how to create hierarchical path names.
*
*       Flattened netlists also require that the top-most netname be used
*       when refering to nets which transcend the design hierarchy (pass
*       through symbol pins).  This insures that nets which are electrically
```

```
*       equivalent use the same name when the design is flattened.  This
*       program demonstrates how to find the top most net name.
*
*       This program also demonstrates the use of a synonym table for
*       generating a unique name when the flattened component or net
*       name is unacceptable to the target system.
*
*
*   Copyright (c) 1986 by Viewlogic Systems, Inc.

*/


/******************/
/*    requires    */
/******************/

#include "sysfuncs.h"
#include <stdlib.h>
#include <malloc.h>
#include <string.h>
#include <stdio.h>              /* standard I/O */
#include <ctype.h>              /* char type macros */
#include "viewbase.h"           /* data base access routines */
#include "strfunc.h"                    /* utility string functions */

/******************/


/*   exceptions   */
/******************/


/******************/
/*    constants   */
/******************/

#define VERSION     "1.10"      /* netlister version number */

#define EXFAILURE   1           /* failure exit code */
#define EXSUCCESS   0           /* successful exit code */

#define EBUFSIZ     400         /* evaluation buffer size */

/* SPROC stuff */
#define MAXPARAM    12          /* parameters per icon    */
#define ARRAY_WIDTH 32          /* for SPROC parameters   */

/******************/
/*     types      */
/******************/


/******************/
/*      data      */
/******************/

static int Attr_on = 1;         /* attribute output flag */
static int Eval_on = 1;         /* attribute evaluation flag */
static int Syn_on = 0;          /* synonym creation flag --- force off */


/******************/
/*     macros     */
/******************/
```

```
/*******************/
/*    functions    */
/*******************/

/* ============ SYNONYM TABLE DATA STRUCTS AND ROUTINES ============
 *
 *  The synonym table routines generate a unique synonym for each unique
 *  input name.  The input name can be any char string.  The output name,
 *  (the synonym) has the general format: <prefix><integer value>,
 *  for example, $23.  The integer portion of the synonym is incremented
 *  for each new unique input name.
 *
 *  The routines and structures are easily modified to generate a
 *  different format if the current one is unexceptable to the target
 *  simulator or layout system.
 *
 */
#define HASHSIZE     101          /* synonym hash table size */
#define PREFIX       "S"          /* synonym prefix */

typedef struct namerec {          /* storage record for one name */
    char *name;                   /* pointer to the original name */

    unsigned int id;              /* unique id created for the new name */
    struct namerec *nexthash;     /* next record in hash link */
    struct namerec *nextid;       /* next record in entry order link */
}
NAMEREC;

static NAMEREC *Namelist[HASHSIZE]; /* hash table of converted names */
static NAMEREC *Listhead = NULL;    /* first record in order of entry */

/* -----------------------------------------------------------
 * hash
 *   create hash table index.
 */
static int hash(char* s) /* name */
{
    unsigned int hashval;

    for (hashval = 0; *s; s++)
        hashval = hashval * 10 + *s;

    return((int)(hashval % HASHSIZE));
} /* hash */


/* -----------------------------------------------------------
 * new_name
 *   if the oldname is not already in the synonym table,
 *   create a new name and record the new and old names in
 *   the table.
 */
static char *new_name(char* oldname)
{
    int index;
    NAMEREC *np;
    static unsigned int uid = 0;     /* id counter */
    static NAMEREC *tail = NULL;     /* last record in entry order */
    static char newname[20];         /* synonym */

    if (!Syn_on)
        return(oldname);    /* synonym creation disabled */

    index = hash(oldname); /* get hash table index */
```

```
/* see if oldname has already been converted */
for (np = Namelist[index]; np != NULL; np = np -> nexthash)
    if (strcmp(oldname, np -> name) == 0)
        break;  /* found it */

if (np == NULL) {
    /* create a new entry */
    np = (NAMEREC *) malloc(sizeof(NAMEREC));
    np -> name = malloc(strlen(oldname) + 1);
    strcpy(np -> name, oldname);
    np -> id = uid++;        /* assign a new unique id */
    np -> nextid = NULL;

    /* link into the hash table list */
    np -> nexthash = Namelist[index];
    Namelist[index] = np;

        /* link into the id order list */
        if (Listhead == NULL) {
            Listhead = np;
        }
        else
            tail -> nextid = np;
        tail = np;
    }

    /* return new name */
    sprintf(newname, "%s%u", PREFIX, np -> id);
    return(newname);
} /* new_name */


/* ------------------------------------------------------------
 * legalname
 *   test for a legal FLAT name under the following rules:
 *       - first char must be alphabetic.
 *       - second and following chars must be alphanumeric.
 *       - maximum length must be <= 8 chars.
 *   illegal names will be converted to synonyms.
 */
static char *legalname(char* name)
{
    int i;
    static char nullstr[] = "";

    if (name == NULL) {
        /* (not necessarily an error) */
        return(nullstr);
    }

    if (!isalpha(name[0])) {
        /* non-alphabetic first char */
        return(new_name(name));
    }

    for (i = 1; name[i]; i++) {
        if (!isalpha(name[i]) && !isdigit(name[i])) {
            /* non-alphanumeric embedded char */
            return(new_name(name));
        }
        if (i >= 8) {
            /* name to long */
            return(new_name(name));
        }
    }
```

```
    return(name);   /* return original */
} /* legalname */

#if 0
/* ----------------------------------------------------------
* dump_synlist
*   write out the cross reference list of synonyms together with
*   the original names to the specified file.
*/
static void dump_synlist(fp)
FILE *fp;


{
    NAMEREC *np;

    if (!Syn_on)
        return;     /* synonym creation disabled */

    iprintf(fp, "**\n**    N A M E   S U B S T I T U T I O N S\n**\n");
    iprintf(fp, "**    New Name      Original\n");
    iprintf(fp, "**    --------      --------\n");

    for (np = Listhead; np != NULL; np = np -> nextid)
        iprintf(fp, "**    %s%-12u %s\n", PREFIX, np -> id, np -> name);

    iprintf(fp, "**\n**    End of Netlist\n");
}

#endif


/* ====================== CONTEXT ROUTINES ======================
*
*   Routines to manage the context data structure. This data structure
*   consists of a linked list of pointers to COMPONENT structures. This
*   stack of pointers defines a path from the topmost component down to
*   the "current" component, i.e. it defines a unique "context".
*
*/
#define MAXNAME 1024                /* max length of hierarchical name */

static char hibrname[MAXNAME] = ""; /* storage for hierarchical name */

typedef struct ccontext {
    struct ccontext *next;          /* next component in stack */
    COMPONENTS *c;                  /* current component */
}
CCONTEXT;

static CCONTEXT *cntxt_list = NULL; /* list of component pointers */

/* ------------------------------------------------------------
* cntxt_push
*   Modify the context by pushing into a component.
*/
static void cntxt_push(COMPONENTS* comp)
{
    CCONTEXT *cp;

    cp = (CCONTEXT *) malloc(sizeof(CCONTEXT));
    cp -> c = comp;
    cp -> next = cntxt_list;
    cntxt_list = cp;
} /* cntxt_push */
```

```
/* ------------------------------------------------------------
 * cntxt_pop
 *   Modify the context by poping out of a component.
 */
static void cntxt_pop()
{
    CCONTEXT *cp;

    if (cntxt_list != NULL) {
        cp = cntxt_list -> next;
        free(cntxt_list);
        cntxt_list = cp;
    }
} /* cntxt_pop */


/* ------------------------------------------------------------
 * addpath
 *   Build the context hierarchy name.
 */
static void addpath(char* buf,CCONTEXT* cp)
{
    if (cp == NULL)
        return;

    if (cp -> next != NULL)
        addpath(buf, cp -> next);

    strcat(buf, igcomnam(cp -> c));
    strcat(buf, "\\");
} /* addpath */


/* ------------------------------------------------------------
 * cntxt_name
 *   Return the component context hierarchy name.
 */
static char *cntxt_name(char* name)
{
    strcpy(hiername, "");
    addpath(hiername, cntxt_list);
    strcat(hiername, name);
    return(hiername);
} /* cntxt_name */


/* ------------------------------------------------------------
 * upper_net
 *   returns a pointer to the net connected on the level above
 *   or NULL if the specified net is not an IO net or there's no
 *   net on the level above.
 */
static NETS *upper_net(NETS* netp,CCONTEXT* cp)
{
    SYMPINS *spnp, *spnp2;
    NETS *uppernet;
    int i;

    if (cp == NULL)
        cp = cntxt_list;    /* set to top of stack */

    if (cp == NULL)
        return(NULL);       /* nothing on stack */

    /* first find out if this net is connected to an interface pin */
    spnp = igsymspn(igcomsym(cp -> c));
    for (i = 1; spnp != NULL; spnp = igspnnxt(spnp), i++)
```

```
    if (igspnnet(spnp) == netp)
        break;  /* match */

    if (spnp == NULL)
        /* not an interface pin */
        return(NULL);

    /* get net connected to this pin on the next highest level */
    uppernet = igpinnet(ifpinpin(i, igcompin(cp -> c)));

    /* see if net is connected to more than one interface pin... */
    /* if so, then a unique name for this signal cannot be determined. */
    for (spnp2 = igspnnxt(spnp); spnp2 != NULL; spnp2 = igspnnxt(spnp2)) {
        if (igspnnet(spnp2) == netp) {
            iwmsgout(WARNING,
                    "Warning - Net %s connects pins %s and %s of symbol %s.\n",
                    ignetnam(netp), igspnnam(spnp), igspnnam(spnp2),
                    iggrpnam(igsymown(igcomsym(cp -> c))));
        }
    }
    return(uppernet);
} /* upper_net */


/* ---------------------------------------------------------------
 * cntxt_netname
 *   Return the highest level net name.
 */
static char *cntxt_netname(NETS* netp)
{
    NETS *parentnet;
    CCONTEXT *cp;

    for (cp = cntxt_list; cp != NULL; cp = cp -> next) {

        if ((parentnet = upper_net(netp, cp)) == NULL)
            break;  /* stop at topmost net */

        if (ignettyp(netp) == GLOBAL_NET) {
            if (ignettyp(parentnet) == LOCAL_NET) {
                /* we are ignoring a global net which occurs on */
                /* the subcircuit.  this may not be what the */
                /* user wants so a warning is in order. */
                iwmsgout(WARNING,
                    "Warning - Global net %s on subcircuit %s is being ignored.\n",
                    ignetnam(netp), iggrpnam(ignetown(netp)));
                iwmsgout(WARNING | NOINC,
                    "          Using signal name from level above.\n");
            }
            else if (strcmp(ignetnam(netp), ignetnam(parentnet)) != 0) {
                /* global nets with different names are tied together. */
                /* this may be a design error. */
                iwmsgout(WARNING,
                    "Warning - Global net %s on subcircuit %s\n",
                    ignetnam(netp), iggrpnam(ignetown(netp)));
                iwmsgout(WARNING | NOINC,
                    "          is tied to global net %s on schematic %s above.\n",
                    ignetnam(parentnet), iggrpnam(ignetown(parentnet)));
            }
        }

            /* continue search on next highest level */
            netp = parentnet;
        }

        strcpy(hiername, "");
```

```
    if (ignettyp(netp) == LOCAL_NET)
        addpath(hiername, cp);  /* global nets do not have a path prefix */

    strcat(hiername, ignetnam(netp));
    return(hiername);
} /* cntxt_netname */


/* ================  DESIGN STRUCT PROCESSING ROUTINES ================ */

/* -------------------------------------------------------------
 * modelname
 *   returns either the value of the MODEL attribute or the
 *   group name.
 */
static char *modelname(GROUPS* grpp)
{
    ATTRIBUTES *attp;

    if (iggrpsym(grpp) != NULL) {
        if ((attp = ifattatt("MODEL",igsymatt(iggrpsym(grpp)))) != NULL) {
            return(igattval(attp));
        }
    }
    return(iggrpnam(grpp));
} /* modelname */


#if 0
/* -------------------------------------------------------------
 * refdesname
 *   returns either the value of the REFDES attribute or the
 *   group name.
 */
static char *refdesname(grpp)
GROUPS *grpp;
{
    ATTRIBUTES *attp;

    if (iggrpsym(grpp) != NULL)
    {
        if ((attp = ifattatt("REFDES",igsymatt(iggrpsym(grpp)))) != NULL)
        {
            return(igattval(attp));
        }
    }
    return(iggrpnam(grpp));
} /* refdesname */

#endif
/* -------------------------------------------------------------
 * primitive
 *   component is primitive if its symbol representation is of type
 *   MODULE or has a matching LEVEL attribute.

 */
static int primitive(COMPONENTS* comp)
{
    SYMBOLS *symp;

    symp = igcomsym(comp);
    if (igsymtyp(symp) == MODULE_TYPE)
        return(1);

    if (iwgetlevel(igsymatt(symp)) != NULL)
        return(1);
```

```
    return(0);
} /* primitive */


/* -------------------------------------------------------------
 * status_line
 *   displays the line "Processing <name> \r".   Only enough spaces
 *   after <name> as required to cover the last line are output.
 */
static void status_line(const char* name)
{
    static int lastlen = 0;
    static char buf[150] = "Processing ";
    int len, i;

    strcpy(&buf[11],name);
    len = strlen(name) + 11;
    for (i = len; i < lastlen; i++)
        buf[i] = ' ';
    buf[i] = '\r';
    buf[i+1] = '\0';
    lastlen = len;
    fputs(buf,stdout);
} /* status_line */


/* -------------------------------------------------------------
 * eval_attribute
 *   expand and evaluate and output one attribute.  if the global
 *   evaluation flag Eval_on is FALSE, then the attribute is output as is.
 */
static void eval_attribute(FILE* fp, ATTRIBUTES* attp,int first)
{
    static char evalbuf[EBUFSIZ];
    int status;

    if (Eval_on) {
        /* expand and evaluate the attribute value */
        status = ipevaluate(evalbuf, igattval(attp), EBUFSIZ);
    }
    else {
        /* use unevaluated attribute value */
        strncpy(evalbuf, igattval(attp), EBUFSIZ);
        evalbuf[EBUFSIZ-1] = '\0';
    }

    iprintf(fp, "%s%s=\"%s\"", (first? "": " "), igattnam(attp), evalbuf);

    if (Eval_on) {
        if (status != 0) {
            /* expansion or evaluation error occured */
            iwmsgout(ERROR, "Error - %s", ipgetmsg(status));
        }
    }
} /* eval_attribute */

#if 0
/* -------------------------------------------------------------
 * wr_sproc_attr
 *   expand and evaluate and output one attribute.  if the global
 *   evaluation flag Eval_on is FALSE, then the attribute is output as is.
 */
static void wr_sproc_attr(fp, attp, fst)
FILE *fp;
ATTRIBUTES *attp;
int fst;
{
    static char evalbuf[EBUFSIZ];
```

```
    strcpy(evalbuf, igattval(attp));
    evalbuf[EBUFSIZ-1] = '\0';

    iprintf(fp, "%s%s=%s\n", (fst? "": " "), strtolw(igattnam(attp)), strtolw(evalbuf));

} /* wr_sproc_attr */

#endif
/* -----------------------------------------------------------
 * do_attributes
 *   this routine is used to output net and interface symbol pin
 *   attributes.
 */
static void do_attributes(FILE* fp,ATTRIBUTES*  attp)
{
    int first = 1;

    if (Attr_on) {
        iprintf(fp, "(");
        for (; attp != NULL; attp = igattnxt(attp)) {
            eval_attribute(fp, attp, first);
            first = 0;
        }
        iprintf(fp, ")");
    }
} /* do_attributes */

/* -----------------------------------------------------------
 * do_comp_attributes
 *   this routine is used to output a component and its symbol
 *   attributes.  it uses the igcossat() "Component attributes
 *   Override Symbol attributes" routine to get unique attributes.
 */
static void do_comp_attributes(FILE* fp,COMPONENTS*  comp)
{
    ATTRIBUTES *attp;

    char current_icon [MAXPARAM] [ARRAY_WIDTH];
    char current_refdes [ARRAY_WIDTH] = { "" };

char current_device [ARRAY_WIDTH] = { "" };
char name [ARRAY_WIDTH];
char val  [ARRAY_WIDTH];
int i=0, special;
char c;

/* flush array */
while(i < MAXPARAM)
{
    current_icon[i][0]='\0';
    i++;
}

/* for all component and symbol attributes */
attp = NULL;
i=0;
while ((attp = igcossat(comp, attp)) != NULL)
{
        /*
        strcpy(evalbuf, igattval(attp));
        evalbuf[EBUFSIZ-1] = '\0';
        */
    special=0;
        strcpy(name, strtolw(igattnam(attp)));
        strcpy(val, strtolw(igattval(attp)));

    if(strcmp(name, "device")==0)
```

```
    {
        strcpy(current_device, val);
        special=1;
    }

    if(strcmp(name, "refdes")==0)
    {
        strcpy(current_refdes, val);
        special=1;
    }

    if( special < 1 )
    {
            strcpy( current_icon[i], name );
            strcat( current_icon[i], "=" );
            strcat( current_icon[i], strtolw(igattval(attp)) );
            i++;
    }
  }

/* dump sdl thre paramemter list */

iprintf(fp, "\n%s %s\n(", current_device, current_refdes);
i=0;
c=' ';
while((i < MAXPARAM) && (current_icon[i][0] != '\0'))
{
    iprintf(fp, "%c\n   %%%s", c, current_icon[i]);
    c = ',';
    i++;
}
iprintf(fp, "\n)");
            /*
            iprintf(fp, "%s=%s\n", strtolw(igattnam(attp)), strtolw(evalbuf));
            */

} /* do_comp_attributes */
#if 0
/* -------------------------------------------------------------
* do_pin_attributes
*   this routine is used to output component pin and symbol pin
*   attributes.  it uses the igcospat() "Component pin attributes
*   Override Symbol pin attributes" routine to get unigue attributes.
*/
static void do_pin_attributes(fp, pinp)
FILE *fp;
PINS *pinp;
{
    ATTRIBUTES *attp;
    int first = 1;

    if (Attr_on) {
        iprintf(fp, "(");

        /* for all component pin and symbol pin attributes */
        attp = NULL;
        while ((attp = igcospat(pinp, attp)) != NULL) {
            eval_attribute(fp, attp, first);
            first = 0;
        }

        iprintf(fp, ")");
    }
} /* do_pin_attributes */

#endif
```

```
/* ---------------------------------------------------------------
* list_net_pins
*   list all component pins connected to this net.  for composite
*   components, the net is followed down into the component's
*   subcircuit.
*/
static void list_net_pins(FILE* fp,NETS* netp)
{
    PINS *pinp;
    COMPONENTS *comp;
    char buf[30];

    for (pinp = ignetpin(netp); pinp != NULL; pinp = igpinnnx(pinp)) {
        comp = igpinown(pinp);
        if (primitive(comp)) {
            /* print component and pin names */
            sprintf(buf, "%s.", legalname(cntxt_name(igcomnam(comp))));
            strcat(buf, legalname(igspnnam(igpinspn(pinp))));
            iprintf(fp, " %s", buf);
        }
        else {
            /* push into composite component */
            cntxt_push(comp);
            list_net_pins(fp, igspnnet(igpinspn(pinp)));

            cntxt_pop();
        }
    }
} /* list_net_pins */


/* ---------------------------------------------------------------
* do_netlist
*   This is the main body of the net orientated listing.  We first
*   cycle through each net on this level and for each net that is a
*   top level net, we list all the component pins connected to that
*   net (following the nets into all subcircuits).  Next, we walk
*   all components on this level and recursively process any that are
*   composite.
*/
static void do_netlist(FILE* fp,GROUPS*  grpp)
{
    COMPONENTS *comp;
    NETS *netp;
    int stat;
    char delim[3];              /* list delimiter if only one element */

    strcpy(delim, "");
    status_line(iggrpnam(grpp));

    if (Eval_on) {
        /* push the variable definition table */
        ippushlev();
    }

    /* list all top level nets and their component pins */

    iprintf(fp, "wire\n");

    for (netp = iggrpnet(grpp); netp != NULL; netp = ignetnxt(netp))
    {
        if (upper_net(netp, NULL) == NULL)
        {
            /* this is a top level net */
```

```
        /*****************************
        write wire list to output file
        *****************************/
        if( *legalname(cntxt_netname(netp)) == '$')
            iprintf(fp, "%s   _%s", delim, legalname(cntxt_netname(netp)));
        else
            iprintf(fp, "%s   %s", delim, legalname(cntxt_netname(netp)));
        strcpy(delim, ",\n");        /* change delim for more elements */

        /* NOTE: Only attributes from the top level net are output. */
        /*       Additional processing would be required to find and */
        /*       output attributes from all of this net's subnets. */
        /***
        do_attributes(fp, ignetatt(netp));
        list_net_pins(fp, netp);
        iprintf(fp, ",\n");
        ***/
    }
}
/*****************
terminate wire list
*****************/

    iprintf(fp, ";\n\n");

    /* push into all composite components */
    comp = NULL;
    while ((comp = iggrpcom(grpp, comp)) != NULL) {
        if (!primitive(comp)) {
            /* push into composite */

            if (Eval_on) {
                /* add variable defs for this component to the table. */
                /* (in the do_complist() routine, variable definitions */
                /* were loaded for both primitive and composite */
                /* components... however, since we're only evaluating net */
                /* attributes in this case, we only need */
                /* to load definitions off composite components.) */

                if ((stat = ipaddvardefs(comp)) != 0) {
                    printf("ERROR -- exn001: Error loading definition: %s\n", ipgetmsg(stat));
                }
            }

            cntxt_push(comp);
            do_netlist(fp, igsymown(igcomsym(comp)));
            cntxt_pop();

            if (Eval_on) {
                /* delete this component's definitions */
                ipdelvardefs();
            }
        }
    }
    if (Eval_on) {
        /* pop the variable definition table */
        ippoplev();
    }
} /* do_netlist */


/* ------------------------------------------------------------
* list_comp_pins
*   this routine cycles through all the pins on the component and
*   lists the names of the nets connected to pins.  unconnected
*   pins will produce a warning message.
```

```
*/
static void list_comp_pins(FILE* fp,COMPONENTS* comp)
{
    #define MAXIO 16
    NETS *netp;
    PINS *pinp;
    ATTRIBUTES *attp;
    int unconnected_pins = 0;

    /* arrays for storage of in and out nets */
    char innets [MAXIO] [ARRAY_WIDTH];
    char outnets [MAXIO] [ARRAY_WIDTH];
    char netname [ARRAY_WIDTH];
    char direction [ARRAY_WIDTH];
    char name [ARRAY_WIDTH];
    char val [ARRAY_WIDTH];

    int pinnumber=0;
    int i;
    char delim[10];

    /* flush arrays */
    i=0;
    while(i < MAXIO)
    {
        innets [i][0] = '\0';
        outnets[i][0] = '\0';
        i++;
    }

    /* for all component pins ... */
    for (pinp = igcompin(comp); pinp != NULL; pinp = igpincnx(pinp))
    {
        /* get pin name
        iprintf(fp, " %s", legalname(igspnnam(igpinspn(pinp))));
        */

        /* output component pin attributes
        do_pin_attributes(fp, pinp);
        */

        /* get the name of the net attached to the pin. the
           cntxt_netname() routine returns the topmost netname
        */

        if ((netp = igpinnet(pinp)) != NULL)
        {
            strcpy(netname, legalname(cntxt_netname(netp)));
        }
        else
        {
            ++unconnected_pins;
        }

        /* for all attributes, extract only pinnumber and direction */
        attp = NULL;
        while ((attp = igcospat(pinp, attp)) != NULL)
        {
            strcpy(name, strtolw(igattnam(attp)));
            strcpy(val,  strtolw(igattval(attp)));

            if(strcmp(name, "#")==0)
               pinnumber = atoi(val);
            if(strcmp(name, "pintype")==0)
               strcpy(direction, val);
        }
```

```
    /* We have direction, pinnumber and net name here, update arrays */
    if ( strcmp(direction, "in") == 0)
        strcpy( innets[pinnumber], netname);
    else
        strcpy( outnets[pinnumber], netname);
} /* all pins */
    /* Print input array */
    strcpy(delim, "");
    iprintf(fp, "\n(\n   ");

    i = 0;
    while(i < MAXIO)
    {
        if ( innets[i][0] != '\0')          /* skip empty fields */
        {
            if (innets[i][0] == '$')
                iprintf(fp, "%s_%s", delim, innets[i]);
            else
                iprintf(fp, "%s%s", delim, innets[i]);
            strcpy(delim,",\n   ");
        }
        i++;
    }

    /* Print output array */
    i=0;
    while(i < MAXIO)
    {
        if ( outnets[i][0] != '\0')         /* skip empty fields */
        {
            if(outnets[i][0] == '$')
                iprintf(fp, "%s_%s", delim, outnets[i]);
            else
                iprintf(fp, "%s%s", delim, outnets[i]);
            strcpy(delim,",\n   ");         /* in case there were no input */
        }
        i++;
    }
    iprintf(fp, "\n);\n");


    if (unconnected_pins)
    {
        iwmsgout(WARNING, "Warning - Component %s has %d unconnected pin(s).",
                legalname(cntxt_name(igcomnam(comp))), unconnected_pins);
    }
    iprintf(fp, "\n");

} /* list_comp_pins */

/* -------------------------------------------------------------
* do_complist
*   This is the main body of the component orientated listing.  This
*   routine recursively decends each branch of the design hierarchy
*   and outputs a statement for each component instance.  Each statement
*   contains the full path name of the component and its pin-net
*   connections.  The top most net name is used for each pin-net connection.
*/
static void do_complist(FILE* fp,GROUPS*  grpp)
{
    COMPONENTS *comp;
    int stat;

    status_line(iggrpnam(grpp));
```

```
    if (Eval_on) {
        /* push the variable definition table */
        ippushlev();
    }

    comp = NULL;
    while ((comp = iggrpcom(grpp, comp)) != NULL) {

        if (Eval_on) {
            /* add variable definitions for this component to the table */
            if ((stat = ipaddvardefs(comp)) != 0) {
                printf("ERROR -- exn002: Error loading definition: %s\n", ipgetmsg(stat));
            }
        }

        if (primitive(comp))
        {
            /* print component statement
            iprintf(fp, " %s", legalname(iggrpnam(igsymown(igcomsym(comp)))));
            iprintf(fp, " %s", legalname(refdesname(igsymown(igcomsym(comp)))));
            */
            /*
            iprintf(fp, " %s", legalname(cntxt_name(igcomnam(comp))));
            */

            do_comp_attributes(fp, comp);

            list_comp_pins(fp, comp);

        }
        else {
            /* push into composite component */
            cntxt_push(comp);
            do_complist(fp, igsymown(igcomsym(comp)));
            cntxt_pop();
        }

        if (Eval_on) {
            /* delete this component's definitions */
            ipdelvardefs();
        }
    }

    if (Eval_on) {
        /* pop the variable definition table */
        ippoplev();
    }
} /* do_complist */

#if 0
/* ------------------------------------------------------------
 * do_interface
 *   the first part of the module description defines the interface
 *   to the outside world.
 */
static void do_interface(fp, grpp)
FILE *fp;
GROUPS *grpp;
{
    SYMPINS *spnp;
iprintf(fp, "INTERFACE\n");

/* list the SYMBOL_PIN=INTERNAL_NET connection list */
for (spnp=igsymspn(iggrpsym(grpp)); spnp != NULL; spnp=igspnnxt(spnp)) {
    /* add pinname */
    iprintf(fp, " %s", igspnnam(spnp));
```

```
        do_attributes(fp, igspnatt(spnp));
        iprintf(fp, "=");
        if (igspnnet(spnp) == NULL) {
            iwmsgout(WARNING,
            "Warning - Symbol pin %s is not used in underlying schematic.",
            igspnnam(spnp));
        }
        else {
            /* add internal netname */
            iprintf(fp, "%s", ignetnam(igspnnet(spnp)));
        }
    }
    iprintf(fp, " ;\n");
} /* do_interface */

#endif
/* -----------------------------------------------------------
 * do_module
 *   output the module statement and symbol attributes.
 */
static void do_module(FILE* fp,GROUPS* grpp)
{
    iprintf(fp, "block %s", strtolw(legalname(modelname(grpp))));
    do_attributes(fp, igsymatt(iggrpsym(grpp)));
    iprintf(fp, "\n\n");
} /* do_module */


/* -----------------------------------------------------------
 * loadfile
 *   Load variable definitions from the specified file (if it
 *   exists).
 */
static void loadfile(const char* fname)
{
    int status;

    if ((status = ipincfile(fname)) == IP_DUPVAR) {
        printf("WARNING -- exn003: Duplicate variable(s) in %s.VAR\n", fname);
    }
    else if (status == IP_SUCCESS) {
        printf("Definitions loaded from %s.VAR\n", fname);
    }
} /* loadfile */

/* -----------------------------------------------------------
 * usage
 *   display usage info.
 */
static void usage()
{
    printf("Usage: FLATNET [flags] design [level ...]\n");
    printf("  flags\n");
    printf("   -a       - disable attribute output.\n");
    printf("   -b       - enable bus expansion.\n");
    printf("   -e       - disable attribute evaluation.\n");
    printf("   -n       - disable NETS section.\n");
    printf("   -w       - disable warning messages.\n");
    printf("   -s       - disable synonym creation.\n");
    printf("  design    - top level schematic name.\n");
    printf("  level     - level string(s).\n");
} /* usage */


/* -----------------------------------------------------------
 * main
```

```
 *   process command line, open output file, load data structs,
 *   process design.
 */
void main(int argc,char* argv[])
{
    FILE *outfp;            /* output file pointer */
    char *filename;         /* output file name */
    char *design_name;      /* top level schematic name */
    GROUPS *top_group;      /* pointer to top group */
    int netlist = 1;        /* net listing flag */
    int warnings = 1;       /* warning flag */
    int i, j, flag, stat;

    printf("VIEWBASE to SDL extractor, Version %s\n", VERSION);
    printf("Copyright (C) STAR Semiconductor Inc. 1991\n");

    if (argc < 2) {     /* no args */
        usage();
        exit(EXFAILURE);
    }

    iwinit();                   /* initialize wir file reader */

    /* process command line. flags and level arguments are optional. */
    /* flags may be grouped together and may occur before or after */
    /* the design name. */
    design_name = NULL;
    for (i = 1; i < argc; i++) {
        if (argv[i][0] == '-') {
            /* command line switch */
            for (j = 1; argv[i][j]; j++) {
                flag = isupper(argv[i][j])? tolower(argv[i][j]): argv[i][j];
                switch (flag) {
                case 'a':   /* disable attribute output */
                    Attr_on = 0;
                    Eval_on = 0;
                    break;
                case 'b':   /* enable bus expansion */
                    iwexpbus();
                    break;
                case 'e':
                    Eval_on = 0;
                    break;
                case 'n':   /* disable net orientated listing */
                    netlist = 0;
                    break;
                case 'w':   /* disable warning messages */
                    warnings = 0;
                    break;
                case 's':   /* disable synonym creation */
                    Syn_on = 0;
                    break;
                } /* switch */
            } /* for j ... */
        }
        else {
            if (design_name == NULL) {
                /* save design name */
                design_name = argv[i];
            }
            else {
                /* save level string (more than one level may be specified) */
                iwsetlevel(argv[i]);
            }
        }
    } /* for i ... */
```

```
if (design_name == NULL) {
    printf("ERROR -- exn003: you must specify a design name.\n");
    usage();
    exit(EXFAILURE);
}

strtolw(design_name);   /* lower-case design name */

/* open output netlist file */
filename = malloc(strlen(design_name) + 5);
sprintf(filename, "%s.pdl", design_name);
if ((outfp = fopen(filename,"w")) == NULL) {
    fprintf(stderr, "Error: can't open %s.\n", filename);
    exit(EXFAILURE);
}

printf("Netlisting to %s.\n", filename);

/* set up error reporting routines */
iwmsgclose();                              /* clear default settings */
iwmsgsetup(ERROR, outfp, "\n%s");          /* errors to file and */
iwmsgsetup(ERROR, stdout, "%s");           /*          console */
iwmsgsetup(INFO, outfp, "\n** %s");        /* infos to file */
if (warnings)
    iwmsgsetup(WARNING, outfp, "\n** %s");  /* warnings to file */

/* load design into data structures */
top_group = iwgroup(design_name);
if (top_group == NULL) {
    fprintf(stderr, "Error loading %s.                \n", design_name);
    fclose(outfp);
    exit(EXFAILURE);
}
printf("\n");

/* free temporary memory used by the reader */
iwcleanup();

/* notify user of errors or warnings found during loading */
if (iwmsgcount(ERROR | WARNING) > 0) {
      printf("%d error(s), %d warning(s) encountered during load.\n",
          iwmsgcount(ERROR), iwmsgcount(WARNING));
  }

  /* initialize output formatting routines */
  iprintfinit(78, " ", "\n  ");

  if (Eval_on) {
      /* initialize parameterized attribute routines and load variable */
      /* definitions from the top level symbol */
      if ((stat = ipinit(top_group)) != 0) {
          printf("ERROR -- exn004: PA initialization error: %s\n", ipgetmsg(stat));
      }
      /* load variables from the variable definition text files */
      loadfile(design_name);
      loadfile("FLATNET");
  }

  /*
  iprintf(outfp, "** FLAT Netlister - V%s\n", VERSION);
  iprintf(outfp, "** Created: %s, %s  %s\n\n", iday(), idate(), itime());
  */

/**********
Block name
**********/
```

```
    do_module(outfp, top_group);        /* output module header */

    /*do_interface(outfp, top_group);*/   /* output module interface nets */

/*********
 Wire list
*********/

    do_netlist(outfp, top_group);   /* output net section */

/*************
Component list
*************/

    iprintf(outfp, "begin\n");

    do_complist(outfp, top_group);      /* output component section */

    iprintf(outfp, "end\n");            /* terminate module section */

    /* dump_synlist(outfp);*/           /* list synonyms */

    status_line("complete.\n");

    printf("%d error(s), %d warning(s) encountered.\n",
        ivmsgcount(ERROR), ivmsgcount(WARNING));

    fclose(outfp);
    exit(EXSUCCESS);
} /* main */
/*
  Copyright (c) 1991 Star Semiconductor Corporation. All Rights Reserved.
  This material may not be copied or used without prior written permission.

 * $Id: exnode.c,v 1.3 1991/09/20 04:24:01 ivan Exp $
 * $Log: exnode.c,v $
 * Revision 1.3  1991/09/20  04:24:01  ivan
 * Minor fixes
 *
 * Revision 1.2  1991/09/16  19:06:24  ivan
 * Changed error messages to Star format
 *
 * Revision 1.1  1991/09/06  18:47:25  ivan
 * Initial revision
 *
*/

/**********************************************************************

                                   exnode.c

***********************************************************************
Build an sdi .CMD file to probe a selected node.
*/


/******************/
/*    requires    */
/******************/

#include <stdio.h>
#include <stdlib.h>
#include <string.h>
#include "sysfuncs.h"
#include "strfunc.h"
#include "exsdl.h"
#include "lex.h"
```

```
/*******************/
/*  exceptions    */
/*******************/


/*******************/
/*   constants    */
/*******************/


/*******************/
/*     types      */
/*******************/


/*******************/
/*      data      */
/*******************/

static char exnode[] = "$Revision: 1.3 $";
/* GLOBAL STORAGE for interfacing to parser and lexical analyser */
char tmprec[MAXRL];             /* holds latest identifier */
extern FILE *yyin,
    *yyout;


/*******************/
/*     macros     */
/*******************/


/*******************/
/*    functions   */
/*******************/

void main(int argc, char *argv[])
{
    char inpath[MAXNAM];
    char outpath[MAXNAM] = {"dp.cmd"};
    char fname[MAXNAM],
         ext[MAXEXT];
 /****************************
 Check command line parameters
 ****************************/

    printf("\nExnode %s\n", exnode);
    printf("Copyright (C) 1991 by STAR Semiconductor Corporation.\n");

    if (argc > 1)
    {
        strtolw(argv[1]);
        if ((strcmp(argv[1], "-h") == 0) || (strcmp(argv[1], "/h") == 0))
        {
            printf("Usage: exsdl filename[.nod]\n");
            exit(-1);
        }
        else
            strcpy(inpath, argv[1]);
    }
    else
    {
        printf("Usage: exsdl filename[.nod]\n");
        exit(-1);
    }
```

```
/************************
Check input file extension
************************/

   splitname(inpath, fname, ext);
   if (strcmp(ext, "") == 0)   /* append default extension */
   {
       strcpy(ext, ".nod");
       mergename(inpath, fname, ext);
   }

/*************************
open input and output files
*************************/

   if ((yyin = fopen(inpath, "r")) == NULL)
   {
       printf("ERROR -- exo001: failed to open %s\n", inpath);
       exit(-1);
   }

   if ((yyout = fopen(outpath, "w")) == NULL)
   {
       printf("ERROR -- exo002: failed to open %s\n", outpath);
       exit(-1);
   }

/****************
Process input file
****************/

   printf("Creating %s from %s\n", outpath, inpath);
   yylex();
   fprintf(yyout, "lo symbols\n");
   fprintf(yyout, "pr %s\n", tmprec);
   fprintf(yyout, "exit y\n");

   fclose(yyin);
   fclose(yyout);
}
/*
 Copyright (c) 1991 Star Semiconductor Corporation. All Rights Reserved.
 This material may not be copied or used without prior written permission.

 * $Id: getdis.c,v 1.4 1991/10/01 16:24:07 ivan Exp $
 * $Log: getdis.c,v $
 * Revision 1.4  1991/10/01  16:24:07  ivan
 * Fix wild address bug.
 *
 * Revision 1.3  1991/09/16  19:06:31  ivan
 * Changed error messages to Star format
 *
 * Revision 1.2  1991/09/11  15:20:44  ivan
 * Support 'blocklen' parameter on 'filter' blocks to control splitting
 * of filters longer than a sample period into seperate blocks.
 *
 * Revision 1.1  1991/09/05  18:47:42  ivan
 * Initial revision
 *
 */

/**************************************************************************

                              getdis.c

**************************************************************************
```

```
Functions for extracting FIR and IIR data from a *.fdf file
*/


/*******************/
/*   requires     */
/*******************/

#include "sysfuncs.h"
#include "strfunc.h"
#include <stdio.h>
#include <string.h>
#include <stdlib.h>

/*******************/
/*  exceptions    */
/*******************/


/*******************/
/*   constants    */
/*******************/

/* dispro file information */

#define MAXLINE 80
#define TYPEREC 2
#define LENGREC 3
#define MAXTAPS 500
#define MAXSECT 50

/*******************/
/*     types      */
/*******************/
/*******************/
/*      data      */
/*******************/


/*******************/
/*     macros     */
/*******************/


/*******************/
/*   functions    */
/*******************/

char *extract_param2(char *str);
extern double lim2(double var);


/******************************
Process DISPRO FIR files
******************************/

int get_dispro_fir_data(FILE * dis_file, double *coeffvec, char *t, int *iptr)
{

    char tmp_rec[MAXLINE];
    char filter_type[12];
    int i,
        numsect,
        hnumsect,
        coef_det;
    double cvalue;
```

```
/**************
get filter type
**************/

   fgets(tmp_rec, MAXLINE, dis_file);
   strcpy(filter_type, extract_param2(tmp_rec));
   strcpy(t, filter_type);      /* for calling routine */

/****************
get filter length
****************/

   fgets(tmp_rec, MAXLINE, dis_file);
   numsect = atoi(extract_param2(tmp_rec));

   if (numsect < 2 || numsect > MAXTAPS)
   {
      printf("ERROR -- gtd001: invalid number of taps\n\n");
      return (-1);
   }

   hnumsect = numsect >> 1;
   *iptr = numsect;            /* for calling routine */


/********************************
         ;
 skip to beginning of coefficients
 ********************************/

    coef_det = 0;
    while (feof(dis_file) == 0)
    {
       fgets(tmp_rec, MAXLINE, dis_file);
       if (strncmp(tmp_rec, "\"<C>", 4) == 0)
       {
          coef_det = 1;        /* found coefficients  */
          break;               /* go and process them */
       }
    }

    if (coef_det == 0)
    {
       return (-2);
    }

 /************************************************************
FIR coefficient record may be very long, so fetch it one value
at a time. First decide if coefficient symmetry is for
even or odd number of samples.
************************************************************/

    if ((numsect & 0x0001) == 0)
    {
       for (i = 0; i < hnumsect; i++)
       {
          fscanf(dis_file, " %lf", &cvalue);
          coeffvec[i] = cvalue;
          coeffvec[numsect - 1 - i] = cvalue;
       }
    }

    else
    {
       for (i = 0; i <= hnumsect; i++)
```

```
        {
            fscanf(dis_file, " %lf", &cvalue);
            coeffvec[i] = cvalue;
            coeffvec[numsect - 1 - i] = cvalue;
        }
    }
    return (0);
}


/*****************************************************************************
Process DISPRO IIR files. Passed down parameters are actually owned by
calling routine.

dis_file   open file for read fdf IIR format
coeffvec   vector of coefficients, 5 per section
t          filter type: lowpass, bandpass, highpass, tranfunc
iptr       number of sections
*****************************************************************************/

int get_dispro_iir_data(FILE * dis_file, double *coeffvec, char *t, int *iptr, int *oddflag)
{
      char tmp_rec[MAXLINE];
      char filter_type[12];
      int i,
          j,
          order,
          numsect,
          coef_det;
      double a,
             b,
             c,
             d,
             e;
   /**************
   get filter type
   **************/

      fgets(tmp_rec, MAXLINE, dis_file);
      strcpy(filter_type, extract_param2(tmp_rec));
      strcpy(t, filter_type);     /* for calling routine */

   /****************
   get filter order
   ****************/

      fgets(tmp_rec, MAXLINE, dis_file);
      order = atoi(extract_param2(tmp_rec));
      i = 0;                      /* for even order filters    */

      if ((order & 0x0001) != 0)  /* test for odd order filter */
      {
      /* make order the next highest even number, set the flag */
          order++;
          i = 1;                  /* for odd order filters */
      }

      numsect = order >> 1;       /* for recursive filter structure */
      *iptr = numsect;            /* for calling routine */
      *oddflag = i;               /* for calling routine */

      if (numsect < 1 || numsect > MAXSECT)
      {
          printf("ERROR --gtd002: invalid number of IIR sections\n\n");
          return (-1);
      }
```

```
    /******************************
    skip to beginning of coefficients
    ******************************/

        coef_det = 0;
        while (feof(dis_file) == 0)
        {
            fgets(tmp_rec, MAXLINE, dis_file);
            if (strncmp(tmp_rec, "\"<C>", 4) == 0)
            {
                coef_det = 1;       /* found coefficients  */
                break;              /* go and process them */
            }
        }
    if (coef_det == 0)
    {
        return (-2);
    }


/*********************************************************************
Fetch coefficients from file.
Second and first order coefficients are modified the same way.
See the DISPRO manual, Figure 3.1a for details.
*********************************************************************/

    j = 0;
    for (i = 0; i < numsect; i++)
    {
        fscanf(dis_file, "%*i, %lf, %lf, %lf, %lf, %lf", &a, &d, &e, &b, &c);
        coeffvec[j++] = lim2(a);/* b0 */
        coeffvec[j++] = lim2(a * d);    /* b1 */
        coeffvec[j++] = lim2(a * e);    /* b2 */
        coeffvec[j++] = lim2(-b);       /* a1 */
        coeffvec[j++] = lim2(-c);       /* a2 */
    }
    return (0);
}


char *extract_param2(char *rec)
{
    int i = 0,
        j = 0;
    static char text[12]; /*!!!!!!!!!!!!!!!!!!!!!!!!!!!!!!!!!!!!!*/
    char c = '\n';              /* initialise for test */
    while (c != ',')            /* eat first parameter */
    {
        c = rec[i++];           /* advance pointer     */
    }

    while (c != '\0')
    {
        c = rec[i];
        if (c == ' ' || c == '\t' || c == '\n' || c == '"')     /* eat white */
            ;
        else
        {
            text[j] = c;        /* copy string */
            j++;
        }
        i++;
    }
    strtolw(text);              /* for type checking */
    return (text);
}
```

```
/*
  Copyright (c) 1991 Star Semiconductor Corporation. All Rights Reserved.
  This material may not be copied or used without prior written permission.

 * $Id: strfunc.c,v 1.3 1991/09/16 19:06:40 ivan Exp $
 * $Log: strfunc.c,v $
 * Revision 1.3  1991/09/16  19:06:40  ivan
 * Changed error messages to Star format
 *
 * Revision 1.2  1991/09/11  15:20:55  ivan
 * Support 'blocklen' parameter on 'filter' blocks to control splitting
 * of filters longer than a sample period into seperate blocks.
 *
 * Revision 1.1  1991/09/06  18:47:56  ivan
 * Initial revision
 *
 */

/*************************************************************************

                                  strfunc.c

**************************************************************************
*/


/*******************/
/*    requires     */
/*******************/

#include "sysfuncs.h"
#include <stdio.h>
#include <stdlib.h>
#include <string.h>
#include <ctype.h>
#include "strfunc.h"

/*******************/
/*   exceptions    */
/*******************/


/*******************/
/*    constants    */
/*******************/


/*******************/
/*      types      */
/*******************/


/*******************/
/*      data       */
/*******************/


/*******************/
/*     macros      */
/*******************/

/*******************/
/*    functions    */
/*******************/
/* convert an int value to character representation in a specified
      radix stored in a string */
```

```
/* recursive itoa with limit on number of chars */
void itoa_limit(int value, char ** string_ptr, int radix, int n_chars)
{
    int     next_value;
    int     digit;

    /* see if limit has been reached */
    n_chars++;
    if (n_chars > ITOA_LIMIT)
        return;

    /* compute the right digit of the value */
    digit = value - (next_value = value/radix)*radix;

    value = next_value;

    /* recursively call us for remaining digits */
    if (value)
        itoa_limit(value, string_ptr, radix, n_chars);

    /* output our digit at end, converting to ASCII */
    *(*string_ptr)++ = (char)(digit + '0');

    /* add terminator, which can be overwritten by successive digits */
    **string_ptr = '\0';
}

/* here is the real itoa */

char* itoa(int value, char* string, int radix)
{
    char*   string_start;
    int     n_chars;

    n_chars = 1;
    string_start = string;

    /* if negative value, output a minus sign and work with positive number */
    if (value < 0)
    {
        *string++ = '-';
        value = -value;
        n_chars++;
    }
    itoa_limit(value, &string, radix, n_chars);
    return (string_start);
}

/* splitname - separate filename into name and extension strings.
   cname points to the combined filename string
   p1 points to the name string
   p2 points to the extension string
   all strings are null terminated
   returns 0
*/

int splitname(char *cname, char *p1, char *p2)
{
   int i = 0,
       j = 0;
   char c;
       forever
   {
      c = cname[i];
      if (c == '.' || c == '\0')
      {
```

```
            p1[i] = '\0';
            i++;
            break;
        }
        p1[i] = c;
        i++;
    }

    if (c == '\0')
        p2[j] = '\0';
    else
    {
        p2[j] = c;
        j++;
        while (c != '\0')
        {
            c = cname[i];
            p2[j] = c;
            i++;
            j++;
        }
    }
    return (0);
}


/* mergename - combine name and extension strings into filename string.
   cname points to the combined filename string
   p1 points to the name string
   p2 points to the extension string
   all strings are null terminated
   returns 0
*/

int mergename(char *cname, char *p1, const char *p2)
{
    cname[0] = '\0';
    strcat(cname, p1);
    strcat(cname, p2);
    return (0);
}


/* strtoup - convert a string to uppercase.
   string points to the null terminated string to be converted
   returns a pointer to string
*/

char *strtoup(char *string)      /* convert string to uppercase */
{
    int i = 0;
    while (string[i] != '\0')
    {
        string[i] = (char) toupper((int) string[i]);
        i++;
    }
    return (string);
}


/* strtolw - convert a string to lowercase.
   string points to the null terminated string to be converted
   returns a pointer to string
*/

char *strtolw(char *string)      /* convert string to lowercase */
{
```

```
   int i = 0;
   while (string[i] != '\0')
   {
       string[i] = (char) tolower((int) string[i]);
       i++;
   }
   return (string);
}

char *strcpress(char *string)   /* remove white space */
{
   int i = 0,
       j = 0;
   while (string[i] != '\0')
   {
       if (isspace(string[i]) == 0)
       {
           string[j] = string[i];
           j++;
       }
       i++;
   }
   string[j] = '\0';            /* terminate compressed string */
   return (string);
}



/* check_open_rf  - check and open a read file, exit on failure
   rfile points to the file structure
   inpath is the filename
   returns 0 if successful
   returns 1 if failed
 */

int check_open_rf(FILE ** rfile, char *rpath)
{
    if ((*rfile = fopen(rpath, "r")) == NULL)
    {
        printf("ERROR -- str001: cannot open %s\n", rpath);
        return (1);
    }
    else
        return (0);
}
```

APPENDIX B

```
/*
  Copyright (c) Star Semiconductor, Inc. 1991. All Rights Reserved.
  This material may not be copied or used without prior written permission.

 * $Header: /home/solus/users4/release/CVS/cells/code/dsink.sdl,v 1.2 1991/10/01
 * $Revision: 1.2 $
 * $Id: dsink.sdl,v 1.2 1991/10/01 21:24:22 chet Exp $
 * $Log: dsink.sdl,v $
# Revision 1.2  1991/10/01  21:24:22  chet
# Added Revision Keyword
#
# Revision 1.1  1991/09/05  14:28:15  allsop
# Initial revision
#

*/
```

```
/*****************************************************************************

                              dsink.sdl

******************************************************************************

Function:

        Dual sink block.  Store two inputs into vectors until full, then cease.

Arguments:

        ina
        inb

Parameters:

        length

Algorithm:

        Manage two sink vectors.
        Store input values into output vectors until full.

*/

/********************/
/*   inline code   */
/********************/

asmblock dsink ( %subr=default, %length=128 ) ( ina , inb ; )

verify ( %length>0 && %length<=256 ), 'Specify length in range 1 to 256.';

variable integer ptr = outvector1;
micro variable outvector1[%length];
micro variable outvector2[%length];

duration 10;

begin
        lda     ptr
        cmp     #outvector1+%length-1
        jgt     DONE
        ldb     ptr
        ldx     ina             // store the inputs in vectors
        stx     [B]
        ldx     inb
        stx     [B+%length]
        add     #1
        sta     ptr             // save ptr for next invocation
DONE:
end

/********************/
/* subroutine call */
/********************/

callblock dsink ( %subr=default, %length=128 ) ( ina , inb ; )

verify ( %length>0 && %length<=256 ), 'Specify length in range 1 to 256.';

variable hex return=postamble;
variable integer length=%length;
variable integer ptr=outvector1;
micro variable outvector1[%length];
micro variable outvector2[%length];

duration 4+13;

begin
        ldx     ina
        ldy     inb
        ldb     #return
        jmp     "dsink.$start"
postamble:
end
```

```
/********************/
/* subroutine body */
/********************/

subrblock dsink { } ()

        symbol return=0, length=1, ptr=2, outvector1=3;

duration 0;

begin
        lda     B
        add     #outvector1-return
        add     [B+length]
        cmp     [B+ptr]
        jle     DONE
        ldf     [B+ptr]
        stx     [F]
        ldl     [B+length]
        sty     [F+L]
        lda     [B+ptr]
        add     #1
        sta     [B+ptr]              // save ptr for next invocation
DONE:
        jmp     [B+return]
        end

/*
  Copyright (c) Star Semiconductor, Inc. 1991. All Rights Reserved.
  This material may not be copied or used without prior written permission.

 * $Header: /home/solus/users4/release/CVS/cells/code/dsinkrd.sdl,v 1.5 1991/10/
 * $Revision: 1.5 $
 * $Id: dsinkrd.sdl,v 1.5 1991/10/01 21:24:27 chet Exp $
 * $Log: dsinkrd.sdl,v $
# Revision 1.5  1991/10/01  21:24:27  chet
# Added Revision Keyword
#
# Revision 1.4  1991/09/19  13:04:55  allsop
# Changed done output to 0.0 or 1.0.
#
# Revision 1.3  1991/09/16  15:12:05  allsop
# Remove micro definitions from reset and done.
#
# Revision 1.2  1991/09/11  14:45:05  chet
# Revise reset threshold for reset >= 0.5; include total lines of code comments.
#
# Revision 1.1  1991/09/05  17:25:23  allsop
# Initial revision
#

*/

/*************************************************************************

                                dsinkrd.sdl

**************************************************************************

Function:

        double sink block with reset input and done flag output

Arguments:

        ina
        inb
        reset
        done

Parameters:

        length

Algorithm:
```

```
        Manage two sink vectors.
        Store input value into output vector until full.
        When reset input becomes >= 0.5, reset output buffer pointer to start;
        also clear DONE output (set to 0.0).
        When output vector is full, signal by setting DONE output (set to 1.0).
        Note: done flag is written every sample, even if unchanged.
        Note: Reset input is ignored while vector is being assembled.
        If reset is held high (>= 0.5) the DONE flag is always zero.

*/

/*******************/
/*   inline code   */
/*******************/

asmblock dsinkrd ( %subr=default, %length=128 ) ( ina, inb, reset ; done )

verify ( %length>0 && %length<=256 ), 'Specify length in range 1 to 256.';

variable integer ptr = outvector1;
micro variable outvector1[%length];
micro variable outvector2[%length];

duration 14;                    // total lines of code:  20

begin
        lda     ptr             // use A register for full check
        cmp     #outvector1+%length-1
        jgt     NO_STORE
        ldb     ptr             // use Base register for storage
        ldx     ina             // X is a scratch register here
        stx     [B]
        ldx     inb
        stx     [B+%length]
        add     #1
        sta     ptr
        jmp     CLR_DONE
NO_STORE:
        lda     reset
        cmp     #0.5            // reset threshold
        jlt     SET_DONE        // jump if not reset
        lda     #outvector1     // set pointer to start of vector
        sta     ptr
CLR_DONE:
        lda     #0.0            // clear done flag; vector being assembled
        jmp     WRITE_DONE
SET_DONE:
        lda     #1.0            // set done flag; vector is full
WRITE_DONE:
        sta     done
DONE:
end

/*******************/
/* subroutine call */
/*******************/

callblock dsinkrd ( %subr=default , %length=128 ) ( ina, inb, reset ; done )

verify ( %length>0 && %length<=256 ), 'Specify length in range 1 to 256.';

variable hex return=postamble;
variable integer creset;            // copy of reset
variable integer length=%length;
variable integer ptr=outvector1;
micro variable outvector1[%length];
micro variable outvector2[%length];

duration 6+16;                  // total lines of code:  6 + 23

begin   ldx     ina
        ldy     inb
        lda     reset
        ldb     #return
        jmp     "dsinkrd.$start"
 postamble:
        sta     done
 end
```

```
/*******************/
/* subroutine body */
/*******************/

subrblock dsinkrd ( ) ()

        symbol return=0, creset=1, length=2, ptr=3, outvector1=4;

duration 0;

begin
        sta     [B+creset]
        lda     B
        add     #outvector1-return
        ldf     A                   // temp register: address of outvector1[0]
        add     [B+length]
        cmp     [B+ptr]
        jgt     DO_STORE
        lda     [B+creset]          // test reset input
        cmp     #0.5                // reset threshold
        jlt     SET_DONE            // jump if not reset
        stf     [B+ptr]             // set pointer to outvector1[0]
        jmp     CLR_DONE
SET_DONE:
        lda     #1.0                // set done flag; vector is full
        jmp     EXIT_SUB            // exit routine from one place only
DO_STORE:
        ldf     [B+ptr]             // use F register for storage
        stx     [F]
        ldl     [B+length]
        sty     [F+L]
        lda     [B+ptr]
        add     #1
        sta     [B+ptr]
CLR_DONE:
        lda     #0.0                // clear done flag; vector being assembled
EXIT_SUB:
        jmp     [B+return]
end
/*
  Copyright (c) Star Semiconductor, Inc. 1991. All Rights Reserved.
  This material may not be copied or used without prior written permission.

 * $Header: /home/solus/users4/release/CVS/cells/code/ext_in.sdl,v 1.4 1991/10/0
 * $Revision: 1.4 $
 * $Id: ext_in.sdl,v 1.4 1991/10/01 21:24:32 chet Exp $
 * $Log: ext_in.sdl,v $
# Revision 1.4  1991/10/01  21:24:32  chet
# Added Revision Keyword
#
# Revision 1.3  1991/09/19  13:06:00  allsop
# Changed subr=off to subr=default.
#
# Revision 1.2  1991/09/04  21:24:09  allsop
# Removed code and moved micro declaration to argument list.
#
# Revision 1.1  1991/08/13  13:44:52  allsop
# Initial revision
#

*/

/*****************************************************************************

                              ext_in.sdl

******************************************************************************

Function:

        external input (from microprocessor)

Arguments:

        out
```

```
Parameters:

        zone;
        trigger;
        rate;

Algorithm:

        SPROC input (microprocessor output) visibility tag.

*/

/********************/
/*   inline code   */
/********************/

asmblock ext_in ( %subr=default, %zone="", %rate=0, %trigger=no_cl ) ( ; micro o

timezone %zone = %rate;
computeline %trigger;

duration 0;
begin
end
/*
  Copyright (c) Star Semiconductor, Inc. 1991. All Rights Reserved.
  This material may not be copied or used without prior written permission.

 * $Header: /home/solus/users4/release/CVS/cells/code/ext_out.sdl,v 1.4 1991/10/
 * $Revision: 1.4 $
 * $Id: ext_out.sdl,v 1.4 1991/10/01 21:24:36 chet Exp $
 * $Log: ext_out.sdl,v $
# Revision 1.4  1991/10/01  21:24:36  chet
# Added Revision Keyword
#
# Revision 1.3  1991/09/19  13:06:45  allsop
# Changed subr=off to subr=default.
#
# Revision 1.2  1991/09/04  20:42:28  allsop
# Removed code and moved micro declaration to argument list.
#
# Revision 1.1  1991/08/13  13:46:09  allsop
# Initial revision
#

*/

/****************************************************************************

                                ext_out.sdl

****************************************************************************

Function:

        external output (to microprocessor)

Arguments:

        in

Parameters:

Algorithm:

        SPROC output (Microprocessor input) visibility tag.

*/

/********************/
/*   inline code   */
/********************/

asmblock ext_out ( %subr=default ) ( micro in ; )

duration 0;

begin
end
```

```
/*
  Copyright (c) Star Semiconductor, Inc. 1991. All Rights Reserved.
  This material may not be copied or used without prior written permission.

 * $Header: /home/solus/users4/release/CVS/cells/code/sink.sdl,v 1.6 1991/10/01
 * $Revision: 1.6 $
 * $Id: sink.sdl,v 1.6 1991/10/01 21:27:10 chet Exp $
 * $Log: sink.sdl,v $
# Revision 1.6  1991/10/01  21:27:10  chet
# Added Revision Keyword
#
# Revision 1.5  1991/08/28  19:28:45  chet
# Replaced with msink.sdl (only difference is 'micro' declaration).
#
# Revision 1.1  1991/08/13  13:54:21  allsop
# Initial revision
#

*/

/************************************************************************

                                sink.sdl

*************************************************************************

Function:

        This cell captures consecutive data samples to a block of data RAM.
        The block of RAM is specified as 'micro'.

Arguments:

        fixed in        -2.0 <= in < 2.0        // current input sample

Parameters:

        integer length  0 < length <=512        // length of data RAM block

Algorithm:

        while ptr is not greater than the last address to be stored
                store input indirect with ptr to current address
                increment pointer
        Note that the subroutine version is slightly more complicated
        but operates on the same principle.

*/

/********************/
/*   inline code   */
/********************/

asmblock sink { %subr=default, %length=128 } ( in ; )

verify ( %length>0 && %length<=512 ), 'Specify length in range 1 to 512.';

variable integer ptr = outvector;
micro variable outvector[%length];

duration 8;

begin
        ldb     ptr
        ldx     in
        lda     ptr
        add     #1
        cmp     #outvector+%length
        jgt     DONE
        stx     [B]
        sta     ptr
DONE:
end

/********************/
/* subroutine call */
/********************/
```

```
callblock sink ( %subr=default, %length=128 ) ( in ; )

verify ( %length>0 && %length<=512 ), 'Specify length in range 1 to 512.';

variable hex return=postamble;
variable integer length=%length;
variable integer ptr=outvector;
micro variable outvector[%length];

duration 3+10;

begin
        ldx     in
        ldb     #return
        jmp     "sink.$start"
postamble:
end

/*******************/
/* subroutine body */
/*******************/

subrblock sink ( ) ()

        symbol return=0, length=1, ptr=2, outvector=3;

duration 0;

begin
        lda     B
        add     #outvector-return
        add     [B+length]
        cmp     [B+ptr]
        jle     DONE
        ldf     [B+ptr]
        stx     [F]
        lda     [B+ptr]
        add     #1
        sta     [B+ptr]             // save ptr for next invocation
DONE:
        jmp     [B+return]
end

/*
  Copyright (c) Star Semiconductor, Inc. 1991. All Rights Reserved.
  This material may not be copied or used without prior written permission.

 * $Header: /home/solus/users4/release/CVS/cells/code/sinkrd.sdl,v 1.7 1991/10/0
 * $Revision: 1.7 $
 * $Id: sinkrd.sdl,v 1.7 1991/10/01 21:27:15 chet Exp $
 * $Log: sinkrd.sdl,v $
# Revision 1.7  1991/10/01  21:27:15  chet
# Added Revision Keyword
#
# Revision 1.6  1991/09/26  20:47:07  allsop
# Remove bogus characters after end statement.
#
# Revision 1.5  1991/09/19  13:03:08  allsop
# Changed done output to 0.0 or 1.0.
#
# Revision 1.4  1991/09/19  12:56:03  allsop
# Changed done output to 0.0 or 1.0.
#
# Revision 1.3  1991/09/16  15:17:28  allsop
# Remove micro definitions from reset and done.
#
# Revision 1.2  1991/09/11  14:32:15  chet
# Revise for reset condition >= 0.5; correct duration statement for subroutine.
#
# Revision 1.1  1991/09/05  14:26:54  allsop
# Initial revision
#

*/

/**************************************************************************
```

sinkrd.sdl

```
******************************************************************************

Function:

        sink block with reset input and done flag output

Arguments:

        in
        reset
        done

Parameters:

        length

Algorithm:

        Manage one sink vector.
        Store input value into output vector until full.
        When reset input becomes >= 0.5, reset output buffer pointer to start;
           also clear DONE output (set to 0.0).
        When output vector is full, signal by setting DONE output (set to 1.0).
        Note: done flag is written every sample, even if unchanged.
        Note: Reset input is ignored while vector is being assembled.
        If reset is held high (>= 0.5) the DONE flag is always zero.

*/

/*******************/
/*   inline code   */
/*******************/

asmblock sinkrd ( %subr=default, %length=128 ) ( in , reset ; done )

verify ( %length>0 && %length<=512 ), 'Specify length in range 1 to 512.';

variable integer ptr = outvector;
micro variable outvector[%length];

duration 12;                    // total lines of code:  18

begin
        lda     ptr             // use A register for full check
        cmp     #outvector+%length-1
        jgt     NO_STORE
        ldb     ptr             // use Base register for storage
        ldx     in              // X is a scratch register here
        stx     [B]
        add     #1
        sta     ptr
        jmp     CLR_DONE
NO_STORE:
        lda     reset
        cmp     #0.5            // reset threshold
        jlt     SET_DONE        // jump if not reset
        lda     #outvector      // set pointer to start of vector
        sta     ptr
CLR_DONE:
        lda     #0.0            // clear done flag; vector being assembled
        jmp     WRITE_DONE
SET_DONE:
        lda     #1.0            // set done flag; vector is full
WRITE_DONE:
        sta     done
DONE:
end

/*******************/
/* subroutine call */
/*******************/

callblock sinkrd ( %subr=default , %length=128 ) ( in , reset ; done )
```

```
verify ( %length>0 && %length<=512 ), 'Specify length in range 1 to 512.';

variable hex return=postamble;
variable integer length=%length;
variable integer ptr=outvector;
micro variable outvector[%length];

duration 5+13;                  // total lines of code:  5+20

begin
        ldx     in
        ldy     reset
        ldb     #return
        jmp     "sinkrd.$start"
postamble:
        sta     done
end

/********************/
/* subroutine body */
/********************/

subrblock sinkrd ( ) ()

        symbol return=0, length=1, ptr=2, outvector=3;

duration 0;

begin
        lda     B
        add     #outvector-return
        ldf     A               // temp register
        add     [B+length]
        cmp     [B+ptr]
        jgt     DO_STORE
        lda     Y               // review reset input value
        cmp     #0.5            // reset threshold
        jlt     SET_DONE        // jump if not reset
        stf     [B+ptr]         // set pointer to start of vector
        jmp     CLR_DONE
SET_DONE:
        lda     #1.0            // set done flag; vector is full
        jmp     EXIT_SUB        // exit routine from one place only
DO_STORE:
        ldf     [B+ptr]         // use F register for storage
        stx     [F]
        lda     [B+ptr]
        add     #1
        sta     [B+ptr]
CLR_DONE:
        lda     #0.0            // clear done flag; vector being assembled
EXIT_SUB:
        jmp     [B+return]
end

/*
  Copyright (c) Star Semiconductor, Inc. 1991. All Rights Reserved.
  This material may not be copied or used without prior written permission.

 * $Header: /home/solus/users4/release/CVS/cells/code/source.sdl,v 1.4 1991/10/0
 * $Revision: 1.4 $
 * $Id: source.sdl,v 1.4 1991/10/01 21:27:19 chet Exp $
 * $Log: source.sdl,v $
# Revision 1.4  1991/10/01  21:27:19  chet
# Added Revision Keyword
#
# Revision 1.3  1991/08/28  19:32:27  chet
# Replaced with msink.sdl (only difference is 'micro' declaration).
#
# Revision 1.1  1991/08/13  13:56:24  allsop
# Initial revision
#

*/

/*************************************************************************
```

source.sdl

```
******************************************************************************

Function:

        This routine reads consecutive inputs from a file (array) of specified
        length, and outputs them, one at a time.
        The array is specified as 'micro'.

Arguments:

        fixed out       -2.0 <= out < 2.0        // current output sample

Parameters:

        file            "name.dat"              // specify data file
        integer trigger
        integer rate
        integer length  0 < length <=512        // length of data RAM block

Algorithm:

        read input indirect with ptr to current address
        store input to out
        increment pointer; wrap address to beginning if necessary
        Note that the subroutine version is slightly more complication
        but performs the same function.

*/

/********************/
/*   inline code    */
/********************/

asmblock source ( %subr=default, %trigger=no_cl,  %zone="", %rate=0, %file="", %

verify ( %length>0 && %length<=512 ), 'Specify length in range 1 to 512.';
verify ( %file != "" ), 'Specify data source filename';

timezone %zone = %rate;
computeline %trigger;

variable integer ptr = invector;
micro variable invector[%length] = %file;

duration 9;

begin
        ldb     ptr
        ldx     [B]
        stx     out
        lda     ptr
        add     #1
        cmp     #invector+%length
        jlt     done
        lda     #invector
done:
        sta     ptr
end

/********************/
/* subroutine call */
/********************/

callblock source ( %subr=default, %trigger=no_cl,  %zone="", %rate=0, %file="",

verify ( %length>0 && %length<=512 ), 'Specify length in range 1 to 512.';
verify ( %file != "" ), 'Specify data source filename';

timezone %zone = %rate;
computeline %trigger;

variable hex return=postamble;
variable integer length=%length;
variable integer ptr=invector;
micro variable invector[%length] = %file;
```

```
duration 3+14;

begin
        ldb     #return
        jmp     "source.$start"
postamble:
        stx     out
end

/********************/
/* subroutine body */
/********************/

subrblock source ( ) ()

        symbol return=0, length=1, ptr=2, invector=3;

duration 0;

begin
        ldf     [B+ptr]
        ldx     [F]
        lda     B
        add     #invector-return
        ldy     A                       // temporary register
        add     [B+length]
        sub     #1
        cmp     [B+ptr]
        jle     WRAP
        lda     [B+ptr]
        add     #1
        ldy     A
WRAP:
        sty     [B+ptr]
        jmp     [B+return]
end
```

APPENDIX C

```
/* $Log: symutil.c,v $
 * Revision 1.3  1991/08/08  14:09:47  krassow
 * *** empty log message ***
 *
 * Revision 1.2  1991/08/08  13:21:09  krassow
 * *** empty log message ***
 * */
/* Utilities supporting symtran.c */
/* ++++++++++++++++++++++ */
#include <stdio.h>
#include <string.h>
#include <stdlib.h>
#include <gf.h>
#include <ibmkeys.h>
#include <standard.h>
#include "sdi_defs.h"
#include "sdi_cmds.h"
#include "symtran.h"
#include "sym_ext.h"

char symutil[] = "$Id: symutil.c,v 1.3 1991/08/08 14:09:47 krassow Exp $" ;

/* ...................... */
/* interface declarations */
/* ...................... */
char * generate_name(void);
void add_output_line(void);
void * emalloc(size_t size);

void free_list(node_type *list);
void fill_in_size(void);
```

```
void clean_exit(int code);
BOOLEAN check_for_ESC(void);
char * symrec2name(char * symbol_rec);

void show_list(node_type *list);
void close_structs(int level, BOOLEAN published);

/* error handling file interface to display module */
extern FILE *efopen(char * path, char * type);
extern int efclose(FILE *file_ptr, char * file_name) ;

/* interface to sps_util module */
extern unsigned int symrec2addr(unsigned char * symbol_rec);

/* item  = pointer to item to be inserted */
/* globals Work and Prev are updated */
void insert(node_type *item, node_type **head)
{
node_type *work;

    /* start at beginning of list */
    if (*head)
        work = *head;
    else {
        *head = item;
        return;
    }

    /* insert item at end of list */
    while (work->next) {
        work = work->next;
    }
    work->next = item;
    item->prev = work;

} /* end of insert */

char * symrec2name(char *symbol_rec)
{
char *ptr, *name_str;
int len;

        if ((ptr = strchr(symbol_rec, ' ')) != NULL) {
                len = ptr - symbol_rec;
                name_str = emalloc(len + 1);
                strncpy(name_str, symbol_rec, len);
                name_str[len] = '\0';
        }
        else
                printf("\nBad (no space) symbol.");
        return(name_str);
} /* end of symrec2name */

void add_to_list(char *symbol_rec, char *name)
{
name_list_item_type * new_item;

                /* create new item from symbol record */
                new_item = emalloc(sizeof(name_list_item_type));
                new_item->next = NULL;
                new_item->addr = symrec2addr(symbol_rec);
                if (name)
                        new_item->name = name;
                else
                        new_item->name = symrec2name(symbol_rec);

                if (List == NULL) {
                        List = new_item;
                        List_end = new_item;
```

```
            }
            else {

                /* append new item to list */
                List_end->next = new_item;

                /* update end of list */
                List_end = new_item;
            }

} /* end of add_to_list */

void show_progress(int *dot_cnt)
{
        (*dot_cnt)++;
        if (!Quiet_mode && *dot_cnt >= 8) {
                printf(".");
                *dot_cnt = 0;
        }
} /* end of show_progress */

void push_name(char *name)
{
    Name_stack[Name_stack_ix] = emalloc(strlen(name)+1);
    strcpy(Name_stack[Name_stack_ix], name);
    Name_stack_ix++;
}

char * pop_name()
{
    Name_stack_ix--;
    return(Name_stack[Name_stack_ix]);
}

/* modify Prev_hdl to insertion point */
/* return TRUE if match; traverse by sibling */

char *make_name(char *start, char *end)
{
int len;
char *name;

    len = end - start;
    name = emalloc((size_t)(len+1));
    strncpy(name, start, len);
    name[len] = '\0';
    return(name);

} /* end of make_name */

void add_dot(char *text, char **end_name)
{
    if (text != *end_name) {
        strcpy(*end_name, ".");
        *end_name++;
    }
    else
        **end_name = '\0';

} /* end of add_dot */

void close_structs(int level, BOOLEAN published)
{
int indent;
char indent_str[100];
char *name;

    while (Name_stack_ix > level) {
```

```
        /* create string containing spaces per indent level */
                strcpy(indent_str, INDENT_CHARS);
        for (indent=1; indent < Name_stack_ix; indent++)
                        strcat(indent_str, INDENT_CHARS);

        /* retrieve the current structure's name from the name stack */
        name = pop_name();

                /* don't use real name unless one or more items are published */
                if (!published)
                        name = generate_name();
        sprintf(Out_line, "\n%s) %s:", indent_str, name);

                if (!published)
                        free(name);

                add_output_line();
    }

    /* declare all top level names in asm format too */

} /* end of close_structs */

void fill_in_size()
{
node_type *this = This_list;
node_type *last = Last_list;

    /* go to end of both lines */
    while (this && this->next)
        this = this->next;
    while (last && last->next)
        last = last->next;

    /* always fill in size */
    last->info->size = this->info->addr - last->info->addr;

} /* fill in size */

BOOLEAN check_for_ESC()
{
    if (gfkbhit())
        if (getkey() == ESC)
            return(TRUE);
    return(FALSE);
}

#ifdef old

void free_node(node_type *item)
{
    free(item->info);
    free(item->name_str);
    free(item);

} /* end of free_node */
#endif

void free_list(node_type *list)
{
node_type *work, *temp;

        work = list;

        /* traverse list freeing as we go... */
        while (work) {
                temp = work->next;
                if (work->name_str)
                        free(work->name_str);
                if (work->info)
```

```
                free(work->info);
            free(work);
            work = temp;
        }

} /* end of free_list */

void free_sym_list(name_list_item_type *list)
{
name_list_item_type *work, *temp;

        work = list;

        /* traverse list freeing as we go... */
        while (work) {
                temp = work->next;
                if (work->name)
                        free(work->name);
                free(work);
                work = temp;
        }

} /* end of free_sym_list */

void * emalloc(size_t size)
{
void *ptr;

    if ((ptr = malloc(size)) == NULL) {
        printf("\nOut of memory...");
        clean_exit(-1);
    }
    else
        return(ptr);

} /* end of emalloc */

/* add the contents of Out_line to both files, handling "extern" appropriately */
void add_output_line()
{
char *ptr;

    do {

        /* place passed line in the header file, always */
        fprintf(Header_file, "%s", Out_line);

        /* also add real declarations (of static variable) to source file */

        /* skip over #defines, they go only in header file */
        if (strstr(Out_line, "#define") != NULL)
            break;

        /* don't use "extern" in source file */
        if ((ptr = strstr(Out_line, "extern ")) != NULL)
            strcpy(ptr, ptr+7);

        fprintf(Source_file, "%s", Out_line);

    } while (FALSE);

} /* end of add_output_line */

char * generate_name(void)
{
char * generated_name;

    /* allocate space for this new name */
    generated_name = emalloc(sizeof("_reserved_xxxx"));
```

```
    /* check for fatal error of running out of numbers */
    if (Generate_ix >= 9999) {
        printf("ERROR -- UTL001: Too many reserved names.");
        exit(-1);
    }

    /* procude the name */
    sprintf(generated_name, "_reserved_%04d", Generate_ix++);

        return(generated_name);

} /* end of generate_name */
/* $Log: sym_ext.c,v $
 * Revision 1.3  1991/08/08  14:09:37  krassow
 * *** empty log message ***
 *
 * Revision 1.2  1991/08/08  13:21:00  krassow
 * *** empty log message ***
 * */
/* ---------------------- */
/* global variables */
/* ---------------------- */
#include <stdio.h>
#include <stdlib.h>
#include <standard.h>
#include "sdi_defs.h"
#include "sdi_cmds.h"
#include "symtran.h"
#include "sym_ext.h"

char symext[] = "$Id: sym_ext.c,v 1.3 1991/08/08 14:09:37 krassow Exp $";
unsigned int Line = 0;
name_list_item_type * List;
name_list_item_type * List_end;
char *Name_stack[50];
int Name_stack_ix;
FILE *Source_file, *Symbol_file, *Header_file;
char Symbol_file_name[MAX_PATH_LEN];
char Source_file_name[MAX_PATH_LEN];
char Header_file_name[MAX_PATH_LEN];
char Source_file_base[MAX_PATH_LEN];
BOOLEAN Quiet_mode;
BOOLEAN All_symbols;
char Version[100];
char User_include[MAX_PATH_LEN];
char *Out_buf;
char Out_line[100];
char *Out;
unsigned int Generate_ix;

node_type *Last_list, *This_list;
BOOLEAN Published;

/* $Log: sym_ext.h,v $
 * Revision 1.3  1991/08/08  14:09:39  krassow
 * *** empty log message ***
 *
 * Revision 1.2  1991/08/08  13:21:02  krassow
 * *** empty log message ***
 * */
/* $Id: sym_ext.h,v 1.3 1991/08/08 14:09:39 krassow Exp $ */
/* ---------------------- */
/* global variables */
/* ---------------------- */

extern unsigned int Line;
extern name_list_item_type * List;
extern name_list_item_type * List_end;
```

```
extern char *Name_stack[50];
extern int Name_stack_ix;
extern FILE *Source_file, *Symbol_file, *Header_file;
extern char Symbol_file_name[MAX_PATH_LEN];
extern char Source_file_name[MAX_PATH_LEN];
extern char Header_file_name[MAX_PATH_LEN];
extern char Source_file_base[MAX_PATH_LEN];
extern BOOLEAN Quiet_mode;
extern BOOLEAN All_symbols;
extern char Version[];
extern char User_include[MAX_PATH_LEN];
extern char *Out_buf;
extern char Out_line[100];
extern char *Out;
extern unsigned int Generate_ix;

extern node_type *Last_list, *This_list;
extern BOOLEAN Published;

/* $Header: /home/solus/users4/release/CVS/link1/symtran/symtran.c,v 1.5 1991/09/15 21:08:47 krassow Exp $ */
/* $Log: symtran.c,v $
 * Revision 1.5  1991/09/15  21:08:47  krassow
 * *** empty log message ***
 *
 * Revision 1.4  1991/08/08  14:09:41  krassow
 * *** empty log message ***
 *
 * Revision 1.3  1991/08/08  13:21:04  krassow
 * *** empty log message ***
 *
 * Revision 1.2  1991/07/31  23:37:40  krassow
 * *** empty log message ***
 *
 * Revision 1.1  1991/07/16  13:43:09  krassow
 * Initial revision
 * */
/* Converts $Compile Symbol table to files design.c and design.h           */
/* The only symbols translated are tagged as "micro" symbols,              */
/*   unless the "all" switch is used (for debugging).                      */
/* Each symbol gets a variable (of type sproc_datum) mapped into a         */
/*    structure so that heirarchial names (with dots) can be used.         */
/*    It is assumed that the .c file can be located at the SPROC's address */
/*    by a linker/locater, so no assembly file need be generated.          */
/* ++++++++++++++++++++++ */
#include <stdio.h>
#include <string.h>
#include <ctype.h>
#include <stdlib.h>
#include <standard.h>
#include <fields.h>
#include <sys\types.h>
#include <sys\stat.h>
#include "sdi_defs.h"
#include "sdi_cmds.h"
#include "symtran.h"
#include "sym_ext.h"

char symtran[] = "$Id: symtran.c,v 1.5 1991/09/15 21:08:47 krassow Exp $";

/* ---------------------- */
/* interface declarations */
/* ---------------------- */

/* interface to Terry's command line module */
extern int cmdline(int argc, char *arcv[], int n_sw, char sw[], int(* sw_fun[])(), char *bad_sw );
extern void get_filenames(int argc, char* argv[], int max_files, int* n_files_ptr, char* files[]);
extern int do_switches(int argc, char *arcv[], int n_sw, char sw[], int (*sw_fun[])(), char *bad_sw );

void free_list(node_type *list);
```

```
void fill_in_size(void);
void clean_exit(int code);
extern BOOLEAN check_for_ESC(void);
int add_data_sym(unsigned int sym_addr, char *symbol);
int add_pattern_sym(sproc_datum pattern, char *symbol);
unsigned char aschex2char(unsigned char * high_byte);
void * emalloc(size_t size);
void symrec_to_struct_entry(char * symbol_rec);
void symrec_to_define(char * symbol_rec);
void write_out_buf(void);

extern void add_output_line(void);
char interface2char(BOOLEAN interface);

/* interface to sym_util module */
extern char * generate_name(void);
extern void show_progress(int *cnt);
extern char *make_name(char *start, char *end);
extern void insert(node_type *item, node_type **head);
extern void push_name(char *name);
extern char * pop_name(void);
extern void add_to_list(char *symbol_rec, char *name);
extern void free_sym_list(name_list_item_type *list);

/* interface to AndyLib */
extern void build_str(char *str, char c, int cnt);

/* sps_util interface */
extern BOOLEAN symrec2interface(unsigned char * symbol_rec);
extern unsigned int symrec2addr(unsigned char * symbol_rec);
extern sproc_datum symrec2flag(unsigned char * symbol_rec);
extern unsigned int symrec2cnt(unsigned char * symbol_rec);
extern unsigned int symrec2zone(unsigned char * symbol_rec);
extern int symrec2fmt(unsigned char * symbol_rec);
extern unsigned long symrec2pattern( unsigned char * symbol_rec);
unsigned long chars2long(char *field);

void show_list(node_type *list);
extern void close_structs(int level, BOOLEAN published);

/* error handling file interface to display module */
extern FILE *efopen(char * path, char * type);
extern int efclose(FILE *file_ptr, char * file_name) ;

void display_banner(char *version);
int set_all_symbols(void);
int set_quiet(void);
int show_usage_and_exit(void);
int set_user_include(char *new_ext);

int process_records(void);

char Sw_str[] = "ahqU" ;
int main(int argc, char* argv[])
{
#define NUM_SWITCHES (sizeof(Sw_str)-1)
int (*func[NUM_SWITCHES]) () ;
char sw_status;
char * files[2];
char cmd_line_file_name[MAX_PATH_LEN];
int n_files = 2;

/* #define loopTest 1 */

#ifdef loopTest
int test;
#endif
```

```
#ifdef loopTest
for (test=0; test<1000; test++) {
#endif

memset(Name_stack, '\0', sizeof(Name_stack));

strcpy(Version, "$Revision: 1.5 $");

/* identify version */
display_banner(Version);

/* note that order in function array must match switch string below */
    func[0] = set_all_symbols;
    func[1] = show_usage_and_exit;
    func[2] = set_quiet;
    func[3] = set_user_include;

/* pay attention to command line switches, if present */
if (do_switches(argc, argv, NUM_SWITCHES, Sw_str, func, &sw_status)) {
    printf("\nERROR -- SYM004: Unknown switch %c", sw_status);
    show_usage_and_exit();
}

    /* get file names, but just check for one */
    /* must allow for 2 filenames to trap missing "-" on switches */
    files[0] = files[1] = cmd_line_file_name;
    get_filenames(argc, argv, 2, &n_files, files);

/* force zero or one filenames on command line */
switch (n_files) {
    case 0 :
        printf("\nERROR -- SYM001: File name must be specified on command line.");
        show_usage_and_exit();
        break;

    case 1 :
        /* enforce proper base name syntax */
        /* disallow embedded dots, non-alpha lead chars */
        if ( (strchr(files[0], '.'))
                    ||   (strlen(files[0]) > 8)
        ||   ( (!isalpha(files[0][0]) && strchr("_$", files[0][0]) != NULL) ) ) {
            printf("\nERROR -- SYM002: Invalid file base name parameter '%s'.", files[0]);
            show_usage_and_exit();
        }
        else {
            /* base name is OK, use it */
            strcpy(Source_file_base, files[0]);
        }
        break;

    default:
                printf("\nERROR -- SYM003: Unknown parameter >%s< (use '-' to precede switch).", files[1]);
        show_usage_and_exit();
        break;
}

/* pay attention to command line switches, if present */
if (do_switches(argc, argv, NUM_SWITCHES, Sw_str, func, &sw_status)) {
    printf("\nERROR -- SYM004: Unknown switch %c", sw_status);
    show_usage_and_exit();
}

/* create output file names */

/* use this base name */
strcpy(Symbol_file_name, Source_file_base);
strcpy(Source_file_name, Source_file_base);
strcpy(Header_file_name, Source_file_base);
```

```
/* apply extensions */
strcat(Symbol_file_name, ".sps");
strcat(Source_file_name, ".c");
strcat(Header_file_name, ".h");

if ((Symbol_file = efopen(Symbol_file_name, "r")) == 0)
    clean_exit(-1);

/* open these for write */
if ((Source_file = efopen(Source_file_name, "w")) == 0)
    clean_exit(-1);

if ((Header_file = efopen(Header_file_name, "w")) == 0)
    clean_exit(-1);

    /* log the creation process */
    strcpy(Out_line, "/* Generated by symtran.exe $Revision: 1.5 $ */\n");
    add_output_line();

    /* make reference to our header file */
    strcpy(Out_line, "#include \"sprocdef.h\"\n");
    add_output_line();

    /* make reference to user's include file, if specified */
    if (strlen(User_include)) {
            strcpy(Out_line, "#include \"");
            strcat(Out_line, User_include);
            strcat(Out_line, "\"\n");
            add_output_line();
    }

    /*-------------------------------------------------------------*/
    /* Emit the code and control declarations */
    /* Then emit the data space structure */
    /* wrap the whole thing in a structure declaration to force ordering */

    /* first, the code and control declares */
sprintf(Out_line,"\n%sextern sproc_code_space_type    %s_code;", INDENT_CHARS, Source_file_base);
add_output_line();
sprintf(Out_line,"\n%sextern sproc_control_space_type %s_control;", INDENT_CHARS, Source_file_base);
add_output_line();

    /* now do the data space */
    strcpy(Out_line, "\nextern before_volatile struct {");
add_output_line();

/* process the records in the symbol file */
    process_records();

    efclose(Symbol_file, Symbol_file_name);
efclose(Source_file, Source_file_name);
efclose(Header_file, Header_file_name);

printf("\nFinished creating '%s' and '%s'.\n",
    Source_file_name, Header_file_name);
    clean_exit(0);

#ifdef loopTest
} /* end of test */
#endif

    return(0);

} /* end of main */

/* ------------------------------------------------------------------*/
/* Read the storage section to build structure tree */
```

```
/* Use the the micro tag to determine which items to make public */
/* -------------------------------------------------------------- */
int process_records()
{
/* Give useful names to sections of the .SPS file. */
/* These sections are separated by a blank line. */
typedef enum { STORAGE_SECTION, IO_SECTION, LABELS_SECTION,
      ORDINARY_SECTION, TIMEZONE_SECTION } section_type;
char symbol_rec[MAX_SYM_REC_SIZE];
int dot_cnt = 0, data_sym_cnt = 0, pattern_sym_cnt = 0;
section_type section = STORAGE_SECTION;
BOOLEAN done_io_once = FALSE;
unsigned int addr;
BOOLEAN done_with_file = FALSE;

   This_list = Last_list = NULL;

      /* process until end of symbol file */
   while (!done_with_file) {

      /* let user bail out */
      if (check_for_ESC()) {
         printf("\nWARNING -- SYM005: Terminating symbol conversion per user request... ");
         break;
      }

            if ((fgets(symbol_rec, sizeof(symbol_rec), Symbol_file)) == NULL) {
         if (feof(Symbol_file))
            break;
         else {
            printf("\nERROR -- SYM006: Problem reading input file, line %d.",
               Line);
                  break;
         }
            }
            Line++;

      if (section == LABELS_SECTION)
         done_io_once = FALSE;

      /* empty lines (consecutive lf's) indicate section change */
            if (strcmp(symbol_rec, "\n") == 0) {

         /* move on to next section */
         /* section ++; The form below removes the implicit conversion. */
         /* section = (section_type) (((int)(section))++); */
         section = (section_type) (((int)(section)) + 1);
                  continue;
      }

            /* not in our section yet, keep looking */
      switch (section) {
         /* case LABELS_SECTION : */

         case STORAGE_SECTION :
                        /* only bother with data space symbols */
                        addr = symrec2addr(symbol_rec);
/*             if (IS_DATA_ADDR(addr) || IS_CONTROL_ADDR(addr)) */
            if (IS_DATA_ADDR(addr))
               symrec_to_struct_entry(symbol_rec);
                        show_progress(&dot_cnt);
                        break;

                  case IO_SECTION :

            if (!done_io_once) {
                              /* close any pending structures */
                              close_structs(0, Published);
```

```
                /* close top level structure */
        sprintf(Out_line, "\n} after_volatile %s;\n\n", Source_file_base);
                add_output_line();

        done_io_once = TRUE;
                }

                break;

    case ORDINARY_SECTION :

        /* convert these symbols into #defines */

                /* skip the ones beginning with _ */
                if (symbol_rec[0] != '_') {
            symrec_to_define(symbol_rec);
                }
        show_progress(&dot_cnt);
        break;

            case TIMEZONE_SECTION :
        done_with_file = TRUE;
        break;

    default : /* other sections have no special significance for us */
        ;
        break;
    }
  }

  return(0);

} /* end of process records */

/* modify Prev_hdl to insertion point */
/* return TRUE if match; traverse by sibling */

void make_valid_c_name(char *name, char sub_list[])
{
char *swap_char;
size_t i;

    /* substutite source char with dest char for every pair in the sub_list */
    for (i = 0; i < strlen(sub_list); i+=2)
        while ((swap_char = strchr(name, sub_list[i])) != NULL)
            *swap_char = sub_list[i+1];

} /* end of make_valid_c_name */

/* parse name into series of dot-delimited names, handle each name in turn */
/* All but the last name are nodes */
void parse_a_line(char * symbol_rec)
{
char *start_ptr, *end_ptr, *name;
node_type *item;

    This_list = NULL;

    /* remove non-C chars from name */
    make_valid_c_name(symbol_rec, "%P&A");

    /* start off with both pointers at beginning */
    start_ptr = end_ptr = symbol_rec;

    /* process the whole line */
    while (start_ptr != NULL) {

        /* find next dot, if any */
        if ((end_ptr = strchr(start_ptr, '.')) != NULL) {
```

```
            /* construct name */
            name = make_name(start_ptr, end_ptr);

            /* point past this dot for next item */
            start_ptr = end_ptr + 1;

            /* create and fill in new node structure */
            /* item = create_node(name); */
            item = emalloc(sizeof(node_type));
            item->name_str = name;
            item->info = NULL;
            item->next = NULL;
            item->prev = NULL;

            insert(item, &This_list);
        }
        else {
            /* no more dots, space signifies end of this name (leaf) */
            end_ptr = strchr(start_ptr, ' ');

            /* construct name */
            name = make_name(start_ptr, end_ptr);

            /* fill in node structure */
            /* item_ptr = create_node(name); */
            item = emalloc(sizeof(node_type));
            item->name_str = name;
            item->next = NULL;
            item->prev = NULL;

            /* fill in other leaf data here */
            item->info = emalloc(sizeof(leaf_type));
            item->info->addr      = symrec2addr(symbol_rec);
            item->info->zone      = symrec2zone(symbol_rec);
            item->info->interface = symrec2interface(symbol_rec);

            insert(item, &This_list);

            break; /* all done with this record */

        }
    } /* end of parsing the line */
} /* end of parse_a_line */

char interface2char(BOOLEAN interface)
{
        return( (char)((interface) ? 'm' : ' ') ) ;

} /* end of interface2char */

/* create a #define for the symbol passed */
void symrec_to_define(char * symbol_rec)
{
char define_name[50];
int len;
enum { NO_SPACE, TOO_LONG, ALL_OK } status = ALL_OK;
char * ptr;
char base_name[9];
char spaces[51];
unsigned long value;
BOOLEAN once = FALSE;

    do {

        if ( (ptr = strchr(symbol_rec, ' ')) != NULL) {
            len = ptr - symbol_rec;
            if (len < sizeof(define_name)) {
                strncpy(define_name, symbol_rec, len); define_name[len] = '\0';
```

```
            }
            else {
                status = TOO_LONG;
                break;
            }
        }
        else {
            status = NO_SPACE;
            break;
        }

        /* don't allow illegal chars in define id */
        make_valid_c_name(define_name, "%P&A.D");

        /* grab the value for the define */
        value = symrec2pattern(symbol_rec);

        /* convert file base name to all upper case to compose define name */
            strcpy(base_name, Source_file_base);
            strupr(base_name);

            /* align value at column 50 */
            len = 50 - 8 - strlen(define_name) ;
            build_str(spaces, ' ', len);

        sprintf(Out_line, "#define %s_%s%s0x%06lX\n",
            base_name, define_name, spaces, value);
        add_output_line();

    } while (once);

} /* end of symrec_to_define */

void symrec_to_struct_entry(char * symbol_rec)
{
node_type *this;
node_type *last;
int level = 0;
char indent_str[100];
BOOLEAN leaf;
BOOLEAN diff_struct;
char temp_string[100];
int space_count;
char *generated_name;

        /* establish initial indentation */
        strcpy(indent_str, INDENT_CHARS);

        parse_a_line(symbol_rec);

    /* bail here for first line */
    if (Last_list == NULL) {
        Last_list = This_list;
        return;
    }

    fill_in_size();

    for (this = This_list, last = Last_list;    /* initialization */
         last != NULL;                          /* iteration test */
         last = last->next, level++,              /* adjustment */
             strcat(indent_str, INDENT_CHARS)) {

            /* this flag is TRUE when a structure change is required */
        diff_struct =
            (strcmp(Name_stack[level], last->name_str) == 0) ? FALSE
                                                              : TRUE;

        /* item is a leaf iff it is the end of the chain */
        leaf = (last->next == NULL) ? TRUE : FALSE;
```

```
    /* if next item exists and new (different) structure */
    /*   add a structure declaration */
    if (!leaf && diff_struct) {

        /* different name must bubble up structure terminator */
        close_structs(level, Published);

                /* begin new structure, so assume not published */
                Published = FALSE;

        sprintf(Out_line,"\n%sstruct {", indent_str);
                add_output_line();

                /* All components of a name are treated as public */
                /*  so that if one or more is, the name exists */
                push_name(last->name_str);
        continue;
    }

    /* if leaf node, emit structure element */
    if (leaf) {

                /* always start with 60 spaces */
                space_count = 60;

        /* output front part of declaration */
                strcpy(Out_line, "\n");
                add_output_line();
                space_count -= strlen(Out_line);

                /* Publish the real name if :            */
                /*    the publish_all switch is set      */
                /*    a top level non-system signal (wire)    */
                /*    the symbol is tagged as micro      */
                if ( (All_symbols)
                ||   (last->info->interface)
                ||   ( (level == 0) && (last->name_str[0] != '_') )
                   ) {
                        space_count -= sprintf(Out_line, "%sdata %s", indent_str, last->name_str);
                        add_to_list(symbol_rec, NULL);
                        Published = TRUE;
                }
                /* otherwise, use a filler in the structure (placeholder) */
        else {
                        generated_name = generate_name();
                        space_count -= sprintf(Out_line, "%sdata %s",
                                                        indent_str, generated_name);
                        add_to_list(symbol_rec, generated_name);
        }
                add_output_line();

        /* declare arrays as such */
        if (last->info->size > 1)
                        space_count -= sprintf(Out_line, "[%u]", last->info->size);
        else
                        strcpy(Out_line, "");
                add_output_line();

                /* build a spacing line to line up address comment */
                memset(temp_string, ' ', space_count); temp_string[space_count] = '\0';

                sprintf(Out_line, ";%s /* %04x %c */",
                        temp_string, last->info->addr, interface2char(last->info->interface));
                add_output_line();
    }

} /* end while not end of list */

/* latch line for next iteration */
free_list(Last_list);
```

```
    Last_list = This_list;
    This_list = NULL;

        return;

} /* end of symrec_to_struct_entry */

int show_usage_and_exit()
{
    /* HELP message */
        printf ("\nUsage: SymTran file [-A] [-Q] [-Ufilename]");
    printf ("\n");
        printf ("\n     -A specifies translate All symbols (for debugging only)");
        printf ("\n");
        printf ("\n     -Q indicates Quiet mode (limited screen output)");
    printf ("\n");
        printf ("\n     -U specifies an #include directive filename");
        printf ("\n");
        printf ("\nTwo output files are created named 'basefile.c' and 'basefile.h'.");
    printf ("\n");
    clean_exit(-5);
    return(0);

} /* end of show_usage_and_exit */

void display_banner(char *version)
{
    /* identify self */
    printf("\nSymTran - SPROC Symbol Translator");
    printf("     %s", version);
    printf("\nCopyright (C) 1991 by STAR Semiconductor Corporation.");
    printf(" all rights reserved.\n");
}

int set_all_symbols(void)
{
    All_symbols = TRUE;
    return(0);
} /* end of set_all_symbols */

int set_user_include(char *str)
{
int ret_val;

        if (strlen(str) < sizeof(User_include)+1) {
                strcpy(User_include, str);
                ret_val = 0;
        }
        else {
                printf("\nERROR -- SYM007: Bad user include file name.");
                ret_val = -1;
        }
        return(ret_val);
} /* end of set_user_include */

int set_quiet()
{
    Quiet_mode = TRUE;
    return(0);
}
void clean_exit(int code)
{
int i;

    /* free the tree and exit */
        free_list(This_list); This_list = NULL;
        free_list(Last_list); Last_list = NULL;
    for (i=0; i<(sizeof(Name_stack) / sizeof(Name_stack[0])); i++) {
```

```
        if (Name_stack[i])
            free(Name_stack[i]);
        else
            break;
    }
        free(Out_buf);
        free_sym_list(List); List = NULL; List_end = NULL;

#ifndef loopTest
        exit(code);
#endif

} /* end of clean_exit */

#include <stdio.h>
#include <string.h>
#include <ctype.h>
#include <stdlib.h>
#include <standard.h>
#include "sdi_defs.h"
#include "sdi_cmds.h"
#include "symtran.h"

char sps_util[] = "$Id: sps_util.c,v 1.3 1991/08/08 14:09:34 krassow Exp $";

unsigned long chars2long(char *field);
int chars2int(char *field);
unsigned char aschex2char(uchar_ptr high_byte);
void copy_3long_to_sdata (sproc_datum *dest, unsigned long *src);

/* fields of signal records */
#define SIGNAL_SYM_COL      0
#define ADDR_SYM_COL       51
#define PATTERN_SYM_COL    51
#define ZONE_SYM_COL       57
#define FORMAT_SYM_COL     63
#define INTERFACE_SYM_COL 66

/* fields of zone records */
#define ZONE_ID_SYM_COL      0
#define ZONE_NAME_SYM_COL    6
#define DECIM_CNT_SYM_COL  59
#define WAIT_FLAG_SYM_COL  65
#define BUF_LEN_SYM_COL    73

BOOLEAN is_address_rec( unsigned char * symbol_rec)
{
unsigned char temp_str[7+2];
BOOLEAN address_flag = FALSE;
int i;

        /* pick out 7 chars from record */
    strncpy(temp_str, &symbol_rec[ADDR_SYM_COL], 7);

        /* null terminate this string */
        temp_str[8] = '\0';

        do {

                /* if a space or line feed is encountered, it is an address record */
                for (i=0; i<5; i++)
                        if ( (temp_str[i] == ' ')
                        ||   (temp_str[i] == '\n')
                        ||   (temp_str[i] == '\r') ) {
                                address_flag = TRUE;
                                break;
                        }
                if (address_flag)
                        break;
```

```
            /* also an address if 8 char field flagged with 'h'  */
#ifdef old_code
/* if h supplied, must convert to address as last 4 digits of 8 char field */
/* Not done, since any hex variable may not be an address. */
        if (symrec2fmt(symbol_rec) == HEX_mode)
                        address_flag = TRUE;

#endif

        } while (FALSE);

        return(address_flag);

} /* end of is_address_rec */

unsigned long symrec2cnt( unsigned char * symbol_rec)
{
unsigned long ret_val;

    ret_val = chars2long(&symbol_rec[DECIM_CNT_SYM_COL]);
        return(ret_val);

} /* end of symrec2cnt */

unsigned int symrec2zone( unsigned char * symbol_rec)
{
int ret_val;

        /* special case of spaces for zone field means can't probe signal */
        if (strncmp(&symbol_rec[ZONE_SYM_COL], "    ", 4) == 0)
                ret_val = CANT_PROBE_ZONE;
    else
                ret_val = chars2int(&symbol_rec[ZONE_SYM_COL]);
        return(ret_val);

} /* end of symrec2zone */

BOOLEAN symrec2interface( unsigned char * symbol_rec)
{
BOOLEAN ret_val;

        /* special case of spaces for zone field means can't probe signal */
    if (symbol_rec[INTERFACE_SYM_COL] != ' ')
        ret_val = TRUE;
    else
        ret_val = FALSE;
        return(ret_val);

} /* end of symrec2interface */

sproc_datum symrec2flag( unsigned char * symbol_rec)
{
sproc_datum temp_sdata;
unsigned long temp_long;

    temp_long = chars2long(&symbol_rec[WAIT_FLAG_SYM_COL]);
    copy_3long_to_sdata(&temp_sdata, &temp_long);
        return(temp_sdata);

} /* end of symrec2flag */

long symrec2pattern( unsigned char * symbol_rec)
{
sproc_datum temp_sdata;
unsigned long temp_long;

    temp_long = chars2long(&symbol_rec[PATTERN_SYM_COL]);
    return(temp_long);
```

```
} /* end of symrec2pattern */

int symrec2fmt(unsigned char * symbol_rec)
{
int ret_val;

        /* pick out char */
        ret_val = symbol_rec[FORMAT_SYM_COL];

        /* accept i or f, default to u for undefined */
        switch (ret_val) {
                case 'i' : ret_val = INT_mode; break;
                case 'f' : ret_val = FP_mode;  break;
                case 'h' : ret_val = HEX_mode; break;
                default  : ret_val = UN_mode;  break;
        }

        return(ret_val);

} /* end of symrec2fmt */

unsigned int symrec2addr(unsigned char * symbol_rec)
{
unsigned int ret_val;

    ret_val = chars2int(&symbol_rec[ADDR_SYM_COL]);
    return(ret_val);

} /* end of symrec2addr */

unsigned long chars2long(char *field)
{
unsigned long ret_val;
char temp_str[7];
int i;
unsigned char byte[3];

    /* pick out chars of field */
    strncpy(temp_str, field, 6);

        /* make null terminated string for conversion */
        temp_str[6] = '\0';

        /* convert to value */
    for (i=0; i<3; i++)
                byte[i] = aschex2char(&temp_str[i*2]);

        /* convert to value */
    ret_val = (((unsigned long)byte[0]) << 16)
            + (((unsigned long)byte[1]) <<  8)
            +                   (byte[2]);

    return(ret_val);
} /* end of chars2long */
int chars2int(char *field)
{
int ret_val;
char temp_str[5];
int i;
unsigned char byte[2];

    /* pick out chars of field */
    strncpy(temp_str, field, 4);

        /* make null terminated string for conversion */
    temp_str[4] = '\0';

        /* convert to value */
```

```
    for (i=0; i<2; i++)
                byte[i] = aschex2char(&temp_str[i*2]);

        /* convert to value */
    /* must cast to unsigned int to stop sign propagation */
    ret_val = (((unsigned int)byte[0]) << 8)
          + (((unsigned int)byte[1])     );

    return(ret_val);
} /* end of chars2int */


unsigned char aschex2char(uchar_ptr high_byte)
{
int i;
unsigned char c, val = (unsigned char) 0;

    /* convert 2 successive ascii bytes into a hex value */
        for (i=1; i<=2; i++) {

        val = (unsigned char) (val << (unsigned char) 4);

                /* allow for space led fields */
                if (*high_byte == ' ')
                        c = '0';
                else
                        c = (unsigned char) toupper(*high_byte);
                if (c < 'A')
                        val += c - '0';
                else
                        val += c - 'A' + 10;
                high_byte++;
        }
        return(val);

} /* end of aschex2char */

void copy_3long_to_sdata (sproc_datum * dest, unsigned long * src)
{
        dest->hi  = (unsigned char) ((*src & 0x00FF0000) >> 16);
        dest->mid = (unsigned char) ((*src & 0x0000FF00) >>  8);
        dest->lo  = (unsigned char) (*src & 0x000000FF) ;
} /* end of copy_3long_to_sdata */

/* $Log: symtran.h,v $
 * Revision 1.4  1991/08/08  14:09:45  krassow
 * *** empty log message ***
 *
 * Revision 1.3  1991/08/08  13:21:07  krassow
 * *** empty log message ***
 *
 * Revision 1.2  1991/07/31  23:37:42  krassow
 * *** empty log message ***
 * */
/* $Id: symtran.h,v 1.4 1991/08/08 14:09:45 krassow Exp $ */
#define MAX_PATH_LEN 250
#define MAX_SYM_LEN 50
#define MAX_SYM_SIZE 51
#define MAX_SYM_REC_SIZE 100

#define INDENT_CHARS "    "

typedef struct leaf_type_struct {
    unsigned int addr;      /* wire's (parameter's) address */
    unsigned int zone;      /* timezone parameter */
    BOOLEAN  interface;     /* TRUE = interface wire */
    unsigned int size;      /* default = 1 sproc datum */
} leaf_type;
```

```
typedef struct node_type_struct {
    char   * name_str;
    struct node_type_struct * next;
    struct node_type_struct * prev;
    struct leaf_type_struct * info;
} node_type;

typedef struct name_item_struct {
    struct name_item_struct * next;
    char *                    name;
    unsigned int              addr;
} name_list_item_type;

$Log: efprintf.c,v $
Revision 1.1  1991/07/10  00:05:33  krassov
Initial revision
*/
nclude <stdio.h>
nclude <stdlib.h>
nclude <stdarg.h>

ar efprintf_id[] = "$Id: efprintf.c,v 1.1 1991/07/10 00:05:33 krassov Exp $";

t efprintf( FILE *stream, char *format, ... )

_list args;
t ret_val;

      /* initialize the variable list pointer to point to first element */
  va_start(args, format);
      ret_val = vfprintf(stream, format, args);
      if (ret_val < 0) {
              fprintf(stderr,
      "\nERROR -- EFP001: File output error - do you have any disk space left?");
              exit(-1);
      }

  va_end(args);
  return(ret_val);
```

APPENDIX D

```
/* $Log: makeload.c,v $
 * Revision 1.15  1991/09/15  20:27:05  krassov
 * Finally changed Id to Revision for generated comment.
 *
 * Revision 1.14  1991/09/15  20:25:15  krassov
 * Changed Header to Id for generated comment.
 *
 * Revision 1.13  1991/09/15  20:23:46  krassov
 * Added before_const, after_const and generation comment.
 *
 * Revision 1.12  1991/09/12  20:42:09  krassov
 * Changed from _load to _block.
 *
 * Revision 1.11  1991/07/31  23:32:56  krassov
 * Fixed SMI file 0x, bug
 *
 * Revision 1.10  1991/07/19  19:15:45  krassov
 * *** empty log message ***
 *
 * Revision 1.9  1991/07/18  20:18:24  krassov
 * makefile now installs to inhouse
 * makeload uses all uppercase in output files
 *
```

```
* Revision 1.8  1991/07/18  18:51:04  krassov
* correct scheme for master sproc boot blocks.
* */
/* 05/21/91 ajk 1.12 Don't use bold characters in help message.        */
/*                   Use all uppercase hex chars for generated output.  */
/*                   (Note that spp files contain lowercase!            */
/* 02/21/91 ajk 1.10 Don't write to trigger addresses in data ram (800-813) */
/*-----------------------------------------------------------------*/
/* Converts SCompile output to LOAD FILE (Motorola S1) format */
/*   converts to Master SPROC Prom format (-P) */
/*   creates to SPROC boot format (-S) for SMI */
/*   creates CODE, CONTROL and DATA files if asked (-E) */
/*   surpresses records of all zero data if asked (-Z) */
/*   surpresses status display (-Q) */
#include <stdio.h>
#include <string.h>
#include <stdlib.h>
#include "ctype.h"
#include "standard.h"
#include "makeload.h"

char makeload[] = "$Id: makeload.c,v 1.15 1991/09/15 20:27:05 krassov Exp $" ;

/* ---------------------- */
/* interface declarations */
/* ---------------------- */
extern int do_switches(int argc, char *arcv[], int n_sw, char sw[], int (*sw_fun[])(), char *bad_sw );
extern void get_filenames(int argc, char* argv[], int max_files, int* n_files_ptr, char* files[]);

void make_blk_str(char *buf, int size, int addr);
char * read_file(char * in_buf, int bytes_to_read, FILE *file, int* len);
void init_output_buffers(void);
void advance_to_next(char ** work_ptr);
void make_rom_header(char *buf, int size, int addr, BOOLEAN last_flag);
void write_bufs_to_file(void);
void show_progress(void);
void create_output_extension(char *ext_str);
void create_checksum(char *cptr, char *buf);
int create_header(char *hptr);
char *emalloc(int size);
int efread(char *ptr, unsigned size, unsigned count, FILE *data_file);
int eread(int data_file, char *ptr, unsigned size);
int efprintf( FILE *stream, char *format, ... );
void display_banner(char *version);
BOOLEAN make_a_record(char **in_buf_ptr, char * end_ptr);
BOOLEAN make_records(char *in_buf, int in_buf_len);
void apply_default_extension(char *fname, char *ext);
char check_files(void);
extern FILE *efopen(char *path, char *type);
extern int efclose(FILE *file_ptr, char *file_name);

int set_file_names(char *str);
int set_extra_files(char *str);
int set_quiet(char *str);
int show_usage_and_exit(void);
int set_Boot_ROM_mode(char *str);
int make_SMI_file(char *str);
int set_zero_surpression(char *str);
void add_fill_byte (char *record);
void byte2ascii(unsigned char *str, unsigned char data_byte);
void correct_blocking_info (int len, int buf_row, int start_address);

/* ---------------------- */
/* global variables */
/* ---------------------- */
enum { BOOT_ROM, S1_FILE } Mode = S1_FILE;

/* starting locations with respect to this program */
```

```
#define CODE_START_ADDRESS    0x0
#define CONTROL_BASE_ADDRESS  0x400
#define CONTROL_START_ADDRESS 0x410
#define DATA_BASE_ADDRESS     0x800
#define DATA_START_ADDRESS    0x814
#define CONTROL_LENGTH        0xF0

#define ROW_SIZE ( (SPROC_TOTAL_SDATA / SDATA_PER_SREC) + 2 )
/* allow for start and end records ----------------^ */
#define COL_SIZE_SMI ((SDATA_PER_SREC*(2 +4 + CHARS_IN_SDATA)) + 2 )
/* fill byte----------------------------| |                       | */
/* comma, space, 0x separator-------------+                       | */
/* newline plus null ---------------------------------------------+ */
#define COL_SIZE_S1 ((SDATA_PER_SREC * (CHARS_IN_SDATA + 2)) + SREC_OH +2)
/* fill byte--------------------------------------------| */
har Out_buf_S1[ROW_SIZE][COL_SIZE_S1] = { '\0'} ;
har Out_buf_SMI[ROW_SIZE][COL_SIZE_SMI] = { '\0'} ;
nt Row_S1 = 0, Row_SMI = 0;
nsigned int Sproc_address;
nsigned int PROM_address;
OOLEAN Make_SMI_file = FALSE;
ILE *Out_file_S1, *Out_file_SMI;
ILE *Data_out_file, *Code_out_file, *Control_out_file;
OOLEAN Make_extra_files = FALSE;
OOLEAN Zero_surpress = FALSE;
har Code_file_name[FILE_NAME_LENGTH];
har Data_file_name[FILE_NAME_LENGTH];
har Design_name[FILE_NAME_LENGTH];
har Out_file_S1_name[FILE_NAME_LENGTH];
har Out_file_SMI_name[FILE_NAME_LENGTH];
OOLEAN Quiet_mode = FALSE;

har Version[] = { "$Revision: 1.15 $" } ;

#define START_RECORD "S0030000FC\n"

/* ---------------------- */
/* code section */
/* ---------------------- */
har cmd_sw_str[] = "ehPqSz";

int main(int argc, char* argv[])
{
ILE *code_file, *data_file;
har out_code_file_name[FILE_NAME_LENGTH];
har out_control_file_name[FILE_NAME_LENGTH];
har out_data_file_name[FILE_NAME_LENGTH];
int recs;
har ext_str[5];
int bytes_to_read;
int code_info_row_S1, control_info_row_S1, data_info_row_S1;
int code_info_row_SMI, control_info_row_SMI, data_info_row_SMI;
int last_code_addr, last_control_addr, last_data_addr;

/* command line overhead */
#define NUM_SWITCHES (sizeof(cmd_sw_str) - 1)
int (*func[NUM_SWITCHES]) () ;
har status;
har * files[2]; /* allow for error handling of multiple file entry */
har cmd_line_file_name[FILE_NAME_LENGTH];
int n_files;

har *work_ptr;
har *in_buf;
int in_buf_len;
har record[100];

        /* always tell who we are */
        display_banner(Version);
```

```
    /* initialize output buffers */
    init_output_buffers();

    /* set up functions activated by command line switches */
  func[0] = set_extra_files;
  func[1] = show_usage_and_exit;
  func[2] = set_Boot_ROM_mode;
  func[3] = set_quiet;
  func[4] = make_SMI_file; /* for SMI support */
  func[5] = set_zero_surpression;

    /* pay attention to command line arguements, if present */
    if (do_switches(argc, argv, NUM_SWITCHES, cmd_sw_str, func, &status)) {
    printf("ERROR -- LOD001: Unknown switch %c", status);
          show_usage_and_exit();
    }

    /* get file names, but just check for one */
    files[0] = cmd_line_file_name;
  get_filenames(argc, argv, 2, &n_files, files);
  switch (n_files) {
        case 0  : /* no file specified, don't use defaults */
    printf("\nERROR -- LOD010: Missing input file name.");
    show_usage_and_exit(); break;

        case 1  :
                set_file_names(files[0]); break;

        default :
    printf("\nERROR -- LOD002: Unknown parameter >%s< (use '-' to precede switch).",
                        files[1]);
                show_usage_and_exit();   break;
  }

  /* with switches all applied, produce full file names */
  apply_default_extension(Code_file_name, "spp");
  apply_default_extension(Data_file_name, "spd");
  create_output_extension(ext_str);
  apply_default_extension(Out_file_S1_name, ext_str);
  apply_default_extension(Out_file_SMI_name, "blk");

/* open needed input files */
/* don't open output files here, do later to avoid hammering good file */
  code_file    = efopen(Code_file_name, "r");
  data_file    = efopen(Data_file_name, "r");
  /* tell user what's happening */
  if (!Quiet_mode) {
  printf("\nWorking on '%s'", Out_file_S1_name);

        if (Make_SMI_file)
    printf(" and '%s'", Out_file_SMI_name);

        if (Make_extra_files)
                printf(" and extra files");

        printf(".\n");
  }

  /* put appropriate start record into file */
  strcpy(Out_buf_S1[Row_S1++], START_RECORD);

  /* put start lines into SMI file */
  if (Make_SMI_file) {
        strcpy(record, "/* Generated by makeload.exe $Revision: 1.15 $ */\n");
        strcpy(Out_buf_SMI[Row_SMI++], record);
  strcpy(record, "#include \"sprocdef.h\"\n\n");
  strcpy(Out_buf_SMI[Row_SMI++], record);
  sprintf(record, "before_const fix24_type after_const %s_block[] = { \n", Design_name);
  strcpy(Out_buf_SMI[Row_SMI++], record);
```

```
}

    /* handle extra files, if needed */
    if (Make_extra_files) {

            /* use these fixed names */
            strcpy(out_code_file_name, "code");
            strcpy(out_control_file_name, "control");
            strcpy(out_data_file_name, "data");
            /* and these file name extensions */
            apply_default_extension(out_code_file_name, ext_str);
            apply_default_extension(out_control_file_name, ext_str);
            apply_default_extension(out_data_file_name, ext_str);

            /* attempt to open these files, terminate if failure */
            Code_out_file = efopen(out_code_file_name, "w");
            Control_out_file = efopen(out_control_file_name, "w");
            Data_out_file = efopen(out_data_file_name, "w");

            /* put start record into these files */
            efprintf(Code_out_file,    START_RECORD);
            efprintf(Control_out_file, START_RECORD);
            efprintf(Data_out_file,    START_RECORD);
    }

    /* ---------------------------------------------------------------*/
    /* begin code records */
    /* ---------------------------------------------------------------*/

    /* Instruction RAM starts at zero */
PROM_address = 0;
Sproc_address = CODE_START_ADDRESS;

    if (Make_SMI_file) {
            code_info_row_SMI = Row_SMI;
            Row_SMI++; /* leave space for block size and start address */
    }

    /* remember where to put block size and start address */
    code_info_row_S1 = Row_S1;

    /* compute number of bytes to read from file */
    bytes_to_read = SPROC_CODE_SDATA * CHARS_IN_LINE;

 /* read the program file into the buffer */
    in_buf = read_file(in_buf, bytes_to_read, code_file, &in_buf_len);

 /* make sure file is big enough here (at least 6 values) */
 if (in_buf_len < 6 * CHARS_IN_LINE) {
    printf("\nERROR -- LOD004: Program file (%s) too small!", Code_file_name);
    exit(-1);
 }

    /* build output S-Records from this input buffer */
    make_records(in_buf, in_buf_len);
 last_code_addr = Sproc_address;

    free(in_buf);

 /* ------------------------------------------------------*/
 /* begin spd file handling */
 /* ------------------------------------------------------*/

 /* -----------------------*/
    /* begin control  records */
    /* -----------------------*/

    /* Control register memory map starts here, but... see below */
 /* Sproc_address = 0x400; */
```

```
    /* ------------------------------------------------------------ */
    /* The strategy here is to read the entire 1K of control space. */
    /* However, 400h thru 40fh are address activated registers and   */
    /*  must NOT be part of a load.  Only 410h thru 4ffh are really  */
    /*  used.  We read the entire 1k to move the input file pointer. */
    /*  but we only use the f0h sdata items which are decoded by SPROC. */
    /* ------------------------------------------------------------ */

    bytes_to_read = SPROC_CONTROL_SDATA * CHARS_IN_LINE;

    /* read the file into the buffer */
    in_buf = read_file(in_buf, bytes_to_read, data_file, &in_buf_len);

  /* make sure file is big enough here */
  if (in_buf_len < bytes_to_read) {
     printf("\nERROR -- LOD005: Data file (%s) too small!", Data_file_name);
     exit(-1);
  }

  /* start with in_buf, but keep to use with free() */
     work_ptr = in_buf;

     /* We must just ignore the next 2 * 8 lines */
     /*  since we don't want to hit these addresses in the download */
  for (recs = 1; recs <= CONTROL_START_ADDRESS - CONTROL_BASE_ADDRESS; recs++) {

             advance_to_next(&work_ptr);

     } /* end of recs loop */

   /* Control register memory map that is used by download starts here */
   Sproc_address = CONTROL_START_ADDRESS;
      if (Make_SMI_file) {
             control_info_row_SMI = Row_SMI;
             Row_SMI++; /* leave space for block size and start address */
      }

      /* remember where to put block size and start address */
      control_info_row_S1 = Row_S1;

      /* Process the 410 - 4ff as data records */
      /* 500h - 410h = F0 */
   make_records(work_ptr, (CONTROL_LENGTH + 2) * CHARS_IN_LINE);
   last_control_addr = Sproc_address;

#ifdef old_way
    if (make_records(work_ptr, CONTROL_LENGTH * CHARS_IN_LINE)) {
       printf("\nERROR -- LOD006: Out of data in .spd file!\n\a");
       exit(-3);
       }
#endif

       free(in_buf);

    /* ---------------------------------------------------- */
    /* begin data space handling */
    /* ---------------------------------------------------- */

       bytes_to_read = SPROC_DATA_SDATA * CHARS_IN_LINE;
       /* read the file into the buffer */
       in_buf = read_file(in_buf, bytes_to_read, data_file, &in_buf_len);

    /* make sure file is big enough here */
    if (in_buf_len < 1 * CHARS_IN_LINE) {
       printf("\nERROR -- LOD007: Data file (%s) too small!", Data_file_name);
       exit(-1);
    }
```

```
    /* start with in_buf, but keep to use with free() */
        work_ptr = in_buf;

    /* We must just ignore the next 20 values */
    /*  since we don't want to hit these trigger addresses in the download */
    for (recs = 1; recs <= 20; recs++) {

                advance_to_next(&work_ptr);

        } /* end of recs loop */

    /* remove skipped records from buffer length */
    in_buf_len -= 20 * CHARS_IN_LINE;

/* ---------------------------------------------------- */
/*  Data RAM starts here */
/* ---------------------------------------------------- */
    $proc_address = DATA_START_ADDRESS;
        if (Make_SMI_file) {
                data_info_row_SMI = Row_SMI;
                Row_SMI++; /* leave space for block size and start address */
        }

        /* remember where to put block size and start address */
        data_info_row_S1 = Row_S1;

    /* go and make the data portion */
    make_records(work_ptr, in_buf_len);
    last_data_addr = $proc_address;

        free(in_buf);

    /* ---------------------------------------------------*/
    /* all input files processed; */
    /* do final cleanup */
    /* ---------------------------------------------------*/

    /* fill in size and address info for SMI file */
        if (Make_SMI_file) {
        make_rom_header(Out_buf_SMI[code_info_row_SMI],
                        last_code_addr - CODE_START_ADDRESS,
                        CODE_START_ADDRESS, FALSE);
        make_rom_header(Out_buf_SMI[control_info_row_SMI],
                        last_control_addr - CONTROL_START_ADDRESS,
                        CONTROL_START_ADDRESS, FALSE);
        make_rom_header(Out_buf_SMI[data_info_row_SMI],
                        last_data_addr - DATA_START_ADDRESS,
                        DATA_START_ADDRESS, FALSE);
            /* also make an assembly format end record */
            make_rom_header(record, 0, 0, TRUE);
            strcat(Out_buf_SMI[Row_SMI++], record);
        }

        if (Mode == BOOT_ROM) {
        /* ---------------------------------------------------- */
        /* place blocking info for boot mode into output buffer */
        /* ---------------------------------------------------- */
        correct_blocking_info(last_code_addr - CODE_START_ADDRESS - 2,
                              code_info_row_S1, CODE_START_ADDRESS);

        correct_blocking_info(last_control_addr - CONTROL_START_ADDRESS - 2,
                              control_info_row_S1, CONTROL_START_ADDRESS);

        correct_blocking_info(last_data_addr - DATA_START_ADDRESS - 2,
                              data_info_row_S1, DATA_START_ADDRESS);

        /* ---------------------------------- */
        /* place ending block in output buffer */
```

```
        /* ---------------------------------- */

    /* Create record indicating zero size (no address needed) */
    /* The record length (07) is known; use zz as placeholder for chksum */
    sprintf(record, "S107%04Xxxxxxxxxyyyyyyyyzz\n", PROM_address);
/*  sprintf(record, "S1071234xxxxxxxxyyyyyyyyzz\n", PROM_address); */
/* char counting>>      0123456789abcdef */
        strcat(Out_buf_S1[Row_S1], record);

    /* use 0 as length and 0 as address so as not to confuse checksum */
    correct_blocking_info(0, Row_S1, 0);

    /* remove the extra address - final block is just len */
    /* copy the cksum and null and newline */
    strncpy(&Out_buf_S1[Row_S1][16], &Out_buf_S1[Row_S1][24], 4);

        Row_S1++; /* for completeness */

  } /* end of Boot_ROM */

    /* place end record in output buffer, leave for Extra files too */
    strcpy(record, "S9030000FC\n");
    strcat(Out_buf_S1[Row_S1++], record);

    /* copy output buffer to output file */
    write_bufs_to_file();

    /* no need to display this information */
    /* >>> printf("\nCode size = %d, Data size = %d",
    last_code_addr,
    last_data_addr - DATA_START_ADDRESS);
    <<< */

    /* close files */
    efclose(Out_file_S1, Out_file_S1_name);
  if (Make_SMI_file)
    efclose(Out_file_SMI, Out_file_SMI_name);
    efclose(code_file, Code_file_name);
    efclose(data_file, Data_file_name);

    if (Make_extra_files) {
        /* add eof record (depends on S1 eof set up previously) */
        efprintf(Code_out_file,    record);
        efprintf(Control_out_file, record);
        efprintf(Data_out_file,    record);

        efclose(Code_out_file,    out_code_file_name);
        efclose(Control_out_file, out_control_file_name);
        efclose(Data_out_file,    out_data_file_name);
    }

    /* tell user */
    if (!Quiet_mode) {
    printf("\nFinished with '%s'", Out_file_S1_name);
        if (Make_SMI_file)
      printf(" and '%s'", Out_file_SMI_name);
        if (Make_extra_files)
            printf(" and extra files");
        printf(".");
    }

    return(0);

} /* end of main */

void correct_blocking_info (int len, int buf_row, int start_address)
{
```

```
#define CKSUM_BYTES (2 + 4 + (8 * 8))
/* length ------------^   ^   ^   ^      */
/* address --------------^   ^   ^      */
/* values per line -----------^   ^      */
/* characters per value ----------^      */

int cksum_bytes;
char temp_str[100], cksum_str[3];

   /* add back the two "values" which are the len and addr blocking info */
   cksum_bytes = (len >= 8 - 2) ? CKSUM_BYTES : 2 + 4 + ((len + 2) * 8);

   /* create the blocking information */
   make_blk_str(temp_str, len, start_address);

   /* overlay padded values with the blocking information */
   strncpy(&Out_buf_S1[buf_row][8], temp_str, strlen(temp_str));

   /* create temporary string containing everything but checksum */
   strncpy(temp_str, &Out_buf_S1[buf_row][2], cksum_bytes);
   temp_str[cksum_bytes] = '\0';

   /* compute checksum on this string and insert into buffer */
   create_checksum(cksum_str, temp_str);
   strncpy(&Out_buf_S1[buf_row][2+cksum_bytes], cksum_str, 2);

} /* end of correct_blocking_info */

/* convert lower nibble of passed character to hex char */
unsigned char nibble2hexchar(unsigned char data_byte)
{
unsigned char ret_ch;
      if (data_byte > 9)
            ret_ch = (unsigned char) ('A' + data_byte - 10);
      else
            ret_ch = (unsigned char) ('0' + data_byte);
      return (ret_ch);
} /* end of nibble2hexchar */

/* convert byte into 2 ascii hex digits */
void byte2ascii(unsigned char *str, unsigned char data_byte)
{
unsigned char tmp_ch;
   tmp_ch = (unsigned char)((data_byte & 0xF0) >> 4);
   *str = nibble2hexchar(tmp_ch);
   str++;
   tmp_ch = (unsigned char)(data_byte & 0x0F);
   *str = nibble2hexchar(tmp_ch);

} /* end of byte2ascii */

#ifdef pad_code
void build_jmp(char *pad_data, int address, unsigned char offset)
{
unsigned long instruct, mode;
unsigned char *str = pad_data;

      instruct = JMP_OP;
      instruct = instruct << OP_SHIFT;
      mode = IMMED_R_MODE ;
      mode = mode << MODE_SHIFT ;
      instruct = instruct + mode + address + offset;

      /* convert to ascii */
      byte2ascii(str, (unsigned char) ((instruct & 0x00FF0000) >> 16) );
      str += 2;
      byte2ascii(str, (unsigned char) ((instruct & 0x0000FF00) >>  8) );
      str += 2;
      byte2ascii(str, (unsigned char) (instruct & 0x000000FF) );
```

```
} /* end of build_jmp */
#endif

void correct_length(char *line_S1, int num_values)
{
char len_str[3];
unsigned char len;

   /* point to length byte of record */
   line_S1 += 2;

   /* compute corrected length */
   len = (unsigned char)(1 + 2 + (num_values * 4));
   /*                    |   |        |                      */
   /*                    |   |        +--- data bytes        */
   /*                    |   +------------- address bytes    */
   /*                    +----------------- length byte      */

   /* stuff the chars representing actual length into this S-record */
   byte2ascii(len_str, len);
   strncpy(line_S1, len_str, 2);
} /* end of correct_length */

/* convert string to upper case */
void str2upr(char *str)
{
char *p = str;

   while (*p != '\0') {
            if (islower(*p))
         *p = (char) toupper(*p);
      p++;
   }

} /* end of str2upr */

/* return TRUE if out of data (also set Sproc_address to last value read) */
BOOLEAN make_a_record(char **in_buf_ptr, char * end_ptr)
{
char line_S1[COL_SIZE_S1];
char line_SMI[COL_SIZE_SMI];
int sdata_count;
char checksum_str[4];
char record[7], temp_record[12];
char pad_data[7];
BOOLEAN end_of_file = FALSE;
BOOLEAN all_zero_values = TRUE;
BOOLEAN first = TRUE;

      /* initialize locals */
      strcpy(pad_data, "000000");
      strcpy(line_SMI, "");

            /* fill in header info for this line */
            create_header(line_S1);

            /* create a line */
            for (sdata_count = 1; sdata_count <= SDATA_PER_SREC; sdata_count++) {

                  /* pad line out with zeros if past end of file */
         /* must catch = condition to not put junk into records */
         if (*in_buf_ptr >= end_ptr) {
                        end_of_file = TRUE;

            /* do no padding for boot roms or SMI file */
            if (Mode == BOOT_ROM || Make_SMI_file) {
               /* fixup length for this record */
               correct_length(line_S1, sdata_count - 1);
               break;
```

```
        }

        strcpy(record, pad_data);

                }
                else {

                        /* read in one 24 bit word per line as 6 ASCII chars */
                        memcpy(record, *in_buf_ptr, CHARS_IN_SDATA);
                        record[CHARS_IN_SDATA] = '\0';
                        str2upr(record);
                        if (strcmp(record, "000000") != 0)
                        all_zero_values = FALSE;
                advance_to_next(in_buf_ptr);
        }

        /* append to current record */
        strcat(line_S1, record);

        /* if needed, follow each sproc word (24 bits) with fill byte for splitting */
        if (Mode == BOOT_ROM)
                add_fill_byte(line_S1);

        /* place commas between values except for last */
        if (Make_SMI_file) {

    if (first) {
        sprintf(temp_record, "0x%s", record);
        first = FALSE;
    }
    else
        sprintf(temp_record, ", 0x%s", record);

                /* first put in the value */
    strcat(line_SMI, temp_record);

                /* pad this 24 bit value */
                add_fill_byte(line_SMI);
            }
    }
    /* end of constructing line */

/* one value per item for count-1 items */
Sproc_address += sdata_count - 1;

/* increment Sproc_address for next record */
if (Mode == BOOT_ROM) {

    /* four bytes per item for count-1 items */
    PROM_address += 4 * (sdata_count - 1);

}

/* don't output this line if all zeros and zero surpression on */
        if ( (Zero_surpress && !all_zero_values)
        ||   (!Zero_surpress) ) {

                /* add checksum to record */
                create_checksum(checksum_str, line_S1+2);
                strcat(line_S1, checksum_str);

                /* line complete, terminate and place in output buffer, bump Row */
                strcat(line_S1, "\n");
                strcpy(Out_buf_S1[Row_S1++], line_S1);

                /* also write to appropriate extra output file, if needed */
                if (Make_extra_files) {
        if (Sproc_address < 0x400)
```

```
                        efprintf(Code_out_file, "%s", line_S1);
    else if (Sproc_address < 0x800)
                        efprintf(Control_out_file, "%s", line_S1);
                else
                                efprintf(Data_out_file, "%s", line_S1);
                }
        } /* end of not all_zero_values */

        /* do the same for SMI buffer, if needed */
        if (Make_SMI_file) {
                /* need comma at end of line of values */
                strcat(line_SMI, ",\n");
                strcpy(Out_buf_SMI[Row_SMI++], line_SMI);
        }

    return(end_of_file);

} /* end of make_a_record */

/* return TRUE if out of data (also set Sproc_address to last value read) */
BOOLEAN make_records(char *in_buf_ptr, int in_buf_len)
{
char *end_ptr;
BOOLEAN end_of_file = TRUE;

        end_ptr = in_buf_ptr + in_buf_len;

        /* process entire file */
        while (in_buf_ptr < end_ptr) {

                end_of_file = make_a_record(&in_buf_ptr, end_ptr);

                /* always run the SPROC address value to calculate block size */
        /* the following is Now done in make_a_record */
        /* Sproc_address += SDATA_PER_SREC; */

        /* let user know things are progressing */
                show_progress();

        } /* end of while */

        return(end_of_file);

} /* end of make_records */

void apply_default_extension(char *fname, char *ext)
{
        /* don't overwrite existing extension, if any */
        if (strchr(fname, '.') == NULL) {
                strcat(fname, ".");
                strcat(fname, ext);
        }
} /* end of apply_default_extension */

char check_files()
{
char answer;

        /* stay in this loop until proper answer */
        do {
        printf("\nUsing '%s'", Code_file_name);
        printf(" & '%s' ", Data_file_name);
        printf("to produce '%s' [Y/N] ? [Y] ",
                Out_file_S1_name);
                /* answer = (char) getche();*/
                answer = (char) getchar();

                if (answer == '\r')
                        answer = 'Y';
```

```
		else
			answer = (char) toupper(answer);

	} while (answer != 'Y' && answer != 'N');

	return(answer);

} /* end of check_files */

int show_usage_and_exit()
{
	/* HELP message */
   printf ("\nConverts Schedule output files (.spp and .spd) to a load file (for SDI).");
   printf ("\n  Can also produce boot PROM file or SMI file.");
	printf ("\n");
   printf ("\n Usage: MakeLoad filebase [-E] [-H] [-Q] [-S] [-Z] where");
	printf ("\n    filebase is the design name");
	printf ("\n    E = produce Extra files = off");
   printf ("\n    P = produce Prom file (.pre instead of .lod)");
   printf ("\n    Q = Quiet mode = off");
   printf ("\n    S = produce SMI file (.blk in addition to .lod)");
   printf ("\n    Z = surpress records of all zeros");
	printf ("\n");
	printf ("\n Default extensions are:");
   printf ("\n    .spp = SPROC program file        ");
   printf ("      .spd = SPROC data file           ");
   printf ("\n    .lod = load file output (for SDI) ");
   printf ("      .blk = SMI file output           ");
   printf ("\n    .pro = boot PROM file output     ");

	printf ("\n");
   printf ("\n When the 'E' switch is used, three additional files are produced.");
   printf ("\n    These file basenames are 'code', 'control' and 'data'.\n");

	exit(-5);
	return(0);

} /* end of show_usage_and_exit */

void display_banner(char *version)
{
	/* identify self */
   printf("Load file builder, %s", version);
   printf("\n Copyright (C) 1991 by STAR Semiconductor Corporation, all rights reserved.");
}

int set_extra_files(char *str)
{
char ignore = *str;

	Make_extra_files = TRUE;
	return(0);
}
int set_quiet(char *str)
{
char ignore = *str;

	Quiet_mode = TRUE;
	return(0);
}

int set_file_names(char *str)
:
char ignore = *str;

	/* establish input file names */
	/*---------------------------*/
	strcpy(Code_file_name, str);
	strcpy(Data_file_name, str);
```

```
strcpy(Design_name, str);

    /* establish output file base names */
    strcpy(Out_file_S1_name, str);
    strcpy(Out_file_SMI_name, str);

    return(0); /* to satisfy do_switches */

} /* end of set_file_names */

nt set_Boot_ROM_mode(char *str)

har ignore = *str;

  if (Make_SMI_file || Zero_surpress) {
    printf("\nERROR -- LOD008: PROM not allowed with SMI or zero surpression.");
    exit(-1);
    }
    Mode = BOOT_ROM;
    return(0);
 /* end of set_Boot_ROM_mode */

nt make_SMI_file(char *str)

har ignore = *str;

    if (Mode == BOOT_ROM) {
    printf("\nERROR -- LOD009: SMI switch not allowed with PROM switch.");
    exit(-1);
    }
    Make_SMI_file = TRUE;
    return(0);
 /* end of make_SMI_file */

nt set_zero_surpression(char *str)

har ignore = *str;

  /* disallow option if making proms */
  if (Mode == BOOT_ROM) {
     printf("\nERROR --  LOD010: Zero surpression not allowed with PROM.");
     exit(-1);
  }
  /* change to surpressing records of all zeros */
  Zero_surpress = TRUE;
     return(0); /* to satisfy do_switches */

} /* end of set_file_names */

char *emalloc(int size)
{
char *ptr;

       if ((ptr = malloc(size)) == NULL)
              exit(-1);
       return(ptr);

} /* end of emalloc */

int efread(char *ptr, unsigned size, unsigned count, FILE *data_file)
{
int status;

       status = fread(ptr, size, count, data_file);
       if (status < 0)
              exit(-1);
       return(status);
```

```
} /* end of afread */

int create_header(char *hptr)
{
int ret_val;

        /* write preamble = type, length and address */
        switch (Mode) {
                case BOOT_ROM :
                        /* allow for 8 fill bytes */
            ret_val = (int)sprintf(hptr, "S123%04X", PROM_address);
                        break;

                case S1_FILE  :
                default       :
                        /* length is always 18 (not 18), includes cksum and addr bytes */
            ret_val = (int)sprintf(hptr, "S118%04X", Sproc_address);
                        break;
        }
        return(ret_val);
} /* end of create_header */

unsigned char aschex2char(char * high_byte)
{
int i;
unsigned char c, val = (unsigned char) 0;
        /* convert 2 successive ascii bytes into a hex value */
        for (i=1; i<=2; i++) {
                val = (unsigned char) (((unsigned int)val) << 4) ;
                c = (unsigned char) toupper(*high_byte);
                if (c < 'A')
                        val += c - '0';
                else
                        val += c - 'A' + 10;
                high_byte++;
        }
        return(val);
} /* end of aschex2char */

void create_checksum(char *cptr, char *buf)
{
char *p;
unsigned int checksum = 0;

        /* add chars to checksum as unsigned int */
        for (p=buf; *p != '\0'; p += 2) {
                checksum += (unsigned int) aschex2char(p);
        }

        /* checksum is 1's compliment of actual sum */
        checksum = (unsigned char) (0xFF - checksum);

        /* fill in return string */
        sprintf(cptr, "%02X", checksum);

} /* end of create_checksum */

void show_progress(void)
{
char working_char;

        if (Quiet_mode)
                return;

        /* let user know what's happening */
        switch (Mode) {
                case BOOT_ROM : working_char = 'p'; break;
                default       : working_char = '+'; break;
```

```
    }
    printf("%c", working_char);

/* end of show_progress */

oid init_output_buffers()

nt i;

      for (i=0; i < ROW_SIZE; i++) {
            memset(Out_buf_S1[i], '\0', COL_SIZE_S1);
            memset(Out_buf_SMI[i], '\0', COL_SIZE_SMI);
      }

/* end of init_output_buffers */

oid write_bufs_to_file()

nt i;

   /* open these output files now, since we're gonna put data in 'em */
   Out_file_S1  = efopen(Out_file_S1_name, "w");
   if (Make_SMI_file)
       Out_file_SMI = efopen(Out_file_SMI_name, "w");

   if (!Quiet_mode)
            printf("\nWriting output...");
        for (i=0; i<Row_S1; i++) {
              efprintf(Out_file_S1, "%s", Out_buf_S1[i]);
        }

        /* if needed, write SMI data to file */
        if (Make_SMI_file) {
              for (i=0; i<Row_SMI; i++) {
                     efprintf(Out_file_SMI, "%s", Out_buf_SMI[i]);
              }
        }

} /* end of write_bufs_to_file */

/* move on to next value in buffer */
/* allow for space padding from scompile (normally 4 spaces) */
/* shouldn't have to skip CR since CR-LF pair translated to just LF by MSC */
void advance_to_next(char ** work_ptr)
{
       *work_ptr += CHARS_IN_SDATA;
    while (**work_ptr == ' ' || **work_ptr == '\n' || **work_ptr == '\r')
              (*work_ptr)++;
} /* end of advance_to_next */

/* format a boot block description as text */
void make_blk_str(char *buf, int size, int addr)
{
long long_size, long_addr;

        long_size = ((long)(size)) << 8;
        long_addr = ((long)(addr)) << 8;

        if (Mode == BOOT_ROM)
        /* note that "LX" as a format is buggy! (gives 0 as result) */
        /* Use lX for long capital hex values */
        sprintf(buf, "%08lX%08lX", long_size, long_addr);
        else
        sprintf(buf, "0x%08lX, 0x%08lX", long_size, long_addr);

 } /* end if make_blk_str */

 void make_rom_header(char *buf, int size, int addr, BOOLEAN last_flag)
```

```
{
char last_line[80];

        make_blk_str(buf, size, addr);

        /* append trailing comma to all but last record */
    if (last_flag) {
        sprintf(last_line, " } ;\nfix24_type before_const %s_block_end after_const = { 0x00BADBAD } ;",
                Design_name);
        strcat(buf, last_line);
    }
        else
                strcat(buf, ",");
        strcat(buf, "\n");

        show_progress();

} /* end of make_rom_header */

void add_fill_byte (char *record)
{
        strcat(record, "00");
} /* end of add_fill_byte */

void create_output_extension(char *ext_str)
{
        switch (Mode) {
                case BOOT_ROM : strcpy(ext_str, "pro"); break;
                default       : strcpy(ext_str, "lod"); break;
        }
} /* end of create_output_extension */

char * read_file(char * in_buf, int bytes_to_read, FILE *file, int * len)
{
char * temp_in_buf;
char place_holder[] = "000000    \n000000    \n";

        /* make the buffer 2 values larger for PROM format */
        if (Mode == BOOT_ROM) {

        /* get a buffer and fill it with data */
        in_buf = emalloc(bytes_to_read + sizeof(place_holder));

        /* make these records look like "normal" records */
        strncpy(in_buf, place_holder, sizeof(place_holder) - 1);

        /* make it appear that these "records" came from file */
        temp_in_buf = in_buf;
        in_buf += sizeof(place_holder) - 1;
                *len = efread(in_buf, 1, bytes_to_read, file);
                in_buf = temp_in_buf;
        *len += sizeof(place_holder) - 1;
        }
        else {
                /* get a buffer and fill it with data */
                in_buf = emalloc(bytes_to_read+1);
                *len = efread(in_buf, 1, bytes_to_read, file);
        }
        return(in_buf);

} /* end of read_file */

/* $Log: efopencl.c,v $
 * Revision 1.1  1991/07/10  00:05:32  krassow
 * Initial revision
 * */
#include <stdio.h>
#include <stdlib.h>
char efopencl[] = "$Id: efopencl.c,v 1.1 1991/07/10 00:05:32 krassow Exp $";
```

```
/* fatal error file open */
FILE *efopen(char *path, char *type)
{
FILE *ret_file;

	if ((ret_file = fopen(path, type)) == NULL) {
	fprintf(stderr, "\nERROR -- EF0001: Can't open file '%s'.", path);
		exit(-2);
	}
	return(ret_file);
} /* end of efopen */

/* fatal error file close */
int efclose(FILE *file_ptr, char *file_name)
{
int ret_val;

	/* if file pointer is null, don't bother closing */
	if (file_ptr != NULL) {
		if ((ret_val = fclose(file_ptr)) != 0) {
	    fprintf(stderr, "\nERROR -- EF0002: Problem closing file '%s'.", file_name);
			exit(-3);
		}
	}
	else
		ret_val = 0;

	return(ret_val);
} /* end of efclose */

/* ---------------------- */
/* Local definitions */
/* ---------------------- */
/* @(#)sdl2load.h       1.11 */

/* generic defines */
#define CHARS_IN_SDATA 6

/* define input file characteristics */
#define CHARS_IN_LINE  (CHARS_IN_SDATA + 4 + 1) /* include spaces and line feed */

/* define SPROC memory characteristics */
#define SPROC_CODE_SDATA    1024
#define SPROC_CONTROL_SDATA 1024 /* absolute worst case! */
#define SPROC_DATA_SDATA    1024
#define SPROC_TOTAL_SDATA   (SPROC_CODE_SDATA + SPROC_CONTROL_SDATA +SPROC_DATA_SDATA)

/* define byte counts */
#define SPROC_CODE_CHARS    (SPROC_CODE_SDATA    * CHARS_IN_SDATA)
#define SPROC_CONTROL_CHARS (SPROC_CONTROL_SDATA * CHARS_IN_SDATA)
#define SPROC_DATA_CHARS    (SPROC_DATA_SDATA    * CHARS_IN_SDATA)
#define SPROC_TOTAL_CHARS   (SPROC_TOTAL_SDATA   * CHARS_IN_SDATA)

#define SREC_OH (2+2+4+2)
/*               ^ ^ ^ ^ */
/* S1 -----------+ | | | */
/* len ------------+ | | */
/* address ----------+ | */
/* checksum -----------+ */

#define SDATA_PER_SREC 8
#define FILE_NAME_LENGTH 80

#define ESC 0x1b
char BOLDstr[5] = { (char) ESC, '[', '1', 'm', '\0' } ;
char NORMstr[5] = { (char) ESC, '[', '0', 'm', '\0' } ;
```

APPENDIX E

```
/*
 Copyright (c) Star Semiconductor, Inc. 1991. All Rights Reserved.
 This material may not be copied or used without prior written permission.

 * $Header: /home/solus/users4/release/CVS/cells/code/breakram.sdl,v 1.7 1991/10
 * $Revision: 1.7 $
 * $Id: breakram.sdl,v 1.7 1991/10/01 21:23:54 chet Exp $
 * $Log: breakram.sdl,v $
# Revision 1.7  1991/10/01  21:23:54  chet
# Added Revision Keyword
#
# Revision 1.6  1991/08/30  16:40:30  krassow
# Changed from A register to L register to preserve flags on recovery
#
# Revision 1.5  1991/08/29  19:51:39  krassow
# Use indirect addressing mode for lda (no #).
#
# Revision 1.4  1991/08/28  19:09:38  krassow
# Changed a NOP to restore A reg from ram copy.
# Note that ram copy must be hard-coded since its creation is not symbolic.
# Changed duration from 100 to 6 as more correct.
#
# Revision 1.3  1991/08/08  15:54:25  krassow
# Changed labels in breakram to lower case.
#
# Revision 1.2  1991/07/30  14:18:54  chet
# New template submission
#
#
*/

/*************************************************************************

                              breakram.sdl

**************************************************************************

Function:

        This code supports idling of GSPs for a break function, and provides a
        place for patch code executed after the WAIT_FLAG becomes non-zero.

Arguments:

        none

Parameters:

        none

Algorithm:


*/


/*******************/
/*   inline code   */
/*******************/

#define WAIT_FLAG        0BFFh
#define NUM_REGS         0eh
#define L_REG_1          0bcah
#define L_REG_2          (L_REG_1 + NUM_REGS)
#define L_REG_3          (L_REG_2 + NUM_REGS)
#define L_REG_4          (L_REG_3 + NUM_REGS)

asmblock breakram()
duration 6;
phantom;
init;
begin
```

```
// four identical fragments, 1 for each gsp
//

//
// GSP1s fragment
//
_%patch_ram_gsp1:
        ldl      WAIT_FLAG       // wait here until SDI fixes Vectors
        jlf      _%patch_ram_gsp1
        ldf L_REG_1      // restore ram copy of A register
        nop
                 nop
        nop                      // just jump to beginning, will be patched
        jmp      _%patch_ram_gsp1   // with original instruction
//
// GSP2's fragment
//
_%patch_ram_gsp2:
        ldl      WAIT_FLAG       // wait here until SDI fixes Vectors
        jlf      _%patch_ram_gsp2
        ldl L_REG_2      // restore ram copy of A register
        nop
        nop
                 nop
        jmp      _%patch_ram_gsp2
//
// GSP3's fragment
//
_%patch_ram_gsp3:
        ldl      WAIT_FLAG       // wait here until SDI fixes Vectors
        jlf      _%patch_ram_gsp3
        ldl L_REG_3      // restore ram copy of A register
        nop
        nop
                 nop
        jmp      _%patch_ram_gsp3
//
// GSP4's fragment
//
_%patch_ram_gsp4:
        ldl      WAIT_FLAG       // wait here until SDI fixes Vectors
        jlf      _%patch_ram_gsp4
        ldl      L_REG_4      // restore ram copy of A register
        nop
        nop
        jmp      _%patch_ram_gsp4
end


/*
 Copyright (c) Star Semiconductor, Inc. 1991. All Rights Reserved.
 This material may not be copied or used without prior written permission.

 * $Header: /home/solus/users4/release/CVS/cells/code/vectors.sdl,v 1.5 1991/10/
 * $Revision: 1.5 $
 * $Id: vectors.sdl,v 1.5 1991/10/02 12:56:16 krassow Exp $
 * $Log: vectors.sdl,v $
! Revision 1.5  1991/10/02  12:56:16  krassow
! Added Revision tag.
!
! Revision 1.4  1991/09/03  14:40:42  krassow
! from TM checked in by AJK
!
! Revision 1.3  1991/07/31  14:42:58  chet
! New template submission
!
! 1.51  7/24/91
*/
// still under Terry's source code control
// %W%  %G%

/*************************************************************************

                            vectors.sdl

**************************************************************************
```

```
Function:

        This block contains SPROC restart vectors.  It is incorporated into
        every system build.

Arguments:

        N/A

Parameters:

        N/A

Algorithm:

        N/A

*/

/********************/
/*   inline code   */
/********************/

asmblock _vectors()
        phantom;
        init;
        begin
                jmp                     "top._$start_gsp1"
                jmp                     "top._$start_gsp2"
                jmp                     "top._$start_gsp3"
                jmp                     "top._$start_gsp4"
end


/*
  Copyright (c) Star Semiconductor, Inc. 1991. All Rights Reserved.
  This material may not be copied or used without prior written permission.

 * $Header: /home/solus/users4/release/CVS/cells/code/io.sdf,v 1.6 1991/10/02 12
 * $Revision: 1.6 $
 * $Id: io.sdf,v 1.6 1991/10/02 12:56:09 krassow Exp $
 * $Log: io.sdf,v $
| Revision 1.6  1991/10/02  12:56:09  krassow
| Added Revision tag.
|
| Revision 1.5  1991/09/19  21:52:41  krassow
| New port dest names.
| Removed generic init.sdl file.
|
| Revision 1.4  1991/09/03  14:40:34  krassow
| from TM checked in by AJK
|
| Revision 1.3  1991/07/31  14:40:50  chet
| New template submission, with function description
|
| 1.51  7/24/91
*/
// still under Terry's source code control
// %W%  %G%

/***************************************************************************

                                io.sdf

****************************************************************************

Function:

        This file provides definitions for input and output, and is included
        during a system build.  It is instantiated first as a mapping of wires
        onto the entire control space, and establishes symbolic references
        for all accesses.  Control space and data space are viewed by the
        scheduler as one block of data RAM.  This scheme thereby decouples
        system architectural features from the user so that the architecture
        may evolve with minimal impact upon the software structure.
```

```
Arguments:

        N/A

Parameters:

        N/A

Algorithm:

        N/A

*/

/********************/
/*   inline code   */
/********************/

   // port definitions
     symbol  cl0 = 20, cl1 = 21, cl2 = 22, cl3 = 23;
     symbol  no_cl = -1, no_trigger = -1;
     // old style port definitions
     symbol  port0 = 0, port1 = 1, port2 = 2, port3 = 3;
     // New (improved) port definitions
     symbol  siport0 = 0, siport1 = 1, soport0 = 2, soport1 = 3;
     symbol  pport0 = 0, aport0 = 0, probe0 = 0;
     symbol  gen0 = 4, gen1 = 5, gen2 = 6, gen3 = 7;
     symbol  gen4 = 8, gen5 = 9, gen6 = 10, gen7 = 11;
     symbol  gen8 = 12, gen9 = 13, gen10 = 14, gen11 = 15;
     symbol  gen12 = 16, gen13 = 17, gen14 = 18, gen15 = 19;

     // port configuration symbols
     symbol  w24 = 0, w16 = 1, w12 = 2, w8 = 3;
     symbol  lsb = 0, msb = 1;
     symbol  short = 1, long = 0;
     symbol  on = 1, off = 0, default = -1;
     symbol  intern = 1, extern = 0;

     // masks for port and compute line triggers
     symbol  port_0_mask =1h, port_1_mask =2h, port_2_mask =4h, port_3_mask = 8
     symbol  gen_0_mask =10h, gen_1_mask =20h, gen_2_mask =40h, gen_3_mask = 80
     symbol  gen_4_mask=100h, gen_5_mask=200h, gen_6_mask=400h, gen_7_mask =800
     symbol  gen_8_mask=1000h, gen_9_mask= 2000h;
     symbol  gen_10_mask=4000h,gen_11_mask = 8000h;
     symbol  gen_12_mask=10000h, gen_13_mask= 20000h;
     symbol  gen_14_mask=40000h, gen_15_mask = 80000h;
     symbol  compute_0_mask=100000h, compute_1_mask= 200000h;
     symbol  compute_2_mask=400000h, compute_3_mask = 800000h;

     // values to be set for port clock registers
     symbol  _%in_clk_val_0 = 0FFh, _%in_clk_val_1 = 0FFh,
             _%out_clk_val_0 = 0FFh, _%out_clk_val_1 = 0FFh;

     // probe port configuration
     symbol  _%probe_out_port_config_0 = 65h;

     // bit position for gpio output field (bit for gpio_0) in gpio_register
     symbol  _%gpio_output_field = 16;

     // gpio and rts configuration symbols
     symbol  gpio_0 = 0, gpio_1 = 1, gpio_2 = 2, gpio_3 = 3;
     symbol   rts_0 = 0,  rts_1 = 1,  rts_2 = 2,  rts_3 = 3;

     // I/O registers
     wire hex         _%ram_configuration;       // 0x400
     wire             _%reserved_1[5];
micro wire hex        _%sproc_halt;              // 0x406
micro wire hex        _%sproc_exit_break;        // 0x407
     wire             _%reserved_2[8];
     // 0x410
     wire hex      _%serial_in_port_int_clk_0;  // 0x410
     wire hex      _%serial_in_port_int_clk_1;
     wire hex      _%serial_out_port_int_clk_0;
     wire hex      _%serial_out_port_int_clk_1; // 0x413
     wire          _%reserved_3[44];
```

```
// 0x440
wire integer _$serial_in_port_buf_len_0;
wire integer _$serial_in_port_fifo_ix_len_0;
wire hex     _$serial_in_port_fifo_start_0;
wire hex     _$serial_in_port_config_0;
wire hex     _$serial_in_port_reserved_0[4];

wire integer _$serial_in_port_buf_len_1;
wire integer _$serial_in_port_fifo_ix_len_1;
wire hex     _$serial_in_port_fifo_start_1;
wire hex     _$serial_in_port_config_1;
wire         _$serial_in_port_reserved_1[4];

wire integer _$serial_out_port_reserved_0;
wire integer _$serial_out_port_buf_len_0;
wire hex     _$serial_out_port_fifo_start_0;
wire hex     _$serial_out_port_config_0;
wire integer _$serial_out_port_decimation_0;
wire hex     _$serial_out_port_run_0;
wire hex     _$serial_out_port_wait_mask_0;
wire         _$serial_out_port_fill_0;

wire integer _$serial_out_port_reserved_1;
wire integer _$serial_out_port_buf_len_1;
wire hex     _$serial_out_port_fifo_start_1;
wire hex     _$serial_out_port_config_1;
wire integer _$serial_out_port_decimation_1;
wire hex     _$serial_out_port_run_1;
wire hex     _$serial_out_port_wait_mask_1;
wire         _$serial_out_port_fill_1;

wire         _$reserved_ports[32];

// 0x480
wire integer _$probe_in_buf_len_0;
wire integer _$probe_in_fifo_ix_len_0;
wire hex     _$probe_in_fifo_start_0;
wire hex     _$probe_in_data_addr_0;
wire hex     _$probe_in_gain_0;
wire         _$reserved_4[3];
// 0x488
wire integer _$probe_out_reserved_0;
wire integer _$probe_out_buf_len_0;
wire hex     _$probe_out_fifo_start_0;
wire hex     _$probe_out_config_0;
wire integer _$probe_out_decimation_0;
wire hex     _$probe_out_run_0;
wire hex     _$probe_out_wait_mask_0;
wire         _$probe_out_fill_0;
// 0x490
wire         _$reserved_5[006bh];
micro wire hex _$parallel_port_clear_flags;       // 0x4fb
micro wire hex _$general_purpose_register;        // 0x4fc
micro wire     _$parallel_port_receive;           // 0x4fd
micro wire hex _$gpio_register;                   // 0x4fe (non-readable)
micro wire hex _$parallel_port_mode_register;     // 0x4ff (non-readable)
wire         _$reserved_6[0300h];

// 0x800
wire hex     _$port_0_flag;
wire hex     _$port_1_flag;
wire hex     _$port_2_flag;
wire hex     _$port_3_flag;
wire hex     _$gen_0_flag;
wire hex     _$gen_1_flag;
wire hex     _$gen_2_flag;
wire hex     _$gen_3_flag;
wire hex     _$gen_4_flag;
wire hex     _$gen_5_flag;
wire hex     _$gen_6_flag;
wire hex     _$gen_7_flag;
wire hex     _$gen_8_flag;
wire hex     _$gen_9_flag;
wire hex     _$gen_10_flag;
wire hex     _$gen_11_flag;
wire hex     _$gen_12_flag;
```

```
wire hex    _%gen_13_flag;
wire hex    _%gen_14_flag;
wire hex    _%gen_15_flag;
wire hex    _%compute_0_flag;
wire hex    _%compute_1_flag;
wire hex    _%compute_2_flag;
wire hex    _%compute_3_flag;


/*
  Copyright (c) Star Semiconductor, Inc. 1991. All Rights Reserved.
  This material may not be copied or used without prior written permission.

 * $Header: /home/solus/users4/release/CVS/cells/code/userdecl.sdl,v 1.4 1991/10
 * $Revision: 1.4 $
 * $Id: userdecl.sdl,v 1.4 1991/10/02 12:58:46 krassow Exp $
 * $Log: userdecl.sdl,v $
# Revision 1.4  1991/10/02  12:58:46  krassow
# Closed Log block comment.
#
# Revision 1.3  1991/10/02  12:56:14  krassow
# Added Revision tag.
#
*/

//
// This file may contain user-supplied declarations which apply to all
// blocks in a design.
//
// To use it, add any desired symbol declarations below, of the form:
//      symbol  <symbol_name> = <symbol_value>;
//
// or add variable storage which is global to the design:
//  variable <variable_name>[<size>];
//

/*
  Copyright (c) Star Semiconductor, Inc. 1991. All Rights Reserved.
  This material may not be copied or used without prior written permission.

 * $Header: /home/solus/users4/release/CVS/cells/code/initc16.sdl,v 1.2 1991/10/
 * $Revision: 1.2 $
 * $Id: initc16.sdl,v 1.2 1991/10/02 12:56:04 krassow Exp $
 * $Log: initc16.sdl,v $
# Revision 1.2  1991/10/02  12:56:04  krassow
# Added Revision tag.
#
# Revision 1.1  1991/09/19  21:42:01  krassow
# Initial revision
#
# Revision 1.4  1991/09/03  14:40:29  krassow
# from TM checked in by AJK
#
# Revision 1.3  1991/07/31  14:42:24  chet
# New template submission, with function description
#
# 1.51  7/24/91
*/
// still under Terry's source code control
// %W%  %G%

/**************************************************************************

                          initc16.sdl

***************************************************************************

Function:

        This code constitutes a true top level block.  It defines initial
        parameters and a framework into which a user's design is instantiated.
        I/O definitions, SPROC restart vectors, core support functions and a
        break facility are established via include files.

Arguments:

        N/A
```

```
Parameters:

        N/A

Algorithm:

        N/A

*/

/********************/
/*   inline code   */
/********************/

seqblock _top()
        phantom;
        // SPROC configuration symbols
        symbol  _%sproc_model = "CHIP 1400-1C";
        symbol  _%n_gsps = 4, _%flag_locs = 24;
        symbol  _%code_space_start = 0;
        symbol  _%io_space_start = 1024, _%data_space_start = 2048;
        symbol  _%io_space_size = 1024;
        symbol  _%patch_ram_size = 59;
        symbol  _%code_space_size = 1024;
        symbol  _%data_space_size = 1024 - _%patch_ram_size - _%flag_locs;
        symbol  _%first_serial_port = 0, _%last_serial_port = 3;
        symbol  _%first_in_port = 0, _%n_in_ports = 2;
        symbol  _%first_out_port = 2, _%n_out_ports = 2;
        symbol  _%first_compute_line = 20, _%last_compute_line = 23;
        // master clock setup
        #define MC_FREQ 16
        symbol _%mc_freq_max = 16;
        symbol _%mc_freq = MC_FREQ;
        verify ( MC_FREQ > 0 && MC_FREQ <= _%mc_freq_max) ,
        'MC_FREQ must be > 0 and <= 16 MHz.';

        symbol  _%chip_gsp_rate = (MC_FREQ * 1000000) / 5;
        symbol  _%init_version = "$Id: initc16.sdl,v 1.2 1991/10/02 12:56:04 kra

        symbol  _%abs_addr_fudge = 0;


        symbol  pi = 3.141592653;

        #include "io.sdf"
        #include "userdecl.sdl"

        begin
                _vectors _restart();
                _user_top top();
                _user_end user_end();
                breakram  break();
        end

// mask out bit 23
#define IMMED_MASK      3fffh

#include "vectors.sdl"
#include "phantoms.sdl"

 /*
  Copyright (c) Star Semiconductor, Inc. 1991. All Rights Reserved.
  This material may not be copied or used without prior written permission.

 * $Header: /home/solus/users4/release/CVS/cells/code/initd20.sdl,v 1.2 1991/10/
 * $Revision: 1.2 $
 * $Id: initd20.sdl,v 1.2 1991/10/02 12:56:07 krassow Exp $
 * $Log: initd20.sdl,v $
 # Revision 1.2  1991/10/02  12:56:07  krassow
 # Added Revision tag.
 #
 # Revision 1.1  1991/09/19  21:42:04  krassow
 # Initial revision
 #
 # Revision 1.4  1991/09/03  14:40:29  krassow
```

```
# from TM checked in by AJK
#
# Revision 1.3  1991/07/31  14:42:24  chet
# New template submission, with function description
#
# 1.51  7/24/91
*/
// still under Terry's source code control
// %W%  %G%

/*****************************************************************************

                              initd20.sdl

*****************************************************************************

Function:

        This code constitutes a true top level block.  It defines initial
        parameters and a framework into which a user's design is instantiated.
        I/O definitions, SPROC restart vectors, core support functions and a
        break facility are established via include files.

Arguments:

        N/A

Parameters:

        N/A

Algorithm:

        N/A

*/


/*******************/
/*   inline code   */
/*******************/

seqblock _top()
        phantom;
        // SPROC configuration symbols
        symbol  _%sproc_model = "CHIP 1400-2D";
        symbol  _%n_gsps = 4, _%flag_locs = 24;
        symbol  _%code_space_start = 0;
        symbol  _%io_space_start = 1024, _%data_space_start = 2048;
        symbol  _%io_space_size = 1024;
        symbol  _%patch_ram_size = 59;
        symbol  _%code_space_size = 1024;
        symbol  _%data_space_size = 1024 - _%patch_ram_size - _%flag_locs;
        symbol  _%first_serial_port = 0, _%last_serial_port = 3;
        symbol  _%first_in_port = 0, _%n_in_ports = 2;
        symbol  _%first_out_port = 2, _%n_out_ports = 2;
        symbol  _%first_compute_line = 20, _%last_compute_line = 23;
        // master clock setup
        #define MC_FREQ 20
        symbol _%mc_freq_max = 20;
        symbol _%mc_freq = MC_FREQ;
        verify ( MC_FREQ > 0 && MC_FREQ <= _%mc_freq_max) ,
        'MC_FREQ must be > 0 and <= 20 MHz.';

        symbol  _%chip_gsp_rate = (MC_FREQ * 1000000) / 5;

        symbol  _%init_version = "$Id: initd20.sdl,v 1.2 1991/10/02 12:56:07 kra
        symbol  _%abs_addr_fudge = 0;

        symbol  pi = 3.141592653;

        #include "io.sdf"
        #include "userdecl.sdl"

        begin
                _vectors _restart();
```

```
                _user_top top();
                _user_end user_end();
                breakram  break();
        end

// mask out bit 23
#define IMMED_MASK      3fffh

#include "vectors.sdl"
#include "phantoms.sdl"

/*
  Copyright (c) Star Semiconductor, Inc. 1991. All Rights Reserved.
  This material may not be copied or used without prior written permission.

 * $Header: /home/solus/users4/release/CVS/cells/code/phantoms.sdl,v 1.5 1991/10
 * $Revision: 1.5 $
 * $Id: phantoms.sdl,v 1.5 1991/10/02 12:56:11 krassow Exp $
 * $Log: phantoms.sdl,v $
# Revision 1.5  1991/10/02  12:56:11  krassow
# Added Revision tag.
#
# Revision 1.4  1991/09/03  14:40:37  krassow
# from TM checked in by AJK
#
# Revision 1.3  1991/07/31  14:43:36  chet
# New template submission, with function description
#
# 1.51  7/24/91
*/
// still under Terry's source code control
// %W%  %G%

/***************************************************************************

                                phantoms.sdl

****************************************************************************

Function:

        This file supplies all of the blocks not specified in a user's design,
        but required to make the design work.  The blocks implement temporal
        scheduling and operating system features.

Arguments:

        N/A

Parameters:

        N/A

Algorithm:

        N/A

*/


/*******************/
/*   inline code   */
/*******************/

////////////////////////////////////////////////////////////////////////////////
//
// _user_top
//
// Null block which gets replaced by real user top block.
//
////////////////////////////////////////////////////////////////////////////////

asmblock _user_top()
        phantom;
        begin
        end
```

```
///////////////////////////////////////////////////////////////////////////
//
// _user_end
//
// Block for setting the end of user data.
//
///////////////////////////////////////////////////////////////////////////
asmblock _user_end()
        phantom;
        variable _$data_end;
        begin
        end

///////////////////////////////////////////////////////////////////////////
//
// _turnstile
//
// This phantom block prevents two GSPs in a temporal partitioning scheme
// from running into each other.  It regulates access to a code segment
// via a semaphore location. If that location is non-zero, it indicates
// that the segment is in use, and that this GSP must wait.
//
///////////////////////////////////////////////////////////////////////////
asmblock _turnstile(;semaphore)
        phantom;
        duration  5;
        begin
$1:             LDA semaphore                           // wait until next segme
                JGT $1
                LDA #1
                STA     semaphore                               // set next segm
        end

///////////////////////////////////////////////////////////////////////////
//
// _wait_seg_flag
//
// Wait untol segment flag reached the desired value.
//
///////////////////////////////////////////////////////////////////////////
asmblock _wait_seg_flag(value)(semaphore;)
        phantom;
        duration  5;
        begin
$1:             LDA semaphore                           // wait until next segme
                CMP     #value
                JGT $1
        end

///////////////////////////////////////////////////////////////////////////
//
// _free_seg
//
// This phantom block frees the segment that we just left.
// The location for the current segment's semaphore is passed so that
// we can decrement it.  We do a decrement
// rather than a clear to guarantee that the first segment of a
// timezone will be run through by all GSPs before the first GSP which loops
// back reenters it.
//
///////////////////////////////////////////////////////////////////////////
asmblock _free_seg(semaphore;)
        phantom;
        begin
                LDA semaphore                           // decrement usage count
                JEQ     $1
                SUB     #1
                STA semaphore
$1:
        end

///////////////////////////////////////////////////////////////////////////
//
// _wait_for_flags
//
// Load the wait flags register with the given mask, then wait for wait flags
// to be cleared.
```

```
//
////////////////////////////////////////////////////////////////////////////////
asmblock _wait_for_flags(wait_mask)()
        phantom;
        begin
                LDWS #wait_mask
$1:             JWF     $1
        end

////////////////////////////////////////////////////////////////////////////////
//
// _set_wait_mask
//
// Just load the wait flags register with the given mask.
//
////////////////////////////////////////////////////////////////////////////////
asmblock _set_wait_mask(wait_mask)()
        phantom;
        begin
                LDWS #wait_mask
        end

////////////////////////////////////////////////////////////////////////////////
//
// _jump_to
//
// Jump to the given address.
// Used to loop back to start of code for a time zone.
//
////////////////////////////////////////////////////////////////////////////////
asmblock _jump_to(loop_address)()
        phantom;
        begin
                JMP loop_address
        end

////////////////////////////////////////////////////////////////////////////////
// _copy
//
// Copy a single word from the source to the destination location.
// Used at the start of a segment to copy from output location to
// output location buffer.
//
////////////////////////////////////////////////////////////////////////////////
asmblock _copy(source; dest)
        phantom;
        begin
                LDA source
                STA dest
        end

////////////////////////////////////////////////////////////////////////////////
//
// _copy_address
//
// Copy the address of the source location to the destination location.
// Used in init code to set up the fifo pointers.
//
////////////////////////////////////////////////////////////////////////////////
asmblock _copy_address(source_size=1)(source[source_size], dest;)
        phantom;
        begin
                LDA #source
                STA dest
        end

////////////////////////////////////////////////////////////////////////////////
//
// _copy_constant
//
// Copy a constant to the destination location.
// Used in init code to set up the gsp count for the 0th segment.
//
////////////////////////////////////////////////////////////////////////////////
asmblock _copy_constant(constant) (dest;)
```

```
        phantom;
        begin
                LDA #constant
                STA dest
        end

////////////////////////////////////////////////////////////////////////////////
//
// _get_sync_input
//
// Wait for wait flags to be cleared, then reload the wait flags register
// with the given mask.
//
////////////////////////////////////////////////////////////////////////////////
asmblock _get_sync_input (wait_mask) (src_addr, dest_addr;)
        phantom;
        begin
                LDWS #wait_mask
    $1:         JWF $1
                LDA src_addr
                STA dest_addr
        end

////////////////////////////////////////////////////////////////////////////////
//
// _loop_bottom
//
// Bottom of repeat loop for repeating decimated/interpolated segments.
//
////////////////////////////////////////////////////////////////////////////////
asmblock _loop_bottom(loop_address)(loop_counter;)
        phantom;
        duration 4;
        begin
                LDA     loop_counter            // decrement loop counter
                SUB     #1
                STA     loop_counter
                JNE loop_address                // go to top of loop if not zero
        end

////////////////////////////////////////////////////////////////////////////////
//
// _to_phant_array
//
// Copy a wire value to a phantom array for repeated
// decimated/interpolated segments.
//
////////////////////////////////////////////////////////////////////////////////
asmblock _to_phant_array(array_ptr, wire_loc;)
        phantom;
        begin
                LDA wire_loc
                LDF     array_ptr
                STA [F]
                LDA     F
                ADD     #1
                STA     array_ptr
        end

////////////////////////////////////////////////////////////////////////////////
//
// _fr_phant_array
//
// Copy a wire value from a phantom array for repeated
// decimated/interpolated segments.
//
////////////////////////////////////////////////////////////////////////////////
asmblock _fr_phant_array(array_ptr, wire_loc;)
        phantom;
        begin
                LDF     array_ptr
                LDA     [F]
                STA wire_loc
                LDA     F
                ADD     #1
                STA     array_ptr
        end
```

```
////////////////////////////////////////////////////////////////////////////////
//
// _up_fr_ph_array
//
// Copy a wire value from a phantom array for repeated
// decimated/interpolated segments, upsampling to the current timezone
// rate.
//
////////////////////////////////////////////////////////////////////////////////
asmblock _up_fr_ph_array(up_fact)(array_ptr, wire_loc;)
        phantom;
        variable        phase;
        begin
                LDF     array_ptr
                LDA     [F]
                STA wire_loc
                LDA     phase                           // check phase to advanc
                ADD     #1
                STA     phase
                CMP     #up_fact-1                      // have we reached the u
                JLT     $1                                      // if not, don't
                LDA     #0
                STA     phase                           // advance and reset pha
                LDA     F
                ADD     #1
                STA     array_ptr
$1:
        end

////////////////////////////////////////////////////////////////////////////////
//
// _down_fr_ph_array
//
// Copy a wire value from a phantom array for repeated
// decimated/interpolated segments, downsampling to the next time
// zone rate (skip the appropriate number of samples).
//
////////////////////////////////////////////////////////////////////////////////
asmblock _down_fr_ph_array(down_factor)(array_ptr, wire_loc;)
        phantom;
        begin
                LDF     array_ptr
                LDA     [F]                                     // fetch next va
                STA wire_loc
                LDA     F
                ADD     #down_factor            // advance array ptr the correct
                STA     array_ptr
        end

////////////////////////////////////////////////////////////////////////////////
//
// _dupe_ph_array
//
// Copy contents of a phantom array.
//
////////////////////////////////////////////////////////////////////////////////
asmblock _dupe_ph_array(array_size)
                                        (from[array_size], to[array_size];)
        phantom;
        duration 4+(3*array_size);
        begin
                LDB     #from
                LDF     #to
                LDL     #array_size-1
                LDD     #1
$loop:
                LDA     [B+L]
                STA     [F+L]
                DJNE $loop
        end

////////////////////////////////////////////////////////////////////////////////
//
// _init_arr_ptr
//
```

```
// Copy the address of the source location to the destination location.
// Used to set up the "to array" pointers.
//
////////////////////////////////////////////////////////////////////////////////
asmblock _init_arr_ptr(source_size=1)(source[source_size], dest;)
        phantom;
        begin
                LDA #source
                STA dest
        end

////////////////////////////////////////////////////////////////////////////////
//
// _dummy
//
////////////////////////////////////////////////////////////////////////////////
asmblock _dummy()()
        phantom;
        begin
        end

////////////////////////////////////////////////////////////////////////////////
//
// _wait_nonz_compute
//
// If any compute flags have been counted, decrement them and proceed, else
// wait for the next one.
//
////////////////////////////////////////////////////////////////////////////////
asmblock _wait_nonz_compute(wait_mask)(compute_count;)
        phantom;
        begin
                LDA     compute_count           // test compute count
                JEQ     $1
                SUB     #1                                      // non-zero, so
                STA     compute_count
                JMP     $3
$1:             JWF     $1                                      // no built-up c
                LDWS #wait_mask                 // reset wait flags register
$3:
        end

////////////////////////////////////////////////////////////////////////////////
//
// _poll_compute_line
//
// Test if a compute has come in.  If so, reset compute flags and bump
// the compute count.
//
////////////////////////////////////////////////////////////////////////////////
asmblock _poll_compute_line(wait_mask)(compute_count;)
        phantom;
        begin
                JWF     $1                                      // test compute
                LDWS #wait_mask                 // reset wait flags register for
                LDA     compute_count           // bump compute count
                ADD     #1
                STA     compute_count
$1:
        end

////////////////////////////////////////////////////////////////////////////////
//
// _pr_reset
//
// Reset the probe when its fifo is half full.
//
////////////////////////////////////////////////////////////////////////////////
asmblock _pr_reset(probe_signal;)
        phantom;
        begin
                ldx     _$probe_out_buf_len_0           // get fifo length to wr
                lda     probe_signal                            // has probe com
                jne     done                                            // jump
                lda     _$probe_out_run_0               // see if fifo half full
                jeq     done                                            // jump
```

```
          stx   _$probe_out_buf_len_0          // reset probe fifo ptr
          stx   probe_signal                          // set probe com
done:
     end
```

APPENDIX F

| COLUMN 1 | COLUMN 2 |
|---|---|
| c58159 | 328000 |
| c58168 | 90082e |
| c58169 | 30084b |
| c5816a | 000000 |
| 300833 | 000000 |
| f58004 | 10084d |
| 318001 | 90084d |
| 900833 | 000000 |
| 300832 | 040000 |
| e5800c | 4c800e |
| 198001 | 5c0846 |
| 900832 | ac084e |
| 4c0489 | 740000 |
| 300834 | 5c8001 |
| d18013 | 740000 |
| 30048d | 4c0849 |
| e58013 | a4084c |
| ac0489 | 5c084c |
| ac0834 | 4c0848 |
| 300800 | 30084a |
| 21bfff | 108001 |
| 700837 | 5c800e |
| e58013 | 740000 |
| 300837 | 4c084c |
| 34800e | 5c8001 |
| 118001 | 4c0847 |
| 718837 | 30084a |
| ed801d | 108001 |
| 318835 | 5c800e |
| 900837 | 740000 |
| | 4c084c |

| COLUMN 3 | COLUMN 4 |
|---|---|
| 5c800e | 5c800e |
| 4c084e | 740000 |
| 30084a | 4c084f |
| 108001 | 5c8001 |
| 5c800e | 4c0847 |
| 30084d | 30084a |
| 112000 | 108001 |
| e1804b | 5c800e |
| 308001 | 740000 |
| c5804e | 4c084f |
| 308001 | 5c8001 |
| 240000 | 4c084f |

118001
90082d
30084d
112000
900850
000000
040000
4c800e
5c0846
ac0851
740000
5c8001
740000
4c0849
a4084f
5c084f
4c0848
30084a
108001

30084a
108001
5c800e
4c0851
30084a
108001
5c800e
300850
112000
e18078
308001
c5807b
308001
240000
118001
90082f
4c082d
5c082e
740000

COLUMN 5

928000
4dffff
30083c
71883a
e58089
4d8000
118001
71883c
ed808d
318838
90083c
ac0455
4c082f
5c082e
740000
740000
a40830
4c082c
300852
71fff8
ed80a4
718008
f580a4
35885b
44800e
320000
5c800e
308008
ed80a2
308004
c580a5

COLUMN 6

308001
c580a5
308003
900829
300864
900828
100829
900864
4c0830
300865
71fff8
ed80ba
718008
f580ba
35886e
44800e
320000
5c800e
308008
ed80b8
308004
c580bb
308001
c580bb
308003
90082a
300877
900826
10082a
900877
300878

COLUMN 7 ed80c7
300828
900827
4c0827
5c082d
740000
740000
a40824
300824
f180d3
240000
118001
f180d3
240000
90081e
30081e
35887b
c58186
a4087a
30087a
358885
c58186
a40822
30088f
700826
f180e3
300890
700826
ed80e3
300826
900825

COLUMN 8

4c0822
5c0822
740000
740000
a40831
4c0825
5c082f
740000
740000
a40823
300823
f180f4
240000
118001
f180f4
240000
90081d
300891
718911
f58100
340891
4c081d
ae8000
4c081e
ae8080
118001
900891
c58105
30081f
711000
ed8107

COLUMN 9

312000
90081c
300824
100823
900819
30081d
358993
c58186
a40992
300992
35899d
c58186
a40821
4c0819
5c09a7
740000
740000
a40818

COLUMN 10 ac045d
3009a8
718a28
f58132
3409a8
4c0821
ae8000
4c0822
ae8080
118001
9009a8
c58137
30081f
711000
ed8139
3189a9
9009a8
318000
c5813a 340841
300818
928000
4dffff
300841
71883f
e58121
4d8000
118001
718841
ed8125
31883d
900841
312000
900820
4c0821
5c0821
740000
740000
a4082b
300831
10082b
90081b
4c081b
5c0aa9

COLUMN 11

4c081a
300aaa
118001
718b2b
f58150
ae8000
900aaa
300832
f58150
318001
900832
300833
e58158
198001
900833
c58004
318001
900832
318000
900833
318835
900800
318835
900837
318838
90083c
31883d
900841
318001
900440
c58004

COLUMN 12 c58168
c58169
c5816a
440bff
d5816b
600bca
740000
740000
740000
c5816b
440bff
d58172
440bd8
740000
740000
740000
c58172
440bff
d58179
440be6
740000
740000
740000
c58179
440bff
d58180
440bf4
740000
740000
c58180
4e8007

COLUMN 13 ae8007
4c800e
5a8001
ae8006
4e8009
5a8005
740000
4e8008
5a8004
ae8009
740000
a68008
c68000

APPENDIX G

COLUMN 1

000000
000000
000000
000000
000000
000000
000000
000000
000000
000000
000000
000000
000000
000000
000000
000000
0000ff
0000ff
0000ff
0000ff
000000
000000
000000
000000
000000
000000
000000
000000
000000
000000

COLUMN 2

000000
000000
000000
000000
000000
000000
000000
000000
000000
000000
000000
000000
000000
000000
000000
000000
000000
000000
000000
000000
000000
000000
000000
000000
000000
000000
000000
000000
000000
000000
000000

COLUMN 3

000002
000835
000015
000000
000000
000000
000000
000000
000000
000000
000000
000000
000000
000000
000000
000000

COLUMN 4

000000
000000
000000
000000
000000
000000
000000
000000
000000
000000
000000
000000
000000
000000
000000

```
000004
000838
000005
000001
000000
100000
000000
000000
000004
00083d
000005
000001
000000
100000
000000
```

```
000000
000000
000000
000000
000000
000000
000000
000000
000000
000000
000000
000000
000000
000000
000000
000000
```

COLUMN 5

```
000000
000000
000000
000000
000000
000000
000000
000000
000000
000000
000000
000000
000000
000000
000000
000000
000000
000000
000000
000000
000000
000000
000000
000000
000000
000000
000000
000000
000000
000000
000000
```

COLUMN 6

```
000000
000000
000000
000000
000000
000000
000000
000000
000000
000000
000000
000000
000000
000000
000000
000000
000000
000000
000000
000000
000000
000000
000000
000000
000000
000000
000000
000000
000000
000000
000000
```

COLUMN 7

```
0000C0
000000
000000
```

COLUMN 8

```
000000
000000
000000
```

```
000000
000000
000000
000000
000000
000000
000000
000000
000000
000000
000000
000000
000000
000000
000000
000000
000000
000000
000000
000000
000000
000000
000000
000000
000000
000000
000000
000000
```

```
000000
000000
000000
000000
000000
000000
000000
000000
000000
000000
000000
000000
000000
000000
000000
000000
000000
000000
000000
000000
000000
000000
000000
000000
000000
000000
000000
000000
```

COLUMN 9

```
000000
000000
000000
000000
000000
000000
000000
000000
000000
000000
000000
000000
000000
000000
000000
000000
000000
000000
000000
000000
000000
000000
000000
000000
000000
000000
000000
```

COLUMN 10

```
000000
000000
000000
000000
000000
000000
000000
000000
000000
000000
000000
000000
000000
000000
000000
000000
000000
000000
000000
000000
000000
000000
000000
000000
000000
000000
000000
```

000000
000000
000000
000000

000000
000000
000000
000000

COLUMN 11

000000
000000
000000
000000
000000
000000
000000
000000
000000
000000
000000
000000
000000
000000
000000
000000
000000
000000
000000
000000
000000
000000
000000
000000
000000
000000
000000
000000
000000
000000
000000

COLUMN 12

000000
000000
000000
000000
000000
000000
000000
000000
000000
000000
000000
000000
000000
000000
000000
000000
000000
000000
000000
000000
000000
000000
000000
000000
000000
000000
000000
000000
000000
000000
000000

COLUMN 13

000000
000000
000000
000000
000000
000000
000000
000000
000000
000000
000000
000000
000000
000000
000000

COLUMN 14

000000
000000
000000
000000
000000
000000
000000
000000
000000
000000
000000
000000
000000
000000
000000
000000

000000
000000
000000
000000
000000
000000
000000
000000
000000
000000
000000
000000
000000
000000
000000
000000

COLUMN 15

000000
000000
000000
000000
000000
000000
000000
000000
000000
000000
000000
000000
000000
000000
000000
000000
000000
000000
000000
000000
000000
000000
000000
000000
000000
000000
000000
000000
000000
000000
000000

COLUMN 17

000000
000000
000000

000000
000000
000000
000000
000000
000000
000000
000000
000000
000000
000000
000000
000000
000000
000000

COLUMN 16

000000
000000
000000
000000
000000
000000
000000
000000
000000
000000
000000
000000
000000
000000
000000
000000
000000
000000
000000
000000
000000
000000
000000
000000
000000
000000
000000
000000
000000
000000
000000

COLUMN 18

000000
000000
000000

000000
000000
000000
000000
000000
000000
000000
000000
000000
000000
000000
000000
000000
000000
000000
000000
000000
000000
000000
000000
000000
000000
000000
000000
000000
000000
000000
000000

000000
000000
000000
000000
000000
000000
000000
000000
000000
000000
000000
000000
000000
000000
000000
000000
000000
000000
000000
000000
000000
000000
000000
000000
000000
000000
000000
000000

COLUMN 19

000000
000000
000000
000000
000000
000000
000000
000000
000000
000000
000000
000000
000000
000000
000000
000000
000000
000000
000000
000000
000000
000000
000000
000000
000000
000000
000000

COLUMN 20

000000
000000
000000
000000
000000
000000
000000
000000
000000
000000
000000
000000
000000
000000
000000
000000
000000
000000
000000
000000
000000
000000
000000
000000
000000
000000
000000

000000
000000
000000
000000

COLUMN 21

000000
000000
000000
000000
000000
000000
000000
000000
000000
000000
000000
000000
000000
000000
000000
000000
000000
000000
000000
000000
000000
000000
000000
000000
000000
000000
000000
000000
000000
000000
000000

COLUMN 23

000000
000000
000000
000000
000000
000000
000000
000000
000000
000000
000000
000000
000000
000000
000000

000000
000000
000000
000000

COLUMN 22

000000
000000
000000
000000
000000
000000
000000
000000
000000
000000
000000
000000
000000
000000
000000
000000
000000
000000
000000
000000
000000
000000
000000
000000
000000
000000
000000
000000
000000
000000
000000

COLUMN 24

000000
000000
000000
000000
000000
000000
000000
000000
000000
000000
000000
000000
000000
000000
000000
000000

000000
000000
000000
000000
000000
000000
000000
000000
000000
000000
000000
000000
000000
000000
000000
000000

000000
000000
000000
000000
000000
000000
000000
000000
000000
000000
000000
000000
000000
000000
000000

COLUMN 25

000000
000000
000000
000000
000000
000000
000000
000000
000000
000000
000000
000000
000000
000000
000000
000000
000000
000000
000000
000000
000000
000000
000000
000000
000000
000000
000000
000000
000000
000000
000000

COLUMN 26

000000
000000
000000
000000
000000
000000
000000
000000
000000
000000
000000
000000
000000
000000
000000
000000
000000
000000
000000
000000
000000
000000
000000
000000
000000
000000
000000
000000
000000
000000
000000

COLUMN 27

000000
000000
000000
000000

COLUMN 28

000000
000000
000000
000000

000000
000000
000000
000000
000000
000000
000000
000000
000000
000000
000000
000000
000000
000000
000000
000000
000000
000000
000000
000000
000000
000000
000000
000000
000000
000000
000000

000000
000000
000000
000000
000000
000000
000000
000000
000000
000000
000000
000000
000000
000000
000000
000000
000000
000000
000000
000000
000000
000000
000000
000000
000000
000000
000000

COLUMN 29

000000
000000
000000
000000
000000
000000
000000
000000
000000
000000
000000
000000
000000
000000
000000
000000
000000
000000
000000
000000
000000
000000
000000
000000
000000
000000
000000
000000
000000
000000
000000

COLUMN 30

000000
000000
000000
000000
000000
000000
000000
000000
000000
000000
000000
000000
000000
000000
000000
000000
000000
000000
000000
000000
000000
000000
000000
000000
000000
000000
000000
000000
000000
000000
000000

COLUMN 31

000000
000000
000000
000000
000000
000000
000000
000000
000000
000000
000000
000000
000000
000000
000000
000000
000000
000000
000000
000000
000000
000000
000000
000000
000000
000000
000000
000000
000000
000000
000000

COLUMN 32

000000
000000
000000
000000
000000
000000
000000
000000
000000
000000
000000
000000
000000
000000
000000
000000
000000
000000
000000
000000
000000
000000
000000
000000
000000
000000
000000
000000
000000
000000
000000

COLUMN 33

000000
000000
000000
000000
000000
000000
000000
000000
000000
000000
000000
000000
000000
000000
000000
000000
000000
000000
000000
000000
000000
000001
000000

COLUMN 34

000000
000000
000000
000000
000000
000000
000000
000000
e5ae5a
133333
092492
0860a9
6487ed
0020c4
000000
000000
000000
000000
000000
000000
fffff8
004000
008000

| | |
|---|---|
| 000000 | 010000 |
| 000000 | 020000 |
| 000000 | 040000 |
| 000000 | 080000 |
| 000000 | 100000 |
| 000000 | 200000 |
| 000000 | 000001 |
| 000000 | 000002 |

| COLUMN 35 | COLUMN 36 |
|---|---|
| 000040 | c03d7f |
| 000080 | 000000 |
| 000100 | 000000 |
| 000000 | 000000 |
| fffff8 | 000000 |
| 004000 | 0000db |
| 008000 | 000053 |
| 010000 | 0000a6 |
| 020000 | 000053 |
| 040000 | 7f6b44 |
| 080000 | c09411 |
| 100000 | 000000 |
| 200000 | 000000 |
| 000001 | 000000 |
| 000002 | 000000 |
| 000004 | 866667 |
| 000008 | 799999 |
| 000010 | 000892 |
| 000020 | 000000 |
| 000040 | 000000 |
| 000080 | 000000 |
| 000100 | 000000 |
| 000000 | 000000 |
| 866667 | 000000 |
| 799999 | 000000 |
| 000000 | 000000 |
| 0000d7 | 000000 |
| 00003d | 000000 |
| 00007b | 000000 |
| 00003d | 000000 |
| 7fc083 | 000000 |

| COLUMN 37 | COLUMN 38 |
|---|---|
| 000000 | 000000 |
| 000000 | 000000 |
| 000000 | 000000 |
| 000000 | 000000 |
| 000000 | 000000 |
| 000000 | 000000 |
| 000000 | 000000 |
| 000000 | 000000 |
| 000000 | 000000 |
| 000000 | 000000 |
| 000000 | 000000 |
| 000000 | 000000 |
| 000000 | 000000 |

000000
000000
000000
000000
000000
000000
000000
000000
000000
000000
000000
000000
000000
000000
000000
000000
000000
000000

000000
000000
000000
000000
000000
000000
000000
000000
000000
000000
000000
000000
000000
000000
000000
000000
000000
000000

COLUMN 39

000000
000000
000000
000000
000000
000000
000000
000000
000000
000000
000000
000000
000000
000000
000000
000000
000000
000000
000000
000000
000000
000000
000000
000000
000000
000000
000000
000000
000000
000000
000000

COLUMN 40

000000
000000
000000
000000
000000
000000
000000
000000
000000
000000
000000
000000
000000
000000
000000
000000
000000
000000
000000
000000
000000
000000
000000
000000
000000
000000
000000
000000
000000
000000
000000

COLUMN 41

000000
000000
000000
000000

COLUMN 42

000000
000000
000000
000000

000000
000000
000000
000000
000000
000000
000000
000000
000000
000000
000000
000000
000000
000000
000000
000000
000000
000000
000000
000000
000000
000000
000000
000000
000000
000000
000000

000000
000000
000000
000000
000000
000000
000000
000000
000000
000000
000000
000000
000000
000000
000000
000000
000000
000000
000000
000000
000000
000000
000000
000000
000000
000000
000000

COLUMN 43

000000
000000
000000
000000
000000
000000
000000
000000
000000
000000
000000
000000
000000
000000
000000
000000
000000
000000
000000
000000
000000
000000
000000
000000
000000
000000
000000
000000
000000
000000
000000

COLUMN 44

000000
000000
000000
000000
000000
000000
000000
000000
000000
000000
000000
00010f
00003d
00007b
00003d
7fc083
c03d7f
000000
000000
000000
000000
000113
000053
0000a6
000053
7f6b44
c09411
000000
000000
000000
000000

COLUMN 45

000000
000000
000000
000000
000000
000000
000000
000000
000000
000000
000000
000000
000000
000000
000000
000000
000000
000000
000000
000000
000000
000000
000000
000000
000000
000000
000000
000000
000000
000000
000000

COLUMN 46

000000
000000
000000
000000
000000
000000
000000
000000
000000
000000
000000
000000
000000
000000
000000
000000
000000
000000
000000
000000
000000
000000
000000
000000
000000
000000
000000
000000
000000
000000
000000

COLUMN 47

000000
000000
000000
000000
000000
000000
000000
000000
000000
000000
000000
000000
000000
000000
000000
000000
000000
000000
000000
000000
000000
000000
000000

COLUMN 48

000000
000000
000000
000000
000000
000000
000000
000000
000000
000000
000000
000000
000000
000000
000000
000000
000000
000000
000000
000000
000000
000000
000000

000000
000000
000000
000000
000000
000000
000000
000000

COLUMN 49

000000
000000
000000
000000
000000
000000
000000
000000
000000
000000
000000
000000
000000
000000
000000
000000
000000
000000
000000
000000
000000
000000
000000
000000
000000
000000
000000
000000
000000
000000
000000

COLUMN 51

000000
000000
000000
000000
000000
000000
000000
000000
000000
000000
000000
000000
000000

000000
000000
000000
000000
000000
000000
000000
000000

COLUMN 50

000000
000000
000000
000000
000000
000000
000000
000000
000000
000000
000000
000000
000000
000000
000000
000000
000000
000000
000000
000000
000000
000000
000000
000000
000000
000000
000000
000000
000000
000000
000000

COLUMN 52

000000
000000
000000
000000
000000
000000
000000
000000
000000
000000
000000
000000
000000

```
000000
000000
000000
000000
000000
000000
000000
000000
000000
000000
000000
000000
000000
000000
000000
000000
000000
000000
```

```
000000
000000
000000
000000
000000
000000
000000
000000
000000
000000
000000
000000
400000
000aab
000000
000000
000000
000000
```

COLUMN 53

```
000000
000000
000000
000000
000000
000000
000000
000000
000000
000000
000000
000000
000000
000000
000000
000000
000000
000000
000000
000000
000000
000000
000000
000000
000000
000000
000000
000000
000000
000000
000000
```

COLUMN 54

```
000000
000000
000000
000000
000000
000000
000000
000000
000000
000000
000000
000000
000000
000000
000000
000000
000000
000000
000000
000000
000000
000000
000000
000000
000000
000000
000000
000000
000000
000000
000000
```

COLUMN 55

```
000000
000000
000000
000000
```

COLUMN 56

```
000000
000000
000000
000000
```

```
000000
000000
000000
000000
000000
000000
000000
000000
000000
000000
000000
000000
000000
000000
000000
000000
000000
000000
000000
000000
000000
000000
000000
000000
000000
000000
000000
000000
000000
000000
000000
000000
000000
000000
000000
000000
000000
000000
000000
000000
000000
000000
000000
000000
000000
000000
000000
000000
```

APPENDIX H

| | | | |
|---|---|---|---|
| _%ram_configuration | 0400 | h | |
| _%reserved_1 | 0401 | f | |
| _%sproc_halt | 0406 | h | s |
| _%sproc_exit_break | 0407 | h | s |
| _%reserved_2 | 0408 | f | |
| _%serial_in_port_int_clk_0 | 0410 | h | |
| _%serial_in_port_int_clk_1 | 0411 | h | |
| _%serial_out_port_int_clk_0 | 0412 | h | |
| _%serial_out_port_int_clk_1 | 0413 | h | |
| _%reserved_3 | 0414 | f | |
| _%serial_in_port_buf_len_0 | 0440 | i | |
| _%serial_in_port_fifo_ix_len_0 | 0441 | i | |
| _%serial_in_port_fifo_start_0 | 0442 | h | |
| _%serial_in_port_config_0 | 0443 | h | |
| _%serial_in_port_reserved_0 | 0444 | h | |
| _%serial_in_port_buf_len_1 | 0448 | i | |
| _%serial_in_port_fifo_ix_len_1 | 0449 | i | |
| _%serial_in_port_fifo_start_1 | 044a | h | |
| _%serial_in_port_config_1 | 044b | h | |
| _%serial_in_port_reserved_1 | 044c | f | |
| _%serial_out_port_reserved_0 | 0450 | i | |
| _%serial_out_port_buf_len_0 | 0451 | i | |
| _%serial_out_port_fifo_start_0 | 0452 | h | |
| _%serial_out_port_config_0 | 0453 | h | |
| _%serial_out_port_decimation_0 | 0454 | i | |
| _%serial_out_port_run_0 | 0455 | h | |
| _%serial_out_port_wait_mask_0 | 0456 | h | |
| _%serial_out_port_fill_0 | 0457 | f | |
| _%serial_out_port_reserved_1 | 0458 | i | |
| _%serial_out_port_buf_len_1 | 0459 | i | |
| _%serial_out_port_fifo_start_1 | 045a | h | |
| _%serial_out_port_config_1 | 045b | h | |
| _%serial_out_port_decimation_1 | 045c | i | |
| _%serial_out_port_run_1 | 045d | h | |
| _%serial_out_port_wait_mask_1 | 045e | h | |

| | | | | |
|---|---|---|---|---|
| _%serial_out_port_fill_1 | 045f | | f | |
| _%reserved_ports | 0460 | | f | |
| _%probe_in_buf_len_0 | 0480 | | i | |
| _%probe_in_fifo_ix_len_0 | 0481 | | i | |
| _%probe_in_fifo_start_0 | 0482 | | h | |
| _%probe_in_data_addr_0 | 0483 | | h | |
| _%probe_in_gain_0 | 0484 | | h | |
| _%reserved_4 | 0485 | | f | |
| _%probe_out_reserved_0 | 0488 | | i | |
| _%probe_out_buf_len_0 | 0489 | | i | |
| _%probe_out_fifo_start_0 | 048a | | h | |
| _%probe_out_config_0 | 048b | | h | |
| _%probe_out_decimation_0 | 048c | | i | |
| _%probe_out_run_0 | 048d | | h | |
| _%probe_out_wait_mask_0 | 048e | | h | |
| _%probe_out_fill_0 | 048f | | f | |
| _%reserved_5 | 0490 | | f | |
| _%parallel_port_clear_flags | 04fb | | h | m |
| _%general_purpose_register | 04fc | | h | m |
| _%parallel_port_receive | 04fd | | f | m |
| _%gpio_register | 04fe | | h | m |
| _%parallel_port_mode_register | 04ff | | h | m |
| _%reserved_6 | 0500 | | f | |
| _%port_0_flag | 0800 | | h | |
| _%port_1_flag | 0801 | | h | |
| _%port_2_flag | 0802 | | h | |
| _%port_3_flag | 0803 | | h | |
| _%gen_0_flag | 0804 | | h | |
| _%gen_1_flag | 0805 | | h | |
| _%gen_2_flag | 0806 | | h | |
| _%gen_3_flag | 0807 | | h | |
| _%gen_4_flag | 0808 | | h | |
| _%gen_5_flag | 0809 | | h | |
| _%gen_6_flag | 080a | | h | |
| _%gen_7_flag | 080b | | h | |
| _%gen_8_flag | 080c | | h | |
| _%gen_9_flag | 080d | | h | |
| _%gen_10_flag | 080e | | h | |
| _%gen_11_flag | 080f | | h | |
| _%gen_12_flag | 0810 | | h | |
| _%gen_13_flag | 0811 | | h | |
| _%gen_14_flag | 0812 | | h | |
| _%gen_15_flag | 0813 | | h | |
| _%compute_0_flag | 0814 | | h | |
| _%compute_1_flag | 0815 | | h | |
| _%compute_2_flag | 0816 | | h | |
| _%compute_3_flag | 0817 | | h | |
| _wn000017 | 0818 | 0 | f | |
| _wn000016 | 0819 | 0 | f | |
| mag_1 | 081a | 0 | f | |
| _wn000018 | 081b | 0 | f | |
| rdone_1 | 081c | 0 | f | |
| raw_ina_1 | 081d | 0 | f | |
| raw_inb_1 | 081e | 0 | f | |
| capture_1 | 081f | 0 | f | |
| _wn000024 | 0820 | 0 | f | |
| filt_ina_1 | 0821 | 0 | f | |
| filt_inb_1 | 0822 | 0 | f | |
| _wn000020 | 0823 | 0 | f | |
| _wn000014 | 0824 | 0 | f | |
| _wn000012 | 0825 | 0 | f | |
| _wn000008 | 0826 | 0 | f | |
| _wn000013 | 0827 | 0 | f | |
| _wn000009 | 0828 | 0 | f | |
| _wn000007 | 0829 | 0 | f | |
| _wn000006 | 082a | 0 | f | |
| _wn000021 | 082b | 0 | f | |

| | | | | |
|---|---|---|---|---|
| _vn000005 | 082c | 0 | f | |
| _vn000003 | 082d | 0 | f | |
| _vn000001 | 082e | 0 | f | |
| _vn000002 | 082f | 0 | f | |
| _vn000004 | 0830 | 0 | f | |
| _vn000011 | 0831 | 0 | f | |
| _zone_0_seg_0 | 0832 | | i | |
| _zone_0_seg_1 | 0833 | | i | |
| _&probe_signal | 0834 | | h | |
| _zone_0_in_fifo_1 | 0835 | | f | |
| _zone_0_in_fifo_out_ptr_1 | 0837 | | h | |
| _zone_0_out_fifo_0 | 0838 | | f | |
| _zone_0_out_fifo_in_ptr_0 | 083c | | h | |
| _zone_0_out_fifo_1 | 083d | | f | |
| _zone_0_out_fifo_in_ptr_1 | 0841 | | h | |
| _%probe_fifo_0 | 0842 | | f | |
| osc1.y10 | 0846 | 0 | f | |
| osc1.y11 | 0847 | 0 | f | |
| osc1.y12 | 0848 | 0 | f | |
| osc1.y13 | 0849 | 0 | f | |
| osc1.y14 | 084a | 0 | f | |
| osc1.freq | 084b | 0 | f | |
| osc1.sinval | 084c | 0 | f | |
| osc1.sinramp | 084d | 0 | f | |
| osc1.sinsgn | 084e | 0 | f | |
| osc1.cosval | 084f | 0 | f | |
| osc1.cosramp | 0850 | 0 | f | |
| osc1.cossgn | 0851 | 0 | f | |
| scaler2.shift | 0852 | 0 | i | |
| scaler2.scaltab | 0853 | 0 | i | |
| int1.temp | 0864 | 0 | f | |
| scaler1.shift | 0865 | 0 | i | |
| scaler1.scaltab | 0866 | 0 | i | |
| int2.temp | 0877 | 0 | f | |
| hlim2.lower | 0878 | 0 | f | |
| hlim2.upper | 0879 | 0 | f | |
| filt2.out1 | 087a | 0 | f | |
| filt2.filter11.return | 087b | 0 | h | |
| filt2.filter11.b0 | 087c | 0 | f | |
| filt2.filter11.b1 | 087d | 0 | f | |
| filt2.filter11.b2 | 087e | 0 | f | |
| filt2.filter11.a1 | 087f | 0 | f | |
| filt2.filter11.a2 | 0880 | 0 | f | |
| filt2.filter11.x1 | 0881 | 0 | f | |
| filt2.filter11.x2 | 0882 | 0 | f | |
| filt2.filter11.y1 | 0883 | 0 | f | |
| filt2.filter11.y2 | 0884 | 0 | f | |
| filt2.filter12.return | 0885 | 0 | h | |
| filt2.filter12.b0 | 0886 | 0 | f | |
| filt2.filter12.b1 | 0887 | 0 | f | |
| filt2.filter12.b2 | 0888 | 0 | f | |
| filt2.filter12.a1 | 0889 | 0 | f | |
| filt2.filter12.a2 | 088a | 0 | f | |
| filt2.filter12.x1 | 088b | 0 | f | |
| filt2.filter12.x2 | 088c | 0 | f | |
| filt2.filter12.y1 | 088d | 0 | f | |
| filt2.filter12.y2 | 088e | 0 | f | |
| hlim1.lower | 088f | 0 | f | |
| hlim1.upper | 0890 | 0 | f | |
| raw.ptr | 0891 | 0 | i | |
| raw.outvector1 | 0892 | 0 | f | m |
| raw.outvector2 | 0912 | 0 | f | m |
| filt1.out1 | 0992 | 0 | f | |
| filt1.filter11.return | 0993 | 0 | h | |
| filt1.filter11.b0 | 0994 | 0 | f | |
| filt1.filter11.b1 | 0995 | 0 | f | |
| filt1.filter11.b2 | 0996 | 0 | f | |

| | | | | |
|---|---|---|---|---|
| filt1.filter11.a1 | 0997 | 0 | f | |
| filt1.filter11.a2 | 0998 | 0 | f | |
| filt1.filter11.x1 | 0999 | 0 | f | |
| filt1.filter11.x2 | 099a | 0 | f | |
| filt1.filter11.y1 | 099b | 0 | f | |
| filt1.filter11.y2 | 099c | 0 | f | |
| filt1.filter12.return | 099d | 0 | h | |
| filt1.filter12.b0 | 099e | 0 | f | |
| filt1.filter12.b1 | 099f | 0 | f | |
| filt1.filter12.b2 | 09a0 | 0 | f | |
| filt1.filter12.a1 | 09a1 | 0 | f | |
| filt1.filter12.a2 | 09a2 | 0 | f | |
| filt1.filter12.x1 | 09a3 | 0 | f | |
| filt1.filter12.x2 | 09a4 | 0 | f | |
| filt1.filter12.y1 | 09a5 | 0 | f | |
| filt1.filter12.y2 | 09a6 | 0 | f | |
| amp1.gain | 09a7 | 0 | f | |
| filtered.ptr | 09a8 | 0 | i | |
| filtered.outvector1 | 09a9 | 0 | f | m |
| filtered.outvector2 | 0a29 | 0 | f | m |
| amp2.gain | 0aa9 | 0 | f | |
| magnitud.ptr | 0aaa | 0 | i | |
| magnitud.outvector | 0aab | 0 | f | m |
| _$data_end | 0b2b | | f | |
| | | | | |
| _zone_0_turnstile_1.semaphore | 0833 | | i | |
| _zone_0_free_seg_0.semaphore | 0832 | | i | |
| _zone_0_pr_reset_0.probe_signal | 0834 | | h | |
| in1.out | 081f | 0 | f | m |
| adcin1.out | 082e | 0 | f | |
| adcin1.fifo | 0835 | | f | |
| adcin1.out_ptr | 0837 | | h | |
| adcin1.in_ptr | 0800 | | h | |
| osc1.sin | 082d | 0 | f | |
| osc1.cos | 082f | 0 | f | |
| mult2.ina | 082d | 0 | f | |
| mult2.inb | 082e | 0 | f | |
| mult2.out | 082c | 0 | f | |
| dacout1.in | 082f | 0 | f | |
| dacout1.fifo | 0838 | | f | |
| dacout1.buffer_ptr | 083c | | h | |
| dacout1.sync_addr | 0455 | | h | |
| mult5.ina | 082f | 0 | f | |
| mult5.inb | 082e | 0 | f | |
| mult5.out | 0830 | 0 | f | |
| scaler2.in | 082c | 0 | f | |
| scaler2.out | 0829 | 0 | f | |
| int1.in | 0829 | 0 | f | |
| int1.out | 0828 | 0 | f | |
| scaler1.in | 0830 | 0 | f | |
| scaler1.out | 082a | 0 | f | |
| int2.in | 082a | 0 | f | |
| int2.out | 0826 | 0 | f | |
| hlim2.in | 0828 | 0 | f | |
| hlim2.out | 0827 | 0 | f | |
| mult4.ina | 0827 | 0 | f | |
| mult4.inb | 082d | 0 | f | |
| mult4.out | 0824 | 0 | f | |
| fwr2.in | 0824 | 0 | f | |
| fwr2.out | 081e | 0 | f | |
| filt2.in | 081e | 0 | f | |
| filt2.out | 0822 | 0 | f | |
| filt2.filter11.in | 081e | 0 | f | |
| filt2.filter11.out | 087a | 0 | f | |
| filt2.filter12.in | 087a | 0 | f | |
| filt2.filter12.out | 0822 | 0 | f | |
| hlim1.in | 0826 | 0 | f | |

| | | | |
|---|---|---|---|
| hlim1.out | 0825 | 0 | f |
| mult6.ina | 0822 | 0 | f |
| mult6.inb | 0822 | 0 | f |
| mult6.out | 0831 | 0 | f |
| mult3.ina | 0825 | 0 | f |
| mult3.inb | 082f | 0 | f |
| mult3.out | 0823 | 0 | f |
| fwr1.in | 0823 | 0 | f |
| fwr1.out | 081d | 0 | f |
| raw.ina | 081d | 0 | f |
| raw.inb | 081e | 0 | f |
| raw.reset | 081f | 0 | f |
| raw.done | 081c | 0 | f |
| sum1.ina | 0824 | 0 | f |
| sum1.inb | 0823 | 0 | f |
| sum1.out | 0819 | 0 | f |
| filt1.in | 081d | 0 | f |
| filt1.out | 0821 | 0 | f |
| filt1.filter11.in | 081d | 0 | f |
| filt1.filter11.out | 0992 | 0 | f |
| filt1.filter12.in | 0992 | 0 | f |
| filt1.filter12.out | 0821 | 0 | f |
| amp1.in | 0819 | 0 | f |
| amp1.out | 0818 | 0 | f |
| dacout2.in | 0818 | 0 | f |
| dacout2.fifo | 083d | | f |
| dacout2.buffer_ptr | 0841 | | h |
| dacout2.sync_addr | 045d | | h |
| filtered.ina | 0821 | 0 | f |
| filtered.inb | 0822 | 0 | f |
| filtered.reset | 081f | 0 | f |
| filtered.done | 0820 | 0 | f |
| raw_done.in | 081c | 0 | f m |
| filt_don.in | 0820 | 0 | f m |
| sqr1.ina | 0821 | 0 | f |
| sqr1.inb | 0821 | 0 | f |
| sqr1.out | 082b | 0 | f |
| sum2.ina | 0831 | 0 | f |
| sum2.inb | 082b | 0 | f |
| sum2.out | 081b | 0 | f |
| amp2.in | 081b | 0 | f |
| amp2.out | 081a | 0 | f |
| magnitud.in | 081a | 0 | f |
| _zone_0_turnstile_0.semaphore | 0832 | | i |
| _zone_0_free_seg_1.semaphore | 0833 | | i |
| _zone_0_copy_constant_0.dest | 0832 | | i |
| _zone_0_copy_constant_1.dest | 0833 | | i |
| _zone_0_copy_address_0.source | 0835 | | f |
| _zone_0_copy_address_0.dest | 0800 | | h |
| _zone_0_copy_address_1.source | 0835 | | f |
| _zone_0_copy_address_1.dest | 0837 | | h |
| _zone_0_copy_address_2.source | 0838 | | f |
| _zone_0_copy_address_2.dest | 083c | | h |
| _zone_0_copy_address_3.source | 083d | | f |
| _zone_0_copy_address_3.dest | 0841 | | h |
| _zone_0_copy_constant_2.dest | 0440 | | i |

| | |
|---|---|
| $start | 0000 |
| _$loop_zone_0 | 0004 |
| _$start_gsp1 | 0159 |
| _$start_gsp2 | 0168 |
| _$start_gsp3 | 0169 |
| _$start_gsp4 | 016a |
| _zone_0_turnstile_1.$start | 0004 |
| _zone_0_turnstile_1.$1 | 0004 |
| _zone_0_free_seg_0.$start | 0008 |
| _zone_0_free_seg_0.$1 | 000c |

| | |
|---|---|
| _zone_0_pr_reset_0.$start | 000c |
| _zone_0_pr_reset_0.done | 0013 |
| adcin1.$start | 0013 |
| adcin1.$1 | 0013 |
| adcin1.$ok | 001d |
| osc1.$start | 0020 |
| osc1.setarg | 0020 |
| osc1.rv | 0027 |
| osc1.term1 | 002f |
| osc1.term2 | 0033 |
| osc1.term3 | 003a |
| osc1.term4 | 0041 |
| osc1.norm | 0046 |
| osc1.fix1 | 004b |
| osc1.adone | 004e |
| osc1.rvc | 0054 |
| osc1.termc1 | 005c |
| osc1.termc2 | 0060 |
| osc1.termc3 | 0067 |
| osc1.termc4 | 006e |
| osc1.normc | 0073 |
| osc1.fix1c | 0078 |
| osc1.done | 007b |
| mult2.$start | 007c |
| dacout1.$start | 0081 |
| dacout1.$1 | 0089 |
| dacout1.$ok | 008d |
| mult5.$start | 008f |
| scaler2.$start | 0094 |
| scaler2.scaler | 0094 |
| scaler2.unity | 00a4 |
| scaler2.valid | 009a |
| scaler2.right | 00a2 |
| scaler2.left | 00a0 |
| scaler2.done | 00a5 |
| int1.$start | 00a6 |
| scaler1.$start | 00aa |
| scaler1.scaler | 00aa |
| scaler1.unity | 00ba |
| scaler1.valid | 00b0 |
| scaler1.right | 00b8 |
| scaler1.left | 00b6 |
| scaler1.done | 00bb |
| int2.$start | 00bc |
| hlim2.$start | 00c0 |
| hlim2.done | 00c7 |
| mult4.$start | 00c8 |
| fwr2.$start | 00cd |
| fwr2.done | 00d3 |
| fwr2.isneg | 00cf |
| filt2.filter11.$start | 00d4 |
| filt2.filter11.postamble | 00d7 |
| filt2.filter12.$start | 00d8 |
| filt2.filter12.postamble | 00db |
| hlim1.$start | 00dc |
| hlim1.done | 00e3 |
| mult6.$start | 00e4 |
| mult3.$start | 00e9 |
| fwr1.$start | 00ee |
| fwr1.done | 00f4 |
| fwr1.isneg | 00f0 |
| raw.$start | 00f5 |
| raw.NO_STORE | 0100 |
| raw.CLR_DONE | 0105 |
| raw.SET_DONE | 0107 |
| raw.WRITE_DONE | 0108 |
| raw.DONE | 0109 |

```
sum1.$start                        0109
filt1.filter11.$start              010c
filt1.filter11.postamble           010f
filt1.filter12.$start              0110
filt1.filter12.postamble           0113
amp1.$start                        0114
dacout2.$start                     0119
dacout2.$1                         0121
dacout2.$ok                        0125
filtered.$start                    0127
filtered.NO_STORE                  0132
filtered.CLR_DONE                  0137
filtered.SET_DONE                  0139
filtered.WRITE_DONE                013a
filtered.DONE                      013b
sqr1.$start                        013b
sum2.$start                        0140
amp2.$start                        0143
magnitud.$start                    0148
magnitud.DONE                      0150
_zone_0_turnstile_0.$start         0150
_zone_0_turnstile_0.$1             0150
_zone_0_free_seg_1.$start          0154
_zone_0_free_seg_1.$1              0158
_zone_0_jump_to_0.$start           0158
_zone_0_copy_constant_0.$start     0159
_zone_0_copy_constant_1.$start     015b
_zone_0_copy_address_0.$start      015d
_zone_0_copy_address_1.$start      015f
_zone_0_copy_address_2.$start      0161
_zone_0_copy_address_3.$start      0163
_zone_0_copy_constant_2.$start     0165
_zone_0_jump_to_1.$start           0167
_zone_0_jump_to_2.$start           0168
_zone_0_jump_to_3.$start           0169
_zone_0_jump_to_4.$start           016a
$start                             016b
_%patch_ram_gsp1                   016b
_%patch_ram_gsp2                   0172
_%patch_ram_gsp3                   0179
_%patch_ram_gsp4                   0180
$start                             0186
form1                              0186

_%n_gsps                           000004    i
_%flag_locs                        000018    i
_%code_space_start                 000000    i
_%io_space_start                   000400    i
_%data_space_start                 000800    i
_%io_space_size                    000400    i
_%patch_ram_size                   00003b    i
_%code_space_size                  000400    i
_%data_space_size                  0003ad    i
_%first_serial_port                000000    i
_%last_serial_port                 000003    i
_%first_in_port                    000000    i
_%n_in_ports                       000002    i
_%first_out_port                   000002    i
_%n_out_ports                      000002    i
_%first_compute_line               000014    i
_%last_compute_line                000017    i
_%mc_freq_max                      000010    i
_%mc_freq                          000010    i
_%chip_gsp_rate                    30d400    i
_%abs_addr_fudge                   000000    i
sl0                                000014    i
sl1                                000015    i
```

```
cl2                 000016   i
cl3                 000017   i
no_cl               ffffff   i
no_trigger          ffffff   i
port0               000000   i
port1               000001   i
port2               000002   i
port3               000003   i
siport0             000000   i
siport1             000001   i
soport0             000002   i
soport1             000003   i
aport0              000000   i
mport0              000000   i
probe0              000000   i
gen0                000004   i
gen1                000005   i
gen2                000006   i
gen3                000007   i
gen4                000008   i
gen5                000009   i
gen6                00000a   i
gen7                00000b   i
gen8                00000c   i
gen9                00000d   i
gen10               00000e   i
gen11               00000f   i
gen12               000010   i
gen13               000011   i
gen14               000012   i
gen15               000013   i
w24                 000000   i
w16                 000001   i
w12                 000002   i
w8                  000003   i
lsb                 000000   i
msb                 000001   i
short               000001   i
long                000000   i
on                  000001   i
off                 000000   i
default             ffffff   i
intern              000001   i
extern              000000   i
port_0_mask         000001   i
port_1_mask         000002   i
port_2_mask         000004   i
port_3_mask         000008   i
gen_0_mask          000010   i
gen_1_mask          000020   i
gen_2_mask          000040   i
gen_3_mask          000080   i
gen_4_mask          000100   i
gen_5_mask          000200   i
gen_6_mask          000400   i
gen_7_mask          000800   i
gen_8_mask          001000   i
gen_9_mask          002000   i
gen_10_mask         004000   i
gen_11_mask         008000   i
gen_12_mask         010000   i
gen_13_mask         020000   i
gen_14_mask         040000   i
gen_15_mask         080000   i
compute_0_mask      100000   i
compute_1_mask      200000   i
compute_2_mask      400000   i
```

| | | |
|---|---|---|
| compute_3_mask | 800000 | i |
| _%in_clk_val_0 | 0000ff | i |
| _%in_clk_val_1 | 0000ff | i |
| _%out_clk_val_0 | 0000ff | i |
| _%out_clk_val_1 | 0000ff | i |
| _%probe_out_port_config_0 | 000065 | i |
| _%gpio_output_field | 000010 | i |
| gpio_0 | 000000 | i |
| gpio_1 | 000001 | i |
| gpio_2 | 000002 | i |
| gpio_3 | 000003 | i |
| rts_0 | 000000 | i |
| rts_1 | 000001 | i |
| rts_2 | 000002 | i |
| rts_3 | 000003 | i |
| _zone_0_out_fifo_0_depth | 000001 | i |
| _zone_0_out_fifo_1_depth | 000001 | i |
| _%probe_fifo_len_0 | 000004 | i |
| in1.%subr | ffffff | i |
| in1.%rate | 000000 | i |
| in1.%trigger | ffffff | i |
| adcin1.%subr | ffffff | i |
| adcin1.%trigger | 000000 | i |
| adcin1.%rate | 000b72 | i |
| adcin1.%config | 000015 | i |
| adcin1.%compute | 000014 | i |
| adcin1.fifo_size | 000002 | i |
| adcin1.buf_size | 000001 | i |
| osc1.%subr | ffffff | i |
| osc1.%trigger | ffffff | i |
| osc1.%rate | 000000 | i |
| osc1.%freq | 0020c4 | f |
| mult2.%subr | ffffff | i |
| dacout1.%dest | 000002 | i |
| dacout1.%trigger | ffffff | i |
| dacout1.%config | 000005 | i |
| dacout1.fifo_size | 000004 | i |
| dacout1.buf_size | 000001 | i |
| mult5.%subr | ffffff | i |
| scaler2.%subr | ffffff | i |
| scaler2.%shift | fffff8 | i |
| int1.%subr | ffffff | i |
| scaler1.%subr | ffffff | i |
| scaler1.%shift | fffff8 | i |
| int2.%subr | ffffff | i |
| hlim2.%subr | ffffff | i |
| hlim2.%lower | 866667 | f |
| hlim2.%upper | 799999 | f |
| mult4.%subr | ffffff | i |
| filt2.filter11.%subr | ffffff | i |
| filt2.filter11.%b0 | 00003d | f |
| filt2.filter11.%b1 | 00007b | f |
| filt2.filter11.%b2 | 00003d | f |
| filt2.filter11.%a1 | 7fe083 | f |
| filt2.filter11.%a2 | e03d7f | f |
| filt2.filter12.%subr | ffffff | i |
| filt2.filter12.%b0 | 000053 | f |
| filt2.filter12.%b1 | 0000a6 | f |
| filt2.filter12.%b2 | 000053 | f |
| filt2.filter12.%a1 | 7f8b44 | f |
| filt2.filter12.%a2 | e09411 | f |
| hlim1.%subr | ffffff | i |
| hlim1.%lower | 866667 | f |
| hlim1.%upper | 799999 | f |
| mult6.%subr | ffffff | i |
| mult3.%subr | ffffff | i |
| raw.%subr | ffffff | i |

| | | |
|---|---|---|
| raw.%length | 000080 | i |
| sum1.%subr | ffffff | i |
| filt1.filter11.%subr | ffffff | i |
| filt1.filter11.%b0 | 00003d | f |
| filt1.filter11.%b1 | 00007b | f |
| filt1.filter11.%b2 | 00003d | f |
| filt1.filter11.%a1 | 7fc083 | f |
| filt1.filter11.%a2 | c03d7f | f |
| filt1.filter12.%subr | ffffff | i |
| filt1.filter12.%b0 | 000053 | f |
| filt1.filter12.%b1 | 0000a6 | f |
| filt1.filter12.%b2 | 000053 | f |
| filt1.filter12.%a1 | 7f8b44 | f |
| filt1.filter12.%a2 | c09411 | f |
| amp1.%subr | ffffff | i |
| amp1.%gain | e00000 | f |
| dacout2.%dest | 000003 | i |
| dacout2.%trigger | ffffff | i |
| dacout2.%config | 000005 | i |
| dacout2.fifo_size | 000004 | i |
| dacout2.buf_size | 000001 | i |
| filtered.%subr | ffffff | i |
| filtered.%length | 000080 | i |
| raw_done.%subr | ffffff | i |
| filt_don.%subr | ffffff | i |
| sqr1.%subr | ffffff | i |
| sum2.%subr | ffffff | i |
| amp2.%subr | ffffff | i |
| amp2.%gain | 400000 | f |
| magnitud.%subr | ffffff | i |
| magnitud.%length | 000080 | i |
| _zone_0_jump_to_0.loop_address | 000004 | h |
| _zone_0_copy_constant_0.constant | 000001 | i |
| _zone_0_copy_constant_1.constant | 0000C0 | i |
| _zone_0_copy_address_0.source_size | 000002 | i |
| _zone_0_copy_address_1.source_size | 000002 | i |
| _zone_0_copy_address_2.source_size | 000002 | i |
| _zone_0_copy_address_3.source_size | 000002 | i |
| _zone_0_copy_constant_2.constant | 000001 | i |
| _zone_0_jump_to_1.loop_address | 000004 | h |
| _zone_0_jump_to_2.loop_address | 000168 | h |
| _zone_0_jump_to_3.loop_address | 000169 | h |
| _zone_0_jump_to_4.loop_address | 00016a | h |
| return | 000000 | i |
| b0 | 000001 | i |
| b1 | 000002 | i |
| b2 | 000003 | i |
| a1 | 000004 | i |
| a2 | 000005 | i |
| x1 | 000006 | i |
| x2 | 000007 | i |
| y1 | 000008 | i |
| y2 | 000009 | i |

0 0001 100000 0004

APPENDIX I

```
#include "sprocdef.h"

fix24_type const yhpdual_load[] = {
0x00019800, 0x00000000,
0xC5815900, 0xC5816800, 0xC5816900, 0xC5816A00, 0x30083400, 0xF5800400, 0x318001
00, 0x90083400,
0x30083300, 0xE5800C00, 0x19800100, 0x90083300, 0x4C048A00, 0x30083500, 0xD18013
00, 0x30048E00,
```

```
0xE5801300, 0xAC048A00, 0xAC083500, 0x30080100, 0x21BFFF00, 0x70083800, 0xE58013
00, 0x30083800,
0x34800E00, 0x11800100, 0x71883700, 0xED801D00, 0x31883500, 0x90083800, 0x328000
00, 0x90082F00,
0x30084C00, 0x00000000, 0x00000000, 0x10084E00, 0x90084E00, 0x00000000, 0x040000
00, 0x4C800E00,
0x5C084700, 0xAC084F00, 0x74000000, 0x5C800100, 0x74000000, 0x4C084A00, 0xA4084D
00, 0x5C084D00,
0x4C084900, 0x30084B00, 0x10800100, 0x5C800E00, 0x74000000, 0x4C084D00, 0x5C8001
00, 0x4C084800,
0x30084B00, 0x10800100, 0x5C800E00, 0x74000000, 0x4C084D00, 0x5C800100, 0x4C084D
00, 0x30084B00,
0x10800100, 0x5C800E00, 0x4C084F00, 0x30084B00, 0x10800100, 0x5C800E00, 0x30084E
00, 0x11200000,
0xE1804B00, 0x30800100, 0xC5804E00, 0x30800100, 0x24000000, 0x11800100, 0x90082E
00, 0x30084E00,
0x11200000, 0x90085100, 0x00000000, 0x04000000, 0x4C800E00, 0x5C084700, 0xAC0852
00, 0x74000000,
0x5C800100, 0x74000000, 0x4C084A00, 0xA4085000, 0x5C085000, 0x4C084900, 0x30084B
00, 0x10800100,
0x5C800E00, 0x74000000, 0x4C085000, 0x5C800100, 0x4C084800, 0x30084B00, 0x108001
00, 0x5C800E00,
0x74000000, 0x4C085000, 0x5C800100, 0x4C085000, 0x30084B00, 0x10800100, 0x5C800E
00, 0x4C085200,
0x30084B00, 0x10800100, 0x5C800E00, 0x30085100, 0x11200000, 0xE1807800, 0x308001
00, 0xC5807B00,
0x30800100, 0x24000000, 0x11800100, 0x90083000, 0x4C082E00, 0x5C082F00, 0x740000
00, 0x74000000,
0xA4082D00, 0x34083D00, 0x30083000, 0x92800000, 0x4DFFFF00, 0x30083D00, 0x71883A
00, 0xE5808900,
0x4D800000, 0x11800100, 0x71883C00, 0xED808D00, 0x31883800, 0x90083D00, 0xAC0456
00, 0x4C083000,
0x5C082F00, 0x74000000, 0x74000000, 0xA4083100, 0x4C082D00, 0x30085300, 0x71FFF8
00, 0xED80A400,
0x71800800, 0xF580A400, 0x35885B00, 0x44800E00, 0x32000000, 0x5C800E00, 0x308008
00, 0xED80A200,
0x30800400, 0xC580A500, 0x30800100, 0xC580A500, 0x30800300, 0x90082A00, 0x300865
00, 0x90082900,
0x10082A00, 0x90086500, 0x4C083100, 0x30086600, 0x71FFF800, 0xED80BA00, 0x718008
00, 0xF580BA00,
0x35886E00, 0x44800E00, 0x32000000, 0x5C800E00, 0x30800800, 0xED80B800, 0x308004
00, 0xC580BB00,
0x30800100, 0xC580BB00, 0x30800300, 0x90082B00, 0x30087800, 0x90082700, 0x10082B
00, 0x90087800,
0x30087900, 0x70082900, 0xF180C700, 0x30087A00, 0x70082900, 0xED80C700, 0x300829
00, 0x90082800,
0x4C082800, 0x5C082E00, 0x74000000, 0x74000000, 0xA4082500, 0x30082500, 0xF180D3
00, 0x24000000,
0x11800100, 0xF180D300, 0x24000000, 0x90081F00, 0x30081F00, 0x35887B00, 0xC58186
00, 0xA4087B00,
0x30087B00, 0x35888500, 0xC5818600, 0xA4082300, 0x30089000, 0x70082700, 0xF180E3
00, 0x30089100,
0x70082700, 0xED80E300, 0x30082700, 0x90082600, 0x4C082300, 0x5C082300, 0x740000
00, 0x74000000,
0xA4083200, 0x4C082600, 0x5C083000, 0x74000000, 0x74000000, 0xA4082400, 0x300824
00, 0xF180F400,
0x24000000, 0x11800100, 0xF180F400, 0x24000000, 0x90081E00, 0x30089200, 0x718911
00, 0xF5810000,
0x34089200, 0x4C081E00, 0xAE800000, 0x4C081F00, 0xAE808000, 0x11800100, 0x900892
00, 0xC5810500,
0x30082000, 0x71100000, 0xED810700, 0x31889200, 0x90089200, 0x31800000, 0xC58108
00, 0x31800100,
0x90081D00, 0x30082500, 0x10082400, 0x90081A00, 0x30081E00, 0x35899300, 0xC58186
00, 0xA4099300,
0x30099300, 0x35899D00, 0xC5818600, 0xA4082200, 0x4C081A00, 0x5C09A800, 0x740000
00, 0x74000000,
0xA4081900, 0x34084200, 0x30081900, 0x92800000, 0x4DFFFF00, 0x30084200, 0x71883F
00, 0xE5812100,
0x4D800000, 0x11800100, 0x71884100, 0xED812500, 0x31883D00, 0x90084200, 0xAC045E
00, 0x3009A900,
0x718A2800, 0xF5813200, 0x3409A900, 0x4C082200, 0xAE800000, 0x4C082300, 0xAE8080
00, 0x11800100,
0x9009A900, 0xC5813700, 0x30082000, 0x71100000, 0xED813900, 0x3189A900, 0x9009A9
00, 0x31800000,
0xC5813A00, 0x31800100, 0x90082100, 0x4C082200, 0x5C082200, 0x74000000, 0x740000
00, 0xA4082C00,
```

0x30083200, 0x10082C00, 0x90081C00, 0x4C081C00, 0x5C0AAA00, 0x74000000, 0x740000
00, 0xA4081B00,
0x340AAB00, 0x4C081B00, 0x300AAB00, 0x11800100, 0x718B2B00, 0xF5815000, 0xAE8000
00, 0x900AAB00,
0x30083300, 0xF5815000, 0x31800100, 0x90083300, 0x30083400, 0xE5815800, 0x198001
00, 0x90083400,
0xC5800400, 0x31800100, 0x90083300, 0x31800000, 0x90083400, 0x31883500, 0x900801
00, 0x31883500,
0x90083800, 0x31883800, 0x90083D00, 0x31883D00, 0x90084200, 0x31800100, 0x900441
00, 0xC5800400,
0xC5816800, 0xC5816900, 0xC5816A00, 0x440C0000, 0xD5816B00, 0x600BCB00, 0x740000
00, 0x74000000,
0x74000000, 0xC5816B00, 0x440C0000, 0xD5817200, 0x440BD900, 0x74000000, 0x740000
00, 0x74000000,
0xC5817200, 0x440C0000, 0xD5817900, 0x440BE700, 0x74000000, 0x74000000, 0x740000
00, 0xC5817900,
0x440C0000, 0xD5818000, 0x440BF500, 0x74000000, 0x74000000, 0xC5818000, 0x4E8007
00, 0x5E800300,
0x74000000, 0x4E800600, 0x5A800200, 0xAE800700, 0x4C800E00, 0x5A800100, 0xAE8006
00, 0x4E800900,
0x5A800500, 0x74000000, 0x4E800800, 0x5A800400, 0xAE800900, 0x74000000, 0xA68008
00, 0xC6800000,
0x0000F200, 0x00041000,
0x0000FF00, 0x0000FF00, 0x0000FF00, 0x0000FF00, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000200, 0x00083500, 0x00001500, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000400, 0x00083800, 0x00000500, 0x00000100, 0x00000000, 0x100000
00, 0x00000000,
0x00000000, 0x00000400, 0x00083D00, 0x00000500, 0x00000100, 0x00000000, 0x100000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,

```
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000,
0x00031800, 0x00081400,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000100, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0xE5AE5A00, 0x13333300, 0x09249200, 0x0860A900, 0x6487ED
00, 0x0020C400,
0x00000000, 0x00000000, 0x00000000, 0x00000000, 0x00000000, 0x00000000, 0xFFFFF8
00, 0x00400000,
0x00800000, 0x01000000, 0x02000000, 0x04000000, 0x08000000, 0x10000000, 0x200000
00, 0x00000100,
0x00000200, 0x00000400, 0x00000800, 0x00001000, 0x00002000, 0x00004000, 0x000080
00, 0x00010000,
0x00000000, 0xFFFFF800, 0x00400000, 0x00800000, 0x01000000, 0x02000000, 0x040000
00, 0x08000000,
0x10000000, 0x20000000, 0x00000100, 0x00000200, 0x00000400, 0x00000800, 0x000010
00, 0x00002000,
0x00004000, 0x00008000, 0x00010000, 0x00000000, 0x86666700, 0x79999900, 0x000000
00, 0x0000D700,
0x00003E00, 0x00007D00, 0x00003E00, 0x7FC08300, 0xC03D7E00, 0x00000000, 0x000000
00, 0x00000000,
0x00000000, 0x0000DB00, 0x00005300, 0x0000A700, 0x00005300, 0x7F6B4400, 0xC09410
00, 0x00000000,
0x00000000, 0x00000000, 0x00000000, 0x86666700, 0x79999900, 0x00089200, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
```

```
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00010F00,
0x00003E00, 0x00007D00, 0x00003E00, 0x7FC08300, 0xC03D7E00, 0x00000000, 0x000000
00, 0x00000000,
0x00000000, 0x00011300, 0x00005300, 0x0000A700, 0x00005300, 0x7F6B4400, 0xC09410
00, 0x00000000,
0x00000000, 0x00000000, 0x00000000, 0xC0000000, 0x0009A900, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
```

```
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x40000000, 0x000AAB
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000, 0x00000000, 0x00000000, 0x00000000, 0x00000000, 0x000000
00, 0x00000000,
0x00000000, 0x00000000 } ;
fix24_type const yhpdual_load_end = { 0x00BADBAD } ;
```

APPENDIX J

```
/*
  Copyright (c) Star Semiconductor, Inc. 1991. All Rights Reserved.
  This material may not be copied or used without prior written permission.

 * $Header: /home/solus/users4/release/CVS/link1/funlib/maintest.c,v 1.1 1991/10
/02 12:27:10 krassow Exp $
 * $Id: maintest.c,v 1.1 1991/10/02 12:27:10 krassow Exp $
 * $Revision: 1.1 $
 */

/*************************************************************************

                      maintest.c

*************************************************************************
```

```
This file is a skeleton (stub) of what a SMI application main.c file
should look like.

*/


/********************/
/*    requires      */
/********************/
/* SPROC specific interface declares */
#include "sprocdef.h"
#include "sproclib.h"

/* application specific declarations */
#include "yhpdual.h"
#include "yhpdual.blk"

/********************/
/*   exceptions     */
/********************/
/* No exceptions    */
/********************/
/*    constants     */
/********************/
#define OUTROW 12
#define OUTCOL  1

#define pi 3.1415926
#define Rref 1000.0
#define Fosc (2930 * 0.0002)
#define real_length 256

/********************/
/*     types        */
/********************/
/* definition section specific to impedance analyzers */
enum { REAL, MAG, OHMS } Display;
enum { AVE, SNAP } Function;
unsigned int Samples;

typedef struct complex_tag {
        double real;
    double imag;
} complex;

typedef struct vector_tag {
        double magnitude;
        double phase;
} vector;

/********************/
/*      data        */
/********************/

unsigned int Debug;
unsigned int Done;
unsigned int loops;
/* This declaration requires that the real sink length matches the  */
/*  imaginary sink length which is a reasonable assumption.         */
sdata Sreal[real_length];
sdata Simag[real_length];
complex Answer[real_length];
complex Final;
double  Rut, Cut; /* device under test */

/********************/
/*     macros       */
/********************/

/********************/
/*    functions     */
/********************/


vector complex2vector(complex cvalue);
double r_to_d(double rad);
```

```
double scale(double val);
void fix24_to_str(char *str, fix24_type src);

/* interface declarations for my routines */
void get_new_data();
void calc();
void show_front_panel();
void update_display();
void delay_to_settle();
vector complex_to_vector(complex cval);
void delay(unsigned int count);
void delay_to_settle(void);

/*******************/
/*      code       */
/*******************/


unsigned int main()
{
    loops = 0;
    Done = 0;
    Function = AVE;
    Display = MAG;
    Samples = real_length;

        /* initialize hardware */
        sproc_reset(&yhpdual_control);

        /* load sproc */
        sproc_load(&yhpdual_code, &yhpdual_load[0]);

        /* display screen header */
        show_front_panel();

        /* start sproc */
    sproc_start(&yhpdual_control);

    /* perform the following forever */
    do {

        /* sanity checker */
        if (loops < 10000)
            loops++;
        else
            loops = 0;

        /* check for keyboard strike */
        if (check_for_key()) {
            delay_to_settle();
        }

        /* get data from sproc */
        get_new_data();

        /* calculate result */
        calc();

        /* refresh output */
                update_display();

        delay(200);

    } while (!Done);

        /* perform any tidying up needed */
        clean_exit();

        return(0);

} /* end of main */

/******************************************************************/
/*                     SPROC specific routines                    */
/******************************************************************/
void get_new_data()
```

```
{
    unsigned int i;

    /* start new SINK collections */
    yhpdual.capture_1.int24 = 0;

    /* wait for sink to become full */
    while (!yhpdual.rdone_1.int24)
        delay(1);

    /* grab data from sproc */
    for (i=0; i<Samples; i++) {
        Sreal[i] = yhpdual.raw.outvector1[i];
        Simag[i] = yhpdual.raw.outvector2[i];
        Answer[i].real = fix24_to_double(Sreal[i].fix24);
        Answer[i].imag = fix24_to_double(Simag[i].fix24);
    }

} /* end of get_new_data */

void update_display()
{
char value_str[80];
char funct_str[12];
vector answer_vector;
unsigned int i;
char temp_real_str[20], temp_imag_str[20];

    switch (Display) {
            case REAL :
                    sprintf(value_str,
          "Real = %10.5f Imaginary = %10.5f                              ",
                  Final.real, Final.imag);
                    break;
            case MAG  :
          answer_vector = complex_to_vector(Final);
                    sprintf(value_str,
          "Magnitude = %10.5f Phase = %7.3f (radians) %8.3f (degrees)",
                  answer_vector.magnitude, answer_vector.phase,
                  r_to_d(answer_vector.phase));
                    break;

        case OHMS :
            sprintf(value_str,
            "Resistive value = %10.5f Impedance value = %10.5f            ",
                Rut, Cut);
            break;

                default :
                        sprintf(value_str, "Invalid Display mode (%d)", Display)
;
                        break;
        }

        switch (Function) {
                case SNAP : strcpy(funct_str, "Snapshot: "); break;
                case AVE  : strcpy(funct_str, " Average: "); break;
                default   : strcpy(funct_str, "Func????: "); break;
        }

        term_set_position(OUTROW, OUTCOL);
        term_print(funct_str);
        term_print(value_str);

/* display sanity check */
    sprintf(value_str, "loop=%5d", loops);
    term_set_position(OUTROW+1, OUTCOL);
    term_print(value_str);

/* display other values for reference */
    if (Debug) {

        strcpy(value_str, "raw  real  raw  imag       Xr            Xc\n");
        term_set_position(OUTROW+2, OUTCOL);
        term_print(value_str);

        for (i=0; i<10; i++) {
```

```
        fix24_to_str(temp_real_str, yhpdual.raw.outvector1[i].fix24);
        fix24_to_str(temp_imag_str, yhpdual.raw.outvector2[i].fix24);

        sprintf(value_str, "%s %08lx %s %08lx %12.5f %12.5f\n",
            temp_real_str, Sreal[i].int24,
            temp_imag_str, Simag[i].int24,
               fix24_to_double(Sreal[i].fix24),
               fix24_to_double(Simag[i].fix24)          );

           term_print(value_str);
        }
    } /* end of Debug */

} /* end of update display */
/*******************************************************************/
/*                          end SPROC specific routines           */
/*******************************************************************/

/*******************************************************************/
/*                     Application specific routines              */
/*******************************************************************/
void calc()
{
unsigned int i;
double real_tot = 0.0;
double imag_tot = 0.0;

    /* compute final answer differently depending on mode */
    switch (Function) {
        case AVE:
            for (i=0; i<Samples; i++) {
                real_tot += Answer[i].real;
                imag_tot += Answer[i].imag;
            }
            Final.real = real_tot / Samples;
            Final.imag = imag_tot / Samples;
            break;

        case SNAP :
        default:
            Final.real = Answer[0].real;
            Final.imag = Answer[0].imag;
            break;
    }

    /* Final answer is always related to reference scaling factor */
    /* Xc = 1 / (2 * pi * Fosc * C), so
    /*    Cut = 1 / ( 2 * pi * Fosc * Rref)
    /*
    /* Rut = Rref * real */


    Final.real = scale(Final.real);
    Final.imag = scale(Final.imag);

    Rut = Rref * Final.real;
    Cut = 1.0 / ( 2 * pi * Fosc * Rref * Final.imag);

} /* end of calc */


unsigned int fact(unsigned int a)
{
unsigned int i = a;

    while (a > 1) {
        i = i * a;
        a--;
    }
    return(i);
}

void fix24_to_str(char *str, fix24_type src)
{
    sprintf(str, "%06lx", src);
}
```

```
double scale(double val)
{    return(val * pi / 2.0);
} /* end of scale */

double r_to_d(double rad)
{    return(rad / pi * 180.0);
} /* end of r_to_d */


void show_front_panel()
{
        term_set_position(2, 30); term_print("+-------------------------+");
        term_set_position(3, 30); term_print("| YHP Impedance Analyzer |");
        term_set_position(4, 30); term_print("+-------------------------+");

        term_set_position(6, 1); term_print("Display modes are: Magnitude/Phase
or Real/Imaginary");

        term_set_position(8, 1); term_print("Functions are: Average or Snapshot\
n");

        /* reserve this line for values output */
    term_set_position(OUTROW, OUTCOL);
    term_print("                                    ");

    term_set_position(15, 10); term_print("F1 to change function");
    term_set_position(16, 10); term_print("F2 to change display mode");
    term_set_position(17, 10); term_print("F10 to terminate");

} /* end of show_front_panel */
/* convert complex value (real and imag) to vector (magnitude and phase) */
vector complex_to_vector(complex cval)
{
vector ret_val;

    /* compute magnitude */
    /* use multiply times self instead of pow function */
    ret_val.magnitude = sqrt((cval.real * cval.real) + (cval.imag * cval.imag));

    /* compute phase angle */
    if (cval.real == 0.0)
            ret_val.phase = 0.0;
    else
        ret_val.phase = atan( cval.imag / cval.real);

    return(ret_val);

} /* end of complex_to_vector */

/* this delay routine is target specific */
void delay(unsigned int count)
{
unsigned int i, j, k;

    for (k=1; k<=count; k++) {
        for (i=0; i<1000; i++) {
            j = i;
        }
    }
} /* end of delay */

void delay_to_settle()
{
    delay(20);
}
```

APPENDIX K

```
/* Generated by symtran.exe $Revision: 1.5 $ */
#include "sprocdef.h"
```

```
    sproc_code_space_type    yhpdual_code;
    sproc_control_space_type yhpdual_control;
before_volatile struct (                                /* 0800   */
    sdata _reserved_0000;                               /* 0801   */
    sdata _reserved_0001;                               /* 0802   */
    sdata _reserved_0002;                               /* 0803   */
    sdata _reserved_0003;                               /* 0804   */
    sdata _reserved_0004;                               /* 0805   */
    sdata _reserved_0005;                               /* 0806   */
    sdata _reserved_0006;                               /* 0807   */
    sdata _reserved_0007;                               /* 0808   */
    sdata _reserved_0008;                               /* 0809   */
    sdata _reserved_0009;                               /* 080a   */
    sdata _reserved_0010;                               /* 080b   */
    sdata _reserved_0011;                               /* 080c   */
    sdata _reserved_0012;                               /* 080d   */
    sdata _reserved_0013;                               /* 080e   */
    sdata _reserved_0014;                               /* 080f   */
    sdata _reserved_0015;                               /* 0810   */
    sdata _reserved_0016;                               /* 0811   */
    sdata _reserved_0017;                               /* 0812   */
    sdata _reserved_0018;                               /* 0813   */
    sdata _reserved_0019;                               /* 0814   */
    sdata _reserved_0020;                               /* 0815   */
    sdata _reserved_0021;                               /* 0816   */
    sdata _reserved_0022;                               /* 0817   */
    sdata _reserved_0023;                               /* 0818   */
    sdata _reserved_0024;                               /* 0819   */
    sdata _reserved_0025;                               /* 081a   */
    sdata mag_1;                                        /* 081b   */
    sdata _reserved_0026;                               /* 081c   */
    sdata rdone_1;                                      /* 081d   */
    sdata raw_ina_1;                                    /* 081e   */
    sdata raw_inb_1;                                    /* 081f   */
    sdata capture_1;                                    /* 0820   */
    sdata _reserved_0027;                               /* 0821   */
    sdata filt_ina_1;                                   /* 0822   */
    sdata filt_inb_1;                                   /* 0823   */
    sdata _reserved_0028;                               /* 0824   */
    sdata _reserved_0029;                               /* 0825   */
    sdata _reserved_0030;                               /* 0826   */
    sdata _reserved_0031;                               /* 0827   */
    sdata _reserved_0032;                               /* 0828   */
    sdata _reserved_0033;                               /* 0829   */
    sdata _reserved_0034;                               /* 082a   */
    sdata _reserved_0035;                               /* 082b   */
    sdata _reserved_0036;                               /* 082c   */
    sdata _reserved_0037;                               /* 082d   */
    sdata _reserved_0038;                               /* 082e   */
    sdata _reserved_0039;                               /* 082f   */
    sdata _reserved_0040;                               /* 0830   */
    sdata _reserved_0041;                               /* 0831   */
    sdata _reserved_0042;                               /* 0832   */
    sdata _reserved_0043;                               /* 0833   */
    sdata _reserved_0044;                               /* 0834   */
    sdata _reserved_0045;                               /* 0835   */
    sdata _reserved_0046[2];                            /* 0837   */
    sdata _reserved_0047;
```

```
sdata _reserved_0052[4];                    /* 0842   */
struct {
    sdata _reserved_0053;                   /* 0846   */
    sdata _reserved_0054;                   /* 0847   */
    sdata _reserved_0055;                   /* 0848   */
    sdata _reserved_0056;                   /* 0849   */
    sdata _reserved_0057;                   /* 084a   */
    sdata _reserved_0058;                   /* 084b   */
    sdata _reserved_0059;                   /* 084c   */
    sdata _reserved_0060;                   /* 084d   */
    sdata _reserved_0061;                   /* 084e   */
    sdata _reserved_0062;                   /* 084f   */
    sdata _reserved_0063;                   /* 0850   */
    sdata _reserved_0064;                   /* 0851   */
} _reserved_0065;
struct {
    sdata _reserved_0066;                   /* 0852   */
    sdata _reserved_0067[17];               /* 0853   */
} _reserved_0068;
struct {
    sdata _reserved_0069;                   /* 0864   */
} _reserved_0070;
struct {
    sdata _reserved_0071;                   /* 0865   */
    sdata _reserved_0072[17];               /* 0866   */
} _reserved_0073;
struct {
    sdata _reserved_0074;                   /* 0877   */
} _reserved_0075;
struct {
    sdata _reserved_0076;                   /* 0878   */
    sdata _reserved_0077;                   /* 0879   */
} _reserved_0078;
struct {
    sdata _reserved_0079;                   /* 087a   */
    struct {
        sdata _reserved_0080;               /* 087b   */
        sdata _reserved_0081;               /* 087c   */
        sdata _reserved_0082;               /* 087d   */
        sdata _reserved_0083;               /* 087e   */
        sdata _reserved_0084;               /* 087f   */
        sdata _reserved_0085;               /* 0880   */
        sdata _reserved_0086;               /* 0881   */
        sdata _reserved_0087;               /* 0882   */
        sdata _reserved_0088;               /* 0883   */
        sdata _reserved_0089;               /* 0884   */
    } _reserved_0090;
    struct {
        sdata _reserved_0091;               /* 0885   */
        sdata _reserved_0092;               /* 0886   */
        sdata _reserved_0093;               /* 0887   */
        sdata _reserved_0094;               /* 0888   */
        sdata _reserved_0095;               /* 0889   */
        sdata _reserved_0096;               /* 088a   */
        sdata _reserved_0097;               /* 088b   */
        sdata _reserved_0098;               /* 088c   */
        sdata _reserved_0099;               /* 088d   */
        sdata _reserved_0100;               /* 088e   */
    } _reserved_0101;
} _reserved_0102;
struct {
    sdata _reserved_0103;                   /* 088f   */
```

```
        sdata outvector1[128];
        sdata outvector2[128];           /* 0892 m */
    } raw;                               /* 0912 m */
    struct {
        sdata _reserved_0107;
        struct {                         /* 0992   */
            sdata _reserved_0108;
            sdata _reserved_0109;        /* 0993   */
            sdata _reserved_0110;        /* 0994   */
            sdata _reserved_0111;        /* 0995   */
            sdata _reserved_0112;        /* 0996   */
            sdata _reserved_0113;        /* 0997   */
            sdata _reserved_0114;        /* 0998   */
            sdata _reserved_0115;        /* 0999   */
            sdata _reserved_0116;        /* 099a   */
            sdata _reserved_0117;        /* 099b   */
        } _reserved_0118;                /* 099c   */
        struct {
            sdata _reserved_0119;
            sdata _reserved_0120;        /* 099d   */
            sdata _reserved_0121;        /* 099e   */
            sdata _reserved_0122;        /* 099f   */
            sdata _reserved_0123;        /* 09a0   */
            sdata _reserved_0124;        /* 09a1   */
            sdata _reserved_0125;        /* 09a2   */
            sdata _reserved_0126;        /* 09a3   */
            sdata _reserved_0127;        /* 09a4   */
            sdata _reserved_0128;        /* 09a5   */
        } _reserved_0129;                /* 09a6   */
    } _reserved_0130;
    struct {
        sdata _reserved_0131;
    } _reserved_0132;                    /* 09a7   */
    struct {
        sdata _reserved_0133;
        sdata outvector1[128];           /* 09a8   */
        sdata outvector2[128];           /* 09a9 m */
    } filtered;                          /* 0a29 m */
    struct {
        sdata _reserved_0134;
    } _reserved_0135;                    /* 0aa9   */
    struct {
        sdata _reserved_0136;
        sdata outvector[128];            /* 0aaa   */
    } magnitud;                          /* 0aab m */
} after_volatile yhpdual;
```

APPENDIX L

```
/* Generated by symtran.exe $Revision: 1.5 $ */
#include "sprocdef.h"

    extern sproc_code_space_type    yhpdual_code;
    extern sproc_control_space_type yhpdual_control;
extern before_volatile struct {
    sdata _reserved_0000;                          /* 0800   */
    sdata _reserved_0001;                          /* 0801   */
    sdata _reserved_0002;                          /* 0802   */
```

```
sdata _reserved_0003;                    /* 0803   */
sdata _reserved_0004;                    /* 0804   */
sdata _reserved_0005;                    /* 0805   */
sdata _reserved_0006;                    /* 0806   */
sdata _reserved_0007;                    /* 0807   */
sdata _reserved_0008;                    /* 0808   */
sdata _reserved_0009;                    /* 0809   */
sdata _reserved_0010;                    /* 080a   */
sdata _reserved_0011;                    /* 080b   */
sdata _reserved_0012;                    /* 080c   */
sdata _reserved_0013;                    /* 080d   */
sdata _reserved_0014;                    /* 080e   */
sdata _reserved_0015;                    /* 080f   */
sdata _reserved_0016;                    /* 0810   */
sdata _reserved_0017;                    /* 0811   */
sdata _reserved_0018;                    /* 0812   */
sdata _reserved_0019;                    /* 0813   */
sdata _reserved_0020;                    /* 0814   */
sdata _reserved_0021;                    /* 0815   */
sdata _reserved_0022;                    /* 0816   */
sdata _reserved_0023;                    /* 0817   */
sdata _reserved_0024;                    /* 0818   */
sdata _reserved_0025;                    /* 0819   */
sdata mag_l;                             /* 081a   */
sdata _reserved_0026;                    /* 081b   */
sdata rdone_l;                           /* 081c   */
sdata raw_ina_l;                         /* 081d   */
sdata raw_inb_l;                         /* 081e   */
sdata capture_l;                         /* 081f   */
sdata _reserved_0027;                    /* 0820   */
sdata filt_ina_l;                        /* 0821   */
sdata filt_inb_l;                        /* 0822   */
sdata _reserved_0028;                    /* 0823   */
sdata _reserved_0029;                    /* 0824   */
sdata _reserved_0030;                    /* 0825   */
sdata _reserved_0031;                    /* 0826   */
sdata _reserved_0032;                    /* 0827   */
sdata _reserved_0033;                    /* 0828   */
sdata _reserved_0034;                    /* 0829   */
sdata _reserved_0035;                    /* 082a   */
sdata _reserved_0036;                    /* 082b   */
sdata _reserved_0037;                    /* 082c   */
sdata _reserved_0038;                    /* 082d   */
sdata _reserved_0039;                    /* 082e   */
sdata _reserved_0040;                    /* 082f   */
sdata _reserved_0041;                    /* 0830   */
sdata _reserved_0042;                    /* 0831   */
sdata _reserved_0043;                    /* 0832   */
sdata _reserved_0044;                    /* 0833   */
sdata _reserved_0045;                    /* 0834   */
sdata _reserved_0046[2];                 /* 0835   */
sdata _reserved_0047;                    /* 0837   */
sdata _reserved_0052[4];                 /* 0842   */
struct {
    sdata _reserved_0053;                /* 0846   */
    sdata _reserved_0054;                /* 0847   */
    sdata _reserved_0055;                /* 0848   */
    sdata _reserved_0056;                /* 0849   */
    sdata _reserved_0057;                /* 084a   */
    sdata _reserved_0058;                /* 084b   */
    sdata _reserved_0059;                /* 084c   */
```

```
    sdata _reserved_0060;                           /* 084d   */
    sdata _reserved_0061;                           /* 084e   */
    sdata _reserved_0062;                           /* 084f   */
    sdata _reserved_0063;                           /* 0850   */
    sdata _reserved_0064;                           /* 0851   */
} _reserved_0065;
struct {
    sdata _reserved_0066;                           /* 0852   */
    sdata _reserved_0067[17];                       /* 0853   */
} _reserved_0068;
struct {
    sdata _reserved_0069;                           /* 0864   */
} _reserved_0070;
struct {
    sdata _reserved_0071;                           /* 0865   */
    sdata _reserved_0072[17];                       /* 0866   */
} _reserved_0073;
struct {
    sdata _reserved_0074;                           /* 0877   */
} _reserved_0075;
struct {
    sdata _reserved_0076;                           /* 0878   */
    sdata _reserved_0077;                           /* 0879   */
} _reserved_0078;
struct {
    sdata _reserved_0079;                           /* 087a   */
    struct {
        sdata _reserved_0080;                       /* 087b   */
        sdata _reserved_0081;                       /* 087c   */
        sdata _reserved_0082;                       /* 087d   */
        sdata _reserved_0083;                       /* 087e   */
        sdata _reserved_0084;                       /* 087f   */
        sdata _reserved_0085;                       /* 0880   */
        sdata _reserved_0086;                       /* 0881   */
        sdata _reserved_0087;                       /* 0882   */
        sdata _reserved_0088;                       /* 0883   */
        sdata _reserved_0089;                       /* 0884   */
    } _reserved_0090;
    struct {
        sdata _reserved_0091;                       /* 0885   */
        sdata _reserved_0092;                       /* 0886   */
        sdata _reserved_0093;                       /* 0887   */
        sdata _reserved_0094;                       /* 0888   */
        sdata _reserved_0095;                       /* 0889   */
        sdata _reserved_0096;                       /* 088a   */
        sdata _reserved_0097;                       /* 088b   */
        sdata _reserved_0098;                       /* 088c   */
        sdata _reserved_0099;                       /* 088d   */
        sdata _reserved_0100;                       /* 088e   */
    } _reserved_0101;
} _reserved_0102;
struct {
    sdata _reserved 0103;                           /* 088f   */
    sdata outvector1[128];                          /* 0892 m */
    sdata outvector2[128];                          /* 0912 m */
} raw;
struct {
    sdata _reserved_0107;                           /* 0992   */
    struct {
        sdata _reserved_0108;                       /* 0993   */
        sdata _reserved_0109;                       /* 0994   */
```

```
            sdata _reserved_0110;                        /* 0995   */
            sdata _reserved_0111;                        /* 0996   */
            sdata _reserved_0112;                        /* 0997   */
            sdata _reserved_0113;                        /* 0998   */
            sdata _reserved_0114;                        /* 0999   */
            sdata _reserved_0115;                        /* 099a   */
            sdata _reserved_0116;                        /* 099b   */
            sdata _reserved_0117;                        /* 099c   */
        } _reserved_0118;
        struct {
            sdata _reserved_0119;                        /* 099d   */
            sdata _reserved_0120;                        /* 099e   */
            sdata _reserved_0121;                        /* 099f   */
            sdata _reserved_0122;                        /* 09a0   */
            sdata _reserved_0123;                        /* 09a1   */
            sdata _reserved_0124;                        /* 09a2   */
            sdata _reserved_0125;                        /* 09a3   */
            sdata _reserved_0126;                        /* 09a4   */
            sdata _reserved_0127;                        /* 09a5   */
            sdata _reserved_0128;                        /* 09a6   */
        } _reserved_0129;
    } _reserved_0130;
    struct {
        sdata _reserved_0131;                            /* 09a7   */
    } _reserved_0132;
    struct {
        sdata _reserved_0133;                            /* 09a8   */
        sdata outvector1[128];                           /* 09a9 m */
        sdata outvector2[128];                           /* 0a29 m */
    } filtered;
    struct {
        sdata _reserved_0134;                            /* 0aa9   */
    } _reserved_0135;
    struct {
        sdata _reserved_0136;                            /* 0aaa   */
        sdata outvector[128];                            /* 0aab m */
    } magnitud;
} after_volatile yhpdual;

#define YHPDUAL_cl0                                     0x000014
#define YHPDUAL_cl1                                     0x000015
#define YHPDUAL_cl2                                     0x000016
#define YHPDUAL_cl3                                     0x000017
#define YHPDUAL_no_cl                                   0xFFFFFF
#define YHPDUAL_no_trigger                              0xFFFFFF
#define YHPDUAL_port0                                   0x000000
#define YHPDUAL_port1                                   0x000001
#define YHPDUAL_port2                                   0x000002
#define YHPDUAL_port3                                   0x000003
#define YHPDUAL_gen0                                    0x000004
#define YHPDUAL_gen1                                    0x000005
#define YHPDUAL_gen2                                    0x000006
#define YHPDUAL_gen3                                    0x000007
#define YHPDUAL_gen4                                    0x000008
#define YHPDUAL_gen9                                    0x00000D
#define YHPDUAL_gen10                                   0x00000E
#define YHPDUAL_gen11                                   0x00000F
#define YHPDUAL_gen12                                   0x000010
#define YHPDUAL_gen13                                   0x000011
#define YHPDUAL_gen14                                   0x000012
#define YHPDUAL_gen15                                   0x000013
#define YHPDUAL_w24                                     0x000000
```

```
#define YHPDUAL_w16                      0x000001
#define YHPDUAL_w12                      0x000002
#define YHPDUAL_w8                       0x000003
#define YHPDUAL_lsb                      0x000000
#define YHPDUAL_msb                      0x000001
#define YHPDUAL_short                    0x000001
#define YHPDUAL_long                     0x000000
#define YHPDUAL_on                       0x000001
#define YHPDUAL_off                      0x000000
#define YHPDUAL_default                  0xFFFFFF
#define YHPDUAL_intern                   0x000001
#define YHPDUAL_extern                   0x000000
#define YHPDUAL_port_0_mask              0x000001
#define YHPDUAL_port_1_mask              0x000002
#define YHPDUAL_port_2_mask              0x000004
#define YHPDUAL_port_3_mask              0x000008
#define YHPDUAL_gen_0_mask               0x000010
#define YHPDUAL_gen_1_mask               0x000020
#define YHPDUAL_gen_2_mask               0x000040
#define YHPDUAL_gen_3_mask               0x000080
#define YHPDUAL_gen_4_mask               0x000100
#define YHPDUAL_gen_5_mask               0x000200
#define YHPDUAL_gen_6_mask               0x000400
#define YHPDUAL_gen_7_mask               0x000800
#define YHPDUAL_gen_8_mask               0x001000
#define YHPDUAL_gen_9_mask               0x002000
#define YHPDUAL_gen_10_mask              0x004000
#define YHPDUAL_gen_11_mask              0x008000
#define YHPDUAL_gen_12_mask              0x010000
#define YHPDUAL_gen_13_mask              0x020000
#define YHPDUAL_gen_14_mask              0x040000
#define YHPDUAL_gen_15_mask              0x080000
#define YHPDUAL_compute_0_mask           0x100000
#define YHPDUAL_compute_1_mask           0x200000
#define YHPDUAL_compute_2_mask           0x400000
#define YHPDUAL_compute_3_mask           0x800000
#define YHPDUAL_gpio_0                   0x000000
#define YHPDUAL_gpio_1                   0x000001
#define YHPDUAL_gpio_2                   0x000002
#define YHPDUAL_gpio_3                   0x000003
#define YHPDUAL_rts_0                    0x000000
#define YHPDUAL_rts_1                    0x000001
#define YHPDUAL_rts_2                    0x000002
#define YHPDUAL_rts_3                    0x000003
#define YHPDUAL_in1DPsubr                0x000000
#define YHPDUAL_in1DPrate                0x000000
#define YHPDUAL_in1DPtrigger             0xFFFFFF
#define YHPDUAL_adcin1DPsubr             0xFFFFFF
#define YHPDUAL_adcin1DPtrigger          0x000000
#define YHPDUAL_adcin1DPrate             0x000B72
#define YHPDUAL_adcin1DPconfig           0x000015
#define YHPDUAL_adcin1DPcompute          0x000014
#define YHPDUAL_adcin1Dfifo_size         0x000002
#define YHPDUAL_adcin1Dbuf_size          0x000001
#define YHPDUAL_mult2DPsubr              0xFFFFFF
#define YHPDUAL_dacout1DPdest            0x000002
#define YHPDUAL_dacout1DPtrigger         0xFFFFFF
#define YHPDUAL_dacout1DPconfig          0x000005
#define YHPDUAL_dacout1Dfifo_size        0x000004
#define YHPDUAL_dacout1Dbuf_size         0x000001
#define YHPDUAL_mult5DPsubr              0xFFFFFF
```

```
#define YHPDUAL_scaler2DPsubr              0xFFFFFF
#define YHPDUAL_scaler2DPshift             0xFFFFF8
#define YHPDUAL_int1DPsubr                 0xFFFFFF
#define YHPDUAL_scaler1DPsubr              0xFFFFFF
#define YHPDUAL_scaler1DPshift             0xFFFFF8
#define YHPDUAL_int2DPsubr                 0xFFFFFF
#define YHPDUAL_hlim2DPsubr                0xFFFFFF
#define YHPDUAL_hlim2DPlower               0x866667
#define YHPDUAL_hlim2DPupper               0x799999
#define YHPDUAL_mult4DPsubr                0xFFFFFF
#define YHPDUAL_filt2Dfilter11DPsubr       0xFFFFFF
#define YHPDUAL_filt2Dfilter11DPb0         0x00003E
#define YHPDUAL_filt2Dfilter11DPb1         0x00007D
#define YHPDUAL_filt2Dfilter11DPb2         0x00003E
#define YHPDUAL_filt2Dfilter11DPa1         0x7FC083
#define YHPDUAL_filt2Dfilter11DPa2         0xC03D7E
#define YHPDUAL_filt2Dfilter12DPsubr       0xFFFFFF
#define YHPDUAL_filt2Dfilter12DPb0         0x000053
#define YHPDUAL_filt2Dfilter12DPb1         0x0000A7
#define YHPDUAL_filt2Dfilter12DPb2         0x000053
#define YHPDUAL_filt2Dfilter12DPa1         0x7F6B44
#define YHPDUAL_filt2Dfilter12DPa2         0xC09410
#define YHPDUAL_hlim1DPsubr                0xFFFFFF
#define YHPDUAL_hlim1DPlower               0x866667
#define YHPDUAL_hlim1DPupper               0x799999
#define YHPDUAL_mult6DPsubr                0xFFFFFF
#define YHPDUAL_mult3DPsubr                0xFFFFFF
#define YHPDUAL_rawDPsubr                  0xFFFFFF
#define YHPDUAL_rawDPlength                0x000080
#define YHPDUAL_sum1DPsubr                 0xFFFFFF
#define YHPDUAL_filt1Dfilter11DPsubr       0xFFFFFF
#define YHPDUAL_filt1Dfilter11DPb0         0x00003E
#define YHPDUAL_filt1Dfilter11DPb1         0x00007D
#define YHPDUAL_filt1Dfilter11DPb2         0x00003E
#define YHPDUAL_filt1Dfilter11DPa1         0x7FC083
#define YHPDUAL_filt1Dfilter11DPa2         0xC03D7E
#define YHPDUAL_filt1Dfilter12DPsubr       0xFFFFFF
#define YHPDUAL_filt1Dfilter12DPb0         0x000053
#define YHPDUAL_filt1Dfilter12DPb1         0x0000A7
#define YHPDUAL_filt1Dfilter12DPb2         0x000053
#define YHPDUAL_filt1Dfilter12DPa1         0x7F6B44
#define YHPDUAL_filt1Dfilter12DPa2         0xC09410
#define YHPDUAL_amp1DPsubr                 0xFFFFFF
#define YHPDUAL_amp1DPgain                 0xC00000
#define YHPDUAL_dacout2DPdest              0x000003
#define YHPDUAL_dacout2DPtrigger           0xFFFFFF
#define YHPDUAL_dacout2DPconfig            0x000005
#define YHPDUAL_dacout2Dfifo_size          0x000004
#define YHPDUAL_dacout2Dbuf_size           0x000001
#define YHPDUAL_filteredDPsubr             0xFFFFFF
#define YHPDUAL_filteredDPlength           0x000080
#define YHPDUAL_raw_doneDPsubr             0x000000
#define YHPDUAL_filt_donDPsubr             0x000000
#define YHPDUAL_sqr1DPsubr                 0xFFFFFF
#define YHPDUAL_sum2DPsubr                 0xFFFFFF
#define YHPDUAL_return                     0x000000
#define YHPDUAL_b0                         0x000001
#define YHPDUAL_b1                         0x000002
#define YHPDUAL_b2                         0x000003
#define YHPDUAL_a1                         0x000004
#define YHPDUAL_a2                         0x000005
```

```
#define YHPDUAL_x1                                        0x000006
#define YHPDUAL_x2                                        0x000007
#define YHPDUAL_y1                                        0x000008
#define YHPDUAL_y2                                        0x000009
```

APPENDIX M

```
// alloctab.cxx
// functions for alloc_table class
// T. Montlick
// 10/31/89
/* source code control: */
static char SccsID[] = "@(#)alloctab.cxx1.56 10/7/91";
#ifndef ALLOC_TABLE_DEF
#include "alloctab.hxx"
#endif
/////////////////////////////////////////////////////////////////////////////
// alloc_table::alloc_table
// Constructor.
/////////////////////////////////////////////////////////////////////////////
alloc_table::alloc_table():// initializer list for all arrays and hash tables
        indices(SZ),
        name_table(SZ),
        sizes(SZ){next_index = 0;}
/////////////////////////////////////////////////////////////////////////////
// alloc_table::~alloc_table
// Destructor.
/////////////////////////////////////////////////////////////////////////////
alloc_table::~alloc_table()
{}
/////////////////////////////////////////////////////////////////////////////
// alloc_table::allocate
// Allocate an element of the given size.
/////////////////////////////////////////////////////////////////////////////
BOOLEANalloc_table::allocate(string& name, expr* size, int* index){
        int             oldval;
        string*new_string;
        // make sure name not already present
        if (indices.find(name, &oldval))
                return FALSE;
        // store name in hash table with next storage index
        indices.add(name, next_index);
        *index = next_index;
```

```
// save this size expression
sizes[next_index] = size;
// create a copy of the name string, and enter it into name table
        new_string = new string(name);
        name_table[ (int) next_index] = new_string;
        // advance index
        next_index++;
        return TRUE;}
/////////////////////////////////////////////////////////////////////
// alloc_table::index_to_location
// Return the location of the given index, -1 if no such index.
/////////////////////////////////////////////////////////////////////
int     alloc_table::index_to_location(int index){
        long  loc_so_far = 0, next_size;
        if ( (index>sizes.size()) || (index<0) )
                return -1;
        for (int i=0; i<index; i++){
                // null sized defaults to 1
                if (sizes[i] == 0)
                        next_size = 1;
                else
                        next_size = int_value(sizes[i]);
                // if size is not known (evaluates to 0), then make it 1
                if (next_size == 0)
                        next_size = 1;
                loc_so_far += next_size;}
        return loc_so_far;}
/////////////////////////////////////////////////////////////////////
// alloc_table::location_to_index
// Return the index of the given location, -1 if no such location.
/////////////////////////////////////////////////////////////////////
int     alloc_table::location_to_index(int location){
        long  loc_so_far = 0, next_size;
        for (int i=0; i<sizes.size(); i++){
                // null sized defaults to 1
                if (sizes[i] == 0)
                        next_size = 1;
                else
                        next_size = int_value(sizes[i]);
                // if size is not known (evaluates to 0), then make it 1
                if (next_size == 0)
                        next_size = 1;
```

```
        if ( (location >= loc_so_far)
         && (location <= (loc_so_far + next_size - 1)) )
              return i;
        loc_so_far += next_size;}
    return (-1);}
////////////////////////////////////////////////////////////////////////
// alloc_table::find
// Find the given name in the table. Return the index and size.
// Returns FALSE if not in table.
////////////////////////////////////////////////////////////////////////
BOOLEANalloc_table::find(string& name, int* index_ptr, expr** size){
    if (indices.find(name, index_ptr)){
        *size = sizes[*index_ptr];
        return TRUE;}
    return FALSE;}
////////////////////////////////////////////////////////////////////////
// alloc_table:name_at_index
// Returns pointer to name string for this index.
////////////////////////////////////////////////////////////////////////
string*alloc_table::name_at_index(int index){
    if (index >= 0){
        return name_table[index];}
    else
        return NULL;}
////////////////////////////////////////////////////////////////////////
// alloc_table:name_at_location
// Returns pointer to name string for this location.
////////////////////////////////////////////////////////////////////////
string*alloc_table::name_at_location(int location){
    int         index;
    index = location_to_index(location);
    if (index >= 0){
        return name_table[index];}
    else
        return NULL;}
////////////////////////////////////////////////////////////////////////
// alloc_table::alloc_size
// Return the allocated size of the whole table.
////////////////////////////////////////////////////////////////////////
```

```
int    alloc_table::alloc_size(){
       long  loc_so_far = 0, next_size;
       for (int i=0; i<sizes.size(); i++){
              // null sized defaults to 1
              if (sizes[i] == 0)
                     next_size = 1;
              else
                     next_size = int_value(sizes[i]);
              // if size is not known (evaluates to 0), then make it 1
              if (next_size == 0)
                     next_size = 1;
              loc_so_far += next_size;}
       return loc_so_far;}
//////////////////////////////////////////////////////////////////////////
// alloc_table::set_size
// Set the given size for element at given index.
//////////////////////////////////////////////////////////////////////////
void  alloc_table::set_size(int index, expr* size){
       // save this size expression (NULL = size of 1)
       if (!size)
              size = int_to_expr((long) 1);
       sizes[index] = size;}
//////////////////////////////////////////////////////////////////////////
// alloc_table::get_size
// Get the given size for element at given index.
//////////////////////////////////////////////////////////////////////////
expr*alloc_table::get_size(int index){
       return sizes[index];}
//////////////////////////////////////////////////////////////////////////
// alloc_table::all_sizes_set
// Returns TRUE if all sizes have been set.
//////////////////////////////////////////////////////////////////////////
BOOLEANalloc_table::all_sizes_set(){
       if (sizes.size() < next_index)
              return FALSE;
       else{
              for (int i=0; i<next_index; i++)
                     if (!sizes[i])
                            return FALSE;}
```

```
	return TRUE; }
// alloctab.hxx
// alloc_table class
// T. Montlick
// 10/31/89
/* source code control: @(#)alloctab.hxx1.56 10/7/91 */
#define ALLOC_TABLE_DEF
#ifndef EXPR_ARRAY_DEF
#include "expr_arr.hxx"
#endif
#ifndef INT_HASH_DEF
#include "int_hash.hxx"
#endif
#ifndef STRG_ARRAY_DEF
#include "strg_arr.hxx"
#endif
#ifdef SZ
#undef SZ
#endif
#defineSZ	4		/* default array and hash table size */
class instance;
// the following neg. number signals an undefined address
#define NO_ADDRESS-1
// class to support allocation of named elements, which can be arrays
class alloc_table{
	int_hashindices;		// storage name to index
	strg_arrayname_table;		// index to name
	expr_arraysizes;		// expr for size of each storage name
	int		next_index;// next available storage index
public:
	alloc_table();
	~alloc_table();
	int		index_to_location(int index);
	int		location_to_index(int location);
	BOOLEANallocate(string& name, expr* size, int* index);
	BOOLEANfind(string& name, int* index, expr** size);
	string*	name_at_index(int index);
	string*	name_at_location(int location);
	int		size()	{ return next_index; };
```

```
	int		alloc_size();
	void	set_size(int index, expr* size);
	expr*	get_size(int index);
	BOOLEANall_sizes_set();
};
// array.cxx
// array class functions
// Terry Montlick
// 5/9/89
/* source code control: */
static char SccsID[] = "@(#)array.cxx1.56 10/7/91";
#include "array.hxx"
/////////////////////////////////////////////////////////////////////////
// array class
/////////////////////////////////////////////////////////////////////////
/////////////////////////////////////////////////////////////////////////
// array::array
// Constructor.
// Allocate an array using the minimum size and 0 initial elements.
/////////////////////////////////////////////////////////////////////////
array::array(){
	p = new elem [alloc_sz=ARRAY_SIZE];
	sz = 0;}
/////////////////////////////////////////////////////////////////////////
// array::array
// Constructor with size.
// Allocate an array with the given size.
/////////////////////////////////////////////////////////////////////////
array::array(int size){
	int		k;
	p = new elem [alloc_sz=size];
	sz = size;
	for (k=0; k<sz; k++) p[k] = NULL;}
/////////////////////////////////////////////////////////////////////////
// array::array
// Constructor with array as argument.
/////////////////////////////////////////////////////////////////////////
array::array(array& a){
	int		k;
```

```
        // create array storage, getting size from source array
        p = new elem [alloc_sz=a.size()];
        sz = alloc_sz;
        // copy array elements
        for (k=0; k<sz; k++) p[k] = a[k];}
//////////////////////////////////////////////////////////////////////
// array::~array
// Destructor.
// Deallocate the array.
//////////////////////////////////////////////////////////////////////
array::~array(){
        delete[alloc_sz] p;}
//////////////////////////////////////////////////////////////////////
// array::operator []
// Access elements of our array class.
// Automatically grows size of array to accomodate higher indices.
//////////////////////////////////////////////////////////////////////
elem&array::operator [] (int i)// return or set element, auto-extending array{
        int             j, k;
        // enlarge allocated size if access is beyond current bounds
        if (i >= alloc_sz){
                j = alloc_sz + ARRAY_SIZE;
                if (i >= j) j = i+1;
                elem* p0 = new elem [j];
                for (k=0; k<alloc_sz; k++) p0[k] = p[k];
                delete[alloc_sz] p;
                p = p0;
                alloc_sz = j;}
        // enlarge max index if beyond current bounds
        if (i >= sz){
                for (k=sz; k<i+1; k++) p[k] = NULL;
                sz = i + 1;}
        if (i >= 0)
                return p[i];}
//////////////////////////////////////////////////////////////////////
// array::operator =
// Assigment of array.
//////////////////////////////////////////////////////////////////////
void array::operator = (array& a){
```

```
    for (int i=0; i<a.size(); i++)
          (*this)[i] = a[i];}
//////////////////////////////////////////////////////////////////////////
// array::size
// Return or sets the size of the array.
//////////////////////////////////////////////////////////////////////////
int&  array::size(){
      return sz;}
//////////////////////////////////////////////////////////////////////////
// array::find
// Finds an element within the array.
// Returns the array index or -1 if element couldn't be found.
//////////////////////////////////////////////////////////////////////////
int          array::find(elem p0)// find the given element{
      int i = 0;
      while ((i < sz) && (p[i] != p0)) i++;
      if (i < sz) return i; else return -1; }
//////////////////////////////////////////////////////////////////////////
// array::insert
// Inserts at the given element from the array, shifting this and
// higher elements up by 1.
//////////////////////////////////////////////////////////////////////////
void  array::insert(int i){
      if ( (i >= 0) && (i < sz)){
            for (int j=sz-1; j>=i; j--)
                  this->operator[](j+1) = this->operator[](j);
            this->operator[](i) = NULL;
      }}
//////////////////////////////////////////////////////////////////////////
// array::remove
// Deletes the given element from the array, shifting higher elements
// down by 1.
//////////////////////////////////////////////////////////////////////////
void  array::remove(int i)// delete at given pointer position{
      if ( (i >= 0) && (i < sz)){
            for (int j=i; j<sz-1; j++)
                  this->operator[](j) = this->operator[](j+1);
            this->operator[](sz-1) = NULL;
            sz--;
```

```
    }}
////////////////////////////////////////////////////////////////////////
// array::clear
// Clear the array.
////////////////////////////////////////////////////////////////////////
void  array::clear(){
      sz = 0;}
////////////////////////////////////////////////////////////////////////
// array::append
// Appends the element to the end of the array, extending it by 1.
////////////////////////////////////////////////////////////////////////
void  array::append(elem p0){
      this->operator[](this->sz) = p0;}
////////////////////////////////////////////////////////////////////////
// array::append
// Appends all the element of another array to the end of this array.
////////////////////////////////////////////////////////////////////////
array&array::operator+(array& a){
      for (int i=0; i<a.sz; i++)
            append(a[i]);
      return *this;}
// array.hxx
// header for array class
// T. Montlick
// 5/7/89
/* source code control: @(#)array.hxx1.56 10/7/91 */
#define ARRAY_DEF
#ifndef STANDARD_DEF
#include "standard.hxx"
#endif
// Class "array" is a dynamic array which automatically enlarges to
// fit any indices.
// It has a "delete" function which deletes an element at a particular index
// and shifts the higher indices down, and an "insert" which shifts up to
// make room for a new element at a particular index.
// It also has a "find" function which finds a particular element pointer
// and returns its index, else it returns -1.
// Arrays of specific types may be created by deriving classes from this class.
// chunk size for allocating arrays
```

```
#define ARRAY_SIZE10
class array{
      elem*       p;
      int                 sz;         // utilized size;
      int                 alloc_sz;   // allocated size;
public:
                  array();
                  array(int);
                  array(array&);
                  ~array();
      elem&operator[](int);// return or set element, auto-extending array
      void  operator=(array&);
      int&  size();
      int         find(elem);       // find the given element
      void  insert(int); // insert at given element position
      void  remove(int);// delete at given element position
      void  clear();
      void  append(elem);
      array&operator+(array&);
      array&operator+=(array& a) {a = *this + a; return *this; }
};
// blck_arr.cxx
// derived class for block array
// Terry Montlick
// 10/10/89
/* source code control: */
static char SccsID[] = "@(#)blck_arr.cxx1.56 10/7/91";
#include "blck_arr.hxx"
// blck_arr.hxx
// header for derived block array class
// T. Montlick
// 10/10/89
/* source code control: @(#)blck_arr.hxx1.56 10/7/91 */
#define BLOCK_ARRAY_DEF
#ifndef ARRAY_DEF
#include "array.hxx"
#endif
class block;
class block_array : public array{
```

```
public:
      block*&    operator [] (int i) { return (block*&) array::operator[] (i); }
      int              find(block* ptr) { return array::find(ptr); }
      void       append(block* ptr){ array::append( (elem) ptr); }
      block_array& operator+(block_array& a)
                               { return (block_array&) array::operator+((array&) a); }
      block_array& operator+=(block_array& a) {a = *this + a; return *this; }
};
// blck_ref.cxx
// block_ref class
// T. Montlick
// 11/9/89
/* source code control: */
static char SccsID[] = "@(#)blck_ref.cxx1.56 10/7/91";
#ifndef BLOCK_REF_DEF
#include "blck_ref.hxx"
#endif
#ifndef BLOCK_DEF
#include "block.hxx"// so we can call block member functs
#endif
///////////////////////////////////////////////////////////////////////////
// arg_set::arg_set
// Constructor.
///////////////////////////////////////////////////////////////////////////
arg_set::arg_set(BOOLEAN store_by_name){
      // make the appropriate storage structure
      if (by_name = store_by_name)
            args.named_args = new expr_hash(SZ);
      else
            args.positional_args = new expr_array(SZ);
      count = 0;}
///////////////////////////////////////////////////////////////////////////
// arg_set::~arg_set
// Destructor.
///////////////////////////////////////////////////////////////////////////
arg_set::~arg_set(){
      if (by_name)
            delete args.named_args;
      else
```

```
        delete args.positional_args;}
//////////////////////////////////////////////////////////////////////
// arg_set::add_posit_expr
// Add a positional expression to the argument set.
// Returns FALSE if arguments are named, not positional.
//////////////////////////////////////////////////////////////////////
BOOLEANarg_set::add_posit_expr(expr* e){
    int         i;
    if (!by_name){
        i = (*args.positional_args).size();
        (*args.positional_args)[i] = e;
        count++;
        return TRUE;}
    else
        return FALSE;}
//////////////////////////////////////////////////////////////////////
// arg_set::add_named_expr
// Add an expression by name to the argument set.
// Returns FALSE if arguments are not named, but positional,
// or if name already present.
//////////////////////////////////////////////////////////////////////
BOOLEANarg_set::add_named_expr(string& s, expr* e){
    if (by_name)
        if ((*args.named_args).add_new(s, e))
        {
            count++;
            return TRUE;
        }
        else return FALSE;
    else
        return FALSE;}
//////////////////////////////////////////////////////////////////////
// arg_set::expr_at_name
// Look up an expression by name to the argument set.
// Returns FALSE if name not found.
//////////////////////////////////////////////////////////////////////
BOOLEANarg_set::expr_at_name(string& s, expr** e){
    if (by_name)
        return (*args.named_args).find(s, e);
```

```
    else
        return FALSE;}
/////////////////////////////////////////////////////////////////////
// arg_set::expr_at_position
// Look up an expression by position in the argument set.
// Returns NULL if not stored by position.
/////////////////////////////////////////////////////////////////////
expr*arg_set::expr_at_position(int i){
    if (!by_name)
        return (*args.positional_args)[i];
    else
        return (expr*) NULL;}
/////////////////////////////////////////////////////////////////////
// arg_set::get_expr_hash()
/////////////////////////////////////////////////////////////////////
expr_hash*arg_set::get_expr_hash(){
    return args.named_args;}
/////////////////////////////////////////////////////////////////////
// arg_set::get_expr_array()
/////////////////////////////////////////////////////////////////////
expr_array*arg_set::get_expr_array(){
    return args.positional_args;}
/////////////////////////////////////////////////////////////////////
// arg_set::size()
/////////////////////////////////////////////////////////////////////
int     arg_set::size(){
    return count;}
/////////////////////////////////////////////////////////////////////
// block_ref::block_ref
// Constructor.
/////////////////////////////////////////////////////////////////////
block_ref::block_ref(string& blk, string& inst, int l){
    values = ports = 0;
    block_name = new string(blk);
    instance_name = new string(inst);
    line_num = l;
    block_ptr = (block*) NULL;}
/////////////////////////////////////////////////////////////////////
// block_ref::~block_ref
```

```
// Destructor.
/////////////////////////////////////////////////////////////////////
block_ref::~block_ref(){
        // dealocates any classes we point to
        if (values)
                delete values;
        if (ports)
                delete ports;
        delete block_name;
        delete instance_name;}
/////////////////////////////////////////////////////////////////////
// block_ref::store_vals
// Store an arg_set of values in the block_ref.
// Returns FALSE if values already present.
/////////////////////////////////////////////////////////////////////
BOOLEANblock_ref::store_vals(arg_set* v){
        if (values)
                return FALSE;
        values = v;
        return TRUE;}
/////////////////////////////////////////////////////////////////////
// block_ref::store_ports
// Store an arg_set of ports in the block_ref.
// Returns FALSE if ports already present.
/////////////////////////////////////////////////////////////////////
BOOLEANblock_ref::store_ports(arg_set* p){
        if (ports)
                return FALSE;
        ports = p;
        return TRUE;}
/////////////////////////////////////////////////////////////////////
// block_ref::get_block_info
// Get all info on this block reference.
/////////////////////////////////////////////////////////////////////
void block_ref::get_block_info(string** blk_name, string** inst_name,
                                        arg_set** vals, arg_set** prts, int* l){
        *blk_name = block_name;
        *inst_name = instance_name;
        *vals = values;
```

```
        *prts = ports;
        *l = line_num;}
////////////////////////////////////////////////////////////////////////////
// block_ref::add_connection
// Add a connection from one of this block ref's outputs to another block
// ref's input. The index of the other block in this parent block is given,
// as well as which input in the block. Finally, the number of our output
// is given.
////////////////////////////////////////////////////////////////////////////
void block_ref::add_connection(int blk_index, int input_number, int our_output){
        int i = blocks_connected_to.size();
        blocks_connected_to[i] = blk_index;
        inputs_connected_to[i] = input_number;
        our_outputs[i] = our_output;}
////////////////////////////////////////////////////////////////////////////
// block_ref::n_connections
// Returns the number of inputs in other block refs that this block ref
// connects to.
////////////////////////////////////////////////////////////////////////////
int     block_ref::n_connections(){
        return blocks_connected_to.size();}
////////////////////////////////////////////////////////////////////////////
// block_ref::get_connection
// Get a connection from one of this block ref's outputs to another block
// ref's input. The index of the other block in this parent block is returned,
// as well as which input in the block. Finally, the number of our output
// is returned.
////////////////////////////////////////////////////////////////////////////
BOOLEANblock_ref::get_connection(int i, int* blk_index, int* input_number,
                                        int* our_output){
        if (i < blocks_connected_to.size()){
                *blk_index = blocks_connected_to[i];
                *input_number = inputs_connected_to[i];
                *our_output = our_outputs[i];
                return TRUE;}
        else
                return FALSE;}
////////////////////////////////////////////////////////////////////////////
// block_ref::all_inputs_marked
```

```
// Return TRUE if all inputs marked by sequencer as having been passed through.
// NOTE: if no inputs, then always return TRUE.
//////////////////////////////////////////////////////////////////////
BOOLEANblock_ref::all_inputs_marked(){
    if (block_ptr){
        for (int i=0; i<block_ptr->io_table_size(); i++)
        {
            if (!block_ptr->io_is_output(i))
            {
                if (!input_reached[i])
                        return FALSE;
            }
        }
        return TRUE;}
    return FALSE;}
//////////////////////////////////////////////////////////////////////
// block_ref::io_size
// Return number of I/Os for block.
//////////////////////////////////////////////////////////////////////
int     block_ref::io_size(){
    if (block_ptr)
        return block_ptr->io_table_size();
    else
        return 0;}
//////////////////////////////////////////////////////////////////////
// block_ref::is_input
// Return TRUE if given I/O is input.
//////////////////////////////////////////////////////////////////////
BOOLEANblock_ref::is_input(int i){
    if (block_ptr)
        return (!block_ptr->io_is_output(i));
    else
        return FALSE;}
//////////////////////////////////////////////////////////////////////
// block_ref::parent_wire_for_io
// Returns index of parent wire for this IO. If no parent, returns -1.
//////////////////////////////////////////////////////////////////////
int     block_ref::parent_wire_for_io(int i){
    if (instance_ptr)
```

```
            return instance_ptr->get_wire_in_parent(i);
        else
            return -1;}
// blck_ref.hxx
// block_ref class
// T. Montlick
// 11/9/89
/* source code control: @(#)blck_ref.hxx1.56 10/7/91 */
#define BLOCK_REF_DEF
#ifndef STRING_DEF
#include "string.hxx"
#endif
#ifndef EXPR_HASH_DEF
#include "exprhash.hxx"
#endif
#ifndef EXPR_ARRAY_DEF
#include "expr_arr.hxx"
#endif
#ifndef INT_ARRAY_DEF
#include "int_arr.hxx"
#endif
#ifndef UTILITY_DEF
#include "utility.h"
#endif
#ifdef SZ
#undef SZ
#endif
#defineSZ       4                   /* default array and hash table size */
class block;
class instance;
// class to support a set of arguments, specified by either name or position
class arg_set{
        BOOLEANby_name;         // TRUE if args are by name
        union{
            expr_array*positional_args;// if args by position
            expr_hash*named_args;// if args by name
        } args;
        int             count;  // # of entries in arg set
public:
```

```
    arg_set(BOOLEAN store_by_name);// constructor
    ~arg_set();                   // destructor
    BOOLEANadd_posit_expr(expr*);
    BOOLEANadd_named_expr(string&, expr*);
    BOOLEANstored_by_name(){ return by_name; }
    expr_hash*get_expr_hash();
    expr_array*get_expr_array();
    BOOLEANexpr_at_name(string& s, expr** e);
    expr*       expr_at_position(int i);
    int              size();
};
// class which defines a reference to a block in a hierarchical block
class block_ref{
    string*     block_name;     // name for block prototype
    block*      block_ptr;      // ptr to prototype block
    string*     instance_name;  // name for this block instance
    instance*instance_ptr;// ptr to this instance
    arg_set*values;             // symbol and param values
    arg_set*ports;              // port values
    int              line_num;  // line number of reference
    int_arrayblocks_connected_to;// input blk refs this blk ref connected to
    int_arrayinputs_connected_to;// which inputs of above
    int_arrayour_outputs;// which of our outputs connected
    int_arrayinput_reached;// TRUE when sequencer reaches this input
    int_arrayloop_io;           // TRUE if I/O in feedback loop
public:
    block_ref(string& blk, string& inst, int l_num);
    ~block_ref();
    BOOLEANstore_vals(arg_set*);
    BOOLEANstore_ports(arg_set*);
    void        get_block_info(string**, string**, arg_set**, arg_set**, int*);
    void        add_connection(int blk_index, int input_number, int our_output);
    void        set_block_pointer(block* p)
                                { block_ptr = p; }
    block*      get_block_pointer()
                                { return block_ptr; }
    void        set_instance_pointer(instance* p)
                                { instance_ptr = p; }
    instance*get_instance_pointer()
```

```
                        { return instance_ptr; }
    void      change_block_name(string* name)
                        { block_name = name; }
    string*   get_instance_name()
                        { return instance_name; }
    int           n_connections();
    BOOLEANget_connection(int which, int* blk_index, int* input_number,
                        int* our_output);
    void      mark_input_as_reached(int inp)
                        { input_reached[inp] = TRUE; }
    BOOLEANis_input_marked(int inp)
                        { return input_reached[inp]; }
    BOOLEANall_inputs_marked();
    void      mark_loop_io(int i)
                        { loop_io[i] = TRUE; }
    BOOLEANis_loop_io(int i)
                        { return loop_io[i]; }
    int           io_size();
    BOOLEANis_input(int i);
    int           parent_wire_for_io(int i);
    int           get_line_number()
                        { return line_num; }
};
// blckhash.cxx
// functions for block hash table class
// T. Montlick
// 9/12/89
/* source code control: */
static char SccsID[] = "@(#)blckhash.cxx1.56 10/7/91";
#ifndef BLOCK_HASH_DEF
#include "blckhash.hxx"
#endif
// bring in hash functions, customized from our defines
#include "hash.cxx"
// blckhash.hxx
// header for block hash table class
// T. Montlick
// 9/12/89
/* source code control: @(#)blckhash.hxx1.56 10/7/91 */
```

```
#define BLOCK_HASH_DEF
class block;
// define symbols which make a custom hash table class
#ifdef HASH
#undef HASH
#endif
#define HASH block_hash
#ifdef HASH_ELEM
#undef HASH_ELEM
#endif
#define HASH_ELEM block_hash_elem
#ifdef HASH_LIST
#undef HASH_LIST
#endif
#define HASH_LIST block_hash_list
#ifdef VAL_TYPE
#undef VAL_TYPE
#endif
#define VAL_TYPE block*
// don't "use pointer", because this will allocate/deallocate storage!
#ifdef USE_POINTER
#undef USE_POINTER
#endif
// suppress output stream function
#define NO_OUTSTREAM
#include"hash.hxx"
// blckstak.cxx
// block_stack class functions
// Terry Montlick
// 10/20/89
/* source code control: */
static char SccsID[] = "@(#)blckstak.cxx1.56 10/7/91";
#include "blckstak.hxx"
// blckstak.hxx
// header for block stack classes
// T. Montlick
// 11/20/89
/* source code control: @(#)blckstak.hxx1.56 10/7/91 */
#define BLOCK_STACK_DEF
```

```
#ifndef STACK_DEF
#include "stack.hxx"
#endif
class block;
class block_stack : public stack{
public:
	void push(block* p){ stack::push(p); }
	block*pop()			{ return (block*) stack::pop(); }
};
// block.cxx
// functions for block class
// T. Montlick
// 10/31/89
/* source code control: */
static char SccsID[] = "@(#)block.cxx1.56 10/7/91";
#ifndef BLOCK_DEF
#include "block.hxx"
#endif
#undef DEBUG
//////////////////////////////////////////////////////////////////////
// block_io::block_io
// Constructor.
//////////////////////////////////////////////////////////////////////
block_io::block_io()
{}
//////////////////////////////////////////////////////////////////////
// block_io::~block_io
// Destructor.
//////////////////////////////////////////////////////////////////////
block_io::~block_io()
{}
//////////////////////////////////////////////////////////////////////
// block_io::set_io_size_and_direction
// Sets an I/O size, plus direction(input or output) referred to by the
// given name.
// An expression for the storage size is also passed, the value of
// which may not yet be known.
// Returns FALSE if the name was not present.
//////////////////////////////////////////////////////////////////////
```

```
BOOLEANblock_io::set_io_size_and_direction(string* name, expr* size, int dir){
    int          index;
    expr*old_size;

    if (!io_table.find(*name, &index, &old_size))
        return FALSE;
    else{
        io_table.set_size(index, size);
        io_direction[index] = dir;
        return TRUE;
    }}
/////////////////////////////////////////////////////////////////////////////
// block_chip_io::block_chip_io
// Constructor.
/////////////////////////////////////////////////////////////////////////////
block_chip_io::block_chip_io(){
    port_number =
    trigger_source =
    port_config = (expr*) NULL;
    port_is_output =
    is_port_block = FALSE;}
/////////////////////////////////////////////////////////////////////////////
// block_chip_io::~block_chip_io
// Destructor.
/////////////////////////////////////////////////////////////////////////////
block_chip_io::~block_chip_io()
{}
/////////////////////////////////////////////////////////////////////////////
// block_chip_io::set_as_port
// Declare that this block is connected to a serial I/O port.
// Returns FALSE if this has already been set.
/////////////////////////////////////////////////////////////////////////////
BOOLEAN block_chip_io::set_as_port(expr* port_num, expr* trigger,
                    BOOLEAN is_output, expr* config, expr* entry_size){
    is_port_block = TRUE;
    port_number = port_num;
    trigger_source = trigger;
    port_is_output = is_output;
    port_config = config;
```

```
    port_entry_size = entry_size;
    return TRUE;}
////////////////////////////////////////////////////////////////////////
// block_chip_io::set_compute_line
// Set a compute line number for this block.
////////////////////////////////////////////////////////////////////////
BOOLEAN block_chip_io::set_compute_line(expr* num){
    if (trigger_source == (expr*) NULL){
        trigger_source = num;
        return TRUE;}
    else
        return FALSE;}
////////////////////////////////////////////////////////////////////////
// block_micro_io::block_micro_io
// Constructor.
////////////////////////////////////////////////////////////////////////
block_micro_io::block_micro_io()
{}
////////////////////////////////////////////////////////////////////////
// block_micro_io::~block_micro_io
// Destructor.
////////////////////////////////////////////////////////////////////////
block_micro_io::~block_micro_io()
{}
////////////////////////////////////////////////////////////////////////
// block_storage::block_storage
// Constructor.
////////////////////////////////////////////////////////////////////////
block_storage::block_storage() :
    storage_init_val(SZ),
    storage_line_numbers(SZ),
    top_level_stor_line(SZ)
{}
////////////////////////////////////////////////////////////////////////
// block_storage::~block_storage
// Destructor.
////////////////////////////////////////////////////////////////////////
block_storage::~block_storage()
{}
```

```
//////////////////////////////////////////////////////////////////////
// block_storage::add_storage_init
// Associates a storage index with an expression which supplies the
// initialization value.
//////////////////////////////////////////////////////////////////////
void block_storage::add_storage_init(int index, expr* expr_ptr){
    storage_init_val[index] = expr_ptr;
    // record line number of initialization for error msg purposes
    storage_line_numbers[index] = line;
    // also record top level line # if nested include file
    if (the_file_stack.size())
        top_level_stor_line[index] = the_file_stack.line_at_file_level(0);
    else
        top_level_stor_line[index] = line;}
//////////////////////////////////////////////////////////////////////
// block_zone::block_zone
// Constructor.
//////////////////////////////////////////////////////////////////////
block_zone::block_zone(){
    timezone_name =
    timezone_rate = (expr*) NULL;}
//////////////////////////////////////////////////////////////////////
// block_zone::~block_zone
// Destructor.
//////////////////////////////////////////////////////////////////////
block_zone::~block_zone()
{}
//////////////////////////////////////////////////////////////////////
// block_zone::set_timezone
// Set a timezone expression for this block when it is parsed, optionally
// declaring it globally.
// The name is an expression which evaluates to a name string.
// Returns FALSE if the timezone has already been set.
//////////////////////////////////////////////////////////////////////
BOOLEANblock_zone::set_timezone(expr* name, expr* rate){
    if (!timezone_name){
        timezone_name = name;
        timezone_rate = rate;
        return TRUE;}
```

```
    else{
        other_error("BLK023",
                "A time zone for this block has already been declared.");
        return FALSE;
    }}
/////////////////////////////////////////////////////////////////////
// block_zone::get_timezone
// Get expressions for the timezone name and rate.
// Returns FALSE if no timezone defined.
/////////////////////////////////////////////////////////////////////
BOOLEANblock_zone::get_timezone(expr** name, expr** rate){
    if (timezone_name){
        *name = timezone_name;
        *rate = timezone_rate;
        return TRUE;}
    else
        return FALSE;}
/////////////////////////////////////////////////////////////////////
// block_virtual::block_virtual
// Constructor.
/////////////////////////////////////////////////////////////////////
block_virtual::block_virtual(){
    is_virtual_io_block = FALSE;}
/////////////////////////////////////////////////////////////////////
// block_virtual::~block_virtual
// Destructor.
/////////////////////////////////////////////////////////////////////
block_virtual::~block_virtual()
{}
/////////////////////////////////////////////////////////////////////
// block_virtual::set_virtual_storage
// Set storage element i as virtual, passing the path string and instance which
// provides the context for that path to the physical storage location to use.//
/////////////////////////////////////////////////////////////////////
void block_virtual::set_virtual_storage(int i, string* path,
                    instance* path_inst){
    virt_storage_path[i] = path;
    is_virtual_storage[i] = TRUE;
    virt_stor_path_inst[i] = path_inst;}
```

```
//////////////////////////////////////////////////////////////////////
// block_rate_change::block_rate_change
// Constructor.
//////////////////////////////////////////////////////////////////////
block_rate_change::block_rate_change(){
      rate_change_block = FALSE;}
//////////////////////////////////////////////////////////////////////
// block_rate_change::~block_rate_change
// Destructor.
//////////////////////////////////////////////////////////////////////
block_rate_change::~block_rate_change()
{}
//////////////////////////////////////////////////////////////////////
// block_rate_change::set_decimating
// Record the fact that this block decimates, producing a new sample rate out.
// Passed the decimation ratio.
//////////////////////////////////////////////////////////////////////
void block_rate_change::set_decimating(expr* ratio){
      decimation = TRUE;
      change_ratio = ratio;
      rate_change_block = TRUE;}
//////////////////////////////////////////////////////////////////////
// block_rate_change::set_interpolating
// Record the fact that this block interpolates, producing a new sample rate
// out.
// Passed the decimation ratio.
//////////////////////////////////////////////////////////////////////
void block_rate_change::set_interpolating(expr* ratio){
      decimation = FALSE;
      change_ratio = ratio;
      rate_change_block = TRUE;}
//////////////////////////////////////////////////////////////////////
// block_subroutine::block_subroutine
// Constructor.
//////////////////////////////////////////////////////////////////////
block_subroutine::block_subroutine(){
      subr_block =
      call_block =
      subr_form =
```

```
      subr_inst_made = FALSE;
      n_times_called = 0;
      subr_inst_ptr = (instance*) NULL;}
////////////////////////////////////////////////////////////////////////
// block_subroutine::~block_subroutine
// Destructor.
////////////////////////////////////////////////////////////////////////
block_subroutine::~block_subroutine()
{}
////////////////////////////////////////////////////////////////////////
// block::block
// Constructor.
////////////////////////////////////////////////////////////////////////
block::block():// initializer list for all arrays and hash tables
      symbol_val_table(SZ),
      alias_name_table(SZ),
      label_sequence(SZ),
      label_offset(SZ){
      absolute_origin =
      is_instantiated =
      is_indivisible =
      in_hierarchy = FALSE;
      override_table = (expr_hash*) NULL;
      instance_ptr = (instance*) NULL;
      n_params =
      element_number = 0;
      l_index = 0;
      phantom =
      init = FALSE;
      block_has_loops = FALSE;
      variant_count = 0;
      // record input file which this block was declared in
      filename = in_filename_string;
      // also record starting line # for block
      starting_line = line;}
////////////////////////////////////////////////////////////////////////
// block::~block
// Destructor.
////////////////////////////////////////////////////////////////////////
```

```
block::~block()
{}
//////////////////////////////////////////////////////////////////////
// block::set_block_name
// Sets the prototype name for this block.
// Returns FALSE if a block by this name already exists.
//////////////////////////////////////////////////////////////////////
BOOLEANblock::set_block_name(string* name){
	block*block_ptr;
	stringsubr_name;
	stringcall_name;

	// form name of subr body block, which we need
	subr_name = subr_name + *name + SUBR_SUFFIX;
	call_name = call_name + *name + CALL_SUFFIX;
	// if this is subroutine call or body, append special suffixes
	if (is_subr_block()){
		// this is subr block, so mark in-line form if exists yet
		if (prototype_blocks.find(*name, &block_ptr))
			block_ptr->set_subr_form();
		// change our name to subroutine name
		*name = *name + SUBR_SUFFIX;}
	else if (is_call_block()){
		// this is subr call block, so mark in-line form if exists yet
		if (prototype_blocks.find(*name, &block_ptr))
			block_ptr->set_subr_form();
		// change our name to call name
		*name = *name + CALL_SUFFIX;}
	else{
		// block is in-line, so see if subr or call form exists
		if (prototype_blocks.find(subr_name, &block_ptr)
			|| prototype_blocks.find(call_name, &block_ptr))
			set_subr_form(); // it does, so record that subr exists}
	// set name string for this block
	block_name = *name;
	// add this block to list of prototypes, but make sure not already there
	if (prototype_blocks.find(*name, &block_ptr))
		return FALSE;
	// store name in hash table with pointer to us
```

```
      prototype_blocks.add(*name, &(*this));
      return TRUE;}
//////////////////////////////////////////////////////////////////////
// block::get_block_name
// Returns the name of this block.
//////////////////////////////////////////////////////////////////////
string*block::get_block_name(){
      return &block_name;}
//////////////////////////////////////////////////////////////////////
// block::add_io_name
// Adds a new I/O offset referred to by the given name.
// Returns as an argument the offset (next sequential)
// which was allocated.
// Returns FALSE if the name was already present.
//////////////////////////////////////////////////////////////////////
BOOLEANblock::add_io_name(string* name, int* offset, BOOLEAN is_micro){
      int          index;
      expr* old_size;
      if (!io_allocate(*name, (expr*) NULL, offset))
            return FALSE;
      else{
            // set flag for uP interface
            io_find(*name, &index, &old_size);
            set_micro_io(index, is_micro);
            return TRUE;
      }}
//////////////////////////////////////////////////////////////////////
// block::add_param_name
// Adds a new parameter to the parameter interface for this block.
// Returns as an argument the index (next sequential)
// which was allocated.
// Parameters precede symbols.
// Returns FALSE if the name was already present.
//////////////////////////////////////////////////////////////////////
BOOLEANblock::add_param_name(string* name, int* index){
      // count as a new parameter
      n_params++;
      return param_table.allocate(*name, (expr*) NULL, index);}
//////////////////////////////////////////////////////////////////////
```

```
// block::add_symbol_name
// Adds a new symbol to this block.
// Returns as an argument the index (next sequential)
// which was allocated.
// Returns FALSE if the name was already present.
//////////////////////////////////////////////////////////////////////
BOOLEANblock::add_symbol_name(string* name, int* index, BOOLEAN is_micro){
    BOOLEANstatus;
    status = param_table.allocate(*name, (expr*) NULL, index);
    if (status)
        set_micro_symbol(*index, is_micro);
    return status;}
//////////////////////////////////////////////////////////////////////
// block::add_symbol_name
// Adds a new symbol to this block, with micro interface state.
// Returns as an argument the index (next sequential)
// which was allocated.
// Returns FALSE if the name was already present.
//////////////////////////////////////////////////////////////////////
BOOLEANblock::add_symbol_name(string* name, int* index){
    return param_table.allocate(*name, (expr*) NULL, index);}
//////////////////////////////////////////////////////////////////////
// block::add_expression_name
// Associate an expression with a symbol name.
// Returns FALSE if the name was already present.
//////////////////////////////////////////////////////////////////////
BOOLEANblock::add_expression_name(string* name, expr* expr_ptr){
    expr*old_expr;
    // make sure name not already present
    if (symbol_val_table.find(*name, &old_expr))
        return FALSE;
    // store name in hash table with expression pointer
    symbol_val_table.add(*name, expr_ptr);
    return TRUE;}
//////////////////////////////////////////////////////////////////////
// block::add_alias_name
// Adds a new alias name and associate it with an equivalent name.
// Returns FALSE if the name was already present.
//////////////////////////////////////////////////////////////////////
```

```
BOOLEANblock::add_alias_name(string* new_name, string* equiv_name){
      expr* old_expr;
      string*old_equiv_name;
      // make sure name not already present
      if (look_up_symbol_name(new_name, &old_expr))
            return FALSE;
      // also look in alias table to make sure not present
      if (alias_name_table.find(*new_name, &old_equiv_name))
            return FALSE;
      // store name in hash table with equivalent name
      alias_name_table.add(*new_name, equiv_name);
      return TRUE;}
/////////////////////////////////////////////////////////////////////////
// block::add_storage_name
// Adds a new memory location or locations referred to by the given name.
// Returns as an argument the storage index (next sequential)
// which was allocated.
// An expression for the storage size is also passed, the value of
// which may not yet be known. If the size expression is NULL, set a size
// of 1.
// A storage type character is passed, which sets the type for the storage
// location(s).
// Also, flags for whether this is a microprocessor interface variable,
// and if this storage is variable storage vs. wire storage.
// Returns FALSE if the name was already present.
/////////////////////////////////////////////////////////////////////////
BOOLEANblock::add_storage_name(string* name, expr* size, int* index_ptr,
                        char type, BOOLEAN is_micro, BOOLEAN is_variable){
      BOOLEANresult;
      result = storage_allocate(*name, size, index_ptr);
      if (result){
            set_storage_size(*index_ptr, size);
            set_storage_type(*index_ptr, type);
            set_micro_var(*index_ptr, is_micro);
            set_as_variable(*index_ptr, is_variable);}
      return result;}
/////////////////////////////////////////////////////////////////////////
// block::get_storage_init
// Get storage init value, calling our instance if phantom storage.
```

```
////////////////////////////////////////////////////////////////////
expr* block::get_storage_init(int index){
	int		size;
	if (index < (size = non_phantom_storage_table_size()))
		return non_phantom_storage_init(index);
	else if (instance_ptr)
		return instance_ptr->get_phantom_storage_init(index-size);
	else
		return NULL;}
////////////////////////////////////////////////////////////////////
// block::get_storage_type
// Get storage type, calling our instance if phantom storage.
////////////////////////////////////////////////////////////////////
char block::get_storage_type(int index){
	int		size;
	if (index < (size = non_phantom_storage_table_size()))
		return get_non_phantom_storage_type(index);
	else if (instance_ptr)
		return instance_ptr->get_phantom_storage_type(index-size);
	else
		return NULL;}
////////////////////////////////////////////////////////////////////
// block::storage_table_size
// Return size of storage table.
////////////////////////////////////////////////////////////////////
int	block::storage_table_size(){
	int	size;
	size = non_phantom_storage_table_size();
	if (instance_ptr)
		size += instance_ptr->phantom_storage_table_size();
	return size;}
////////////////////////////////////////////////////////////////////
// block::storage_name_at_index
// Return the name in the storage table at the given index.
// Uses instance phantom storage if index is beyond our storage table.
////////////////////////////////////////////////////////////////////
string*block::storage_name_at_index(int index){
	int	size;
	if (index < (size = non_phantom_storage_table_size()))
```

```
        return non_phantom_storage_name_at_index(index);
    else if (instance_ptr)
        return instance_ptr->phantom_storage_name_at_index(index-size);
    else
        return new string("INVALID_STORAGE");}
//////////////////////////////////////////////////////////////////////
// block::storage_offset_at_index
// Return the storage offset in the storage table at the given index.
// Uses instance phantom storage if index is beyond our storage table.
//////////////////////////////////////////////////////////////////////
int    block::storage_offset_at_index(int index){
    int         size;
    if (index < (size = non_phantom_storage_table_size()))
        return storage_index_to_location(index);
    else if (instance_ptr)
        return instance_ptr->phantom_storage_offset_at_index(index-size);
    else
        return 0;}
//////////////////////////////////////////////////////////////////////
// block::storage_entry_size
// Return the storage entry size in the storage table for the given index.
// Uses instance phantom storage if index is beyond our storage table.
//////////////////////////////////////////////////////////////////////
expr* block::storage_entry_size(int index){
    int         size;
    if (index < (size = non_phantom_storage_table_size()))
        return non_phantom_storage_entry_size(index);
    else if (instance_ptr)
        return instance_ptr->phantom_storage_entry_size(index-size);
    else
        return NULL;}
//////////////////////////////////////////////////////////////////////
// block::look_up_storage_name
// Find the given name in the storage table.
// Returns TRUE if found, along with the storage index.
// Also checks any phantom storage, if instance present.
//////////////////////////////////////////////////////////////////////
BOOLEANblock::look_up_storage_name(string* s, int* index){
    expr*dummy_size;
```

```
    if (storage_find(*s, index, &dummy_size))
        return TRUE;
    else if (instance_ptr)
        return instance_ptr->look_up_phantom_storage_name(s, index);
    else
        return FALSE;}
//////////////////////////////////////////////////////////////////////
// block::look_up_param_name
// Find the given name in the parameter table.
// Returns TRUE if found, along with the index.
//////////////////////////////////////////////////////////////////////
BOOLEANblock::look_up_param_name(string s, int* index){
    expr*dummy_size;
    return param_table.find(s, index, &dummy_size);}
//////////////////////////////////////////////////////////////////////
// block::look_up_symbol_name
// Find the given name in the symbol table.
// Returns TRUE if found, along with the index.
//////////////////////////////////////////////////////////////////////
BOOLEANblock::look_up_symbol_name(string* s, expr** expr_ptr){
    return symbol_val_table.find(*s, expr_ptr);}
//////////////////////////////////////////////////////////////////////
// block::add_verify_expression
// Add an expression whose truth is to be evaluated when this block
// is instantiated.
//////////////////////////////////////////////////////////////////////
void block::add_verify_expression(expr* expr_ptr, string* fail_string){
    int         i;
    i = verify_expressions.size();
    verify_expressions[i] = expr_ptr;
    verify_msgs[i] = fail_string;}
//////////////////////////////////////////////////////////////////////
// block::same_level_translation
// Returns the expression which is the translation of the given
// symbol name.
// If the name is an alias, translate until an expression is found.
// If name not found, return NULL.
// Do not search higher levels in the hieararchy.
//////////////////////////////////////////////////////////////////////
```

```
expr* block::same_level_translation(string* name){
	expr*	expr_ptr;
	string*	name_ptr;
	expr*	size;
	int		number;
	expr*	return_value;
	BOOLEANgot_addr = FALSE;
	name_ptr = name;
	return_value = (expr*) NULL;
	// keep translating alias names until we don't find one
	while (alias_name_table.find(*name_ptr, &name_ptr))
		;
	// first see of it is an IO frame pointer offset
	if (io_find(*name_ptr, &number, &size)){
		// have i/o index, but we need actual i/o location
		// if this block being instantiated, ask our instance for this info
		if (instance_ptr)
		{
			if (instance_ptr->valid_parent_io())
			{
				number = instance_ptr->get_addr_of_io(number);
				got_addr = TRUE;
			}
		}
		if (!got_addr)
			number = io_index_to_location(number);
		return new expr((long) number, RELATIVE);}
	// not that, so try to look up in storage table
	else if (look_up_storage_name(name_ptr, &number)){
		// have storage index, but we need actual location
		// if this block being instantiated, ask our instance for this info
		if (instance_ptr)
			number = instance_ptr->get_addr_of_storage(number);
		else
			number = storage_index_to_location(number);
		return new expr((long) number, RELATIVE);}
	// name not found so far, so it should then be a symbol
	// look up as ordinary symbol
	if (look_up_symbol_name(name_ptr, &expr_ptr))
```

```
        return expr_ptr;
    // last chance is label name, in which case we return address of label
    else if (label_name_to_index(name_ptr, &number))
        return new expr((long) label_address(number), RELATIVE);
    return return_value;}
////////////////////////////////////////////////////////////////////////
// block::translate_with_instances
// Returns the expression which is the translation of the given
// symbol name.
// If the name is an alias, translate until an expression is found.
// If name not found, return NULL.
// Search higher levels, if necessary, returning context if different from
// current.
////////////////////////////////////////////////////////////////////////
expr* block::translate_with_instances(string* name, instance** path_inst_ptr,
                                    instance** symbol_inst_ptr){
    string*     name_ptr;
    expr*       return_value = NULL;
    instance*inst_ptr;
    block*      block_ptr;
    expr*       expr_ptr;
    expr*       name_expr_ptr = NULL;
    name_ptr = name;
    // assume symbol instance context same as current for now
    *symbol_inst_ptr = instance_ptr;
    // if the translation name is a path, the instance where the path
    // is defined will get filled in
    *path_inst_ptr = (instance*) NULL;
    // first check for override of this name
    if (override_table){
        if (override_table->find(*name_ptr, &expr_ptr))
        {
            // translated name, so see if it results in a string
            if (expr_ptr->eval_to_symbol(&name_ptr))
            {
                // it does, so save this string as an expression
                // in case there's no further translation
                name_expr_ptr = expr_ptr;
            }
```

```
            else
            {
                  // translated override name to non-symbol expression
                  // so just return it
                  return expr_ptr;
            }
      }}
if (name_expr_ptr != (expr*) NULL){
      // string translation found in our override table, so see if
      // we can translate it further higher up
      pop_block();
      if (cur_block)
      {
            // there is a higher-level block, so get translation and
            // advance relocation level for this expression
            if (return_value = cur_block->translate_with_instances(name_ptr,
                              path_inst_ptr, symbol_inst_ptr))
                  return_value->set_reloc_level(
                              return_value->what_reloc_level() + 1);
      }
      push_block(this);}
else
// not found in override table, so check ordinary translation
if (!(return_value = same_level_translation(name_ptr))){
      // no translation found, so see if name is path to lower level block
      if (instance_ptr)
      {
            if (inst_ptr = instance_ptr->
                  get_instance_of_name(name_ptr, &name_ptr))
            {
                  // 1st part of name matches one of our decendents
                  block_ptr = inst_ptr->prototype();
                  // make sure to set this block context for expr evaluation
                  inst_ptr->push_context();
                  // translate symbol in a decendent, returning instance for
                  // symbol if found
                  if (return_value = block_ptr->same_level_translation(name_ptr))
                              *symbol_inst_ptr = inst_ptr;
                  inst_ptr->pop_context();
```

```
				}
			}
			if (!return_value)
			{
				// still no translation found, so check any higher level block
				pop_block();
				if (cur_block)
				{
					// there is a higher level block, so get translation and
					// advance relocation level for this expression
					if (return_value = cur_block->translate_with_instances(name_ptr,
							path_inst_ptr, symbol_inst_ptr))
							return_value->set_reloc_level(
							return_value->what_reloc_level() + 1);
				}
				push_block(this);
			}}
		// if no translation, see if there is a translated name from override
		// symbol table, and return this
		if (!return_value && name_expr_ptr)
			return_value = name_expr_ptr;
		// if no path instance was found in a higher level translation, use the
		// current instance as the path instance
		if (*path_inst_ptr == (instance*) NULL)
			*path_inst_ptr = instance_ptr;
		return return_value;}
////////////////////////////////////////////////////////////////////
// block::translation
// Version if translate_with_instances which doesn't return path and symbol
// instances.
////////////////////////////////////////////////////////////////////
expr* block::translation(string* name){
	instance*path_inst;
	instance*symbol_inst;
	return translate_with_instances(name, &path_inst, &symbol_inst);}
////////////////////////////////////////////////////////////////////
// block::translate_to_param_val
// Returns the parameter value which is the translation of the given
// symbol name.
```

```
////////////////////////////////////////////////////////////////////////
expr* block::translate_to_param_val(string* name){
	string*	name_ptr;
	expr*	return_value = NULL;
	expr*	expr_ptr;
	expr*	name_expr_ptr = NULL;
	name_ptr = name;
	if (override_table){
		if (override_table->find(*name_ptr, &expr_ptr))
			return_value = expr_ptr;}
	return return_value;}
////////////////////////////////////////////////////////////////////////
// block::translate_to_io
// Returns the I/O location which is the translation of the given
// symbol name.
// If the name is an alias, translate until found.
// If name not found, return FALSE.
////////////////////////////////////////////////////////////////////////
BOOLEANblock::translate_to_io(string* name, int* value){
	string*name_ptr;
	expr*size;
	int		number;
	BOOLEANgot_addr;
	name_ptr = name;
	// keep translating alias names until we don't find one
	while (alias_name_table.find(*name_ptr, &name_ptr))
		;
	// see of it is an IO frame pointer offset
	if (io_find(*name_ptr, &number, &size)){
		// have i/o index, but we need actual i/o location
		// if this block being instantiated, ask our instance for this info
		if (instance_ptr)
		{
			if (instance_ptr->valid_parent_io())
			{
				number = instance_ptr->get_addr_of_io(number);
				got_addr = TRUE;
			}
		}
```

```
		if (!got_addr)
			number = io_index_to_location(number);
		*value = number;
		return TRUE;}
	else
		return FALSE;}
//////////////////////////////////////////////////////////////////////////
// block::translate_to_storage
// Returns the storage location which is the translation of the given
// symbol name.
// If the name is an alias, translate until found.
// If name not found, return FALSE.
//////////////////////////////////////////////////////////////////////////
BOOLEANblock::translate_to_storage(string* name, int* value){
	string*name_ptr;
	int		number;
	name_ptr = name;
	// keep translating alias names until we don't find one
	while (alias_name_table.find(*name_ptr, &name_ptr))
		;
	// see of it is a storage table offset
	if (look_up_storage_name(name_ptr, &number)){
		// have storage index, but we need actual location
		// if this block being instantiated, ask our instance for this info
		if (instance_ptr)
			number = instance_ptr->get_addr_of_storage(number);
		else
			number = storage_index_to_location(number);
		*value = number;
		return TRUE;}
	else
		return FALSE;}
//////////////////////////////////////////////////////////////////////////
// block::known_symbol
// Returns TRUE if the given symbol name has been declared, regardless
// of whether it has a defined value.
//////////////////////////////////////////////////////////////////////////
BOOLEANblock::known_symbol(string* name){
	expr*expr_ptr;
```

```
string*name_ptr;
expr*size;
int        number;
BOOLEANreturn_value;
name_ptr = name;
// keep translating alias names until we don't find one
while (alias_name_table.find(*name_ptr, &name_ptr))
      ;
// first see of it is an IO frame pointer offset
if (io_find(*name_ptr, &number, &size))
      return TRUE;
// not that, so try to look up in storage table
else if (look_up_storage_name(name_ptr, &number))
      return TRUE;
// name not found so far, so it should then be a symbol
// first look up in override symbol table, if any
if (override_table)
      if (override_table->find(*name_ptr, &expr_ptr))
            return TRUE;
// check if ordinary symbol
if (look_up_symbol_name(name_ptr, &expr_ptr))
      return TRUE;
else{
      // no translation found, so check any higher level block
      pop_block();
      if (cur_block)
      {
            // there is a higher level block, so check if known
            return_value = cur_block->known_symbol(name_ptr);
      }
      else
            return_value = FALSE;
      push_block(this);
      return return_value;
}}
//////////////////////////////////////////////////////////////////////
// block::translation_known
// Returns TRUE if the given name has a known value.
//////////////////////////////////////////////////////////////////////
```

```
BOOLEANblock::translation_known(string* name){
    expr*expr_ptr;
    expr_ptr = translation(name);
    return (expr_ptr != (expr*) NULL);}
/////////////////////////////////////////////////////////////////////
// block::look_up_io_name
// Find the given name in the io table.
// Returns TRUE if found, along with the io index.
/////////////////////////////////////////////////////////////////////
BOOLEANblock::look_up_io_name(string* s, int* index){
    expr*dummy_size;
    return io_find(*s, index, &dummy_size);}
/////////////////////////////////////////////////////////////////////
// block::param_expr_at_index
// Returns the expression for the parameter at the given index.
/////////////////////////////////////////////////////////////////////
expr*block::param_expr_at_index(int index){
    expr*      expr_ptr = NULL;
    string*    name_ptr;
    // get name at index
    name_ptr = param_name_at_index(index);
    // first check for name in override table
    if (override_table)
        override_table->find(*name_ptr, &expr_ptr);
    // if no value, look in regular symbol table
    if (expr_ptr == (expr*) NULL)
        look_up_symbol_name(name_ptr, &expr_ptr);
    // if still no value, return 0
    if (expr_ptr == (expr*) NULL)
        expr_ptr = new expr((long) 0);
    return expr_ptr;}
/////////////////////////////////////////////////////////////////////
// block::verify_block_refs
// Verify that all blocks referenced by this block exist.
// If not, return the name of one which does not.
/////////////////////////////////////////////////////////////////////
string*block::verify_block_refs(){
    // base class has no referenced blocks
    return NULL;}
```

```
////////////////////////////////////////////////////////////////////////
// block::refs_iter_init
// Initialize the iterator index for the block refs iterator.
////////////////////////////////////////////////////////////////////////
void  block::refs_iter_init(){
      // base class has no reference blocks}
////////////////////////////////////////////////////////////////////////
// block::next_ref
// Get the next block referred to by this block. If no more
// blocks, return FALSE.
////////////////////////////////////////////////////////////////////////
BOOLEANblock::next_ref(block_ref** ref_ptr){
      // base class has no reference blocks
      NOREF(ref_ptr);
      return FALSE;}
////////////////////////////////////////////////////////////////////////
// block::check_verify_expressions
// Check all the verify expressions for truth. If we encounter a false one,
// this function returns with a pointer to it.
////////////////////////////////////////////////////////////////////////
expr* block::check_verify_expressions(){
      expr*             e;
      expr_element value;
      int                           eval_status;
      BOOLEAN       verify_OK;
      char              msg[100];
      extern int   instr_line;
      for (int i=0; i<verify_expressions.size(); i++){
            e = verify_expressions[i];
            verify_OK = TRUE;
            // evaluate the expression
            if (eval_status = e->eval(&value))
            {
                  // set global variable "instr_line" to reflect 0 line number
                  instr_line = 0;
                  value_goof_msg(eval_status, e, "verify expression", msg);
                  eval_status = other_error("BLK001", msg);
            }
            else
```

```
        {
            switch(value.what_type())
            {
            case INT_VALUE:
                verify_OK = (BOOLEAN) value.int_value();
                break;
            case REAL_VALUE:
                verify_OK = (value.real_value() != 0.0);
                break;
            default:
                break;
            }
        }
        if (!verify_OK)
        {
            return e;
        }}
    return NULL;}
//////////////////////////////////////////////////////////////////////////
// block::hier_io_name_at_index()
// Returns a string which is the hierarchical i/o name at the given index.
// If we have no instance, just return the normal i/o name.
//////////////////////////////////////////////////////////////////////////
string*block::hier_io_name_at_index(int index){
    string*     hier_name;
    if (instance_ptr){
        // use hierarchical name if not top block
        if (!instance_ptr->is_top_level())
        {
            // get hierarchical name of instance as a string
            hier_name = instance_ptr->hier_name_string();
            // concatenate the io name onto this
            *hier_name = *hier_name + "." + *io_name_at_index(index);
            return hier_name;
        }}
    return io_name_at_index(index);}
//////////////////////////////////////////////////////////////////////////
// block::hier_storage_name_at_index()
// Returns a string which is the hierarchical storage name at the given index.
```

```
// If we have no instance, just return the normal storage name.
////////////////////////////////////////////////////////////////////
string*block::hier_storage_name_at_index(int index){
      string*      hier_name;
      if (instance_ptr){
            // use hierarchical name if not top block
            if (!instance_ptr->is_top_level())
            {
                  // get hierarchical name of instance as a string
                  hier_name = instance_ptr->hier_name_string();
                  // concatenate the io name onto this
                  *hier_name = *hier_name + "." + *storage_name_at_index(index);
                  return hier_name;
            }}
      return storage_name_at_index(index);}
////////////////////////////////////////////////////////////////////
// block::hier_label_name_at_index()
// Returns a string which is the hierarchical label name at the given index.
// If we have no instance, just return the normal label name.
////////////////////////////////////////////////////////////////////
string*block::hier_label_name_at_index(int index){
      string*      hier_name;
      if (instance_ptr){
            // use hierarchical name if not top block
            if (!instance_ptr->is_top_level())
            {
                  // get hierarchical name of instance as a string
                  hier_name = instance_ptr->hier_name_string();
                  // concatenate the io name onto this
                  *hier_name = *hier_name + "." + *label_name_at_index(index);
                  return hier_name;
            }}
      return label_name_at_index(index);}
////////////////////////////////////////////////////////////////////
// block::hier_param_name_at_index()
// Returns a string which is the hierarchical param name at the given index.
// If we have no instance, just return the normal param name.
////////////////////////////////////////////////////////////////////
string*block::hier_param_name_at_index(int index){
```

```
    string*     hier_name;
    if (instance_ptr){
        // use hierarchical name if not top block
        if (!instance_ptr->is_top_level())
        {
            // get hierarchical name of instance as a string
            hier_name = instance_ptr->hier_name_string();
            // concatenate the io name onto this
            *hier_name = *hier_name + "." + *param_name_at_index(index);
            return hier_name;
        }}
    return param_name_at_index(index);}
//////////////////////////////////////////////////////////////////////
// block::add_label_name
// Adds a new label name along with its sequence #.
// Returns FALSE if the name and a seq # were already present.
//////////////////////////////////////////////////////////////////////
BOOLEANblock::add_label_name(string* name, int address){
    int     index;
    expr* old_size;
    // see if name already present
    if (!label_table.find(*name, &index, &old_size)){
        // name not present, so allocate a new one and get its index
        index = assign_label_index(name);}
    // store the label seq # in a table, provided not already there
    if (label_sequence[index] == NULL || label_sequence[index] == NO_ADDRESS){
        label_sequence[index] = address;
        return TRUE;}
    else
        return FALSE;}
//////////////////////////////////////////////////////////////////////
// block::label_name_to_index
// Get the index for the given label name.
// Returns FALSE if name not present.
// Label table extends to phantom labels in instance, if present.
//////////////////////////////////////////////////////////////////////
BOOLEANblock::label_name_to_index(string* name, int* index){
    expr* size;
    if (label_table.find(*name, index, &size))
```

```
        return TRUE;
    else{
        if (instance_ptr)
            return instance_ptr->phantom_label_name_to_index(name, index);
        else
            return FALSE;
    }}
//////////////////////////////////////////////////////////////////////
// block::assign_label_index
// Gets an index (not an address!) for a label name.
// If the name was not encountered before, a new, unique index is allocated
// for it.
//////////////////////////////////////////////////////////////////////
int block::assign_label_index(string* name){
    int         index;
    expr*       old_size;
    // see if name already present
    if (label_table.find(*name, &index, &old_size))
        return index;
    else{
        // store name in hash table with new index
        label_table.allocate(*name, (expr*) NULL, &l_index);
        label_sequence[l_index] = NO_ADDRESS; // need label for this index
        return l_index++;
    }}
//////////////////////////////////////////////////////////////////////
// block::label_table_size
// Get the size of the label table.
// Label table extends to phantom labels in instance, if present.
//////////////////////////////////////////////////////////////////////
int block::label_table_size(){
    int         size;
    size = label_table.size();
    if (instance_ptr)
        size += instance_ptr->phantom_label_table_size();
    return size; }
//////////////////////////////////////////////////////////////////////
// block::label_name_at_index
// Get the name at the given label index.
```

```
// Label table extends to phantom labels in instance, if present.
///////////////////////////////////////////////////////////////////////
string*block::label_name_at_index(int index){
    int         size;
    // see if in block's table
    if (index < (size = label_table.size()))
        return label_table.name_at_index(index);
    else{
        // else look in instance's table of phantom labels
        if (instance_ptr)
            return instance_ptr->phantom_label_name_at_index(index-size);
        else
            return new string("INVALID_LABEL");
    }}
///////////////////////////////////////////////////////////////////////
// block::label_seq_at_index
// Get the seq # at the given label index.
// Label table extends to phantom labels in instance, if present.
///////////////////////////////////////////////////////////////////////
int    block::label_seq_at_index(int index){
    int         size;
    if (index < (size = label_table.size()))
        return label_sequence[index];
    else{
        if (instance_ptr)
            return instance_ptr->phantom_label_seq_at_index(index-size);
        else
            return 0;
    }}
///////////////////////////////////////////////////////////////////////
// block::label_offset_at_index
// Get the offset at the given label index.
// Label table extends to phantom labels in instance, if present.
///////////////////////////////////////////////////////////////////////
int    block::label_offset_at_index(int index){
    int         size;
    if (index < (size = label_table.size()))
        return label_offset[index];
    else{
```

```
		if (instance_ptr)
			return instance_ptr->phantom_label_offset_at_index(index-size);
		else
			return 0;
	}}
////////////////////////////////////////////////////////////////////////////
// block::set_label_offset
// Set the offset for the given label index.
// Label table extends to phantom labels in instance, if present.
////////////////////////////////////////////////////////////////////////////
void block::set_label_offset(int index, int offset){
	int		size;
	if (index < (size = label_table.size()))
		label_offset[index] = offset;
	else{
		if (instance_ptr)
			instance_ptr->set_phantom_label_offset(index-size, offset);
	}}
////////////////////////////////////////////////////////////////////////////
// block::label_address
// Gets an absolute address for a label index.
// If no label offset available, just use label seq. # in block.
// This is so that we can use this routine for resolving the address of
// a label when we're checking jump instructions for backward jumps.
////////////////////////////////////////////////////////////////////////////
int	block::label_address(int index){
	int		address;
	// we need absolute address of label
	// if this block being instantiated, ask our instance for this info
	if (absolute_origin){
		if (label_offset[index])
			address = label_offset[index] + origin_address;
		else
			address = label_sequence[index] + origin_address;}
	else if (instance_ptr)
		address = instance_ptr->get_addr_of_label(index);
	else{
		if (label_offset[index])
			address = label_offset[index];
```

```
        else
                address = label_sequence[index];}
    return address;}
/////////////////////////////////////////////////////////////////////
// block::get_address_from_label_name
// Find the given label name in the block, searching higher level blocks
// as necessary. Return the address, else the special (neg) value
// "NO_ADDRESS".
/////////////////////////////////////////////////////////////////////
int block::get_address_from_label_name(string* name){
    int              index;
    int              jmp_address;
    instance*inst_ptr;
    block*     block_ptr;
    expr*      expr_ptr;
    // assume we can't find
    jmp_address = NO_ADDRESS;
    // allow him to use alias
    // keep translating alias names until we don't find one
    while (alias_name_table.find(*name, &name))
            ;
    // look for label in the current block
    if (label_name_to_index(name, &index))
            jmp_address = label_address(index);
    // if not in current block, may be in higher level block
    if (jmp_address == NO_ADDRESS){
            // see if override symbol which translates to label in higher block
            if (override_table)
                    if (override_table->find(*name, &expr_ptr))
                            expr_ptr->eval_to_symbol(&name);
            // not in current block, so look in any higher level block
            pop_block();
            // if there is a higher level block, look for label recursively
            if (cur_block)
                    jmp_address = cur_block->get_address_from_label_name(name);
            push_block(this);}
    if (jmp_address == NO_ADDRESS){
            // if no label found in this block's context, check if absolute name
            // from top of instance hierarchy
```

```
            if (top_instance)
            {
                if (inst_ptr = top_instance->get_instance_of_name(name, &name))
                {
                    // name may refer to an absolute label from top of hierarchy
                    // get ptr to block and check its label table
                    block_ptr = inst_ptr->prototype();
                    // set instance for this block
                    block_ptr->instance_ptr = inst_ptr;
                    if (block_ptr->label_name_to_index(name, &index))
                            jmp_address = inst_ptr->get_addr_of_label(index);
                }
            }
            if (jmp_address == NO_ADDRESS)
            {
                // There are actually two "tops" of the instance tree. The
                // "_true_top", which we just used, and "_top", which is the
                // top instance in the user's design. Check if an absolute
                // name from the user's top since he doesn't necessarily know
                // that he is not the real top of the instance tree.
                if (user_top_instance)
                {
                    if (inst_ptr = user_top_instance->get_instance_of_name(name,
                            &name))
                    {
                            // name may refer to an absolute label from top of hierarchy
                            // get ptr to block and check its label table
                            block_ptr = inst_ptr->prototype();
                            // set instance for this block
                            block_ptr->instance_ptr = inst_ptr;
                            if (block_ptr->label_name_to_index(name, &index))
                            jmp_address = inst_ptr->get_addr_of_label(index);
                    }
                }
            }}
        return jmp_address;}
////////////////////////////////////////////////////////////////////////
// block::storage_error
// Output error text for storage initialization. Passed text and
```

```
// index of storage location.
////////////////////////////////////////////////////////////////////////
int   block::storage_error(char* msg_code, int index, char* s){
      char        msg[100];
      extern intinstr_line;
      // set global variable "instr_line" to reflect line number of storage init
      instr_line = get_storage_line_number(index);
      if (instance_ptr)
            instance_ptr->out_error(msg_code, cerr, FALSE);
      else
            out_err_header(msg_code);
      cerr << "Initializing storage location '"
            << *non_phantom_storage_name_at_index(index)
            << "' -- " << s << "\n";
      return 1;                         }
////////////////////////////////////////////////////////////////////////
// block::storage_warning
// Output warning text for storage initialization. Passed text and
// index of storage location.
////////////////////////////////////////////////////////////////////////
int   block::storage_warning(char* msg_code, int index, char* s){
      char        msg[100];
      extern intinstr_line;
      // set global variable "instr_line" to reflect line number of storage init
      instr_line = get_storage_line_number(index);
      if (instance_ptr)
            instance_ptr->out_warning(msg_code, cerr, FALSE);
      else
            out_warn_header(msg_code);
      cerr << "Initializing storage location '"
            << *non_phantom_storage_name_at_index(index)
            << "' -- " << s << "\n";
      return 0;                         }
#ifdef OWC
extern "C" {
#endif
////////////////////////////////////////////////////////////////////////
// read_init_file
// Open the given init file and read it into the initialization vector.
```

```
////////////////////////////////////////////////////////////////////////
int   read_init_file(string* name_string, int size, long_array* storage_vector,
                                   int index){
      int                          status = 0;
      long           val;          // initialization value
      int                          token;// token value from yylex()
      BOOLEAN        negate = FALSE;
      string*        failed_path;
      BOOLEAN        broke = FALSE;
      int                          last_i;
      extern int   line;           // current line # for lex analyzer
      // open input file with file pointer yyin, for lex
      if (!push_file(name_string, &failed_path))
            status = COULD_NOT_EVAL;
      if (!status){
            // read the data from the init file
            for (int i=0; i<size; i++)
            {
                  // get next token from lexical analyzer
                  token = yylex();

                  // handle minus sign
                  while (token == UMINUS || token == '-')
                  {
                        negate = !negate;
                        // get new token from lexical analyzer
                        token = yylex();
                  }
                  // if end of file, break out of loop
                  if (token == 0)
                  {
                        // remember where we broke so we can zero rest
                        last_i = i;
                        broke = TRUE;
                        break;
                  }
                  // if not valid number token, get out with error
                  else if ( token != INTEGER && token != REAL )
                  {
```

```
yyerror("dummy");
status = INIT_FILE_SYNTAX_ERR;
// remember where we broke so we can zero rest
last_i = i;
broke = TRUE;
break;
}
else
{
// now have number token, so get integer value
if (token == REAL)
{
// check for real number out of range, but make sure
// we handle unary minus correctly
if ( (negate && real_out_of_range(-yylval.rval))
|| (!negate && real_out_of_range(yylval.rval)) )
{
charmsg[100];
sprintf(msg,
"real value %f at line %i of init file '%s' is not in range -2.0 to
+1.9999.",
yylval.rval, line, &(*name_string)[0]);
status = storage_error("BLK024", index, msg);
status = INIT_FILE_SYNTAX_ERR;
}
// get 24 bit integer equivalent of real value
val = (long) (yylval.rval * REAL_FACTOR);
}
else
val = (long) yylval.ival;
// if previous unary minus, then negate flag was set
if (negate)
{
val = -val;
negate = FALSE;
}
(*storage_vector)[i] = val;
}
if (status)
```

```
                {
                        // remember where we broke so we can zero rest
                        last_i = i;
                        broke = TRUE;
                        break;
                }
        }
        // if we broke, fill in rest of array with zero!
        if (broke)
        {
                for (i= last_i; i<size; i++)
                        (*storage_vector)[i] = 0;
        }
        pop_file(); // done with init file}
    return status;}
#ifdef OWC}
#endif
/////////////////////////////////////////////////////////////////////////
// block::out_storage_code
// Output a single word of storage initialization for the given storage index.
// Return nonzero error code if init. error.
// If the storage is a vector, return "is_vector" true, and also return
// an array of all the storage values.
/////////////////////////////////////////////////////////////////////////
int block::out_storage_code(int index, ostream& out, BOOLEAN* is_vector,
                                long_array* storage_vector){
    expr*           e = (expr*) NULL;// expression for storage initializer
    long            val;        // initialization value
    int                         reloc_type;
    int                         reloc_level;
    unsigned longout_val;       // 24 bits of output value
    int                         eval_status = 0;
    expr*           size_expr;  // expression for size of vector
    int                         size;// number for size of vector
    int                         i;
    expr_element value;         // expression which yields init value
    string*         name_string;// init file string
    BOOLEAN         vector_initialized = FALSE;
    BOOLEAN         is_real;    // TRUE if storage code is real
```

```
char                storage_type;
int                             dummy;
// if storage is virtual, don't output anything
if (is_storage_virtual(index)){
      *is_vector = FALSE;
      return 0;}
// get expression for storage initializer
// if instance present, check for override initializer
if (instance_ptr)
      e = instance_ptr->get_storage_override_init(index);
if (!e)
      e = get_storage_init(index);
else
      val = 0;
// default value to 0
val = 0;
// see if this storage is a vector
size = 1;
size_expr = storage_entry_size(index);
// if vector, get size of array to hold init values
if (size_expr){
      size = (int) int_value(size_expr);
      // make sure array size not larger than we need
      if (storage_vector->size() > size)
            storage_vector->size() = size;}
if (e){
      // there is an initialization expression, so get the type for this
      // storage location
      storage_type = get_storage_type(index);
      if (e->is_int_valued())
      {
            // expression has integer value, so see if storage type
            // conflicts
            if (storage_type == 'f')
            {
                  // must convert integer to fixed, so give warning
                  storage_warning("BLK007", index,
                              "Converted integer to fixed point.");
                  cerr << " (";
```

```
            cerr << e->int_value(&dummy, &dummy) << " -> ";
            // just add "fix" operator, but do this on copy of original
            e = new expr(*e);
            e = concat_expr(e, operator_to_expr('F'));
            // format real value so decimal point shows
            cerr << form("%f", e->real_value(&dummy, &dummy));
            cerr << ")\n";
        }
}
else if (e->is_real_valued())
{
        // expression has fixed point value, so see if storage type
        // conflicts
        if (storage_type == 'i')
        {
            // must convert fixed to integer, so give warning
            storage_warning("BLK008", index,
                        "Converted fixed point to integer.");
            cerr << " (";
            // format real value so decimal point shows
            cerr << form("%f", e->real_value(&dummy, &dummy));
            cerr << " -> ";
            // just add "INT" operator, but do this on copy of original
            e = new expr(*e);
            e = concat_expr(e, operator_to_expr('I'));
            cerr << e->int_value(&dummy, &dummy);
            cerr << ")\n";
        }
}
if (eval_status = eval_24_bit_value(e, &val, &reloc_type,
                        &reloc_level, &is_real))
{
        // couldn't evaluate expression, so see if its a symbol
        if (eval_status == NUM_VALUE_NOT_KNOWN)
        {
            // it is, so open a file with this name
            // we will read it via yylex, so open compatibly
            if (e->eval(&value))
            {
```

```
if (value.what_type() == SYMBOL_VALUE)
{
// gave a symbol, so treat as file to read values from
name_string = value.symbol();
vector_initialized = FALSE;
if (eval_status = read_init_file(name_string, size,
storage_vector, index))
{
// output msg if it doesn't get otherwise output
if (eval_status == COULD_NOT_EVAL)
{
charmsg[100];
sprintf(msg, "\n couldn't open a storage init file called '%s'.",
&(*name_string)[0]);
if (values_must_be_known)
storage_error("BLK002", index, msg);
else
storage_warning("BLK002", index, msg);
}
}
else
vector_initialized = TRUE;
if (vector_initialized)
{
// get first value, but only if we have a vector
val = (*storage_vector)[0];
}
}
        }
    }
  }}
out_val = val & WORD_MASK;
out << form("%06lx ",out_val);
// test if vector, and init if not previously inited
if (*is_vector = (size > 1)){
      if (!vector_initialized)
      {
            for (i=0; i<size; i++)
                  (*storage_vector)[i] = val;
```

```
        }}
    if (values_must_be_known)
        return eval_status;
    else
        return 0;}
//////////////////////////////////////////////////////////////////////
// block::out_rest_of_storage_vector
// If the given storage is a vector, repeat the init value for rest of size.
//////////////////////////////////////////////////////////////////////
void block::out_rest_of_storage_vector(long_array* vect, ostream& out){
    int                     i;
    unsigned longout_val;
    for (i=1; i<vect->size(); i++){
        out << "\n";
        out_val = (*vect)[i] & WORD_MASK;
        out << form("%06lx ",out_val);
    }}
//////////////////////////////////////////////////////////////////////
// block::out_storage
// Output the storage initialization, starting at 0.
//////////////////////////////////////////////////////////////////////
int block::out_storage(ostream& data){
    int             result = 0;
    int             status = 0;
    BOOLEANmore;
    BOOLEANfatal = FALSE;
    long_arraystorage_vector;
    for (int i=0; i<storage_table_size(); i++){
        if (status = out_storage_code(i, data, &more, &storage_vector))
        {
            char  msg[100];
            expr*e = get_storage_init(i);
            result |= status;
            switch (status)
            {
            case NUM_VALUE_NOT_KNOWN:
                {
                        string*s;
                        if (s = e->unknown_symbol())
```

```
                    sprintf(msg, "\n value for symbol %s is not known.",
                    &(*s)[0] );
                    else
                    sprintf(msg,
                    "\n value for initialization is not known.");
                    if (values_must_be_known)
                    status = storage_error("BLK003", i, msg);
                    else
                    status = storage_warning("BLK003", i, msg);
        }
        break;
    case REAL_OUT_OF_RANGE:
        sprintf(msg,
                    "real value %f is not in range -2.0 to +1.9999.",
                    real_value(e));
        status = storage_error("BLK004", i, msg);
        fatal = TRUE;
        break;
    case OVERFLOW:
        sprintf(msg,
                    "integer value %i doesn't fit in 24 bits.",
                    int_value(e));
        status = storage_error("BLK005", i, msg);
        fatal = TRUE;
        break;
    case COULD_NOT_EVAL:
    case INIT_FILE_SYNTAX_ERR:
        fatal = TRUE;
        break;      // msg already output
    default:
        if (values_must_be_known)
                    status =
                    storage_error("BLK006", i, "couldn't evaluate.");
        else
                    status =
                    storage_warning("BLK006", i, "couldn't evaluate.");
        break;
    }
}
```

```
        if (more)
            out_rest_of_storage_vector(&storage_vector, data);
        data << "\n";
        if (fatal)
            break;}
    // if just warning, return 0
    if (!values_must_be_known && !fatal)
        result = 0;
    return result;}
////////////////////////////////////////////////////////////////////////////
// block::sequence_children
// If this is a hierarchical block, sequence its children.
// Returns TRUE if error.
////////////////////////////////////////////////////////////////////////////
BOOLEANblock::sequence_children(BOOLEAN* new_rate_ptr){
    NOREF(new_rate_ptr);
    return FALSE;}
////////////////////////////////////////////////////////////////////////////
// asm_block::asm_block
// Constructor.
////////////////////////////////////////////////////////////////////////////
asm_block::asm_block():// initializer list for all arrays and hash tables
    operand_values(SZ),
    opcode_fields(SZ),
    addr_mode_fields(SZ),
    operand_fields(SZ),
    instr_line_numbers(SZ),
    relocation(SZ),
    reloc_level(SZ),
    linked_addr_mode(SZ),
    linked_operand(SZ),
    top_level_instr_line(SZ){
    autosequence = FALSE;
    is_indivisible =
    leaf_block = TRUE;
    manual_block = FALSE;
    duration = (expr*) NULL;}
////////////////////////////////////////////////////////////////////////////
// asm_block::~asm_block
```

```
// Destructor.
/////////////////////////////////////////////////////////////////////
asm_block::~asm_block()
{}
/////////////////////////////////////////////////////////////////////
// asm_block::add_operand_value
// Record an operand value expression and return an unique index which
// identifies the expression, so that the operand field of the instruction
// can be evaluated later.
/////////////////////////////////////////////////////////////////////
int    asm_block::add_operand_value(expr* expr_ptr){
       static int operand_value_index = 0;
       operand_values[operand_value_index] = expr_ptr;
       return operand_value_index++;}
/////////////////////////////////////////////////////////////////////
// asm_block::enter_fields
// Enter the fields of a new instruction into the arrays for each field.
// The number for this instruction is passed, as this is used as the
// array index for the fields.
// Keeping the instruction fields in distinct arrays makes it easier
// to do successive compiler passes, eliminating the need for masking
// of the composite instruction.
/////////////////////////////////////////////////////////////////////
void asm_block::enter_fields(int index, int line_num, int opcode,
                                   int addr_mode, int operand, int reloc_type){
      opcode_fields[index] = opcode;
      addr_mode_fields[index] = addr_mode;
      operand_fields[index] = operand;
      instr_line_numbers[index] = line_num;
      relocation[index] = reloc_type;
      // also add file inclusion nest level, used for listing output,
      // as well as line number in top-level file
      if (the_file_stack.size())
            top_level_instr_line[index] = the_file_stack.line_at_file_level(0);
      else
            top_level_instr_line[index] = line_num;}
/////////////////////////////////////////////////////////////////////
// asm_block::set_duration
// Sets an expression for the duration of this block, plus whether
```

```
// or not duration can be variable.
// Returns FALSE of duration was previously set.
//////////////////////////////////////////////////////////////////
BOOLEAN asm_block::set_duration(expr* dur){
    if (duration)
        return FALSE;
    else{
        duration = dur;
        return TRUE;
    }}
//////////////////////////////////////////////////////////////////
// value_goof_msg
// Create a message string for a value warning or error
//////////////////////////////////////////////////////////////////
void value_goof_msg(int eval_status, expr* expr_ptr, char* name,
                        char* msg){
    switch (eval_status){
    case REAL_OUT_OF_RANGE:
        sprintf(msg,
                "Real %s %f is not in range -2.0 to +1.9999", name,
                real_value(expr_ptr));
        break;
    case OVERFLOW:
        sprintf(msg,
                "Integer %s %ld doesn't fit in 24 bits", name,
                int_value(expr_ptr));
        break;
    case OPERAND_OVERFLOW:
        sprintf(msg,
                "%s %ld is too big to fit in the 15 bit operand field", name,
                int_value(expr_ptr));
        break;
    case NULL_EXPR:
        sprintf(msg,
                "No %s!! Internal error!!", name);
        break;
    case NOT_BOTH_NUMBERS_OR_STRINGS:
        sprintf(msg,
                "Both arguments for this %s operator need to be either numbers or strings",
```

```
                    name);
            break;
        case INT_REQUIRED:
            sprintf(msg,
                    "Arguments for this %s operator need to be integers",
                    name);
            break;
        case ADDRESSES_CODE_SPACE:
            sprintf(msg,
                    "%s %ld refers to code space, not data space", name,
                    int_value(expr_ptr));
            break;
        default:
            sprintf(msg,
                    "Value unknown for %s", name);
            break;
        }}
////////////////////////////////////////////////////////////////////////
// asm_block::value_error
// Report a value error for an expression.
////////////////////////////////////////////////////////////////////////
void asm_block::value_error(int eval_status, expr* expr_ptr, int i, char* name){
    char        msg[100];
    extern intinstr_line;
    int                 status;
    char        *msg_code = "BLK010"; // change low char based on status

    // set global variable "instr_line" to reflect line number
    instr_line = instr_line_numbers[i];
    // set low digit char from eval status enumeration
    msg_code[5] = '0' + eval_status;
    value_goof_msg(eval_status, expr_ptr, name, msg);
    status = other_error(msg_code, msg);}
////////////////////////////////////////////////////////////////////////
// asm_block::value_warning
// Report a value warning for an expression.
////////////////////////////////////////////////////////////////////////
void asm_block::value_warning(int eval_status, expr* expr_ptr, int i, char* name){
    char        msg[100];
```

```
	extern intinstr_line;
	int		status;
	char	*msg_code = "BLK010"; // change low char based on status
	// set global variable "instr_line" to reflect line number
	instr_line = instr_line_numbers[i];
	// set low digit char from eval status enumeration
	msg_code[5] = '0' + eval_status;
	value_goof_msg(eval_status, expr_ptr, name, msg);
	status = warning(msg_code, msg);}
//////////////////////////////////////////////////////////////////////
// asm_block::eval_operands
// Evaluate all operand values and indexed offsets and set them in their
// respective instructions.
// This is called both at compile and link time, since all operands
// need not be known at compile time
// The arrays "linked_addr_mode" and "linked_operand" and set, so
// the original arrays "addr_mode_fields" and "operand_fields" are
// not touched.
//////////////////////////////////////////////////////////////////////
int asm_block::eval_operands( BOOLEAN must_be_known){
	long	immed_val;
	long	high_bits;
	int		eval_status = 0;
	int		warn_status;
	expr*	expr_ptr;
	BOOLEANis_real;		// TRUE if operand is real
	int		jmp_address;
	string*	name;
	int		return_value = 0;
	for (int i=0; i<n_instructions; i++){
		// assume operand and address is ok for now
		linked_addr_mode[i] = addr_mode_fields[i];
		linked_operand[i] = operand_fields[i];

		// if immediate mode address, try to evaluate
		if (is_immediate_mode(addr_mode_fields[i]))
		{
			// but make sure we trap only source operand class opcodes
			if (is_source_op_opcode(opcode_fields[i]))
```

```
{
        expr_ptr = operand_values[operand_fields[i]];

        if (eval_status = eval_24_bit_value(expr_ptr, &immed_val,
                &relocation[i], &reloc_level[i], &is_real))
                if (must_be_known || eval_status != NUM_VALUE_NOT_-
KNOWN)
                {
                value_error(eval_status, expr_ptr, i, "immediate value");
                return_value = 1;
                }
        // see if we must decide justification
        if (addr_mode_fields[i] == IMMEDIATE_MODE)
        {
                // test if it will fit in operand field unshifted
                // first extract potential high bits
                high_bits = immed_val & ~OPER_MASK;
                if (high_bits && (high_bits != HIGH_MASK))
                {
                // too big to fit unshifted, so shift down
                // but if not real, output a warning
                // unless phantom block, where we assume we know
                // what we're doing
                if (!is_real && !phantom)
                {
                warn_status = OPERAND_OVERFLOW;
                value_warning(warn_status, expr_ptr, i,
                "Immediate integer");
                }
                immed_val = immed_val >> HIGH_SHIFT;

                // set address mode to left justify
                linked_addr_mode[i] = IMMED_L_MODE;
                }
                else
                // will fit right justified and sign extended
                linked_addr_mode[i] = IMMED_R_MODE;
        }
        // set operand_field, but make sure to use only our bits!
```

```
                linked_operand[i] = (int) (immed_val & LOW_MASK);
            }
            else if (is_jump_opcode(opcode_fields[i]))
            {
                // get name for this label
                name = label_name_at_index(operand_fields[i]);
                // find label in this block or higher level block
                jmp_address = get_address_from_label_name(name);
                if (must_be_known && jmp_address == NO_ADDRESS)
                {
                        eval_status = NUM_VALUE_NOT_KNOWN;
                        value_error(eval_status, (expr*) NULL, i, "jump address");
                        return_value = 1;
                }
                linked_operand[i] = (int) (jmp_address & LOW_MASK);
            }
        }
        // else if indirect mode address, try to evaluate
        else if (is_indexed_mode(addr_mode_fields[i]))
        {
            // but make sure we trap only correct opcode classes
            if (is_source_op_opcode(opcode_fields[i]) ||
                is_dest_op_opcode(opcode_fields[i]) ||
                is_jump_opcode(opcode_fields[i]) )
            {
                // indexed mode is same, but only allow right-justified number
                expr_ptr = operand_values[operand_fields[i]];
                if (eval_status = eval_24_bit_value(expr_ptr, &immed_val,
                        &relocation[i], &reloc_level[i], &is_real))
                        if (must_be_known || eval_status != NUM_VALUE_NOT_-
KNOWN)
                        {
                        value_error(eval_status, expr_ptr, i, "index value");
                        return_value = 1;
                        }
                // test if it will fit in operand field unshifted
                // first extract potential high bits
                high_bits = immed_val & ~OPER_MASK;
                if (high_bits && (high_bits != HIGH_MASK))
```

```
                {
                        // too big to fit unshifted, so value is out of range!
                        eval_status = OPERAND_OVERFLOW;
                        value_error(eval_status, expr_ptr, i, "Indexed mode offset");
                        return_value = 1;
                }
                else
                {
                        // set operand, but make sure to use only our bits!
                        linked_operand[i] = (int) (immed_val & LOW_MASK);
                }
        }
}
// else if direct mode address, try to evaluate
else if (is_direct_mode(addr_mode_fields[i]))
{
        // but make sure we trap only correct opcode classes
        if (is_source_op_opcode(opcode_fields[i]) ||
                is_dest_op_opcode(opcode_fields[i]) ||
                is_jump_opcode(opcode_fields[i]) )
        {
                // only allow right-justified number
                expr_ptr = operand_values[operand_fields[i]];
                eval_status = eval_24_bit_value(expr_ptr, &immed_val,
                        &relocation[i], &reloc_level[i], &is_real);
                // make sure operand is legal, which can't be negative
                high_bits = immed_val & ~OPER_MASK;
                if (high_bits)
                        eval_status = OPERAND_OVERFLOW;
                // give warning if trying to address code space
                if (must_be_known &&
                        eval_status == 0 && immed_val < io_space_start)
                {
                        warn_status = ADDRESSES_CODE_SPACE;
                        value_warning(warn_status, expr_ptr, i, "Address");
                }
                if (eval_status)
                {
                        if (must_be_known || eval_status != NUM_VALUE_NOT_-
```

```
KNOWN)
                    {
                    value_error(eval_status, expr_ptr, i,"Address");
                    return_value = 1;
                    }
                }
                // if there's a fudge factor (chip bug) for absolute addresses,
                // add it
                if (abs_addr_fudge)
                    linked_operand[i] = (int) ((immed_val & LOW_MASK)
                    + abs_addr_fudge);
                else
                    linked_operand[i] = (int) (immed_val & LOW_MASK);
            }
        }}
    return return_value;}
////////////////////////////////////////////////////////////////////////
// asm_block::check_duration
// If no duration given, make sure the block has no backward
// jumps if there are any condition jumps, which would could create
// data-dependent loops.
// Returns FALSE if it fails this test.
// If no duration and no backward jumps, then set the duration
// equal to the number of instructions.
// If any conditional forward jumps, set duration as variable.
// "eval_operands" must first have been called, since this resolves
// jump addresses.
////////////////////////////////////////////////////////////////////////
BOOLEAN asm_block::check_duration(){
    BOOLEANconditionals = FALSE;
    BOOLEANbackward_jumps = FALSE;
    if (duration)
        return TRUE;

    for (int i=0; i<n_instructions; i++){
        if (is_jump_opcode(opcode_fields[i]))
        {
            if (is_cond_jump_opcode(opcode_fields[i]))
                conditionals = TRUE;
```

```
            // test if this is a backward branch
            if (linked_operand[i] < i)
                backward_jumps = TRUE;
        }}
    // if any conditionals, don't allow backward jumps
    if (conditionals){
        if (backward_jumps)
        {
            other_error("BLK020",
            "With condition jumps and backward jumps, you must specify a duration.");
            return FALSE;
        }}
    // set duration expression from # of instructions
    duration = int_to_expr((long) n_instructions);
    return TRUE;}
/////////////////////////////////////////////////////////////////
// asm_block::out_instruction
// output assembly code for the given line.
/////////////////////////////////////////////////////////////////
void asm_block::out_instruction(int line, ostream& out){
    long  instruction;

    instruction = ((long) opcode_fields[line] << OP_SHIFT)
                        | ((long) linked_addr_mode[line] << MODE_SHIFT)
                        | (long) linked_operand[line];
    out << form("%06lx",instruction);}
/////////////////////////////////////////////////////////////////
// asm_block::out_reloc_instruction
// output assembly code for the given line, but put appostrophe on
// at end if operand field is relocatable.
/////////////////////////////////////////////////////////////////
void asm_block::out_reloc_instruction(int line, ostream& out){
    long  instruction;
    instruction = ((long) opcode_fields[line] << OP_SHIFT)
                        | ((long) linked_addr_mode[line] << MODE_SHIFT)
                        | (long) linked_operand[line];
    out << form("%06lx", instruction);
    if (relocation[line] >= RELATIVE)
        out << "'";
```

```
        else if (relocation[line] == UNDEFINED)
                out << "?";
        else
                out << " ";
        // if non-zero relocation level, print it
        if (reloc_level[line])
                out << "*" << reloc_level[line] << " ";
        else
                out << " ";
                }
////////////////////////////////////////////////////////////////////////
// asm_block::out_asm
// output assembly code directly, without linking
////////////////////////////////////////////////////////////////////////
int asm_block::out_asm(ostream& out){
        for (int i=0; i<n_instructions; i++){
                out_instruction(i, out);
                out << "\n";}
        return 0;}
////////////////////////////////////////////////////////////////////////
// asm_block::out_addr_and_instruction
// Output the instruction address followed by the instruction.
////////////////////////////////////////////////////////////////////////
void asm_block::out_addr_and_instruction(int next_instr, ostream& listing){
        int             address;
        // if code has absolute origin, displace output addr by this amount
        address = next_instr;
        if (absolute_origin)
                address += origin_address;
        listing << form("%04x ", address);
        out_reloc_instruction(next_instr, listing);}
////////////////////////////////////////////////////////////////////////
// asm_block::out_listing
// Output the program listing.
////////////////////////////////////////////////////////////////////////
int     asm_block::out_listing(istream& in, ostream& listing, int& in_line){
        int                             next_instr = 0;
        int                             next_storage = 0;
        int                             n_storage;
```

```
BOOLEAN     new_line = TRUE;
char        ch;
int                  status = 0;
BOOLEAN     more;
long_array storage_vector;
// get size of storage table
n_storage = non_phantom_storage_table_size();
while (
          (next_instr < n_instructions) ||
          (next_storage < n_storage)
     ){
     if (in.rdstate() != _good) break;
     in.get(ch);
     if (new_line)
     {
          // check for output of instruction code
          // - use top level instruction line in case code was generated
          // from inside an include file
          if ( (top_level_instr_line[next_instr] <= in_line+1)
               && (next_instr < n_instructions) )
          {
               out_addr_and_instruction(next_instr, listing);
               next_instr++;
          }
          // check for output of storage initialization
          else if ( (get_top_level_stor_line(next_storage) <= in_line+1)
                    && (next_storage < n_storage) )
          {
               listing << form("%04x ",
                    storage_index_to_location(next_storage));
               status |= out_storage_code(next_storage, listing, &more,
                    &storage_vector);
               next_storage++;
          }
          else
               listing << " ";
          new_line = FALSE;
     };
     listing.put(ch);
```

```
            if (ch == '\n')
            {
                // output remaining multi-code instruction line
                while ( (top_level_instr_line[next_instr] <= in_line+1)
                                && (next_instr < n_instructions) )
                {
                    out_addr_and_instruction(next_instr, listing);
                    listing << "\n";
                    next_instr++;
                }
                // output remaining multi-code initialization line
                while ( (get_top_level_stor_line(next_storage) <= in_line+1)
                                && (next_storage < n_storage) )
                {
                    listing << form("%04x ",
                                storage_index_to_location(next_storage));
                    status |= out_storage_code(next_storage, listing, &more,
                                &storage_vector);
                    listing << "\n";
                    next_storage++;
                }
                in_line++;
                new_line = TRUE;
            }
        }
        return status;}
//////////////////////////////////////////////////////////////////////
// hier_block::hier_block
// Constructor.
//////////////////////////////////////////////////////////////////////
hier_block::hier_block() : instances(SZ){
        autosequence = TRUE;
        leaf_block = FALSE;
        manual_block = FALSE;
        refs_connected = FALSE;
        children_sequenced = FALSE;}
//////////////////////////////////////////////////////////////////////
// hier_block::~hier_block
// Destructor.
```

```
/////////////////////////////////////////////////////////////////////
hier_block::~hier_block()
{}
/////////////////////////////////////////////////////////////////////
// hier_block::add_block_ref
// Add a block_ref for a new instance.
// Returns FALSE if an instance by this name already exists.
/////////////////////////////////////////////////////////////////////
BOOLEAN hier_block::add_block_ref(block_ref* ref_ptr){
	int			i;
	string*		name;

	// make sure instance name is unique
	name = ref_ptr->get_instance_name();
	for (i=0; i<instances.size(); i++){
		if (*name == *instances[i]->get_instance_name())
		return FALSE;}
	i = instances.size();
	instances[i] = ref_ptr;
	return TRUE;}
/////////////////////////////////////////////////////////////////////
// hier_block::refs_iter_init
// Initialize the iterator index for the block refs iterator.
/////////////////////////////////////////////////////////////////////
void hier_block::refs_iter_init(){
	ref_index = 0;}
/////////////////////////////////////////////////////////////////////
// hier_block::next_ref
// Get the next block referred to by this block. If no more
// blocks, return FALSE.
/////////////////////////////////////////////////////////////////////
BOOLEANhier_block::next_ref(block_ref** ref_ptr){
	if (ref_index < instances.size()){
		*ref_ptr = instances[ref_index++];
		return TRUE;}
	else{
		return FALSE;}
/////////////////////////////////////////////////////////////////////
// hier_block::verify_block_refs
```

```
// Verify that all blocks referenced by this block exist. Also set a ptr
// to the block in the block ref.
// If not, return the name of one which does not.
//////////////////////////////////////////////////////////////////////
string*hier_block::verify_block_refs(){
        block_ref*ref_ptr;
        string*      blk_name;
        string*      inst_name;
        arg_set*vals;
        arg_set*ports;
        int                 ln;
        block*      blk_ptr;

        for (int i=0; i<instances.size(); i++){
                ref_ptr = instances[i];
                ref_ptr->get_block_info(&blk_name, &inst_name, &vals, &ports; &ln);
                if (prototype_blocks.find(*blk_name, &blk_ptr))
                        ref_ptr->set_block_pointer(blk_ptr);
                else
                        return blk_name;}
        return NULL;}
//////////////////////////////////////////////////////////////////////
// hier_block::sequence_children
// If this is a hierarchical block, sequence its children.
// This function sequences children recursively.
// It sets a boolean argument new_rate_ptr to TRUE if any rate changes
// (decimation or interpolation) were performed in the children.
// We need to know this because such rate changes created time sub-zones
// which need to be kept together in block sequencing. This lets us split
// sub-zones easily, by just checking for a change in zone in the block
// sequence.
// Returns TRUE if error.
//////////////////////////////////////////////////////////////////////
BOOLEANhier_block::sequence_children(BOOLEAN* new_rate_ptr){
        int                 i;
        inp_listremaining;             // inputs (block and input index) remaining
        int_arraypending_blocks;// blocks with inputs pending
        int                 blk_index;
        int                 inp_index;
```

```
BOOLEANstatus = FALSE;
BOOLEANnew_rate = FALSE;// if any child has new rate, set as TRUE
// set this block prototype as the current block for error msgs
push_block(this);
// sequence if this is autosequence and we have block inputs
if (is_autosequence() && block_inputs.size()){
      // first make sure all our references are marked
      if (!refs_connected)
      {
            other_error("BLK901", "INTERNAL ERROR -- Trying to sequence block with-
out first connecting refs.\n");
            pop_block();
            return TRUE;
      }
      // we must auto-sequence, so start off with inputs to block
      remaining = block_inputs;
      // first make a list of all blocks with inputs pending
      // and also filter out any block which is really the parent block
      // output psuedo-block, which has a negative block index
      remaining.iter_init();
      while (remaining.next(&blk_index, &inp_index))
      {
            if (blk_index >= 0)
            {
                  // first mark initial inputs to blocks as reached
                  instances[blk_index]->mark_input_as_reached(inp_index);
#ifdef DEBUG
      cerr << "marking input " << inp_index << " of block "
           << *instances[blk_index]->get_instance_pointer()->hier_name_string()
           << " as reached\n";
#endif
                  // next add new block number to pending blocks list
                  if (pending_blocks.find(blk_index) < 0)
                  {
                              pending_blocks[pending_blocks.size()] = blk_index;
#ifdef DEBUG
      cerr << "adding "
           << *instances[blk_index]->get_instance_pointer()->hier_name_string()
           << " to pending blocks on sequence children\n";
```

```
#endif
                }
            }
            else
                remaining.remove();// remove parent output pseudo-block
        }
        // repeat while any inputs remaining or any blocks with pending input
        while (!remaining.empty() || pending_blocks.size())
        {
            // Pass through blocks which have all inputs marked. This
            // marks inputs in the connected blocks, which, in turn, we
            // try to pass through if all their inputs are marked.
            // The process continues until there are no more blocks.
            // If there are blocks but we can't pass through any, then
            // we are blocked with a feedback loop.
            //
            // If block passed through or any of its child blocks have a new
            // sample rate, then new_rate is set TRUE.
            if (!pass_through_fully_marked_blocks(remaining, pending_blocks,
                        &new_rate))
                mark_loops(remaining, pending_blocks, &new_rate);
        }}
    else{
        // not autosequence, so set the sequence that the user specified
        // set our block as sequenced & recursively sequence children
        for (i=0; i<instances.size(); i++)
            set_sequenced_and_call_children(i, &new_rate);}
    // make sure all child blocks are sequenced
        for (i=0; i<instances.size(); i++)
        {
            if (!instances[i]->get_instance_pointer()->is_sequenced())
            {
                // only virtual I/O blocks can be left out of sequence
                // add them at the end
                if (instances[i]->get_block_pointer()->is_block_virtual_io())
                {
                        // add virtual I/O block at end of sequence
                        sequence.append(i);
                        instances[i]->get_instance_pointer()->set_sequenced();
```

```
                    }
                    else
                    {
                            instances[i]->get_instance_pointer()->
                            out_error("BLK022", cerr, TRUE);
                            cerr << "Unable to place this instance in a"
                             << " firing sequence.\n"
                             << " Is it connected to anything?\n";
                            status = TRUE;
                    }
                }
            }
    // mark us has having sequenced children
    set_children_sequenced();
    // we're no longer the current block
    pop_block();
    // tell caller if this block or any child block has a sample rate change
    *new_rate_ptr = new_rate;
    return status;}
//////////////////////////////////////////////////////////////////////////
// hier_block::mark_loops
// Used by hier_block::sequence_children to mark feedback loops,
// and let user know he has feedback.
//////////////////////////////////////////////////////////////////////////
void hier_block::mark_loops(inp_list& remaining, int_array& pending_blocks,
                            BOOLEAN* new_rate_ptr){
    int         j;
    int         blk_index;
    block*      blk_ptr;
    string*     blk_name;
    string*     io_name;
    // we hit a loop!
    if (pending_blocks.size()){
        // find unmarked inputs for pending block, and mark as loop
        blk_index = pending_blocks[0];
        for (j=0; j<instances[blk_index]->io_size(); j++)
        {
            if (instances[blk_index]->is_input(j))
            {
```

```
if (!instances[blk_index]->is_input_marked(j))
{
                // found an input that's not mark
                // so mark normally and as loop input
                instances[blk_index]->mark_loop_io(j);
#ifdef DEBUG
    cerr << "marking as loop I/O " << j << " of block "
        << *instances[blk_index]->get_instance_pointer()->hier_name_string()
        << " as reached\n";
#endif
                instances[blk_index]->mark_input_as_reached(j);
#ifdef DEBUG
    cerr << "marking input " << j << " of block "
        << *instances[blk_index]->get_instance_pointer()->hier_name_string()
        << " as reached\n";
#endif
                // mark this wire as a loop wire
                loop_wires[
                 instances[blk_index]->parent_wire_for_io(j)]= TRUE;
                // tell user that he has a feedback loop
                blk_ptr = instances[blk_index]->get_block_pointer();
                io_name = blk_ptr->io_name_at_index(j);
                blk_name = blk_ptr->get_block_name();
                line = instances[blk_index]->get_line_number();
                out_warn_header("BLK021");
                cerr << "Do you know you have a feedback loop to input '"
                 << *io_name
                 << "' of block '"
                 << *blk_name
                 << "'?\n";
            }
        }
    }
    // can now pass through this block
    pass_through(blk_index, remaining, pending_blocks, new_rate_ptr);
    block_has_loops = TRUE;
}}
/////////////////////////////////////////////////////////////////////
// hier_block::pass_through_full_marked_blocks
```

```
// Used by hier_block::sequence_children to pass through all blocks which
// have all their inputs marked.
// Returns TRUE if we passed through any blocks.
///////////////////////////////////////////////////////////////////////
BOOLEAN hier_block::pass_through_fully_marked_blocks(inp_list& remaining,
                                int_array& pending_blocks, BOOLEAN* new_rate_ptr){
    int             i;
    int             blk_index;
    BOOLEANpassed_through = FALSE;
    // If all block's inputs marked, can pass through this block.
    // HOWEVER:
    // We must pass through blocks which cross into new time
    // subzones at the last possible moment. This results in
    // subzone sequencing within a block sequence; that is, all
    // the blocks in a subzone are kept in a contiguous sequence.
    // Scan pending blocks first for any which doesn't cross to
    // a new subzone boundary (new sample rate).
    if (pending_blocks.size()){
        for (i=0; i<pending_blocks.size(); i++)
        {
            blk_index = pending_blocks[i];
            if (instances[blk_index]->all_inputs_marked()
            && !instances[blk_index]->get_instance_pointer()->
//                          is_new_rate_block())
                            prototype()->is_rate_change_block())
            {
                pass_through(blk_index, remaining, pending_blocks,
                            new_rate_ptr);
                passed_through = TRUE;
            }
        }}
    // if no ordinary blocks passed through, we can now pass through
    // a new subzone block
    if (!passed_through && pending_blocks.size()){
        for (i=0; i<pending_blocks.size(); i++)
        {
            blk_index = pending_blocks[i];
#ifdef DEBUG
        cerr << "testing pass through for possible rate change block "
```

```
                << *instances[blk_index]->get_instance_pointer()->hier_name_string()
                << "\n";
#endif
                    if (instances[blk_index]->all_inputs_marked()
                         && instances[blk_index]->get_instance_pointer()->
                                   prototype()->is_rate_change_block())
                    {
                         pass_through(blk_index, remaining, pending_blocks,
                                   new_rate_ptr);
                         passed_through = TRUE;
                         // make sure to break through just one subzone boundary
                         // at a time!
                         break;
                    }
               }}
          return passed_through;}
////////////////////////////////////////////////////////////////////////
// hier_block::set_sequenced_and_call_children
// Mark this block as sequenced, and also recursively call
// hier_block::sequence_children() to sequence all children if they
// have not been sequenced before.
// This is so that we can mark sub-zone info
// for child blocks which we need to keep sub-zones together in parent blocks.
////////////////////////////////////////////////////////////////////////
void hier_block::set_sequenced_and_call_children(int blk_index,
                                        BOOLEAN* new_rate_ptr){
          instance*inst_ptr;
          // make this block next in sequence
          sequence.append(blk_index);
          inst_ptr = instances[blk_index]->get_instance_pointer();
          // if child is hierarchical, try to sequence it
          if (!inst_ptr->prototype()->is_leaf_block()){
               // if block has not been sequenced before, sequence its children,
               // then mark it as sequenced
               if (!( (hier_block*) inst_ptr->prototype() )->are_children_sequenced())
               {
                    // save current block context and set instance info in block
                    inst_ptr->push_context();
```

```
            // recursively call sequence_children
            inst_ptr->prototype()->sequence_children(new_rate_ptr);
            // restore previous context
            inst_ptr->pop_context();
        }}
    else{
        // block is primitive, so check if it's a rate change block, which
        // would create a new sample rate
        if (inst_ptr->prototype()->is_rate_change_block())
            *new_rate_ptr = TRUE;}
    // mark new instance as sequenced
    inst_ptr->set_sequenced();}
/////////////////////////////////////////////////////////////////////////
// hier_block::pass_through
// Used to pass through a block which has all inputs marked.
// Recursively calls hier_block::sequence_children() to sequence children
// of the passed through block. This is so that we can mark sub-zone info
// for child blocks which we need to keep sub-zones together in parent blocks.
/////////////////////////////////////////////////////////////////////////
void hier_block::pass_through(int blk_index, inp_list& remaining,
                        int_array& pending_blocks, BOOLEAN* new_rate_ptr){
    int         j;
    int         inp_index;
    int         output_index;
    int         nxt_blk;
    BOOLEANnew_rate = FALSE;
#ifdef DEBUG
    cerr << "passing through "
        << *instances[blk_index]->get_instance_pointer()->hier_name_string()
        << "\n";
#endif
    // set our block as sequenced & recursively sequence children
    set_sequenced_and_call_children(blk_index, &new_rate);
    // remove this block from pending blocks list
    pending_blocks.remove(pending_blocks.find(blk_index));
    // remove this block's inputs from remaining inputs list
    remaining.iter_init();
    while (remaining.next(&nxt_blk, &inp_index)){
        if (nxt_blk == blk_index)
```

```
                remaining.remove(); }
        // add its output connections to our remaining list
        for (j=0; j<n_connections(blk_index); j++){
            get_connection(blk_index, j, &nxt_blk, &inp_index, &output_index);
            // add to list only if input not marked, which would make a loop,
            // and if not really an output to the parent block, which is a special
            // negative pseudo-block index
            if (nxt_blk >= 0)
            {
                if (!instances[nxt_blk]->is_input_marked(inp_index))
                {
                    // add to remaining inputs list
                    remaining.add(nxt_blk, inp_index);
                    // mark this input as reached
                    instances[nxt_blk]->mark_input_as_reached(inp_index);
#ifdef DEBUG
    cerr << "marking input " << inp_index << " of block "
        << *instances[nxt_blk]->get_instance_pointer()->hier_name_string()
        << " as reached\n";
#endif

                    // also add to pending blocks list if block not already on
                    if (pending_blocks.find(nxt_blk) < 0)
                    {
                            pending_blocks[pending_blocks.size()] = nxt_blk;
#ifdef DEBUG
    cerr << "adding "
        << *instances[nxt_blk]->get_instance_pointer()->hier_name_string()
        << " to pending blocks on pass through\n";
#endif
                    }
                    // if child set a new sample rate (sub-zone),
                    // mark connecting blocks as new_rate blocks
                    if (new_rate)
                            instances[nxt_blk]->get_instance_pointer()->
                            set_as_new_rate_block();
                }
                else
                {
```

```
                    // this output goes to a marked input, which would make a loop
                    // save this info about the output
                    instances[blk_index]->mark_loop_io(output_index);
#ifdef DEBUG
    cerr << "marking as loop I/O " << output_index << " of block "
        << *instances[blk_index]->get_instance_pointer()->hier_name_string()
        << " as reached\n";
#endif
            }
        }}
    // tell caller if we had a rate change
    if (new_rate)
        *new_rate_ptr = new_rate;}
//////////////////////////////////////////////////////////////////////
// seq_block::seq_block
// Constructor.
//////////////////////////////////////////////////////////////////////
seq_block::seq_block(){
    autosequence = FALSE;
    leaf_block = FALSE;
    manual_block = FALSE;}
//////////////////////////////////////////////////////////////////////
// seq_block::~seq_block
// Destructor.
//////////////////////////////////////////////////////////////////////
seq_block::~seq_block()
{}
//////////////////////////////////////////////////////////////////////
// gsp_block::gsp_block
// Constructor.
//////////////////////////////////////////////////////////////////////
gsp_block::gsp_block(){
    autosequence = FALSE;
    leaf_block = FALSE;
    manual_block = TRUE;}
//////////////////////////////////////////////////////////////////////
// gsp_block::~gsp_block
// Destructor.
//////////////////////////////////////////////////////////////////////
```

```
gsp_block::~gsp_block()
{}
/////////////////////////////////////////////////////////////////////
// new_gsp_asm_name
// Create a new name for an asm block embedded in a gsp block.
// Returns both a block name and an instance name.
/////////////////////////////////////////////////////////////////////
void  new_gsp_asm_name(string** blk_name, string** inst_name){
      static intasm_block_count = 0;
      char         count_text[ITOA_LIMIT];
      char         blk_name_arr[ITOA_LIMIT+10];
      char         inst_name_arr[ITOA_LIMIT+10];
      // create unique strings for block and instance names
      itoa(asm_block_count, count_text, 10);
      strcpy(blk_name_arr, "$$asm");
      strcat(blk_name_arr, count_text);
      *blk_name = new string(blk_name_arr);
      strcpy(inst_name_arr, "$$asmI");
      strcat(inst_name_arr, count_text);
      *inst_name = new string(inst_name_arr);
      // advance the index for next time around
      asm_block_count++;}
/////////////////////////////////////////////////////////////////////
// gsp_block::add_new_asm_section
// Add a new assembly language section, created as an asm block, in
// this gsp block.
/////////////////////////////////////////////////////////////////////
void  gsp_block::add_new_asm_section(block* section){
      string*      blk_name;
      string*      inst_name;
      // generate a new name for this embedded asm block
      new_gsp_asm_name(&blk_name, &inst_name);
      // set the name for this block, provide it doesn't already exist
      while (!section->set_block_name(blk_name))
            new_gsp_asm_name(&blk_name, &inst_name);
      // add a reference to this block
      hier_block::add_block_ref(new block_ref(*blk_name, *inst_name, line));}
// block.hxx
// block class
```

```
// T. Montlick
// 10/31/89
/* source code control: @(#)block.hxx1.56 10/7/91 */
#define BLOCK_DEF
#ifndef STANDARD_DEF
#include "standard.hxx"
#endif
extern "C" {
#include "mystdlib.h"}
#ifndef INTRFACE_DEF
#include "intrface.hxx"
#endif
#ifndef STRING_DEF
#include "string.hxx"
#endif
#ifndef EXPR_DEF
#include "expr.hxx"
#endif
#ifndef EXPR_HASH_DEF
#include "exprhash.hxx"
#endif
#ifndef STRG_HASH_DEF
#include "strghash.hxx"
#endif
#ifndef EXPR_ARRAY_DEF
#include "expr_arr.hxx"
#endif
#ifndef INT_HASH_DEF
#include "int_hash.hxx"
#endif
#ifndef BLOCK_HASH_DEF
#include "blckhash.hxx"
#endif
#ifndef INT_ARRAY_DEF
#include "int_arr.hxx"
#endif
#ifndef LONG_ARRAY_DEF
#include "long_arr.hxx"
#endif
```

```
#ifndef STRG_ARRAY_DEF
#include "strg_arr.hxx"
#endif
#ifndef ALLOC_TABLE_DEF
#include "alloctab.hxx"
#endif
#ifndef BLOCK_ARRAY_DEF
#include "blck_arr.hxx"
#endif
#ifndef BLOCK_REF_ARRAY_DEF
#include "bref_arr.hxx"
#endif
#ifndef FIELDS_DEF
#include "fields.h"
#endif
#ifndef UTILITY_DEF
#include "utility.h"
#endif
#ifndef INSTANCE_DEF
#include "instance.hxx"
#endif
#ifndef INP_LIST_DEF
#include "inp_list.hxx"
#endif
// we use yylex to get init values from files, so need token values
#ifdef DOS
#include "ytab.h"
#else
#include "y.tab.h"
#endif
#ifdef SZ
#undef SZ
#endif
#defineSZ 10 /* default array and hash table size */
// suffixes added to block names for subroutine body and call
#defineSUBR_SUFFIX"$S"
#defineCALL_SUFFIX"$C"
class instance;
#ifndef INST_ARRAY_DEF
```

```
#include "inst_arr.hxx"
#endif
// base class of block class which maintains info for a port block
class block_chip_io{
        BOOLEANis_port_block;   // TRUE if block is an I/O port
        expr*       port_number;    // which port number
        expr*       trigger_source; // if signal source, which trigger number
        BOOLEANport_is_output;  // TRUE if serial I/O is output
        expr*       port_config;    // port config. word
        expr*       port_entry_size;// size of a fifo entry
        expr_arraygpio_numbers;// non-empty when gpios declared
        int_arraygpio_directions;// non-zero for outputs
        expr_arrayrts_numbers;// non-empty when rts' declared
        int_arrayrts_directions;// non-zero for outputs
public:
        block_chip_io();
        ~block_chip_io();
        expr*trigger_source_expr()
                                { return trigger_source; }
        expr*port_number_expr()
                                { return port_number; }
        expr*port_config_expr()
                                { return port_config; }
        expr*port_entry_size_expr()
                                { return port_entry_size; }
        BOOLEANis_port_output()
                                { return port_is_output; }
        BOOLEAN set_as_port(expr* port_num, expr* trigger,
                                BOOLEAN is_output, expr* config, expr* entry_size);
        BOOLEANis_sproc_output()
                                { return (is_port_block && port_is_output); }
        BOOLEANis_serial_port()
                                { return (is_port_block); }
        BOOLEANset_compute_line(expr* num);
        void  set_gpio(expr* e, BOOLEAN b)
                                { gpio_numbers.append(e);gpio_directions.append(b); }
        void  set_rts(expr* e, BOOLEAN b)
                                { rts_numbers.append(e); rts_directions.append(b); }
        BOOLEANhas_gpio(){ return (gpio_numbers.size() > 0); }
```

```
	int		n_gpios()		{ return gpio_numbers.size(); }
	expr*gpio_expr(int i, BOOLEAN* is_out_ptr)
				{ *is_out_ptr = gpio_directions[i]; return gpio_numbers[i]; }
	BOOLEANhas_rts(){ return (rts_numbers.size() > 0); }
	int		n_rts()		{ return rts_numbers.size(); }
	expr*rts_expr(int i, BOOLEAN* is_out_ptr)
				{ *is_out_ptr = rts_directions[i]; return rts_numbers[i]; }
};
// base class of block class which maintains info for i/o to block
class block_io{
	alloc_tableio_table;		// inputs and outputs, in order declared
	int_arrayio_direction;// non-zero for outputs
	expr_arrayio_init_val;// init. expr. for pseudo-sampled output
public:
	block_io();
	~block_io();
	BOOLEANio_allocate(string& name, expr* size, int* index)
					{ return io_table.allocate(name, size, index); }
	BOOLEANio_find(string& name, int* index, expr** size)
					{ return io_table.find(name, index, size); }
	BOOLEANall_io_declared(){ return io_table.all_sizes_set(); }
	int		io_table_size()	{ return io_table.size(); }
	expr*io_entry_size(int i)
					{ return io_table.get_size(i); }
	string*io_name_at_loc(int loc)
					{ return io_table.name_at_location(loc); }
	string*io_name_at_index(int index)
					{ return io_table.name_at_index(index); }
	int		io_index_to_location(int index)
					{ return io_table.index_to_location(index); }
	BOOLEANio_is_output(int i)
					{ return (io_direction[i] != 0); }
	void set_io_init_value(int i, expr* e)
					{ io_init_val[i] = e; }
	expr*get_io_init_value(int i)
					{ return io_init_val[i]; }
	BOOLEANset_io_size_and_direction(string* name, expr* size, int direction);
};
// base class of block class which maintains info for micro intrface
```

```
class block_micro_io{
	int_arrayis_micro_io;// TRUE if I/O is uP interface location
	int_arrayis_micro_var;// TRUE if storage is uP interface variable
	int_arrayis_micro_symbol;// TRUE if symbol is uP interface
public:
	block_micro_io();
	~block_micro_io();
	void  set_micro_io(int i, BOOLEAN b)
					{ is_micro_io[i] = b; }
	void  set_micro_var(int i, BOOLEAN b)
					{ is_micro_var[i] = b; }
	void  set_micro_symbol(int i, BOOLEAN b)
					{ is_micro_symbol[i] = b; }
	BOOLEANget_micro_io(int i)
					{ return is_micro_io[i]; }
	BOOLEANget_micro_var(int i)
					{ return is_micro_var[i]; }
	BOOLEANget_micro_symbol(int i)
					{ return is_micro_symbol[i]; }
};
// base class of block class which maintains info for storage to block
class block_storage{
	alloc_tablestorage_table;// local storage, in order declared
	expr_arraystorage_init_val;// storage location to init. expression
	int_arraystorage_line_numbers;// line #s which init storage locations
	int_arraytop_level_stor_line;// if include file, last top level line #
	int_arraystorage_types;// fixed, integer, hex, etc.
	int_arrayvariable_storage;// TRUE if variables, as opposed to wires
public:
	block_storage();
	~block_storage();
	BOOLEANstorage_allocate(string& name, expr* size, int* index)
					{ return storage_table.allocate(name, size, index); }
	void  set_storage_size(int index, expr* size)
					{ storage_table.set_size(index, size); }
	void  set_storage_type(int index, char type)
					{ storage_types[index] = (int) type; }
	void  set_as_variable(int index, BOOLEAN var)
					{ variable_storage[index] = var; }
```

```
    BOOLEANis_a_variable(int index)
                                  { return variable_storage[index]; }
    char  get_non_phantom_storage_type(int index)
                                  { return (char) storage_types[index]; }
    string*non_phantom_storage_name_at_index(int index)
                                  { return storage_table.name_at_index(index); }
    string*storage_name_at_location(int location)
                                  { return storage_table.name_at_location(location); }
    int         storage_index_to_location(int index)
                                  { return storage_table.index_to_location(index); }
    expr*non_phantom_storage_entry_size(int index)
                                  { return storage_table.get_size(index); }
    BOOLEANstorage_find(string& name, int* index, expr** size)
                                  { return storage_table.find(name, index, size); }
    void  add_storage_init(int index, expr* expr_ptr);
    expr*non_phantom_storage_init(int index)
                                  { return storage_init_val[index]; }
    int         get_storage_line_number(int i)
                                  { return storage_line_numbers[i]; }
    int         get_top_level_stor_line(int i)
                                  { return top_level_stor_line[i]; }
    int         non_phantom_storage_table_size()
                                  { return storage_table.size(); }
    int         non_phantom_alloc_storage_size()
                                  { return storage_table.alloc_size(); }
};
// base class of block class which maintains info for timezone
class block_zone{
    expr*       timezone_name;  // expr evaluating to a timezone name string
    expr*       timezone_rate;  // rate, if specified, for timezone
public:
    block_zone();
    ~block_zone();
    BOOLEANset_timezone(expr* name, expr* rate);
    BOOLEANget_timezone(expr** name, expr** rate);
    BOOLEANis_timezone_triggered()
                                  { return timezone_name != (expr*) NULL; }
    BOOLEANis_sproc_input()
                                  { return is_timezone_triggered(); }
```

```
};
// base class of block class which maintains virtual storage and I/O info
class block_virtual{
    int_arrayis_virtual_storage;// TRUE if storage is really elsewhere
    strg_arrayvirt_storage_path;// path string for where virtual storage is
    inst_arrayvirt_stor_path_inst;// instance reference for path
    BOOLEANis_virtual_io_block;// TRUE if this block is virtual I/O block
public:
    block_virtual();
    ~block_virtual();
    BOOLEANis_storage_virtual(int i)
                    { return is_virtual_storage[i]; }
    string*get_virt_storage_path(int i, instance** path_inst)
                    { *path_inst = virt_stor_path_inst[i];
                    return virt_storage_path[i]; }
    void  set_as_virtual_io()
                    { is_virtual_io_block = TRUE; }
    BOOLEANis_block_virtual_io()
                    { return is_virtual_io_block; }
    void  set_virtual_storage(int i, string* path, instance* path_inst);
};
// base class of block class which maintains info about a block which is
// on a rate change boundary (decimation or interpolation)
class block_rate_change{
    BOOLEANrate_change_block;// TRUE if block is before rate boundary
    BOOLEANdecimation;      // TRUE if decimation, FALSE if interp.
    expr*      change_ratio;    // interpolation or decimation ratio
public:
    block_rate_change();
    ~block_rate_change();
    void  set_decimating(expr* ratio);
    void  set_interpolating(expr* ratio);
    BOOLEANis_rate_change_block()
                    { return rate_change_block; }
    BOOLEANis_decimating()
                    { return (rate_change_block && decimation); }
    BOOLEANis_interpolating()
                    { return (rate_change_block && !decimation); }
    expr*get_change_ratio()
```

```
                    { return change_ratio; }
};
class block_subroutine{
    BOOLEANsubr_block;      // TRUE if block is subroutine
    BOOLEANcall_block;      // TRUE if block is subroutine call
    BOOLEANsubr_form;       // TRUE if inline block & has subr form
    int             n_times_called;// if subr, # times called
    BOOLEANsubr_inst_made; // in call block, TRUE if subr. instance
    instance*subr_inst_ptr;// ptr to subroutine instance
public:
    block_subroutine();
    ~block_subroutine();
    void        set_subr_block() { subr_block = TRUE; }
    BOOLEANis_subr_block()  { return subr_block; }
    void        set_call_block()  { call_block = TRUE; }
    BOOLEANis_call_block()  { return call_block; }
    void        set_subr_form()  { subr_form = TRUE; }
    BOOLEANhas_subr_form() { return subr_form; }
    void        increment_call_count(){ n_times_called++; }
    int             get_n_times_called(){ return n_times_called; }
    void        set_subr_inst_made(instance* inst)
                        { subr_inst_made = TRUE; subr_inst_ptr = inst; }
    BOOLEANis_subr_inst_made(){ return subr_inst_made; }
    instance*get_subr_instance(){ return subr_inst_ptr; }
};
class block : public block_chip_io, public block_micro_io, public block_zone,
            public block_virtual, public block_io, public block_storage,
            public block_rate_change, public block_subroutine{
    string      block_name;     // name for this block prototype
    string*     filename;       // name for file this block is in
    int             starting_line;// line number for start of block
    alloc_tableparam_table;// parameters and symbols, in order decl.
    int             n_params;  // # of initial params in previous table
    expr_hashsymbol_val_table;// symbol name to expression
    strg_hashalias_name_table;// alias name to (symbol or alias) name
    expr_arrayverify_expressions;// expressions to verify as TRUE
    strg_arrayverify_msgs;// msg to output on verify failed
    BOOLEANautosequence;    // TRUE if block refs to be autosequenced
    BOOLEANleaf_block;      // TRUE if block is leaf (ASM) block
```

```
        BOOLEANmanual_block;    // TRUE if block has GSP phantom blocks
        BOOLEANis_instantiated;// TRUE if block is instantiated by another
        BOOLEANin_hierarchy;    // TRUE when this block in inst. hierarchy
        BOOLEANis_indivisible;  // TRUE of block should not be split
        expr_hash*override_table;// symbols to check first
        instance*instance_ptr;// instance if block being instantiated
        alloc_tablelabel_table;// label name to index
        int_arraylabel_sequence;// index to sequence # of label
        int_arraylabel_offset;// index to label offset from start
        int_arraylabel_final;// label value is final rel. address
        BOOLEANabsolute_origin;// TRUE if block not relocatable
        int             origin_address;// start address if block not reloc.
        int             element_number;// # of elem. (typically instructions)
        int             l_index;    // next index # for label
        BOOLEANphantom;             // TRUE if phantom (linker-inserted)
        BOOLEANinit;                // TRUE if init (once-only execution)
        BOOLEANblock_has_loops;// TRUE if instances form loops
        int_arrayloop_wires;        // TRUE for wires which form loops
        int             variant_count;// # of variant instances for this block
        friend class asm_block;
        friend class hier_block;
        friend class seq_block;
        friend class gsp_block;
public:
        block();
        ~block();
        BOOLEANset_block_name(string*);
        string*get_block_name();
        string* get_filename(){ return filename; }
        int         get_starting_line(){ return starting_line; }
        BOOLEANadd_io_name(string* name, int* index, BOOLEAN is_micro);
        BOOLEANadd_param_name(string* name, int* index);
        BOOLEANadd_symbol_name(string* name, int* index);
        BOOLEANadd_symbol_name(string* name, int* index, BOOLEAN is_micro);
        BOOLEANadd_expression_name(string* name, expr* expr_ptr);
        BOOLEANadd_alias_name(string* new_name, string* equiv_name);
        BOOLEANadd_storage_name(string* name, expr* size, int* index, char type,
                                BOOLEAN is_micro, BOOLEAN is_variable);
        expr*get_storage_init(int index);
```

```
char  get_storage_type(int index);
int           storage_table_size();
expr* storage_entry_size(int i);
string*storage_name_at_index(int index);
int           storage_offset_at_index(int index);
void  add_verify_expression(expr* expr_ptr, string* fail_string);
expr* same_level_translation(string* name);
expr* translate_with_instances(string* name, instance** path_inst_ptr,
                                  instance** symbol_inst_ptr);
expr* translation(string* name);
expr* translate_to_param_val(string* name);
BOOLEANtranslate_to_io(string* name, int* value);
BOOLEANtranslate_to_storage(string* name, int* value);
BOOLEANknown_symbol(string* name);
BOOLEANtranslation_known(string* name);
BOOLEANis_autosequence(){ return autosequence; }
BOOLEANis_leaf_block()   { return leaf_block; }
BOOLEANis_indivisible_block(){ return is_indivisible; }
void  set_as_indivisible(){ is_indivisible = TRUE; }
BOOLEANis_manual_block(){ return manual_block; }
virtualstring*verify_block_refs();
virtualvoid refs_iter_init();
virtualBOOLEANnext_ref(block_ref**);
expr* check_verify_expressions();
void  set_as_instantiated(){ is_instantiated = TRUE; }
BOOLEANis_it_instantiated(){ return is_instantiated; }
void  set_in_hierarchy(BOOLEAN b){ in_hierarchy = b; }
BOOLEANis_in_hierarchy(){ return in_hierarchy; }
BOOLEANlook_up_storage_name(string* s, int* index);
BOOLEANlook_up_symbol_name(string* s, expr** expr_ptr);
BOOLEANlook_up_io_name(string* s, int* index);
BOOLEANlook_up_param_name(string s, int* index);
string*param_name_at_loc(int loc)
                                  { return param_table.name_at_location(loc); }
string*param_name_at_index(int index)
      { return param_name_at_loc(param_table.index_to_location(index)); }
expr* param_expr_at_index(int index);
int           param_table_size(){ return param_table.size(); }
int           get_n_params()   { return n_params; }
```

```
void set_override_symbols(expr_hash* symbols)
                            { override_table = symbols; }
int         n_verify_expressions()
                            { return verify_expressions.size(); }
expr* get_verify_expression(int i)
                            { return verify_expressions[i]; }
int         storage_error(char* msg_code, int loc, char* s);
int         storage_warning(char* msg_code, int loc, char* s);
int         out_storage_code(int i, ostream& out, BOOLEAN* is_vector,
                            long_array* v);
void out_rest_of_storage_vector(long_array* p, ostream& data);
int         out_storage(ostream& out);
string* get_verify_msg(int i)
                            { return verify_msgs[i]; }
void set_instance(instance* inst)
                            { instance_ptr = inst; }
string* hier_io_name_at_index(int index);
string* hier_storage_name_at_index(int index);
string* hier_label_name_at_index(int index);
string* hier_param_name_at_index(int index);
BOOLEAN label_name_to_index(string* name, int* index);
BOOLEAN add_label_name(string* name, int address);
int         assign_label_index(string* name);
int         label_table_size();
string* label_name_at_index(int index);
int         label_address(int index);
int         label_seq_at_index(int index);
int         label_offset_at_index(int index);
int         get_address_from_label_name(string*);
void set_label_offset(int index, int offset);
void iter_init_symbols();
BOOLEAN next_symbol(string** name_ptr, string** hier_ptr, expr** val_ptr);
void set_origin(int org)
                            { absolute_origin = TRUE; origin_address = org; }
BOOLEAN is_absolute() { return absolute_origin; }
int         org()           { return origin_address; }
int         instr_number() { return element_number; }
void advance_instr_number()
                            { element_number++; }
```

```
	void set_phantom(){ phantom = TRUE; }
	BOOLEANis_phantom(){ return phantom; }
	void set_init()	{ init = TRUE; }
	BOOLEANis_init(){ return init; }
	virtualBOOLEANsequence_children(BOOLEAN* new_rate_ptr);
	BOOLEANdoes_block_have_loops(){ return block_has_loops; }
	BOOLEANis_loop_wire(int i){ return loop_wires[i]; }
	int		new_variant_number()
				{ return variant_count++; }
};
// constants used to evaluate asm operands and 24-bit numbers
#define HIGH_MASK0xFFFF8000
#defineLOW_MASK0x00007FFF
#defineHIGH_SHIFT9		/* 24 bits width - 15 bit operand */
#define REAL_FACTOR4194304 /* 2^22 */
#define MAX_REAL1.99999999999
#define MIN_REAL-2.0
#defineWORD_MASK0x00FFFFFF
#define NEG_WORD_OVERFL0xFF000000
class asm_block : public block{
	expr_arrayoperand_values;// operand value index to expression
	// arrays for instruction fields, indexed by instruction number:
	int_arrayopcode_fields;
	int_arrayaddr_mode_fields;
	int_arrayoperand_fields;
	int_arrayinstr_line_numbers;
	int_arrayrelocation;
	int_arrayreloc_level;
	int_arraylinked_addr_mode;
	int_arraylinked_operand;
	int_arrayinclude_level;
	int_arraytop_level_instr_line;
	expr*		duration;
	int			n_instructions;// # of instructions in block
public:
	asm_block();
	~asm_block();
	int		add_operand_value(expr* expr_ptr);
	void enter_fields(int index, int line_num, int opcode, int addr_mode,
```

```
                                int operand, int reloc_level);
        int         eval_operands(BOOLEAN operands_known);
        void  out_instruction(int line, ostream& out);
        void  out_reloc_instruction(int line, ostream& out);
        int         out_asm(ostream& out);
        void  value_error(int eval_status, expr* expr_ptr, int i, char* name);
        void  value_warning(int eval_status, expr* expr_ptr, int i, char* name);
        int         out_listing(istream& in, ostream& out, int& listing_line);
        BOOLEANset_duration(expr*);
        void  set_n_instructions(int n){ n_instructions = n; }
        int         get_n_instructions(){ return n_instructions; }
        expr*get_duration_expr()     { return duration; }
        BOOLEAN check_duration();
        void  out_addr_and_instruction(int instr, ostream& listing);
};
#ifdef OWC
extern "C" {
#endif
int    read_init_file(string* name_string, int size, long_array* storage_vector,
                int index);
#ifdef OWC}
#endif
class hier_block : public block{
        bref_arrayinstances;            // blocks instantiated in this one
        BOOLEANchildren_sequenced;// TRUE if child blocks have been sequenced
        int              ref_index;  // ref names iterator index
        BOOLEANrefs_connected;  // TRUE when refs have been wired together
        inp_listblock_inputs;// child inputs that are block inputs
        int_arraywire_use_count;// # of inputs from each wire
        int_arrayinput_use_count;// # of inputs from each block input
        int_arraysequence;              // sequence for refs
public:
        hier_block();
        ~hier_block();
        BOOLEAN add_block_ref(block_ref*);// add a block ref for a new instance
        string*verify_block_refs();
        void  refs_iter_init();
        BOOLEANnext_ref(block_ref**);
        int         get_n_children()  { return instances.size(); }
```

```
void add_connection(int i, int blk_index, int input_num, int output)
            { instances[i]->add_connection(blk_index, input_num, output); }
int         n_connections(int i)
            { return instances[i]->n_connections(); }
BOOLEANget_connection(int i, int which, int* blk_index, int* input_num,
                  int* output)
            { return instances[i]->get_connection(which, blk_index,
                  input_num, output); }
void set_refs_connected(){ refs_connected = TRUE; }
BOOLEANare_refs_connected(){ return refs_connected; }
block*get_block_pointer(int i)
                  { return instances[i]->get_block_pointer();}
instance* get_instance_pointer(int i)
                  { return instances[i]->get_instance_pointer();}
void add_to_inputs(int which_ref, int which_input)
                  { block_inputs.add(which_ref, which_input); }
void inputs_iter_init()
                  { block_inputs.iter_init(); }
BOOLEANnext_input( int* which_ref, int* which_input)
                  { return block_inputs.next(which_ref, which_input); }
void bump_wire_use_count(int i)
                  { wire_use_count[i]++; }
int         get_wire_use_count(int i)
                  { return wire_use_count[i]; }
void bump_input_use_count(int i)
                  { input_use_count[i]++; }
int         get_input_use_count(int i)
                  { return input_use_count[i]; }
block_ref* get_child_block_ref(int i)
                  { return instances[i]; }
BOOLEANsequence_children(BOOLEAN* new_rate_ptr);
void mark_loops(inp_list& remaining, int_array& pending_blocks,
                  BOOLEAN* new_rate_ptr);
BOOLEAN pass_through_fully_marked_blocks(inp_list& remaining,
                  int_array& pending_blocks, BOOLEAN* new_rate_ptr);
void set_children_sequenced()
                  { children_sequenced = TRUE; }
BOOLEANare_children_sequenced()
                  { return children_sequenced; }
```

```
void set_sequenced_and_call_children(int blk_index,
                              BOOLEAN* new_rate_ptr);
void pass_through(int, inp_list&, int_array&, BOOLEAN* new_rate_ptr);
int      sequenced_child(int i)
                              { return sequence[i]; }
};
class seq_block : public hier_block{
public:
      seq_block();
      ~seq_block();
};
class gsp_block : public seq_block{
public:
      gsp_block();
      ~gsp_block();
      void add_new_asm_section(block* section);
};
// other functions
void value_goof_msg(int eval_status, expr* expr_ptr, char* name,
                              char* msg);
      extern "C" intyylex();
// bref_arr.cxx
// derived class for block_ref array
// Terry Montlick
// 10/10/89
/* source code control: */
static char SccsID[] = "@(#)bref_arr.cxx1.56 10/7/91";
#include "bref_arr.hxx"
bref_array::bref_array()
{}
bref_array::bref_array(int i)
{}
// bref_arr.hxx
// header for derived block_ref array class
// T. Montlick
// 10/10/89
/* source code control: @(#)bref_arr.hxx1.56 10/7/91 */
#define BLOCK_REF_ARRAY_DEF
#ifndef ARRAY_DEF
```

```
#include "array.hxx"
#endif
#ifndef BLOCK_REF_DEF
#include "blck_ref.hxx"
#endif
class bref_array : public array{
public:
    bref_array();
    bref_array(int i);
    block_ref*&operator [] (int i)
                { return (block_ref*&) array::operator[] (i); }
    int         find(block_ref* ptr) { return array::find(ptr); }
    void        append(block_ref* ptr){ array::append(ptr); }
    bref_array&operator+(bref_array& a)
                { return (bref_array&) array::operator+((array&) a); }
    bref_array&operator+=(bref_array& a) {a = *this + a; return *this; }
};
/*************************************************************************
 *
 * Command line functions
 *
 * Terry Montlick 3/20/90
 *
 *************************************************************************/
/* source code control: */
static char SccsID[] = "@(#)cmdline.c1.56 10/7/91";
#include <ctype.h>
#ifdef OWC
extern "C" {
#endif
/*************************************************************************
 *
 * get_filenames
 *
 * Parse a command line into file names, ignoring command switches.
 * Valid for either DOS or unix.
 * Passed "argc" and "argv" from the main program, this function fills
 * in a caller-supplied array to hold file names.
 *
```

```
 * int max_files- max # of file names the user's array will hold.
 * int* n_files_ptr- ptr to # of file names founds
 * char* files      - array of ptrs to file name strings
 *
 ****************************************************************************/
void get_filenames(argc, argv, max_files, n_files_ptr, files)
int         argc;
char* argv[];
int         max_files;
int*  n_files_ptr;
char* files[];{
      int         n_files = 0;
      int         i;
      for (i=1; i<argc; i++){
            /* accept unix-style switch */
            if (*argv[i] == '-')
                  ;
#ifndef UNIX      /* "/" would be confusing with unix directories */
            else if (*argv[i] == '/')
                  ;
#endif
            else
            {
                  /* a non-switch is assumed to be a file name */
                  if (n_files < max_files)
                  {
                        /* first character of file name is 1st */
                        files[n_files] = argv[i];
                        n_files++;
                  }
            }}
      *n_files_ptr = n_files;}
/****************************************************************************
 *
 * find_switch
 *
 * Function used by do_switches to search for a particular switch character
 * in an array.
 *
```

```
*****************************************************************************/
int find_switch(n_switches, switches, sw, which_switch_ptr, no_val_ptr)
int        n_switches;            /* # of switches in search array */
char  switches[];       /* array of switches */
char  sw;                         /* switch to search for */
int*  which_switch_ptr;/* if found a match, matching switch position */
int*  no_val_ptr;       /* set TRUE if switch should not have a value */{
      int            j;
      char      upper_sw;
      int            found;
      char      match_sw;
      int            no_value;
      /* convert switch to upper case for compare */
      if (islower(sw))
            upper_sw = toupper(sw);
      else
            upper_sw = sw;
      found = 0;
      for (j=0; j<n_switches; j++){
            /* get potential matching switch character, converting
             * to upper case if necessary (which signifies that switch
             * does not have an argument immediately following it)
             */
            match_sw = switches[j];
            if (no_value = islower(match_sw))
                  match_sw = toupper(match_sw);
            if (upper_sw == match_sw)
            {
                  found = 1;
                  *which_switch_ptr = j;
                  *no_val_ptr = no_value;
                  break;
            }}
      return found;}
/*****************************************************************************
 *
 * do_switches
 *
 * Parse a command line for switches and execute action routines for them.
```

```
* Valid for either DOS or unix.
* Passed "argc" and "argv" from the main program.
*
* Switches in array must be upper case if the corresponding function can
* take an argument immediately following the switch, and lower case if not.
*
* int* n_switches- # of different switches
* char switches[]- array of single-character switches
* int (*switch_funcs[])() - array of ptrs to action routines
*
* If an unknown switch was encountered, return non-zero and bad switch
* character in "bad_sw".
* If an action routine failed, return its return value and set
* "bad_sw" to 0;
*
*****************************************************************************/
int do_switches(argc, argv, n_switches, switches, switch_funcs, bad_sw)
int         argc;
char* argv[];
int         n_switches;
char  switches[];
#ifdef OWC
int         (*switch_funcs[]) (char*);
#else
int         (*switch_funcs[]) ();
#endif
char* bad_sw;{
      int              i, j, k;
      int              status;
      char        sw;
      char*       sw_val;
      int              no_value;
      *bad_sw = 0;
      for (i=1; i<argc; i++){
            /* accept unix-style switch */
            if( (*argv[i] == '-')
#ifndef UNIX  /* "/" would be confusing with unix directories */
            || (*argv[i] == '/')
#endif
```

```
)
{
    /* switch character is second */
    sw = argv[i][1];
    if (find_switch(n_switches, switches, sw, &j, &no_value))
    {
        /* found the switch, so see if it can take a value */
        if (no_value)
        {
                /* no value for switch, so any remaining characters
                 * must be more switches
                 */
                if (status = (*switch_funcs[j]) (""))
                return (status);
                /* check for remaining non-valued switches following */
                for (k=2; ((sw=argv[i][k]) != '\0'); k++)
                {
                if (find_switch(n_switches, switches, sw, &j,
                 &no_value))
                {
                if (status = (*switch_funcs[j]) (""))
                return (status);
                }
                else
                {
                *bad_sw = sw;
                return -1;
                }
                }
        }
        else
        {
                /* first character of value is 3rd */
                sw_val = argv[i] + 2;
                if (status = (*switch_funcs[j]) (sw_val))
                return (status);
        }
    }
    else
```

```
                {
                        *bad_sw = sw;
                        return -1;
                }
        }}
    return 0;}
#ifdef OWC}
#endif
/*****************************************************************************
 *
 * Command line functions
 *
 * Terry Montlick 3/20/90
 *
 *****************************************************************************/
/* source code control: @(#)cmdline.h1.56 10/7/91 */
void get_filenames(int, char*[], int, int*, char*[]);
typedef int  (*PTIFS[]) (char*);
int do_switches(int, char*[], int, char[], PTIFS, char*);
// defines.cxx
// Routines to handle #define directive
// T. Montlick
// 10/31/89
/* source code control: */
static char SccsID[] = "@(#)defines.cxx1.56 10/7/91";
#ifndef DEFINES_DEF
#include "defines.hxx"
#endif
// hash table for defines
strg_hashdefine_table(SZ);
#ifdef V6
extern "C" {
#endif
#ifdef OWC
extern "C" {
#endif
///////////////////////////////////////////////////////////////////
// enter_define
// Set the given define name and value in the define name table.
```

```
// This is triggered from a "#define" macro.
////////////////////////////////////////////////////////////////////
void enter_define(string* new_name, string* value){
        string*old_val;
        // if name already present, don't override it
        if (!define_table.find(*new_name, &old_val))
                define_table.add(*new_name, value);}
////////////////////////////////////////////////////////////////////
// find_define
// See if the given identifier is a define name, and if so, return
// its value.
// Returns FALSE if no such define name.
////////////////////////////////////////////////////////////////////
BOOLEANfind_define(string* name, char** value){
string*         defined_as;
        if (define_table.find(*name, &defined_as)){
                *value = &(*defined_as)[0];
                return TRUE;}
        else
                return FALSE;}
#ifdef V6}
#endif
#ifdef OWC}
#endif
// defines.hxx
// Routines to handle #define directive
// T. Montlick
// 10/31/89
/* source code control: @(#)defines.hxx1.56 10/7/91 */
#define DEFINES_DEF
#ifndef STRING_DEF
#include "string.hxx"
#endif
#ifndef STRG_HASH_DEF
#include "strghash.hxx"
#endif
#ifdef SZ
#undef SZ
#endif
```

```
#defineSZ        20              /* default array and hash table size */
extern "C" {
extern voidenter_define(string* new_name, string* value);
extern BOOLEANfind_define(string* name, char** value);}
#define ERR_STR_DEF
/* source code control: @(#)err_str.h1.56 10/7/91 */
/* error and warning msg strings */
#defineERR_STRING"ERROR -- "
#defineWARN_STRING"WARNING -- "
#defineERR_DELIM":\n "
// expr.cxx
// expression class functions
// T. Montlick
// 10/2/89
/* source code control: */
static char SccsID[] = "@(#)expr.cxx1.56 10/7/91";
#ifndef EXPR_DEF
#include "expr.hxx"
#endif
#ifdef DEBUG
#undef DEBUG
#endif
///////////////////////////////////////////////////////////////////////
// expr_element::expr_element(double)
// Constructor for an expr_element real value.
///////////////////////////////////////////////////////////////////////
expr_element::expr_element(double d, expr_element* p=0,
                          expr_element* n=0, int rt=ABSOLUTE){
    contents.real_value = d;
    type = REAL_VALUE;
    if (prev = p)
        p->next = this;
    if (next = n)
        n->prev = this;
    reloc_type = rt;
    reloc_level = 0;}
///////////////////////////////////////////////////////////////////////
// expr_element::expr_element(long)
// Constructor for an expr_element integer value.
```

```
////////////////////////////////////////////////////////////////////////////////
expr_element::expr_element(long d, expr_element* p=0,
                                        expr_element* n=0, int rt=ABSOLUTE){
        contents.int_value = d;
        type = INT_VALUE;
        if (prev = p)
                p->next = this;
        if (next = n)
                n->prev = this;
        reloc_type = rt;
        reloc_level = 0;}
////////////////////////////////////////////////////////////////////////////////
// expr_element::expr_element(string*)
// Constructor for an expr_element string.
////////////////////////////////////////////////////////////////////////////////
expr_element::expr_element(string* s, expr_element* p=0,
                                        expr_element* n=0){
        contents.symbol = s;
        type = SYMBOL_VALUE;
        if (prev = p)
                p->next = this;
        if (next = n)
                n->prev = this;
        reloc_type = ABSOLUTE;
        reloc_level = 0;}
////////////////////////////////////////////////////////////////////////////////
// expr_element::expr_element(char)
// Constructor for an expr_element character operator.
////////////////////////////////////////////////////////////////////////////////
expr_element::expr_element(char c, expr_element* p=0,
                                        expr_element* n=0){
        contents.oper = c;
        type = OPER;
        if (prev = p)
                p->next = this;
        if (next = n)
                n->prev = this;
        reloc_type = ABSOLUTE;
        reloc_level = 0;}
```

```
////////////////////////////////////////////////////////////////////////
// expr_element::expr_element()
// Constructor for an expr_element with no contents.
////////////////////////////////////////////////////////////////////////
expr_element::expr_element(){
        contents.oper = 0;
        type = OPER;
        prev = next = 0;
        reloc_type = ABSOLUTE;
        reloc_level = 0;}
////////////////////////////////////////////////////////////////////////
// expr_element::expr_element(expr_element)
// Constructor for an expr_element called with an expr_element.
////////////////////////////////////////////////////////////////////////
expr_element::expr_element(expr_element& e, expr_element* p=0,
                                        expr_element* n=0){
        // copy contents except for pointers
        type = e.type;
        switch (type){
        case SYMBOL_VALUE:
                contents.symbol = e.contents.symbol;
                break;
        case INT_VALUE:
        case EVAL_ERROR:
                contents.int_value = e.contents.int_value;
                break;
        case REAL_VALUE:
                contents.real_value = e.contents.real_value;
                break;
        case OPER:
                contents.oper = e.contents.oper;
                break;}
        if (prev = p)
                p->next = this;
        if (next = n)
                n->prev = this;
        reloc_type = e.reloc_type;
        reloc_level = e.reloc_level;}
////////////////////////////////////////////////////////////////////////
```

```
// expr_element::~expr_element()
// Destructor.
// Delete this element plus all succeeding elements.
/////////////////////////////////////////////////////////////////////
expr_element::~expr_element(){
	if (prev)
		prev->next = next;
	if (next)
		next->prev = prev;}
/////////////////////////////////////////////////////////////////////
// expr_element::operator=()
// Assignment operator from another expression element.
// Creates a copy of this element.
/////////////////////////////////////////////////////////////////////
void expr_element::operator=(expr_element& e){
	if (this == &e)
		return;			// don't assign to self
	type = e.type;
	switch (e.type){
	case SYMBOL_VALUE:
		contents.symbol = e.contents.symbol;
		break;
	case INT_VALUE:
	case EVAL_ERROR:
		contents.int_value = e.contents.int_value;
		break;
	case REAL_VALUE:
		contents.real_value = e.contents.real_value;
		break;
	case OPER:
		contents.oper = e.contents.oper;
		break;}
	reloc_type = e.reloc_type;
	reloc_level = e.reloc_level;}
/////////////////////////////////////////////////////////////////////
// expr_element::real_value()
// Return real value of expression element.
/////////////////////////////////////////////////////////////////////
doubleexpr_element::real_value(){
```

```
    if (type == REAL_VALUE)
        return contents.real_value;
    else if (type == INT_VALUE)
        return (double) contents.int_value;
    else
        cerr << "error: trying to take real value of non-valued expression element\n";
    return 0.0;}
//////////////////////////////////////////////////////////////////////
// expr_element::int_value()
// Return integer value of expression element.
//////////////////////////////////////////////////////////////////////
long expr_element::int_value(){
    if (type == INT_VALUE)
        return contents.int_value;
    else if (type == REAL_VALUE)
        return (round(contents.int_value));
    else
        cerr << "error: trying to take int value of non-valued expression element\n";
    return 0;}
//////////////////////////////////////////////////////////////////////
// expr_element::symbol()
// Return symbol value of expression element.
//////////////////////////////////////////////////////////////////////
string*expr_element::symbol(){
    if (type == SYMBOL_VALUE)
        return contents.symbol;
    else
        cerr << "error: trying get symbol from non-symbol element \n";
    return 0;}
//////////////////////////////////////////////////////////////////////
// expr_element::error_code()
// Return error code for EVAL_ERROR expression element.
//////////////////////////////////////////////////////////////////////
int   expr_element::error_code(){
    if (type == EVAL_ERROR)
        return (int) contents.int_value;
    else
        cerr << " error: trying to get error code from non-error expr. element\n";
    return 0;}
```

```
////////////////////////////////////////////////////////////////////////
// expr_element::append()
// Append an expr_element to this one.
////////////////////////////////////////////////////////////////////////
void  expr_element::append(expr_element* his){
      next = his;
      his->prev = this; // link in backward pointer}
////////////////////////////////////////////////////////////////////////
// get_operator_string
// Get a string version of the operator argument.
////////////////////////////////////////////////////////////////////////
void get_operator_string(char c, string& op){
      switch(c){
      case 'L':
            op = "log";
            break;
      case 'E':
            op = "exp";
            break;
      case 'Q':
            op = "is equal to";
            break;
      case 'N':
            op = "is not equal to";
            break;
      case '<':
            op = "is less than";
            break;
      case '>':
            op = "is greater than";
            break;
      case 'l':
            op = "is less than or equal to";
            break;
      case 'g':
            op = "is greater than or equal to";
            break;
      case 'r':
            op = ">>";
```

```
            break;
      case 's':
            op = "<<";
            break;
      case 'M':
            op = "-";
            break;
      case 'I':
            op = "int";
            break;
      case 'F':
            op = "fix";
            break;
      case 'a':
            op = "and";
            break;
      case 'o':
            op = "or";
            break;
      case 'n':
            op = "not";
            break;
      default:
            op = chr(c);
      }}
///////////////////////////////////////////////////////////////////////////
// output stream operator for expr_element list
// Called originally for the last element of the (postfix) list,
// this operator will recursively call itself for an operator's arguments
// so that infix output is generated.
// NOTE: the expression element pointer argument is changed to point to
// the element before the result of this output.
///////////////////////////////////////////////////////////////////////////
ostream& operator << (ostream& s, expr_element*& e){
      string          op("");
      expr_element*us;
#defineMAX_CHRS100
      // if there is no previous element, this is the listhead, so just exit.
      if (!e->prev)
```

```
        return s;

// save pointer this element, and set argument to point at previous
// which is correct for a non-operator.
us = e;
e = e->prev;

switch(us->type){
case SYMBOL_VALUE:
        s << *(us->contents.symbol);
        break;
case INT_VALUE:
        s << us->contents.int_value;
        break;
case EVAL_ERROR:
        s << "error:" << us->contents.int_value;
        break;
case REAL_VALUE:
        s << us->contents.real_value;
        // make sure to add a ".0" if necessary to signal a real
        int int_part = (int) us->contents.real_value;
        if ((us->contents.real_value - int_part) == 0.0)
                s << ".0";
        break;
case OPER:
        get_operator_string(us->contents.oper, op);
        // check for unary or binary operator
        if (unary_operator(us->contents.oper))
        {
                // output this operator, followed by our argument
                s << op << " " << e;
        }
        else
        {
                // binary operator, so must get and save 2nd argument
                // create an output stream to hold this argument
                char  arg_2_text[MAX_CHRS];
                ostream arg_2(MAX_CHRS, arg_2_text);
                // initialize text array with nulls, so string gets terminated
```

```
            for (int i=0; i<MAX_CHRS; i++)
                  arg_2_text[i] = '\0';

            // call previous element to get its value
            arg_2 << e;
            // e now points to 1st argument, so we can output all
            s << e << " " << op << " " << arg_2_text;
      }
      break;}
  return s;}
////////////////////////////////////////////////////////////////////////
// negate_operator
// Turn this operator into its negation, if possible. Returns TRUE if
// we must negate arguments to this operator.
// Some operators get a "NOT" inserted after them by this function.
////////////////////////////////////////////////////////////////////////
BOOLEAN expr_element::negate_operator(){
      expr_element*e;
      BOOLEAN       negate_args = TRUE;

      if (type == OPER){
            switch(contents.oper)
            {
            case 'Q':
                  contents.oper = 'N';// == becomes !=
                  negate_args = FALSE;
                  break;
            case 'N':
                  contents.oper = 'Q';// != becomes ==
                  negate_args = FALSE;
                  break;
            case '<':
                  contents.oper = 'g';// < becomes >=
                  negate_args = FALSE;
                  break;
            case '>':
                  contents.oper = 'l';// > becomes <=
                  negate_args = FALSE;
                  break;
```

```
case 'l':
    contents.oper = '>';// <= becomes >
    negate_args = FALSE;
    break;
case 'g':
    contents.oper = '<';// >= becomes <
    negate_args = FALSE;
    break;
case 'a':
    contents.oper = 'o';// and becomes or
    break;
case 'o':
    contents.oper = 'a';// or becomes and
    break;
case 'n':
    // "not" does not negate args, and gets detected and deleted by caller
    negate_args = FALSE;
    break;
default:
    // default is to modify this operator with a "NOT" operator
    e = new expr_element('n', this, this->next);

    // negate has been performed, so args don't get changed
    negate_args = FALSE;
}}
return negate_args;}
//////////////////////////////////////////////////////////////////////
// negate()
// Called originally for the last element of the (postfix) list,
// this function will recursively call itself to negate this list,
// modifying it with a list which is the negation of the original.
// It negates only if the argument is TRUE.
// Returns a pointer to the element remaining right before the negation,
// whether on not negation was called for.
// That is, if we are negating an argument, we return a pointer to the
// element right before the argument.
//////////////////////////////////////////////////////////////////////
expr_element* expr_element::negate(BOOLEAN negate_it){
    expr_element*previous;
```

```
expr_element*c;
BOOLEAN         negate_args;
char            op;
BOOLEAN         delete_this_element = FALSE;
// if there is no previous element, this is the listhead, so just exit.
if (!prev)
      return this;
// save previous element, because this
previous = prev;
// for an atomic type, simply insert a "NOT" after it
switch(type){
case SYMBOL_VALUE:
case INT_VALUE:
case EVAL_ERROR:
case REAL_VALUE:
      if (negate_it)
            c = new expr_element('n', this, this->next);
      break;
case OPER:
      // try to negate operator.
      if (negate_it)
      {
            // if this operator is "NOT", set flag to delete in before exit
            if (contents.oper == 'n')
                  delete_this_element = TRUE;
            negate_args = negate_operator();
      }
      else
            negate_args = FALSE;
      op = contents.oper;
      // negate previous argument, if required
      previous = previous->negate(negate_args);
      // if binary operator, there is a second argument to process
      if (!unary_operator(op))
            previous = previous->negate(negate_args);
      break;}
// if this was "not" operator, need to delete this element
if (delete_this_element)
      delete this;
```

```
	// return the next most previous element
	return previous;}
////////////////////////////////////////////////////////////////////////
// expr_element::last()
// Return the last element of a list.
////////////////////////////////////////////////////////////////////////
expr_element* expr_element::last(){
	expr_element*p;
	p = this;
	while (p->next)
		p = p->next;
	return p;}
////////////////////////////////////////////////////////////////////////
// expr::expr(long)
// Constructor for an expression consisting of a single integer value.
////////////////////////////////////////////////////////////////////////
expr::expr(long d, int r){
	expr_element*elem;
	elem = new expr_element(d, &listhead, 0, r);
	reloc_level = 0;}
////////////////////////////////////////////////////////////////////////
// expr::expr(double)
// Constructor for an expression consisting of a single real value.
////////////////////////////////////////////////////////////////////////
expr::expr(double d, int r){
	expr_element*elem;
	elem = new expr_element(d, &listhead, 0, r);
	reloc_level = 0;}
////////////////////////////////////////////////////////////////////////
// expr::expr(string*)
// Constructor for an expression consisting of a single symbol string.
////////////////////////////////////////////////////////////////////////
expr::expr(string* s){
	expr_element*elem;
	elem = new expr_element(s, &listhead);
	reloc_level = 0;}
////////////////////////////////////////////////////////////////////////
// expr::expr(char)
// Constructor for an expression consisting of a single character operator.
```

```
////////////////////////////////////////////////////////////////////
expr::expr(char c){
	expr_element*elem;
	elem = new expr_element( (char) c, &listhead);
	reloc_level = 0;}
////////////////////////////////////////////////////////////////////
// expr::expr(expr)
// Constructor for an expr called with an expr.
// Copies the entire expression.
////////////////////////////////////////////////////////////////////
expr::expr(expr& e){
	expr_element*src_ptr;
	expr_element*dest_ptr;
	expr_element*prev_dest_ptr;
	src_ptr = &e.listhead;
	dest_ptr = &this->listhead;
	prev_dest_ptr = (expr_element*) NULL;
	while (src_ptr){
		if (!dest_ptr)
			dest_ptr = new expr_element(*src_ptr, prev_dest_ptr);
		else
			*dest_ptr = *src_ptr;
		// advance to next element
		prev_dest_ptr = dest_ptr;
		dest_ptr = dest_ptr->next;
		src_ptr = src_ptr->next;}
	// DOS-16M version crashes on this copy if called with null expression,
	// so check first
	if (&e)
		reloc_level = e.reloc_level;
	else
		reloc_level = 0;}
////////////////////////////////////////////////////////////////////
// expr::expr(expr_element)
// Constructor for an expr called with an expr_element.
////////////////////////////////////////////////////////////////////
expr::expr(expr_element& e){
	expr_element*dest_ptr;
	dest_ptr = new expr_element(e, &this->listhead);
```

```
    reloc_level = 0;}
////////////////////////////////////////////////////////////////////////
// expr::expr()
// Constructor for an expression with nothing in it.
////////////////////////////////////////////////////////////////////////
expr::expr(){
    expr_element*elem;
    elem = new expr_element( (char) 0, &listhead);
    reloc_level = 0;}
////////////////////////////////////////////////////////////////////////
// expr::~expr()
// Destructor.
////////////////////////////////////////////////////////////////////////
expr::~expr(){
    // iteratively delete the first element of the expression
    while (listhead.next)
        delete listhead.next;}
////////////////////////////////////////////////////////////////////////
// expr::operator=()
// Assignment operator from another expression.
// Creates a copy of this expression.
////////////////////////////////////////////////////////////////////////
void expr::operator=(expr& e){
    expr_element*src_ptr;
    expr_element*dest_ptr;
    expr_element*prev_dest_ptr;
    if (this == &e)
        return;                    // don't assign to self
    src_ptr = &e.listhead;
    dest_ptr = &this->listhead;
    prev_dest_ptr = (expr_element*) NULL;
    while (src_ptr){
        if (!dest_ptr)
            dest_ptr = new expr_element(*src_ptr, prev_dest_ptr);
        else
            *dest_ptr = *src_ptr;
        // advance to next element
        prev_dest_ptr = dest_ptr;
        dest_ptr = dest_ptr->next;
```

```
        src_ptr = src_ptr->next;
    }}
//////////////////////////////////////////////////////////////////////
// expr::concat(expr*)
// Concatenate an expression to the end of this one.
//////////////////////////////////////////////////////////////////////
void expr::concat(expr* e){
    expr_element*our_last;
    expr_element*his_first;
    // find the last element of our expression, and point to it
    our_last = listhead.next;
    while (our_last->next)
        our_last = our_last->next;
    his_first = e->listhead.next;
    // put his list following this one
    our_last->append(his_first);
    // delete him, but null him out first!
    e->listhead.next = (expr_element*) NULL;
    delete e;}
//////////////////////////////////////////////////////////////////////
// op_requires_integers()
// Returns TRUE if operator requires integers.
//////////////////////////////////////////////////////////////////////
BOOLEAN op_requires_integers(char op){
    switch(op){
    case '&':
    case '|':
    case '^':
    case 'r':
    case 's':
        return TRUE;
    default:
        return FALSE;
    }}
//////////////////////////////////////////////////////////////////////
// expr::eval_integers_op()
// Evaluate the binary operator which is in the expression element pointed to.
// This operator requires two integers.
// The arguments are in the previous expression elements, and all
```

```
// are replaced by the result.
/////////////////////////////////////////////////////////////////////
void expr::eval_integers_op(expr_element* e){
	long  int_arg1, int_arg2;	// integer arguments
	int		arg1_reloc, arg2_reloc;// relocation types for arguments
	int		arg1_level, arg2_level;
	if (e->prev->type == INT_VALUE){
		int_arg2 = e->prev->int_value();
		e->type = INT_VALUE;}
	else if (e->prev->type == EVAL_ERROR)
		*e = *e->prev;
	else{
		e->type = EVAL_ERROR;
		e->contents.int_value = INT_REQUIRED;}
	arg2_reloc = e->prev->what_reloc_type();
	arg2_level = e->prev->what_reloc_level();
	delete e->prev;

	// check 1st argument only if 2nd is ok
	if (e->type != EVAL_ERROR){
		if (e->prev->type == INT_VALUE)
		{
			int_arg1 = e->prev->int_value();
			e->type = INT_VALUE;
		}
		else if (e->prev->type == EVAL_ERROR)
			*e = *e->prev;
		else
		{
			e->type = EVAL_ERROR;
			e->contents.int_value = INT_REQUIRED;
		}
		arg1_reloc = e->prev->what_reloc_type();
		arg1_level = e->prev->what_reloc_level();
		delete e->prev;
	}
	if (e->type != EVAL_ERROR){
		switch(e->contents.oper)
		{
```

```
        case '&':
            e->contents.int_value = int_arg1 & int_arg2;
            break;
        case '|':
            e->contents.int_value = int_arg1 | int_arg2;
            break;
        case '^':
            e->contents.int_value = int_arg1 ^ int_arg2;
            break;
        case 'r':
            e->contents.int_value = int_arg1 >> int_arg2;
            break;
        case 's':
            e->contents.int_value = int_arg1 << int_arg2;
            break;
        }
        // take whichever reloc type is nonzero
        if (arg1_reloc != ABSOLUTE)
        {
            e->reloc_type = arg1_reloc;
            e->reloc_level = arg1_level;
        }
        else
        {
            e->reloc_type = arg2_reloc;
            e->reloc_level = arg2_level;
        }
    }}
////////////////////////////////////////////////////////////////////////////
// expr::eval_reals_op()
// Evaluate the binary operator which is in the expression element pointed to.
// This operator uses two reals, integers being converted to reals.
// The arguments are in the previous expression elements, and all
// are replaced by the result.
////////////////////////////////////////////////////////////////////////////
void expr::eval_reals_op(expr_element* e){
    doublearg1, arg2;               // binary arguments
    int         arg1_reloc, arg2_reloc;// relocation types for arguments
    int         arg1_level, arg2_level;// relocation levels for arguments
```

```
if (e->prev->type == REAL_VALUE){
      arg2 = e->prev->real_value();
      e->type = REAL_VALUE;}
else if (e->prev->type == INT_VALUE){
      arg2 = e->prev->real_value();
      e->type = INT_VALUE;}
else if (e->prev->type == EVAL_ERROR)
      *e = *e->prev;
else{
      e->type = EVAL_ERROR;
      e->contents.int_value = NUM_VALUE_NOT_KNOWN;}
arg2_reloc = e->prev->what_reloc_type();
arg2_level = e->prev->what_reloc_level();
delete e->prev;
// check 1st argument only if 2nd is ok
if (e->type != EVAL_ERROR){
      if (e->prev->type == REAL_VALUE)
      {
            arg1 = e->prev->real_value();
            e->type = REAL_VALUE;
      }
      else if (e->prev->type == INT_VALUE)
            arg1 = e->prev->real_value();
      else if (e->prev->type == EVAL_ERROR)
            *e = *e->prev;
      else
      {
            e->type = EVAL_ERROR;
            e->contents.int_value = NUM_VALUE_NOT_KNOWN;
      }
      arg1_reloc = e->prev->what_reloc_type();
      arg1_level = e->prev->what_reloc_level();
      delete e->prev;}
if (e->type != EVAL_ERROR){
      // assume relocation type of first argument
      e->reloc_type = arg1_reloc;
      e->reloc_level = arg1_level;
      switch(e->contents.oper)
      {
```

```
case '+':
    e->contents.real_value = arg1 + arg2;
    // take whichever reloc type is nonzero
    if (arg1_reloc == ABSOLUTE)
    {
        e->reloc_type = arg2_reloc;
        e->reloc_level = arg2_level;
    }
    break;
case '-':
    e->contents.real_value = arg1 - arg2;
    // subtracting same reloc type yields ABSOLUTE (0)
    if (arg1_reloc == arg2_reloc)
        e->reloc_type = ABSOLUTE;
    break;
case '*':
    e->contents.real_value = arg1 * arg2;
    break;
case '/':
    e->contents.real_value = divide(arg1, arg2);
    break;
case 'L':
    e->contents.real_value = logn(arg1, arg2);
    break;
case 'E':
    e->contents.real_value = expn(arg1, arg2);
    break;
case 'Q':
    e->contents.real_value = (double) (arg1 == arg2);
    e->type = INT_VALUE;
    break;
case 'N':
    e->contents.real_value = (double) (arg1 != arg2);
    e->type = INT_VALUE;
    break;
case 'l':
    e->contents.real_value = (double) (arg1 <= arg2);
    e->type = INT_VALUE;
    break;
```

```
        case 'g':
            e->contents.real_value = (double) (arg1 >= arg2);
            e->type = INT_VALUE;
            break;
        case '<':
            e->contents.real_value = (double) (arg1 < arg2);
            e->type = INT_VALUE;
            break;
        case '>':
            e->contents.real_value = (double) (arg1 > arg2);
            e->type = INT_VALUE;
            break;
        case 'a':
            e->contents.real_value = (double) (round(arg1) && round(arg2));
            e->type = INT_VALUE;
            break;
        case 'o':
            e->contents.real_value = (double) (round(arg1) || round(arg2));
            e->type = INT_VALUE;
            break;
        }
        // see if contents should be changed to an integer
        if (e->type == INT_VALUE)
            e->contents.int_value = round(e->contents.real_value);
    }}
////////////////////////////////////////////////////////////////////////
// op_can_take_strings()
// Returns TRUE if operator can take two strings (comparison operator).
////////////////////////////////////////////////////////////////////////
BOOLEAN op_can_take_strings(char op){
    if ( op == 'Q' ||
     op == 'N' )
        return TRUE;
    else
        return FALSE;}
////////////////////////////////////////////////////////////////////////
// expr::eval_strings_op()
// Evaluate the binary operator which is in the expression element pointed to.
// This operator can take two strings. If both are present, then evaluate it.
```

```
// If only one argument is a string, its an error.
// If neither argument is a string, leave arguments and operator alone.
////////////////////////////////////////////////////////////////////
void expr::eval_strings_op(expr_element* e){
    string*s1;
    string* s2;

    if ( (e->prev->type == SYMBOL_VALUE) ||
         (e->prev->prev->type == SYMBOL_VALUE) ){
        if (e->prev->type == e->prev->prev->type)
        {
            // get ptrs to strings
            s1 = e->prev->contents.symbol;
            s2 = e->prev->prev->contents.symbol;
            if (e->contents.oper == 'Q')
                // test if strings are equal
                e->contents.int_value = (long) (*s1 == *s2);
            else
            // test if strings are unequal
            e->contents.int_value = (long) (*s1 != *s2);

            // comparison yields an integer
            e->type = INT_VALUE;
            e->reloc_type = ABSOLUTE;

            // delete both arguments
            delete e->prev;
            delete e->prev;
        }
        else
        {
            // comparison operator with just one string!
            e->type = EVAL_ERROR;
            e->contents.int_value = NOT_BOTH_NUMBERS_OR_STRINGS;
            delete e->prev;
            delete e->prev;
        }
    }}
////////////////////////////////////////////////////////////////////
```

```
// unary_operator()
// Returns TRUE if operator is unary.
/////////////////////////////////////////////////////////////////////
BOOLEAN unary_operator(char op){
	switch(op){
	case 'M':
	case 'I':
	case 'F':
	case '~':
	case 'n':
		return TRUE;
	default:
		return FALSE;
	}}
/////////////////////////////////////////////////////////////////////
// expr::eval_unary_op()
// Evaluate the unary operator which is in the expression element pointed to.
// The argument is in the previous expression element, and both elements
// are replaced by the result.
/////////////////////////////////////////////////////////////////////
void expr::eval_unary_op(expr_element* e){
	char  op;
	// get operator
	op = e->contents.oper;
	// replace this element with its operand
	*e = *e->prev;
	switch (op){
	case 'M':
		// unary minus, so replace operator with negative value
		if (e->type == INT_VALUE)
			e->contents.int_value = - e->contents.int_value;
		else if (e->type == REAL_VALUE)
			e->contents.real_value = - e->contents.real_value;
		else if (e->type != EVAL_ERROR)
		{
			e->type = EVAL_ERROR;
			e->contents.int_value = NUM_VALUE_NOT_KNOWN;
		}
		break;
```

```
case 'I':
    // integer conversion operator
    if (e->type == REAL_VALUE)
    {
        e->contents.int_value = round(e->contents.real_value);
        e->type = INT_VALUE;
        e->reloc_type = ABSOLUTE;
    }
    else if (e->type == INT_VALUE)
        ;
    else if (e->type != EVAL_ERROR)
    {
        e->type = EVAL_ERROR;
        e->contents.int_value = NUM_VALUE_NOT_KNOWN;
    }
    break;
case 'F':
    // fixed point conversion operator
    if (e->type == INT_VALUE)
    {
        e->contents.real_value = e->real_value();
        e->type = REAL_VALUE;
        e->reloc_type = ABSOLUTE;
    }
    else if (e->type == REAL_VALUE)
        ;
    else if (e->type != EVAL_ERROR)
    {
        e->type = EVAL_ERROR;
        e->contents.int_value = NUM_VALUE_NOT_KNOWN;
    }
    break;
case '~':
    // bitwise negate operator
    if (e->type == INT_VALUE)
        e->contents.int_value = ~(e->contents.int_value);
    else if (!EVAL_ERROR)
    {
        e->type = EVAL_ERROR;
```

```
            e->contents.int_value = INT_REQUIRED;
        }
        break;
    case 'n':
        // logical negate operator
        if (e->type == INT_VALUE)
            e->contents.int_value = !(e->contents.int_value);
        else if (e->type == REAL_VALUE)
        {
            e->contents.int_value = !(round(e->contents.real_value));
            e->type = INT_VALUE;
        }
        else if (!EVAL_ERROR)
        {
            e->type = EVAL_ERROR;
            e->contents.int_value = NUM_VALUE_NOT_KNOWN;
        }
        break;}
    // delete the operand
    delete e->prev;}
////////////////////////////////////////////////////////////////////
// expr::eval()
// Evaluate the expression and return the value as an expr_element.
// The value is of the type appropriate for the result of the expression.
// Returns FALSE if error evaluating expression. In this case, the value
// is of type EVAL_ERROR and an error code is in contents.int_value.
////////////////////////////////////////////////////////////////////
BOOLEAN expr::eval(expr_element* e){
    expr_element*elem;
    expr_element*last_elem;
    expr*           symbol_expr;
    int                     trans_reloc_level;
    #ifdef DEBUG
        cerr << "evaluating: " << *this << "\n";
    #endif
    // order is Reverse Polish, so scan for an operator
    // translate any symbols encountered along the way to values
    // operate on a copy of our expression, so evaluation is non-destructive!
    expr copy = *this;
```

```
elem = copy.listhead.next;
// if nothing to evaluate, return "value not known"
if (!elem){
    elem = e;// don't create a new element, but just use caller's!
    elem->type = EVAL_ERROR;
    elem->contents.int_value = NUM_VALUE_NOT_KNOWN;}
while (elem){
    if (elem->type == SYMBOL_VALUE)
    {
        // symbol is an expr, which must be evaluated
        symbol_expr = translation(elem->contents.symbol);
        if (symbol_expr)
        {
            string*     sym_name;
            BOOLEANrecurse = TRUE;
            // symbol has a value, so evaluate it, and set in elem
            // but first make sure it doesn't evaluate to itself
            if (symbol_expr->eval_to_symbol(&sym_name))
            {
                    if (*sym_name == *elem->contents.symbol)
                    recurse = FALSE;
            }
            // first save relocation level from translation
            trans_reloc_level = symbol_expr->what_reloc_level();
            // recursively evaluate new translated symbol value
            if (recurse)
                    symbol_expr->eval(elem);
            // if relocation level from translation, set it in element
            if (trans_reloc_level)
                    elem->set_reloc_level(trans_reloc_level);
        }
    }
    else if (elem->type == OPER)
    {
        // first check for unary operators
        if (unary_operator(elem->contents.oper))
            eval_unary_op(elem);
        else
        {
```

```
                        // binary operator
                        // first check if operator is "==" or "!=", which
                        // can take strings (unvalued symbols)
                        if (op_can_take_strings(elem->contents.oper))
                                eval_strings_op(elem);
                        // check if operator requires integer
                        else if (op_requires_integers(elem->contents.oper))
                                eval_integers_op(elem);
                        // continue, if we haven't already processed the operator
                        if (elem->type == OPER)
                                // operator must be for real operands
                                eval_reals_op(elem);
                }
        }
        last_elem = elem;
        elem = elem->next;}
    // after all operations, value is in last_elem
    *e = *last_elem;
    return (last_elem->type != EVAL_ERROR);}
////////////////////////////////////////////////////////////////////////
// expr::eval_to_symbol()
// Try to evaluate the expression to a symbol, and return the string
// for that symbol. If the evaluation doesn't yield a symbol, return FALSE.
////////////////////////////////////////////////////////////////////////
BOOLEAN expr::eval_to_symbol(string** s){
    expr_element*elem;
    expr_elementtest_elem;
    expr_element*last_elem;
    #ifdef DEBUG
        cerr << "evaluating: " << *this << "\n";
    #endif
    // order is Reverse Polish, so scan for an operator
    // translate any symbols encountered along the way to values
    // operate on a copy of our expression, so evaluation is non-destructive!
    expr copy = *this;
    elem = copy.listhead.next;
    // if nothing to evaluate, return "value not known"
    if (!elem){
        elem = new expr_element((long) 0);
```

```
        elem->type = EVAL_ERROR;
        elem->contents.int_value = NUM_VALUE_NOT_KNOWN;}
    while (elem){
        if (elem->type == OPER)
        {
            // first check for unary operators
            if (unary_operator(elem->contents.oper))
                eval_unary_op(elem);
            else
            {
                // binary operator
                // first check if operator is "==" or "!=", which
                // can take strings (unvalued symbols)
                if (op_can_take_strings(elem->contents.oper))
                        eval_strings_op(elem);
                // check if operator requires integer
                else if (op_requires_integers(elem->contents.oper))
                        eval_integers_op(elem);
                // continue, if we haven't already processed the operator
                if (elem->type == OPER)
                        // operator must be for real operands
                        eval_reals_op(elem);
            }
        }
        last_elem = elem;
        elem = elem->next;}
    // after all operations, value is in last_elem
    if (last_elem->type == SYMBOL_VALUE){
        // return symbol string to user
        *s = last_elem->symbol();
        return TRUE;}
    else
        return FALSE;}
////////////////////////////////////////////////////////////////
// expr::real_value()
// Evaluate the expression and return a real value.
// The expression may consist of any combination of operators, reals, ints,
// and symbols which are evaluated to reals.
// Also evaluates the relocation level of the expression.
```

```
/////////////////////////////////////////////////////////////////////
double expr::real_value(int* reloc_type, int* reloc_level){
        expr_elementelem;
        doublefinal_value;
        // evaluate this expression
        eval(&elem);
        // it may be an integer, however, so convert to real in this case
        if (elem.type == INT_VALUE)
                final_value = (double) elem.contents.int_value;
        else if (elem.type == REAL_VALUE)
                final_value = elem.contents.real_value;
        else
                // evaluated to symbol or some evaluation error, so return value of 0
                final_value = 0.0;
        // return computed relocation type and level
        *reloc_type = elem.reloc_type;
        *reloc_level = elem.reloc_level;
        return final_value;}
/////////////////////////////////////////////////////////////////////
// expr::int_value()
// Evaluate the expression and return an integer value.
// The expression may consist of any combination of operators, ints,
// and symbols which are evaluated to ints.
/////////////////////////////////////////////////////////////////////
long expr::int_value(int* reloc_type, int* reloc_level){
        // simply evaluate as real and convert to integer
        return round(real_value(reloc_type, reloc_level));}
/////////////////////////////////////////////////////////////////////
// expr::what_reloc_type()
// Evaluate the expression and returns its relocation type.
/////////////////////////////////////////////////////////////////////
int expr::what_reloc_type(){
        doubleval;
        int             reloc_type, r_level;
        // simply evaluate as real
        val = real_value(&reloc_type, &r_level);
        return reloc_type;}
/////////////////////////////////////////////////////////////////////
// expr::what_reloc_level()
```

```
// Evaluate the expression and returns its relocation level.
// If non-zero level is set as override level, then use this instead.
//////////////////////////////////////////////////////////////////////
int expr::what_reloc_level(){
//      doubleval;
//      int         reloc_type, r_level;
        if (reloc_level)
                return reloc_level;
        else{
//              // simply evaluate as real
//              val = real_value(&reloc_type, &r_level);
//              return r_level;
                // don't do above, because can result in infinite call loop!
                return 0;
        }}
//////////////////////////////////////////////////////////////////////
// expr::unknown_symbol()
// Returns a point to the first symbol in the expression whose value
// is not known.
// If no unknown values, then it returns NULL.
//////////////////////////////////////////////////////////////////////
string* expr::unknown_symbol(){
        expr_element*elem;
        elem = listhead.next;
        while (elem){
                if (elem->type == SYMBOL_VALUE)
                {
                        if (!translation_known(elem->contents.symbol))
                                return elem->contents.symbol;
                        else
                        {
                                // translation from symbol found, but is it just another symbol?
                                return (
                                translation(elem->contents.symbol)->unknown_symbol());
                        }
                }
                elem = elem->next;}
        return NULL;}
//////////////////////////////////////////////////////////////////////
```

```
// output stream operator for expr
/////////////////////////////////////////////////////////////////////
ostream& operator << (ostream& s, expr& e){
      expr_element*last_elem;
      // go to the last element, and call output stream operator for this.
      last_elem = e.listhead.last();
      return s << last_elem;}
/////////////////////////////////////////////////////////////////////
// expr::has_int_value
// Tests if expression can result in a valid integer.
/////////////////////////////////////////////////////////////////////
BOOLEANexpr::has_int_value(){
      expr_elementelem;
      // evaluate this expression
      eval(&elem);
      if (elem.type == INT_VALUE || elem.type == REAL_VALUE)
            return TRUE;
      else
            return FALSE;}
/////////////////////////////////////////////////////////////////////
// expr::is_real_valued
// Tests if expression results in a real value.
/////////////////////////////////////////////////////////////////////
BOOLEANexpr::is_real_valued(){
      expr_elementelem;
      // evaluate this expression
      eval(&elem);
      return (elem.type == REAL_VALUE);}
/////////////////////////////////////////////////////////////////////
// expr::is_int_valued
// Tests if expression results in an int value.
/////////////////////////////////////////////////////////////////////
BOOLEANexpr::is_int_valued(){
      expr_elementelem;
      // evaluate this expression
      eval(&elem);
      return (elem.type == INT_VALUE);}
/////////////////////////////////////////////////////////////////////
// negate()
```

```
// Creates and returns a new expression list which is the logical
// negation of this list.
////////////////////////////////////////////////////////////////
expr* expr::negate(){
      expr_element*last_elem;
      expr_element*first_elem;
      expr*             new_list;
      // make a copy of this list
      new_list = new expr(*this);

      // go to the last element, and call negate for this.
      last_elem = new_list->listhead.last();
      first_elem = last_elem->negate(TRUE);

      // we don't need first_elem, because we still have the pointer to the start
      return new_list;}
// expr.hxx
// header for expression class
// T. Montlick
// 10/2/89
/* source code control: @(#)expr.hxx1.56 10/7/91 */
#define EXPR_DEF
#ifndef STANDARD_DEF
#include "standard.hxx"
#endif
#ifndef STRING_DEF
#include "string.hxx"
#endif
extern "C" {
#ifndef UTILITY_DEF
#include "utility.h"
#endif
#ifndef INTRFACE_DEF
#include "intrface.h"
#endif}
/*
Define the expr class, which embodies a numeric expression.
This expression can be simply a single number, or any combination of
numbers, symbols, and operators. Expressions are given in Reverse Polish
```

```
order.
*/
// types of expression element contents:
enum contents_type { INT_VALUE, REAL_VALUE, SYMBOL_VALUE, OPER, EVAL_ERROR
};
// if contents is EVAL_ERROR type, error codes contained as int_valued:
enum { VALUE_OK, NUM_VALUE_NOT_KNOWN, REAL_OUT_OF_RANGE, OVERFLOW,
NULL_EXPR,
      NOT_BOTH_NUMBERS_OR_STRINGS, COULD_NOT_EVAL, OPERAND_OVER-
FLOW,
      INT_REQUIRED, INIT_FILE_SYNTAX_ERR, ADDRESSES_CODE_SPACE};
/*
The expr_element class forms the building blocks of an expr. The
expr class is a friend class and manipulates it directly, however it
is made a class rather than a struct so that it can have a few
convenient functions, such as output stream operator and
destructor for deleting an expr element.
*/
class expr_element{
      friend class expr;
      union
      {           // contents of expression element, which may be one of:
            double      real_value;
            long        int_value;
            string*     symbol;
            char        oper;
      } contents;
      contents_typetype;// identifies type of above element
      int                   reloc_type;// non-zero for relocatable storage loc
      int                   reloc_level;// rel. level of block defined in
      expr_element*next;// pointer to next element in expression
      expr_element*prev;// pointer to prev element in expression
public:
      expr_element(long, expr_element* p, expr_element* n, int r);
      expr_element(double, expr_element* p, expr_element* n, int r);
      expr_element(char, expr_element* p, expr_element* n);
      expr_element(string*, expr_element* p, expr_element* n);
      expr_element(expr_element&, expr_element* p, expr_element* n);
      expr_element();
```

```
    ~expr_element();// destructor
    void  operator=(expr_element&);
    long  int_value();// return integer value of element
    doublereal_value();// return real value of element
    string*symbol(); // return symbol of symbol-valued element
    int         error_code();// return error code for EVAL_ERROR element
    int         what_reloc_type(){ return reloc_type; }
    int         what_reloc_level(){ return reloc_level; }
    void  set_reloc_level(int i)
                            { reloc_level = i; }
    int         what_type()     { return type; }
    void  append(expr_element* his); // append element to end of this one
    BOOLEANnegate_operator();
    expr_element*negate(BOOLEAN negate_it);
    expr_element*last();
    friendostream&operator<<(ostream&, expr_element*&);
};
class expr{
    expr_elementlisthead;// dummy -- ptr to first element of expression
    int                     reloc_level;// what level expr defined in nested blocks
public:
    expr(long, int r=0);// create expr. consisting of just an int val
    expr(double, int r=0);// create expr. consisting of just a real val
    expr(char);                 // create expr. consisting of just operator
    expr(string*);              // create expression consisting of just symbol
    expr(expr&);                // create an expression from another expression
    expr(expr_element&);// create an expression from an expr element
    expr();                     // create expr. with nothing in it
    ~expr();                    // destructor
    void  operator=(expr&);
    void  concat(expr*);// concatenate expr to end of this one
    doublereal_value(int*, int*);// evaluate real value of expression
    long  int_value(int*, int*);// evaluate integer value of expression
    BOOLEANeval(expr_element*);// evaluate and return expression value
    BOOLEAN eval_to_symbol(string** s);
    void  eval_unary_op(expr_element*);
    void  eval_integers_op(expr_element*);
    void  eval_reals_op(expr_element*);
    void  eval_strings_op(expr_element*);
```

```
    int         what_reloc_type();// returns relocation type of expression
    int         what_reloc_level();
    void  set_reloc_level(int i)
                                { reloc_level = i; }
    string*unknown_symbol();// returns ptr to symbol whose value not known
    friendostream&operator<<(ostream&, expr&);
    BOOLEANhas_int_value();
    BOOLEANis_real_valued();
    BOOLEANis_int_valued();
    expr* negate();              // returns another expr which is this' negation
};
BOOLEAN op_requires_integers(char op);
BOOLEAN op_can_take_strings(char op);
BOOLEAN unary_operator(char op);
// expr_arr.cxx
// derived class for expression array
// Terry Montlick
// 10/10/89
/* source code control: */
static char SccsID[] = "@(#)expr_arr.cxx1.56 10/7/91";
#include "expr_arr.hxx"
expr_array::expr_array()
{}
expr_array::expr_array(int i)
{}
//////////////////////////////////////////////////////////////////////
// expr_array::expr_array
// Constructor with expr_array as argument.
//////////////////////////////////////////////////////////////////////
expr_array::expr_array(expr_array& a){
      for (int i=0; i<a.size(); i++){
            // create a copy of each source expression
            expr* s = new expr(*a[i]);
            (*this)[i] = s;
      }}
//////////////////////////////////////////////////////////////////////
// expr_array::operator =
// Assigment of array.
//////////////////////////////////////////////////////////////////////
```

```
void expr_array::operator = (expr_array& a){
	for (int i=0; i<a.size(); i++){
		// create a copy of each source expression
		expr* s = new expr(*a[i]);
		(*this)[i] = s;
	}}
// expr_arr.hxx
// header for derived expression array classes
// T. Montlick
// 10/10/89
/* source code control: @(#)expr_arr.hxx1.56 10/7/91 */
#define EXPR_ARRAY_DEF
#ifndef ARRAY_DEF
#include "array.hxx"
#endif
#ifndef EXPR_DEF
#include "expr.hxx"
#endif
class expr_array : public array{
public:
	expr_array();
	expr_array(int i);
	expr_array(expr_array&);// constructor from another expr_array
	void  operator=(expr_array&);// assignment op from other expr_array
	expr*&     operator [] (int i) { return (expr*&) array::operator[] (i); }
	int              find(expr* ptr) { return array::find(ptr); }
	void       append(expr* ptr){ array::append(ptr); }
	expr_array&operator+(expr_array& a)
				{ return (expr_array&) array::operator+((array&) a); }
	expr_array&operator+=(expr_array& a) {a = *this + a; return *this; }
};
// exprhash.cxx
// functions for expression hash table class
// T. Montlick
// 9/12/89
/* source code control: */
static char SccsID[] = "@(#)exprhash.cxx1.56 10/7/91";
#ifndef EXPR_HASH_DEF
#include "exprhash.hxx"
```

```
#endif
// bring in hash functions, customized from our defines
#include "hash.cxx"
// exprhash.hxx
// header for expression hash table class
// T. Montlick
// 9/12/89
/* source code control: @(#)exprhash.hxx1.56 10/7/91 */
#define EXPR_HASH_DEF
#ifndef EXPR_DEF
#include"expr.hxx"
#endif
// define symbols which make a custom hash table class
#ifdef HASH
#undef HASH
#endif
#define HASH expr_hash
#ifdef HASH_ELEM
#undef HASH_ELEM
#endif
#define HASH_ELEM expr_hash_elem
#ifdef HASH_LIST
#undef HASH_LIST
#endif
#define HASH_LIST expr_hash_list
#ifdef VAL_TYPE
#undef VAL_TYPE
#endif
#define VAL_TYPE expr
// use expr*, not expr
#ifdef USE_POINTER
#undef USE_POINTER
#endif
#define USE_POINTER
#include"hash.hxx"
/*
$Header: /home/solus/users4/release/CVS/star/lib/f_find.c,v 1.7 1991/09/05 20:31:07 ed Exp $
$Id: f_find.c,v 1.7 1991/09/05 20:31:07 ed Exp $
$Log: f_find.c,v $
```

```
 * Revision 1.7 1991/09/05 20:31:07 ed
 * for debug in codeview
 *
 */
/* must define C library routines as extern C or names get mangled to C++ - TM*/
#ifdef __cplusplus
#ifdef sun
extern "C--" {
#else
extern "C" {
#endif
#endif
#include <stdlib.h>
#include <string.h>
#include <stdio.h>
#include <malloc.h>
/* don't need these - TM */
/* #include <direct.h> */
/* #include <conio.h> */
/* #include <io.h> */
#include <time.h>
#include <sys/types.h>
#include <sys/stat.h>
#include <errno.h>
#ifdef __cplusplus}
#endif
#ifdef DOS
extern "C" {
#endif
#include "starstd.h"
#include "f_find.h"
/****************************************************************************
            no_end_slash()
      -This function will check if there is a back slash at the end of
       an input string if in DOS, or a forward slash if in UNIX.
       If so, the slash will be eliminated.
      -This funotion serves file_find() by checking each directory set up
       along a environment string does not end with a slash. The purpose is
       to make inputs consistent.
```

```
*/
void
no_end_slash( char *string )/* assume string is '\0' terminated */{
      ushortlen;          /* length of the input string */
      /*
      ** function prototype
      ** no paramter declaration for library function
      ** to avoid warning
      */
/*    C++ needs this declared as "extern C - TM"
 extern size_t strlen(); */ /* get string length not include '\0' */
      /*
      ** get the size of the input string
      */
      len = (ushort)strlen( string );
#ifdef DEBUG
      printf( "\nlength of string = %hu\n", len );
#endif
      /*
      ** check if the last char. of the string
      ** is a slash
      */
      if ( SLASH != string[len-1] ){
            return;      /* don't touch the string */}
      else{
            /*
            ** replace the slash by '\0'
            */
            string[len-1] = '\0';
            return;}
}
/***************************************************************************
            file_find()
 -This function searches for a target file in each path along
      the STAR environment string.
      -However, in order to save SPROClab user convectional memory,
      the STAR environment variable will contain only the root dir.
      of sproc software. This function is designed to be able to
      find programs inside major subdirectories under the root.
```

```
-The sequence of area that file_find() looks for target file
is as follows:
      1)current directory
      2)root directory of first path along STAR environment string
      3)/exe directory under the current root
      4)/lib directory under the current root
      5)/sprocfil directory under the current root
      if file not found, get next path along STAR environment string
      and goto step 3)
It stops searching when the first target file is found.
-It returns OK if it succeeds
                NO if it fails
                NFG if drastic situation occurs.
-inputs
      1)char*filename; -file to be found
      2)char*filepath; -buffer ptr input from caller;
                        path of target file would be copied
                        to this buffer
*/
int
file_find( char *filename, /* file to be found */
          char *filepath) /* buffer ptr input from caller;
path of target file would be copied
to this buffer */{
      char  *varname; /* environment variable that specifies
a list of directory paths */
      /* character array made static so it doesn't get inited every time */
      static char star[5] = "STAR";
      char  pathbuf[_MAX_PATH];/* buffer to store the path of the
                                target file */
      char  *retv_sptr;
      int        i;
      char  *seps;
      char  filepathptr[_MAX_PATH];
      char  *dir_token;
      FILE *file;        /* used fopen and fclose now - TM */
      /* rewritten as static array, had flaky assignment to pointers - TM */
      static char *sproc_subdir[] = { /* sproc major subdir. under star
                                environment strings */
```

```
        SLASH_STRING,
        SLASH_STRING "exe" SLASH_STRING,
        SLASH_STRING "lib" SLASH_STRING,
        SLASH_STRING "sprocfil" SLASH_STRING
    };
    /*
    ** set up current major sproc subdircectory in DOS
    ** assume each subdir. set up in environment
    ** does not have '\' follows.
    */
    int         file_found = FALSE; /* flag signal for file exist */
    /*
    ** function prototype
    ** no paramter declaration for library functions
    ** to avoid warning
    */
/*  C++ needs these declared as "extern C" - TM
    extern char *strcpy();
extern char *getenv();
extern char *strtok();
*/
    void no_end_slash( char *string );
    /*
    ++ for codeview
    */
    varname = star;
#ifdef DEBUG
    printf( "\n" );
    printf( "sproc_subdir[0] = %s\n", sproc_subdir[0] );
    printf( "sproc_subdir[1] = %s\n", sproc_subdir[1] );
printf( "sproc_subdir[2] = %s\n", sproc_subdir[2] );
printf( "sproc_subdir[3] = %s\n", sproc_subdir[3] );
#endif
    /*
    ** firstly, look for the target file in current dir.
    */
    if ((file = fopen(filename, "r")) != 0)
{
#ifdef DEBUG
```

```
            printf( "file found in local dir.\n" );
#endif
            file_found = TRUE;
            fclose(file);}
      /*
      ** copy the file path to buffer input from caller
      ** if target file exists.
      */
      if ( file_found ){
      if ( filepath != strcpy( filepath, filename ) )
            {
#ifdef DEBUG
                  printf( "\nstrcpy() failed!\n" );
#endif
                  return( NFG );
            }
            return( OK );}
      /*
      ** get the string value of the input environment variable
      */
      retv_sptr = getenv( varname );
      if ( NULL == retv_sptr ){
#ifdef DEBUG
            printf( "\n%s does not have environment string.\n", varname );
#endif
            return( NO );}
      else /* environment string OK */{
            if ( NULL == strcpy( pathbuf, retv_sptr ) )
            {
#ifdef DEBUG
                  printf( "\nstrcpy() failed\n" );
#endif
                  return( NFG );
            }
#ifdef DEBUG
            printf( "\n%s = %s\n", varname, pathbuf );
#endif
            /*
            ** Break environment string into differnent directories
```

```
        */
        seps = ";";
    if ((dir_token = strtok( pathbuf, seps )) != NULL)
        { /* Find first directory */
            no_end_slash( dir_token ); /* take the slash at the end of
                                 of token out, if it exists */
            strcpy( filepathptr, dir_token );
        }
/* file_found = FALSE; */
        while( (dir_token != NULL) && !file_found )
    {
            for ( i=0; i<SPROC_SUBDIR_NO; i++ )
            {
                /*
                ** append sproc subdir. and filename to this dir.
                */
                strcat( filepathptr, sproc_subdir[i] );
                strcat( filepathptr, filename );
#ifdef DEBUG
                printf( "\nfilepathptr = %s\n", filepathptr );
#endif
                /*
                ** check for the existence of file in
                ** current sproc directory
                */
                if ((file = fopen(filepathptr, "r")) != 0)
            {
                        file_found = TRUE;
                        fclose(file);
                        break;
                }
            if ( i == (SPROC_SUBDIR_NO-1) )
                        break;
                strcpy( filepathptr, dir_token );
#ifdef DEBUG
 printf( "\nfilepathptr = %s\n", filepathptr );
#endif
            }   /* for end */
            if ( file_found )
```

```
                    break;
    if ((dir_token = strtok( (char*) NULL, seps )) != NULL)
              { /* Find next directory */
                    no_end_slash( dir_token );
                    strcpy( filepathptr, dir_token );
              }
    } /* while end */
    }     /* else end */
    /*
    ** copy the file path to buffer input from caller
    */
    if ( file_found ){
    if ( filepath != strcpy( filepath, filepathptr ) )
         {
#ifdef DEBUG
              printf( "\nstrcpy() failed!\n" );
#endif
              return( NFG );
         }
         return( OK );}
    else{
#ifdef DEBUG
         printf( "\nfile not found!!!!!\n" );
#endif
         return ( NO );
    }}
#ifdef DOS}
#endif
/*
$Header: /home/solus/users4/release/CVS/star/lib/f_find.h,v 1.2 1991/09/03 18:11:47 ed Exp $
$Id: f_find.h,v 1.2 1991/09/03 18:11:47 ed Exp $
$Log: f_find.h,v $
 * Revision 1.2 1991/09/03 18:11:47 ed
 * constant SPROC_SUBDIR_NO changed from 3 to 4 to accomodate the parent
 * directory in addition to "exe", "lib", "sprocfil" subdirectories.
 *
*/

/*****************************************************************************
```

F_FIND.H

-private header file for f_find.c

```
*/
#ifdef sun
#defineSLASH '/'
#define SLASH_STRING"/"
#else
#defineSLASH '\\'
#define SLASH_STRING"\\"
#endif
#define FILE_EXIST0
#define SPROC_SUBDIR_NO 4/* including parent dir. */
/*
** function prototype
*/
void no_end_slash( char *string );
int file_find( char *filename, char *filepath );
/* fields.h */
/* source code control: @(#)fields.h1.56 10/7/91 */
#define FIELDS_DEF
/* SDL assembler constants */
#define OP_SHIFT18/* # bits left to shift opcode field (24-6 bits) */
#define MODE_SHIFT15/* # bits left to shift addr mode field (24-6-3)*/
#define OPER_MASK0X7FFF/* mask defining operand field */
/* here are the opcodes: */
#define ADD_OP 0X04
#define ADC_OP 0X05
#define AND_OP 0X08
#define ASL_OP 0X00
#define ASR_OP 0X01
#define CLC_OP 0X19
#define CMP_OP 0X1C
#define DJNE_OP 0X3F
#define EOR_OP 0X0B
#define JMP_OP 0X31
#define JCC_OP 0X32
#define JCS_OP 0X33
#defineJNE_OP        0X34
#define JLF_OP 0X35
```

```
#define JMF_OP 0X36
#define JOV_OP 0X37
#define JSI_OP 0X38
#define JZE_OP 0X39
#define JEQ_OP JZE_OP
#define JLE_OP 0X3A
#define JLT_OP 0X3B
#define JGE_OP 0X3C
#define JGT_OP 0X3D
#define LBSJ_OP0X30
#define LDA_OP 0X0C
#define LDB_OP 0X0D
#define LDCC_OP 0X0E
#define LDD_OP 0X0F
#define LDF_OP 0X18
#define LDWS_OP 0X12
#define LDL_OP 0X11
#define LDX_OP 0X13
#define MAC_OP 0X16
#define MPY_OP 0X17
#define LDY_OPMPY_OP
#define NOP_OP 0X1D
#define NOT_OP 0X09
#define ORA_OP 0X0A
#define ROL_OP 0X02
#define ROR_OP 0X03
#define SEC_OP 0X1A
#define STA_OP 0X24
#define STB_OP 0X21
#define STBS_OP 0X1F
#define STD_OP 0X22
#define STF_OP 0X20
#define STL_OP 0X23
#define STML_OP 0X28
#define STMH_OP 0X29
#define STMG_OP 0X2A
#define STMLI_OP 0X2C
#define STMHI_OP 0X2D
#define STMGI_OP 0X2E
```

```
#define STWS_OP 0X27
#define STX_OP 0X2B
#define STY_OP 0X2F
#define SUB_OP 0X06
#define SUBC_OP 0X07
#define JWF_OP 0X3E
#define XLD_OP 0X15
/* addressing modes */
#define ABSOLUTE_MODE0X0
#define IMMED_L_MODE 0X2 /* left justified immediate operand */
#define IMMED_R_MODE 0X3 /* right justified immediate operand */
#define REG_MODE 0X1
#defineIND_LOOP_MODE0X4
#define IND_MODE0X5
#define IO_IND_LOOP_MODE 0X6
#defineIO_IND_MODE0X7
#define IMMEDIATE_MODE0X8/* for intermediate code only, justif. unknown */
/* register definitions */
#define A_REG 0x0E
#define B_REG 0x09
#define D_REG 0x0A
#define F_REG 0x0B
#define L_REG 0x08
#define BS_REG 0x0C
#define WS_REG 0x0F
#define X_REG 0x03
#define Y_REG 0x07
#define ML_REG 0x00
#define MH_REG 0x01
#define MG_REG 0x02
#define MLI_REG 0x04
#define MHI_REG 0x05
#define MGI_REG 0x06
/*****************************************************************
      FILE FUNCTION DEFINITIONS
Tony Curran
11-22-89
Function prototypes:
int splitname( char *cname, char *p1, char *p2 );
```

```
int mergename( char *cname, char *p1, char *p2 );
char *strtoup( char *string );
int check_open_rf( FILE *rfile, char *rpath )
****************************************************/
/* source code control: */
static char SccsID[] = "@(#)filefunc.c1.56 10/7/91";
#include <stdio.h>
#include <ctype.h>
/*#include <stdlib.h> */
#include <string.h>
/* splitname - separate filename into name and extension strings.
 cname points to the combined filename string
 p1 points to the name string
 p2 points to the extension string
 all strings are null terminated
 returns 0
*/
int splitname(cname, p1, p2)
char* cname;
char* p1;
char* p2;{
 int i=0,j=0;
 char c;
 while (1)
 {
 c=cname[i];
 if ( c=='.' ||.c=='\0')
       {
       p1[i] = '\0';
       i++;
       break;
       }
 p1[i] = c;
 i++;
 }
 if ( c=='\0')
 p2[j]='\0';
 else
 {
```

```
p2[j] = c;
j++;
while ( c!='\0' )
      {
      c = cname[i];
      p2[j] = c;
      i++;
      j++;
      }
}
return(0);}
/* mergename - combine name and extension strings into filename string.
 cname points to the combined filename string
 p1 points to the name string
 p2 points to the extension string
 all strings are null terminated
 returns 0
*/
int mergename(cname, p1, p2)
char* cname;
char* p1;
char* p2;{
 cname[0] = '\0';
 strcat(cname, p1);
 strcat(cname, p2);
 return(0);}
/* strtoup - convert a string to uppercase.
 string points to the null terminated string to be converted
 returns a pointer to string
 */
char *strtoup( string ) /* convert string to uppercase */
char* string;{
 int i=0;
 while ( string[i] != '\0')
 {
 string[i] = (char)toupper((int)string[i]);
 i++;
 }
 return ( string );
```

```
}
/* check_open_rf - check and open a read file, exit on failure
 rfile points to the file structure
 inpath is the filename
 returns 0 if successful
 returns 1 if failed
 */
int check_open_rf( rfile, rpath )
FILE*rfile;
char* rpath;{
 if( ( rfile = fopen( rpath, "r" )) == NULL )
 {
 printf( "ERROR - cannot open %s\n", rpath );
 return(1);
 }
 else
 return(0);}
/*****************
function prototypes
*****************/
/* source code control: @(#)filefunc.h1.56 10/7/91 */
externint splitname( char *cname, char *p1, char *p2 );
externint mergename( char *cname, char *p1, char *p2 );
externchar *strtoup( char *str );
externint check_open_rf ( FILE *infile, char *inpath );
// filestak.cxx
// file_stack class functions
// Terry Montlick
// 3/23/90
/* source code control: */
static char SccsID[] = "@(#)filestak.cxx1.56 10/7/91";
#include "filestak.hxx"
void  file_stack::push(string* s, FILE* f, int l){
      names.push(s);
      FILEs.push(f);
      lines.push(l);}
string*file_stack::pop(FILE** f_ptr, int* l_ptr){
      *f_ptr = FILEs.pop();
      *l_ptr = lines.pop();
```

```
    return names.pop();}
// filestak.hxx
// header for file stack class
// T. Montlick
// 3/23/90
/* source code control: @(#)filestak.hxx1.56 10/7/91 */
#define FILE_STACK_DEF
#ifndef STACK_DEF
    #include "stack.hxx"
#endif
class string;
class int_stack : public stack{
public:
    void push(int i)        { stack::push( (elem) i); }
    int      pop()          { return (int) stack::pop(); }
    int      nth(int n)     { return (int) stack::nth(n); }
};
class string_stack : public stack{
public:
    void push(string* s)    { stack::push(s); }
    string*pop()            { return (string*) stack::pop(); }
};
class F_stack : public stack{
public:
    void push(FILE* s)      { stack::push(s); }
    FILE*pop()              { return (FILE*) stack::pop(); }
};
class file_stack{
    string_stacknames;
    int_stack   lines;
    F_stack         FILEs;
public:
    void push(string* s, FILE* f, int l);
    string*pop(FILE** f_ptr, int* l_ptr);
    int      size()         { return names.size(); }
    int      line_at_file_level(int i)
                            { return lines.nth(lines.size() - i); }
};
/***************************************************************************
```

```
 *
 * Get environment variable functions
 *
 * Terry Montlick 3/20/90
 *
 ***************************************************************************/
/* built into DOS Microsoft C (believe it or not!), this function needs only
 * the be available in UNIX.
 */
/* source code control: */
static char SccsID[] = "@(#)getenv.c1.56 10/7/91";
/* only compile if not DOS */
#ifndef DOS
/* max size for this environment variable name */
#define MAX_NAME100
/****************************************************************************
 *
 * getenv
 *
 * Look for the given environment variable name and return its value as
 * the value of the function.
 * Returns NULL if not found.
 *
 ***************************************************************************/
char* getenv(varname)
char* varname;{
      extern char** environ;
      char*          p;
      char*          val_ptr;
      char*          return_val = 0L;
      int                      i;
      char           name_buf[MAX_NAME];
      externchar*strpbrk();
      for (i=0; ((p = environ[i]) != 0); i++){
            /* find delimiter for name */
            if ((val_ptr = strpbrk(environ[i], "=")) == 0L)
                  break;
            /* copy name to buffer */
            strncpy(name_buf, p, (val_ptr-p));
```

```
        name_buf[val_ptr-p] = '\0';
        if (strcmp(varname, name_buf) == 0)
        {
            /* found name, so advance past end ptr to start of value */
            val_ptr++;
            return_val = val_ptr;
            break;
        }}
    return return_val;}
#endif
/*****************************************************************************
 *
 * Get environment variable function
 *
 * Terry Montlick 3/22/90
 *
 *****************************************************************************/
/* source code control: @(#)getenv.h1.56 10/7/91 */
char *getenv(char*);
// hash.cxx
// functions for hash table class
// T. Montlick
// 9/12/89
/* source code control: @(#)hash.cxx1.56 10/7/91 */
#ifndef HASH_DEF
#include "hash.hxx"
#endif
///////////////////////////////////////////////////////////////////////////
// hash_elem::hash_elem
// Constructor.
///////////////////////////////////////////////////////////////////////////
HASH_ELEM::HASH_ELEM(){
    val = 0;
    next = 0;}
///////////////////////////////////////////////////////////////////////////
// hash_elem::~hash_elem
// Destructor.
///////////////////////////////////////////////////////////////////////////
HASH_ELEM::~HASH_ELEM(){
```

```
        // if value is a pointer, deallocate object pointed to
#ifdef USE_POINTER
        if (val)
                delete val;
#endif}
////////////////////////////////////////////////////////////////////
// hash_list::hash_list
// Constructor.
////////////////////////////////////////////////////////////////////
HASH_LIST::HASH_LIST(){
        listhead.next = 0;}
////////////////////////////////////////////////////////////////////
// hash_list::hash_list
// Constructor from other hash list.
////////////////////////////////////////////////////////////////////
HASH_LIST::HASH_LIST(HASH_LIST& h){
        HASH_ELEM*src_ptr;
        HASH_ELEM*dest_ptr;
        HASH_ELEM*last_dest_ptr;
        // first clear out any list which already exists
        iter_init();
        while (next())
                remove();               // delete first element
        src_ptr = h.listhead.next;
        last_dest_ptr = &listhead;
        while (src_ptr){
                // create a new hash element and copy source contents to it
                dest_ptr = new HASH_ELEM;
                dest_ptr->s = src_ptr->s;
                // if we are using pointers, create a new copy of value
#ifdef USE_POINTER
                if (src_ptr->val)
                        dest_ptr->val = new VAL_TYPE(*src_ptr->val);
                else
                        dest_ptr->val = ( VALUE_TYPE ) NULL;
#else
                dest_ptr->val = src_ptr->val;
#endif
                dest_ptr->next = 0;
```

```
        // advance pointers
        last_dest_ptr->next = dest_ptr;
        last_dest_ptr = dest_ptr;
        src_ptr = src_ptr->next;
    }}
////////////////////////////////////////////////////////////////////////////
// hash_list::~hash_list
// Destructor. Delete all hash list elements.
////////////////////////////////////////////////////////////////////////////
HASH_LIST::~HASH_LIST(){
    iter_init();
    while (next())
        remove();                // delete first element}
////////////////////////////////////////////////////////////////////////////
// hash_list::operator =
// Assignment from other hash list.
////////////////////////////////////////////////////////////////////////////
void HASH_LIST::operator=(HASH_LIST& h){
    HASH_ELEM*src_ptr;
    HASH_ELEM*dest_ptr;
    HASH_ELEM*last_dest_ptr;
    // first clear out any list which already exists
    iter_init();
    while (next())
        remove();                // delete first element
    src_ptr = h.listhead.next;
    last_dest_ptr = &listhead;
    while (src_ptr){
        // create a new hash element and copy source contents to it
        dest_ptr = new HASH_ELEM;
        dest_ptr->s = src_ptr->s;
        // if we are using pointers, create a new copy of value
#ifdef USE_POINTER
        if (src_ptr->val)
            dest_ptr->val = new VAL_TYPE(*src_ptr->val);
        else
            dest_ptr->val = ( VALUE_TYPE ) NULL;
#else
        dest_ptr->val = src_ptr->val;
```

```
#endif
            dest_ptr->next = 0;
            // advance pointers
            last_dest_ptr->next = dest_ptr;
            last_dest_ptr = dest_ptr;
            src_ptr = src_ptr->next;
      }}
///////////////////////////////////////////////////////////////////////
// hash_list::iter_init
// Initialize to iterate through list.
///////////////////////////////////////////////////////////////////////
void HASH_LIST::iter_init(){
      current = &listhead;
      last = 0;}
///////////////////////////////////////////////////////////////////////
// hash_list::next
// Iterator.
///////////////////////////////////////////////////////////////////////
HASH_ELEM* HASH_LIST::next(){
      if (last = current)
            current = last->next;
      return current;}
///////////////////////////////////////////////////////////////////////
// hash_list::find
// Find the given name in the hash list, returning TRUE if the
// name was found and leaving this entry as the current value.
///////////////////////////////////////////////////////////////////////
BOOLEAN HASH_LIST::find(const string& name){
      iter_init();
      while (next()){
            if (name == current->s)
                  return TRUE;}
      return FALSE;}
///////////////////////////////////////////////////////////////////////
// hash_list::add
// Add a new name and value to the front of the hash list.
// If the name is already in the list, set the new value.
///////////////////////////////////////////////////////////////////////
void HASH_LIST::add(string& name, VALUE_TYPE& value){
```

```
    HASH_ELEM*ptr;
    if (!find(name)){
        ptr = new HASH_ELEM;
        ptr->s = name;
        // if we are using pointers, create a new copy of value
#ifdef USE_POINTER
        if (value)
            ptr->val = new VAL_TYPE(*value);
        else
            ptr->val = ( VALUE_TYPE ) NULL;
#else
        ptr->val = value;
#endif
        ptr->next = listhead.next;
        listhead.next = ptr;}
    else{
        // if pointers, deallocate prev value
#ifdef USE_POINTER
        if (current->val)
            delete current->val;
#endif
        current->val = value;
    }}
/////////////////////////////////////////////////////////////////////
// hash_list::remove
// Delete the current iteration element from the hash list.
/////////////////////////////////////////////////////////////////////
void HASH_LIST::remove(){
    if (current && last){
        last->next = current->next;
        delete current;
        current = last->next;
    }}
/////////////////////////////////////////////////////////////////////
// hash::hash
// Constructor. Create a hash table of the given size.
/////////////////////////////////////////////////////////////////////
HASH::HASH(int size){
    p = new HASH_LIST [sz = size];}
```

```
////////////////////////////////////////////////////////////////////
// hash::hash
// Constructor from another hash table.
////////////////////////////////////////////////////////////////////
HASH::HASH(HASH& h){
      // create new hash table of same size
      p = new HASH_LIST [sz = h.sz];
      // copy each hash list in array
      for (int i=0; i<sz; i++)
            p[i] = h.p[i];}
////////////////////////////////////////////////////////////////////
// hash::~hash
// Destructor. Deallocate hash table.
////////////////////////////////////////////////////////////////////
HASH::~HASH(){
      delete [sz] p;}
////////////////////////////////////////////////////////////////////
// hash::hash_key
// Return hash key for the given name string.
////////////////////////////////////////////////////////////////////
int HASH::hash_key(const string& name){
      int         key = 0;
      char* p;
      p = (char*) &name[0];
      for (int i=0; i<MAX_HASH_CHAR; i++){
            key = (key + *p) % sz;
            if (*p != '\0')
                  p++;              // don't advance beyond end of string}
      return key;}
////////////////////////////////////////////////////////////////////
// hash::find
// Find the given name in the hash table, returning the value.
// Returns TRUE if the name was found.
////////////////////////////////////////////////////////////////////
BOOLEAN HASH::find(const string& name, VALUE_TYPE* valptr){
      HASH_LIST*which_list;
      which_list = &p[hash_key(name)];
      if (which_list->find(name)){
            *valptr = *which_list->value();
```

```
        return TRUE;}
    else
        return FALSE;}
////////////////////////////////////////////////////////////////////
// hash::present
// Find the given name in the hash table.
// Returns TRUE if the name was found.
////////////////////////////////////////////////////////////////////
BOOLEAN HASH::present(const string& name){
    HASH_LIST*which_list;

    which_list = &p[hash_key(name)];
    return which_list->find(name);}
////////////////////////////////////////////////////////////////////
// hash::remove
// Find the given name in the hash table, and delete the entry.
////////////////////////////////////////////////////////////////////
BOOLEAN HASH::remove(string& name){
    HASH_LIST*which_list;

    which_list = &p[hash_key(name)];
    if (which_list->find(name)){
        which_list->remove();
        return TRUE;}
    return FALSE;}
////////////////////////////////////////////////////////////////////
// hash::add
// Add the given name and value to the hash table. If the name is
// not present, add a new entry.
////////////////////////////////////////////////////////////////////
void HASH::add(string& name, VALUE_TYPE& value){
    HASH_LIST*which_list;
    which_list = &p[hash_key(name)];
    which_list->add(name, value);}
////////////////////////////////////////////////////////////////////
// hash::add_new
// Add the given name and value to the hash table. If the name is
// already present, return FALSE;
////////////////////////////////////////////////////////////////////
```

```
BOOLEAN HASH::add_new(string& name, VALUE_TYPE& value){
    HASH_LIST*which_list;
    which_list = &p[hash_key(name)];
    if (which_list->find(name))
        return FALSE;
    add(name, value);
    return TRUE;}
////////////////////////////////////////////////////////////////////
// hash::iter_init
// Init the iterator to selected each element of hash table in turn.
////////////////////////////////////////////////////////////////////
void HASH::iter_init(){
    HASH_LIST*which_list;
    iter_index = iter_count = 0;
    which_list = &p[iter_index];
    which_list->iter_init();}
////////////////////////////////////////////////////////////////////
// hash::next
// Get the next hash entry. Returns FALSE if no more.
////////////////////////////////////////////////////////////////////
BOOLEAN HASH::next(string** name_ptr, VALUE_TYPE* value){
    HASH_LIST*which_list;
    HASH_ELEM*which_elem;
    which_list = &p[iter_index];
    which_elem = which_list->next();
    while (!which_elem){
        iter_index++;
        // if at end of hash array, all done
        if (iter_index >= sz)
            return FALSE;
        else
        {
            which_list = &p[iter_index];
            which_list->iter_init();
            which_elem = which_list->next();
        }}
    *name_ptr = &which_elem->s;
#ifdef USE_POINTER
    if (which_elem->val)
```

```
        *value = new VAL_TYPE(*which_elem->val);
    else
        *value =( VALUE_TYPE ) NULL;
#else
    *value = which_elem->val;
#endif
    iter_count++;
    return TRUE;}
#ifndef NO_OUTSTREAM
////////////////////////////////////////////////////////////////////
// ostream& operator<<(ostream&, HASH&)
// Output stream operator.
////////////////////////////////////////////////////////////////////
ostream& operator<<(ostream& strm, HASH& h){
    h.iter_init();
    // just call our output iterator function
    return strm <<= h;}
////////////////////////////////////////////////////////////////////
// ostream& operator<<=(ostream&, HASH&)
// Output stream iterator function.
// Get the next hash element, output it, and call ourself again.
// If no more elements, just return output stream.
////////////////////////////////////////////////////////////////////
ostream& operator<<=(ostream& strm, HASH& h){
    string*         name;
    VALUE_TYPEval;
    quoter          name_q;
    quoter          val_q;
    int                     count;
    // save to test for first time iterating
    count = h.iter_count;
    if (h.next(&name, &val)){
        name_q.in() << *name;
        #ifdef USE_POINTER
            val_q.in() << *val;
        #else
            val_q.in() << val;
        #endif
        // if not first iterator, output separator
```

```
            if (count)
                  return (strm << ", " << name_q.out() << "=" << val_q.out()) <<= h;
            else
                  return (strm << name_q.out() << "=" << val_q.out()) <<= h;}
      else
            return strm;}
#endif
//hash.hxx
// header for hash table class
// T. Montlick
// 9/12/89
/* source code control: @(#)hash.hxx1.56 10/7/91 */
#define HASH_DEF
#ifndef STANDARD_DEF
#include"standard.hxx"
#endif
#ifndef STRING_DEF
#include"string.hxx"
#endif
#ifndef POST_STREAM_DEF
#include"poststrm.hxx"
#endif
// The following are used to create a custom hash list.
// The custom hash class must include "hash.cxx", but first must define
// various symbols.
// Derived classes are not used because they are not flexible enough!
// HASH is defined as the name of the hash table class
#ifndef HASH
#define HASH hash
#endif
// HASH_LIST is defined as the name of the hash list class
#ifndef HASH_LIST
#define HASH_LIST hash_list
#endif
// HASH_ELEM is defined as the name of the hash element class
#ifndef HASH_ELEM
#define HASH_ELEM hash_elem
#endif
// VAL_TYPE is the type contained in the val field of each hash element
```

```
#ifndef VAL_TYPE
#define VAL_TYPE elem
#endif
// USE_POINTER is defined if we are to store a pointer to value type,
// not the type itself.
#ifdef VALUE_TYPE
#undef VALUE_TYPE
#endif
#ifdef USE_POINTER
#define VALUE_TYPE VAL_TYPE*
#else
#define VALUE_TYPE VAL_TYPE
#endif
// Hash element, which is used to build a linked list of entries
class HASH_ELEM{
public:
      string      s;                  // this string
      VALUE_TYPEval;// value associated with this string
      HASH_ELEM*next;// next string in list
public:
      HASH_ELEM(); // constructor
      ~HASH_ELEM();// destructor
};
// Hash list, used to build a hash table
class HASH_LIST{
      HASH_ELEMlisthead;// dummy, points to first hash element
      HASH_ELEM*current;// current element
      HASH_ELEM*last;// previous element
public:
      HASH_LIST();  // constructor
      HASH_LIST(HASH_LIST&);// construction from other hash list
      ~HASH_LIST();
      void      operator=(HASH_LIST&);
      void      iter_init();
      HASH_ELEM*next();
      void      remove();
      BOOLEAN find(const string& name);
      void      add(string& name, VALUE_TYPE& value);
      string*   name()          { return &current->s; }
```

```
    VALUE_TYPE*value(){ return &current->val; }
};
#define MAX_HASH_CHAR8/* max characters to generate hash key */
// The hash table
class HASH{
    HASH_LIST*p;            // pointer to array of hash lists
    int        sz;          // size of hash table array
    int        iter_index;  // which hash list currently iterating
    int        iter_count;  // # of iterations
public:
    HASH(int size);         // create hash table of given size
    HASH(HASH&);            // constructor from other hash table
    ~HASH();
    void operator=(HASH&);// assignment oper. from other hash table
    int  hash_key(const string& name);// return the hash key for name
    BOOLEANfind(const string& name, VALUE_TYPE* valptr);// return val from name
    BOOLEANpresent(const string& name);// just see if name present
    BOOLEANremove(string& name);// delete the given entry
    void add(string& name, VALUE_TYPE& value);// add value or entry
    BOOLEANadd_new(string& name, VALUE_TYPE& value);// add new entry
    void iter_init();
    BOOLEANnext(string** name, VALUE_TYPE* valptr);
    friend ostream& operator<<=(ostream&, HASH&);
    friend ostream& operator<<(ostream&, HASH&);
};
// inp_list.cxx
// input list class
// T. Montlick
// 11/30/89
/* source code control: */
static char SccsID[] = "@(#)inp_list.cxx1.56 10/7/91";
#ifndef INP_LIST_DEF
#include "inp_list.hxx"
#endif
/////////////////////////////////////////////////////////////////
// inp_list::inp_list
// Constructor.
/////////////////////////////////////////////////////////////////
inp_list::inp_list()
```

```
{}
///////////////////////////////////////////////////////////////////////////
// inp_list::inp_list(inp_list&)
// Constructor from other inp_list.
///////////////////////////////////////////////////////////////////////////
inp_list::inp_list(inp_list& l){
        blck = l.blck;
        inp = l.inp;
        iter_index = l.iter_index;}
///////////////////////////////////////////////////////////////////////////
// inp_list::~inp_list
// Destructor.
///////////////////////////////////////////////////////////////////////////
inp_list::~inp_list()
{}
///////////////////////////////////////////////////////////////////////////
// inp_list::operator = (inp_list&)
// Assignment operator from other inp_list.
///////////////////////////////////////////////////////////////////////////
void inp_list::operator = (inp_list& l){
        blck = l.blck;
        inp = l.inp;
        iter_index = l.iter_index;}
///////////////////////////////////////////////////////////////////////////
// inp_list::add
// Add a block and input pair.
///////////////////////////////////////////////////////////////////////////
void inp_list::add(int which_blck, int which_input){
        int        i;
        i = blck.size();
        blck[i] = which_blck;
        inp[i] = which_input;}
///////////////////////////////////////////////////////////////////////////
// inp_list::remove
// Remove last input pair gotten with next().
///////////////////////////////////////////////////////////////////////////
void inp_list::remove(){
        int        i;
        i = --iter_index;// make sure we back up iter index to point to current
```

```
        // make sure we were really pointing to something
        if (i >= 0){
                blck.remove(i);
                inp.remove(i);}
        else iter_index++;}
////////////////////////////////////////////////////////////////////////
// inp_list::next
// Get next pair.
////////////////////////////////////////////////////////////////////////
BOOLEANinp_list::next(int* which_blck, int* which_input){
        if (iter_index < blck.size()){
                *which_blck = blck[iter_index];
                *which_input = inp[iter_index];
                iter_index++;
                return TRUE;}
        else
                return FALSE;}
////////////////////////////////////////////////////////////////////////
// inp_list::get
// Get pair at given index, bypassing iterator.
////////////////////////////////////////////////////////////////////////
BOOLEANinp_list::get(int i, int* which_blck, int* which_input){
        if (i < blck.size()){
                *which_blck = blck[i];
                *which_input = inp[i];
                return TRUE;}
        else
                return FALSE;}
// inp_list.hxx
// input list class
// T. Montlick
// 2/11/90
/* source code control: @(#)inp_list.hxx1.56 10/7/91 */
#define INP_LIST_DEF
#ifndef INT_ARRAY_DEF
        #include "int_arr.hxx"
#endif
// This class maintains an input list, which consists of pairs of block indices
// and input index numbers. Input lists are used for tracing through sets of
```

```
// block inputs for sequencing.
class inp_list{
      int_arrayblck;
      int_arrayinp;
      int              iter_index;
public:
      inp_list();
      inp_list(inp_list& l);
      ~inp_list();
      void operator = (inp_list& l);
      void  add(int which_blck, int which_input);
      void  remove();
      BOOLEANempty()          { return (blck.size() == 0); }
      void  iter_init()   { iter_index = 0; }
      BOOLEANnext(int* which_blck, int* which_input);
      int          size()          { return blck.size(); }
      BOOLEANget(int i, int* which_blck, int* which_input);
};
// inst_arr.cxx
// derived class for instance array
// Terry Montlick
// 11/30/89
/* source code control: */
static char SccsID[] = "@(#)inst_arr.cxx1.56 10/7/91";
#include "inst_arr.hxx"
// inst_arr.hxx
// header for derived instance array class
// T. Montlick
// 11/30/89
/* source code control: @(#)inst_arr.hxx1.56 10/7/91 */
#define INST_ARRAY_DEF
#ifndef ARRAY_DEF
#include "array.hxx"
#endif
class instance;
class inst_array : public array{
public:
      instance*&operator[](int i) { return (instance*&) array::operator[] (i); }
      int               find(instance* ptr) { return array::find(ptr); }
```

```
	void		append(instance* ptr){ array::append(ptr); }
	inst_array&operator+(inst_array& a)
					{ return (inst_array&) array::operator+((array&) a); }
	inst_array&operator+=(inst_array& a) {a = *this + a; return *this; }
};
// instanc1.cxx
// instance class
// T. Montlick
// 11/30/89
/* source code control: */
static char SccsID[] = "@(#)instanc1.cxx1.56 10/7/91";
#ifndef INSTANCE_DEF
#include "instance.hxx"
#endif

//////////////////////////////////////////////////////////////////////
// instance_rate_change::instance_rate_change
// Constructor.
//////////////////////////////////////////////////////////////////////
instance_rate_change::instance_rate_change(){
	new_rate_block = FALSE;}
//////////////////////////////////////////////////////////////////////
// instance_rate_change::~instance_rate_change
// Destructor.
//////////////////////////////////////////////////////////////////////
instance_rate_change::~instance_rate_change()
{}
//////////////////////////////////////////////////////////////////////
// instance::instance
// Constructor.
//////////////////////////////////////////////////////////////////////
instance::instance(block* proto, string& inst_name, instance* parent,
				int index): instance_phantoms(proto){
	prototype_ptr = proto;
	instance_name = inst_name;
	parent_instance = parent;
	our_index = index;
	overrides = NULL;
	our_n_storage_locs =
```

```
      storage_base =
      n_storage_locs = 0;
      instruction_base = NO_INSTR_BASE;
      line_num = 0;
      inst_is_variant =
      is_serial_port =
      is_serial_output =
      connections_set =
      sequenced =
      overrides_processed =
      labels_output =
      init = FALSE;
//    last_insert_pos = -1;
      // initialize zones to none
      for (int i=0; i<proto->storage_table_size(); i++){
            zone_for_wire[i] = NO_TIME_ZONE;
      }}
////////////////////////////////////////////////////////////////////////
// instance::~instance
// Destructor.
////////////////////////////////////////////////////////////////////////
instance::~instance()
{}
////////////////////////////////////////////////////////////////////////
// push_context
// Set this instance's block as current block, and set instance info.
////////////////////////////////////////////////////////////////////////
void instance::push_context(){
      // set this block's prototype as the current block
      push_block(prototype_ptr);
      // set the override symbol table for this instance
      prototype_ptr->set_override_symbols(overrides);
      // also set this instance pointer in the prototype block so it can
      // translate storage expressions
      prototype_ptr->set_instance(this);}
////////////////////////////////////////////////////////////////////////
// pop_context
// Clears instance info in block and restores previous current block.
////////////////////////////////////////////////////////////////////////
```

```
void instance::pop_context(){
    // allow for possible multple push of same block, so don't clear block info!
    // we're no longer the current block
    pop_block();}
//////////////////////////////////////////////////////////////////////////
// instance::build_tree
// Called for the top level instance, this function builds the instance tree by
// instantiating all child blocks.
// Returns a pointer to the instance which caused the tree build
// to failed because of infinite hierarchy, else returns NULL.
//////////////////////////////////////////////////////////////////////////
instance*instance::build_tree(){
    int             i;
    block*      blk;
    block*      child_block;
    string*     child_blk_name;
    string*     child_name;
    arg_set*child_vals;
    arg_set*child_ports;
    int             line_num_called_at;
    instance*new_child;
    instance*bad_instance;
    block_ref*child_ref;
    blk = prototype_ptr;
    // first make sure we have not been instantiated in hierarchy
    if (blk->is_in_hierarchy())
        return this;
    // it's not, so mark it
    blk->set_in_hierarchy(TRUE);
    blk->refs_iter_init();
    // start reference/child instance index from 0
    i = 0;
    // get each block name instantiated by this block
    while (blk->next_ref(&child_ref)){
        // get reference info, including line # for this instance
        child_ref->get_block_info(&child_blk_name, &child_name, &child_vals,
                        &child_ports, &line_num_called_at);
        // look for child block name in list of prototypes
        if (prototype_blocks.find(*child_blk_name, &child_block))
```

```
        {
            // if block has subroutine form, instantiate inline form for now and
            // count # times it's called
            if (child_block->has_subr_form())
                child_block->increment_call_count();
            // create a new child instance
            new_child = new instance(child_block, *child_name, this, i);
            // give the block reference a pointer to him
            child_ref->set_instance_pointer(new_child);
            // set in child line # we called him from
            new_child->line_num = line_num_called_at;

            // add to our children
            child_instances[i] = new_child;

            // store pointer to block ref
            child_refs[i] = child_ref;

            // and recursively call our child
            if (bad_instance = new_child->build_tree())
                return bad_instance;
            i++;                    // advance child index
        }}
    // unmark this block in instance hierarchy
    blk->set_in_hierarchy(FALSE);
    return NULL;}
//////////////////////////////////////////////////////////////////////
// instance::process_subroutines
// Called for the top level instance, this function processes subroutines
// by seeing if the inline or call form should be used. It then instantiates
// the correct form, and if a subroutine call, makes sure that the subroutine
// body is at the top level of the instance tree.
//////////////////////////////////////////////////////////////////////
int instance::process_subroutines(){
    int             i;
    block*          blk;
    block*          child_block;
    string*         child_blk_name;
    string*         child_name;
```

```
arg_set*child_vals;
arg_set*child_ports;
int             line_num_called_at;
instance*child;
block_ref*child_ref;
int             status = 0;
// make override symbols available
push_context();
blk = prototype_ptr;
// first make sure we have not been instantiated in hierarchy
if (blk->is_in_hierarchy()){
      out_err_header("INS092");
      cerr << "Subroutine block '"
            << *prototype()->get_block_name()
            << "' eventually includes itself!\n";
      status = 1;}
// it's not, so mark it
blk->set_in_hierarchy(TRUE);
blk->refs_iter_init();
// start reference/child instance index from 0
i = 0;
// get each block name instantiated by this block
while (blk->next_ref(&child_ref)){
      // get reference info, including line # for this instance
      child_ref->get_block_info(&child_blk_name, &child_name, &child_vals,
                              &child_ports, &line_num_called_at);
      // look for child block name in list of prototypes
      if (prototype_blocks.find(*child_blk_name, &child_block))
      {
            // get instance pointer
            child = child_instances[i];
            // see if this is a possible subroutine
            if (child_block->has_subr_form())
            {
                  // this is a possible subroutine, so see if call or inline
                  if (check_if_subr_call(child_block, child))
                  {
                              expr_hash*parameters;
                              // subr call, so use call form of name
```

```
stringsubr_call_name;
subr_call_name = subr_call_name + *child_blk_name
+ CALL_SUFFIX;
if (!prototype_blocks.find(subr_call_name, &child_block))
{
out_error("INS085", cerr, TRUE);
cerr << "Unable to find subr call block for '"
 << *child_blk_name
 << "'.\n";
status = 1;
}
// make sure subroutine body is at top level
if (!child_block->is_subr_inst_made())
{
stringsubr_name;
block*subr_block;
instance*subr_inst;
block_ref*block_ref_ptr;
intj;
subr_name = subr_name + *child_blk_name + SUBR_SUFFIX;
if (!prototype_blocks.find(subr_name, &subr_block))
{
out_error("INS086", cerr, TRUE);
cerr << "Unable to find subr block for '"
 << *child_blk_name
 << "'.\n";
status = 1;
}
// create the subr instance as next child of top inst
j = top_instance->get_n_children();
subr_inst = new instance(subr_block, *child_blk_name,
top_instance, j);
top_instance->child_instances[j] = subr_inst;
// add a new block reference for top instance
// so block gets auto-sequenced
block_ref_ptr = new block_ref(subr_name,
*child_blk_name, 0);
((hier_block*) top_instance->prototype() )->
add_block_ref(block_ref_ptr);
```

```
                    // give the block reference a pointer to subroutine inst
                    block_ref_ptr->set_instance_pointer(subr_inst);
                    child_block->set_subr_inst_made(subr_inst);
                    }
                    // kill previous child instance
                    // but first get parameters
                    parameters = child->get_overrides();
                    delete child;
                    // and create a new child instance with subr call block
                    child = new instance(child_block, *child_name, this, i);
                    // give him old parameters
                    child->set_overrides(parameters);
                    // give the block reference a pointer to him
                    child_ref->set_instance_pointer(child);
                    // set in child line # we called him from
                    child->line_num = line_num_called_at;
                    // add to our children
                    child_instances[i] = child;
                    // store pointer to block ref
                    child_refs[i] = child_ref;
                }
            }
            // and recursively call our child
            if (status == 0)
                status |= child->process_subroutines();
            i++;            // advance child index
        }}
    // unmark this block in instance hierarchy
    blk->set_in_hierarchy(FALSE);
    pop_context();
    return status;}
////////////////////////////////////////////////////////////////////////////////
// instance::check_if_subr_call
// Returns TRUE if this child should be called as subroutine rather than
// remain inline.
////////////////////////////////////////////////////////////////////////////////
BOOLEAN instance::check_if_subr_call(block* child_block, instance* child_inst){
    BOOLEANstatus = FALSE;
    BOOLEANdont_know_status = TRUE;
```

```
expr*       expr_ptr;
static      string subr_param_string(SUBR_PARAM_STR);
int               param_index;
long        value;
int               dummy1, dummy2;
// push to child context so parameter values available
child_inst->push_context();
if (child_block->look_up_param_name(subr_param_string, &param_index)){
      // get and evaluate parameter expression
      expr_ptr = child_block->param_expr_at_index(param_index);
      value = expr_ptr->int_value(&dummy1, &dummy2);
      // check condition values (defined in our header)
      if (value USE_SUBR_CONDITION)
      {
            status = TRUE;
            dont_know_status = FALSE;
      }
      else if (value DONT_USE_SUBR_COND)
      {
            status = FALSE;
            dont_know_status = FALSE;
      }}
if (dont_know_status){
      // use default, which can be specified from command line
      if (child_block->get_n_times_called() >= deflt_subr_count)
            status = TRUE;}
child_inst->pop_context();
return status;}
////////////////////////////////////////////////////////////////////////
// get_declaration
// Get the strings for the next export declaration in the remaining
// portion of the declarations string.
////////////////////////////////////////////////////////////////////////
BOOLEAN get_declaration(string* declarations, string** symbol_name,
                  string** symbol_val){
      char*       start_ptr;
      char*       end_ptr;
      char*       temp_ptr;
      int               n_chars;
```

```
char        name[MAX_HIER_NAME_SIZE];
int              i;
start_ptr = &declarations->operator[](0);
// skip any white space
start_ptr = start_ptr + strspn(start_ptr, " ");
// search for the next "=" or space in the declaration
if (!(end_ptr = strpbrk(start_ptr, "= ")))
      return FALSE;
// there is name between start_ptr and end_ptr
// copy it into our character array
n_chars = end_ptr - start_ptr;
// make sure that there's no separator character in name
if ((temp_ptr = strpbrk(start_ptr, ", ")) < end_ptr){
      if (temp_ptr != (char*) NULL)
            return FALSE;}
// limit name to max size
if (n_chars > MAX_HIER_NAME_SIZE)
      n_chars = MAX_HIER_NAME_SIZE;
strncpy(name, start_ptr, n_chars);

// don't forget terminal null
name[n_chars] = '\0';
// make sure name is a legal identifier
if ( (name[0] >='a' && name[0] <= 'z')
      || (name[0] >='A' && name[0] <= 'Z')
      || name[0] == '$'
      || name[0] == '%'
      || name[0] == '_'
)
      ;
else
      return FALSE;
for (i=1; i<n_chars; i++){
      if ( (name[i] >='a' && name[i] <= 'z')
            || (name[i] >='A' && name[i] <= 'Z')
            || (name[i] >='0' && name[i] <= '9')
            || name[i] == '$'
            || name[i] == '%'
            || name[i] == '_'
```

```
    )
            ;
    else
            return FALSE;}
// make a symbol string from it
*symbol_name = new string(name);
// if not already there, go to the next "="
if (end_ptr[0] != '='){
    if (!(end_ptr = strpbrk(end_ptr, "=")))
            return FALSE;}
end_ptr++;// go past "="
// skip any white space
end_ptr = end_ptr + strspn(end_ptr, " ");
// now set start_ptr to search from start of value
start_ptr = end_ptr;
if (!(end_ptr = strpbrk(start_ptr, ", ")))
    end_ptr = start_ptr + strlen(start_ptr);
n_chars = end_ptr - start_ptr;
// skip past separators for next name/value pair
end_ptr = end_ptr + strspn(end_ptr, ", ");
// limit name to max size
if (n_chars > MAX_HIER_NAME_SIZE)
    n_chars = MAX_HIER_NAME_SIZE;
strncpy(name, start_ptr, n_chars);
// don't forget terminal null
name[n_chars] = '\0';
// make a symbol string from it
*symbol_val = new string(name);
// and make a new declarations string which is remainder of string
n_chars = strlen(end_ptr);
strncpy(name, end_ptr, n_chars);
name[n_chars] = '\0';
*declarations = name;
return TRUE;}
////////////////////////////////////////////////////////////////////////
// instance::process_exports
// Sees if this instance and children have export symbols declared in its
// parameter list.
// Returns non-zero if error.
```

```
////////////////////////////////////////////////////////////////////
int instance::process_exports(){
    int         status = 0;
    expr*       expr_ptr;
    static      string exports_param_string(EXPORTS_PARAM_STR);
    int         param_index;
    string*     declarations;
    int         i;
    string*     symbol_name;
    string*     symbol_val;
    string*     inst_symbol_val;
    expr*       symbol_val_expr;
    int         temp;
    // push to child context so parameter values available
    push_context();
    if (prototype()->look_up_param_name(exports_param_string, &param_index)){
        // get and evaluate parameter expression
        expr_ptr = prototype()->param_expr_at_index(param_index);
        if (expr_ptr->eval_to_symbol(&declarations))
        {
            // exports parameter has a string value
            // so get each declaration
            while (get_declaration(declarations, &symbol_name, &symbol_val))
            {
                // make sure the symbol value is one of our names
                if (!prototype()->look_up_storage_name(symbol_val, &temp)
                        && !prototype()->look_up_symbol_name(symbol_val,
                         &symbol_val_expr) )
                {
                        out_error("INS075", cerr, TRUE);
                        cerr << "The name to be exported, '"
                         << *symbol_val
                         << "', is not present in the block.\n";
                        status = 1;
                }
                // make a string expression from symbol val string
                // starting with this instance name
                inst_symbol_val = new string("");
                *inst_symbol_val = *inst_symbol_val + instance_name + "."
```

```
                    + *symbol_val;
        symbol_val_expr = new expr(inst_symbol_val);
        // add expression to parent
        if (!parent()->prototype()->
                add_expression_name(symbol_name, symbol_val_expr))
        {
                out_error("INS073", cerr, TRUE);
                cerr << "The export name '"
                 << *symbol_name
                 << "' is already defined.\n";
                status = 1;
        }
        if (!parent()->prototype()->
                add_symbol_name(symbol_name, &temp, FALSE))
        {
                out_error("INS074", cerr, TRUE);
                cerr << "The export name '"
                 << *symbol_name
                 << "' already exists.\n";
                status = 1;
        }
    }
    // should be no more declarations left if successful
    if (*declarations != "")
    {
        out_error("INS072", cerr, TRUE);
        cerr << "Illegal exports parameter declaration of '"
                << *declarations
                << "'.\n";
        status = 1;
    }
}
else
{
    out_error("INS071", cerr, TRUE);
    cerr << "Exports parameter declaration has an illegal value of '"
        << *expr_ptr
        << "'.\n";
    status = 1;
```

```
        }}
    for (i=0; i<child_instances.size(); i++)
        status |= child_instances[i]->process_exports();
    pop_context();
    return status;}
////////////////////////////////////////////////////////////////////////
// instance::evaluate_overrides
// Called for the top level instance, this function hierarchically
// evaluates all symbols to be passed to child instances.
// It creates the table of evaluated override symbols and places them
// as the hash table "overrides" in the child instance.
// Note: this function can now be called repeatedly for added children
// as it now checks if child instances have already been evaluated.
////////////////////////////////////////////////////////////////////////
int     instance::evaluate_overrides(){
    int             status = 0;
    block*          child_prototype;// prototype block for child
    block_ref*child_ref;            // our reference to child
    string*         child_blk_name; // info from reference ...
    string*         child_name;
    arg_set*child_vals;
    arg_set*child_ports;
    expr_array*child_exprs;
    expr_hash*child_overrides;
    string*         param_name;
    int             i;
    int             dummy_index;
    expr*           dummy_expr;
    int             line_num;
    instance*child;
    // save current block context and set instance info in block
    push_context();
    // create a symbol table for each child
    for (i=0; i<child_instances.size(); i++){
        // only process child if not done before
        if ( !child_instances[i]->are_overrides_processed())
        {
            child_instances[i]->set_overrides_processed();
            child_prototype = child_instances[i]->prototype_ptr;
```

```
child_ref = child_refs[i];
if (child_ref != (block_ref*) NULL)
{
      // set context as child so error msgs get referred to child
      child_instances[i]->push_context();
      // get reference info for this child
      child_ref->get_block_info(&child_blk_name, &child_name,
                  &child_vals, &child_ports, &line_num);
      // For each child, create a hash table of override symbols
      // from the child values arg_set, provided it exists.
      // This hash table has unevaluated expressions, which
      // get evaluated by instance::compute_contents().
      //
      // If this arg_set is by name:
      // Just create hash table of names and their expressions.
      //
      // If this arg_set is by position:
      // Get each successive name from param table of the child
      // block prototype, and create a hash table entry with the
      // corresponding expression.
      //
      if (child_vals)
      {
                  if (child_vals->stored_by_name())
                  {
                  // arg_set has a hash table, so just point to it
                  child_overrides = child_vals->get_expr_hash();
                  // make sure all the names are child parameter names
                  child_overrides->iter_init();
                  while (child_overrides->next(&param_name,
                  &dummy_expr))
                  {
                  if (!child_prototype->look_up_param_name(
                  *param_name, &dummy_index))
                  {
                  if (*param_name == SUBR_PARAM_STR)
                  {
                  child_instances[i]->out_error("INS201",
                  cerr, TRUE);
```

```
cerr << "This block has no subroutine form "
 << "available.\n";
status = 1;
break;
}
else
{
child_instances[i]->out_error("INS001",
cerr, TRUE);
cerr << "This block has no parameter named '"
 << *param_name
 << "'.\n";
status = 1;
break;
}
}
}
}
else
{
// stored by position, so find names in prototype
// block create a fresh hash table, copy in entries
child_overrides = new expr_hash(SZ);
child_exprs = child_vals->get_expr_array();
for(int j=0; j<child_exprs->size(); j++)
{
// use expression from block reference and
// name from prototype parameter table
param_name = child_prototype->
param_name_at_index(j);
if (param_name == (string*) NULL)
{
child_instances[i]->out_error("INS002",
cerr, TRUE);
cerr << "This block has no parameter "
 << (j+1)
 << ".\n";
status = 1;
break;
```

```
                    }
                    child_overrides->add(*param_name,(*child_exprs)[j]);
                    }
                    }
                    if (status)
                    break;
                    // set this hash table as the override table for this child
                    child_instances[i]->set_overrides(child_overrides);
            }
            // restore our context
            child_instances[i]->pop_context();
        }
        // recursively call our children
        child = child_instances[i];
        if (child != (instance*) NULL)
            status |= child_instances[i]->evaluate_overrides();
    }}
  // restore previous block context
  pop_context();
  return status;}
////////////////////////////////////////////////////////////////////////
// instance::check_verify_expressions
// Check verify expression for our prototype, which must also have been
// set as the current block.
// Returns non-zero and outputs errors if any verify errors.
////////////////////////////////////////////////////////////////////////
int   instance::check_verify_expressions(){
      int            status = 0;
      int            i;
      expr*      e;
      int            n_verify;
      string*    failed_string;
      // check truth of any verify expressions
      if (n_verify = prototype_ptr->n_verify_expressions())
      {
          for (i=0; i<n_verify; i++)
          {
              e = prototype_ptr->get_verify_expression(i);
              // expression must have integer value of non-zero to be true
```

```
if (e->has_int_value())
{
    if (!int_value(e))
    {
            // if user has specified a failed msg, get it
            failed_string = prototype_ptr->get_verify_msg(i);
            // get negation of the error expression
            e = e->negate();

            // and output this negated expression
            out_error("INS003", cerr, TRUE);
            // if user has given a string with verify, output it
            if (failed_string)
            cerr << *failed_string << "\n";
            else
            // otherwise output negation of verify condition
            cerr << *e << "\n";
            // done with negate string
            delete e;
            status = 1;
    }
}
else
{
    // verify expression doesn't have integer value
    // if user has specified a failed msg, get it
    failed_string = prototype_ptr->get_verify_msg(i);
    out_error("INS004", cerr, TRUE);
    // if user has given a string with verify, output it
    if (failed_string)
            cerr << *failed_string << "\n";
    else
            // otherwise output no value msg
    cerr << "No value for '" << *e << "'.\n";
    status = 1;

}}
return status;}
//////////////////////////////////////////////////////////////////////
```

```
// instance::is_init()
// Test if this is an init block.
// Check prototype, too.
/////////////////////////////////////////////////////////////////////
BOOLEAN instance::is_init(){
    if (init)
        return TRUE;
    else if (prototype_ptr)
        return prototype_ptr->is_init();
    return FALSE;}
/////////////////////////////////////////////////////////////////////
// instance::check_asm_block
// If this is an asm block, get the # of instructions and
// the duration.
// Also, verify all operands.
// Outputs errors as necessary, returning non-zero if any error.
/////////////////////////////////////////////////////////////////////
int instance::check_asm_block(){
    int             status = 0;
    expr*       e;
    // if we are a leaf (ASM) block, get # of instructions
    if (prototype_ptr->is_leaf_block()){
        n_instruct_locs = ((asm_block*) prototype_ptr)->get_n_instructions();
        // if we are init, record # of init instr. separately
        if (is_init())
            n_init_instr_locs = n_instruct_locs;
        else if (prototype_ptr->is_phantom())
            // else if just phantom, record # instructions separately
            set_n_phantom_instr_locs(n_instruct_locs);
        // and set duration for asm block
        init_duration = 0;
        set_phantom_duration(0);
        e = ((asm_block*) prototype_ptr)->get_duration_expr();
        if (e->has_int_value())
        {
            duration = (int) int_value(e);
            // is phantom duration if block is phantom block
            if (is_init())
                init_duration = duration;
```

```
else if (prototype_ptr->is_phantom())
      set_phantom_duration(duration);
if (duration < 0)
{
      out_error("INS005", cerr, TRUE);
      cerr << "This instance has an illegal duration value of "
                  << duration << ".\n";
      status = 1;
}
// check if this is a subroutine call block and there is a
// subroutine available
if (prototype_ptr->is_subr_inst_made())
{
      block*      subr_block;
      int         subr_dur;
      // get expression for subroutine duration
      subr_block = prototype_ptr->get_subr_instance()->prototype();
      if (subr_block->is_leaf_block())
      {
                  e = ((asm_block*) subr_block)->get_duration_expr();
                  if (e->has_int_value())
                  {
                  subr_dur = (int) int_value(e);
                  duration += subr_dur;
                  if (subr_dur < 0)
                  {
                  out_error("INS096", cerr, TRUE);
                  cerr << "Subroutine body has an illegal duration"
                   << " value of "
                    << subr_dur<< ".\n";
                  status = 1;
                  }
                  }
                  else
                  {
                  out_error("INS097", cerr, TRUE);
                  cerr << "Subroutine body doesn't have a duration "
                   << "defined.\n";
                  status = 1;
```

```
                }
        }
        else
        {
                out_error("INS095", cerr, TRUE);
                cerr << "A subroutine body must be a primitive block.\n";
                status = 1;
        }
    }
  }
  else
  {
      out_error("INS006", cerr, TRUE);
      cerr << "This instance doesn't have a duration defined.\n";
      status = 1;
  }}
 return status;}
//////////////////////////////////////////////////////////////////////
// instance::compute_storage_sizes
// Compute size of storage for this instance.
// Includes any phantom storage, which is referred back to us from prototype.
// Outputs errors if storage sizes are now known and returns non-zero.
//////////////////////////////////////////////////////////////////////
int  instance::compute_storage_sizes(){
     int             status = 0;
     int             i;
     int             storage_entries;
     int             first_phantom;
     BOOLEANerr;
     expr*      e;
     int             entry_size;
     // evaluate expressions which allocate sizes for storage and IO
     storage_entries = prototype_ptr->storage_table_size();
     first_phantom = storage_entries - phantom_storage_table_size();
     // will make the storage size array
     storage_sizes.clear();
     for (i=0; i<storage_entries; i++){
          err = FALSE;
          e = prototype_ptr->storage_entry_size(i);
```

```
            if (prototype_ptr->is_storage_virtual(i))
                ;                   // ignore virtual storage
            else if (e->has_int_value())
            {
                entry_size = (int) int_value(e);
                if (entry_size > 0)
                {
                    storage_sizes[storage_sizes.size()] = entry_size;

                    // update tally of storage location allocation
                    n_storage_locs += entry_size;
                    // if in phantom storage range, tally it
                    if (i >= first_phantom)
                            add_n_phantom_stor_locs(entry_size);
                    // also save our own individual storage locs, not incl. childs
                    our_n_storage_locs = n_storage_locs;

                else
                    err = TRUE;
            }
            else
                err = TRUE;
            if (err)
            {
                prototype_ptr->storage_error("INS007", i, "Unknown vector size.");
                status = 1;
            }}
        return status;}
/////////////////////////////////////////////////////////////////////
// instance::compute_io_sizes
// Compute size of I/O for this instance.
// Outputs errors if I/O sizes are now known and returns non-zero.
/////////////////////////////////////////////////////////////////////
int     instance::compute_io_sizes(){
        int             status = 0;
        int             i;
        int             io_entries;
        BOOLEANerr;
        expr*       e;
```

```
    int               entry_size;
    string*     bad_entry_name;
    io_entries = prototype_ptr->io_table_size();
    // will make the io size array
    io_sizes.clear();
    for (i=0; i<io_entries; i++){
        err = FALSE;
        e = prototype_ptr->io_entry_size(i);
        if (e->has_int_value())
        {
            entry_size = (int) int_value(e);
            if (entry_size > 0)
                io_sizes[io_sizes.size()] = entry_size;
            else
                err = TRUE;
        }
        else
            err = TRUE;
        if (err)
        {
            bad_entry_name = prototype_ptr->io_name_at_index(i);
            out_error("INS008", cerr, FALSE);
            cerr << " Unknown vector size for the I/O called '"
                 << *bad_entry_name << "'\n";
            status = 1;
        }}
    return status;}
//////////////////////////////////////////////////////////////////////
// instance::compute_contents
// Called for the top level instance, this function computes location
// allocations and all other contents, instantiating all child blocks.
// It evaluates operands for asm blocks to make sure they are good.
// If errors, return non-zero.
//////////////////////////////////////////////////////////////////////
int   instance::compute_contents(){
    int               status = 0;
    int               i;
    instance*child;
    // save current block context and set instance info in block
```

```
push_context();
n_storage_locs = n_instruct_locs = n_init_instr_locs = duration =
init_duration = our_n_storage_locs = 0;
set_n_phantom_stor_locs(0);
set_n_phantom_instr_locs(0);
set_phantom_duration(0);
// evaluate expressions which allocate sizes for storage and IO
status |= compute_storage_sizes();
status |= compute_io_sizes();

// check truth of any verify expressions
status |= check_verify_expressions();
// check validity of asm block
if (!status) status |= check_asm_block();
if (!status){
        // call ourself for all our children, which adds to our loc counts
        for (i=0; i<child_instances.size(); i++)
        {
                child = child_instances[i];
                if (child != (instance*) NULL)
                        status |= child_instances[i]->compute_contents();
        }
        // add to our parent's tallies
        if (parent_instance)
        {
                parent_instance->n_storage_locs += n_storage_locs;
                parent_instance->add_n_phantom_stor_locs(get_n_phantom_stor_locs());
                parent_instance->n_instruct_locs += n_instruct_locs;
                parent_instance->
                        add_n_phantom_instr_locs(get_n_phantom_instr_locs());
                parent_instance->n_init_instr_locs += n_init_instr_locs;
                parent_instance->duration += duration;
                parent_instance->add_phantom_duration(get_phantom_duration());
                parent_instance->init_duration += init_duration;
        }}
// restore previous block context
pop_context();
return status;}
////////////////////////////////////////////////////////////////////////
```

```
// instance::compute_code_locations
// Called for the top level instance, this function computes actual
// starting locations to use for instructions in
// all child blocks.
// Also set the relative addresses of any labels in this block, if
// it is hierarchical.
// This is called in turn for each time zone, and only blocks which are
// in that time zone are used (unless timezone has the value of NO_TIME_ZONE,
// in which case everything is used).
// We must have been previously sequenced.
// Returns TRUE of this instance not skipped because it is in a different
// time zone.
////////////////////////////////////////////////////////////////////////
BOOLEAN instance::compute_code_locations(int& next_instr_base, zone* timezone){
    int             i;
    // ignore this block if its not in the desired time zone
    if (!is_zone_or_subzone_present(timezone) && timezone != NO_TIME_ZONE)
        return FALSE;
    // If we were called with NO_TIME_ZONE and we have multiple,
    // then we must compute code locations for each zone, in turn.
    // (unless we are a manual block, of course!)
    if ((timezone == NO_TIME_ZONE && how_many_zones()
        && !prototype()->is_manual_block()) && should_partition_design())
        for (i=0; i<the_zones->n_zones(); i++)
            do_compute_code_locations(next_instr_base, the_zones->get_zone(i));
    else
        do_compute_code_locations(next_instr_base, timezone);
    return TRUE;}
////////////////////////////////////////////////////////////////////////
// instance::do_compute_code_locations
// Guts of compute_code_locations for a time zone.
// This routine also sets the label offsets both for hierarchical and asm
// blocks.
////////////////////////////////////////////////////////////////////////
void instance::do_compute_code_locations(int& next_instr_base, zone* timezone){
    int             i, i_seq;
    int             rel_address;
    block*      child_proto;
    BOOLEANchild_computed;
```

```
BOOLEANuse_partitioned_seq = FALSE;
// save current block context and set instance info in block
push_context();
// set our base locations from the caller, unless we have an absolute org
if (instruction_base == NO_INSTR_BASE){
      if (!prototype_ptr->is_absolute())
            instruction_base = next_instr_base;
      else
            instruction_base = prototype_ptr->org();}
// if this is asm block, set label offsets from label sequence #s
if (prototype_ptr->is_leaf_block()){
      for (int j=0; j<prototype_ptr->label_table_size(); j++)
      {
            // make sure this label hasn't had offset set
            if (!prototype_ptr->label_offset_at_index(j))
            {
                  // Since our instructions are each one memory location,
                  // label sequence is simply relative address of label.
                  // Set label sequence as label offset.
                  rel_address = prototype_ptr->label_seq_at_index(j);
                  prototype_ptr->set_label_offset(j, rel_address);
            }
      }}
// Call ourself for all our children, which sets bases.
// if partitioned sequence available, use it
if (get_partitioned_size())
      use_partitioned_seq = TRUE;
for (i=0; i<child_instances.size(); i++){
      // use sequenced order (partitioned if available)
      if (use_partitioned_seq)
            i_seq = get_part_sequence(i);
      else
            i_seq = get_sequence(i);
      child_proto = child_instances[i_seq]->prototype();
      child_computed = child_instances[i_seq]->
                  compute_code_locations(next_instr_base, timezone);
      // If we have labels, then set their relative addresses.
      // Labels in hierarchical blocks are "attached" to the instance
      // which they directly preceed, so that if this instance is
```

```
        // reordered, the label moves with it.
        if (prototype_ptr->label_table_size() && child_computed)
        {
            // check if any label refers to this child index
            // Label sequence has child index. We now set the offset from
            // start of our block
            for (int j=0; j<prototype_ptr->label_table_size(); j++)
            {
                // make sure this label hasn't had offset set
                if (!prototype_ptr->label_offset_at_index(j))
                {
                        if (prototype_ptr->label_seq_at_index(j) == i_seq)
                        {
                        // compute relative addr of label from our start
                        rel_address = next_instr_base - instruction_base;
                        // set this as label offset
                        prototype_ptr->set_label_offset(j, rel_address);
                        }
                }
            }
        }
        // advance the next base location provide child was actually
        // computed
        if (!child_proto->is_absolute() && child_proto->is_leaf_block()
            && child_computed)
            next_instr_base += child_instances[i_seq]->n_instruct_locs;}
    // restore previous block context
    pop_context();}
////////////////////////////////////////////////////////////////////////
// instance::compute_data_locations
// Called for the top level instance, this function computes actual
// starting locations to use for data storage in
// all child blocks.
////////////////////////////////////////////////////////////////////////
void instance::compute_data_locations(int next_store_base){
    int             i, i_seq;
    BOOLEANuse_partitioned_seq = FALSE;
    // save current block context and set instance info in block
    push_context();
```

```
        storage_base = next_store_base;
        // advance past our own storage
        next_store_base += our_n_storage_locs;
        // if partitioned sequence available, use it
        if (get_partitioned_size())
            use_partitioned_seq = TRUE;
        // call ourself for all our children, which sets bases
        for (i=0; i<child_instances.size(); i++){
            // use sequenced order (partitioned if available)
            if (use_partitioned_seq)
                i_seq = get_part_sequence(i);
            else
                i_seq = get_sequence(i);
            child_instances[i_seq]->compute_data_locations(next_store_base);
            // advance the next base locations for suceeding children
            next_store_base += child_instances[i_seq]->n_storage_locs;}
        // restore previous block context
        pop_context();}
////////////////////////////////////////////////////////////////////
// instance::generate_code
// Called for an instance, this function outputs code
// for this block and all blocks beneath it.
// This is called in turn for each time zone, and only blocks which are
// in that time zone are output (unless timezone has the value of NO_TIME_ZONE,
// in which case everything is output).
////////////////////////////////////////////////////////////////////
int instance::generate_code(ostream& code_stream, zone* timezone){
        int             i;
        int             status = 0;
        // ignore this block if its not in the desired time zone
        if (!is_zone_or_subzone_present(timezone) && timezone != NO_TIME_ZONE)
            return status;
        // If we were called with NO_TIME_ZONE and we have multiple,
        // then we must compute code locations for each zone, in turn.
        // (unless we are a manual block, or partitioning suppressed, of course!)
        if ( (timezone == NO_TIME_ZONE && how_many_zones()
            && !prototype()->is_manual_block()) && should_partition_design())
            for (i=0; i<the_zones->n_zones(); i++)
            {
```

```
            if (!status)
                  status |= do_generate_code(code_stream, the_zones->get_zone(i));
      }
   else
      status |= do_generate_code(code_stream, timezone);
   return status;}
////////////////////////////////////////////////////////////////////
// instance::do_generate_code
// Guts of generate_code, called for each time zone.
////////////////////////////////////////////////////////////////////
int instance::do_generate_code(ostream& code_stream, zone* timezone){
   int               i, i_seq;
   hier_block*hier_ptr;
   int               status = 0;
   // save pointer to our prototype as a hier block pointer, if we need it
   hier_ptr = (hier_block*) prototype_ptr;

   // save current block context and set instance info in block
   push_context();
   // if this is an asm block, re-evaluate operands so we can output code
   if (prototype_ptr->is_leaf_block()){
      // evaluate operands for this block using the full hierarchy
      if (!status)
         status |= ((asm_block*) prototype_ptr)->eval_operands(TRUE);
      // output the assembly code
      if (!status)
         status |= ((asm_block*) cur_block)->out_asm(code_stream);
      check_ostream(code_stream);}
   if (!status){
      // call ourself for all our children
      for (i=0; i<get_partitioned_size(); i++)
      {
         // use partitioned sequenced order
         i_seq = get_part_sequence(i);
         status |= child_instances[i_seq]->
                        generate_code(code_stream, timezone);
         if (status)
            break;
      }}
```

```
	// restore previous block context
	pop_context();
	return status;}
//////////////////////////////////////////////////////////////////////
// instance::generate_data
// Called for an instance, this function outputs data initialization
// for this block and all blocks beneath it.
//////////////////////////////////////////////////////////////////////
int instance::generate_data(ostream& data_stream){
	int		i, i_seq;
	hier_block*hier_ptr;
	int		status = 0;
	// save pointer to our prototype as a hier block pointer, if we need it
	hier_ptr = (hier_block*) prototype_ptr;

	// save current block context and set instance info in block
	push_context();
	// output the storage info, which is done for any block type
	status |= cur_block->out_storage(data_stream);
	check_ostream(data_stream);
	if (!status){
		// call ourself for all our children
		for (i=0; i<get_partitioned_size(); i++)
		{
			// use partitioned sequenced order
			i_seq = get_part_sequence(i);
			status |= child_instances[i_seq]->generate_data(data_stream);
			if (status)
				break;
		}}
	// restore previous block context
	pop_context();
	return status;}
//////////////////////////////////////////////////////////////////////
// output_name_and_value
// Output a name and a value to the given output stream.
//////////////////////////////////////////////////////////////////////
void output_name_and_value(string* name, long value, ostream& out){
	int		pad_chars;
```

```
	int                 j;
	unsigned long trimmed_value;
	// compute # of space pad characters to make a fixed-length field
	pad_chars = MAX_HIER_NAME_SIZE - name->length() + 1;
	// output the hierarchical name, followed by spaces, and then the value
	out << *name;
	for (j=0; j<pad_chars; j++)
		out << " ";
	trimmed_value = value;
	trimmed_value = trimmed_value & 0xffff;
	out << form("%04lx\n", trimmed_value);
	check_ostream(out);}
/////////////////////////////////////////////////////////////////////
// output_name_value_and_type
// Output a name and a value to the given output stream.
/////////////////////////////////////////////////////////////////////
void output_name_value_and_type(string* name, long value, char type,
				BOOLEAN is_micro, ostream& out){
	int                 pad_chars;
	int                 j;
	unsigned long trimmed_value;
	char          micro_char;
	// set character for micro tag field
	if (is_micro)
		micro_char = MICRO_CHAR;
	else
		micro_char = ' ';
	// compute # of space pad characters to make a fixed-length field
	pad_chars = MAX_HIER_NAME_SIZE - name->length() + 1;
	// output the hierarchical name, followed by spaces, and then the value
	out << *name;
	for (j=0; j<pad_chars; j++)
		out << " ";
	trimmed_value = value;
	trimmed_value = trimmed_value & 0xffff;
	out << form("%04lx %c %c\n", trimmed_value, type,
					micro_char);
	check_ostream(out);}
/////////////////////////////////////////////////////////////////////
```

```
// output_name_value24_and_type
// Output a name, value (24 bit), and data type to the given output stream.
/////////////////////////////////////////////////////////////////////
void output_name_value24_and_type(string* name, long value, char type,
                                  ostream& out){
    int             pad_chars;
    int             j;
    unsigned long trimmed_value;
    // compute # of space pad characters to make a fixed-length field
    pad_chars = MAX_HIER_NAME_SIZE - name->length() + 1;
    // output the hierarchical name, followed by spaces, and then the value
    out << *name;
    for (j=0; j<pad_chars; j++)
        out << " ";
    trimmed_value = value;
    trimmed_value = trimmed_value & 0xffffff;
    out << form("%06lx %c\n", trimmed_value, type);}
/////////////////////////////////////////////////////////////////////
// output_name_value_and_zone
// Output a name, value, and zone to the given output stream.
/////////////////////////////////////////////////////////////////////
void output_name_value_and_zone(string* name, long value, zone* zone_ptr,
                        ostream& out){
    int             pad_chars;
    int             j;
    int             zone_num;
    unsigned long trimmed_value;
    zone_num = the_zones->find_zone(zone_ptr);
    // compute # of space pad characters to make a fixed-length field
    pad_chars = MAX_HIER_NAME_SIZE - name->length() + 1;
    // output the hierarchical name, followed by spaces, and then the value
    out << *name;
    for (j=0; j<pad_chars; j++)
        out << " ";
    trimmed_value = value;
    trimmed_value = trimmed_value & 0xffffff;
    out << form("%04lx", trimmed_value)
        << form(" %4x\n", zone_num);
    check_ostream(out);}
```

```
////////////////////////////////////////////////////////////////////////////////
// output_name_value_zone_and_type
// Output a name, value, zone, and data type to the given output stream.
////////////////////////////////////////////////////////////////////////////////
void output_name_value_zone_and_type(string* name, long value, zone* zone_ptr,
                         char type, BOOLEAN is_micro, ostream& out){
      int               pad_chars;
      int               j;
      int               zone_num;
      unsigned long trimmed_value;
      char        micro_char;
      zone_num = the_zones->find_zone(zone_ptr);
      // set character for micro tag field
      if (is_micro)
            micro_char = MICRO_CHAR;
      else
            micro_char = ' ';
      // if no trigger mask, just output name and value
      if (zone_num < 0)
            output_name_value_and_type(name, value, type, is_micro, out);
      else{
            // compute # of space pad characters to make a fixed-length field
            pad_chars = MAX_HIER_NAME_SIZE - name->length() + 1;
            // output the hierarchical name, followed by spaces, and then the value
            out << *name;
            for (j=0; j<pad_chars; j++)
                  out << " ";
            trimmed_value = value;
            trimmed_value = trimmed_value & 0xffffff;
            out << form("%04lx", trimmed_value)
                  << form(" %4x %c %c\n", zone_num, type, micro_char);}
      check_ostream(out);}
////////////////////////////////////////////////////////////////////////////////
// output_zone_record
// Output a name, value, zone, and data type to the given output stream.
////////////////////////////////////////////////////////////////////////////////
void output_zone_record(int zone_num, ostream& out){
      int               pad_chars;
      int               j;
```

```
long        mask;
int             decim;
zone*       zone_ptr;
string*     zone_name;
long        fifo_size;
zone_ptr = the_zones->get_zone(zone_num);
mask = the_zones->zone_mask(zone_ptr);
decim = the_zones->decimation(zone_ptr);
zone_name = the_zones->get_zone_name(zone_num);
// compute fifo size from zone repeat count
fifo_size = compute_fifo_size(zone_ptr->get_repeat_count());
// compute # of space pad characters to make a fixed-length field
pad_chars = MAX_HIER_NAME_SIZE - zone_name->length() + 1;
// output the name, followed by spaces, and then the value
out << form("%4x", zone_num);
out << " " << *zone_name;
for (j=0; j<pad_chars; j++)
      out << " ";
out   << form(" %04x %06lx %04lx\n", decim, mask, fifo_size);
check_ostream(out);}
//////////////////////////////////////////////////////////////////
// instance::output_storage_symbols
// Called for an instance, this function outputs storage symbols
// for this block and all blocks beneath it.
//////////////////////////////////////////////////////////////////
int instance::output_storage_symbols(ostream& out){
    int             i, i_seq;
    int             storage_entries;
    int             status = 0;
    string*     hier_name;
    string*     name;
    expr*       expr_ptr;
    int             reloc_type, reloc_level;
    long        value;
    zone*       zone_ptr;
    char*       type;
    BOOLEANis_micro;
    // save current block context and set instance info in block
    push_context();
```

```
storage_entries = prototype_ptr->storage_table_size();
for (i=0; i<storage_entries; i++){
        // find out if this is micro interface symbol
        is_micro = prototype_ptr->get_micro_var(i);
        // get name and hierarchical name string for this index
        name = prototype_ptr->storage_name_at_index(i);
        hier_name = prototype_ptr->hier_storage_name_at_index(i);
        // get data type for storage, based on any initial value
        type = prototype_ptr->get_storage_type(i);
        // get integer value of this name, which is storage location
        expr_ptr = prototype_ptr->translation(name);
        value = expr_ptr->int_value(&reloc_type, &reloc_level);
        // if this wire has a time zone, output zone info, too
        if ((zone_ptr = get_zone_for_wire(i)) != NO_TIME_ZONE)
                output_name_value_zone_and_type(hier_name, value, zone_ptr,
                        type, is_micro, out);
        else
                output_name_value_and_type(hier_name, value, type, is_micro, out);}
// call ourself for all our children
for (i=0; i<get_partitioned_size(); i++){
        // use partitioned sequenced order
        i_seq = get_part_sequence(i);
        child_instances[i_seq]->output_storage_symbols(out);}
// restore previous block context
pop_context();
return status;}
////////////////////////////////////////////////////////////////////////
// instance::output_io_symbols
// Called for an instance, this function outputs io symbols
// for this block and all blocks beneath it.
////////////////////////////////////////////////////////////////////////
int instance::output_io_symbols(ostream& out){
        int             i, i_seq;
        int             status = 0;
        string*         hier_name;
        string*         name;
        expr*           expr_ptr;
        int             reloc_type, reloc_level;
        long            value;
```

```
zone*       zone_ptr;
instance*inst;
int                 wire;
char        type;
BOOLEANis_micro;
BOOLEANis_storage;
instance*symbol_inst;
int                 storage_index;
string*     xlated_name;
// save current block context and set instance info in block
push_context();
for (i=0; i<prototype_ptr->io_table_size(); i++){
        // find out if this is micro interface symbol
        is_micro = prototype_ptr->get_micro_io(i);
        // get name and hierarchical name string for this index
        name = prototype_ptr->io_name_at_index(i);
        hier_name = prototype_ptr->hier_io_name_at_index(i);
        // get integer value of this name, which is storage location
        expr_ptr = prototype_ptr->translation(name);
        value = expr_ptr->int_value(&reloc_type, &reloc_level);
        // if this wire has a time zone, output zone info, too
        get_wire_for_io(i, 0, &inst, &wire);
        // get data type for storage, based on any initial value
        type = inst->prototype()->get_storage_type(wire);
        if ((zone_ptr = inst->get_zone_for_wire(wire)) != NO_TIME_ZONE)
                output_name_value_zone_and_type(hier_name, value, zone_ptr,
                        type, is_micro, out);
        else
                output_name_value_and_type(hier_name, value, type, is_micro, out);}
// now check the symbols for any which are storage "aliases",
// since SDI/SMI considers this section to be a storage alias section
// rather than an I/O section
for (i=0; i<prototype_ptr->param_table_size(); i++){
        is_storage = FALSE;
        // get name and hierarchical name string for this index
        name = prototype_ptr->param_name_at_index(i);
        hier_name = prototype_ptr->hier_param_name_at_index(i);
        // get value expression for this name
        expr_ptr = prototype_ptr->param_expr_at_index(i);
```

```
    if (translates_to_storage(name, &symbol_inst, &xlated_name))
    {
        if (symbol_inst->prototype()->
            look_up_storage_name(xlated_name, &storage_index))
        {
            is_storage = TRUE;
            // get expression for storage location in final instance
            expr_ptr = symbol_inst->prototype()->translation(xlated_name);
            // its a storage name, so get zone
            zone_ptr = symbol_inst->
                    get_zone_for_wire(storage_index);
            // get data type for storage
            type = symbol_inst->prototype()->
                    get_storage_type(storage_index);
            // find out if this is micro interface symbol
            is_micro = prototype()->get_micro_symbol(i);
        }
    }
    if (is_storage)
    {
        // set context to that of symbol so it can be evaluated
        symbol_inst->push_context();
        value = expr_ptr->int_value(&reloc_type, &reloc_level);
        symbol_inst->pop_context();
        // if this wire has a time zone, output zone info, too
        if (zone_ptr != NO_TIME_ZONE)
            output_name_value_zone_and_type(hier_name, value, zone_ptr,
                    type, is_micro, out);
        else
            output_name_value_and_type(hier_name, value, type,is_micro,
                    out);
    }}
// call ourself for all our children
for (i=0; i<get_partitioned_size(); i++){
    // use partitioned sequenced order
    i_seq = get_part_sequence(i);
    child_instances[i_seq]->output_io_symbols(out);}
// restore previous block context
pop_context();
```

```
        return status;}
//////////////////////////////////////////////////////////////////////
// instance::output_labels
// Called for an instance, this function outputs labels
// for this block and all blocks beneath it.
// This is called in turn for each time zone, and only blocks which are
// in that time zone are output (unless timezone has the value of NO_TIME_ZONE,
// in which case everything is output).
//////////////////////////////////////////////////////////////////////
int instance::output_labels(ostream& out, zone* timezone){
        int             i;
        int             status = 0;
        // ignore this block if its not in the desired time zone
        if (!is_zone_or_subzone_present(timezone) && timezone != NO_TIME_ZONE)
                return status;
        // If we were called with NO_TIME_ZONE and we have multiple,
        // then we must output labels for each zone, in turn.
        // (unless we are a manual block, or partitioning suppressed, of course!)
        if ( (timezone == NO_TIME_ZONE && how_many_zones()
                && !prototype()->is_manual_block()) && should_partition_design())
                for (i=0; i<the_zones->n_zones(); i++)
                {
                        if (!status)
                                status |= do_output_labels(out, the_zones->get_zone(i));
                }
        else
                status |= do_output_labels(out, timezone);
        return status;}
//////////////////////////////////////////////////////////////////////
// instance::do_output_labels
// Called for an instance, this function outputs labels
// for this block and all blocks beneath it.
//////////////////////////////////////////////////////////////////////
int instance::do_output_labels(ostream& out, zone* timezone){
        int             i, i_seq;
        int             status = 0;
        string*         hier_name;
        string*         name;
        long            value;
```

```
// save current block context and set instance info in block
push_context();
// output labels only if the block is not empty
if (get_n_instruct_locs()){
      if (!are_labels_output())
      {
            for (i=0; i<prototype_ptr->label_table_size(); i++)
            {
                  // get name and hierarchical name string for this index
                  name = prototype_ptr->label_name_at_index(i);
                  hier_name = prototype_ptr->hier_label_name_at_index(i);
                  // get address for this index
                  value = prototype_ptr->label_address(i);
                  // only output if there's a real address
                  if (value != NO_ADDRESS)
                              output_name_and_value(hier_name, value, out);

            set_labels_output();
      }
      // call ourself for all our children
      for (i=0; i<get_partitioned_size(); i++)
      {
            // use partitioned sequenced order
            i_seq = get_part_sequence(i);
            child_instances[i_seq]->output_labels(out, timezone);
      }}
// restore previous block context
pop_context();
return status;}
////////////////////////////////////////////////////////////////////
// instance::output_symbols
// Called for an instance, this function outputs symbols
// for this block and all blocks beneath it.
////////////////////////////////////////////////////////////////////
int instance::output_symbols(ostream& out){
      int         i, i_seq;
      int         status = 0;
      string*     hier_name;
      string*     name;
```

```
expr*       val;
long        int_val;
int              reloc_type, reloc_level;
char        data_type;
BOOLEANis_real;
instance*symbol_inst;
// save current block context and set instance info in block
push_context();
// get the block symbols
for (i=0; i<prototype_ptr->param_table_size(); i++){
        // get name and hierarchical name string for this index
        name = prototype_ptr->param_name_at_index(i);
        hier_name = prototype_ptr->hier_param_name_at_index(i);
        // get value expression for this name
        val = prototype_ptr->param_expr_at_index(i);
        // flag if it translates to storage, don't output
        if (!translates_to_storage(name, &symbol_inst, &name))
        {
                if (!eval_24_bit_value(val, &int_val, &reloc_type, &reloc_level,
                                &is_real))
                {
                        // if relocation type is "relative", then this is an address,
                        // so signal this with a hex data type
                        if (reloc_type == RELATIVE)
                                data_type = 'h';
                        else if (!is_real)
                                data_type = 'i';
                        else
                                data_type = 'f';
                        output_name_value24_and_type(hier_name, int_val,
                                data_type, out);
                }
        }}
// call ourself for all our children
for (i=0; i<get_partitioned_size(); i++){
        // use partitioned sequenced order
        i_seq = get_part_sequence(i);
        child_instances[i_seq]->output_symbols(out);}
// restore previous block context
```

```
    pop_context();
    return status;}
////////////////////////////////////////////////////////////////////////
// instance::translates_to_storage
// See if the given name can be (recursively) translated to storage.
// If yes, return TRUE and the storage name and instance context for
// this name in which the storage exists.
////////////////////////////////////////////////////////////////////////
BOOLEAN instance::translates_to_storage(string* name, instance** inst,
                        string** storage_name){
    int                 storage_index;
    int                 param_index;
    instance*path_inst;
    instance*symbol_inst;
    expr*       expr_ptr;
    // see if storage by this name exists here
    if (prototype()->look_up_storage_name(name, &storage_index)){
        *inst = this;
        *storage_name = name;
        return TRUE;}
    // otherwise try to get expression for name
    else if (prototype()->look_up_param_name(*name, &param_index)){
        expr_ptr = prototype()->param_expr_at_index(param_index);
        if (expr_ptr->eval_to_symbol(&name))
        {
            // it evaluates to a symbol, so see of xlation
            expr_ptr = prototype()->translate_with_instances(name, &path_inst,
                            &symbol_inst);
            if (expr_ptr != (expr*) NULL)
            {
                // get name with path stripped off
                symbol_inst = path_inst->get_instance_of_name(name, &name);
                if (symbol_inst != (instance*) NULL
                            && symbol_inst != this)
                {
                            // have new name in the context of a new instance
                            // so recursively translate to storage
                            return symbol_inst->translates_to_storage(name,
                            inst, storage_name);
```

```
                )
            }
        }}
    return FALSE;}
// instanc2.cxx
// instance class
// T. Montlick
// 11/30/89
/* source code control: */
static char SccsID[] = "@(#)instanc2.cxx1.56 10/7/91";
#ifndef INSTANCE_DEF
#include "instance.hxx"
#endif
//////////////////////////////////////////////////////////////////////////
// instance::connect_child_port
// Make sure our "name" is a valid signal for us to connect to port j
// of the given child instance and child prototype.
// Set the "wire_in_parent" for port j of this child to our wire or I/O.
// If any errors, output them and return nonzero.
//////////////////////////////////////////////////////////////////////////
int     instance::connect_child_port(string* name, int j, instance* child_instance,
                        block* child_prototype,int_array& n_outputs_to_wire,
                        int_array& n_outputs_to_output){
    int             status = 0;
    int             index;
    instance*another_inst;
    // child I/O can be connected to either our wire or one of our I/Os,
    // so see which it is
    if (prototype_ptr->look_up_io_name(name, &index)){
        // child I/O is connected to one of our I/Os
        // so set which of our I/Os in child
        child_instance->wire_in_parent[j] = index;
        child_instance->wire_really_io[j] = TRUE;

        // make sure vector sizes match
        if (io_sizes[index] != child_instance->io_sizes[j])
        {
            child_instance->out_error("INS009", cerr, TRUE);
            cerr << " You can't connect I/O '"
```

```
                << *name
                << "' of width "
                << io_sizes[index]
                << " to an I/O of width "
                << child_instance->io_sizes[j] << "\n";
            status = 1;
        }
        if (child_prototype->io_is_output(j))
        {
            // child I/O is an output
            // make sure it doesn't connect to our input
            if (!prototype_ptr->io_is_output(index))
            {
                child_instance->out_error("INS010", cerr, TRUE);
                cerr << "You can't connect the input '"
                        << *name
                        << "' to an output in the called block\n";
                status = 1;
            }
            else
            {
                // child output connects to one of our outputs
                // output can only have one output onto it
                n_outputs_to_output[index]++;
                if (n_outputs_to_output[index]>1)
                {
                        child_instance->out_error("INS011", cerr, TRUE);
                        cerr << "Output '"
                         << *name
                         << "' already has an output connected "
                         << "to it\n";
                        status = 1;
                }
            }
        }   }
    else if (prototype_ptr->look_up_storage_name(name, &index)){
        // it is connected to one of our wires, so set which in child
        child_instance->wire_in_parent[j] = index;
```

```
        // make sure vector sizes match
        if (storage_sizes[index] != child_instance->io_sizes[j])
        {
              child_instance->out_error("INS012", cerr, TRUE);
              cerr << " You can't connect wire '"
                    << *name
                    << "' of width "
                    << storage_sizes[index]
                    << " to an I/O of width "
                    << child_instance->io_sizes[j] << "\n";
              status = 1;
        }
        // if child I/O is an output, mark this in our wire
        if (child_prototype->io_is_output(j))
        {
              // wire can only have one output onto it
              n_outputs_to_wire[index]++;
              if (n_outputs_to_wire[index]>1)
              {
                    child_instance->out_error("INS013", cerr, TRUE);
                    cerr << "You are trying to connect more than one "
                                << "output to wire '"
                                << *name
                                << "'\n";
                    status = 1;
              }
        }}
else if (find_wire_name(name, &index, &another_inst)){
        // wire is actually in a higher level instance than our parent
        // so set this as the "bypass parent" instance
        child_instance->wire_in_parent[j] = index;
        child_instance->bypass_parent[j] = another_inst;
        // if not top level IO, make sure the user knows what he's done
        if (!another_inst->is_top_level())

              child_instance->out_warning("INS014", cerr, TRUE);
              cerr << " Do you know you connected to wire '"
                    << *name
                    << "' in the higher\n level instance '"
```

```
                << another_inst->instance_name
                << "'?\n";
        }}
    else{
        child_instance->out_error("INS015", cerr, TRUE);
        cerr << "You tried to connect '"
              << *name << "', which is not an I/O or wire name\n";
        status = 1;}
    return status;}
/////////////////////////////////////////////////////////////////////
// instance::wire_connections
// Create the connections between this instance and its child instances.
// Called for the top level block, this function recursively calls itself
// for all child blocks.
// Wiring info is established both for instances and blocks. Instances know
// about the connections to their parents, while hierarchical blocks know
// about the connections with their children.
// Outputs errors if mismatch in I/O sizes, or multiple outputs onto 1 wire,
// and returns non-zero.
/////////////////////////////////////////////////////////////////////
int   instance::wire_connections(){
    int             status = 0;
    block*      child_prototype;// prototype block for child
    block_ref*child_ref;        // our reference to child
    string*     child_blk_name; // info from reference ...
    string*     child_name;
    arg_set*child_vals;
    arg_set*child_ports;
    int             line_num;
    int             i;
    string*     name;
    instance*child_instance;
    expr*       our_name_expr;
    int             child_ports_size;
    int_arrayn_outputs_to_wire;// # outputs onto wire from our children
    int_arrayn_outputs_to_output;// # outputs onto I/O from our children

    // save current block context and set instance info in block
    push_context();
```

```
// create connections for each child
for (i=0; i<child_instances.size(); i++){
    child_prototype = child_instances[i]->prototype_ptr;
    child_instance = child_instances[i];
    child_ref = child_refs[i];
    if (child_ref != (block_ref*) NULL)
    {
        // get reference info for this child
        child_ref->get_block_info(&child_blk_name, &child_name, &child_vals,
                    &child_ports, &line_num);
        if (child_ports)
        {
            child_ports_size = child_ports->size();

            if (child_ports_size != child_prototype->io_table_size())
            {
                    child_instance->out_error("INS016", cerr, TRUE);
                    cerr << " You tried to call this block with "
                     << child_ports_size
                     << "I/O ports specified, but it has "
                     << child_prototype->io_table_size() << " I/O ports\n";
                    status = 1;
            }
            else
            {
                    for (int j=0; j<child_ports_size; j++)
                    {
                    if (child_ports->stored_by_name())
                    {
                    // stored by name, so look up child's name for I/O
                    name = child_prototype->io_name_at_index(j);

                    // now look up that name in our hash table
                    if (!child_ports->
                    expr_at_name(*name, &our_name_expr))
                    {
                    child_instance->out_error("INS017", cerr, TRUE);
                    cerr << "You haven't specified the I/O "
                     << "port named '"
```

```
<< *name << "'\n";
status = 1;
}
}
else
{
// just look up our name expr in stored-by-pos array
our_name_expr = child_ports->expr_at_position(j);
}
// we now have an expression which should evaluate to
// one of our wire or I/O names
if (!our_name_expr)
{
child_instance->out_error("INS018", cerr, TRUE);
cerr << " No I/O or wire name for port\n";
status = 1;
}
else if (!our_name_expr->eval_to_symbol(&name))
{
child_instance->out_error("INS019", cerr, TRUE);
cerr << "'"
<< *our_name_expr
<< "' is not one of our I/O or wire names\n";
status = 1;
}
else
// connect this I/O port of child
status |= connect_child_port(name, j,child_instance,
child_prototype, n_outputs_to_wire,
n_outputs_to_output);
}
        }
    }
}
// recursively call our children
status |= child_instances[i]->wire_connections();}
// make sure that all our outputs are connected to child outputs
if (child_instances.size()){
    for (i=0; i<prototype_ptr->io_table_size(); i++)
```

```
        {
            if (prototype_ptr->io_is_output(i))
            {
                // no connected output only legal if a non-autosequenced
                if (!n_outputs_to_output[i]
                        && prototype_ptr->is_autosequence())
                {
                        out_error("INS020", cerr, FALSE);
                        cerr << "There is no connection to the output "
                         << "port named '"
                          << *prototype_ptr->io_name_at_index(i)
                         << "'\n";
                        status = 1;
                }
            }
        }}
    // Have established connections between this instance and its child
    // instances, so we must now establish connections between our
    // prototype block and its child block refs, provided they have
    // not previously been determined.
    if (!prototype_ptr->is_leaf_block())
        make_prototype_connections();
    // mark this instance's child connections as set
    connections_set = TRUE;
    // restore previous block context
    pop_context();
    return status;}
///////////////////////////////////////////////////////////////////////////
// instance::make_prototype_connections
// Establish connections between our
// prototype block and its child block refs, provided they have
// not previously been determined.
///////////////////////////////////////////////////////////////////////////
void instance::make_prototype_connections(){
    hier_block*hier_ptr;
    block*      child_prototype;// prototype block for child
    int             i;
    instance*child_instance;
    int                 parent_wire;
```

```
int_arraywire_has_output;// TRUE if wire has output
int_arraywhich_output;// which output of child wire
int_arraywhich_block;// which child block outputs to wire
// save pointer to our prototype as a hier block pointer
hier_ptr = (hier_block*) prototype_ptr;

// do only if prototype not previously done
if (!hier_ptr->are_refs_connected()){
    // initialize array of which of our wires have outputs
    for (i=0; i<storage_sizes.size(); i++)
        wire_has_output[i] = FALSE;
    // find which children output to which of our wires
    for (i=0; i<child_instances.size(); i++)
    {
        child_prototype = child_instances[i]->prototype_ptr;
        child_instance = child_instances[i];
        for (int j=0; j<child_prototype->io_table_size(); j++)
        {
            // if this child I/O an output onto one of wires,
            // record for this wire what child and child I/O
            // this is
            if (child_prototype->io_is_output(j))
            {
                    parent_wire = child_instance->wire_in_parent[j];
                    // make sure its our wire, not our I/O
                    if (!child_instance->wire_really_io[j])
                    {
                    which_output[parent_wire] = j;
                    which_block[parent_wire] = i;
                    wire_has_output[parent_wire] = TRUE;
                    }
                    else
                    {
                    // output is I/O, so set connection between
                    // this child and the output of this block,
                    // which has special negative pseudo-block
                    // index
                    hier_ptr->add_connection(i, -1, parent_wire, j);
                    }
```

```
            }
        }
}
// now find which children input from our wires
for (i=0; i<child_instances.size(); i++)
{
    // only consider other children which have block references
    if (child_refs[i] != (block_ref*) NULL)
    {
        child_prototype = child_instances[i]->prototype_ptr;
        child_instance = child_instances[i];
        for (int j=0; j<child_prototype->io_table_size(); j++)
        {
                // if this child wire an input, add a connection
                // from the child output on the wire to this child input
                if (!child_prototype->io_is_output(j))
                {
                parent_wire = child_instance->wire_in_parent[j];
                // If our wire really I/O, add to the list of
                // input connections for this block; that is,
                // what child blocks and child block inputs are
                // at the front of this block.
                // HOWEVER: Just because this an input for our
                // child, do not assume it is an input for us!
                if (child_instance->wire_really_io[j])
                {
                if (!prototype_ptr->io_is_output(parent_wire))
                {
                hier_ptr->add_to_inputs(i, j);
                // tally # of inputs from this input
                hier_ptr->bump_input_use_count(parent_wire);
                }
                }
                else
                {
                // connects to our wire, so just add
                // connection from output block to this
                // block's input
                hier_ptr->add_connection( which_block[parent_wire],
```

```
                    i, j, which_output[parent_wire]);
                    // also tally # of inputs from this wire
                    hier_ptr->bump_wire_use_count(parent_wire);
                    }
                    }
            }
        }
}
// make sure all wires have at least one input and output
// skip if this is top level phantom block
if (parent())
{
        for (i=0; i<storage_sizes.size(); i++)
        {
            if (!wire_has_output[i])
            {
                    // skip warning if user-created phantom
                    // or if a variable, as opposed to a wire
                    if ( !phantom_name(*prototype_ptr->
                    storage_name_at_index(i)) )
                    if ( !prototype_ptr->is_a_variable(i) )
                    {
                    out_warning("INS021", cerr, FALSE);
                    cerr << "There is no signal to the wire named '"
                     << *prototype_ptr->storage_name_at_index(i)
                     << "'.\n";
                    }
            }
            if (!hier_ptr->get_wire_use_count(i))
            {
                    // skip warning if user-created phantom
                    // or if a variable, as opposed to a wire
                    if ( !phantom_name(*prototype_ptr->
                    storage_name_at_index(i)) )
                    if ( !prototype_ptr->is_a_variable(i) )
                    {
                    out_warning("INS022", cerr, FALSE);
                    cerr << "The signal from the wire named '"
                     << *prototype_ptr->storage_name_at_index(i)
```

```
                                << "' doesn't go anywhere.\n";
                                }
                        }
                }
        }}
    // we've connects the refs in the prototype, so remember this
    hier_ptr->set_refs_connected();}
/////////////////////////////////////////////////////////////////////
// instance::add_top_level_inputs
// Called for the top level block, this function scans its child block refs
// for input port blocks, and adds these to this block prototype's block
// inputs list. This is so that the top level block may be sequenced from
// its inputs just like any other block.
// Returns nonzero if block is input port and not at top level.
/////////////////////////////////////////////////////////////////////
int instance::add_top_level_inputs(){
    int             i;
    hier_block*hier_ptr;
    block*      blk_ptr;
    int             status = 0;
    // save pointer to our prototype as a hier block pointer
    hier_ptr = (hier_block*) prototype_ptr;

    for (i=0; i<get_n_children(); i++){
        // get pointer to child block prototype
        blk_ptr = hier_ptr->get_block_pointer(i);
        if (blk_ptr == NULL)
            blk_ptr = blk_ptr;
        // test if block is an input to the SPROC
        if (blk_ptr->is_sproc_input())
//          || (child_instances[i]->add_top_level_inputs()) )
        {
            status = 1;
            // add child block's input
            // to our list (input port # doesn't matter)
            hier_ptr->add_to_inputs(i, 0);
            // if top level, always return 0
            if (is_top_level())
                status = 0;
```

```
        }
        child_instances[i]->add_top_level_inputs();}
    return status;}
//////////////////////////////////////////////////////////////////////
// instance::get_addr_of_storage
// Given a storage index for this block, return the address of the actual
// storage which this should use.
//////////////////////////////////////////////////////////////////////
int instance::get_addr_of_storage(int index){
    int             address;
    string*     virtual_path;
    instance*path_inst;
    expr*       storage_expr;
    long        expr_value;
    int             reloc_type, reloc_level;
    BOOLEANis_real;

    // if address already computed, just return it
    if (address = storage_addresses[index])
        return address;
    if (prototype_ptr->is_storage_virtual(index)){
        // virtual storage, so get string for where to find it
        virtual_path = prototype_ptr->get_virt_storage_path(index, &path_inst);
        // path string is respect to path instance, so set as context
        path_inst->push_context();
        // translate string to an expression
        storage_expr = path_inst->prototype()->translation(virtual_path);
        // evaluate the expression from here
        eval_24_bit_value(storage_expr, &expr_value, &reloc_type,
                                &reloc_level, &is_real);
        path_inst->pop_context();
        address = (int) expr_value;}
    else{
        // for ordinary storage, just compute offset from base
        address = prototype_ptr->storage_offset_at_index(index);
        address += storage_base;}
    // newly computed address, so save for later reference
    storage_addresses[index] = address;
    return address;}
```

```
////////////////////////////////////////////////////////////////////
// instance::get_wire_for_io
// Given an I/O index for this block, return the instance and the wire in
// this instance that the I/O is actually connected to.
// Supports a phantom level for the given wire, supplying the particular
// phantom wire requested.
// Also supports a parent bypass instance for phantom blocks which need
// access to any wire in an ancestor.
// Returns FALSE as the value of the function if we ran out of ancestors.
////////////////////////////////////////////////////////////////////
BOOLEAN instance::get_wire_for_io(int index, int phantom_level,
                                  instance** which_instance, int* which_wire){
    int             parent_index;
    // get which wire this is in our parent, which may actually be an I/O
    parent_index = wire_in_parent[index];
    // test for a parent bypass (instance given directly)
    if (bypass_parent[index]){
        // have been given instance that wire is in, so return info
        // first translate the index into the wire appropriate for this level
        // of phantom wire
        *which_instance = bypass_parent[index];
        *which_wire =
            bypass_parent[index]->get_phantom(parent_index, phantom_level);}
    // if it's really a parent I/O, then call us for parent
    else if (wire_really_io[index]){
        if (parent_instance)
            return parent_instance->get_wire_for_io(parent_index, phantom_level,
                                                    which_instance, which_wire);
        else
            return FALSE;}
    else{
        // really a wire, so return its info
        // first translate the index into the wire appropriate for this level
        // of phantom wire
        *which_instance = parent_instance;
        *which_wire = parent_instance->get_phantom(parent_index, phantom_level);}
    return TRUE;}
////////////////////////////////////////////////////////////////////
// instance::get_io_for_wire
```

```
// Inverse of "get_wire_for_io".
// Given an instance and a wire in that instance, return the I/O index in the
// current instance which points to this wire.
// Returns FALSE as the value of the function if could not find.
//////////////////////////////////////////////////////////////////////
BOOLEAN instance::get_io_for_wire(instance* which_instance, int which_wire,
                                  int* io_index){
        int             n_ios;
        int             i;
        instance*test_instance;
        int             test_wire;
        // scan each I/O, seeing if it matches the wire
        n_ios = prototype_ptr->io_table_size();
        for (i=0; i<n_ios; i++){
                get_wire_for_io(i, 0, &test_instance, &test_wire);
                if (test_instance == which_instance && test_wire == which_wire){
                        *io_index = i;
                        return TRUE;}}
        return FALSE;}
//////////////////////////////////////////////////////////////////////
// instance::find_wire_name
// Find the given wire by name in one of our ancestors.
// Returns the index in ancestor, plus a pointer to the ancestor instance.
// This is used to create a bypass to an arbitrary ancestor wire, not
// using the ordinary I/O mechanism. Used for phantom blocks which need
// I/O from arbitrary wires.
// Returns FALSE as the value of the function if could not find the name.
//////////////////////////////////////////////////////////////////////
BOOLEAN instance::find_wire_name(string* name, int* which_wire,
                                          instance** which_inst){
        int             index;
        instance*parent_ptr;
        if (parent_ptr = parent_instance){
                if (parent_ptr->prototype_ptr->look_up_storage_name(name, &index)){
                        // found storage in parent
                        *which_wire = index;
                        *which_inst = parent_ptr;
                        return TRUE;{
```

```
    else if (parent_ptr = parent_instance){
        if (parent_ptr->prototype_ptr->look_up_storage_name(name, &index))
        {
            // found storage in parent
            *which_wire = index;
            *which_inst = parent_ptr;
            return TRUE;
        }
        else
        {
            // try parent's parent, etc.
            return parent_ptr->find_wire_name(name, which_wire, which_inst);
        }}
    else
        return FALSE;// no parent, so can't find}
//////////////////////////////////////////////////////////////////////
// instance::get_addr_of_io
// Given an I/O index for this block, return the address of the actual
// storage which this I/O should use.
//////////////////////////////////////////////////////////////////////
int instance::get_addr_of_io(int index){
    instance*which_instance;
    int          which_wire;
    int          address = 0;
    int          phantom_level;
    // get phantom level recorded for this I/O
    phantom_level = get_phantom_io_level(index);
    // get wire for this I/O, at the given phantom level
    if (!get_wire_for_io(index, phantom_level, &which_instance, &which_wire)){
        out_error("INS024", cerr, FALSE);
        cerr << "The top level block can't have any I/O declared for it!\n";
        return 0;}
    else
        address = which_instance->get_addr_of_storage(which_wire);
    return address;}
//////////////////////////////////////////////////////////////////////
// instance::get_addr_of_label
// Given a label index for this block, return the address
// which this should use.
```

```
////////////////////////////////////////////////////////////////////////////
int instance::get_addr_of_label(int index){
      int          address;

      address = prototype_ptr->label_offset_at_index(index);
      // if rel address is really a signal that there's no address, leave alone!
      if (address != NO_ADDRESS)
            address += instruction_base;// else add our base to form abs. addr.
      return address;}
////////////////////////////////////////////////////////////////////////////
// hier_name_string()
// Returns a string for the hierarchical name.
////////////////////////////////////////////////////////////////////////////
string*instance::hier_name_string(){
      char         name[MAX_HIER_NAME_SIZE];
      // init name array to nulls, so chars we stream in will have
      // a null delimiter
      for (int i=0; i<MAX_HIER_NAME_SIZE; i++)
            name[i] = '\0';
      // create an output stream which uses our character array
      ostreamname_stream(MAX_HIER_NAME_SIZE, name);

      // stream our hierarchical name into our array
      name_stream << *this;
      // create a new string from this
      return (new string(name));}
// instanc3.cxx
// instance class
// T. Montlick
// 11/30/89
/* source code control: */
static char SccsID[] = "@(#)instanc3.cxx1.56 10/7/91";
#ifndef INSTANCE_DEF
#include "instance.hxx"
#endif
#undef DEBUG
////////////////////////////////////////////////////////////////////////////
// get_instance_of_name()
// Treating the name string as a pathname in the hierarchy from where we are,
```

```
// Get a pointer to the instance which this name would be in.
// Returns NULL if no such instance.
///////////////////////////////////////////////////////////////////////
instance*instance::get_instance_of_name(string* name, string** remainder){
    char*       start_ptr;
    char*       end_ptr;
    instance*current_inst;
    char        inst_name[MAX_HIER_NAME_SIZE];
    int             i;
    BOOLEANfound_the_name;
    int             n_chars;
    current_inst = this;
    start_ptr = &name->operator[](0);
    while (current_inst){
        // search for the next "." in the name string
        if (end_ptr = strpbrk(start_ptr, "."))
        {
            // there is an instance name between start_ptr and end_ptr
            // copy it into our character array
            n_chars = end_ptr - start_ptr;
            // limit name to max size
            if (n_chars > MAX_HIER_NAME_SIZE)
                n_chars = MAX_HIER_NAME_SIZE;
            strncpy(inst_name, start_ptr, n_chars);

            // don't forget terminal null
            inst_name[n_chars] = '\0';
            // look for a child instance with this name
            found_the_name = FALSE;
            for (i=0; i<current_inst->child_instances.size(); i++)
            {
                if (current_inst->child_instances[i]->instance_name
                        == inst_name)
                {
                        current_inst = current_inst->child_instances[i];
                        found_the_name = TRUE;
                        break;
                }
            }
```

```
            // if we didn't find the name, no current instance so get out
            if (!found_the_name)
                current_inst = NULL;
            // advance place in hierarchical name past the next "."
            start_ptr = end_ptr + 1;
        }
        else
            break;
    }
    if (current_inst){
        // there should be no hierarchy left
        // if there is, then we haven't got the instance
        if (strpbrk(start_ptr, "."))
            current_inst = NULL;
        else
        {
            // create the remainder name string and return it
            strcpy(inst_name, start_ptr);
            *remainder = new string(inst_name);
        }}
    return current_inst;}
//////////////////////////////////////////////////////////////////////
// out_error()
// Output the error line for this instance.
// If parent is true, output message referenced to parent file, else
// output message referenced to our file.
// Returns TRUE if OK to output rest of error msg.
//////////////////////////////////////////////////////////////////////
void instance::out_error(char* msg_code, ostream& e, BOOLEAN parent){
    if (!check_error_count())
            // will exit here if too many errors
    e   << ERR_STRING << msg_code << " ";
    if (parent && !is_top_level()){
        if (no_file_info)
            e   << "Instance '" << *this << "' contained in block '"
                << *parent_instance->prototype_ptr->get_block_name()
                << "'";
        else
            e   << "Instance '" << *this << "' called from '"
```

```
                << *parent_instance->prototype_ptr->get_block_name()
                << "' in '" << *parent_instance->prototype_ptr->get_filename()
                << "', line " << line_num;}
    else{
        if (no_file_info)
            e       << "Instance '" << *this << "' contained in block '"
                    << *prototype_ptr->get_block_name()
                    << "'";
        else
        {
            e       << "Instance '" << *this << "' of block '"
                    << *prototype_ptr->get_block_name()
                    << "' in '" << *prototype_ptr->get_filename() << "'";
            // if caller set "instr_line", use this
            if (instr_line)
                e           << ", line " << instr_line;
        }}
    e       << ERR_DELIM;}
//////////////////////////////////////////////////////////////////////////////
// out_warning()
// Same as out_error, but displays a warning and does not return a value.
//////////////////////////////////////////////////////////////////////////////
void instance::out_warning(char* msg_code, ostream& e, BOOLEAN parent){
    e       << WARN_STRING << msg_code << " ";
    if (parent && !is_top_level()){
        if (no_file_info)
            e       << "Instance '" << *this << "' contained in block '"
                    << *parent_instance->prototype_ptr->get_block_name()
                    << "'";
        else
            e       << "Instance '" << *this << "' called from '"
                    << *parent_instance->prototype_ptr->get_block_name()
                    << "' in '" << *parent_instance->prototype_ptr->get_filename()
                    << "', line " << line_num;}
    else{
        if (no_file_info)
            e       << "Instance '" << *this << "' contained in block '"
                    << *prototype_ptr->get_block_name()
                    << "'";
```

```
        else
        {
                e       << "Instance '" << *this << "' of block '"
                        << *prototype_ptr->get_block_name()
                        << "' in '" << *prototype_ptr->get_filename() << "'";
                // if caller set "instr_line", use this
                if (instr_line)
                        e               << ", line " << instr_line;
        }}
    e       << ERR_DELIM;}
////////////////////////////////////////////////////////////////////
// operator<<
// Output the instance name hierarchically.
////////////////////////////////////////////////////////////////////
ostream& operator<<(ostream& s, instance& i){
    if (i.parent_instance){
        // call our parent, so its output comes first
        // but suppress top-level parent instance, 'cause its redundent
        if (!i.parent_instance->is_top_level())
        {
            s << *(i.parent_instance);

            // output a dot as a separator
            s << ".";
        }}
    // after output of any parents, output our name
    return s << i.instance_name;}
////////////////////////////////////////////////////////////////////
// is_top_level()
// Returns TRUE if this is a top level instance.
////////////////////////////////////////////////////////////////////
BOOLEAN instance::is_top_level(){
    // Either very top (phantom top level) or 2nd from top (user top level)
    // is considered a top level instance.
    if (parent_instance){
        if (parent_instance->parent_instance)
            return FALSE;}
    return TRUE;}
```

```
////////////////////////////////////////////////////////////////////
// instance::copy_in_sequence
// Called for the top level instance, this function copies into each
// instance the block sequence generated by the block prototype.
// Our prototype block must have been previously sequenced.
////////////////////////////////////////////////////////////////////
int instance::copy_in_sequence(){
	int		i;
	hier_block*hier_ptr;
	// save pointer to our prototype as a hier block pointer, if we need it
	hier_ptr = (hier_block*) prototype_ptr;

	// call ourself for all our children, which sets bases
	for (i=0; i<child_instances.size(); i++){
		// copy sequence from prototype
		sequence[i] = hier_ptr->sequenced_child(i);
		// call for our child
		child_instances[i]->copy_in_sequence();}
	return 0;}
////////////////////////////////////////////////////////////////////
// set_zone_for_wire
// Set the given wire as existing within a particular timezone.
// Also, duplicate any timezone for the wire to all its phantoms.
////////////////////////////////////////////////////////////////////
void instance::set_zone_for_wire(int index, zone* timezone){
	int		wire_levels;
	int		i;
#ifdef DEBUG
	string*	wire_name;
	wire_name = this->prototype()->hier_storage_name_at_index(index);
	cerr << "setting wire "
		<< *wire_name << " to zone "
		<< *timezone->get_zone_name() << "\n";
#endif
	wire_levels = get_phantom_wire_level(index) + 1;
	for (i=0; i<wire_levels; i++)
		zone_for_wire[get_phantom(index, i)] = timezone;
}
////////////////////////////////////////////////////////////////////
```

```
// set_wire_zones
// Called for a sequenced block which has zones set for its input wires,
// this function sets the zones for all output wires.
// NOTE: the top level I/O wire zones got set from zones::identify_zones().
// It calls itself recursively to set the wire zones
// for all children.
// Included is processing of a rate change block, which creates a new
// upsampled or downsampled sub-zone.
// Returns FALSE if error.
///////////////////////////////////////////////////////////////////
BOOLEAN instance::set_wire_zones(){
	int			i, i_seq, j, k;
	hier_block*hier_ptr;
	BOOLEANstatus = TRUE;
	instance*wire_inst;
	int			wire;
	zone*			zone_ptr;
	zone*			new_zone_ptr;
	int			storage_entries;
	// save pointer to our prototype as a hier block pointer, if we need it
	hier_ptr = (hier_block*) prototype_ptr;

	// save current block context and set instance info in block
	push_context();
	// if this is an asm block, find a zone for an input wire
	// and set zones for outputs
	if (prototype_ptr->is_leaf_block()){
		zone_ptr = NO_TIME_ZONE;
		// scan all inputs to get zones
		for (j=0; j<prototype_ptr->io_table_size(); j++)
		{
			if (!prototype_ptr->io_is_output(j))

				if (!get_wire_for_io(j, 0, &wire_inst, &wire))
				{
					out_error("INS903", cerr, TRUE);
					cerr << "INTERNAL ERROR -- No wire for input in "
					 << "set_wire_zones.\n";
					status = FALSE;
```

```
                break;
            }
            // get zone for input
            // All inputs must be in compatible zones, but they
            // all may not be in the same zone. Take the latest
            // of the input zones as the zone to label for outputs.
            // This assures that output wire value is generated only
            // when we have reached this timezone.
            new_zone_ptr = wire_inst->get_zone_for_wire(wire);
            if (new_zone_ptr != NO_TIME_ZONE)
            {
                    if (zone_ptr == NO_TIME_ZONE)
                    zone_ptr = new_zone_ptr;
                    else
                    {
                    // got a different zone, so save latest
                    if (the_zones->later_zone(new_zone_ptr, zone_ptr))
                    zone_ptr = new_zone_ptr;
                    }
            }
        }
}
if (status)
{
        if (zone_ptr == NO_TIME_ZONE)
        {
            // No zone for input, so this instance should
            // already have a zone if it is an input instance.
            // If zone present in instance, than get it and use it.
            if (single_zoned())
                    zone_ptr = get_zone(0);
        }
        if (zone_ptr != NO_TIME_ZONE)
        {
            // Check if instance of a rate change block,
            // in which case we must create a new timezone.
            // This zone is the one to use for output wires
            if (prototype_ptr->is_rate_change_block())
                    status = set_new_output_zone(zone_ptr, &zone_ptr);
```

```
}
if (zone_ptr != NO_TIME_ZONE)
{
      // scan all outputs and set the zone
      // for their wires
      for (k=0; k<prototype_ptr->io_table_size(); k++)
      {
                  if (prototype_ptr->io_is_output(k))
                  {
                  if (!get_wire_for_io(k, 0, &wire_inst, &wire))
                  {
                  out_error("INS904", cerr, TRUE);
                  cerr << "INTERNAL ERROR -- No wire for output"
                   << " in set_wire_zones.\n";
                  status = FALSE;
                  break;
                  }
                  wire_inst->set_zone_for_wire(wire, zone_ptr);
                  }
      }
      // also scan all wires in this block and set their zone
      storage_entries = prototype_ptr->storage_table_size();
      for (k=0; k<storage_entries; k++)
                  set_zone_for_wire(k, zone_ptr);
}
else
{
      // error unless this is phantom block, which need not be in
      // a zone
      // virtual I/O will get set later when we set instance zones
      if (!prototype_ptr->is_phantom() &&
                  !prototype_ptr->is_block_virtual_io() )
      {
                  out_warning("INS025", cerr, TRUE);
                  cerr << "Unable to determine a timezone for I/O"
                   << " in this block.\n";
      }
}
}}
```

```
    if (status){
        // call ourself for all our children
        for (i=0; i<child_instances.size(); i++)
        {
            // use sequenced order
            i_seq = sequence[i];

            status = child_instances[i_seq]->set_wire_zones();
            if (!status)
                break;
        }}
    // restore previous block context
    pop_context();
    return status;}
////////////////////////////////////////////////////////////////////////
// set_new_output_zone
// A rate change block instance has been encountered in the process of
// setting wire zones, so create a new time sub-zone.
// Passed the zone for the inputs to the block, and returns the
// newly created zone for the outputs from the block.
// Returns FALSE if error.
////////////////////////////////////////////////////////////////////////
BOOLEAN instance::set_new_output_zone(zone* in_zone, zone** out_zone_ptr){
    expr*       ratio_expr_ptr;
    long        ratio;
    BOOLEANstatus = TRUE;
    BOOLEANdecimating;
    zone*       new_zone_ptr;
    // evaluate the rate change factor
    ratio_expr_ptr = prototype_ptr->get_change_ratio();
    decimating = prototype_ptr->is_decimating();
    if (ratio_expr_ptr->has_int_value()){
        ratio = int_value(ratio_expr_ptr);
        if (ratio <= 0)
        {
            out_error("INS031", cerr, TRUE);
            cerr << "Illegal decimation/interpolation ratio of "
                << ratio << ".\n";
            status = FALSE;
```

```
        }}
    else{
        out_error("INS032", cerr, TRUE);
        cerr << "Decimation/interpolation ratio expression "
            << *ratio_expr_ptr << " not an integer.\n";
        status = FALSE;}
    // ask the zones class the create the time sub-zone
    if (status){
        new_zone_ptr = the_zones->
            make_sub_zone(in_zone, ratio, decimating);
        // make sure it was successful
        if (new_zone_ptr != NO_TIME_ZONE)
            *out_zone_ptr = new_zone_ptr;
        else
            status = FALSE;}
    // if error, return no time zone just to be safe
    if (!status)
        *out_zone_ptr = NO_TIME_ZONE;
    return status;}
///////////////////////////////////////////////////////////////////
// set_virtual_io
// Called after blocks have been connected, this function detects any
// virtual blocks and sets the wires connected to them as virtual storage.
// It calls itself recursively for all children.
// Returns non-zero if error.
///////////////////////////////////////////////////////////////////
int instance::set_virtual_io(){
    int             i;
    hier_block*hier_ptr;
    int             status = 0;
    expr*       expr_ptr;
    string*     path;
    instance*wire_inst;
    int             wire;
    instance*path_inst;
    instance*symbol_inst;
    // save pointer to our prototype as a hier block pointer, if we need it
    hier_ptr = (hier_block*) prototype_ptr;
```

```
// save current block context and set instance info in block
push_context();
if (prototype_ptr->is_block_virtual_io()){
    // block is virtual, so get translation for "connect", which is the
    // path for the true location of the virtual storage
    string connect_name(CONNECT);
    if (expr_ptr = prototype_ptr->translate_to_param_val(&connect_name))
    {
        // translated name, so see if it results in a string
        if (expr_ptr->eval_to_symbol(&path))
        {
            // now have actual storage name as path from somewhere above
            // get translation of this path, which will supply the
            // instance for the top of the path
            if (prototype_ptr->translate_with_instances(path,
                        &path_inst, &symbol_inst))
            {
                    // set the block for the instance at the top of the
                    // path as indivisible, since virtual I/O must be in
                    // same zone and segment as its physical location
                    path_inst->prototype()->set_as_indivisible();
                    for (i=0; i<prototype_ptr->io_table_size(); i++)
                    {
                    if (!get_wire_for_io(i, 0, &wire_inst, &wire))
                    {
                    out_error("INS905", cerr, TRUE);
                    cerr << "INTERNAL ERROR -- No wire"
                     << " in set_virtual_io.\n";
                    status = 1;
                    break;
                    }
                    else
                    {
                    // set storage as virtual in prototype
                    wire_inst->prototype()->
                    set_virtual_storage(wire, path, path_inst);
                    }
                    }
            }
```

```
                else
                {
                        // no translation for path from here
                        out_error("INS026", cerr, TRUE);
                        cerr << "Virtual I/O location '"
                         << *path
                         << "' doesn't make sense here.\n";
                        status = 1;
                }
            }
            else
            {
                out_error("INS027", cerr, TRUE);
                cerr << "Virtual connection parameter is not a string.\n";
                status = 1;
            }
        }
        else
        {
            out_error("INS028", cerr, TRUE);
            cerr << "Can't find virtual connection parameter with the"
                    << " required name of '"
                    << CONNECT <<"'.\n";
            status = 1;
        }}
    if (!status){
        // call ourself for all our children
        for (i=0; i<child_instances.size(); i++)
        {
            status = child_instances[i]->set_virtual_io();
            if (status)
                break;
        }}
    // restore previous block context
    pop_context();
    return status;
}
////////////////////////////////////////////////////////////////////////
// set_pseudo_sampled_init
```

```
// Called after blocks have been connected, this function looks for any
// pseudo-sampled outputs, which have initialization values, and
// sets these init values for the wires they connect to.
// It calls itself recursively for all children.
// Returns non-zero if error.
////////////////////////////////////////////////////////////////////
int instance::set_pseudo_sampled_init(){
    int             i;
    hier_block*hier_ptr;
    int             status = 0;
    expr*       expr_ptr;
    instance*wire_inst;
    int             wire;
    string*     storage_name;
    string*     path_string;
    instance*path_inst;
    // save pointer to our prototype as a hier block pointer, if we need it
    hier_ptr = (hier_block*) prototype_ptr;
    // save current block context and set instance info in block
    push_context();
    for (i=0; i<prototype_ptr->io_table_size(); i++){
        if (expr_ptr = prototype_ptr->get_io_init_value(i))
        {
            // have non-null expression for i/o init value
            if (!get_wire_for_io(i, 0, &wire_inst, &wire))
            {
                out_error("INS906",cerr, TRUE);
                cerr << "INTERNAL ERROR -- No wire"
                        << " in set_pseudo_sampled_init.\n";
                status = 1;
                break;
            }
            // set the init expression for the connected wire
            // but make sure we use real, not virtual wire!
            // so first get full path for real wire if this wire is virtual
            if (wire_inst->prototype()->is_storage_virtual(wire))
            {
                path_string = wire_inst->prototype()->
                        get_virt_storage_path(wire, &path_inst);
```

```
                // next, get the instance which this path refers to
                wire_inst = path_inst->get_instance_of_name(path_string,
                        &storage_name);
                // finally, look up the wire name in the instance's prototype
                wire_inst->prototype()->
                        look_up_storage_name(storage_name, &wire);
            }
            // set the overide expression
            wire_inst->set_storage_override_init(wire, expr_ptr);
        }}
    if (!status){
        // call ourself for all our children
        for (i=0; i<child_instances.size(); i++)
        {
            status = child_instances[i]->set_pseudo_sampled_init();
            if (status)
                break;
        }}
    // restore previous block context
    pop_context();
    return status;
}
//////////////////////////////////////////////////////////////////////
// inherit_wire_zone_from_parent
// This is a virtual I/O block, so inherit zone from parent.
// Get parent zone and set all i/o wires to this zone.
// Returns FALSE if error.
//////////////////////////////////////////////////////////////////////
BOOLEAN instance::inherit_wire_zone_from_parent(){
    int             j;
    instance*wire_inst;
    int             wire;
    zone*       zone_ptr;
    for (j=0; j<prototype_ptr->io_table_size(); j++){
        if (!get_wire_for_io(j, 0, &wire_inst, &wire))
        {
            out_error("INS907", cerr, TRUE);
            cerr << "INTERNAL ERROR -- No wire for input in "
                << "inherit_wire_zone_from_parent.\n";
```

```
            return FALSE;
        }
        zone_ptr = parent()->get_zone(0);
        wire_inst->set_zone_for_wire(wire, zone_ptr);}
    return TRUE;}
//////////////////////////////////////////////////////////////////////////
// set_zone_from_io
// Given a wire i/o number for this instance, look up the zone for the wire
// and it this zone to the instance.
// Returns any new zone found, plus updates the count of time zones
// for the instance.
// Returns FALSE if error.
//////////////////////////////////////////////////////////////////////////
BOOLEAN instance::set_zone_from_io(int io_number, zone** zone_ptr_ptr,
                        zone* last_zone_ptr, int* n_time_zones_ptr){
    instance*wire_inst;
    int         wire;
    zone*       zone_ptr;
    block*      wire_block;
    int         i;
    if (!get_wire_for_io(io_number, 0, &wire_inst, &wire)){
        out_error("INS908", cerr, TRUE);
        cerr << "INTERNAL ERROR -- No wire for input in "
            << "set_zone_from_io.\n";
        return FALSE;}
    zone_ptr = wire_inst->get_zone_for_wire(wire);
    if (zone_ptr == NO_TIME_ZONE){
        // error unless this is phantom block, which need not be in
        // a zone
        if (!prototype_ptr->is_phantom())
        {
            out_error("INS029", cerr, TRUE);
            cerr << "Wire '"
                << *wire_inst->prototype()->storage_name_at_index(wire)
                << "' goes to the first block of your design and "
                << "therefore\n must be connected to a "
                << "signal source.\n";
            return FALSE;
        }}
```

```
    if (last_zone_ptr == NO_TIME_ZONE){
        last_zone_ptr = zone_ptr;
        (*n_time_zones_ptr)++;
#ifdef DEBUG
            cerr << "adding zone "
                << *zone_ptr->get_zone_name()
                << " to instance "
                << *this->hier_name_string() << "\n";
#endif
        // record zone in this instance
        add_zone(zone_ptr);}
    else if (last_zone_ptr != zone_ptr){
        (*n_time_zones_ptr)++;
#ifdef DEBUG
            cerr << "adding zone "
                << *zone_ptr->get_zone_name()
                << " to instance "
                << *this->hier_name_string() << "\n";
#endif
        // record zone in instance
        add_zone(zone_ptr);
        // Multiple zones for indivisible block is illegal
        // unless the zones are really on exactly the same clock
        // due to a combination of decimation and interpolation.
        if ( prototype_ptr->is_indivisible_block())
        {
            if (the_zones->zones_at_same_rate(last_zone_ptr, zone_ptr))
            {
                // If true, force block to have one zone, taking the most
                // derivative zone (last added).
                // This effectively performs zone splitting, placing this
                // and later blocks into the split zone so that this zone
                // may be scheduled later than the zone it was split from.
                //
                // The one exception is when the block has a feedback input.
                // Check the wires for each input.
                // If wire is a loop feedback wire, ignore its zone because this
                // can be a decimated/interpolated zone which would otherwise be
                // set for the block and cause too-late instantiation
```

```
zone*        zone_to_delete = (zone*) NULL;
for (i=0; i<prototype_ptr->io_table_size(); i++)
{
        if (!prototype_ptr->io_is_output(i))
        {
        get_wire_for_io(io_number, 0, &wire_inst, &wire);
        wire_block = wire_inst->prototype();
        if (wire_block->does_block_have_loops())
        {
        if (wire_block->is_loop_wire(wire))
        // yes! this is a feedback io, so delete its zone
        zone_to_delete = wire_inst->get_zone_for_wire(wire);
        }
        }
}
if (zone_to_delete == (zone*) NULL)
{
        if (the_zones->later_zone(last_zone_ptr, zone_ptr))
        {
        zone_to_delete = zone_ptr;
        zone_ptr = last_zone_ptr;// take zone # from last
        }
        else
        zone_to_delete = last_zone_ptr;
}
delete_zone(zone_to_delete);
}
else
{
    // one zone not derived from another and at same rate,
    // so we must check to make sure one zone is not actually
    // a user-specified zone which should be collapsed with
    // a decimated/interpolated zone
    if (!the_zones->try_to_collapse_zones(last_zone_ptr, zone_ptr))
    {
            out_error("INS030", cerr, TRUE);
            cerr << "This instance can't be in both zone '"
             << *last_zone_ptr->get_zone_name()
             << "' and zone '"
```

```
                    << *zone_ptr->get_zone_name()
                    << "'.\n";
                   return FALSE;
            }
         }
      }}
   // give all our ancestors this zone
   add_zone_in_ancestors(zone_ptr);
   // return new zone ptr to user
   *zone_ptr_ptr = zone_ptr;
   return TRUE;}
////////////////////////////////////////////////////////////////
// add_zone_connections
// This is a rate change instance, so look up the zones for its i/o wires
// (which must have zone info set) and set connections between the zones to
// establish the zone topology. This is required by the scheduler.
// Returns FALSE if error.
////////////////////////////////////////////////////////////////
BOOLEAN instance::add_zone_connections(){
   int          i, j;
   instance*wire_inst;
   int          wire;
   zone*     in_zone_ptr;
   zone*     out_zone_ptr;
   // scan all inputs
   for (i=0; i<prototype_ptr->io_table_size(); i++)
   {
      if (!prototype_ptr->io_is_output(i))
      {
         // found an input, so get its zone
         if (!get_wire_for_io(i, 0, &wire_inst, &wire))
         {
            out_error("INS960", cerr, TRUE);
            cerr << "INTERNAL ERROR -- No wire for input in "
                  << "add_zone_connections.\n";
            return FALSE;
         }
         in_zone_ptr = wire_inst->get_zone_for_wire(wire);
         if (in_zone_ptr != NO_TIME_ZONE)
```

```
// scan all outputs for this input
for (j=0; j<prototype_ptr->io_table_size(); j++)
{
        if (prototype_ptr->io_is_output(j))
        {
        // set connections between input and output zones
        if (!get_wire_for_io(j, 0, &wire_inst, &wire))
        {
        out_error("INS961", cerr, TRUE);
        cerr << "INTERNAL ERROR -- No wire for output in "
         << "add_zone_connections.\n";
        return FALSE;
        }
        out_zone_ptr = wire_inst->get_zone_for_wire(wire);
        if (out_zone_ptr != NO_TIME_ZONE
        && in_zone_ptr != out_zone_ptr)
        {
        // now have in and out zone ptrs, so set forward
        // and backward pointers
        if (!in_zone_ptr->next_zone_present(out_zone_ptr))
        in_zone_ptr->add_next_zone(out_zone_ptr);
        if (!out_zone_ptr->prev_zone_present(in_zone_ptr))
        out_zone_ptr->add_prev_zone(in_zone_ptr);
        }
        }
}
    }
  }}.
return TRUE;}
//////////////////////////////////////////////////////////////////////
// set_instance_zones
// Called for a sequenced block which has zone for wires set by
// set_wire_zones, this function sets the zone for all instances.
// It calls itself recursively to set the instance zones
// for all children.
// If our ancestor had just a single time zone, then pass it in and use it
// if no other zone info can be found.
// Returns FALSE if error.
```

```
/////////////////////////////////////////////////////////////////////
BOOLEAN instance::set_instance_zones(zone* parent_zone_ptr){
	int		i, i_seq, j;
	hier_block*hier_ptr;
	BOOLEANstatus = TRUE;
	zone*	zone_ptr;
	zone*	last_zone_ptr;
	int		n_time_zones;
	BOOLEANgot_a_zone_io;
	// save pointer to our prototype as a hier block pointer, if we need it
	hier_ptr = (hier_block*) prototype_ptr;

	// save current block context and set instance info in block
	push_context();
	// if this is an asm block, verify that we are single time zone
	// and set zones for outputs
	n_time_zones = 0;
	last_zone_ptr = zone_ptr = NO_TIME_ZONE;
	// if this is a virtual I/O block, set wire zones from parent
	if (prototype_ptr->is_block_virtual_io())
		status = inherit_wire_zone_from_parent();
	// if this is a rate change block, take this opportunity to set the
	// zone links to establish zone topology, which the scheduler needs
	if (status){
		if ( prototype_ptr->is_rate_change_block())
			status = add_zone_connections(); }
	// scan all inputs to get zones
	if (status){
		for (j=0; j<prototype_ptr->io_table_size(); j++)
		{
			// The zone(s) for an instance is, in general, gotten from
			// the zone of each input. The exception is a rate change block,
			// (either downsampler or upsampler),
			// which is in the same zone as its OUTPUTS.
			// Thus a decimator runs at the lower of the two rates at
			// a rate boundary, and an interpolator runs at the higher.
			got_a_zone_io = FALSE;
			if ( prototype_ptr->is_rate_change_block())
			{
```

```
if (prototype_ptr->io_is_output(j))
        got_a_zone_io = TRUE;
}
else if (!prototype_ptr->io_is_output(j))
    got_a_zone_io = TRUE;
if (got_a_zone_io)
{
    if (!(status = set_zone_from_io(j, &zone_ptr, last_zone_ptr,
            &n_time_zones)))
            break;
    else
            last_zone_ptr = zone_ptr;
}
}}
if (status){
    if (n_time_zones == 0 && how_many_zones() == 0)
    {
        // no zone, so see if parent passed us a zone
        if (parent_zone_ptr != NO_TIME_ZONE)
        {
            n_time_zones = 1;
            zone_ptr = parent_zone_ptr;
#ifdef DEBUG
        cerr << "adding zone "
            << *zone_ptr->get_zone_name()
            << " from parent to instance "
            << *this->hier_name_string() << "\n";
#endif
            // record zone in instance
            add_zone(zone_ptr);
        }
    }
    // call ourself for all our children, passing them the time zone
    // if there is just a single one
    if (n_time_zones != 1)
        zone_ptr = NO_TIME_ZONE;
    for (i=0; i<child_instances.size(); i++)
    {
        // use sequenced order
```

```
                i_seq = sequence[i];

                status = child_instances[i_seq]->set_instance_zones(zone_ptr);
                if (!status)
                      break;
          }
          // make sure this instance has a zone
          if (status)
          {
                if (how_many_zones() == 0 && should_partition_design())
                {
                      out_error("INS033", cerr, TRUE);
                      cerr << "Could not determine time zone for this instance.\n";
                      status = FALSE;
                }
          }}
    // restore previous block context
    pop_context();
    return status;
}
////////////////////////////////////////////////////////////////////
// valid_parent_io
// Returns TRUE if this instance has valid parent IO, that is, if our
// parent exists and has had its child connections set.
////////////////////////////////////////////////////////////////////
BOOLEANinstance::valid_parent_io(){
      BOOLEANstatus = FALSE;
      if (parent_instance){
            if (parent_instance->are_connections_set())
                  status = TRUE;}
      return status;}
////////////////////////////////////////////////////////////////////
// add_zone
// Add a zone to the zone list, provided its not already there.
////////////////////////////////////////////////////////////////////
void instance::add_zone(zone* zone_ptr){
      int          i;
      if ((i = zone_ptrs.find(zone_ptr)) >= 0)
            return;
```

```
        i = zone_ptrs.size();
        zone_ptrs[i] = zone_ptr;
        seg_number = UNKNOWN_SEGMENT;}
////////////////////////////////////////////////////////////////////////
// delete_zone
// Delete a zone from the zone list.
////////////////////////////////////////////////////////////////////////
void instance::delete_zone(zone* zone_ptr){
        int             i;
        if ((i = zone_ptrs.find(zone_ptr)) < 0)
                return;
        zone_ptrs.remove(i);}
////////////////////////////////////////////////////////////////////////
// change_zone
// Change all references to one zone to another zone.
// Performed recursively for all children.
////////////////////////////////////////////////////////////////////////
void instance::change_zone(zone* old_zone, zone* new_zone){
        int             i;
        // change our zone pointer
        if (is_zone_present(old_zone)){
                delete_zone(old_zone);
                add_zone(new_zone);
#ifdef DEBUG
                        cerr << "changing zone "
                                << *old_zone->get_zone_name()
                                << " to "
                                << *new_zone->get_zone_name()
                                << " in instance "
                                << *this->hier_name_string() << "\n";
#endif}
        // change zones for our wires
        for (i=0; i<zone_for_wire.size(); i++){
                if (zone_for_wire[i] == old_zone)
                        zone_for_wire[i] = new_zone;}
        // recursively call children
        for (i=0; i<child_instances.size(); i++)
                child_instances[i]->change_zone(old_zone, new_zone);
////////////////////////////////////////////////////////////////////////
```

```
// add_zone_in_ancestors
// Add a zone in ancestor (just go up to user top).
/////////////////////////////////////////////////////////////////////
void instance::add_zone_in_ancestors(zone* zone_ptr){
	if (!is_top_level()){
		parent_instance->add_zone(zone_ptr);
		parent_instance->add_zone_in_ancestors(zone_ptr);
	}}
/////////////////////////////////////////////////////////////////////
// is_zone_or_subzone_present
// Returns TRUE if the given zone is present in our zone.
// Calls the zone class to use original zones in case any of zones are
// derived zones.
/////////////////////////////////////////////////////////////////////
BOOLEANinstance::is_zone_or_subzone_present(zone* z){
	int	i;
	zone*orig;
	if (z != (zone*) NULL){
		orig = z->original_zone();
		for (i=0; i<zone_ptrs.size(); i++)
		{
			if (orig == zone_ptrs[i]->original_zone())
				return TRUE;
		}}
	return FALSE;}
/////////////////////////////////////////////////////////////////////
// operator<<=
// Output the instance, with its prototype name, instance name, parameters
// and I/O, exactly as if it were a line in the parent block .sdl file.
/////////////////////////////////////////////////////////////////////
ostream& operator<<=(ostream& s, instance& inst){
	int		i;
	string*		name;
	instance*which_inst;
	int		index;
	// output prototype name and instance name
	s << *inst.prototype_name() << " "
	 << inst.instance_name << " ";
	// if overrides hash table present, it is parameters for instance
```

```
    if (inst.overrides != (expr_hash*) NULL)
        s << "{" << *inst.overrides << "} ";
    // output I/O for instance
    s << "(";
    for (i=0; i<inst.prototype_ptr->io_table_size(); i++){
        // get name string for this index
        inst.get_wire_for_io(i, inst.get_phantom_io_level(i),
                &which_inst, &index);
        name = which_inst->prototype_ptr->storage_name_at_index(index);
        // output I/O name separated from any previous name in list
        if (i>0)
            s << ", ";
        s << *name;}
    s << ");\n";
    return s;}
/////////////////////////////////////////////////////////////////
// out_instance_block
// Output this instance as a block.
/////////////////////////////////////////////////////////////////
void instance::out_instance_block(ostream& s){
    int                 i;
    int                 i_seq;
    string*     name;
    expr*       expr_ptr;
    int                 size;
    int                 dummy1, dummy2;
    linebreaker*l_break;
    char        storage_type;
    // only output if hierarchical block, because this function need
    // only be used for outputting instances which have had phantom blocks
    // added to them
    if (prototype()->is_leaf_block())
        return;
    // make a linebreaker object to break lines neatly
    l_break = new linebreaker(" ", 80, 0);
    // output header for this block
    // first output block name
    l_break->in() << "manblock " << *prototype_name();
    // output parameters definitions for block
```

```
l_break->in() << " (";
for (i=0; i<prototype_ptr->get_n_params(); i++){
        if (i > 0)
                l_break->in() << ", ";
        name = prototype_ptr->param_name_at_index(i);
        l_break->in() << *name;
        expr_ptr = prototype_ptr->param_expr_at_index(i);

        // if parameter value present, then output it
        if (expr_ptr != (expr*) NULL)
                l_break->in() << "=" << *expr_ptr;}
l_break->in() << ") (";
// output the I/O declaration
for (i=0; i<prototype_ptr->io_table_size(); i++){
        // get name string for this index
        name = prototype_ptr->io_name_at_index(i);
        if (i > 0)
                l_break->in() << "; ";
        if (prototype_ptr->io_is_output(i))
                l_break->in() << "output ";
        else
                l_break->in() << "input ";
        l_break->in() << *name;
        // if size is greater than one, declare it as a vector
        expr_ptr = prototype_ptr->io_entry_size(i);
        if (expr_ptr != (expr*) NULL)
        {
                size = (int) expr_ptr->int_value(&dummy1, &dummy2);
                if (size > 1)
                l_break->in() << "[" << size << "]";
        }}
l_break->in() << ")\n";
// send the line break output to the output stream
s << l_break->out();
delete l_break;
// now output the remaining parameters, which are actually symbols
for(i=prototype_ptr->get_n_params(); i<prototype_ptr->param_table_size();
                        i++){
        name = prototype_ptr->param_name_at_index(i);
```

```
        s << "symbol " << *name;
        expr_ptr = prototype_ptr->param_expr_at_index(i);
        // if parameter value present, then output it
        if (expr_ptr != (expr*) NULL)
            s << "=" << *expr_ptr;
        s << ";\n";}
// output the wires and any initial values
for (i=0; i<prototype_ptr->storage_table_size(); i++){
        // get name string for this index
        name = prototype_ptr->storage_name_at_index(i);
        s << "wire ";

        // output storage type
        storage_type = prototype_ptr->get_storage_type(i);
        switch (storage_type)
        {
            case 'f':
                s << "fixed ";
                break;
            case 'i':
                s << "integer ";
                break;
            case 'h':
                s << "hex ";
                break;
        }
        s << *name;
        // if size is greater than one, declare it as a vector
        expr_ptr = prototype_ptr->storage_entry_size(i);
        if (expr_ptr != (expr*) NULL)
        {
            size = (int) expr_ptr->int_value(&dummy1, &dummy2);
            if (size > 1)
            s << "[" << size << "]";
        }
        expr_ptr = prototype_ptr->get_storage_init(i);
        // if storage init value present, then output it
        if (expr_ptr != (expr*) NULL)
            s << "=" << *expr_ptr;
```

```
        s << ";\n";}
    // output start of block body text
    s << "begin\n";
    // call output operator for all our children
    for (i=0; i<child_instances.size(); i++){
        // use sequenced order
        i_seq = sequence[i];
        // check if label needs to be output before this child instance
        if (prototype_ptr->label_table_size())
        {
            // check if any label refers to this child index
            // Label sequence has child index.
            for (int j=0; j<prototype_ptr->label_table_size(); j++)
            {
                if (prototype_ptr->label_seq_at_index(j) == i_seq)
                {
                        name = prototype_ptr->label_name_at_index(j);
                        s << *name << ":\n";
                }
            }
        }
        // make a linebreaker object to break lines neatly
        l_break = new linebreaker(" ", 80, 4);
        l_break->in() <<= *child_instances[i_seq];
        s << " " << l_break->out();
        delete l_break;}
    // output end of block body text
    s << "end\n\n";}
///////////////////////////////////////////////////////////////////////
// out_variant_blocks
// Output all blocks in the hierarchy which are variants.
// Any block which has a variant child must itself become a variant.
///////////////////////////////////////////////////////////////////////
void instance::out_variant_blocks(ostream& s){
    int                     i;
    int                     i_seq;
    // save current block context and set instance info in block
    push_context();
    // call function for all our children
```

```
    for (i=0; i<child_instances.size(); i++){
        // use sequenced order
        i_seq = sequence[i];
        child_instances[i_seq]->out_variant_blocks(s); }
    // if this block has phantoms, it is a variant block
    if (has_phantoms() || is_variant()){
        // make us a variant
        make_variant();
        // since we are variant, set our parent as a variant
        if (parent() != (instance*) NULL)
            parent()->make_variant();
        // and output ourself
        out_instance_block(s); }
    pop_context(); }
////////////////////////////////////////////////////////////////////////////
// make_variant
// Make this instance a variant of the prototype instance, provided it
// is not already a variant.
////////////////////////////////////////////////////////////////////////////
void instance::make_variant(){
    if (!inst_is_variant){
        variant_number = prototype()->new_variant_number();
        inst_is_variant = TRUE;
    }}
////////////////////////////////////////////////////////////////////////////
// prototype_name
// Returns the name of the block prototype, including any variant number
// to distinguish the block.
////////////////////////////////////////////////////////////////////////////
string* instance::prototype_name(){
    string*     s;
    if (inst_is_variant){
        s = new string("");
        *s = *s + *prototype()->get_block_name()
                + "%" + int_to_c_string(variant_number); }
    else
        s = prototype()->get_block_name();
    return s; }
////////////////////////////////////////////////////////////////////////////
```

```
// instance::add_phantom_storage_name
// Adds a new phantom location or locations referred to by the given name.
// Returns as an argument the storage index (next sequential)
// which was allocated.
// An expression for the storage size is also passed, the value of
// which may not yet be known. If the size expression is NULL, set a size
// of 1.
// Returns FALSE if the name was already present.
// Calls the protected function:
// instance_phantoms::add_phantom_storage_name_only to do most of the work
// except for setting the zone info for the new phantom storage.
// NOTE: No initial value other than 0 is possible for phantom storage.
////////////////////////////////////////////////////////////////////////
BOOLEANinstance::add_phantom_storage_name(string* name, expr* size,
                int* index, char type){
      BOOLEANresult;
      if (result = add_phantom_storage_name_only(name, size, index, type))
            set_phantom_link_and_zone(*index, NO_PHANTOM_LINK, NO_TIME_ZONE);
      return result;}
////////////////////////////////////////////////////////////////////////
// instance::set_phantom_link_and_zone
// Create a phantom wire link from a wire to its phantom, and set
// the zone for the phantom.
////////////////////////////////////////////////////////////////////////
void instance::set_phantom_link_and_zone(int i, int phantom_i, zone* timezone){
          set_phantom_wire_link(i, phantom_i);
          // set zone only if phantom wire is real (it could be NO_PHANTOM_LINK)
          if (phantom_i >=0)
                zone_for_wire[phantom_i] = timezone;}
////////////////////////////////////////////////////////////////////////
// instance::insert_partitioned
// Insert a child into our partitioned child sequence.
////////////////////////////////////////////////////////////////////////
void instance::insert_partitioned(int pos, int child_number){
      part_sequence.insert(pos);
      part_sequence[pos] = child_number;}
////////////////////////////////////////////////////////////////////////
// instance::set_partitioned
// Record fact that this instance in partitioned in the given timezone.
```

```
//////////////////////////////////////////////////////////////////////
void instance::set_partitioned(zone* zone_ptr){
    int         i;
    // make sure zone is present and get index (add if not present)
    if ((i = zone_ptrs.find(zone_ptr)) < 0){
        add_zone(zone_ptr);
        i = zone_ptrs.find(zone_ptr);}
    // set partitioned flag for this zone index
    partitioned[i] = TRUE;}
//////////////////////////////////////////////////////////////////////
// instance::append_partitioned
// Append the given child to the partitioned sequence of children.
// Do so only if not already in the list.
//////////////////////////////////////////////////////////////////////
void instance::append_partitioned(int i){
    if (part_sequence.find(i) < 0)
        part_sequence[part_sequence.size()] = i;}
//////////////////////////////////////////////////////////////////////
// instance::needs_partitioning
// See if instance needs partitioning. It does if zone is present for
// instance and it has not yet been partitioned.
//////////////////////////////////////////////////////////////////////
BOOLEAN instance::needs_partitioning(zone* zone_ptr){
    int         i;
    // make sure zone is present and get index
    if ((i = zone_ptrs.find(zone_ptr)) < 0)
        return FALSE;
    return (!partitioned[i]);}
//////////////////////////////////////////////////////////////////////
// make_manual_sequence
// Create a manual block sequenc, bypassing partitioning, by copying
// the child sequence to the partitioned sequence.
//////////////////////////////////////////////////////////////////////
BOOLEAN instance::make_manual_sequence(){
    int                     i;
    int                     i_seq;
    BOOLEAN     status = TRUE;
    // save current block context and set instance info in block
    push_context();
```

```
    // call function for all our children
    for (i=0; i<child_instances.size(); i++){
        // use sequenced order, and make next in partitioned sequence
        i_seq = sequence[i];
        append_partitioned(i_seq);
        status = child_instances[i_seq]->make_manual_sequence();}
    pop_context();
    return status;}
/////////////////////////////////////////////////////////////////////
// instance_phantoms::instance_phantoms
// Constructor.
/////////////////////////////////////////////////////////////////////
instance_phantoms::instance_phantoms(block* proto):
    phantom_label_seq(SZ),
    phantom_label_offset(SZ){
    prototype_ptr = proto;
    phantom_l_index =
    n_phantom_stor_locs = 0;
    inst_has_phantoms = FALSE;
    // initialize phantom links to null, and zones to none
    for (int i=0; i<proto->storage_table_size(); i++)
        phantom_wire_link[i] = NO_PHANTOM_LINK;}
/////////////////////////////////////////////////////////////////////
// instance_phantoms::~instance_phantoms
// Destructor.
/////////////////////////////////////////////////////////////////////
instance_phantoms::~instance_phantoms()
{}
/////////////////////////////////////////////////////////////////////
// instance_phantoms::phantom_storage_offset_at_index
// Return the phantom storage offset in the storage table at the given index
/////////////////////////////////////////////////////////////////////
int instance_phantoms::phantom_storage_offset_at_index(int index){
    int         alloc;
    // make sure to add allocation of storage table
    alloc = prototype_ptr->non_phantom_alloc_storage_size();
    alloc += phantom_storage_table.index_to_location(index);
    return alloc;}
/////////////////////////////////////////////////////////////////////
```

```
// instance_phantoms::look_up_phantom_storage_name
// Find the given name in the phantom storage table.
// Returns TRUE if found, along with the full storage index.
///////////////////////////////////////////////////////////////////////
BOOLEANinstance_phantoms::look_up_phantom_storage_name(string* s, int* index){
    expr*dummy_size;
    int         ph_index;
    if (phantom_storage_table.find(*s, &ph_index, &dummy_size)){
        *index = ph_index + prototype_ptr->non_phantom_storage_table_size();
        return TRUE;}
    else
        return FALSE;}
///////////////////////////////////////////////////////////////////////
// instance_phantoms::phantom_label_name_to_index
// Get the index for the given phantom label name.
// Returns FALSE if name not present.
///////////////////////////////////////////////////////////////////////
BOOLEANinstance_phantoms::phantom_label_name_to_index(string* name, int* index){
    expr*size;
    return phantom_label_table.find(*name, index, &size);}
///////////////////////////////////////////////////////////////////////
// instance_phantoms::add_phantom_label_name
// Adds a new phantom label name along with its seq #.
// Returns FALSE if the name and a seq # were already present.
///////////////////////////////////////////////////////////////////////
BOOLEANinstance_phantoms::add_phantom_label_name(string* name, int address){
    int   index;
    expr*old_size;
    // see if name already present
    if (!phantom_label_table.find(*name, &index, &old_size)){
        // name not present, so allocate a new one and get its index
        index = get_phantom_label_index(name);}
    // store the label seq # in a table, provided not already there
    if (!phantom_label_seq[index]
        || phantom_label_seq[index] == NO_ADDRESS){
        phantom_label_seq[index] = address;
        return TRUE;}
    else
        return FALSE;}
```

```
////////////////////////////////////////////////////////////////////
// instance_phantoms::add_phantom_storage_name_only
// Adds a new phantom location or locations referred to by the given name.
// Returns as an argument the storage index (next sequential)
// which was allocated.
// An expression for the storage size is also passed, the value of
// which may not yet be known. If the size expression is NULL, set a size
// of 1.
// Returns FALSE if the name was already present.
// Does NOT fill in zone information, and therefore is protected
// so that it should just be called by instance::add_phantom_storage_name
// which has access to zone functions.
// NOTE: No initial value other than 0 is possible for phantom storage.
////////////////////////////////////////////////////////////////////
BOOLEANinstance_phantoms::add_phantom_storage_name_only(string* name,
            expr* size, int* index, char type){
    BOOLEANresult;
    int         i;
    int         ph_index;
    result = phantom_storage_table.allocate(*name, size, &ph_index);
    if (result){
        phantom_storage_table.set_size(ph_index, size);
        phantom_storage_types[ph_index] = type;
        // initialize a phantom wire link for this storage location
        // non-phantom storage is first
        // get real index number to use, which is offset by stor. table size
        i = ph_index + prototype_ptr->non_phantom_storage_table_size();
        // give copy to caller
        *index = i;}
    return result;}
////////////////////////////////////////////////////////////////////
// instance_phantoms::get_phantom_label_index
// Gets an index (not an address!) for a phantom label name.
// If the name was not encountered before, a new, unique index is allocated
// for it.
////////////////////////////////////////////////////////////////////
int   instance_phantoms::get_phantom_label_index(string* name){
    int         index;
    expr*       old_size;
```

```
    // see if name already present
    if (phantom_label_table.find(*name, &index, &old_size))
        return index;
    else{
        // store name in hash table with new index
        phantom_label_table.allocate(*name, NULL, &phantom_l_index);
        phantom_label_seq[phantom_l_index] = NO_ADDRESS;
        return phantom_l_index++;
    }}
//////////////////////////////////////////////////////////////////////
// instance_phantoms::get_phantom_wire_level
// For the given storage index, count the current number of phantom wire
// levels and return it.
//////////////////////////////////////////////////////////////////////
int instance_phantoms::get_phantom_wire_level(int index){
    int         level;
    get_last_phantom(index, &level);
    return level;}
//////////////////////////////////////////////////////////////////////
// instance_phantoms::get_last_phantom
// For the given storage index, get the index of the last phantom, and
// return it, along with the phantom level.
//////////////////////////////////////////////////////////////////////
int instance_phantoms::get_last_phantom(int index, int* level_ptr){
    int             level = 0;
    int             next;
    // jump along phantom wire links until end, counting levels
    while ((next = phantom_wire_link[index]) != NO_PHANTOM_LINK){
        if (next == index)
        {
            out_err_header("INS901");
            cerr << "INTERNAL ERROR -- phantom links are corrupted!\n";
            exit(1);
        }
        index = next;
        level++;}
    *level_ptr = level;
    return index;}
```

```
////////////////////////////////////////////////////////////////////
// instance_phantoms::get_phantom
// For the given storage index, get the phantom for the given level.
////////////////////////////////////////////////////////////////////
int instance_phantoms::get_phantom(int index, int level){
	int			i, next;
	i = 0;
	while ((next = phantom_wire_link[index]) != NO_PHANTOM_LINK){
		if (next == index)
		{
			out_err_header("INS902");
				cerr << "INTERNAL ERROR -- phantom links are corrupted!\n";
			exit(1);
		}
		if (i++ == level)
			break;
		else
			index = next;}
	return index;}
////////////////////////////////////////////////////////////////////
// instance_phantoms::reattach_phantom_labels
// Remove any phantom labels from their connection to the "at_index"
// instance and connect them to the instance at "new_index".
// Used if we are inserting an instance at a particular place and wish a
// label to be assocatiated with the new instance.
////////////////////////////////////////////////////////////////////
void instance_phantoms::reattach_phantom_labels(int at_index, int new_index){
	for (int i=0; i<phantom_label_seq.size(); i++){
		if (phantom_label_seq[i] == at_index)
			phantom_label_seq[i] = new_index;
	}}
// instance.hxx
// block instance class
// T. Montlick
// 11/30/89
/* source code control: @(#)instance.hxx1.56 10/7/91 */
#define INSTANCE_DEF
#ifndef STRING_DEF
#include "string.hxx"
```

```
#endif
#ifndef UTILITY_DEF
#include "utility.hxx"
#endif
#ifndef INTRFACE_DEF
    #include "intrface.hxx"
#endif
#ifndef EXPR_DEF
#include "expr.hxx"
#endif
#ifndef EXPR_HASH_DEF
#include "exprhash.hxx"
#endif
#ifndef INT_ARRAY_DEF
#include "int_arr.hxx"
#endif
#ifndef INP_LIST_DEF
#include "inp_list.hxx"
#endif
#ifndef ALLOC_TABLE_DEF
#include "alloctab.hxx"
#endif
#ifndef INST_ARRAY_DEF
#include "inst_arr.hxx"
#endif
#ifndef BLOCK_DEF
#include "block.hxx"
#endif
#ifndef BLOCK_REF_DEF
#include "blck_ref.hxx"
#endif
#ifndef BLOCK_REF_ARRAY_DEF
#include "bref_arr.hxx"
#endif
#ifndef ZONE_DEF
#include "zone.hxx"
#endif
#ifndef ZONE_ARRAY_DEF
#include "zone_arr.hxx"
```

```
#endif
#ifdef SZ
#undef SZ
#endif
#defineSZ        4                // default array and hash table size
#defineHASH_SZ10
// special index in phantom_wire_link table indicating no more links
#define NO_PHANTOM_LINK-1
// special zone ptr in zone_for_wire table indicating no zone set
#define NO_TIME_ZONE(zone*) NULL
// illegal duration signifying unknown value
#define UNKNOWN_DURATION-1
// unknown value for segment
#define UNKNOWN_SEGMENT-1
// initial value for instruction_base
#define NO_INSTR_BASE-1
// special parameter name used for virtual I/O block
#define CONNECT"%connect"
// special parameter name used for subroutine control
#defineSUBR_PARAM_STR"%subr"
// special parameter name used to declare exported symbols
#defineEXPORTS_PARAM_STR"%exports"
#defineUSE_SUBR_CONDITION>0
#defineDONT_USE_SUBR_COND==0
// character to tag a micro interface symbol in symbol file
#define MICRO_CHAR'm'
class block;
class zone;
// base class for instance which handles all varieties of phantoms
class instance_phantoms{
    block*      prototype_ptr;   // our prototype
    int               n_phantom_instr_locs;// phantom only
    int               n_phantom_stor_locs;// phantoms only
    int               phantom_duration;// phantom duration for this block
    alloc_tablephantom_storage_table;// phantom storage, added to block storage
    expr_arrayphantom_storage_init;// init vals for phantom storage
    int_arrayphantom_storage_types;// types for phantom storage
    alloc_tablephantom_label_table;// phantom label name to index
    int               phantom_l_index;// next index # for label
```

```
    int_arrayphantom_label_seq;// index to label seq #
    int_arrayphantom_label_offset;// index to label offset from start
    int_arrayphantom_wire_link;// for each wire, index of next phantom
    int_arrayphantom_io_level;// for each I/O, phantom wire level
    BOOLEANinst_has_phantoms;// TRUE if instance has had phantoms added
protected:
    BOOLEANadd_phantom_storage_name_only(string* name, expr* size,
                        int* index, char type);
public:
    instance_phantoms(block* proto);
    ~instance_phantoms();
    void    set_n_phantom_stor_locs(int i) { n_phantom_stor_locs = i; }
    void    add_n_phantom_stor_locs(int i) { n_phantom_stor_locs += i; }
    int         get_n_phantom_stor_locs(){ return n_phantom_stor_locs; }
    void    set_n_phantom_instr_locs(int i){ n_phantom_instr_locs = i; }
    void    add_n_phantom_instr_locs(int i){ n_phantom_instr_locs += i; }
    int         get_n_phantom_instr_locs(){ return n_phantom_instr_locs; }
    void    set_phantom_duration(int i){ phantom_duration = i; }
    void    add_phantom_duration(int i){ phantom_duration += i; }
    int         get_phantom_duration(){ return phantom_duration; }
    int         phantom_storage_table_size()
                    { return phantom_storage_table.size(); }
    string* phantom_storage_name_at_index(int index)
                    { return phantom_storage_table.name_at_index(index); }
    int         phantom_storage_offset_at_index(int index);
    expr*   get_phantom_storage_init(int index)
                    { return phantom_storage_init[index]; }
    char    get_phantom_storage_type(int index)
                    { return (char) phantom_storage_types[index]; }
    expr*   phantom_storage_entry_size(int index)
                    { return phantom_storage_table.get_size(index); }
    BOOLEANlook_up_phantom_storage_name(string* s, int* index);
    BOOLEANphantom_label_name_to_index(string* name, int* index);
    BOOLEANadd_phantom_label_name(string* name, int address);
    int         get_phantom_label_index(string* name);
    int         phantom_label_table_size()
                    { return phantom_label_table.size(); }
    string* phantom_label_name_at_index(int index)
                    { return phantom_label_table.name_at_index(index); }
```

```
    int         phantom_label_seq_at_index(int index)
                        { return phantom_label_seq[index]; }
    int         phantom_label_offset_at_index(int index)
                        { return phantom_label_offset[index]; }
    void    set_phantom_label_offset(int index, int offset)
                        { phantom_label_offset[index] = offset; }
    int         get_phantom_wire_level(int index);
    int         get_last_phantom(int index, int* level_ptr);
    int     get_phantom(int index, int level);
    void    set_phantom_io_level(int i, int j)
                        { phantom_io_level[i] = j; }
    int         get_phantom_io_level(int i){ return phantom_io_level[i]; }
    void    set_phantom_wire_link(int i, int j)
                        { phantom_wire_link[i] = j; }
    void    set_has_phantoms()
                        { inst_has_phantoms = TRUE; }
    BOOLEANhas_phantoms(){ return inst_has_phantoms; }
    void    reattach_phantom_labels(int at_index, int new_index);
};
// base class of instance class which maintains info about an instance which is
// on a rate change boundary (decimation or interpolation)
class instance_rate_change{
    BOOLEANdecimation;      // TRUE if decimation, FALSE if interp.
    expr*   change_ratio;   // interpolation or decimation ratio
    BOOLEANnew_rate_block; // block follows a rate change block
public:
    instance_rate_change();
    ~instance_rate_change();
    void  set_decimating(expr* ratio);
    void  set_interpolating(expr* ratio);
    BOOLEANis_rate_change_block()
                        { return new_rate_block; }
    BOOLEANis_decimating()
                        { return (new_rate_block && decimation); }
    BOOLEANis_interpolating()
                        { return (new_rate_block && !decimation); }
    expr* get_change_ratio()
                        { return change_ratio; }
    void  set_as_new_rate_block()
```

```
                        { new_rate_block = TRUE; }
    BOOLEANis_new_rate_block()
                        { return new_rate_block; }
};
// class which defines a block instance
class instance : public instance_phantoms, public instance_rate_change{
    int             n_instruct_locs;// sum of instructions including children
    int             n_init_instr_locs;// init time only
    int             n_storage_locs;// sum of storage locs including children
    int             our_n_storage_locs;// just our own storage locs, no kids
    int             instruction_base;// starting address of instructions
    int             storage_base;// starting address of storage
    int             duration;   // total duration for this block
    int             init_duration;// init duration for this block
    block*      prototype_ptr;  // our prototype
    int             line_num;  // line # which called us in prototype
    instance*parent_instance;// pointer to our parent instance
    int             our_index; // our index in parent
    inst_arraychild_instances;// pointers to our child instances
    bref_arraychild_refs;       // pointers to our child block references
    string      instance_name;  // our name
    int_arraystorage_sizes;// evaluation of sizes in storage_table
    int_arrayio_sizes;          // evaluation of sizes in io_table
    expr_hash*overrides;        // override symbols from parent
    int_arraywire_in_parent;// wire indices in parent for our I/O
    int_arraywire_really_io;// parent wire index is really I/O index
    inst_arraybypass_parent;// bypass parent for I/O, but go to inst.
    int_arraysample_rates;// index of rate or rates for instance
    BOOLEANis_serial_port;   // TRUE if block is a serial port
    BOOLEANis_serial_output;// TRUE if serial output
    zone_arrayzone_for_wire;// time zone for wires, real and phantom
    zone_arrayzone_ptrs;        // which timezones instance is in
    int_arraypartitioned;// partitioned flags for timezones
    int             seg_number;// segment # for timezone, if known
    int_arraysequence;          // child sequence, if hierarchical block
    int_arraypart_sequence;// child sequence after partitioning
    BOOLEANsequenced;       // TRUE of sequenced in parent
    BOOLEANconnections_set;// TRUE if child connections have been made
    BOOLEANinit;                // TRUE if only instance is an init block
```

```
BOOLEANinst_is_variant;// TRUE if variant from prototype
int            variant_number;// number distinguishing from other variants
expr_arrayoverride_storage_init;// init vals which override prototype
BOOLEANoverrides_processed;// TRUE if override symbols processed
BOOLEANlabels_output;   // TRUE if labels output once
int_arraystorage_addresses;// evaluated actual addresses for our stor.
public:
    instance(block* proto, string& inst_name, instance* parent, int index);
    ~instance();
    block*     prototype()       { return prototype_ptr; }
    instance*parent()            { return parent_instance; }
    void       push_context();
    void       pop_context();
    instance*build_tree();// build the instance tree
    int            process_subroutines();
    BOOLEANcheck_if_subr_call(block* child_block, instance* child_inst);
    int            process_exports();
    int            evaluate_overrides();
    void       set_overrides(expr_hash* h)
                                 { if (overrides != (expr_hash*) NULL)
                                 delete overrides;
                                 overrides = h; }
    expr_hash*get_overrides()    { return overrides; }
    void       set_overrides_processed() { overrides_processed = TRUE; }
    BOOLEANare_overrides_processed() { return overrides_processed; }
    int            compute_contents();
    int            get_n_instruct_locs(){ return n_instruct_locs; }
    int            get_n_init_instr_locs(){ return n_init_instr_locs; }
    int            get_n_storage_locs(){ return n_storage_locs; }
    int            get_duration(){ return duration; }
    int            get_init_duration(){ return init_duration; }
    int            check_verify_expressions();
    int            check_asm_block();
    int            compute_storage_sizes();
    BOOLEANcompute_code_locations(int& next_instr_base, zone* timezone);
    void       do_compute_code_locations(int& next_instr_base, zone* timezone);
    void       compute_data_locations(int next_store_base);
    int            compute_io_sizes();
    int            connect_child_port(string*, int, instance*, block*, int_array&,
```

```
                        int_array&);
int             wire_connections();
void        make_prototype_connections();
int             add_top_level_inputs();
int             get_addr_of_storage(int index);
BOOLEANget_wire_for_io(int index, int phantom_level,
                        instance** which_instance, int* which_wire);
BOOLEANget_io_for_wire(instance* which_instance, int which_wire,
                        int* io_index);
BOOLEAN find_wire_name(string* name, int* which_wire,
                        instance** which_inst);
int             get_addr_of_io(int index);
int             get_addr_of_label(int index);
int             get_instruction_base()
                        { return instruction_base; }
int             generate_code(ostream& code_stream, zone* timezone);
int             do_generate_code(ostream& code_stream, zone* timezone);
int             generate_data(ostream& data_stream);
int             output_storage_symbols(ostream& out);
int             output_io_symbols(ostream& out);
int             output_labels(ostream& out, zone* timezone);
int             do_output_labels(ostream& out, zone* timezone);
int             output_symbols(ostream& out);
BOOLEANtranslates_to_storage(string* name, instance** symbol_inst,
                        string** storage_name);
string*     hier_name_string();
instance*get_instance_of_name(string* name, string** remainder);
void        out_error(char* msg_code, ostream& e, BOOLEAN parent);
void        out_warning(char* msg_code, ostream& e, BOOLEAN parent);
friend      ostream& operator<<(ostream& s, instance& i);
BOOLEAN is_top_level();
int             n_sample_rates(){ return sample_rates.size(); }
void        add_sample_rate(int rate)
                        { if (sample_rates.find(rate) < 0)
                        sample_rates[sample_rates.size()] = rate; }
int             get_sample_rate(int i)
                        { return sample_rates[i]; }
int             get_n_children(){ return child_instances.size(); }
instance*get_child(int i){ return child_instances[i]; }
```

```
int         get_sequence(int i){ return sequence[i]; }
void        add_new_child(instance* inst)
                        { child_instances[child_instances.size()] = inst; }
int         copy_in_sequence();
void        set_zone_for_wire(int index, zone* timezone);
zone*       get_zone_for_wire(int index)
                        { return zone_for_wire[index]; }
BOOLEANadd_phantom_storage_name(string* name, expr* size, int* index,
                        char type);
void        set_phantom_link_and_zone(int i, int j, zone* timezone);
BOOLEAN set_wire_zones();
BOOLEANset_new_output_zone(zone* in_zone, zone** out_zone_ptr);
BOOLEANinherit_wire_zone_from_parent();
BOOLEANset_zone_from_io(int io_number, zone** zone_ptr,
                        zone* last_zone, int* n_time_zones_ptr);
BOOLEANadd_zone_connections();
BOOLEAN set_instance_zones(zone* parent_zone);
void        set_io_to_wire_in_parent(int i, int j)
                        { wire_in_parent[i] = j; }
int         get_wire_in_parent(int i)
                        { return wire_in_parent[i]; }
void        set_bypass_parent(int i, instance* inst)
                        { bypass_parent[i] = inst; }
void        append_partitioned(int i);
int         get_partitioned_size(){ return part_sequence.size(); }
int         get_part_sequence(int i){ return part_sequence[i]; }
void        insert_partitioned(int i, int j);
int         get_io_sizes_size()
                        { return io_sizes.size(); }
int         get_sequence_size()
                        { return sequence.size(); }
BOOLEANare_connections_set()
                        { return connections_set; }
BOOLEANvalid_parent_io();
void        set_init()          { init = TRUE; }
BOOLEANis_init();
BOOLEANsingle_zoned(){ return (zone_ptrs.size() == 1); }
int         how_many_zones(){ return zone_ptrs.size(); }
zone*       get_zone(int i)
```

```
                                { return zone_ptrs[i]; }
int                get_seg_number()
                                { return seg_number; }
void        add_zone(zone* zone_ptr);
void        delete_zone(zone* zone_ptr);
void        change_zone(zone* old_zone, zone* new_zone);
void        add_zone_in_ancestors(zone* zone_ptr);
BOOLEANis_zone_present(zone* z)
                                { return (zone_ptrs.find(z) >= 0); }
BOOLEANis_zone_or_subzone_present(zone* z);
void        set_seg_number(int i)
                                { seg_number = i; }
friend      ostream& operator<<=(ostream& s, instance& inst);
void        out_instance_block(ostream& s);
void        make_variant();
BOOLEANis_variant(){ return inst_is_variant; }
int                what_variant_number()
                                { return variant_number; }
string*     prototype_name();
void        out_variant_blocks(ostream& s);
int                set_virtual_io();
int                set_pseudo_sampled_init();
void        set_sequenced(){ sequenced = TRUE; }
BOOLEANis_sequenced(){ return sequenced; }
void        set_storage_override_init(int i, expr* expr_ptr)
                                { override_storage_init[i] = expr_ptr; }
expr*       get_storage_override_init(int i)
                                { return override_storage_init[i]; }
void        set_partitioned(zone* zone_ptr);
BOOLEANneeds_partitioning(zone* zone_ptr);
BOOLEANmake_manual_sequence();
void        set_labels_output(){ labels_output = TRUE; }
BOOLEANare_labels_output(){ return labels_output; }
};
// int_arr.cxx
// derived class for integer array
// Terry Montlick
// 10/10/89
/* source code control: */
```

```
static char SccsID[] = "@(#)int_arr.cxx1.56 10/7/91";
#include "int_arr.hxx"
int_array::int_array()
{}
int_array::int_array(int i)
{}
// int_arr.hxx
// header for derived int array classes
// T. Montlick
// 10/10/89
/* source code control: @(#)int_arr.hxx1.56 10/7/91 */
#define INT_ARRAY_DEF
#ifndef ARRAY_DEF
#include "array.hxx"
#endif
class int_array : public array{
public:
      int_array();
      int_array(int i);
      void       operator=(int_array& a){ array::operator=((array&) a); }
      int&       operator[](int i) { return (int&) array::operator[] (i); }
      int              find(int ptr) { return array::find( (elem) ptr); }
      void       append(int ptr){ array::append((elem) ptr); }
      int_array&operator+(int_array& a)
                              { return (int_array&) array::operator+((array&) a); }
      int_array&operator+=(int_array& a) {a = *this + a; return *this; }
};
// int_hash.cxx
// functions for integer hash table class
// T. Montlick
// 9/12/89
/* source code control: */
static char SccsID[] = "@(#)int_hash.cxx1.56 10/7/91";
#ifndef int_HASH_DEF
#include "int_hash.hxx"
#endif
// bring in hash functions, customized from our defines
#include "hash.cxx"
// int_hash.hxx
```

```
// header for integer hash table class
// T. Montlick
// 9/12/89
/* source code control: @(#)int_hash.hxx1.56 10/7/91 */
#define INT_HASH_DEF
#ifndef STRING_DEF
#include"string.hxx"
#endif
// define symbols which make a custom hash table class
#ifdef HASH
#undef HASH
#endif
#define HASH int_hash
#ifdef HASH_ELEM
#undef HASH_ELEM
#endif
#define HASH_ELEM int_hash_elem
#ifdef HASH_LIST
#undef HASH_LIST
#endif
#define HASH_LIST int_hash_list
#ifdef VAL_TYPE
#undef VAL_TYPE
#endif
#define VAL_TYPE int
#ifdef USE_POINTER
#undef USE_POINTER
#endif
#include"hash.hxx"
// intrface.cxx
// C language interface to C++ classes
// T. Montlick
// 10/31/89
/* source code control: */
static char SccsID[] = "@(#)intrface.cxx1.56 10/7/91";
#ifndef INTRFACE_DEF
#include "intrface.hxx"
#endif
// include header which f_find function uses
```

```
#include "starstd.h"
// make all functions in this file C-callable, so don't mangle names
extern "C"{
// current block pointer
block*      cur_block = NULL;
/* pointer to current arg_set (for block_ref arguments) */
arg_set*cur_arg_set = NULL;
/* pointer to current block_ref */
block_ref*cur_block_ref = NULL;
/* block stack, for nested blocks */
block_stack the_block_stack;
// file stack for nested include files
file_stackthe_file_stack;
// hash table of pointers to all our block prototypes
block_hashprototype_blocks(20);
// list of asm blocks, used for generating listing
block_array asm_block_list;
// list of blocks in order encountered
block_arrayblock_list;
// current input filename
char  in_filename[MAX_NAME_SIZE];
// pointer to input filename as a string
string* in_filename_string;
// pointer to path string to prepend to all input files
string* in_path_string;
/* parser variables: */
int         line ; ;                /* line number for current place in parse */
int         instr_line;             /* line # of current instruction */
int error_count = 0;
/* initialization variables from init file */
long        n_gsps;
long        n_ports;
long        flag_locs;
long        io_space_start;
long        data_space_start;
long        code_space_start;
long        code_space_size;
long        data_space_size;
long        io_space_size;
```

```
long      first_serial_port;
long      last_serial_port;
long      first_in_port;
long      n_in_ports;
long      first_out_port;
long      n_out_ports;
long      first_compute_line;
long      last_compute_line;
long      chip_gsp_rate;
long      max_gpio_number = 3;
long      max_rts_number = 3;
long      abs_addr_fudge = 0;
string*   SPROC_model = (string*) NULL;
string*   init_version = (string*) NULL;
/* variables from the command line */
string*SPROC = (string*) NULL;/* SPROC type -- determines init file */
string*alt_path = (string*) NULL;/* alternate path for input files */
string*list_file = (string*) NULL;/* name for listing file */
string*out_file_base = (string*) NULL;/* base name for output files */
string*man_file_base = (string*) NULL;/* base name for manual output file */
externBOOLEAN verify_only = FALSE;/* verify compilation only - no link */
externBOOLEANno_executable = FALSE;/* suppress output of executable file */
externBOOLEANmake_listing = FALSE;/* by default, don't make listing */
externBOOLEANverbose = FALSE;
externBOOLEAN no_file_info = FALSE;/* error messages have file info */
externint         clock_error = DEFAULT_CLOCK_ERROR;/* % clock error to allow */
externBOOLEAN uncensored = FALSE;/* uncensor detailed statistics */
externBOOLEAN no_partition = FALSE;/* default is to partition */
externint         dcflt_subr_count = DEFAULT_SUBR_COUNT;/* count to use subr */
BOOLEANvalues_must_be_known;
/* pointer to top of instance tree */
instance*top_instance;
/* pointer to top of user's design */
instance*user_top_instance;
/* child index in true top block of user's top block */
int               users_top_block_index;
/* pointer to instance of restart vector */
instance*restart_instance;
/* pointer to the restart block prototype */
```

```
block*      restart_block;
/* fifo hardware flags allocator class */
flags*      fifo_flags;
/* gpio and rts allocators */
io_bits*gpios;
io_bits*rts;
/* time zones */
zones*the_zones;
/* gsp allocator class */
gsps*gsp_allocator;
/* makefile file stream */
ostream*makefile_stream_ptr;
/* partitioning info */
int                 n_zones = 0;
int_arrayn_gsps_used;
double      exact_gsps[10];
int                 total_gsps = 0;
///////////////////////////////////////////////////////////////////
// new_string
// Create a string from a character pointer and return a pointer to it.
// Used to create our C++ string from a C code call.
///////////////////////////////////////////////////////////////////
string* new_string(char* s){
        return new string(s);}
///////////////////////////////////////////////////////////////////
// concat_string
// Concatenate two strings.
// Used to concatenate 2 C++ strings from a C code call.
///////////////////////////////////////////////////////////////////
string* concat_string(string* s1, string* s2){
        // just used concatenation operator for string class
        *s1 = *s1 + *s2;
        return s1;}
///////////////////////////////////////////////////////////////////
// delete_string
// Delete a string.
// Used to delete our C++ string from a C code call.
///////////////////////////////////////////////////////////////////
void delete_string(string* s){
```

```
        delete s;}
///////////////////////////////////////////////////////////////////////
// int_to_expr
// Create an expression class instance from an integer.
// Used to create an expression from a C code call.
///////////////////////////////////////////////////////////////////////
expr* int_to_expr(long numb){
        expr* new_expr;
        new_expr = new expr(numb);
        return new_expr;}
///////////////////////////////////////////////////////////////////////
// real_to_expr
// Create an expression class instance from a real.
// Used to create an expression from a C code call.
///////////////////////////////////////////////////////////////////////
expr* real_to_expr(double numb){
        expr* new_expr;
        new_expr = new expr(numb);
        return new_expr;}
///////////////////////////////////////////////////////////////////////
// string_to_expr
// Create an expression class instance from a string.
// Used to create an expression from a C code call.
///////////////////////////////////////////////////////////////////////
expr* string_to_expr(string* s){
        expr* new_expr;
        new_expr = new expr(s);
        return new_expr;}
///////////////////////////////////////////////////////////////////////
// operator_to_expr
// Create an expression class instance from an operator, which is a
// single character code representing an arithmetic operation.
// Used to create an expression from a C code call.
///////////////////////////////////////////////////////////////////////
struct expr* operator_to_expr(char op){
        expr* new_expr;
        new_expr = new expr(op);
        return new_expr;}
///////////////////////////////////////////////////////////////////////
```

```
// concat_expr
// Build up an expression by concatenating two expressions.
// Used to build an expression from a C code call.
//////////////////////////////////////////////////////////////////////
expr* concat_expr(expr* expr1, expr* expr2){
      expr1->concat(expr2);
      return expr1;}
//////////////////////////////////////////////////////////////////////
// real_value
// Return the real value of an expression.
// Callable directly from C code.
//////////////////////////////////////////////////////////////////////
double real_value(expr* c){
      int           dummy_type;
      int           dummy_level;
      return c->real_value(&dummy_type, &dummy_level);}
//////////////////////////////////////////////////////////////////////
// int_value
// Return the integer value of an expression.
// Callable directly from C code.
//////////////////////////////////////////////////////////////////////
long int_value(expr* c){
      int           dummy_type;
      int           dummy_level;
      return c->int_value(&dummy_type, &dummy_level);}
//////////////////////////////////////////////////////////////////////
// what_reloc_level
// Returns relocation level of an expression.
// Callable directly from C code.
//////////////////////////////////////////////////////////////////////
int what_reloc_level(expr* c){
      return c->what_reloc_level();}
//////////////////////////////////////////////////////////////////////
// C interface to block class.
// All routines use the external variable cur_block, which is a pointer
// to the current block.
//////////////////////////////////////////////////////////////////////
//////////////////////////////////////////////////////////////////////
// cur_blk_check()
```

```
// If no current block for interface routine, exit with error msg.
////////////////////////////////////////////////////////////////////
void cur_blk_check(char* msg_code, char* msg){
      NOREF(msg);
      if (!cur_block){
            out_err_header(msg_code);
            cerr << "INTERNAL ERROR: No current block for ' << msg << "\n";
            exit(-1);
      }}
////////////////////////////////////////////////////////////////////
// set_block_name
// Sets block prototype name..
////////////////////////////////////////////////////////////////////
BOOLEANset_block_name(string* n){
      cur_blk_check("INT901", "set_block_name");
      return cur_block->set_block_name(n);}
////////////////////////////////////////////////////////////////////
// add_storage_name
// Adds a new memory location referred to by the given name.
// Returns as an argument the storage index (next sequential)
// which was allocated.
// Returns FALSE if the name was already present.
////////////////////////////////////////////////////////////////////
BOOLEANadd_storage_name(string* name, expr* size, int* index, char type,
                                    BOOLEAN is_micro, BOOLEAN is_variable){
      cur_blk_check("INT902", "add_storage_name");
      return cur_block->add_storage_name(name, size, index, type, is_micro,
                                    is_variable);}
////////////////////////////////////////////////////////////////////
// add_storage_init
// Associates a storage location with an expression which supplies the
// initialization value.
////////////////////////////////////////////////////////////////////
void add_storage_init(int location, expr* expr_ptr){
      cur_blk_check("INT903", "add_storage_init");
      cur_block->add_storage_init(location, expr_ptr);}
////////////////////////////////////////////////////////////////////
// add_io_name
// Adds a new I/O offset referred to by the given name.
```

```
// Returns as an argument the offset (next sequential)
// which was allocated.
// Returns FALSE if the name was already present.
///////////////////////////////////////////////////////////////
BOOLEANadd_io_name(string* name, int* offset, BOOLEAN is_micro){
      cur_blk_check("INT904", "add_io_name");
      return cur_block->add_io_name(name, offset, is_micro);}
///////////////////////////////////////////////////////////////
// set_io_size_and_direction
// Sets the size and direction for the given I/O offset name.
// Returns FALSE if the name was not present.
///////////////////////////////////////////////////////////////
BOOLEANset_io_size_and_direction(string* name, expr* size, int dir){
      cur_blk_check("INT905", "set_io_size_and_direction");
      return cur_block->set_io_size_and_direction(name, size, dir);}
///////////////////////////////////////////////////////////////
// set_io_init_value
// Sets an initial value for the given I/O offset.
///////////////////////////////////////////////////////////////
void  set_io_init_value(int i, expr* e){
      cur_blk_check("INT906", "set_io_init_value");
      cur_block->set_io_init_value(i, e);}
///////////////////////////////////////////////////////////////
// add_param_name
// Allocates a new parameter referred to by the given name.
// Returns as an argument the index (next sequential)
// which was allocated.
// Returns FALSE if the name was already present.
///////////////////////////////////////////////////////////////
BOOLEANadd_param_name(string* name, int* offset){
      cur_blk_check("INT907", "add_param_name");
      return cur_block->add_param_name(name, offset);}
///////////////////////////////////////////////////////////////
// finish_adding_params
// Encountered last parameter declaration, so this routine finished off
// adding parameters by always adding the "exports" parameter.
///////////////////////////////////////////////////////////////
void finish_adding_params(){
      static string exports_string(EXPORTS_PARAM_STR);
```

```
static string empty_string("");
static expr empty_string_expr(&empty_string);
int          temp;
if (add_expression_name(&exports_string, &empty_string_expr))
     add_param_name(&exports_string, &temp);}
////////////////////////////////////////////////////////////////////
// add_symbol_name
// Allocates a new symbol referred to by the given name.
// Returns as an argument the index (next sequential)
// which was allocated.
// Returns FALSE if the name was already present.
////////////////////////////////////////////////////////////////////
BOOLEANadd_symbol_name(string* name, int* offset, BOOLEAN is_micro){
     cur_blk_check("INT908", "add_symbol_name");
     return cur_block->add_symbol_name(name, offset, is_micro);}
////////////////////////////////////////////////////////////////////
// add_expression_name
// Associate an expression with a symbol name.
// Returns FALSE if the name was already present.
////////////////////////////////////////////////////////////////////
BOOLEANadd_expression_name(string* name, expr* expr_ptr){
     cur_blk_check("INT909", "add_expression_name");
     return cur_block->add_expression_name(name, expr_ptr);}
////////////////////////////////////////////////////////////////////
// add_alias_name
// Adds a new alias name and associate it with an equivalent name.
// Returns FALSE if the name was already present.
////////////////////////////////////////////////////////////////////
BOOLEANadd_alias_name(string* new_name, string* equiv_name){
     cur_blk_check("INT910", "add_alias_name");
     return cur_block->add_alias_name(new_name, equiv_name);}
////////////////////////////////////////////////////////////////////
// add_verify_expression
// Add an expression whose truth is to be evaluated when this block
// is instantiated.
////////////////////////////////////////////////////////////////////
void  add_verify_expression(expr* expr_ptr, string* fail_string){
     cur_blk_check("INT911", "add_verify_expression");
     cur_block->add_verify_expression(expr_ptr, fail_string);}
```

```
////////////////////////////////////////////////////////////////////
// translation
// Returns the expression which is the translation of the given
// symbol name.
// If the name is an alias, translate until an expression is found.
// If name not found, return NULL.
////////////////////////////////////////////////////////////////////
expr* translation(string* name){
      cur_blk_check("INT912", "translation");
      return cur_block->translation(name);}
////////////////////////////////////////////////////////////////////
// known_symbol
// Returns TRUE if the given name is a known symbol.
////////////////////////////////////////////////////////////////////
BOOLEANknown_symbol(string* name){
      cur_blk_check("INT913", "known_symbol");
      return cur_block->known_symbol(name);}
////////////////////////////////////////////////////////////////////
// translation_known
// Returns TRUE if the given name has a known value.
////////////////////////////////////////////////////////////////////
BOOLEANtranslation_known(string* name){
      cur_blk_check("INT914", "translation_known");
      return cur_block->translation_known(name);}
////////////////////////////////////////////////////////////////////
// add_operand_value
// Record an operand value expression and return an unique index which
// identifies the expression.
////////////////////////////////////////////////////////////////////
int   add_operand_value(expr* expr_ptr){
      cur_blk_check("INT915", "add_operand_value");
      return ((asm_block*) cur_block)->add_operand_value(expr_ptr);}
////////////////////////////////////////////////////////////////////
// add_label_name
// Adds a new label name along with its address.
// Returns FALSE if the name and an address were already present.
////////////////////////////////////////////////////////////////////
BOOLEANadd_label_name(string* name, int address){
      cur_blk_check("INT916", "add_label_name");
```

```
        return (cur_block)->add_label_name(name, address);}
////////////////////////////////////////////////////////////////////////
// set_duration
// Set duration expression for asm block.
////////////////////////////////////////////////////////////////////////
BOOLEANset_duration(expr* duration){
        cur_blk_check("INT917", "set_duration");
        return ((asm_block*) cur_block)->set_duration(duration);}
////////////////////////////////////////////////////////////////////////
// assign_label_index
// Gets an index (not an address!) for a label name.
// If the name was not encountered before, a new, unique index is allocated
// for it.
////////////////////////////////////////////////////////////////////////
int     assign_label_index(string* name){
        cur_blk_check("INT918", "assign_label_index");
        return (cur_block)->assign_label_index(name);}
////////////////////////////////////////////////////////////////////////
// enter_fields
// Enter the fields of a new instruction into the arrays for each field.
// The number for this instruction is passed, as this is used as the
// array index for the fields.
// Keeping the instruction fields in distinct arrays makes it easier
// to do successive compiler passes, eliminating the need for masking
// of the composite instruction.
//
////////////////////////////////////////////////////////////////////////
void enter_fields(int index, int line_num, int opcode, int addr_mode,
                                        int operand, int reloc_level){
        cur_blk_check("INT919", "enter_fields");
        ((asm_block*) cur_block)->enter_fields(index, line_num, opcode, addr_mode,
                                        operand, reloc_level);}
////////////////////////////////////////////////////////////////////////
// set_origin
// Set origin for start of code.
////////////////////////////////////////////////////////////////////////
void    set_origin(int org){
        cur_blk_check("INT920", "set_origin");
        cur_block->set_origin(org);}
```

```
////////////////////////////////////////////////////////////////////////
// set_phantom
// Mark block as a phantom (linker-inserted).
////////////////////////////////////////////////////////////////////////
void set_phantom(){
      cur_blk_check("INT921", "set_phantom");
      cur_block->set_phantom();}
////////////////////////////////////////////////////////////////////////
// set_as_virtual_io
// Mark block as a a virtual I/O block.
////////////////////////////////////////////////////////////////////////
void set_as_virtual_io(){
      cur_blk_check("INT922", "set_as_virtual_io");
      cur_block->set_as_virtual_io();}
////////////////////////////////////////////////////////////////////////
// set_init
// Mark block as init (once_only execution).
////////////////////////////////////////////////////////////////////////
void set_init(){
      cur_blk_check("INT923", "set_init");
      cur_block->set_init();}
////////////////////////////////////////////////////////////////////////
// set_timezone
// Sets timezone name and values for current block.
////////////////////////////////////////////////////////////////////////
BOOLEANset_timezone(expr* name, expr* rate){
      cur_blk_check("INT924", "set_timezone");
      return cur_block->set_timezone(name, rate);}
////////////////////////////////////////////////////////////////////////
// set_as_port
// Set current block as input or output port, plust set config parameters.
////////////////////////////////////////////////////////////////////////
BOOLEANset_as_port(expr* port_num, expr* trigger, BOOLEAN is_output,
                              expr* config, expr* entry_size){
      cur_blk_check("INT925", "set_as_port");
      return cur_block->set_as_port(port_num, trigger, is_output, config,
                  entry_size);}
////////////////////////////////////////////////////////////////////////
// set_gpio
```

```
// Allocate a gpio port.
//////////////////////////////////////////////////////////////////////
void set_gpio(expr* num, BOOLEAN is_output){
      cur_blk_check("INT945", "set_gpio");
      cur_block->set_gpio(num, is_output);}
//////////////////////////////////////////////////////////////////////
// set_rts
// Allocate an rts port.
//////////////////////////////////////////////////////////////////////
void set_rts(expr* num, BOOLEAN is_output){
      cur_blk_check("INT946", "set_rts");
      cur_block->set_rts(num, is_output);}
//////////////////////////////////////////////////////////////////////
// set_compute_line
// Set current block as compute line triggered.
//////////////////////////////////////////////////////////////////////
BOOLEAN set_compute_line(expr* num){
      cur_blk_check("INT926", "set_compute_line");
      return cur_block->set_compute_line(num);}
//////////////////////////////////////////////////////////////////////
// is_absolute
// Returns TRUE if addresses are absolute.
//////////////////////////////////////////////////////////////////////
BOOLEANis_absolute(){
      cur_blk_check("INT927", "is_absolute");
      return cur_block->is_absolute();}
//////////////////////////////////////////////////////////////////////
// instr_number
// Returns instruction number of current block.
//////////////////////////////////////////////////////////////////////
int instr_number(){
      cur_blk_check("INT928", "instr_number");
      return cur_block->instr_number();}
//////////////////////////////////////////////////////////////////////
// advance_instr_number
// Advances instruction number of current block.
//////////////////////////////////////////////////////////////////////
void advance_instr_number(){
      cur_blk_check("INT929", "advance_instr_number");
```

```
      cur_block->advance_instr_number();}
////////////////////////////////////////////////////////////////////
// storage_error
// Output error text for storage initialization. Passed text and
// index of storage location.
////////////////////////////////////////////////////////////////////
int   storage_error(char* msg_code, int loc, char* s){
      cur_blk_check("INT930", "storage_error");
      return ((asm_block*) cur_block)->storage_error(msg_code, loc, s);}
////////////////////////////////////////////////////////////////////
// set_decimating
// Record that this block is decimating.
////////////////////////////////////////////////////////////////////
void set_decimating(expr* ratio){
      cur_blk_check("INT943", "set_decimating");
      cur_block->set_decimating(ratio);}
////////////////////////////////////////////////////////////////////
// set_interpolating
// Record that this block is interpolating.
////////////////////////////////////////////////////////////////////
void set_interpolating(expr* ratio){
      cur_blk_check("INT944", "set_interpolating");
      cur_block->set_interpolating(ratio);}
////////////////////////////////////////////////////////////////////
// new_arg_set
// Create a new current arg_set.
////////////////////////////////////////////////////////////////////
void  new_arg_set(BOOLEAN store_by_name){
      cur_arg_set = new arg_set(store_by_name);}
////////////////////////////////////////////////////////////////////
// cur_arg_set_check()
// If no current arg set for interface routine, exit with error msg.
////////////////////////////////////////////////////////////////////
void cur_arg_set_check(char* msg_code, char* msg){
      NOREF(msg);
      if (!cur_arg_set){
            out_err_header(msg_code);
            cerr << "INTERNAL ERROR: No current arg set for ' << msg << "\n";
            exit(-1);
```

```
    }}
////////////////////////////////////////////////////////////////////////////
// add_posit_expr
// Add a positional argument expression current arg_set.
////////////////////////////////////////////////////////////////////////////
BOOLEANadd_posit_expr(expr* e){
      cur_arg_set_check("INT931", "add_posit_expr");
      return cur_arg_set->add_posit_expr(e);}
////////////////////////////////////////////////////////////////////////////
// add_named_expr
// Add a named argument expression current arg_set.
////////////////////////////////////////////////////////////////////////////
BOOLEANadd_named_expr(string* name, expr* e){
      cur_arg_set_check("INT932", "add_posit_expr");
      return cur_arg_set->add_named_expr(*name, e);}
////////////////////////////////////////////////////////////////////////////
// new_block_ref
// Create a new current block_ref.
////////////////////////////////////////////////////////////////////////////
void  new_block_ref(string* blck_name, string* inst_name, int l){
      cur_block_ref = new block_ref(*blck_name, *inst_name, l);}
////////////////////////////////////////////////////////////////////////////
// cur_block_ref_check()
// If no current block ref for interface routine, exit with error msg.
////////////////////////////////////////////////////////////////////////////
void cur_block_ref_check(char* msg_code, char* msg){
      NOREF(msg);
      if (!cur_block_ref){
            out_err_header(msg_code);
            cerr << "INTERNAL ERROR: No current block ref for ' << msg << '\n";
            exit(-1);
    }}
////////////////////////////////////////////////////////////////////////////
// store_vals
// Store the set of value arguments for the current block_ref.
////////////////////////////////////////////////////////////////////////////
BOOLEANstore_vals(arg_set* p){
      cur_block_ref_check("INT933", "store_vals");
      return cur_block_ref->store_vals(p);}
```

```
////////////////////////////////////////////////////////////////////////
// store_ports
// Store the set of port arguments for the current block_ref.
////////////////////////////////////////////////////////////////////////
BOOLEANstore_ports(arg_set* p){
      cur_block_ref_check("INT934", "store_ports");
      return cur_block_ref->store_ports(p);}
////////////////////////////////////////////////////////////////////////
// save_this_block_ref
// Save cur_block_ref as the next ref for the cur_block.
////////////////////////////////////////////////////////////////////////
BOOLEAN save_this_block_ref(){
      cur_blk_check("INT935", "save_this_block_ref");
      return ((hier_block*) cur_block)->add_block_ref(cur_block_ref);}
////////////////////////////////////////////////////////////////////////
// push_block
// Push the current block on the block stack, and replace it with the given
// block.
////////////////////////////////////////////////////////////////////////
void push_block(block* b){
      the_block_stack.push(cur_block);
      cur_block = b;}
////////////////////////////////////////////////////////////////////////
// add_block
// The given block is new, so add it to the list of blocks.
////////////////////////////////////////////////////////////////////////
void add_block(block* b){
      block_list[block_list.size()] = b;}
////////////////////////////////////////////////////////////////////////
// pop_block
// Pop up the block stack, making the previously pushed block the current
// block.
////////////////////////////////////////////////////////////////////////
void pop_block(){
      cur_block = the_block_stack.pop();}
////////////////////////////////////////////////////////////////////////
// new_hier_block
// Create a new hierarchical block and set as the current block.
// Push any current block.
```

```
//////////////////////////////////////////////////////////////////////
void new_hier_block(){
    push_block((block*) new hier_block());
    // add block to list of unchecked blocks
    add_block(cur_block);}
//////////////////////////////////////////////////////////////////////
// new_asm_block
// Create a new assembly block and set as the current block.
// Push any current block.
//////////////////////////////////////////////////////////////////////
void new_asm_block(){
    push_block((block*) new asm_block());
    // save the asm block in the list of blocks for generating listing
    asm_block_list[asm_block_list.size()] = cur_block;
    // add block to list of unchecked blocks
    add_block(cur_block);}
//////////////////////////////////////////////////////////////////////
// new_subr_block
// Create a new subroutine block and set as the current block.
// Push any current block.
//////////////////////////////////////////////////////////////////////
void new_subr_block(){
    push_block((block*) new asm_block());
    // tell the block that it is a subroutine block
    cur_block->set_subr_block();
    // save the asm block in the list of blocks for generating listing
    asm_block_list[asm_block_list.size()] = cur_block;
    // add block to list of unchecked blocks
    add_block(cur_block);}
//////////////////////////////////////////////////////////////////////
// new_call_block
// Create a new subroutine call block and set as the current block.
// Push any current block.
//////////////////////////////////////////////////////////////////////
void new_call_block(){
    push_block((block*) new asm_block());
    // tell the block that it is a subroutine call block
    cur_block->set_call_block();
    // save the asm block in the list of blocks for generating listing
```

```
      asm_block_list[asm_block_list.size()] = cur_block;
      // add block to list of unchecked blocks
      add_block(cur_block);}
////////////////////////////////////////////////////////////////////////
// new_seq_block
// Create a new sequence block and set as the current block.
// Push any current block.
////////////////////////////////////////////////////////////////////////
void new_seq_block(){
      push_block((block*) new seq_block());
      // add block to list of unchecked blocks
      add_block(cur_block);}
////////////////////////////////////////////////////////////////////////
// new_gsp_block
// Create a new GSP sequence block and set as the current block.
// Push any current block.
////////////////////////////////////////////////////////////////////////
void new_gsp_block(){
      push_block((block*) new gsp_block());
      // add block to list of unchecked blocks
      add_block(cur_block);}
////////////////////////////////////////////////////////////////////////
// end_of_block
// The end of the current block has been reached, so pop the block stack.
// Returns FALSE if not all IO has been declared for block.
////////////////////////////////////////////////////////////////////////
BOOLEAN end_of_block(){
      int            status = TRUE;
      cur_blk_check("INT936", "end_of_block");
      // make sure that all IO has been declared for this block
      if (!cur_block->all_io_declared())
            status = FALSE;
      pop_block();
      return status;}
////////////////////////////////////////////////////////////////////////
// end_of_asm_section
// The end of an ASM section imbedded in the current gsp_block has
// been reached.
// The end of the current block has been reached, so pop the block stack.
```

```
////////////////////////////////////////////////////////////////////
BOOLEAN end_of_asm_section(){
    int             status;

    block*     asm_section;
    // save pointer to the asm section block
    asm_section = cur_block;
    // done with this block, so pop
    status = end_of_block();
    cur_blk_check("INT937", "end_of_asm_section");
    ((gsp_block*) cur_block)->add_new_asm_section(asm_section);
    return status;}
////////////////////////////////////////////////////////////////////
// finish_asm_block
// The end of an asm_block has been reached. Do post-processing on this block:
// Resolve forward references, evaluated operands, etc.
////////////////////////////////////////////////////////////////////
BOOLEAN finish_asm_block(){
    BOOLEANstatus = TRUE;
    // clear instr line for for following block error msgs
    instr_line = 0;
    cur_blk_check("INT938", "finish_asm_block");
    // save # of instructions
    ((asm_block*) cur_block)->set_n_instructions(cur_block->instr_number());
    // evaluate operand values
    status |= ((asm_block*) cur_block)->eval_operands(values_must_be_known);
    // make sure duration is present if its necessary
    status |= ((asm_block*) cur_block)->check_duration();
    return status;}
////////////////////////////////////////////////////////////////////
// push_file
// Push the currently open file on the block stack, and replace it with the
// given new filename, opening it.
// If could not open the new file, return FALSE and the full path which failed
// (nothing gets pushed).
// Exits with error if maximum file depth exceeded.
////////////////////////////////////////////////////////////////////
BOOLEAN push_file(string* f_name, string** path_ptr){
    extern FILE*yyin;
```

```
    // check for max file stack depth
    if (the_file_stack.size() == MAX_FILE_DEPTH){
        out_err_header("INT001");
        cerr << "Maximum include file depth of "
            << MAX_FILE_DEPTH
            << " exceeded.\n Do you have recursive include files?\n";
        exit(-1);}
    else {
        // stack current file info, including FILE ptr in yyin
        the_file_stack.push(in_filename_string, yyin, line);
        // open new file
        if (!open_in_file(f_name, path_ptr))
        {
            pop_file();
            return FALSE;
        }
        // set this filename as current one
        in_filename_string = f_name;}
    return TRUE;}
/////////////////////////////////////////////////////////////////////
// pop_file
// Pop up the file stack, making the previously pushed file the current
// file. Returns TRUE if something was popped from stack.
/////////////////////////////////////////////////////////////////////
BOOLEAN pop_file(){
    extern FILE*yyin;
    // pop only if something in file stack
    if (the_file_stack.size()){
        // close currently open file, since we're all done with it
        if (yyin)
            fclose(yyin);
        // and substitute file from stack
        in_filename_string = the_file_stack.pop(&yyin, &line);
        return TRUE;}
    else
        return FALSE;}
/////////////////////////////////////////////////////////////////////
// strip_path
// Passed a pointer to a filename string, this function creates another string
```

```
// consisting of the name with any initial path information stripped, and
// returns a pointer to this string.
/////////////////////////////////////////////////////////////////////
string* strip_path(string* name){
	int		i;
	string*stripped_name;
	for (i=name->length()-1; i>0; i--){
		if ((*name)[i] == '/' || (*name)[i] == '\\')
		{
			i++;
			break;
		}}
	stripped_name = new string(&(*name)[i]);
	return stripped_name;}
/////////////////////////////////////////////////////////////////////
// get_path
// Passed a pointer to a filename string, this function creates another string
// consisting of just any initial path information, and
// returns a pointer to this string.
/////////////////////////////////////////////////////////////////////
string* get_path(string* name){
	int		i;
	string*path_name;
	char	c;
	path_name = (string*) NULL;
	for (i=name->length()-1; i>0; i--){
		if ((*name)[i] == '/' || (*name)[i] == '\\')
		{
			// save character after path delimiter
			c = (*name)[++i];
			// substitute string terminator and make path string
			(*name)[i] = '\0';
			path_name = new string(&(*name)[0]);
			// replace character
			(*name)[i] = c;
			break;
		}}
	// if no pathname found, create an empty string
	if (path_name == (string*) NULL)
```

```
        path_name = new string("");
    return path_name;}
////////////////////////////////////////////////////////////////
// open_in_file
// Opens the input file with the given name.
// This function checks the alternate path if not found in current directory.
// If file could not be found, returns FALSE and an pointer to the pathname
// which failed.
// Includes support for makefile, which lists all files opened for this design.
////////////////////////////////////////////////////////////////
BOOLEAN open_in_file(string* f_name, string** path_ptr){
    extern FILE*yyin;
//  string*         alt_name;
    string*         name_used;
//  string*         stripped_name;
    char            full_name[_MAX_PATH];// returned by f_find()
//  BOOLEAN         file_opened = FALSE;
    // try to open input file with file pointer yyin (for lex)
    // first strip off any path and prepend the standard path string
//  stripped_name = strip_path(f_name);
//  *f_name = "";
//  *f_name = *f_name + *in_path_string + *stripped_name;
    if (file_find(&(*f_name)[0], full_name) != OK){
        *path_ptr = f_name;
        return FALSE;}
    else{
        *f_name = "";
        *f_name = *f_name + full_name;}
    if (yyin = fopen(&(*f_name)[0], "r"))
//  {
        name_used = f_name;
//      file_opened = TRUE;
//  }
//  else if (*in_path_string != "")
//  {
//      // couldn't open, so if there was any prepended path string,
//      // try removing it and opening the file in the current directory
//      *f_name = *stripped_name;
//      if (yyin = fopen(&(*f_name)[0], "r"))
```

```
//          {
//                name_used = f_name;
//                file_opened = TRUE;
//          }
//    }
//    if (!file_opened)
      else{
            *path_ptr = f_name;
            return FALSE;
      }
///         // couldn't open, so try with alternate path name prepended
//          alt_name = new string("");
//          stripped_name = strip_path(f_name);
//          *alt_name = *alt_name + *alt_path + *stripped_name;
//          if (yyin = fopen(&(*alt_name)[0], "r"))
//                name_used = alt_name;
//          else
//          {
//                *path_ptr = alt_name;
//                return FALSE;
//          }
//    }
      // record full filename globally
      in_filename_string = name_used;
      // add a line to the makefile for whatever name we used
      *makefile_stream_ptr << *name_used << "\n";
      // init counters for the parser
      line = 1;
      instr_line = 0;
      return TRUE;}
/////////////////////////////////////////////////////////////////////
// get_config_constant
// Evaluate the SPROC configuration constant read from the init file.
/////////////////////////////////////////////////////////////////////
int   get_config_constant(string name, long* var_ptr){
      expr*       expr_ptr;
      int               dummy1, dummy2;
      int               status = 0;
      if (top_instance == (instance*) NULL){
```

```
        out_err_header("INT939");
        cerr << "INTERNAL ERROR -- Failed to get config constant\n"
             << " -- no top instance.\n";
        return 1;}
    // make top instance the current block
    top_instance->push_context();
    expr_ptr = top_instance->prototype()->translation(&name);
    if (expr_ptr == (expr*) NULL){
        out_err_header("INT002");
        cerr << "Could not find the configuration symbol '"
             << name
             << "'.\n Is your init file current?\n";
        status = 1;}
    if (!status){
        if (expr_ptr->has_int_value())
        {
            *var_ptr = expr_ptr->int_value(&dummy1, &dummy2);
        }
        else
        {
            out_err_header("INT003");
        cerr << "Non-integer value for configuration symbol '"
                 << name
                 << "'.\n Your init file may be currupted.\n";
            status = 1;
        }}
    top_instance->pop_context();
    return status;}
///////////////////////////////////////////////////////////////////////
// get_config_string
// Evaluate the SPROC configuration string parameter read from the init file.
///////////////////////////////////////////////////////////////////////
int get_config_string(string name, string** var_ptr){
    expr*       expr_ptr;
    int             status = 0;
    if (top_instance == (instance*) NULL){
        out_err_header("INT940");
        cerr << "INTERNAL ERROR -- Failed to get config constant\n"
             << " -- no top instance.\n";
```

```
        return 1;}
    // make top instance the current block
    top_instance->push_context();
    expr_ptr = top_instance->prototype()->translation(&name);
    if (expr_ptr == (expr*) NULL){
        out_err_header("INT004");
        cerr << "Could not find the configuration symbol '"
             << name
             << "'.\n Is your init file current?\n";
        status = 1;}
    if (!status){
        if (!expr_ptr->eval_to_symbol(var_ptr))
        {
            out_err_header("INT005");
        cerr << "Non-string value for configuration symbol '"
                 << name
                 << "'.\n Your init file may be currupted.\n";
            status = 1;
        }}
    top_instance->pop_context();
    return status;}
//////////////////////////////////////////////////////////////////////
// get_user_config_constant
// Evaluate the SPROC configuration in the user's top block.
//////////////////////////////////////////////////////////////////////
int get_user_config_constant(string name, long* var_ptr){
    expr*       expr_ptr;
    int                 dummy1, dummy2;
    int                 status = 0;
    if (user_top_instance == (instance*) NULL){
        out_err_header("INT941");
        cerr << "INTERNAL ERROR -- Failed to get config constant\n"
             << " -- no top user block.\n";
        return 1;}
    // make user top instance the current block
    user_top_instance->push_context();
    expr_ptr = user_top_instance->prototype()->translation(&name);
    if (expr_ptr == (expr*) NULL){
        out_err_header("INT006");
```

```
        cerr << "Could not find the configuration symbol '"
              << name
              << "'.\n";
        status = 1;}
    if (!status){
        if (expr_ptr->has_int_value())
        {
              *var_ptr = expr_ptr->int_value(&dummy1, &dummy2);
        }
        else
        {
              out_err_header("INT007");
         cerr << "Non-integer value for configuration symbol '"
                    << name
                    << "'.\n";
              status = 1;
        }}
    user_top_instance->pop_context();
    return status;}
////////////////////////////////////////////////////////////////////////
// get_user_config_string
// Evaluate the SPROC configuration string parameter in the top user block.
////////////////////////////////////////////////////////////////////////
int   get_user_config_string(string name, string** var_ptr){
    expr*       expr_ptr;
    int               status = 0;
    if (user_top_instance == (instance*) NULL){
        out_err_header("INT942");
        cerr << "INTERNAL ERROR -- Failed to get config constant\n"
              << " -- no top instance.\n";
        return 1;}
    // make user top instance the current block
    user_top_instance->push_context();
    expr_ptr = user_top_instance->prototype()->translation(&name);
    if (expr_ptr == (expr*) NULL){
        out_err_header("INT008");
        cerr << "Could not find the configuration symbol '"
              << name
              << "'.\n";
```

```
        status = 1;}
    if (!status){
        if (!expr_ptr->eval_to_symbol(var_ptr))
        {
            out_err_header("INT009");
        cerr << "Non-string value for configuration symbol '"
                << name
                << "'.\n";
            status = 1;
        }}
    user_top_instance->pop_context();
    return status;}
//////////////////////////////////////////////////////////////////////
// real_out_of_range
// Returns TRUE if the real number is out of legal SPROC number range.
//////////////////////////////////////////////////////////////////////
BOOLEAN real_out_of_range(double real_val){
    return ((real_val > MAX_REAL) || (real_val < MIN_REAL));}
//////////////////////////////////////////////////////////////////////
// eval_24_bit_value
// Evaluate an expression, whether real or integer, to a 24-bit value.
// Returns 0 if an error in computing the value, and a positive error
// code.
//////////////////////////////////////////////////////////////////////
int eval_24_bit_value(expr* e, long* val_ptr, int* reloc_type,
                              int* reloc_level, BOOLEAN* is_real){
    doublereal_val;
    long  val = 0, overflow_bits;
    expr_element value;
    // assume we don't have a real value
    *is_real = FALSE;

    // default 24-bit value is 0
    *val_ptr = 0;

    // assume reloc level is 0 and type is absolute location
    *reloc_type = ABSOLUTE;
    *reloc_level = 0;
```

```
if (!e)
      return NULL_EXPR;
// evaluate the expression
if (!e->eval(&value)){
      // eval error, so return error code, which is an integer value
      // unless value is simply not known yet
      if (value.error_code() == NUM_VALUE_NOT_KNOWN)
            *reloc_type = UNDEFINED;
      return value.error_code();}
// pass caller relocation info
*reloc_type = value.what_reloc_type();
*reloc_level = e->what_reloc_level();
switch(value.what_type()){
      case SYMBOL_VALUE:
            *reloc_type = UNDEFINED;
            return NUM_VALUE_NOT_KNOWN;
      case INT_VALUE:
            val = value.int_value();
            break;
      case REAL_VALUE:
            // immediate value is real, so make sure it's in range
            real_val = value.real_value();
            *is_real = TRUE;
            if (real_out_of_range(real_val))
                  return REAL_OUT_OF_RANGE;
            // get 24 bit integer equivalent of real value
            val = (long) (real_val * REAL_FACTOR);
            break;
      default:
            return COULD_NOT_EVAL;}
// make sure value will fit in 24 bits
overflow_bits = val & ~WORD_MASK;
// check if overflow and not just sign extension
if (overflow_bits && (overflow_bits != NEG_WORD_OVERFL))
      return OVERFLOW;
// return 24 bit value
*val_ptr = val;
return VALUE_OK;}
///////////////////////////////////////////////////////////////////
```

```
// should_partition_design
// Evaluate if we should partition the design. Don't partition if user's
// top level block is a GSP block (manual partitioning).
// Returns FALSE if no.
////////////////////////////////////////////////////////////////////
BOOLEANshould_partition_design(){
    if (no_partition)
        return FALSE;
    // get ptr to our child, which is the user's top level block
    if (user_top_instance == (instance*) NULL)
        return FALSE;
    return !(user_top_instance->prototype()->is_manual_block());}
}
/* intrface.h
**
** C language interface to C++ classes
**
** T. Montlick
** 10/31/89
*/
/* source code control: @(#)intrface.h1.56 10/7/91 */
#define INTRFACE_DEF
/* storage type codes used for linker */
#defineRELATIVE1
#defineABSOLUTE0
#defineUNDEFINED-1
/* use function prototypes for C++ */
#ifdef __cplusplus
class arg_set;
class block;
/* declaration of external functions which deal with expressions */
extern struct expr*real_to_expr(double numb);
extern struct expr*int_to_expr(long numb);
extern long         int_value(expr* c);
extern double     real_value(expr* c);
extern int          what_reloc_level(expr* c);
extern struct expr* string_to_expr(string* s);
extern struct expr* operator_to_expr(char op);
extern struct expr* concat_expr(expr* expr1, expr* expr2);
```

```
extern BOOLEANreal_out_of_range(double real_val);
extern int              eval_24_bit_value(expr* e, long* val_ptr,
                                  int* reloc_type, int* reloc_level, BOOLEAN* is_real);
/* functions which deal with strings */
extern struct string*new_string(char* s);
extern struct string*concat_string(string* s1, string* s2);
extern void       delete_string(string* s);
/* functions which interface to block class (the current block) */
extern BOOLEANset_block_name(string* n);
extern BOOLEANadd_storage_name(string* name, expr* size, int* index,
                                  char type, BOOLEAN is_micro, BOOLEAN is_variable);
extern BOOLEANadd_io_name(string* name, int* offset,BOOLEAN is_micro);
extern BOOLEANset_io_size_and_direction(string* name, expr* size,
                                  int dir);
extern void             set_io_init_value(int i, expr* e);
extern BOOLEANadd_param_name(string* name, int* offset);
extern void             finish_adding_params();
extern BOOLEANadd_symbol_name(string* name, int* offset,
                                  BOOLEAN is_micro);
extern void             add_storage_init(int location, expr* expr_ptr);
extern BOOLEANadd_expression_name(string* name, expr* expr_ptr);
extern int              add_operand_value(expr* expr_ptr);
extern BOOLEANadd_label_name(string* name, int address);
extern BOOLEANadd_alias_name(string* new_name, string* equiv_name);
extern void             add_verify_expression(expr* expr_ptr,
                                  string* fail_string);
extern BOOLEANset_duration(expr* duration);
extern int              assign_label_index(string* name);
extern void             enter_fields(int index, int line_num, int opcode,
                                  int addr_mode, int operand, int reloc_level);
extern structexpr*translation(string* name);
extern BOOLEANknown_symbol(string* name);
extern BOOLEANtranslation_known(string* name);
extern int              storage_error(char* msg_code, int loc, char* s);
extern BOOLEANfinish_asm_block();
extern void             set_origin(int org);
extern void             set_phantom();
extern void             set_as_virtual_io();
extern BOOLEANis_absolute();
```

```
extern int            instr_number();
extern void           advance_instr_number();
extern BOOLEANset_timezone(expr* name, expr* rate);
extern BOOLEANset_as_port(expr* port_num, expr* trigger,
                              BOOLEAN is_output, expr* config,
                              expr* entry_size);
extern void           set_gpio(expr* num, BOOLEAN is_output);
extern void           set_rts(expr* num, BOOLEAN is_output);
extern BOOLEANset_compute_line(expr* num);
extern void           enter_define(string* new_name, string* value);
extern BOOLEANfind_define(string* name, char** value);
/* functions which interface to arg_set class (the current arg_set) */
extern void           new_arg_set(BOOLEAN store_by_name);
extern BOOLEANadd_posit_expr(expr* e);
extern BOOLEANadd_named_expr(string* name, expr* e);
/* functions which interface to block_ref class (the current block_ref) */
extern void           new_block_ref(string* blck_name, string* inst_name,
                              int l);
extern BOOLEANstore_vals(arg_set* p);
extern BOOLEANstore_ports(arg_set* p);
extern BOOLEANsave_this_block_ref();
/* functions which set the current block and push/pop the block stack */
extern void       push_block(block* b);
extern void       add_block(block* b);
extern void           pop_block();
extern void           new_hier_block();
extern void           new_asm_block();
extern void           new_call_block();
extern void           new_subr_block();
extern void           new_seq_block();
extern void           new_gsp_block();
extern BOOLEAN end_of_block();
extern BOOLEANend_of_asm_section();
/* misc */
externBOOLEAN push_file(string* f_name, string** path_ptr);
externBOOLEAN         pop_file();
extern BOOLEAN        open_in_file(string* f_name, string** path_ptr);
extern int            get_config_constant(string name, long* var_ptr);
extern int            get_config_string(string name, string** var_ptr);
```

```
extern int              get_user_config_constant(string name, long* var_ptr);
extern int              get_user_config_string(string name, string** var_ptr);
externBOOLEAN           should_partition_design();
// extern long     atol(char*);
// externdouble    atof(char*);
#else
/* declaration of external functions which deal with expressions */
extern struct expr*real_to_expr();
extern struct expr*int_to_expr();
extern long             int_value();
extern double    real_value();
extern int              what_reloc_level();
extern struct expr* string_to_expr();
extern struct expr* operator_to_expr();
extern struct expr* concat_expr();
extern BOOLEANreal_out_of_range();
extern int              eval_24_bit_value();
/* functions which deal with strings */
extern struct string*new_string();
extern struct string*concat_string();
extern void       delete_string();
/* functions which interface to block class (the current block) */
extern BOOLEANset_block_name();
extern BOOLEANadd_storage_name();
extern BOOLEANadd_io_name();
extern BOOLEANset_io_size_and_direction();
extern void             set_io_init_value();
extern BOOLEANadd_param_name();
extern void             finish_adding_params();
extern BOOLEANadd_symbol_name();
extern void             add_storage_init();
extern BOOLEANadd_expression_name();
extern int              add_operand_value();
extern BOOLEANadd_label_name();
extern BOOLEANadd_alias_name();
extern void             add_verify_expression();
extern BOOLEANset_duration();
extern int              assign_label_index();
extern void             enter_fields();
```

```
extern structexpr*translation();
extern BOOLEANknown_symbol();
extern BOOLEANtranslation_known();
extern int             storage_error();
extern BOOLEANfinish_asm_block();
extern void            set_origin();
extern void            set_phantom();
extern void            set_as_virtual_io();
extern BOOLEANis_absolute();
extern int             instr_number();
extern void            advance_instr_number();
extern BOOLEANset_timezone();
extern BOOLEANset_as_port();
extern void            set_gpio();
extern void            set_rts();
extern BOOLEANset_compute_line();
extern void            enter_define();
extern BOOLEANfind_define();
/* functions which interface to arg_set class (the current arg_set) */
extern void            new_arg_set();
extern BOOLEANadd_posit_expr();
extern BOOLEANadd_named_expr();
/* functions which interface to block_ref class (the current block_ref) */
extern void            new_block_ref();
extern BOOLEANstore_vals();
extern BOOLEANstore_ports();
extern BOOLEANsave_this_block_ref();
/* functions which set the current block and push/pop the block stack */
extern void        push_block();
extern void        add_block();
extern void            pop_block();
extern void            new_hier_block();
extern void            new_asm_block();
extern void            new_subr_block();
extern void            new_call_block();
extern void            new_seq_block();
extern void            new_gsp_block();
extern BOOLEAN end_of_block();
extern BOOLEANend_of_asm_section();
```

```
/* misc */
externBOOLEAN       push_file();
externBOOLEAN       pop_file();
extern BOOLEAN      open_in_file();
extern int          get_config_constant();
extern int          get_config_string();
extern int          get_user_config_constant();
extern int          get_user_config_string();
externBOOLEAN       should_partition_design();
extern long         atol();
externdouble        atof();
#endif
/* pointer to current block */
externstruct block*cur_block;
/* pointer to current arg_set (for block_ref arguments) */
externstruct arg_set*cur_arg_set;
/* pointer to current block_ref */
extern struct block_ref*cur_block_ref;

/* parser variables: */
externint       line;           /* line number for current place in parse */
externint       instr_line;     /* line # of current instruction */
extern BOOLEANvalues_must_be_known;
externBOOLEANmake_listing;

// intrface.hxx
// C language interface to C++ classes
// T. Montlick
// 10/31/89
/* source code control: @(#)intrface.hxx1.56 10/7/91 */
#define INTRFACE_DEF
#ifndef STRING_DEF
#include "string.hxx"
#endif
#ifndef EXPR_DEF
#include "expr.hxx"
#endif
#ifndef BLOCK_DEF
#include "block.hxx"
```

```
#endif
#ifndef BLOCK_REF_DEF
#include "blck_ref.hxx"
#endif
#ifndef BLOCK_STACK_DEF
#include "blckstak.hxx"
#endif
#ifndef FILE_STACK_DEF
#include "filestak.hxx"
#endif
#ifndef BLOCK_ARRAY_DEF
#include "blck_arr.hxx"
#endif
#ifndef BLOCK_HASH_DEF
#include "blckhash.hxx"
#endif
#ifndef INSTANCE_DEF
#include "instance.hxx"
#endif
#ifndef ZONE_DEF
#include "zone.hxx"
#endif
#ifndef ZONE_ARRAY_DEF
#include "zone_arr.hxx"
#endif
extern "C"{
class flags;
class zones;
class gsps;
class io_bits;
// max size for filename
#define MAX_NAME_SIZE100
// max size for a hierarchical symbol name
#defineMAX_HIER_NAME_SIZE50
// max depth for include files
#defineMAX_FILE_DEPTH9
/* storage type codes used for linker */
#defineRELATIVE1
#defineABSOLUTE0
```

```
#defineUNDEFINED-1
/* special line number which means no line */
#define NO_LINE-1
/* default percent error to allow for sample clocks */
#define DEFAULT_CLOCK_ERROR1
/* default count of instances before calling subr., if available */
#defineDEFAULT_SUBR_COUNT 3
/* declaration of external functions which deal with expressions */
extern struct expr*real_to_expr(double numb);
extern struct expr*int_to_expr(long numb);
extern long             int_value(expr* e);
extern double       real_value(expr* e);
extern int              what_reloc_level(expr* e);
extern struct expr* string_to_expr(string* s);
extern struct expr* operator_to_expr(char op);
extern struct expr* concat_expr(expr* expr1, expr* expr2);
extern BOOLEANreal_out_of_range(double real_val);
extern int              eval_24_bit_value(expr* e, long* val_ptr,
                                int* reloc_type, int* reloc_level, BOOLEAN* is_real);
/* functions which deal with strings */
extern struct string*new_string(char* s);
extern struct string*concat_string(string* s1, string* s2);
extern void         delete_string(string* s);
/* functions which interface to block class (the current block) */
extern BOOLEANset_block_name(string* n);
extern BOOLEANadd_storage_name(string* name, expr* size, int* index,
                                char type, BOOLEAN is_micro, BOOLEAN is_variable);
extern BOOLEANadd_io_name(string* name, int* offset,
                                BOOLEAN is_micro);
extern BOOLEANset_io_size_and_direction(string* name, expr* size,
                                int dir);
extern void             set_io_init_value(int i, expr* e);
extern BOOLEANadd_param_name(string* name, int* offset);
extern void             finish_adding_params();
extern BOOLEANadd_symbol_name(string* name, int* offset,
                                BOOLEAN is_micro);
extern void             add_storage_init(int location, expr* expr_ptr);
extern BOOLEANadd_expression_name(string* name, expr* expr_ptr);
extern int              add_operand_value(expr* expr_ptr);
```

```
extern BOOLEANadd_label_name(string* name, int address);
extern BOOLEANadd_alias_name(string* new_name, string* equiv_name);
extern void             add_verify_expression(expr* expr_ptr,
                                  string* fail_string);
extern BOOLEANset_duration(expr* duration);
extern int              assign_label_index(string* name);
extern void             enter_fields(int index, int line_num, int opcode,
                                  int addr_mode, int operand, int reloc_level);
extern structexpr*translation(string* name);
extern BOOLEANknown_symbol(string* name);
extern BOOLEANtranslation_known(string* name);
extern int              storage_error(char* msg_code, int loc, char* s);
extern BOOLEANfinish_asm_block();
extern void             set_origin(int org);
extern void             set_phantom();
extern void             set_as_virtual_io();
extern BOOLEANis_absolute();
extern int              instr_number();
extern void             advance_instr_number();
extern BOOLEANset_timezone(expr* name, expr* rate);
extern BOOLEANset_as_port(expr* port_num, expr* trigger,
                                  BOOLEAN is_output, expr* config,
                                  expr* entry_size);
extern void             set_gpio(expr* num, BOOLEAN is_output);
extern void             set_rts(expr* num, BOOLEAN is_output);
extern BOOLEANset_compute_line(expr* num);
extern void             enter_define(string* new_name, string* value);
extern BOOLEANfind_define(string* name, char** value);
extern void             set_decimating(expr* ratio);
extern void             set_interpolating(expr* ratio);
/* functions which interface to arg_set class (the current arg_set) */
extern void             new_arg_set(BOOLEAN store_by_name);
extern BOOLEANadd_posit_expr(expr* e);
extern BOOLEANadd_named_expr(string* name, expr* e);
/* functions which interface to block_ref class (the current block_ref) */
extern void             new_block_ref(string* blck_name, string* inst_name,
                                  int l);
extern BOOLEANstore_vals(arg_set* p);
extern BOOLEANstore_ports(arg_set* p);
```

```
extern BOOLEANsave_this_block_ref();
/* functions which set the current block and push/pop the block stack */
extern void        push_block(block* b);
extern void        add_block(block* b);
extern void             pop_block();
extern void             new_hier_block();
extern void             new_asm_block();
extern void             new_subr_block();
extern void             new_call_block();
extern void             new_seq_block();
extern void             new_gsp_block();
extern BOOLEAN end_of_block();
extern BOOLEANend_of_asm_section();
/* misc */
externBOOLEAN       push_file(string* f_name, string** path_ptr);
externBOOLEAN       pop_file();
extern BOOLEAN      open_in_file(string* f_name, string** path_ptr);
extern int          get_config_constant(string name, long* var_ptr);
extern int          get_config_string(string name, string** var_ptr);
extern int          get_user_config_constant(string name, long* var_ptr);
extern int          get_user_config_string(string name, string** var_ptr);
externBOOLEAN       should_partition_design();
// extern long     atol(char*);
// externdouble    atof(char*);
externstring*     strip_path(string* name);
externstring*     get_path(string* name);
/* pointer to current block */
externblock*cur_block;
/* pointer to current arg_set (for block_ref arguments) */
externarg_set*cur_arg_set;
/* pointer to current block_ref */
extern block_ref*cur_block_ref;
/* block stack, for nested blocks */
externblock_stack the_block_stack;
// file stack for nested include files
externfile_stackthe_file_stack;
// list of asm blocks, used for generating listing
extern block_array asm_block_list;
// list of blocks in the order encountered
```

```
extern block_arrayblock_list;
/* pointer to block hash table */
extern block_hashprototype_blocks;
// current input filename
extern charin_filename[MAX_NAME_SIZE];
// pointer to input filename as a string
extern string* in_filename_string;
// pointer to path string to prepend to all input files
extern string* in_path_string;
/* parser variables: */
extern int   line;                    /* line number for current place in parse */
extern int   instr_line;  /* line # of current instruction */
extern int error_count;
extern BOOLEANvalues_must_be_known;
/* pointer to top of instance tree */
extern instance*top_instance;
/* pointer to top of user's design */
extern instance*user_top_instance;
/* child index in true top block of user's top block */
externint                  users_top_block_index;
/* effective chip gsp clock rate in hz */
extern long chip_gsp_rate;
/* fifo hardware flags allocator class */
extern flags*fifo_flags;
/* gpio and rts allocators */
externio_bits*gpios;
externio_bits*rts;
/* time zones */
externzones*the_zones;
/* gsp allocator class */
externgsps*gsp_allocator;
/* makefile file stream */
externostream*makefile_stream_ptr;
/* partitioning info */
externint                  n_zones;
externint_arrayn_gsps_used;
externdouble      exact_gsps[10];
externint                  total_gsps;
/* initialization variables from init file */
```

```
externlong n_gsps;
externlong n_ports;
externlong flag_locs;
externlong io_space_start;
externlong data_space_start;
externlong code_space_start;
externlong code_space_size;
externlong data_space_size;
externlong io_space_size;
externlong first_serial_port;
externlong last_serial_port;
externlong first_in_port;
externlong n_in_ports;
externlong first_out_port;
externlong n_out_ports;
externlong first_compute_line;
externlong last_compute_line;
externlong chip_gsp_rate;
externlong max_gpio_number;
externlong max_rts_number;
externlong abs_addr_fudge;
externstring*SPROC_model;
externstring*init_version;
/* variables from the command line */
externstring*SPROC;
externstring*alt_path ;
externstring*list_file;
externstring*out_file_base;
externstring*man_file_base;
externBOOLEANverify_only;
externBOOLEANno_executable;
externBOOLEANmake_listing;
externBOOLEANverbose;
externBOOLEAN no_file_info;
externint          clock_error;
externBOOLEAN uncensored;
externBOOLEAN no_partition;
externint          deflt_subr_count;}
// long_arr.cxx
```

```
// derived class for long array
// Terry Montlick
// 10/10/89
/* source code control: */
static char SccsID[] = "@(#)long_arr.cxx1.56 10/7/91";
#include "long_arr.hxx"
// long_arr.hxx
// header for derived long array class
// T. Montlick
// 10/10/89
/* source code control: @(#)long_arr.hxx1.56 10/7/91 */
#define LONG_ARRAY_DEF
#ifndef ARRAY_DEF
#include "array.hxx"
#endif

class long_array : public array{
public:
      void  operator=(long_array& a) { array::operator= ((array&) a); }
      long&operator [] (int i) { return (long&) array::operator[] (i); }
      int                  find(long l) { return array::find( (elem) l); }
      void  append(long l){ array::append( (elem) l); }
      long_array&operator+(long_array& a)
                              { return (long_array&) array::operator+((array&) a); }
      long_array&operator+=(long_array& a) {a = *this + a; return *this; }
};
/* mystdlib.c
 *
 * Private verions of functions needed from stdlib, not available on Sun
 *
 * T. Montlick
 * 2/10/90
 */
/* source code control: */
static char SccsID[] = "@(#)mystdlib.c1.56 10/7/91";
#include <ctype.h>
#include "mystdlib.h"
/* recursive itoa with limit on number of chars */
void itoa_limit(value, string_ptr, radix, n_chars)
```

```
int          value;
char**string_ptr;
int          radix;
int          n_chars;{
      int          next_value;
      int          digit;

      /* see if limit has been reached */
      n_chars++;
      if (n_chars> ITOA_LIMIT)
            return;
      /* compute the right digit of the value */
      digit = value - (next_value = value/radix)*radix;

      value = next_value;
      /* recursively call us for remaining digits */
      if (value)
            itoa_limit(value, string_ptr, radix, n_chars);
      /* output our digit at end, converting to ASCII */
      *(*string_ptr)++ = digit + '0';
      /* add terminator, which can be overwritten by successive digits */
      **string_ptr = '\0';}
/* here is the real itoa */
char* itoa(value, string, radix)
int          value;
char* string;
int          radix;{
      int          next_value;
      int          digit;
      char* string_start;
      int          n_chars;
      n_chars = 1;
      string_start = string;

      /* if negative value, output a minus sign and work with positive number */
      if (value < 0){
            *string++ = '-';
            value = -value;
            n_chars++;}
```

```
     itoa_limit(value, &string, radix, n_chars);
     return (string_start);}
int  my_toupper(c)
char c;{
     if (islower(c))
          return toupper(c);
     else
          return c;}
/* mystdlib.h
 *
 * Private verions of functions needed from stdlib, not available on Sun
 *
 * T. Montlick
 * 2/10/90
 */
/* source code control: @(#)mystdlib.h1.56 10/7/91 */
/* max chars for itoa */
#defineITOA_LIMIT13
/* use function prototypes for C++ */
#ifdef __cplusplus
extern char* itoa(int value, char* string, int radix);
/* stick my_toupper here too, which circumvents Sun toupper bug */
extern intmy_toupper(int c);
#else
extern char* itoa();
/* stick my_toupper here too, which circumvents Sun toupper bug */
extern intmy_toupper();
#endif
// parser.cxx
/* source code control: */
static char SccsID[] = "@(#)parser.cxx1.56 10/10/91";
#ifndef BLOCK_DEF
    #include "block.hxx"
#endif
#ifndef BLOCK_HASH_DEF
    #include "blckhash.hxx"
#endif
#ifndef BLOCK_STACK_DEF
    #include "blckstak.hxx"
```

```
#endif
#ifndef BLOCK_ARRAY_DEF
      #include "blck_arr.hxx"
#endif
#ifndef UTILITY_DEF
      #include "utility.h"
#endif
#ifndef INTRFACE_DEF
      #include "intrface.hxx"
#endif
#ifndef STRING_DEF
      #include "string.hxx"
#endif
#ifndef INSTANCE_DEF
      #include "instance.hxx"
#endif
#ifndef ZONE_DEF
      #include "zone.hxx"
#endif
#ifndef ZONE_ARRAY_DEF
      #include "zone_arr.hxx"
#endif
#ifndef DEFINES_DEF
      #include "defines.hxx"
#endif
extern "C" {
#include "filefunc.h"
// #include "getenv.h"
#include "cmdline.h" }
#ifdef sun
extern "C--" {
#else
extern "C" {
#endif
#include <time.h>
#include <stdio.h>
#include <stdlib.h> }
#include <new.hxx>
#ifndef _FKIND
```

```
    #define _FKIND
#endif
extern "C" intyyparse();
#define LINK
//#define OLD
#ifdef DOS
#include <sys\types.h>
#else
#include <sys/types.h>
#endif
#defineINIT_BASE"init"
#defineINIT_EXT"sdl"
//#defineDIRECTORY_ENV"SPR_LIB"
// define for new external release
//#define RELEASE
// define for uncontrolled test version
#undef TESTREL
//#define TESTREL
// if RELEASE defined, use version # from next line, else use SCCS version #
#ifdefRELEASE
#define VERSION_STRING"SCHEDULE Version 1.0"
#else
#ifdef TESTREL
#define VERSION_STRING"SCHEDULE Internal Uncontrolled Version 1.54b"
#else
#define VERSION_STRING"SCHEDULE Revision 1.56a"
#endif
#endif
//define COPYRIGHT_STRING "Copyright (C) 1991 by STAR Semiconductor Corporation\n\n"
#define LOG_FILE_NAME"schedule.log"
// hardware configuration info names from the init file
#define N_GSPS        "_%n_gsps"
#define FLAG_LOCS"_%flag_locs"
#defineCODE_SPACE_START"_%code_space_start"
#defineIO_SPACE_START"_%io_space_start"
#defineDATA_SPACE_START"_%data_space_start"
#defineCODE_SPACE_SIZE"_%code_space_size"
#defineIO_SPACE_SIZE"_%io_space_size"
#defineDATA_SPACE_SIZE"_%data_space_size"
```

```
#defineFIRST_SERIAL_PORT"_%first_serial_port"
#defineLAST_SERIAL_PORT"_%last_serial_port"
#defineFIRST_IN_PORT"_%first_in_port"
#defineN_IN_PORTS  "_%n_in_ports"
#defineFIRST_OUT_PORT"_%first_out_port"
#defineN_OUT_PORTS"_%n_out_ports"
#defineFIRST_COMPUTE_LINE"_%first_compute_line"
#defineLAST_COMPUTE_LINE"_%last_compute_line"
#defineCHIP_GSP_RATE"_%chip_gsp_rate"
#defineINIT_VERSION"_%init_version"
#defineSPROC_MODEL"_%sproc_model"
#define ABS_ADDR_FUDGE"_%abs_addr_fudge"
BOOLEANhelp = FALSE;
////////////////////////////////////////////////////////////////////
// any_block_not_present
// Scan the blocks for any block reference not present.
// Start at block j, where j is a by-name argument modified by this routine.
// Also sets the block ptr in each block ref.
// If found one, return it.
////////////////////////////////////////////////////////////////////
string* any_block_not_present(int& j){
	string*	s = 0;
	for (int i=j; i<block_list.size(); i++){
		if (s = block_list[i]->verify_block_refs())
			break;}
	return s;}
////////////////////////////////////////////////////////////////////
// output_rest_of_listing
// Copy an input stream to an output listing stream.
////////////////////////////////////////////////////////////////////
void output_rest_of_listing(istream& in, ostream& out){
	char	ch;
	BOOLEANnewline = FALSE;

	while (in.get(ch)){
		if (newline)

			// on newline, output left margin pad spaces
			out << " ";
```

```
            newline = FALSE;
        }
        out.put(ch);
        if (ch == '\n')
            newline = TRUE;
    }}
//////////////////////////////////////////////////////////////////////
// compile
// Compile the given file, recursively opening referenced files
// as necessary.
//////////////////////////////////////////////////////////////////////
int compile(char* filename, BOOLEAN list){
    int     status = 0;
    extern FILE*yyin;
    filebufinbuf;
    filebuflisting_file;
    char  list_filename[MAX_NAME_SIZE];
    char  new_filename[MAX_NAME_SIZE];
    char  name[MAX_NAME_SIZE];
    char  extension[MAX_NAME_SIZE];
    int         list_line;
    string*missing_blockname;
    int         file_count = 0;
    int         from_block = 0;  // starting block for blocks present check
//  string*alt_name;
    // we don't need to know all values at compile time
    values_must_be_known = FALSE;
    strncpy(in_filename, filename, MAX_NAME_SIZE);
    while (strcmp(in_filename, "") != 0){
        file_count++;
        // make sure filename has the extension ".SDL" if no other
        splitname(in_filename, name, extension);
        if (strcmp(extension, "") == 0)
            mergename(in_filename, name, ".sdl");
        // make the input filename available to the blocks which get created
        in_filename_string = new string(in_filename);
        // no current line
        line = NO_LINE;
        // open input file (with file pointer yyin for lex)
```

```
if (!open_in_file(in_filename_string, &in_filename_string))
{
    out_err_header("PAR001");
    cerr << "Unable to open input file '"
        << *in_filename_string << "'\n";
    return 1;
}
// call the parser
status |= yyparse();
// parser is done with it, so close the input file
fclose(yyin);
// no current input file
in_filename_string = (string*) NULL;
// if this file first and also has any an assembly block, make listing
if (file_count == 1 && asm_block_list.size() > 0 && list)
{
    // init line count for listing
    list_line = 0;
    // reopen input file as a stream for C++ so we can generate listing
    if (!inbuf.open(in_filename, input))
    {
//          // couldn't open, so try with alternate path name prepended
//          alt_name = new string("");
//          *alt_name = *alt_name + *alt_path + in_filename;
//          if (!inbuf.open(&(*alt_name)[0], input))
        {
                out_err_header("PAR002");
                cerr << "Unable to open the input file for the listing!\n";
                error_count++;
                break;
        }
    }
    istream in(&inbuf);
    splitname(in_filename, name, extension);
    // use list file name, if present
    if (*list_file == "")
    {
        *list_file = name;
    }
```

```
splitname(&(*list_file)[0], name, extension);
if (extension[0] == '\0')
      mergename(list_filename, name, ".lst");
else
      mergename(list_filename, name, extension);
if (listing_file.open(list_filename, output) == 0)
{
      out_err_header("PAR003");
      cerr << "Unable to open listing file '"
                  << list_filename <<"'.\n";
      error_count++;
      break;
}
{
      // create stream for listing which closes when we exit scope
      ostream listing(&listing_file);

      // call the listing routine with the input stream
      // for all blocks which use this file
      for (int i=0; i<asm_block_list.size(); i++)
      {
                  if (*asm_block_list[i]->get_filename() == in_filename)
                  {
                  push_block(asm_block_list[i]);
                  status |= ((asm_block*) cur_block)->out_listing(in,
                  listing, list_line);
                  pop_block();
                  }
      }
      // output any remaining portion of listing file
      output_rest_of_listing(in, listing);
      // close the input file
      inbuf.close();
}
}
// check all new blocks for any reference to a block not present.
// but only if no errors to prevent recursive file opening errors
if (!status)
{
```

```
                if (missing_blockname = any_block_not_present(from_block))
                {
                    // found a missing block, so build a filename from its name
                    strncpy(name, &((*missing_blockname)[0]), MAX_NAME_SIZE);
                    mergename(new_filename, name, ".sdl");
                    // see if this is same as previous
                    if (strcmp(new_filename, in_filename) == 0)
                    {
                                // it was, so we didn't find the block where it should be!
                                out_err_header("PAR004");
                                cerr << "Couldn't find the block '"
                                 << *missing_blockname <<"' in the file '"
                                 << in_filename <<"'!\n";
                                error_count++;
                                break;
                    }
                    else
                                strcpy(in_filename, new_filename);
                }
                else
                    strcpy(in_filename, "");
        }
        else
                break;}
    status |= error_count;
    return status;}
//////////////////////////////////////////////////////////////////////////////
// call_user_top
// Call the user's top level block within the real top level block.
//////////////////////////////////////////////////////////////////////////////
BOOLEAN call_user_top(block* true_top, block* user_top, int* which_child_ptr){
    block_ref*ref_ptr;
    string*     name;
    string*     inst_name;
    arg_set*vals;
    arg_set*ports;
    int             ln;
    string      top_block_name("_user_top");
    BOOLEANstatus = FALSE;
```

```
    int                which_child = 0;
    true_top->refs_iter_init();
    // get each block name instantiated by true top level block
    while (true_top->next_ref(&ref_ptr)){
        ref_ptr->get_block_info(&name, &inst_name, &vals, &ports, &ln);
        // see if reference to special "_user_top"
        if (top_block_name == *name)
        {
            // it is, so substitute user top block's real name!
            ref_ptr->change_block_name(user_top->get_block_name());

            status = TRUE;
            break;
        }
        which_child++;}
    // return which is child is user's top block to caller
    *which_child_ptr = which_child;
    return status;
}
//////////////////////////////////////////////////////////////////////
// instantiate
// Create the instance tree from the block list.
// Mark blocks instantiated by other blocks.
// Find the block which is not instantiated by any other block. This is
// the top level block.
// Build the instance tree with its root at the top level block.
//////////////////////////////////////////////////////////////////////
int   instantiate(){
    int            i;
    block*         blk;
    string*        name;
    string*        inst_name;
    arg_set*vals;
    arg_set*ports;
    int            ln;
    block_ref*ref_ptr;
    block*         ref_block;
    block*         top_level_block = NULL;
    instance*bad_block_instance;
```

```
string      top_string("_true_top");
string      phantom_top_string("_top");
int              status = 0;
// first mark all blocks instantiated by other blocks
for (i=0; i<block_list.size(); i++){
      blk = block_list[i];
      blk->refs_iter_init();
      // get each block name instantiated by this block
      while (blk->next_ref(&ref_ptr))
      {
            ref_ptr->get_block_info(&name, &inst_name, &vals, &ports, &ln);

            if (prototype_blocks.find(*name, &ref_block))
                  ref_block->set_as_instantiated();
            else
            {
                  out_err_header("PAR005");
                  cerr << "Unable to find the block named '"
                              << *name << "'\n";
                  return 1;
            }
      }}
// now scan for blocks which are not instantiated
// there should be just one of these, which is the top level block
for (i=0; i<block_list.size(); i++){
      blk = block_list[i];
      // ignore phantom block declarations, which may not get instantiated
      if (blk->is_phantom())
            ;
      // also ignore subroutine and subroutine call blocks
      else if (blk->is_subr_block())
            ;
      else if (blk->is_call_block())
            ;
      else if (!blk->is_it_instantiated())
      {
            // make sure we don't have one already
            if (!top_level_block)
                  top_level_block = blk;
```

```
            else
            {
                  out_err_header("PAR006");
                  cerr << "More than one top level block: \n"
                              << " "
                              << *top_level_block->get_block_name() << " and "
                              << *blk->get_block_name() << "\n";
                  return 1;
            }
      }}
if (!top_level_block){
      out_err_header("PAR007");
      cerr << "No top level block!\n";
      return 1;}
// we now have a top level block, so we can build the instance tree!
// First, though, we must find the phantom block "_top" which is the
// true top level block. This phantom block can declare storage names
// (which initially map to SPROC I/O space) so that all blocks may
// see these names.
if (!prototype_blocks.find(phantom_top_string, &ref_block)){
      out_err_header("PAR008");
      cerr << "Cannot find the phantom block '_top'.\n";
      return 1;}
// now make this block instantiate the user's top level block
if (!call_user_top(ref_block, top_level_block, &users_top_block_index)){
      out_err_header("PAR009");
      cerr << "Phantom block '_top' is corrupted.\n";
      return 1;}
// now instantiate the true top level block
top_instance = new instance(ref_block, top_string, NULL, 0);
// create the fifo flags allocator, which uses top_instance
fifo_flags = new flags();
// create gpio and rts allocators
gpios = new io_bits();
rts = new io_bits();
// build the tree
if (bad_block_instance = top_instance->build_tree()){
      out_err_header("PAR010");
      cerr << "Block '"
```

```
                << *bad_block_instance->prototype()->get_block_name()
                << "' eventually includes itself!\n";
            return 1;}
    // save a pointer to the user's top level block
    user_top_instance = top_instance->get_child(users_top_block_index);
    // Top level block has no I/O, but we must pretend its I/O is to
    // port blocks so the top level block will get sequenced just like
    // any other block.
    status |= top_instance->add_top_level_inputs();
    return status;}
////////////////////////////////////////////////////////////////////
// get_configuration
// Evaluate the SPROC configuration constants read from the init file.
////////////////////////////////////////////////////////////////////
int get_configuration(){
    int                 status = 0;
    status |= get_config_constant(N_GSPS, &n_gsps);
    if (!status)
        status |= get_config_constant(FLAG_LOCS, &flag_locs);
    if (!status)
        status |= get_config_constant(IO_SPACE_START, &io_space_start);
    if (!status)
        status |= get_config_constant(DATA_SPACE_START, &data_space_start);
    if (!status)
        status |= get_config_constant(CODE_SPACE_START, &code_space_start);
    if (!status)
        status = get_config_constant(IO_SPACE_SIZE, &io_space_size);
    if (!status)
        status = get_config_constant(DATA_SPACE_SIZE, &data_space_size);
    if (!status)
        status = get_config_constant(CODE_SPACE_SIZE, &code_space_size);
    if (!status)
        status |= get_config_constant(FIRST_SERIAL_PORT, &first_serial_port);
    if (!status)
        status |= get_config_constant(LAST_SERIAL_PORT, &last_serial_port);
    if (!status)
        status |= get_config_constant(FIRST_IN_PORT, &first_in_port);
    if (!status)
        status |= get_config_constant(N_IN_PORTS, &n_in_ports);
```

```
        if (!status)
                status |= get_config_constant(FIRST_OUT_PORT, &first_out_port);
        if (!status)
                status |= get_config_constant(N_OUT_PORTS, &n_out_ports);
        if (!status)
                status |= get_config_constant(FIRST_COMPUTE_LINE, &first_compute_line);
        if (!status)
                status |= get_config_constant(LAST_COMPUTE_LINE, &last_compute_line);
        if (!status)
                status |= get_config_constant(CHIP_GSP_RATE, &chip_gsp_rate);
        if (!status)
                status |= get_config_string(SPROC_MODEL, &SPROC_model);
        if (!status)
                status |= get_config_string(INIT_VERSION, &init_version);
// get fudge factor for absolute addresses
        if (!status)
                status |= get_config_constant(ABS_ADDR_FUDGE, &abs_addr_fudge);
        // set # of ports from first and last ports
        if (!status)
                n_ports = last_serial_port - first_serial_port + 1;
        return status; }
////////////////////////////////////////////////////////////////////
// evaluate_and_connect
// Evaluate parameters passed to each instance.
// Compute contents of blocks, evaluate storage and I/O requirements,
// durations, and code sizes.
// Wire the connections between blocks and between instances.
////////////////////////////////////////////////////////////////////
int     evaluate_and_connect() {
        int             status = 0;
        // compute override symbols passed to each instance
        status |= top_instance->evaluate_overrides();
        // compute contents of each instance
        if (!status)
                status |= top_instance->compute_contents();
        if (!status)
                status |= top_instance->process_subroutines();
        if (!status)
                status |= top_instance->process_exports();
```

```
// re-compute override symbols passed to each instance
if (!status)
      status |= top_instance->evaluate_overrides();
// re-compute contents of each instance
if (!status)
      status |= top_instance->compute_contents();
// wire up the connections between instances
if (!status)
      status |= top_instance->wire_connections();
// also set any storage for virtual I/O blocks
if (!status)
      status |= top_instance->set_virtual_io();
// finally set any pseudo-sampled output init values for connected wires
if (!status)
      status |= top_instance->set_pseudo_sampled_init();
return status;}

//////////////////////////////////////////////////////////////////////
// sequence
// Sequence children in block prototypes.
// Then copy this sequence into each instance, since it may get modified
// if phantom blocks are added.
//////////////////////////////////////////////////////////////////////
int   sequence(){
      int             status = 0;
      BOOLEANnew_rate;// args for sequence_children
      // next, determine the sequence of child block firing in each
      // hierarchical block
      status |= top_instance->prototype()->sequence_children(&new_rate);
      // now call each instance to copy in its sequence if hierarchical
      if (!status)
            status |= top_instance->copy_in_sequence();
      return status;}
//////////////////////////////////////////////////////////////////////
// print_zone_list
// Output a master zone name and all its subzones.
//////////////////////////////////////////////////////////////////////
void print_zone_list(zone* z, ostream& out){
      int             i;
```

```
    zone*       next;
    for (i=0; i<z->n_next_zones(); i++){
        next = z->next_zone(i);
        out << *next->get_zone_name() << " ";
        print_zone_list(next, out);}
}
//////////////////////////////////////////////////////////////////////
// partition
// Do temporal partitioning. Create the time zones, partition them, and
// report results to user.
//////////////////////////////////////////////////////////////////////
int     partition(){
    int                 status = 0;
    int                 i, j;
    double      exactly;
    zone*       the_zone;
    // create the time zones class
    the_zones = new zones();
    // also create the gsp number allocator
    gsp_allocator = new gsps();
    status = the_zones->create_and_partition_zones(&n_zones,
                                    &n_gsps_used, exact_gsps);
    if (!status){
        for (i=0; i<n_zones; i++)
        {
            the_zone = the_zones->get_zone(i);
            total_gsps += n_gsps_used[i];
            cerr << "Zone " << *the_zones->get_zone_name(i);
            // if master zone, include names of sub-zones
            if (the_zone->is_master_zone())
            {
                cerr << " (plus ";
                print_zone_list(the_zone, cerr);
                cerr << ")";
            }
            cerr << " partitioned onto "
                << n_gsps_used[i];
            if (n_gsps_used[i] == 1)
                cerr << " GSP. ";
```

```
else
      cerr << " GSPs. ";

// print exact # of GSPs
// minimum utilization is X.1 if any remainder over X but < 0.05
exactly = exact_gsps[i] - n_gsps_used[i] + 1;
if ((exactly < 0.05) && (exactly > 0.0))
      exactly = 0.1;
exactly += n_gsps_used[i] - 1;
cerr << "(Utilization is "
       << form("%.1f", exactly)
       << " GSPs)\n";
if (uncensored)
{
      cerr << "Maximum segment cycles are "
                  << the_zones->max_cycles(i) << ".\n";
      cerr << " Segment 0 (part 1)"
                  << " cycles are "
                  << the_zones->cycles_used_in_seg(i, 0)
                  << ".\n";
      for (j=1; j<the_zones->n_segments(i); j++)
      {
                 cerr << " Segment " << j
                  << " cycles are "
                  << the_zones->cycles_used_in_seg(i, j)
                  << " (including "
                  << the_zones->overhead_allowed_for_in_seg(i, j)
                  << " for inter-segment overhead).\n";
      }
      cerr << " Segment 0 (part 2)"
                  << " cycles are "
                  << the_zones->cycles_used_in_seg(i,
                 the_zones->n_segments(i))
                  << ".\n";
}
}
if (total_gsps > n_gsps)
{
      out_err_header("PAR011");
```

```
                cerr << "Partitioning requires "
                     << total_gsps
                     << " GSPs, but there are only "
                     << n_gsps
                     << " available on\n"
                     << " SPROC '"
                     << *SPROC_model
                     << "'.\n";
                status = ERROR_STATUS;
        }}
    return status;}
//////////////////////////////////////////////////////////////////////
// just_create_zones
// No partitioning, so just create the time zones, and
// report results to user.
//////////////////////////////////////////////////////////////////////
int     just_create_zones(){
    int             status = 0;
    int             i;
    int             n_zones = 0;
    // create the time zones class
    the_zones = new zones();
    // also create the gsp number allocator
    gsp_allocator = new gsps();
    if (!top_instance->make_manual_sequence())
        status = 1;
    if (!status){
        if (!the_zones->create_time_zones(&n_zones))
        status = 1;}
    if (!status)
        status = the_zones->initialize_all_fifo_info();
    if (!status)
        status = the_zones->initialize_port_registers();
    if (!status){
        cerr << "\n";
        for (i=0; i<n_zones; i++)
        {
            cerr << "Zone "
                 << *the_zones->get_zone_name(i)
```

```
                << " manually partitioned.\n\n";
        }}
    return status;}
///////////////////////////////////////////////////////////////////////
// reevaluate
// Reevaluate contents of blocks after temporal partioning, which has
// created phantom blocks. This creates contents for phantom block instances,
// and recomputes sizes.
///////////////////////////////////////////////////////////////////////
int     reevaluate(){
    return top_instance->compute_contents();}
///////////////////////////////////////////////////////////////////////
// percent
// Compute fractional percent of the ratio of two integers.
///////////////////////////////////////////////////////////////////////
int percent(int part, int total){
    doublepart_double;
    doubletotal_double;
    int         result;
    part_double = (double) part;
    total_double = (double) total;
    result = (int) round( (part_double*100/total_double) );
    return result;}
///////////////////////////////////////////////////////////////////////
// generate_code_and_data
// Set starting addresses for code and data.
// Output generated code and data.
///////////////////////////////////////////////////////////////////////
int     generate_code_and_data(){
    int             status = 0;
    filebuf     pgm_file;
    filebuf     dat_file;
    int             data_locs;
    int             code_locs;
    int             exec_time;
    int             overhead_time;
    int             init_code;
    int             overhead_code;
    int             appl_code;
```

```
    int             appl_data;
    int             overhead_data;
    string          program_file_name;
    string          data_file_name;
    string          symbol_file_name;
    string          man_file_name;
    char            name[MAX_NAME_SIZE];
    char            extension[MAX_NAME_SIZE];
    char            filename[MAX_NAME_SIZE];
#ifndef OLD
    void output_zone_record(int zone_num, ostream& out);
#endif
    // we need to know all values at code generation time
    values_must_be_known = TRUE;
    // compute starting locations for instructions and data
    top_instance->compute_code_locations((int) code_space_start, NO_TIME_ZONE);
    top_instance->compute_data_locations((int) io_space_start);
    // make filenames for output files
    program_file_name = *out_file_base;
    program_file_name = program_file_name + ".spp";
    data_file_name = *out_file_base;
    data_file_name = data_file_name + ".spd";
    symbol_file_name = *out_file_base;
    symbol_file_name = symbol_file_name + ".sps";
    // open files to generate code
    if (pgm_file.open(&program_file_name[0], output) == 0){
        out_err_header("PAR012");
        cerr << "Unable to open '" << program_file_name << "' output file.\n";
        status = 1;}
    if (!status){
        if (dat_file.open(&data_file_name[0], output) == 0)
        {
            out_err_header("PAR013");
            cerr << "Unable to open '" << data_file_name << "' output file.\n";
            status = 1;

    if (!status){
        ostream code(&pgm_file);
        if (!status)
```

```
{
        if (verbose)
                cerr << "Generating program file.\n";
        status = top_instance->generate_code(code, NO_TIME_ZONE);
        check_ostream(code);
}}
if (!status){
        ostream data(&dat_file);
        if (!status)
        {
                if (verbose)
                        cerr << "Generating data file.\n";
                status = top_instance->generate_data(data);
                check_ostream(data);
        }}
if (!status){
        // open file for symbols
        filebuf                 sym_file;

        if (sym_file.open(&symbol_file_name[0], output) == 0)
        {
                out_err_header("PAR014");
                cerr << "Unable to open '" << symbol_file_name
                        << "' output file.\n";
                status = 1;
        }
        ostream symbols(&sym_file);
        if (!status)
        {
                if (verbose)
                        cerr << "Generating symbols file.\n";
                status = top_instance->output_storage_symbols(symbols);
                check_ostream(symbols);
        }}
        // separate storage from i/o
        if (!status)
                symbols << "\n";
        if (!status)
        {
```

```
            status = top_instance->output_io_symbols(symbols);
            check_ostream(symbols);
        }
        // separate io from labels
        if (!status)
            symbols << "\n";

        if (!status)
        {
            status = top_instance->output_labels(symbols, NO_TIME_ZONE);
            check_ostream(symbols);
        }
        if (!status)
            symbols << "\n";
        if (!status)
        {
            status = top_instance->output_symbols(symbols);
            check_ostream(symbols);
        }
#ifndef OLD
        if (!status)
        {
            symbols << "\n";
            for (int i=0; i<the_zones->n_including_sub_zones(); i++)
                output_zone_record(i, symbols);
            check_ostream(symbols);
        }
#endif}
    if (!status){
        // if user desires manual block file of decompiled design, output it
        if (*man_file_base != "")
        {
            // first create man filename with default "sdl" extension
            splitname(&(*man_file_base)[0], name, extension);
            if (extension[0] == '\0')
                mergename(filename, name, ".sdl");
            else
                mergename(filename, name, extension);
            man_file_name = filename;
```

```
// make sure it's not the same as the user's top level file
if (*user_top_instance->prototype()->get_filename()
                == man_file_name)
      cerr << "Manual sdl file not generated because it would"
                << " clobber your source file.\n";
else
{
      if (verbose)
                cerr << "Generating manual sdl file.\n";
      }
      filebuf     man_file;

      if (man_file.open(&man_file_name[0], output) == 0)
      {
                out_err_header("PAR015");
                cerr << "Unable to open '" << man_file_name
                 << "' manual sdl output file.\n";
                status = 1;
      }
      if (!status)
      {
                ostream man_stream(&man_file);
                // set context to user's top block and output it to file
                top_instance->push_context();
                man_stream << "//\n"
                << "// Manual design generated from automatically"
                << " partitioned '"
                << *user_top_instance->prototype()->get_filename()
                << "'\n//\n\n";
                user_top_instance->out_variant_blocks(man_stream);
                top_instance->pop_context();
                check_ostream(man_stream);
      }
}
}}
// make sure to subtract i/o space and flag locs from storage used
if (!status){
   data_locs = (int) (top_instance->get_n_storage_locs() - io_space_size
         - flag_locs);
```

```
code_locs = top_instance->get_n_instruct_locs();
// don't count initialization duration in execution time
exec_time = top_instance->get_duration()
                - top_instance->get_init_duration();
overhead_time = top_instance->get_phantom_duration();
// censor overhead!
if (uncensored)
{
    cerr << "Of the execution time, "
         << percent(overhead_time, exec_time)
         << "% is overhead.\n";
}
init_code = top_instance->get_n_init_instr_locs();
overhead_code = top_instance->get_n_phantom_instr_locs();
appl_code = code_locs - init_code - overhead_code;
overhead_data = top_instance->get_n_phantom_stor_locs();
appl_data = data_locs - overhead_data;
// see if we have overrun code or data space
if (!status)
{
    if (code_space_size < code_locs)
    {
        out_err_header("PAR016");
        cerr << "This design requires "
                << code_locs
                << " code locations but only "
                << code_space_size
                << " code\n locations are available in this SPROC.\n";
        status = 1;
    }
}
if (!status)
{
    if (data_space_size < data_locs)
    {
        out_err_header("PAR017");
        cerr << "This design requires "
                << data_locs
                << " data locations but only "
```

```
                        << data_space_size
                        << " data\n locations are available in this SPROC.\n";
                status = 1;
            }
    }}
if (!status){
    cerr << "A total of "
        << data_locs
        << " data locations and "
        << code_locs
        << " code locations were used.\n";
    // append info to log file
    // use C, because it has "append" file open mode
    FILE *fp;
    time_ttime_ptr;
    if ((fp = fopen(LOG_FILE_NAME, "a")) == NULL)
        printf("Can't open Scompile log file.\n");
    else
    {
        time(&time_ptr);
        fprintf(fp, VERSION_STRING);
        fprintf(fp, " on design '%s',", &(*out_file_base)[0]);
        fprintf(fp, " %s", ctime(&time_ptr));
        fprintf(fp, " data: %4i code: %4i GSPs: %1i\n",
                        data_locs, code_locs, total_gsps);
        fclose(fp);
    }
    // censor details!
    if (uncensored)
    {
        cerr << "SPROC Memory Utilization:\n\n"
         << " application overhead init & other\n"
         << "code "
         << form("%4d", appl_code)
                        << " "
         << form("%4d", overhead_code)
                        << " "
         << form("%4d\n", init_code)
         << "data "
```

```
                << form("%4d", appl_data)
                        << " "
                << form("%4d\n\n", overhead_data);
        }}
    return status;}
///////////////////////////////////////////////////////////////////////////
// no_mem_error
///////////////////////////////////////////////////////////////////////////
// extern "C" {
//     void abort(int);
// }
void no_mem_error(){
    out_err_header("PAR018");
    cerr << "Sorry, you're out of memory!\n";
    abort();}
///////////////////////////////////////////////////////////////////////////
// switch functions
///////////////////////////////////////////////////////////////////////////
///////////////////////////////////////////////////////////////////////////
// d_switch_func
// process "d" command line switch -- define.
///////////////////////////////////////////////////////////////////////////
int d_switch_func(char* name_ptr){
    string*     name;
    string*     value;
    char*       equals_ptr;
    char*       value_ptr;
    value = (string*) NULL;
    // see if value given
    if (equals_ptr = strpbrk(name_ptr, "=")){
        // null the equals to terminate the first string
        *equals_ptr = '\0';
        value_ptr = equals_ptr + 1;
        value = new string(value_ptr);}
    name = new string(name_ptr);
    enter_define(name, value);
    return 0;}
///////////////////////////////////////////////////////////////////////////
// t_switch_func
```

```
// process "t" command line switch -- SPROC type.
////////////////////////////////////////////////////////////////////
int t_switch_func(char* name_ptr){
      *SPROC = *(new string(name_ptr));
      return 0;}
////////////////////////////////////////////////////////////////////
// p_switch_func
// process "p" command line switch -- alternate directory path.
////////////////////////////////////////////////////////////////////
//int p_switch_func(char* name_ptr)
//{
//      *alt_path = *(new string(name_ptr));
//      return 0;
//}
////////////////////////////////////////////////////////////////////
// o_switch_func
// process "o" command line switch -- output file base name.
////////////////////////////////////////////////////////////////////
int o_switch_func(char* name_ptr){
      *out_file_base = *(new string(name_ptr));
      return 0;}
////////////////////////////////////////////////////////////////////
// l_switch_func
// process "l" command line switch -- list file name.
// Filename is optional, but turns on listing file.
////////////////////////////////////////////////////////////////////
int l_switch_func(char* name_ptr){
      *list_file = *(new string(name_ptr));
      make_listing = TRUE;
      return 0;}
////////////////////////////////////////////////////////////////////
// c_switch_func
// process "c" command line switch -- check compile only.
////////////////////////////////////////////////////////////////////
int c_switch_func(char* name_ptr){
      NOREF(name_ptr);
      verify_only = TRUE;
      return 0;}
////////////////////////////////////////////////////////////////////
```

```
// m_switch_func
// process "m" command line switch -- manual output file base name.
/////////////////////////////////////////////////////////////////////
int m_switch_func(char* name_ptr){
        *man_file_base = *(new string(name_ptr));
        return 0;}
/////////////////////////////////////////////////////////////////////
// h_switch_func
// process "h" command line switch -- help.
/////////////////////////////////////////////////////////////////////
int h_switch_func(char* name_ptr){
        NOREF(name_ptr);
        help = TRUE;
        return 0;}
/////////////////////////////////////////////////////////////////////
// v_switch_func
// process "v" command line switch -- verbose only.
/////////////////////////////////////////////////////////////////////
int v_switch_func(char* name_ptr){
        NOREF(name_ptr);
        verbose = TRUE;
        return 0;}
/////////////////////////////////////////////////////////////////////
// f_switch_func
// process "f" command line switch -- no file info in error messages
/////////////////////////////////////////////////////////////////////
int f_switch_func(char* name_ptr){
        NOREF(name_ptr);
        no_file_info = TRUE;
        return 0;}
/////////////////////////////////////////////////////////////////////
// e_switch_func
// process "e" command line switch -- clock error %.
/////////////////////////////////////////////////////////////////////
int e_switch_func(char* name_ptr){
        clock_error = atoi(name_ptr);
        if (clock_error >= 100 || clock_error < 0 ){
                out_err_header("PAR019");
                cerr << " Illegal value of " << clock_error << " for e switch.\n";
```

```
		return 1;}
	else
		return 0;}
//////////////////////////////////////////////////////////////////////
// u_switch_func
// process "u" command line switch -- uncensor detailed statistics.
//////////////////////////////////////////////////////////////////////
int u_switch_func(char* name_ptr){
	NOREF(name_ptr);
	uncensored = TRUE;
	return 0;}
//////////////////////////////////////////////////////////////////////
// s_switch_func
// process "s" command line switch -- suppress partitioning.
//////////////////////////////////////////////////////////////////////
int s_switch_func(char* name_ptr){
	NOREF(name_ptr);
	no_partition = TRUE;
	return 0;}
//////////////////////////////////////////////////////////////////////
// b_switch_func
// process "b" command line switch -- default count before switching to
// subroutine call.
//////////////////////////////////////////////////////////////////////
int b_switch_func(char* name_ptr){
	deflt_subr_count = atoi(name_ptr);
	return 0;}

//////////////////////////////////////////////////////////////////////
// parser main program
//////////////////////////////////////////////////////////////////////
main(int argc, char* argv[]){
	string*		init_file;
	char		name[MAX_NAME_SIZE];
	char		extension[MAX_NAME_SIZE];
	string		makefile_name;
	filebuf		makefile;
	int			status;
	char		filename[MAX_NAME_SIZE];
```

```
//      char*       path_ptr;
        // file name stuff
        #define MAX_FILES4
        int         n_files;
        char* files[MAX_FILES];
        // commands switch stuff
        #define N_SWITCHES13
        typedefint          (*PTIF) (char*);// pointer to integer function
        static charswitches[N_SWITCHES] = { 'D', 'T', 'O' , 'L', 'c', 'M',
                                        'h', 'v', 'E', 'f', 'u', 's', 'B' };
        static PTIFswitch_funcs[N_SWITCHES];
        char        bad_switch;
        switch_funcs[0] = (PTIF) &d_switch_func;
        switch_funcs[1] = (PTIF) &t_switch_func;
//      switch_funcs[2] = (PTIF) &p_switch_func;
        switch_funcs[2] = (PTIF) &o_switch_func;
        switch_funcs[3] = (PTIF) &l_switch_func;
        switch_funcs[4] = (PTIF) &c_switch_func;
        switch_funcs[5] = (PTIF) &m_switch_func;
        switch_funcs[6] = (PTIF) &h_switch_func;
        switch_funcs[7] = (PTIF) &v_switch_func;
        switch_funcs[8] = (PTIF) &e_switch_func;
        switch_funcs[9] = (PTIF) &f_switch_func;
        switch_funcs[10] = (PTIF) &u_switch_func;
        switch_funcs[11] = (PTIF) &s_switch_func;
        switch_funcs[12] = (PTIF) &b_switch_func;
        // init names strings to empty string - switch can update them
        SPROC = new string("");
//      alt_path = new string("");
        list_file = new string("");
        out_file_base = new string("");
        man_file_base = new string("");
        // set out of local memory handler
        set_new_handler(no_mem_error);
        // process the command line to get the input filename
        get_filenames(argc, argv, MAX_FILES, &n_files, files);
        if (status = do_switches(argc, argv, N_SWITCHES, switches,
                    switch_funcs, &bad_switch)){
            if (bad_switch)
```

```
        {
            out_err_header("PAR020");
            cerr << "You used an invalid command line switch '"
                << chr(bad_switch) << "'.\n";
        }
        exit(-status);}
//  // if no alternate path specified, try environment variable
//  if (*alt_path == "")
//  {
//      if ((path_ptr = getenv(DIRECTORY_ENV)) != NULL)
//          *alt_path = path_ptr;
//  }
    if (n_files == 0 || help){
        cerr << VERSION_STRING << "\n" << COPYRIGHT_STRING;
        cerr << "Usage: SCHEDULE [-V] [-C] [-H] [-F] [-Dname[=def]] "
            << "[-Ttype] [-Ooutfile]\n"
            << " [-L[listfile]] "
            << "[-Eclockerror] [-Bsubrcount] sourcefile\n";
        exit(!help);}
    else
        strncpy(filename, files[0], MAX_NAME_SIZE);
    // build the init file name using a potentially command line-
    // supplied SPROC type to concatenate
    init_file = new string("");
    *init_file = *init_file + INIT_BASE + *SPROC + "." + INIT_EXT;
    // output the banner
    cerr << VERSION_STRING << "\n" << COPYRIGHT_STRING;
    if (n_files > 1){
        out_err_header("PAR021");
        cerr << "You gave too many file names on the command line.\n";
        (-1);}
    // if no base name for output files supplied, use source file name
    if (*out_file_base == ""){
        splitname(filename, name, extension);
        *out_file_base = name;
        // make sure we strip off any path from the file base name
        out_file_base = strip_path(out_file_base);}
    // get any path from the input file to prepend to all input files
    in_path_string = new string(filename);
```

```
    in_path_string = get_path(in_path_string);
    // makefile name for output "make" file
    makefile_name = *out_file_base;
    makefile_name = makefile_name + ".spm";
    // open makefile
    if (makefile.open(&makefile_name[0], output) == 0){
          out_err_header("PAR022");
          cerr << "Unable to open '" << makefile_name << "' makefile.\n";
          status = 1;}
    if (!status)
          makefile_stream_ptr = new ostream(&makefile);
    // compile init file
    if (!status){
          if (!verify_only)
                status = compile(&(*init_file)[0], FALSE);}
    // compile user-supplied file
    if (!status){
          if (verbose)
                cerr << "Compiling blocks.\n";
          status = compile(filename, make_listing);}
    if (!verify_only){
#ifdef LINK
          if (!status)
          {
                if (verbose)
                      cerr << "Creating instances.\n";
                status = instantiate();
          }
          if (!status)
                status = get_configuration();
          if (!status)
          {
                if (verbose)
                      cerr << "Connecting up instances.\n";
                status = evaluate_and_connect();
          }
          if (!status)
          {
                if (verbose)
```

```
                cerr << "Sequencing blocks.\n";
            status = sequence();
        }
        // partition design & insert phantoms only if auto-partitioning allowed
        if (should_partition_design())
        {
            if (!status)
            {
                if (verbose)
                        cerr << "Partitioning design.\n";
                status = partition();
                // analyze zones result may not be true error
                if (status == NO_INPUTS)
                        status = 0;
                else
                        status = -status;
                if (!status)
                        status = reevaluate();
            }
        }
        else if (!status)
            just_create_zones();// ignore return status, since maybe no zone
        if (!status || status == NO_INPUTS)
        status = generate_code_and_data();
#endif}
    // delete the stream for the makefile to close it
    delete makefile_stream_ptr;
    exit(-status);}
// poststrm.cxx
// post-proccessing stream class functions
// Terry Montlick
// 3/28/90
/* source code control: */
static char SccsID[] = "@(#)poststrm.cxx1.56 10/7/91";
#include "poststrm.hxx"
//////////////////////////////////////////////////////////////////////
// quoter class
// Class to add quotes around an ostream which contains characters which
// originally would have been quoted on input, that is, which contain special
```

```
// characters.
// To use, create an object in this class. Then use the in() member
// function as the target of the output stream. Then use the out()
// member function as the source to the desired output stream.
/////////////////////////////////////////////////////////////////////
/////////////////////////////////////////////////////////////////////
// quoter::quoter
// Constructor.
/////////////////////////////////////////////////////////////////////
quoter::quoter(){
	int		i;
	// make stream point to array, allowing space for quotes
	os_ptr = new ostream(QUOTE_ARR_SIZE-3, &arr[1]);
	// fill array with nulls which will terminate the input
	for (i=0; i<QUOTE_ARR_SIZE; i++)
		arr[i] = '\0';}
/////////////////////////////////////////////////////////////////////
//quoter::~quoter
// Destructor.
/////////////////////////////////////////////////////////////////////
quoter::~quoter()
{}
/////////////////////////////////////////////////////////////////////
// quoter::out()
// Called after an in() operation, this function adds quotes to stream data
// if it contains non-alphanumeric characters and returns a pointer to it.
/////////////////////////////////////////////////////////////////////
char* quoter::out(){
	int		i;
	BOOLEANadd_quotes = FALSE;
	if (arr[1] == '\0')
		return &arr[1];
	// if first char is a number, then this is a number string, so don't add
	// quotes.
	if (arr[1] >= '0' && arr[1] <='9')
		return &arr[1];
	// see if first char is a legal start of identifier
	if (	(arr[1] >= 'a' && arr[1] <= 'z')
		|| (arr[1] >= 'A' && arr[1] <= 'Z')
```

```
        || arr[1] == '$'
        || arr[1] == '%'
        || arr[1] == '_'
    ){
        // first char is legal for an identifier, so see if rest of chars ok
        for (i=1; arr[i] != '\0'; i++)
        {
            if (    (arr[i] >= 'a' && arr[i] <= 'z')
                    || (arr[i] >= 'A' && arr[i] <= 'Z')
                    || (arr[i] >= '0' && arr[i] <= '9')
                    || arr[i] == '$'
                    || arr[i] == '%'
                    || arr[i] == '_'
                    || arr[i] == '.'
            )
                    ;
            else
            {
                    // not in legal set for identifier, so must add quotes
                    add_quotes = TRUE;
                    break;
            }
        }}
    else
        add_quotes = TRUE;
    if (add_quotes){
        arr[0] = '"';
        arr[strlen(arr)] = '"';
        return &arr[0];}
    else
        return &arr[1];}
////////////////////////////////////////////////////////////////////////
// linebreaker class
// Class to neatly break lines of an ostream.
// To use, create an object in this class. Then use the in() member
// function as the target of the output stream. Then use the out()
// member function as the source to the desired output stream.
////////////////////////////////////////////////////////////////////////
////////////////////////////////////////////////////////////////////////
```

```
// linebreaker::linebreaker
// Constructor.
////////////////////////////////////////////////////////////////////
linebreaker::linebreaker(char* prefix_chars = "", int l_len = 80,
                                        int init_len = 0){
    int         i;
    // make stream point to array
    os_ptr = new ostream(BREAK_ARR_SIZE-1, &arr[0]);
    // fill array with nulls which will terminate the input
    for (i=0; i<BREAK_ARR_SIZE; i++)
        arr[i] = '\0';
    // save prefix char string
    strncpy(prefix, prefix_chars, PREFIX_ARR_SIZE-1);
    // save size of prefix stirng
    prefix_len = strlen(prefix);
    // save max line length
    line_len = l_len;
    // save initial line length
    initial_len = init_len;}
////////////////////////////////////////////////////////////////////
// linebreaker::~linebreaker
// Destructor.
////////////////////////////////////////////////////////////////////
linebreaker::~linebreaker()
{}
////////////////////////////////////////////////////////////////////
// linebreaker::out()
// Called after an in() operation, this function breaks a line of stream data.
// It looks for white space characters and overwrites them with returns.
////////////////////////////////////////////////////////////////////
char* linebreaker::out(){
    int             i, j;
    int             line_start = initial_len;
    int             count = initial_len;
    // scan string, counting characters and resetting on new line
    for (i=0; arr[i] != '\0'; i++){
        if (arr[i] == '\n')
        {
            // reset for new line
```

```
                line_start = i + 1;
                count = 0;
            }
            else if (count++ == line_len)
            {
                // line is too long, so back up till we hit white space
                for (j=i; j>=line_start; j--)
                {
                    if (arr[j] == ' ' || arr[j] == '\t')
                    {
                            // found white space, so make a new line
                            arr[j] = '\n';
                            i = j;
                            line_start = j+1;
                            // add the prefix string, shifting up remaining chars
                            for (j=BREAK_ARR_SIZE-prefix_len-1; j>=line_start; j--)
                            arr[j+prefix_len] = arr[j];
                            // add prefix string
                            for (j=0; j<prefix_len; j++)
                            arr[line_start + j] = prefix[j];
                            // start new line with prefix characters
                            count = prefix_len;
                            i += prefix_len;
                            break;
                    }
                }
            }}
        return &arr[0];}
// poststrm.hxx
// header for stream post-processing classes
// T. Montlick
// 3/28/90
/* source code control: @(#)poststrm.hxx1.56 10/7/91 */
#define POST_STREAM_DEF
#ifndef STANDARD_DEF
#include "standard.hxx"
#endif
#define QUOTE_ARR_SIZE100
#define BREAK_ARR_SIZE300
```

```
#define PREFIX_ARR_SIZE30
class quoter{
        char            arr[QUOTE_ARR_SIZE];
        ostream*os_ptr;
public:
        quoter();
        ~quoter();
        ostream&in()      { return *os_ptr; }
        char*           out();
};
class linebreaker{
        char            arr[BREAK_ARR_SIZE];
        ostream*os_ptr;
        char            prefix[PREFIX_ARR_SIZE];
        int                     line_len;
        int                     prefix_len;
        int                     initial_len;
public:
        linebreaker(char* prefix_chars, int l_len, int init_len);
        ~linebreaker();
        ostream&in()      { return *os_ptr; }
        char*           out();
};
#ifndef OWC// objectworks hdr is C++
#ifdef sun
extern "C--"// but otherwise, sun doesn't have C function prototype{
#else
extern "C"{
#endif
#endif
#include<string.h>
#ifndef OWC}
#endif
// schedule.cxx
// scheduler class
// T. Montlick
// 9/1/90
/* source code control: */
static char SccsID[] = "@(#)schedule.cxx1.56 10/7/91";
```

```
#ifndef SCHEDULER_DEF
#include "schedule.hxx"
#endif
//////////////////////////////////////////////////////////////////////
// scheduler constructor
//////////////////////////////////////////////////////////////////////
scheduler::scheduler(){
      init_done = FALSE;
      n_tasks = 0;}
//////////////////////////////////////////////////////////////////////
// scheduler destructor
//////////////////////////////////////////////////////////////////////
scheduler::~scheduler()
{}
//////////////////////////////////////////////////////////////////////
// scheduler::add_sample_period_and_duration()
// Add the next task, in order of execution sequence (as determined by the
// compiler's block sequencing algorithm).
// This task is defined by a sample period and a duration, given relative to
// this particular sample period.
//////////////////////////////////////////////////////////////////////
void scheduler::add_sample_period_and_duration(long per, double dur){
      original_period[n_tasks] = per;
      duration[n_tasks++] = dur;}
//////////////////////////////////////////////////////////////////////
// scheduler::add_connection()
// Add a topological connection from task i to task j.
// add_sample_period_and_duration() must have been called previously.
// This function also verifies that the sample periods for the connections
// are consistent, else it returns FALSE.
//////////////////////////////////////////////////////////////////////
BOOLEAN scheduler::add_connection(int from, int to){
      int          i, t;
      long  per;
      // make sure all fan-in tasks have same rate
      per = original_period[from];
      for (t=0; t<n_previous(to); t++){
            i = previous(to, t);
            if (original_period[i] != per)
```

```
            return FALSE;}
        connections[from][to] = TRUE;
        return TRUE;}
////////////////////////////////////////////////////////////////////////
// scheduler::previous()
// Return the index of the previous task in the task topology. Prev_index
// is used to distinguish between multiple previous tasks, where 0 is the
// first, 1 is the second, etc. (call n_previous() to find out total number).
////////////////////////////////////////////////////////////////////////
int scheduler::previous(int task, int prev_index){
        int         i;
        int         count = 0;
        for (i=0; i<n_tasks; i++){
                if (connections[i][task])
                {
                        count++;
                        if (count > prev_index)
                                return i;
                }}
        return -1;}
////////////////////////////////////////////////////////////////////////
// scheduler::n_previous()
// Return the number of previous tasks in the task topology. If init done,
// we can look it up, else we must compute it.
////////////////////////////////////////////////////////////////////////
int     scheduler::n_previous(int task){
        if (init_done)
                return prev_count[task];
        else
                return compute_n_previous(task);}
////////////////////////////////////////////////////////////////////////
// scheduler::compute_n_previous()
// Compute the number of previous tasks in the task topology.
////////////////////////////////////////////////////////////////////////
int scheduler::compute_n_previous(int task){
        int         i;
        int         count = 0;
        for (i=0; i<n_tasks; i++){
                if (connections[i][task])
```

```
                count++;}
        return count;}
///////////////////////////////////////////////////////////////////
// scheduler::next()
// Return the index of the next task in the task topology. Next_index
// is used to distinguish between multiple next tasks, where 0 is the
// first, 1 is the second, etc. (call n_next() to find out total number).
///////////////////////////////////////////////////////////////////
int scheduler::next(int task, int next_index){
        int             i;
        int             count = 0;
        for (i=0; i<n_tasks; i++){
                if (connections[task][i])
                {
                        count++;
                        if (count > next_index)
                                return i;
                }}
        return -1;}
///////////////////////////////////////////////////////////////////
// scheduler::n_next()
// Return the number of next tasks in the task topology. If init done,
// we can look it up, else we must compute it.
///////////////////////////////////////////////////////////////////
int     scheduler::n_next(int task){
        if (init_done)
                return next_count[task];
        else
                return compute_n_next(task);}
///////////////////////////////////////////////////////////////////
// scheduler::compute_n_next()
// Return the number of next tasks in the task topology.
///////////////////////////////////////////////////////////////////
int scheduler::compute_n_next(int task){
        int             i;
        int             count = 0;
        for (i=0; i<n_tasks; i++){
                if (connections[task][i])
                        count++;}
```

```
        return count;}
////////////////////////////////////////////////////////////////////
// gcd()
// Euclid's algorithm for greatest common divisor.
////////////////////////////////////////////////////////////////////
long gcd(long m, long n){
        long          r;
        while ( (r = m % n) != 0 ){
                m = n;
                n = r;}
        return (n);}
////////////////////////////////////////////////////////////////////
// gcd_set()
// Find gcd for a set of numbers.
////////////////////////////////////////////////////////////////////
long gcdset(long_array& numbers, int n){
        int                     i;
        long_arraynums;
        /* compute gcd by Euclid's algorithm for each adjacent pair,
                which reduces the total # by one. Repeat until just one result */
        for (i=0; i<n; i++)
                nums[i] = numbers[i];
        while (n>1){
                for (i=0; i<(n-1); i++)
                {
                        nums[i] = gcd(nums[i], nums[i+1]);
                }
                n--;}
        return nums[0];}
////////////////////////////////////////////////////////////////////
// lcm()
// Find least common multiple for a set of numbers.
////////////////////////////////////////////////////////////////////
long lcm(long_array& numbers, int n){
        int                     i;
        long          multiple;
        BOOLEANnot_found = TRUE;
        // use brute force method for now
        multiple = 1;
```

```
    while (not_found){
          not_found = FALSE;
          for (i=0; i<n; i++)
          {
                if (multiple % numbers[i])
                {
                      not_found = TRUE;
                      break;
                }
          }
          if (not_found)
                multiple++;}
    return multiple;}
//////////////////////////////////////////////////////////////////////
// scheduler::add_temporal_task()
// Called by scheduler::init_counters(), this function adds a task to the
// scheduler for temporal partitioning. It returns the last task number
// added.
//////////////////////////////////////////////////////////////////////
int scheduler::add_temporal_task(double sum, int task, int *n_ptr){
    double      total;
    int                 gsps;
    // if beyond last task, all done
    if (task >= n_tasks){
          gsps = (int) (sum + 0.99999999);
          *n_ptr = gsps;
          return (task-1);}
    // add this task
    total = sum + duration[task];
    gsps = (int) (total + 0.99999999);
    // see if we have filled last gsp sufficiently
    if ( (gsps - total) < headroom ){
          *n_ptr = gsps;
          return task;}
    else
          // haven't filled sufficiently, so add next task
          return add_temporal_task(total, task+1, n_ptr);}
//////////////////////////////////////////////////////////////////////
// scheduler::init_counters()
```

```
// Compute the initial counter values for the scheduling algorithm.
// These initial values are loaded into the SPROC task scheduling
// counters used to do run-time scheduling.
////////////////////////////////////////////////////////////////////
void scheduler::init_counters(){
    int             i, j, k, n;
    int             task, first_task, last_task;
    long        longest;
    long        base;
    long_arraylcm_array;
    // figure out which gsp task should go on
    n_gsps = 0;
    first_task = 0;
    while (first_task < n_tasks){
        // try to add tasks for temporal partitioning
        last_task = add_temporal_task(0.0, first_task, &n);
        // we have allocate "n" gsps
        for (task=first_task; task<=last_task; task++)
        {
            // place this task in all gsps consumed
            for (k=n_gsps; k<(n_gsps+n); k++)
                which_gsp[task][which_gsp[task].size()] = k;
        }
        // if schedule is more than one gsp, set as temporally partitioned
        if (n > 1)
        {
            // find least common multiple period for this group of tasks
            for (task=first_task; task<=last_task; task++)
                lcm_array[task-first_task] = period[task];
            longest = lcm(lcm_array, last_task-first_task+1);
            // set reload count based on longest period
            for (task=first_task; task<=last_task; task++)
                reload_count[task] = longest/period[task];
            // record as temporally partitioned
            for (k=n_gsps; k<(n_gsps+n); k++)
            {
                is_temporal[k] = TRUE;
                // set initial task to run
                previous_task[k] = first_task;
```

```
                // every gsp past 1st in series is a "chaser"
                if (k > n_gsps)
                        is_chaser_gsp[k] = TRUE;
            }
        }
        n_gsps += n;
        first_task = last_task+1;}
    // set a counter for each task for each gsp
    for (j=0; j<n_gsps; j++){
        base = 0;
        for (i=0; i<n_tasks; i++)
        {
            // init max_due counter
            max_due[i] = 0;
            // init counter
            // if this is single gsp, then we are doing interlieved scheduling
            // so whenever interpolation is done we must update a "base"
            // initial count so that interpolation counter waits until
            // previous sample is available
            if ( !is_temporal[j] && (n_previous(i) > 0) )
            {
                // interpolating if current not divisible by previous
                if ( reload_count[i] % reload_count[previous(i,0)] )
//              if (reload_count[previous(i,0)]/reload_count[i] > 1)
                        base = counter[j][previous(i,0)];
            }
            counter[j][i] = base + reload_count[i];
            // init due counter
            due[j][i] = 0;
        }}
    // compute utilization fraction based on # of gsps
    utilization = utilization/n_gsps;}
//////////////////////////////////////////////////////////////////////
// scheduler::compute_periods()
// Compute the period for each scheduler task, returning the GCD of the
// periods. If unable to compute the periods, return 0.
//////////////////////////////////////////////////////////////////////
long scheduler::compute_periods(){
    int                 i;
```

```
long        gcd_period;
double      sum;
BOOLEANfound_it = FALSE;
// this is a good time to count the next and previous tasks in the
// network topology
for (i=0; i<n_tasks; i++){
      next_count[i] = compute_n_next(i);
      prev_count[i] = compute_n_previous(i);}
// first normalize the original periods by their GCD
gcd_period = gcdset(original_period, n_tasks);
for (i=0; i<n_tasks; i++)
      period[i] = original_period[i]/gcd_period;
// find smallest multiply integer for the scheduler periods such that the
// sum of their inverses is 1 or less
scheduler_rate = 1;
do{
      sum = 0.0;
      for (i=0; i<n_tasks; i++)
            sum += 1.0/(scheduler_rate*period[i]);
      if (sum <= 1.0)
            found_it = TRUE;
      else
            scheduler_rate++;
} while (!found_it);
// now compute true period at average scheduler rate
// also sum task times for utilization
utilization = 0.0;
for (i=0; i<n_tasks; i++){
      period[i] = scheduler_rate * period[i];
      reload_count[i] = period[i];
      utilization += duration[i];}
init_counters();
init_done = TRUE;
return (gcd_period);}
////////////////////////////////////////////////////////////////////////////
// scheduler::get_next_task()
// Get the next task from the scheduler.
// This algorithm is implemented on the SPROC for run-time scheduling.
////////////////////////////////////////////////////////////////////////////
```

```
int scheduler::get_next_task(int gsp){
    int             next_task = NO_TASK;
    int             i;
    int             most_due_count;
    BOOLEANnot_found_next;
    BOOLEANgo_ahead = TRUE;
    if (is_temporal[gsp]){
        i = previous_task[gsp];
        // if first count for this task, decrement previous gsps ahead count
        if ( (counter[gsp][i] == reload_count[i]) && is_chaser_gsp[gsp] )
            ahead_count[gsp-1]--;
        // assume repeating current task
        next_task = i;
        // if counter is 0, then we should advance task, but first make
        // sure next gsp is ahead by at least one task
        if (counter[gsp][i] == 0)
        {
            // is next gsp ahead by at least one task?
            if (is_chaser_gsp[gsp])
            {
                if (!(ahead_count[gsp-1] >= 1))
                        go_ahead = FALSE;
            }
        }
        if (go_ahead)
        {
            if (--counter[gsp][i] == 0)
            {
                // finished with this task, so advance to next
                // reload counter for this task
                counter[gsp][i] = reload_count[i];
                ahead_count[gsp]++;
                not_found_next = TRUE;
                while (not_found_next)
                {
                        i = (i+1) % n_tasks;
                        if (which_gsp[i].find(gsp) >= 0)
                        {
                        previous_task[gsp] = i;
```

```
                        not_found_next = FALSE;
                        }
                }
            }
        }
        else
            // don't have go-ahead, so tell caller
            next_task = WAIT_TASK;}
else{
    // spacial partitioning
    while (next_task == NO_TASK)
    {
        // see which task is most due -- this is the next task to run
        most_due_count = 0;
        for (i=0; i<n_tasks; i++)
        {
            if (which_gsp[i].find(gsp) >= 0)
            {
                    if (due[gsp][i] > 0)
                    {
                    if (due[gsp][i] > most_due_count)
                    {
                    next_task = i;
                    most_due_count= due[gsp][i];
                    }
                    }
            }
        }
        // if a task was selected, decrement its due count
        if (next_task != NO_TASK)
            due[gsp][next_task]--;

        // decrement modulo counts
        for (i=0; i<n_tasks; i++)
        {
            if (which_gsp[i].find(gsp) >= 0)
            {
                    if (--counter[gsp][i] == 0)
                    {
```

```
                        counter[gsp][i] =reload_count[i];
                        due[gsp][i]++;
                        // max_due is maintained purely for accounting purposes
                        if (due[gsp][i] > max_due[i])
                        max_due[i] = due[gsp][i];
                        }
                }
            }
        }}
    return (next_task);}
// schedule.hxx
// scheduler class
// T. Montlick
// 9/1/90
// source code control: @(#)schedule.hxx1.56 10/7/91
#define SCHEDULER_DEF
#ifndef STRING_DEF
    #include "string.hxx"
#endif
#ifndef LONG_ARRAY_DEF
    #include "long_arr.hxx"
#endif
#ifndef INT_ARRAY_DEF
    #include "int_arr.hxx"
#endif
#define BOOLEANshort
#defineTRUE    1
#defineFALSE    0
#defineINFINITY99999999999
#define NO_TASK-1
#define WAIT_TASK-2
#define MAX_TASKS100
#defineMAX_GSPS32
/*
The scheduler class is first passed the headroom allowable for spacial
partitioning (expresses as a fraction of one sample period) via a call to
scheduler::set_headroom(). This is the amount of "wasted processing power"
that is tolerated for a gsp in spacial partitioning. Sequential tasks are
placed on a gsp until the next task will not fit on the gsp. If the amount
```

left over on that gsp is less than the headroom allowed, then the remaining tasks are spacially partitioned onto other gsps. If the amount left over on that gsp is greater than or equal to the headroom allowed, then the next gsp is enlisted for temporal, rather than spacial partitioning. A headroom value of zero forces purely temporal partitioning.
The class is then given a sequence of sample periods and task durations, relative to a sample period (via scheduler::add_sample_period_and_duration()), one for each task in a sequence of decimated and/or interpolated tasks. scheduler::add_connection is called for each pair of topologically adjacent tasks.
scheduler::compute_periods() is then called to create the scheduler sequence. The scheduler period for each task counter can then be read via scheduler::get_scheduler_period(), and initialization values for counters read by calls to scheduler::get_counter_value().
To run the scheduler, call scheduler::get_next_task(), which returns the next task number, starting from 0, to run, or the negative value NO_TASK if no task for this scheduler slot.

```
*/
class scheduler{
	long_array	original_period;
	long_array	counter[MAX_GSPS];
	int_array	is_temporal;// TRUE if gsp is temporally partitioned
	int_array	previous_task;// last tasks for temporally part. gsps
	int_array	connections[MAX_TASKS];// TRUE if connection from i to j
	long_array	period;
	long_array	reload_count;
	int_array	is_chaser_gsp;// TRUE if temp. part. gsp chases another
	int_array	ahead_count;// tasks which next gsp ahead - temp. part.
	int_array	which_gsp[MAX_TASKS];
	double		duration[MAX_TASKS];
	int_array	due[MAX_GSPS];
	int_array	max_due;
	int			n_tasks;
	int_array	next_count;	// pre-computed count of next in topology
	int_array	prev_count;	// pre-computed count of prev in topology
	int			n_gsps;
	double		utilization;
	int			scheduler_rate;
	double		headroom;	// max headroom on gsp for temp. part.
```

```
    BOOLEAN     init_done;  // TRUE when init phase completed
private:
    void        init_counters();
    int                 compute_n_previous(int task);
    int                 compute_n_next(int task);
    int                 add_temporal_task(double sum, int task, int *n_ptr);
public:
    scheduler();
    ~scheduler();
    void        set_headroom(double h){ headroom = h; }
    void        add_sample_period_and_duration(long per, double dur);
    BOOLEANadd_connection(int i, int j);
    long        compute_periods();
    int                 get_n_tasks(){ return n_tasks; }
    int                 get_n_gsps(){ return n_gsps; }
    long        get_counter_value(int i){ return counter[0][i]; }
    long        get_scheduler_period(int i){ return period[i]; }
    long        get_temporal_repeats(int i){ return period[i]/scheduler_rate; }
    int                 get_which_gsp(int i, int j){ return which_gsp[i][j]; }
    int                 n_gsps_for_task(int i){ return which_gsp[i].size(); }
    int                 get_scheduler_rate(){ return scheduler_rate; }
    int                 get_next_task(int gsp);
    int                 get_max_due(int i) { return max_due[i]; }
    double      get_utilization()  { return utilization; }
    int                 previous(int task, int prev_index);
    int                 n_previous(int task);
    int                 next(int task, int next_index);
    int                 n_next(int task);
    BOOLEANa_first_task(int i){ return (n_next(i) && !n_previous(i)); }
};
// misc functions:
long gcd(long m, long n);
long gcdset(long_array& numbers, int n);

%{
    struct string*define_name;
    struct string*define_val;
    struct string*include_file;
%}
```

```
%START NORMAL COMMENT DEFINE DEF_CONTIN DEF_VAL INCLUDE
a    [aA]
b    [bB]
c    [cC]
d    [dD]
e    [eE]
f    [fF]
g    [gG]
h    [hH]
i    [iI]
j    [jJ]
k    [kK]
l    [lL]
m    [mM]
n    [nN]
o    [oO]
p    [pP]
q    [qQ]
r    [rR]
s    [sS]
t    [tT]
u    [uU]
v    [vV]
w    [wW]
x    [xX]
y    [yY]
z    [zZ]
%k   2000
%e   2000
%p   4000
%{
#include <stdio.h>
#include <ctype.h>
#include "fields.h"
#include "standard.h"
/* interface to C++ data structures */
#include "interface.h"
/* general utility routines */
#include "utility.h"
```

```
#ifdef DOS/* DOS can't handle standard yacc filename */
#include "ytab.h"
#else
#include "y.tab.h"
#endif
/* source code control: */
static char SccsID[] = "@(#)sdl.lex1.56 10/7/91";
%}
%%
<NORMAL>[ \t];                 /* skip delimiter characters */
<NORMAL>\n  line++;            /* skip newline but advance line count */
<NORMAL>"//".*\n; /* skip comment to end of line */
<NORMAL>"/*"BEGIN COMMENT;/* enter comment state */
<COMMENT>\nline++;             /* skip newline but advance count */
<COMMENT>. ;                   /* ignore other chars */
<COMMENT>"*/"BEGIN NORMAL;/* exit comment state */
<NORMAL>"#"define[ \t]*BEGIN DEFINE;/* enter define state */
<DEFINE>[a-zA-Z$%_][a-zA-Z$%0-9_]*{
                               /* create a string for the define name.
                               */
                               define_name = new_string(yytext);
                               define_val = new_string("");
                               BEGIN DEF_VAL;/* enter define value state */
                               }
<DEFINE>.       {
                               BEGIN NORMAL;/* exit define -- no name */
                               }
<DEF_VAL>.+\\${
                               /* line continuation character at end */
                               /* just add to existing value without leaving state */
                               yytext[yyleng-1] = '\0';/* write null over '\'*/
                               define_val =
                               concat_string(define_val, new_string(yytext));
                               BEGIN DEF_CONTIN;/* continue state till cr */
                               }
<DEF_CONTIN>\n{
                               line++;
                               BEGIN DEF_VAL;
                               }
```

```
<DEF_VAL>.+   {
                          define_val =
                          concat_string(define_val, new_string(yytext));
                          }
<DEF_VAL>\n   {           /* bump line count */
                          line++;
                          enter_define(define_name, define_val);
                          BEGIN NORMAL;/* exit define value state */
                          }
<NORMAL>"#"include[ \t]* BEGIN INCLUDE;/* enter include state */
<INCLUDE>\"[^"\n]*\"{
                          /* get the name of the include file.
                          */
                          char *name_ptr;
                          /* write null over last ", and skip first one */
                          yytext[yyleng-1] = '\0';
                          name_ptr = &yytext[0] + 1;
                          /* get string for include file */
                          include_file = new_string(name_ptr);
                          /* push current file on stack and open this one */
                          if (!push_file(include_file, &include_file))
                          {
                          error_w_string("LEX001",
                          "Unable to open include file '", include_file,
                          "'.");
                          exit (-1);
                          }
                          BEGIN NORMAL;/* return to normal state */
                          }
<NORMAL>{a}{s}{m}{b}{l}{o}{c}{k}return(ASMBLOCK);
<NORMAL>{s}{e}{q}{b}{l}{o}{c}{k}return(SEQBLOCK);
<NORMAL>{m}{a}{n}{b}{l}{o}{c}{k}return(GSPBLOCK);
<NORMAL>{s}{u}{b}{r}{b}{l}{o}{c}{k}return(SUBRBLOCK);
<NORMAL>{c}{a}{l}{l}{b}{l}{o}{c}{k}return(CALLBLOCK);
<NORMAL>{b}{l}{o}{c}{k}return(BLOCK);
<NORMAL>{b}{e}{g}{i}{n}return(BEG);
<NORMAL>{e}{n}{d}              return(END);
<NORMAL>{i}{n}{p}{u}{t}return(INPUT);
<NORMAL>{m}{i}{c}{r}{o}return(MICRO);
```

```
<NORMAL>{o}{u}{t}{p}{u}{t}return(OUTPUT);
<NORMAL>{w}{i}{r}{e}return(WIRE);
<NORMAL>{v}{a}{r}{i}{a}{b}{l}{e}return(VARIABLE);
<NORMAL>{p}{a}{r}{a}{m}return(PARAM);
<NORMAL>{s}{y}{m}{b}{o}{l}return(SYMBOL);
<NORMAL>{d}{u}{r}{a}{t}{i}{o}{n}return(DURATION);
<NORMAL>{a}{l}{i}{a}{s}return(ALIAS);
<NORMAL>{v}{e}{r}{i}{f}{y}return(VERIFY);
<NORMAL>{v}{i}{r}{t}{u}{a}{l}return(VIRTUAL);
<NORMAL>{o}{r}{g}            return(ORG);
<NORMAL>{p}{h}{a}{n}{t}{o}{m}return(PHANTOM);
<NORMAL>{i}{n}{i}{t}return(INIT);
<NORMAL>{t}{i}{m}{e}{z}{o}{n}{e}return(TIMEZONE);
<NORMAL>{p}{o}{r}{t}return(PORT);
<NORMAL>{g}{p}{i}{o}return(GPIO);
<NORMAL>{r}{t}{s}            return(RTS);
<NORMAL>{c}{o}{m}{p}{u}{t}{e}{l}{i}{n}{e} return(COMPUTELINE);
<NORMAL>{d}{o}{w}{n}{s}{a}{m}{p}{l}{e} return(DECIMATE);
<NORMAL>{u}{p}{s}{a}{m}{p}{l}{e} return(INTERPOLATE);
<NORMAL>{a}{d}{d}            return(ADD);
<NORMAL>{a}{d}{c}            return(ADC);
<NORMAL>{a}{n}{d}            return(AND);
<NORMAL>{a}{s}{l}            return(ASL);
<NORMAL>{a}{s}{r}            return(ASR);
<NORMAL>{c}{l}{c}            return(CLC);
<NORMAL>{c}{m}{p}            return(CMP);
<NORMAL>{d}{j}{n}{e}return(DJNE);
<NORMAL>{x}{o}{r}            return(EOR);
<NORMAL>{j}{m}{p}            return(JMP);
<NORMAL>{j}{c}{c}            return(JCC);
<NORMAL>{j}{c}{s}            return(JCS);
<NORMAL>{j}{e}{q}            return(JEQ);
<NORMAL>{j}{l}{f}            return(JLF);
<NORMAL>{j}{m}{f}            return(JMF);
<NORMAL>{j}{o}{v}            return(JOV);
<NORMAL>{j}{s}{i}            return(JSI);
<NORMAL>{j}{z}{e}            return(JZE);
<NORMAL>{j}{g}{e}            return(JGE);
<NORMAL>{j}{l}{e}            return(JLE);
```

```
<NORMAL>{j}{g}{t}         return(JGT);
<NORMAL>{j}{l}{t}         return(JLT);
<NORMAL>{j}{n}{e}         return(JNE);
<NORMAL>{l}{b}{s}{j}return(LBSJ);
<NORMAL>{l}{d}{a}         return(LDA);
<NORMAL>{l}{d}{b}         return(LDB);
<NORMAL>{l}{d}{c}{c}return(LDCC);
<NORMAL>{l}{d}{d}         return(LDD);
<NORMAL>{l}{d}{w}{s}return(LDWS);
<NORMAL>{l}{d}{f}         return(LDF);
<NORMAL>{l}{d}{l}         return(LDL);
<NORMAL>{l}{d}{x}         return(LDX);
<NORMAL>{l}{d}{y}         return(LDY);
<NORMAL>{m}{a}{c}         return(MAC);
<NORMAL>{m}{p}{y}         return(MPY);
<NORMAL>{n}{o}{p}         return(NOP);
<NORMAL>{n}{o}{t}         return(NOT);
<NORMAL>{o}{r}{a}         return(ORA);
<NORMAL>{s}{e}{c}         return(SEC);
<NORMAL>{s}{u}{b}         return(SUB);
<NORMAL>{s}{u}{b}{c}return(SUBC);
<NORMAL>{s}{t}{a}         return(STA);
<NORMAL>{s}{t}{b}         return(STB);
<NORMAL>{s}{t}{d}         return(STD);
<NORMAL>{s}{t}{w}{s}return(STWS);
<NORMAL>{s}{t}{f}         return(STF);
<NORMAL>{s}{t}{l}         return(STL);
<NORMAL>{s}{t}{m}{h}return(STMH);
<NORMAL>{s}{t}{m}{l}return(STML);
<NORMAL>{s}{t}{m}{g}return(STMG);
<NORMAL>{s}{t}{m}{h}{i}return(STMHI);
<NORMAL>{s}{t}{m}{l}{i}return(STMLI);
<NORMAL>{s}{t}{m}{g}{i}return(STMGI);
<NORMAL>{s}{t}{b}{s}return(STBS);
<NORMAL>{s}{t}{x}         return(STX);
<NORMAL>{s}{t}{y}         return(STY);
<NORMAL>{r}{o}{l}         return(ROL);
<NORMAL>{r}{o}{r}         return(ROR);
<NORMAL>{j}{w}{f}         return(JWF);
```

```
<NORMAL>{x}{l}{d}          return(XLD);
<NORMAL>A   return(A);
<NORMAL>B   return(B);
<NORMAL>D   return(D);
<NORMAL>F   return(F);
<NORMAL>L   return(LL);
<NORMAL>BS return(BS);
<NORMAL>WS return(WS);
<NORMAL>X   return(X);
<NORMAL>Y   return(Y);
<NORMAL>ML return(ML);
<NORMAL>MH return(MH);
<NORMAL>MG return(MG);
<NORMAL>MLI return(MLI);
<NORMAL>MHI return(MHI);
<NORMAL>MGI return(MGI);
<NORMAL>{i}{n}{t}return(INT);
<NORMAL>{f}{i}{x}return(FIX);
<NORMAL>{l}{o}{g}return(LOG);
<NORMAL>{e}{x}{p}return(EXP);
<NORMAL>"&&"return(L_AND);
<NORMAL>"||"return(OR);
<NORMAL>"!" return(NOT);
<NORMAL>"=="return(EQ_EQ);
<NORMAL>"!="return(NOT_EQ);
<NORMAL>"<="return(LT_EQ);
<NORMAL>">="return(GT_EQ);
<NORMAL>">>"return(R_SHIFT);
<NORMAL>"<<"return(L_SHIFT);
<NORMAL>{i}{n}{t}{e}{g}{e}{r}return(INTEG);
<NORMAL>{f}{i}{x}{e}{d}return(FIXED);
<NORMAL>{h}{e}{x}          return(HEX);
<NORMAL>[a-zA-Z$%_][a-zA-Z$%0-9_]*{
                    /* found an identifier, so
                     * create a character string, and return pointer
                     * to it as the value of yylval
                    */
                    char *val;
                    int length = 0, i;
```

```
char*p;
yylval.string_ptr = new_string(yytext);
/* first look to see if its a defined name */
if (find_define(yylval.string_ptr, &val))
{
/* found the identifier, so substitute value */
p =&val[0];

/* first count the length of the string */
while (*p++ != '\0')
length++;
/* push the string back on the input stream */
for (i=--length; i>=0; i--)
{
unput(val[i]);
}
}
else
return(IDENTIFIER);
}
<NORMAL>\"[^"\n]*\" {
/* string --
 * handle same as identifier, but strip off quotes
*/
char *val;
int length = 0, i;
char*p;
/* write null over last ", and skip first one */
yytext[yyleng-1] = '\0';
val = &yytext[0] + 1;
yylval.string_ptr = new_string(val);
return(STRING);
}
<NORMAL>\'[^'\n]*\' {
/* single-quoted string is same --
 * handle same as identifier, but strip off quotes
*/
char *val;
int length = 0, i;
```

```
                        char*p;
                        /* write null over last ", and skip first one */
                        yytext[yyleng-1] = '\0';
                        val = &yytext[0] + 1;
                        yylval.string_ptr = new_string(val);
                        return(STRING);
                        }
<NORMAL>[0-9]+{
                        yylval.ival = atol(yytext);
                        return(INTEGER);
                        }
<NORMAL>[0-9]+"."[0-9]*{
                        yylval.rval = atof(yytext);
                        return(REAL);
                        }
<NORMAL>"."[0-9]+{
                        yylval.rval = atof(yytext);
                        return(REAL);
                        }
<NORMAL>[0-9]*("."[0-9]+)?[Ee][-+]?[0-9]+{/* scientific notation number */
                        yylval.rval = atof(yytext);
                        return(REAL);
                        }
<NORMAL>[0-9][0-9A-Fa-f]*[Hh]{/* hex number */
                        char *p, c;
                        yylval.ival = 0;
                        for (p=yytext; my_toupper(*p) != 'H'; p++)
                        {
                        c = my_toupper(*p);
                        yylval.ival *= 16;
                        if ((c >= 'A') && (c <= 'F'))
                        yylval.ival += c - 'A' + 10;
                        else
                        yylval.ival += c - '0';
                        }
                        return(INTEGER);
                        }
<NORMAL>[0-1]+[Bb]{     /* binary number */
                        char *p, c;
```

```
                    yylval.ival = 0;
                    for (p=yytext; my_toupper(*p) != 'B'; p++)
                    {
                    c = *p;
                    yylval.ival *= 2;
                    yylval.ival += c - '0';
                    }
                    return(INTEGER);
                    }
<NORMAL>.       return(*yytext);/* return any other char */
.                   { BEGIN NORMAL; unput(*yytext); }
\n                  { BEGIN NORMAL; unput(*yytext); }

%%
/* routine to sync to next input line */
resynch(){
        char c;
        while (c = input())
            if (c == '\n')
            {
                line++;
                break;
            }}
%{
#include <stdio.h>
#include <ctype.h>
#include "fields.h"
#include "standard.h"
/* interface to C++ data structures */
#include "intrface.h"
/* general utility routines */
#include "utility.h"
/* source code control: */
static char SccsID[] = "@(#)sdl.yac1.56 10/7/91";
/* fields in the current instruction being assembled */
int        opcode;
int        addr_mode_field;
int        operand_field;
int        temp;
```

```
int        reloc_type = ABSOLUTE;/* relocation type for operand, if known */
struct expr*arr_size;/* size expr. for a variable which can be an array
                                   NULL implies size of 1 */
char  storage_type;/* current storage type in declaration */
BOOLEANmicro;      /* TRUE if variable is a micro interface variable */
/* #define YYDEBUG don't define for newest SUN OS */
%}
%start sdl
%union{
 struct expr* int_const;
 struct expr*real_const;
 struct expr*sym_expr;
 struct string*string_ptr;
      struct arg_set*arg_set_ptr;
      long            ival;
      double          rval;
      BOOLEAN         bool;}
/* declarations for lhs */
%type <real_const> real_constant
%type <sym_expr> expression
%type <sym_expr> sym_expression
%type <sym_expr> int_expression
%type <int_const>int_constant
%type <string_ptr>jmp_address
%type <string_ptr>symbol
%type <sym_expr>n_elements
%type <sym_expr>opt_size_spec
%type <arg_set_ptr>opt_param_list
%type <arg_set_ptr>instance_port_list
%type <string_ptr>block_ref_name
%type <string_ptr>instance_name
%type <string_ptr>identifier_or_string
%type <bool>opt_micro
/* operator precedence */
%left INT
%left FIX
%left OR
%left L_AND
%left '|'
```

```
%left '^'
%left '&'
%left EQ_EQ NOT_EQ
%left LT_EQ GT_EQ '<' '>'
%left L_SHIFT R_SHIFT
%left '+'   '-'
%left '*'   '/'
%left LOG EXP
%left UMINUS '-' NOT
%tokenASMBLOCK
%tokenBLOCK
%token SEQBLOCK
%tokenGSPBLOCK
%tokenSUBRBLOCK
%tokenCALLBLOCK
%tokenBEG
%tokenEND
%token<string_ptr>IDENTIFIER
%token<string_ptr>STRING
%tokenINPUT
%tokenOUTPUT
%tokenWIRE
%tokenVARIABLE
%tokenPARAM
%tokenSYMBOL
%tokenDURATION
%tokenALIAS
%tokenVERIFY
%tokenVIRTUAL
%tokenORG
%tokenPHANTOM
%tokenINIT
%tokenMICRO
%tokenTIMEZONE
%tokenPORT
%tokenGPIO
%tokenRTS
%tokenCOMPUTELINE
%tokenDECIMATE
```

```
%tokenINTERPOLATE
%tokenEQ_EQ
%tokenNOT_EQ
%tokenLT_EQ
%tokenGT_EQ
%tokenL_SHIFT
%tokenR_SHIFT
%tokenL_AND
%tokenOR
%tokenNOT
%token <ival> INTEGER
%token <rval> REAL
/* opcodes */
%tokenADD
%tokenADC
%tokenAND
%tokenASL
%tokenASR
%tokenCLC
%token CMP
%tokenDJNE
%tokenEOR
%tokenJMP
%tokenJCC
%tokenJCS
%token JEQ
%tokenJLF
%tokenJMF
%tokenJOV
%tokenJSF
%tokenJZE
%tokenJGE
%tokenJLE
%tokenJGT
%tokenJLT
%tokenJNE
%token LBSJ
%tokenLDA
%tokenLDB
```

```
%tokenLDCC
%token LDD
%tokenLDF
%tokenLDWS
%tokenLDL
%tokenLDX
%tokenLDY
%tokenMAC
%tokenMPY
%tokenORA
%tokenSUB
%tokenSUBC
%tokenSTA
%tokenSTB
%tokenSTD
%tokenSTF
%tokenSTWS
%tokenSTL
%tokenSTMH
%tokenSTML
%tokenSTMG
%tokenSTMHI
%tokenSTMLI
%tokenSTMGI
%tokenSTBS
%tokenSTX
%tokenSTY
%tokenNOP
%tokenNOT
%tokenROL
%tokenROR
%tokenSEC
%token XLD
%tokenJWF
/* source registers */
%tokenA
%tokenB
%tokenD
%token F
```

```
/* don't use 'L' because it screws up defines of Long constants! */
%tokenLL
%tokenBS
%tokenWS
%tokenX
%tokenY
%tokenML
%tokenMH
%token MG
%tokenMLI
%tokenMHI
%token MGI
/* storage types */
%tokenFIXED
%tokenINTEG
%tokenHEX
%%
sdl :
 /* null */
 | blocks
 ;
blocks :
 block
 | blocks block
 ;
block
 hierarchical_block
 | primitive_block
 | sequence_block
 | gsp_block
 | subr_block
 | call_block
 ;
hierarchical_block :
 hier_block_start param_list port_list hier_declarations BEG hier_body END
                {
                        if (!end_of_block())
                        {
                                other_error("YAC001",
```

```
                    "IO for this block has not been declared.");
                    YYERROR;
            }
        }
;
primitive_block :
asm_block_start param_list port_list asm_declarations BEG asm_body END
        {
            if (!finish_asm_block())
            {
                    other_error("YAC002",
                    "Couldn't successfully compile this block.");
                    YYERROR;
            }
            if (!end_of_block())
            {
                    other_error("YAC001",
                    "IO for this block has not been declared.");
                    YYERROR;
            }
        }

subr_block :
subr_block_start param_list port_list asm_declarations BEG asm_body END
        {
            if (!finish_asm_block())
            {
                    other_error("YAC002",
                    "Couldn't successfully compile this block.");
                    YYERROR;
            }
            if (!end_of_block())
            {
                    other_error("YAC001",
                    "IO for this block has not been declared.");
                    YYERROR;
            }
        }
```

```
call_block :
 call_block_start param_list port_list asm_declarations BEG asm_body END
                 {
                        if (!finish_asm_block())
                        {
                                    other_error("YAC002",
                                    "Couldn't successfully compile this block.");
                                    YYERROR;
                        }
                        if (!end_of_block())
                        {
                                    other_error("YAC001",
                                    "IO for this block has not been declared.");
                                    YYERROR;
                        }
                 }

sequence_block :
 seq_block_start param_list port_list hier_declarations BEG hier_body END
                 {
                        if (!end_of_block())
                        {
                                    other_error("YAC001",
                                    "IO for this block has not been declared.");
                                    YYERROR;
                        }
                 }

gsp_block :
 gsp_block_start param_list port_list hier_declarations BEG gsp_body END
                 {
                        if (!end_of_block())
                        {
                                    other_error("YAC001",
                                    "IO for this block has not been declared.");
                                    YYERROR;
                        }
                 }
```

```
hier_block_start :
      BLOCK
            {
                  other_error("YAC003", "You must give an instance name.");
                  YYERROR;
            }
 | BLOCK IDENTIFIER
          {
                  new_hier_block();
                  if (!set_block_name($2))
                  {
                        error_w_string("YAC004",
                        "A block named '", $2,"' already exists.");
                        YYERROR;
                  }
            }
;
seq_block_start :
      SEQBLOCK
            {
                  other_error("YAC003", "You must give an instance name.");
                  YYERROR;
            }
 | SEQBLOCK IDENTIFIER
          {
                  new_seq_block();
                  if (!set_block_name($2))
                  {
                        error_w_string("YAC004",
                        "A block named '", $2,"' already exists.");
                        YYERROR;
                  }
            }
;
gsp_block_start :
      GSPBLOCK

                  other_error("YAC003", "You must give an instance name.");
                  YYERROR;
```

```
		}
| GSPBLOCK IDENTIFIER
		{
			new_gsp_block();
			if (!set_block_name($2))
			{
				error_w_string("YAC004",
				"A block named '", $2,"' already exists");
				YYERROR;
			}
		}
;
asm_block_start :
	ASMBLOCK
		{
			other_error("YAC003", "You must give an instance name.");
			YYERROR;
		}
| ASMBLOCK IDENTIFIER
		{
			new_asm_block();
			if (!set_block_name($2))
			{
				error_w_string("YAC004",
				"A block named '", $2,"' already exists.");
				YYERROR;
			}
			else
			{
				extern struct string* new_string();
				/* create a label called "$start" for the start of code */
				add_label_name(new_string("$start"), instr_number());
			}
		}
;
subr_block_start :
	SUBRBLOCK
		{
			other_error("YAC003", "You must give an instance name.");
```

```
            YYERROR;
        }
| SUBRBLOCK IDENTIFIER
    {
            new_subr_block();
            if (!set_block_name($2))
            {
                    error_w_string("YAC004",
                    "A block named '", $2,"' already exists.");
                    YYERROR;
            }
            else
            {
                    extern struct string* new_string();
                    /* create a label called "$start" for the start of code */
                    add_label_name(new_string("$start"), instr_number());
            }
        }
;
call_block_start :
    CALLBLOCK
        {
            other_error("YAC003", "You must give an instance name.");
            YYERROR;
        }
| CALLBLOCK IDENTIFIER

            new_call_block();
            if (!set_block_name($2))
            {
                    error_w_string("YAC004",
                    "A block named '", $2,"' already exists.");
                    YYERROR;
            }
            else
            {
                    extern struct string* new_string();
                    /* create a label called "$start" for the start of code */
                    add_label_name(new_string("$start"), instr_number());
```

```
            }
        }
;
port_list :
        /* null */
        | '(' ')'
| '(' ports ')'
;
ports :
        labeled_ports
        | implicit_ports
        ;
labeled_ports :
 port_spec
 | ports ';' port_spec
    ;
implicit_ports:
    inputs ';'
    | inputs ';' outputs
    | ';' outputs
 ;
port_spec :
    input_ports
    | output_ports
    ;
input_ports :
    INPUT inputs
    ;
inputs :
    input
    | inputs ',' input
    ;
input :
 opt_micro IDENTIFIER opt_size_spec
        {
            /* allocate I/O offset with this name */
                if (!add_io_name($2, &temp, $1))
                {
                        error_w_string("YAC005", "An input or output named '",
```

```
                    $2, "' already exists.");
                    YYERROR;
            }
        /* set size for I/O with this name */
            if (!set_io_size_and_direction($2, $3, FALSE))
            {
                    error_w_string("YAC006", "An I/O port named '", $2,
                    "' has not been declared.");
                    YYERROR;
            }
        }
;
output_ports :
    OUTPUT outputs
    ;
outputs :
    output
    | outputs ',' output
    ;
output :
opt_micro IDENTIFIER opt_size_spec
        {
        /* allocate I/O offset with this name */
            if (!add_io_name($2, &temp, $1))
            {
                    error_w_string("YAC005", "An input or output named '",
                    $2, "' already exists.");
                    YYERROR;
            }
        /* set size for I/O with this name */
            if (!set_io_size_and_direction($2, $3, TRUE))
            {
                    error_w_string("YAC006", "An I/O port named '", $2,
                    "' has not been declared.");
                    YYERROR;
            }
        }
| opt_micro IDENTIFIER opt_size_spec '=' expression
        {
```

```
/* allocate I/O offset with this name */
      if (!add_io_name($2, &temp, $1))
      {
            error_w_string("YAC005", "An input or output named '",
            $2, "' already exists.");
            YYERROR;
      }
/* set size for I/O with this name */
      if (!set_io_size_and_direction($2, $3, TRUE))
      {
            error_w_string("YAC006", "An I/O port named '", $2,
            "' has not been declared.");
            YYERROR;
      }
/* set initial value for I/O (psuedo-sampled output) */
      set_io_init_value(temp, $5);
}
;
opt_micro : /* optional interface declaration for micro interface */
/* null */
      {
            $$ = FALSE;
      }
| MICRO
      {
            $$ = TRUE;
      }
;
param_list :
/* null */
      {
            finish_adding_params();
      }
| '[' ']'
      {
            finish_adding_params();
      }
| '[' params ']'
      {
```

```
                finish_adding_params();
            }
    ;
params :
    param
    | params ',' param
    ;
param :
        param_def
        | param_value_def
        ;
param_def :
    identifier_or_string
                {
                    /* enter NULL as value for this name */
                    if (!add_expression_name($1, NULL))
                    {
                            error_w_string("YAC007", "The parameter or variable '", $1,
                            "' is already defined.");
                            YYERROR;
                    }
                    if (!add_param_name($1, &temp))
                    {
                            error_w_string("YAC008", "A parameter named '", $1,
                            "' already exists.");
                            YYERROR;
                    }
                }
    ;
param_value_def :
    identifier_or_string '=' expression
                {
                    /* enter expr as value for this name */
                    if (!add_expression_name($1, $3))
                    {
                            error_w_string("YAC009", "The parameter '", $1,
                            "' is already defined.");
                            YYERROR;
                    }
```

```
                    if (!add_param_name($1, &temp))
                    {
                            error_w_string("YAC008", "A parameter named '", $1,
                            "' already exists.");
                            YYERROR;
                    }
                }
;
asm_declarations :
        /* null */
        | asm_declaration_list
        ;
asm_declaration_list :
        asm_declaration
| asm_declaration_list asm_declaration
;
asm_declaration :
variable_declaration
        | symbol_declaration
| duration_declaration
        | alias_declaration
        | verify_declaration
        | org_declaration
        | phantom_declaration
        | virtual_declaration
        | init_declaration
        | timezone_declaration
        | port_declaration
        | compute_declaration
        | decimate_declaration
        | interpolate_declaration
| error ';'
;
hier_declarations :
        /* null */
        | hier_declaration_list
        ;
hier_declaration_list :
hier_declaration
```

```
 | hier_declaration_list hier_declaration
 ;
hier_declaration :
 wire_declaration
 | variable_declaration
        | symbol_declaration
        | alias_declaration
        | verify_declaration
        | phantom_declaration
        | virtual_declaration
        | init_declaration
| error ';'
 ;
wire_declaration :
 wire_type_declare wire_defs ';'
 ;
wire_type_declare :
        opt_micro WIRE FIXED
                {
                        storage_type = 'f';
                        micro = $1;
                }
        | opt_micro WIRE INTEG
                {
                        storage_type = 'i';
                        micro = $1;
                }
        | opt_micro WIRE HEX
                {
                        storage_type = 'h';
                        micro = $1;
                }
        | opt_micro WIRE
                {
                        storage_type = ' ';
                        micro = $1;
                }
        ;
variable_declaration :
```

```
var_type_declare var_defs ';'
;
symbol_declaration :
symbol_type_declare symbol_defs ';'
;
symbol_type_declare :
      opt_micro SYMBOL
            {
                  micro = $1;
            }
      ;
duration_declaration :
 DURATION int_expression ';'
            {
                  if (!set_duration($2))
                  {
                              other_error("YAC010",
                              "A duration for this block has already been declared.");
                              YYERROR;
                  }
            }
 ;
decimate_declaration :
 DECIMATE int_expression ';'
            {
                  set_decimating($2);
            }
 ;
interpolate_declaration :
 INTERPOLATE int_expression ';'
            {
                  set_interpolating($2);
            }
 ;
wire_defs :
 wire_def
 | wire_defs ',' wire_def
 ;
wire_def :
```

```
IDENTIFIER opt_size_spec
        {
                /* if no type declared for storage, default it to "fixed" */
                if (storage_type == ' ')
                        storage_type = 'f';
            /* allocate storage with this name, and initialize to NULL */
                if (!add_storage_name($1, $2, &temp, storage_type, micro,FALSE))
                {
                        error_w_string("YAC011", "A wire or I/O port named '", $1,
                        "' already exists.");
                        YYERROR;
                }
            }
    | wire_value_def
;
wire_value_def :
IDENTIFIER opt_size_spec '=' sym_expression
        {
                /* if no type declared for storage, default it to "fixed" */
                if (storage_type == ' ')
                        storage_type = 'f';
            /* allocate storage with this name, and initialize to expr */
                if (add_storage_name($1, $2, &temp, storage_type, FALSE, FALSE))
                {
                        add_storage_init(temp, $4);
                        /* enter expr as value for this name */
                        if (!add_expression_name($1, $4))
                        {
                        error_w_string("YAC012",
                        "The variable or parameter '", $1,
                        "' is already defined.");
                        YYERROR;
                        }
                }
                else
                {
                        error_w_string("YAC013",
                        "Storage named '", $1, "' already exists.");
                        YYERROR;
```

```
				}
		}
| IDENTIFIER opt_size_spec '=' int_constant
	{
			/* if no type declared for storage, default it to "int" */
			if (storage_type == ' ')
					storage_type = 'i';
		/* allocate storage with this name, and initialize to expr */
			if (add_storage_name($1, $2, &temp, storage_type, FALSE, FALSE))
			{
					add_storage_init(temp, $4);
					/* enter expr as value for this name */
					if (!add_expression_name($1, $4))
					{
					error_w_string("YAC012",
					"The variable or parameter '", $1,
					"' is already defined.");
					YYERROR;
					}
			}
			else
			{
					error_w_string("YAC014",
					"Storage named '", $1, "' already exists.");
					YYERROR;
			}
		}
| IDENTIFIER opt_size_spec '=' real_constant
	{
			/* if no type declared for storage, default it to "fixed" */
			if (storage_type == ' ')
					storage_type = 'f';
		/* allocate storage with this name, and initialize to expr */
			if (add_storage_name($1, $2, &temp, storage_type, FALSE, FALSE))
			{
					add_storage_init(temp, $4);
					/* enter expr as value for this name */
					if (!add_expression_name($1, $4))
					{
```

```
                        error_w_string("YAC012",
                        "The variable or parameter '", $1,
                        "' is already defined.");
                        YYERROR;
                        }
                }
                else
                {
                        error_w_string("YAC014",
                        "Storage named '", $1, "' already exists.");
                        YYERROR;
                }
        }
;
var_type_declare :
      opt_micro VARIABLE FIXED
           {
                storage_type = 'f';
                micro = $1;
           }
     | opt_micro VARIABLE INTEG
           {
                storage_type = 'i';
                micro = $1;
           }
     | opt_micro VARIABLE HEX
           {
                storage_type = 'h';
                micro = $1;
           }
     | opt_micro VARIABLE
           {
                storage_type = ' ';
                micro = $1;
           }
     ;
var_defs :
 var_def
| var_defs ',' var_def
```

```
;
var_def :
IDENTIFIER opt_size_spec
        {
                /* if no type declared for storage, default it to "fixed" */
                if (storage_type == ' ')
                        storage_type = 'f';
            /* allocate storage with this name, and initialize to NULL */
                if (add_storage_name($1, $2, &temp, storage_type, micro, TRUE))
                        add_storage_init(temp, NULL);
                else
                {
                        error_w_string("YAC014",
                        "Storage named '", $1, "' already exists.");
                        YYERROR;
                }
            }
    | var_value_def
;
var_value_def :
IDENTIFIER opt_size_spec '=' sym_expression
        {
                /* if no type declared for storage, default it to "fixed" */
                if (storage_type == ' ')
                        storage_type = 'f';

            /* allocate storage with this name, and initialize to expr */
                if (add_storage_name($1, $2, &temp, storage_type, micro, TRUE))
                {
                        add_storage_init(temp, $4);
                        /* enter expr as value for this name */
                        if (!add_expression_name($1, $4))
                        {
                        error_w_string("YAC012",
                        "The variable or parameter '", $1,
                        "' is already defined.");
                        YYERROR;
                        }
                }
```

```
                        else
                        {
                                    error_w_string("YAC014",
                                    "Storage named '", $1, "' already exists.");
                                    YYERROR;
                        }
                    }
| IDENTIFIER opt_size_spec '=' int_constant
          {
                        /* if no type declared for storage, default it to "int" */
                        if (storage_type == ' ')
                                    storage_type = 'i';
                    /* allocate storage with this name, and initialize to expr */
                        if (add_storage_name($1, $2, &temp, storage_type, micro, TRUE))
                        {
                                    add_storage_init(temp, $4);
                                    /* enter expr as value for this name */
                                    if (!add_expression_name($1, $4))
                                    {
                                    error_w_string("YAC012",
                                    "The variable or parameter '", $1,
                                    "' is already defined.");
                                    YYERROR;
                                    }
                        }
                        else
                        {
                                    error_w_string("YAC014",
                                    "Storage named '", $1, "' already exists.");
                                    YYERROR;
                        }
                    }
| IDENTIFIER opt_size_spec '=' real_constant
          {
                        /* if no type declared for storage, default it to "fixed" */
                        if (storage_type == ' ')
                                    storage_type = 'f';
                    /* allocate storage with this name, and initialize to expr */
                        if (add_storage_name($1, $2, &temp, storage_type, micro, TRUE))
```

```
{
        add_storage_init(temp, $4);
        /* enter expr as value for this name */
        if (!add_expression_name($1, $4))
        {
        error_w_string("YAC012",
        "The variable or parameter '", $1,
        "' is already defined.");
        YYERROR;
        }
}
else
{
        error_w_string("YAC014",
        "Storage named '", $1, "' already exists.");
        YYERROR;
}

;
symbol_defs :
 symbol_def
 | symbol_defs ',' symbol_def
 ;
symbol_def :
 identifier_or_string '=' expression
        {
        /* enter expr as value for this name */
        if (!add_expression_name($1, $3))
        {
                error_w_string("YAC015",
                "The symbol or parameter '", $1,
                "' is already defined.");
                YYERROR;
        }
        if (!add_symbol_name($1, &temp, micro))
        {
                error_w_string("YAC016",
                "A symbol or parameter named '", $1,
                "' already exists.");
```

```
                YYERROR;
            }
        }
;
opt_size_spec : /* declares arrays and digital bus widths */
/* null */
        {
            $$ = NULL;/* implies scalar */
        }
| '[' n_elements ']'
            {
                $$ = $2;
            }
;
alias_declaration :
    ALIAS IDENTIFIER IDENTIFIER ';'
            {
                /* add alias name & equivalent name to alias name table */
                if (!add_alias_name($2, $3))
                {
                        error_w_string("YAC017",
                        "The alias '", $2, "' is already defined.");
                        YYERROR;
                }
            }
    ;
identifier_or_string :
    IDENTIFIER
    | STRING
    ;
verify_declaration :
VERIFY expression ';'
            {
                add_verify_expression($2, NULL);
            }
    | VERIFY expression ',' STRING ';'
            {
                add_verify_expression($2, $4);
            }
```

```
;
org_declaration :
 ORG INTEGER ';'
                {
                        set_origin((int) $2);
                }
;
phantom_declaration :
 PHANTOM ';'
                {
                        set_phantom();
                }
;
virtual_declaration :
 VIRTUAL ';'
                {
                        set_as_virtual_io();
                }
;
init_declaration :
 INIT ';'
                {
                        set_init();
                }
;
timezone_declaration :
        TIMEZONE sym_expression ';'
                {
                        if (!set_timezone($2, NULL))
                        {
                                /* function prints error msg */
                                YYERROR;
                        }


        | TIMEZONE sym_expression '=' int_expression ';'
                {
                        if (!set_timezone($2, $4))
                        {
```

```
                YYERROR;
            }
        }
    ;
port_declaration :
    PORT int_expression ',' int_expression ',' INPUT ',' int_expression ','
        int_expression ';'
        {
            if (!set_as_port($2, $4, FALSE, $8, $10))
            {
                other_error("YAC018",
                "A port for this block has already been declared.");
                YYERROR;
            }
        }
    | PORT int_expression ',' int_expression ',' OUTPUT ',' int_expression ','
        int_expression ';'
        {
            if (!set_as_port($2, $4, TRUE, $8, $10))
            {
                other_error("YAC018",
                "A port for this block has already been declared.");
                YYERROR;
            }
        }
    | GPIO int_expression ',' INPUT ';'
        {
            set_gpio($2, FALSE);
        }
    | GPIO int_expression ',' OUTPUT ';'
        {
            set_gpio($2, TRUE);
        }
    | RTS int_expression ',' INPUT ';'
        {
            set_rts($2, FALSE);
        }
    | RTS int_expression ',' OUTPUT ';'
        {
```

```
                set_rts($2, TRUE);
            }
    ;
compute_declaration :
    COMPUTELINE int_expression ';'
            {
                if (!set_compute_line($2))
                {
                        other_error("YAC028",
                        "A computeline or port for this block has already been
declared.");
                        YYERROR;
                }
            }
    ;
int_expression :
    int_constant
            { $$ = $1; }
| sym_expression
;
expression :
    int_constant
            { $$ = $1; }
| real_constant
            { $$ = $1; }
| sym_expression
;
int_constant : /* integer expression from known values */
INTEGER
            { $$ = int_to_expr($1); } /* convert to constant expression */
| int_constant '+' int_constant
            { $$ = int_to_expr(int_value($1) + int_value($3)); }
| int_constant '-' int_constant
            { $$ = int_to_expr(int_value($1) - int_value($3)); }
| int_constant '*' int_constant
            { $$ = int_to_expr(int_value($1) * int_value($3)); }
| int_constant '/' int_constant
            { $$ = int_to_expr( round(
                        divide((double) int_value($1), (double) int_value($3) )));
```

```
            }
    | int_constant LOG int_constant
            { $$ = int_to_expr( round(
                        logn( (double) int_value($1), (double) int_value($3) ) ) );
            }
    | int_constant EXP int_constant
            { $$ = int_to_expr( round(
                        expn( (double) int_value($1), (double) int_value($3) ) ) );
            }
| int_constant L_AND int_constant
            { $$ = int_to_expr(int_value($1) && int_value($3)); }
| real_constant L_AND real_constant
            { $$ = int_to_expr(round(real_value($1)) && round(real_value($3))); }
| real_constant L_AND int_constant
            { $$ = int_to_expr(round(real_value($1)) && int_value($3)); }
| int_constant L_AND real_constant
            { $$ = int_to_expr(int_value($1) && round(real_value($3))); }
| int_constant OR int_constant
            { $$ = int_to_expr(int_value($1) || int_value($3)); }
| real_constant OR real_constant
            { $$ = int_to_expr(round(real_value($1)) || round(real_value($3))); }
| real_constant OR int_constant
            { $$ = int_to_expr(round(real_value($1)) || int_value($3)); }
| int_constant OR real_constant
            { $$ = int_to_expr(int_value($1) || round(real_value($3))); }
| '-' int_constant %prec UMINUS
            { $$ = int_to_expr( - int_value($2)); }
| '~' int_constant
            { $$ = int_to_expr( ~ int_value($2)); }
| NOT int_constant
            { $$ = int_to_expr( ! int_value($2)); }
| NOT real_constant
            { $$ = int_to_expr( ! round(real_value($2))); }
| '~' real_constant
            { bitwise_err(); YYERROR; }
    | INT int_constant
            { $$ = $2; }
    | INT real_constant
            { $$ = int_to_expr(int_value($2)); }
```

```
    | FIX real_constant
                { $$ = $2; }
    | FIX int_constant
                { $$ = real_to_expr(real_value($2)); }
| '(' int_constant ')'
                { $$ = $2; }
| int_constant EQ_EQ int_constant
                { $$ = int_to_expr((long) (int_value($1) == int_value($3))); }
| real_constant EQ_EQ real_constant
                { $$ = int_to_expr((long) (real_value($1) == real_value($3))); }
| real_constant EQ_EQ int_constant
                { $$ = int_to_expr((long) (real_value($1) == (double) int_value($3))); }
| int_constant EQ_EQ real_constant
                { $$ = int_to_expr((long) ((double) int_value($1) == real_value($3))); }
| int_constant NOT_EQ int_constant
                { $$ = int_to_expr((long) (int_value($1) != int_value($3))); }
| real_constant NOT_EQ real_constant
                { $$ = int_to_expr((long) (real_value($1) != real_value($3))); }
| real_constant NOT_EQ int_constant
                { $$ = int_to_expr((long) (real_value($1) != (double) int_value($3))); }
| int_constant NOT_EQ real_constant
                { $$ = int_to_expr((long) ((double) int_value($1) != real_value($3))); }
| int_constant LT_EQ int_constant
                { $$ = int_to_expr((long) (int_value($1) <= int_value($3))); }
| real_constant LT_EQ real_constant
                { $$ = int_to_expr((long) (real_value($1) <= real_value($3))); }
| real_constant LT_EQ int_constant
                { $$ = int_to_expr((long) (real_value($1) <= (double) int_value($3))); }
| int_constant LT_EQ real_constant
                { $$ = int_to_expr((long) ((double) int_value($1) <= real_value($3))); }
| int_constant GT_EQ int_constant
                { $$ = int_to_expr((long) (int_value($1) >= int_value($3))); }
| real_constant GT_EQ real_constant
                { $$ = int_to_expr((long) (real_value($1) >= real_value($3))); }
| real_constant GT_EQ int_constant
                { $$ = int_to_expr((long) (real_value($1) >= (double) int_value($3))); }
| int_constant GT_EQ real_constant
                { $$ = int_to_expr((long) ((double) int_value($1) >= real_value($3))); }
| int_constant '<' int_constant
```

```
            { $$ = int_to_expr((long) (int_value($1) < int_value($3))); }
| real_constant '<' real_constant
            { $$ = int_to_expr((long) (real_value($1) < real_value($3))); }
| real_constant '<' int_constant
            { $$ = int_to_expr((long) (real_value($1) < (double) int_value($3))); }
| int_constant '<' real_constant
            { $$ = int_to_expr((long) ((double) int_value($1) < real_value($3))); }
| int_constant '>' int_constant
            { $$ = int_to_expr((long) (int_value($1) > int_value($3))); }
| real_constant '>' real_constant
            { $$ = int_to_expr((long) (real_value($1) > real_value($3))); }
| real_constant '>' int_constant
            { $$ = int_to_expr((long) (real_value($1) > (double) int_value($3))); }
| int_constant '>' real_constant
            { $$ = int_to_expr((long) ((double) int_value($1) > real_value($3))); }
| int_constant '&' int_constant
            { $$ = int_to_expr((long) (int_value($1) & int_value($3))); }
| real_constant '&' real_constant
            { bitwise_err(); YYERROR; }
| real_constant '&' int_constant
            { bitwise_err(); YYERROR; }
| int_constant '&' real_constant
            { bitwise_err(); YYERROR; }
| int_constant '|' int_constant
            { $$ = int_to_expr((long) (int_value($1) | int_value($3))); }
| real_constant '|' real_constant
            { bitwise_err(); YYERROR; }
| real_constant '|' int_constant
            { bitwise_err(); YYERROR; }
| int_constant L_SHIFT int_constant
            { $$ = int_to_expr((long) (int_value($1) << int_value($3))); }
| real_constant L_SHIFT real_constant
            { shift_err(); YYERROR; }
| real_constant L_SHIFT int_constant
            { shift_err(); YYERROR; }
| int_constant L_SHIFT real_constant
            { shift_err(); YYERROR; }
| int_constant R_SHIFT int_constant
            { $$ = int_to_expr((long) (int_value($1) >> int_value($3))); }
```

```
| real_constant R_SHIFT real_constant
                { shift_err(); YYERROR; }
| real_constant R_SHIFT int_constant
                { shift_err(); YYERROR; }
| int_constant R_SHIFT real_constant
                { shift_err(); YYERROR; }
| int_constant '^' int_constant
                { $$ = int_to_expr((long) (int_value($1) ^ int_value($3))); }
| real_constant '^' real_constant
                { bitwise_err(); YYERROR; }
| real_constant '^' int_constant
                { bitwise_err(); YYERROR; }
| int_constant '^' real_constant
                { bitwise_err(); YYERROR; }
    ;
real_constant : /* real expression from known values */
 REAL
                { $$ = real_to_expr($1); } /* convert to constant expression */
| real_constant '+' real_constant
                { $$ = real_to_expr(real_value($1) + real_value($3)); }
| real_constant '+' int_constant
                { $$ = real_to_expr(real_value($1) + int_value($3)); }
| int_constant '+' real_constant
                { $$ = real_to_expr(int_value($1) + real_value($3)); }
| real_constant '-' real_constant
                { $$ = real_to_expr(real_value($1) - real_value($3)); }
| real_constant '-' int_constant
                { $$ = real_to_expr(real_value($1) - int_value($3)); }
| int_constant '-' real_constant
                { $$ = real_to_expr(int_value($1) - real_value($3)); }
| real_constant '*' real_constant
                { $$ = real_to_expr(real_value($1) * real_value($3)); }
| real_constant '*' int_constant
                { $$ = real_to_expr(real_value($1) * int_value($3)); }
| int_constant '*' real_constant
                { $$ = real_to_expr(int_value($1) * real_value($3)); }
| real_constant '/' real_constant
                { $$ = real_to_expr(
                        divide(real_value($1), real_value($3) ) );
```

```
                }
| real_constant '/' int_constant
                { $$ = real_to_expr(
                        divide(real_value($1), (double) int_value($3) ) );
                }
| int_constant '/' real_constant
                { $$ = real_to_expr(
                        divide((double) int_value($1), real_value($3) ) );
                }
    | real_constant LOG real_constant
                { $$ = real_to_expr(
                        logn( real_value($1), real_value($3) ) );
                }
    | real_constant LOG int_constant
                { $$ = real_to_expr(
                        logn( real_value($1), (double) int_value($3) ) );
                }
    | int_constant LOG real_constant
                { $$ = real_to_expr(
                        logn( (double) int_value($1), real_value($3) ) );
                }
    | real_constant EXP real_constant
                { $$ = real_to_expr(
                        expn( real_value($1), real_value($3) ) );
                }
    | real_constant EXP int_constant
                { $$ = real_to_expr(
                        expn( real_value($1),(double) int_value($3) ) );
                }
    | int_constant EXP real_constant
                { $$ = real_to_expr(
                        expn( (double) int_value($1),real_value($3) ) );
                }
| '-' real_constant %prec UMINUS
                { $$ = real_to_expr( - real_value($2)); }
| '(' real_constant ')'
                { $$ = $2; }
;
sym_expression : /* expression from symbolic values */
```

```
/* These rules return a symbolic expression from the RHS tokens. */
/* The expression is created in Reverse Polish order. */
symbol
                { $$ = string_to_expr($1); }
    | sym_expression '+' sym_expression
                { $$ = concat_expr(concat_expr($1, $3), operator_to_expr('+') ); }
| sym_expression '+' int_constant
                { $$ = concat_expr(concat_expr($1, $3), operator_to_expr('+') ); }
| int_constant '+' sym_expression
                { $$ = concat_expr(concat_expr($1, $3), operator_to_expr('+') ); }
| sym_expression '+' real_constant
                { $$ = concat_expr(concat_expr($1, $3), operator_to_expr('+') ); }
| real_constant '+' sym_expression
                { $$ = concat_expr(concat_expr($1, $3), operator_to_expr('+') ); }
| sym_expression '-' sym_expression
                { $$ = concat_expr(concat_expr($1, $3), operator_to_expr('-') ); }
| sym_expression '-' int_constant
                { $$ = concat_expr(concat_expr($1, $3), operator_to_expr('-') ); }
| int_constant '-' sym_expression
                { $$ = concat_expr(concat_expr($1, $3), operator_to_expr('-') ); }
| sym_expression '-' real_constant
                { $$ = concat_expr(concat_expr($1, $3), operator_to_expr('-') ); }
| real_constant '-' sym_expression
                { $$ = concat_expr(concat_expr($1, $3), operator_to_expr('-') ); }
| sym_expression '*' sym_expression
                { $$ = concat_expr(concat_expr($1, $3), operator_to_expr('*') ); }
| sym_expression '*' int_constant
                { $$ = concat_expr(concat_expr($1, $3), operator_to_expr('*') ); }
| int_constant '*' sym_expression
                { $$ = concat_expr(concat_expr($1, $3), operator_to_expr('*') ); }
| sym_expression '*' real_constant
                { $$ = concat_expr(concat_expr($1, $3), operator_to_expr('*') ); }
| real_constant '*' sym_expression
                { $$ = concat_expr(concat_expr($1, $3), operator_to_expr('*') ); }
| sym_expression '/' sym_expression
                { $$ = concat_expr(concat_expr($1, $3), operator_to_expr('/') ); }
| sym_expression '/' int_constant
                { $$ = concat_expr(concat_expr($1, $3), operator_to_expr('/') ); }
| int_constant '/' sym_expression
```

```
        { $$ = concat_expr(concat_expr($1, $3), operator_to_expr('/') ); }
| sym_expression '/' real_constant
        { $$ = concat_expr(concat_expr($1, $3), operator_to_expr('/') ); }
| real_constant '/' sym_expression
        { $$ = concat_expr(concat_expr($1, $3), operator_to_expr('/') ); }
| sym_expression LOG sym_expression
        { $$ = concat_expr(concat_expr($1, $3), operator_to_expr('L') ); }
| sym_expression LOG int_constant
        { $$ = concat_expr(concat_expr($1, $3), operator_to_expr('L') ); }
| int_constant LOG sym_expression
        { $$ = concat_expr(concat_expr($1, $3), operator_to_expr('L') ); }
| sym_expression LOG real_constant
        { $$ = concat_expr(concat_expr($1, $3), operator_to_expr('L') ); }
| real_constant LOG sym_expression
        { $$ = concat_expr(concat_expr($1, $3), operator_to_expr('L') ); }
| sym_expression EXP sym_expression
        { $$ = concat_expr(concat_expr($1, $3), operator_to_expr('E') ); }
| sym_expression EXP int_constant
        { $$ = concat_expr(concat_expr($1, $3), operator_to_expr('E') ); }
| int_constant EXP sym_expression
        { $$ = concat_expr(concat_expr($1, $3), operator_to_expr('E') ); }
| sym_expression EXP real_constant
        { $$ = concat_expr(concat_expr($1, $3), operator_to_expr('E') ); }
| real_constant EXP sym_expression
        { $$ = concat_expr(concat_expr($1, $3), operator_to_expr('E') ); }
| '-' sym_expression %prec UMINUS
        { $$ = concat_expr($2,operator_to_expr('M') ); }
| '~' sym_expression
        { $$ = concat_expr($2,operator_to_expr('~') ); }
| NOT sym_expression
        { $$ = concat_expr($2,operator_to_expr('n') ); }
| INT sym_expression
        { $$ = concat_expr($2,operator_to_expr('I') ); }
| FIX sym_expression
        { $$ = concat_expr($2,operator_to_expr('F') ); }
| '(' sym_expression ')'
        { $$ = $2; }
| sym_expression EQ_EQ sym_expression
        { $$ = concat_expr(concat_expr($1, $3), operator_to_expr('Q') ); }
```

```
| sym_expression EQ_EQ int_constant
        { $$ = concat_expr(concat_expr($1, $3), operator_to_expr('Q') ); }
| int_constant EQ_EQ sym_expression
        { $$ = concat_expr(concat_expr($1, $3), operator_to_expr('Q') ); }
| sym_expression EQ_EQ real_constant
        { $$ = concat_expr(concat_expr($1, $3), operator_to_expr('Q') ); }
| real_constant EQ_EQ sym_expression
        { $$ = concat_expr(concat_expr($1, $3), operator_to_expr('Q') ); }
| sym_expression NOT_EQ sym_expression
        { $$ = concat_expr(concat_expr($1, $3), operator_to_expr('N') ); }
| sym_expression NOT_EQ int_constant
        { $$ = concat_expr(concat_expr($1, $3), operator_to_expr('N') ); }
| int_constant NOT_EQ sym_expression
        { $$ = concat_expr(concat_expr($1, $3), operator_to_expr('N') ); }
| sym_expression NOT_EQ real_constant
        { $$ = concat_expr(concat_expr($1, $3), operator_to_expr('N') ); }
| real_constant NOT_EQ sym_expression
        { $$ = concat_expr(concat_expr($1, $3), operator_to_expr('N') ); }
| sym_expression LT_EQ sym_expression
        { $$ = concat_expr(concat_expr($1, $3), operator_to_expr('l') ); }
| sym_expression LT_EQ int_constant
        { $$ = concat_expr(concat_expr($1, $3), operator_to_expr('l') ); }
| int_constant LT_EQ sym_expression
        { $$ = concat_expr(concat_expr($1, $3), operator_to_expr('l') ); }
| sym_expression LT_EQ real_constant
        { $$ = concat_expr(concat_expr($1, $3), operator_to_expr('l') ); }
| real_constant LT_EQ sym_expression
        { $$ = concat_expr(concat_expr($1, $3), operator_to_expr('l') ); }
| sym_expression GT_EQ sym_expression
        { $$ = concat_expr(concat_expr($1, $3), operator_to_expr('g') ); }
| sym_expression GT_EQ int_constant
        { $$ = concat_expr(concat_expr($1, $3), operator_to_expr('g') ); }
| int_constant GT_EQ sym_expression
        { $$ = concat_expr(concat_expr($1, $3), operator_to_expr('g') ); }
| sym_expression GT_EQ real_constant
        { $$ = concat_expr(concat_expr($1, $3), operator_to_expr('g') ); }
| real_constant GT_EQ sym_expression
        { $$ = concat_expr(concat_expr($1, $3), operator_to_expr('g') ); }
| sym_expression '<' sym_expression
```

```
                { $$ = concat_expr(concat_expr($1, $3), operator_to_expr('<') ); }
| sym_expression '<' int_constant
                { $$ = concat_expr(concat_expr($1, $3), operator_to_expr('<') ); }
| int_constant '<' sym_expression
                { $$ = concat_expr(concat_expr($1, $3), operator_to_expr('<') ); }
| sym_expression '<' real_constant
                { $$ = concat_expr(concat_expr($1, $3), operator_to_expr('<') ); }
| real_constant '<' sym_expression
                { $$ = concat_expr(concat_expr($1, $3), operator_to_expr('<') ); }
| sym_expression '>' sym_expression
                { $$ = concat_expr(concat_expr($1, $3), operator_to_expr('>') ); }
| sym_expression '>' int_constant
                { $$ = concat_expr(concat_expr($1, $3), operator_to_expr('>') ); }
| int_constant '>' sym_expression
                { $$ = concat_expr(concat_expr($1, $3), operator_to_expr('>') ); }
| sym_expression '>' real_constant
                { $$ = concat_expr(concat_expr($1, $3), operator_to_expr('>') ); }
| real_constant '>' sym_expression
                { $$ = concat_expr(concat_expr($1, $3), operator_to_expr('>') ); }
| sym_expression '&' sym_expression
                { $$ = concat_expr(concat_expr($1, $3), operator_to_expr('&') ); }
| sym_expression '&' int_constant
                { $$ = concat_expr(concat_expr($1, $3), operator_to_expr('&') ); }
| int_constant '&' sym_expression
                { $$ = concat_expr(concat_expr($1, $3), operator_to_expr('&') ); }
| sym_expression '&' real_constant
                { bitwise_err(); YYERROR; }
| real_constant '&' sym_expression
                { bitwise_err(); YYERROR; }
| sym_expression '|' sym_expression
                { $$ = concat_expr(concat_expr($1, $3), operator_to_expr('|') ); }
| sym_expression '|' int_constant
                { $$ = concat_expr(concat_expr($1, $3), operator_to_expr('|') ); }
| int_constant '|' sym_expression
                { $$ = concat_expr(concat_expr($1, $3), operator_to_expr('|') ); }
| sym_expression '|' real_constant
                { bitwise_err(); YYERROR; }
| real_constant '|' sym_expression
                { bitwise_err(); YYERROR; }
```

```
| sym_expression L_SHIFT sym_expression
        { $$ = concat_expr(concat_expr($1, $3), operator_to_expr('s') ); }
| sym_expression L_SHIFT int_constant
        { $$ = concat_expr(concat_expr($1, $3), operator_to_expr('s') ); }
| int_constant L_SHIFT sym_expression
        { $$ = concat_expr(concat_expr($1, $3), operator_to_expr('s') ); }
| sym_expression L_SHIFT real_constant
        { shift_err(); YYERROR; }
| real_constant L_SHIFT sym_expression
        { shift_err(); YYERROR; }
| sym_expression R_SHIFT sym_expression
        { $$ = concat_expr(concat_expr($1, $3), operator_to_expr('r') ); }
| sym_expression R_SHIFT int_constant
        { $$ = concat_expr(concat_expr($1, $3), operator_to_expr('r') ); }
| int_constant R_SHIFT sym_expression
        { $$ = concat_expr(concat_expr($1, $3), operator_to_expr('r') ); }
| sym_expression R_SHIFT real_constant
        { shift_err(); YYERROR; }
| real_constant R_SHIFT sym_expression
        { shift_err(); YYERROR; }
| sym_expression '^' sym_expression
        { $$ = concat_expr(concat_expr($1, $3), operator_to_expr('^') ); }
| sym_expression '^' int_constant
        { $$ = concat_expr(concat_expr($1, $3), operator_to_expr('^') ); }
| int_constant '^' sym_expression
        { $$ = concat_expr(concat_expr($1, $3), operator_to_expr('^') ); }
| sym_expression '^' real_constant
        { bitwise_err(); YYERROR; }
| real_constant '^' sym_expression
        { bitwise_err(); YYERROR; }
| sym_expression L_AND sym_expression
        { $$ = concat_expr(concat_expr($1, $3), operator_to_expr('a') ); }
| sym_expression L_AND int_constant
        { $$ = concat_expr(concat_expr($1, $3), operator_to_expr('a') ); }
| int_constant L_AND sym_expression
        { $$ = concat_expr(concat_expr($1, $3), operator_to_expr('a') ); }
| sym_expression L_AND real_constant
        { $$ = concat_expr(concat_expr($1, $3), operator_to_expr('a') ); }
| real_constant L_AND sym_expression
```

```
                { $$ = concat_expr(concat_expr($1, $3), operator_to_expr('a') ); }
 | sym_expression OR sym_expression
                { $$ = concat_expr(concat_expr($1, $3), operator_to_expr('o') ); }
 | sym_expression OR int_constant
                { $$ = concat_expr(concat_expr($1, $3), operator_to_expr('o') ); }
 | int_constant OR sym_expression
                { $$ = concat_expr(concat_expr($1, $3), operator_to_expr('o') ); }
 | sym_expression OR real_constant
                { $$ = concat_expr(concat_expr($1, $3), operator_to_expr('o') ); }
 | real_constant OR sym_expression
                { $$ = concat_expr(concat_expr($1, $3), operator_to_expr('o') ); }
 ;
symbol :
      IDENTIFIER
      | STRING
      ;
n_elements :
 int_expression
 ;
hier_body :
 block_refs
 ;
gsp_body :
 gsp_block_refs
 ;
gsp_block_refs :
 gsp_block_ref
 | gsp_block_refs gsp_block_ref
 ;
gsp_block_ref :
      block_ref
      | start_gsp_asm asm_body end_gsp_asm
      | label
      ;
start_gsp_asm :
      BEG
                {
                      /* embedded assembly block looks like nested asm block */
                      new_asm_block();
```

```
                }
        ;
end_gsp_asm :
        END
                {
                        if (!finish_asm_block())
                        {
                                other_error("YAC021", "Unable to compile this block.");
                                YYERROR;
                        }
                        if (!end_of_asm_section())
                        {
                                other_error("YAC021", "Unable to compile this block.");
                                YYERROR;
                        }
                        /* treat like a line (for labels) */
                        advance_instr_number();
                }
        ;
block_refs :
 block_ref
 | block_refs block_ref
 ;
block_ref :
 block_ref_name instance_name opt_param_list instance_port_list ';'
                {
                        instr_line = 0;/* use "line" for error reporting */
                        new_block_ref($1, $2, line);
                        store_vals($3);
                        store_ports($4);
                        if (!save_this_block_ref())
                        {
                                other_error("YAC022",
                                "An instance by this name already exists.");
                                YYERROR;
                        }
                        else
                                /* treat like a line (for labels) */
                                advance_instr_number();
```

```
                }
        | block_ref_name opt_param_list instance_port_list ';'
                {
                        other_error("YAC023", "You must give an instance name.");
                        YYERROR;
                }
        | block
    | error
    ;
block_ref_name :
    IDENTIFIER
    ;
instance_name :
    IDENTIFIER
    ;
opt_param_list :
    /* null */
                {
                    /* make an empty argument set */
                    new_arg_set(FALSE);
                    $$ = cur_arg_set;
                    cur_arg_set = NULL;
            }
    | '{' '}'
                {
                    /* make an empty argument set */
                    new_arg_set(FALSE);
                    $$ = cur_arg_set;
                    cur_arg_set = NULL;
                }
    | '{' values '}'
                {
                    /* save values which have been parsed, and init cur. arg_set */
                    $$ = cur_arg_set;
                    cur_arg_set = NULL;
                }
    ;
instance_port_list :
        /* null */
```

```
                {
                        /* make an empty argument set */
                        new_arg_set(FALSE);
                        $$ = cur_arg_set;
                        cur_arg_set = NULL;
                        /* instr_line = line; *//* save just as for asm line */
                }
     | '(' ')'
                {
                        /* make an empty argument set */
                        new_arg_set(FALSE);
                        $$ = cur_arg_set;
                        cur_arg_set = NULL;
                        /* instr_line = line; *//* save just as for asm line */
                }
| '(' values ')'
                {
                        /* save ports which have been parsed, and init cur. arg_set */
                        $$ = cur_arg_set;
                        cur_arg_set = NULL;
                        /* instr_line = line; *//* save just as for asm line */
                }
;
values :
 positional_values
 | named_values
;
positional_values :
        positional_value
        | positional_values ',' positional_value
        ;
positional_value :
        expression
                {
                        if (!cur_arg_set)/* if no current arg set, make by position */
                                new_arg_set(FALSE);
                        add_posit_expr($1);
                }
        ;
```

```
named_values :
      named_value
     | named_values ',' named_value
     ;
named_value :
      identifier_or_string '=' expression
            {
                  if (!cur_arg_set)/* if no current arg set, make by name */
                        new_arg_set(TRUE);
                  if (!add_named_expr($1, $3))
                  {
                        error_w_string("YAC024",
                        "The name '", $1, "' is used more than once.");
                        YYERROR;
                  }
            }
     | identifier_or_string '='
            {
                  /* ignore unspecified param so default value is used */
            }
     ;
asm_body :
      /* null */
| asm_lines
;
asm_lines :
asm_line
| asm_lines asm_line
;
asm_line :
      label
| asm_instruction opt_terminator
         {
                  enter_fields(instr_number(), instr_line, opcode, addr_mode_field,
                        operand_field, reloc_type);
               advance_instr_number();
               reloc_type = ABSOLUTE;
         }
     | error
```

```
                {
                        resynch();
                        yyerrok;
                        yyclearin;
                }
 ;
asm_instruction :
 opcode_src_op_class src_operand
 | opcode_dest_op_class dest_operand
 | opcode_jmp_op_class jmp_operand
 | opcode_non_op_class
                { addr_mode_field = operand_field = 0; }
      | IDENTIFIER
                {
                        instr_line = line;/* set line # for error message */
                        error_w_string("YAC025", "'", $1, "' is not a valid opcode.");
                        YYERROR;
                }
 ;
opt_terminator :
 /* null */
 | ';'
 ;
label :
 IDENTIFIER ':'
                {
                        /* record label with current instr number as value */
                        if (!add_label_name($1, instr_number()))
                        {
                                error_w_string("YAC026",
                                "The label '", $1, "' is already defined.");
                                YYERROR;
                        }
                }
 ;
opcode_src_op_class :
 ADD
                { opcode = ADD_OP; instr_line = line; /* record opcode line # */ }
 | ADC
```

```
                { opcode = ADC_OP; instr_line = line; }
| AND
                { opcode = AND_OP; instr_line = line; }
| CMP
                { opcode = CMP_OP; instr_line = line; }
| EOR
                { opcode = EOR_OP; instr_line = line; }
| LDA
                { opcode = LDA_OP; instr_line = line; }
| LDB
                { opcode = LDB_OP; instr_line = line; }
| LDCC
                { opcode = LDCC_OP; instr_line = line; }
| LDD
                { opcode = LDD_OP; instr_line = line; }
| LDF
                { opcode = LDF_OP; instr_line = line; }
| LDL
                { opcode = LDL_OP; instr_line = line; }
| LDWS
                { opcode = LDWS_OP; instr_line = line; }
| LDX
                { opcode = LDX_OP; instr_line = line; }
| LDY
                { opcode = LDY_OP; instr_line = line; }
| MAC
                { opcode = MAC_OP; instr_line = line; }
| MPY
                { opcode = MPY_OP; instr_line = line; }
| ORA
                { opcode = ORA_OP; instr_line = line; }
| SUB
                { opcode = SUB_OP; instr_line = line; }
| SUBC
                { opcode = SUBC_OP; instr_line = line; }
| XLD
                { opcode = XLD_OP; instr_line = line; }
;
opcode_jmp_op_class :
```

```
JMP
        { opcode = JMP_OP; instr_line = line; }
| JCC
        { opcode = JCC_OP; instr_line = line; }
| JCS
        { opcode = JCS_OP; instr_line = line; }
| JEQ
        { opcode = JEQ_OP; instr_line = line; }
| JLF
        { opcode = JLF_OP; instr_line = line; }
| JMF
        { opcode = JMF_OP; instr_line = line; }
| JOV
        { opcode = JOV_OP; instr_line = line; }
| JSI
        { opcode = JSI_OP; instr_line = line; }
| JZE
        { opcode = JZE_OP; instr_line = line; }
| JLE
        { opcode = JLE_OP; instr_line = line; }
| JLT
        { opcode = JLT_OP; instr_line = line; }
| JGE
        { opcode = JGE_OP; instr_line = line; }
| JGT
        { opcode = JGT_OP; instr_line = line; }
| JWF
        { opcode = JWF_OP; instr_line = line; }
| JNE
        { opcode = JNE_OP; instr_line = line; }
| DJNE
        { opcode = DJNE_OP; instr_line = line; }
| LBSJ
        { opcode = LBSJ_OP; instr_line = line; }
;
opcode_dest_op_class:
STA
        { opcode = STA_OP; instr_line = line; }
| STB
```

```
                { opcode = STB_OP; instr_line = line; }
| STD
                { opcode = STD_OP; instr_line = line; }
| STF
                { opcode = STF_OP; instr_line = line; }
| STL
                { opcode = STL_OP; instr_line = line; }
| STML
                { opcode = STML_OP; instr_line = line; }
| STMH
                { opcode = STMH_OP; instr_line = line; }
| STMG
                { opcode = STMG_OP; instr_line = line; }
| STMLI
                { opcode = STMLI_OP; instr_line = line; }
| STMHI
                { opcode = STMHI_OP; instr_line = line; }
| STMGI
                { opcode = STMGI_OP; instr_line = line; }
| STWS
                { opcode = STWS_OP; instr_line = line; }
| STBS
                { opcode = STBS_OP; instr_line = line; }
| STX
                { opcode = STX_OP; instr_line = line; }
| STY
                { opcode = STY_OP; instr_line = line; }
;
opcode_non_op_class :
ASL
                { opcode = ASL_OP; instr_line = line; }
| ASR
                { opcode = ASR_OP; instr_line = line; }
| CLC
                { opcode = CLC_OP; instr_line = line; }
| NOP
                { opcode = NOP_OP; instr_line = line; }
| NOT
                { opcode = NOT_OP; instr_line = line; }
```

```
| ROL
                { opcode = ROL_OP; instr_line = line; }
| ROR
                { opcode = ROR_OP; instr_line = line; }
| SEC
                { opcode = SEC_OP; instr_line = line; }
;
src_operand :
 immediate_operand
 | absolute_operand
 | indexed_operand
 | src_reg_operand
 ;
dest_operand :
 absolute_operand
 | indexed_operand
 ;
jmp_operand :
        jmp_address
 | '[' absolute_operand ']'
 | indexed_operand
       | src_reg_operand
       ;
immediate_operand :
 '#' expression
                {
                        addr_mode_field = IMMEDIATE_MODE;

                        /* record immediate value, and record index in instr. */
                        operand_field = add_operand_value($2);
                }
 | '#' '<' expression
                {
                        addr_mode_field = IMMED_L_MODE;
                        operand_field = add_operand_value($3);
                }
 | '#' '>' expression
                {
                        addr_mode_field = IMMED_R_MODE;
```

```
                operand_field = add_operand_value($3);
        }
;
absolute_operand :
    expression
        {
                addr_mode_field = ABSOLUTE_MODE;
                operand_field = add_operand_value($1);
        }
;
indexed_operand :
'[' B '+' expression ']'
        {
                addr_mode_field = IND_MODE;
                operand_field = add_operand_value($4);
        }
| '[' B expression ']'
        {
                /* this parses an initial "-" */
                addr_mode_field = IND_MODE;
                operand_field = add_operand_value($3);
        }
| '[' B '+' LL '+' expression ']'
        {
                addr_mode_field = IND_LOOP_MODE;
                operand_field = add_operand_value($6);
        }
| '[' B '+' LL expression ']'
        {
                /* this parses an initial "-" */
                addr_mode_field = IND_LOOP_MODE;
                operand_field = add_operand_value($5);
        }
| '[' F '+' expression ']'
        {
                addr_mode_field = IO_IND_MODE;
                operand_field = add_operand_value($4);
        }
| '[' F expression ']'
```

```
                {
                        /* this parses an initial "-" */
                        addr_mode_field = IO_IND_MODE;
                        operand_field = add_operand_value($3);
                }
| '[' F '+' LL '+' expression ']'
                {
                        addr_mode_field = IO_IND_LOOP_MODE;
                        operand_field = add_operand_value($6);
                }
| '[' F '+' LL expression ']'
                {
                        /* this parses an initial "-" */
                        addr_mode_field = IO_IND_LOOP_MODE;
                        operand_field = add_operand_value($5);
                }
| '[' B ']'
                {
                        addr_mode_field = IND_MODE;
                        operand_field = add_operand_value(int_to_expr((long) 0));
                }
| '[' B '+' LL ']'
                {
                        addr_mode_field = IND_LOOP_MODE;
                        operand_field = add_operand_value(int_to_expr((long) 0));
                }
| '[' F ']'
                {
                        addr_mode_field = IO_IND_MODE;
                        operand_field = add_operand_value(int_to_expr((long) 0));
                }
| '[' F '+' LL ']'
                {
                        addr_mode_field = IO_IND_LOOP_MODE;
                        operand_field = add_operand_value(int_to_expr((long) 0));
                }
;
src_reg_operand :
 A
```

```
                { addr_mode_field = REG_MODE; operand_field = A_REG; }
| B
                { addr_mode_field = REG_MODE; operand_field = B_REG; }
| D
                { addr_mode_field = REG_MODE; operand_field = D_REG; }
| F
                { addr_mode_field = REG_MODE; operand_field = F_REG; }
| LL
                { addr_mode_field = REG_MODE; operand_field = L_REG; }
| BS
                { addr_mode_field = REG_MODE; operand_field = BS_REG; }
| WS
                { addr_mode_field = REG_MODE; operand_field = WS_REG; }
| X
                { addr_mode_field = REG_MODE; operand_field = X_REG; }
| Y
                { addr_mode_field = REG_MODE; operand_field = Y_REG; }
| ML
                { addr_mode_field = REG_MODE; operand_field = ML_REG; }
| MH
                { addr_mode_field = REG_MODE; operand_field = MH_REG; }
| MG
                { addr_mode_field = REG_MODE; operand_field = MG_REG; }
| MLI
                { addr_mode_field = REG_MODE; operand_field = MLI_REG; }
| MHI
                { addr_mode_field = REG_MODE; operand_field = MHI_REG; }
| MGI
                { addr_mode_field = REG_MODE; operand_field = MGI_REG; }
;
jmp_address :
identifier_or_string
                {
                    /* record name and return index for it, which is operand */
                    operand_field = assign_label_index($1);
                    /* address mode is immediate (right justified) to load PC */
                    addr_mode_field = IMMED_R_MODE;
                    /* mark this operand field as relocatable or absolute */
                    if (is_absolute())
```

```
                        reloc_type = ABSOLUTE;
            else
                        reloc_type = RELATIVE;
        }
;
%%
void bitwise_err(){
      other_error("YAC019",
            "Bitwise operator can't be applied to a fixed point number.");}
void shift_err(){
      other_error("YAC020",
            "Shift operator can't be applied to a fixed point number.");}
void fixed_p_offset(){
      other_error("YAC027",
                  "Fixed point number not permitted as an address offset.");}

// simulate.hxx
// simulation class
// T. Montlick
// 9/1/90
/* source code control: */
static char SccsID[] = "%W% %G%";
#define SIMULATION_DEF
#ifndef STRING_DEF
      #include "string.hxx"
#endif
#ifndef LONG_ARRAY_DEF
      #include "long_arr.hxx"
#endif
#ifndef INT_ARRAY_DEF
      #include "int_arr.hxx"
#endif
#define BOOLEANshort
#defineTRUE     1
#defineFALSE    0
#defineINFINITY999999999999
#define NO_TASK-1
#define WAIT_TASK-2
#define MAX_TASKS100
```

```
#defineMAX_GSPS32

#ifndef SCHEDULER_DEF
#include "schedule.hxx"
#endif
////////////////////////////////////////////////////////////////////////
// gsp simulation
// These classes perform a discrete event simulation with the
// scheduler.
////////////////////////////////////////////////////////////////////////
#defineNO_GSP -1
////////////////////////////////////////////////////////////////////////
// class waiting_gsps
// gsps waiting for for something
////////////////////////////////////////////////////////////////////////
class waiting_gsps {
int_arraywaiting_gsp[MAX_TASKS];// gsps waiting for task
double      time_waiting[MAX_TASKS]; // time which each task was waiting
double      max_task_wait_time[MAX_TASKS];// longest a task's gsp been waiting
int_arraydo_accounting;
int              n_tasks;
int              n_gsps;
public:
            waiting_gsps(int n, int n_g);
            ~waiting_gsps();
void  add_waiting_gsp(int gsp, int task, BOOLEAN accounting);
BOOLEANtest_waiting_gsp(int task);
BOOLEANis_gsp_waiting_for_task(int task, int gsp);
BOOLEANget_next_gsp_waiting_for_task(int task, int* gsp_ptr);
BOOLEANget_gsp_waiting_for_task(int task, int gsp);
void  advance_waiting_time(double time);
doubleget_longest_wait(int task){ return max_task_wait_time[task]; }
int         which_task_gsp_waiting_for(int gsp);
};
////////////////////////////////////////////////////////////////////////
// class "working_gsps"
// gsps working on tasks
// note that more than one gsp can work on a task if the task is multisegmented
////////////////////////////////////////////////////////////////////////
```

```
class working_gsps {
int                     n_gsps;
int_array   working_task_numbers;// task # for each GSP
double          gsps_time_left[MAX_GSPS];// time left for each GSP
double          original_time[MAX_GSPS];// orig. duration for each GSP
public:
                working_gsps(int gsps);
                ~working_gsps();
void        add_gsp_simulation(int gsp, int task, double ti0e);
BOOLEAN next_gsp_free(int* gsp, int* task, BOOLEAN time_passage_ok,
                              double* passed_time);
int             which_task_for_gsp(int gsp);
BOOLEANany_time_passed(int gsp);
double      due_time();
void        advance_time(double delta);
};
////////////////////////////////////////////////////////////////////////
// "idle" class
// The idle class (pun intended) keeps a list of free items, each with a unique
// sequential positive ID number starting from 0.
// Each item has a count, which gets decremented when an item is checked out.
////////////////////////////////////////////////////////////////////////
class idle {
int_arrayidle_count;
public:
            idle();
            ~idle();
BOOLEANcheck_any_out(int* which);
BOOLEANany_available();
BOOLEANcheck_specific_out(int which);
void  return_one(int i);
BOOLEANis_it_idle(int i){ return (idle_count[i] > 0); }
void  set_idle_count(int i, int count);
};
////////////////////////////////////////////////////////////////////////
// "simulation" class
////////////////////////////////////////////////////////////////////////

enum gsp_status { IDLE, WAITING, PENDING, JUST_STARTED, WORKING };
```

```
class simulation {
idle         idle_gsps;
idle         *idle_tasks_ptr;
waiting_gsps *waiting_ptr;
waiting_gsps *pending_ptr;
working_gsps *working_ptr;
int               max_gsps;
int               n_gsps;
int               n_tasks;
double       total_time;
schedulerthe_scheduler;
double       sample_period_fraction[MAX_TASKS];
int_arraytask_queue[MAX_TASKS];// current sizes of queues from i to j
int_arrayneeded_q_size[MAX_TASKS];//size needed to fire next task
int_arraymax_q_size[MAX_TASKS];// log of max sizes
int_arrayinput_queue;  // inputs queues for first tasks
int_arrayneeded_input_q_size;
int_arraymax_input_q; // log of max input q sizes
int_arrayinterpolation;
int_arrayinterp_count;
int               verbose;
double       input_timer;
BOOLEANbuffered_input_block;
public:
                  simulation(int gsp_count, double headroom);
                  ~simulation();
void         add_task(long period, double period_fraction);
BOOLEANconnect_tasks(int i, int j)
                                    { return the_scheduler.add_connection(i, j); }
void         done_adding_tasks();
void         simulate(BOOLEAN time_passage_ok, double* time_ptr);
int               get_n_tasks()      { return n_tasks; }
double       get_waiting_time(int i){ return waiting_ptr->get_longest_wait(i); }
double       get_pending_time(int i){ return pending_ptr->get_longest_wait(i); }
void         set_verbosity(int v){ verbose = v; }
long         get_scheduler_period(int i)
                           { return the_scheduler.get_scheduler_period(i); }
long         get_counter_value(int i)
                           { return the_scheduler.get_counter_value(i); }
```

```
int             get_max_due(int i)
                    { return the_scheduler.get_max_due(i); }
int             get_which_gsp(int i, int j)
                    { return the_scheduler.get_which_gsp(i, j); }
int             n_gsps_for_task(int i)
                    { return the_scheduler.n_gsps_for_task(i); }
int             get_n_gsps()      { return n_gsps; }
int             which_task_for_gsp(int gsp, gsp_status* status_ptr);
void        clock_input_timer(double amount);
void        bump_fired(int i);
BOOLEANtry_running(BOOLEAN time_passage_ok);
BOOLEANtry_promoting();
double      get_utilization(){ return the_scheduler.get_utilization(); }
BOOLEANenough_in_input_queues(int t);
void        gobble_inputs_from_firing(int t);
void        set_samples_needed(int t, int s);
int             n_input_queues(int task);
int             input_queue_size(int task, int q);
int             n_network_inputs();
int             network_input_q_size(int q);
};
#include <stdio.h>
enum opcode {asl,asr,rol,ror,add,adc,sub,subc,and,not,ora,eor,lda,ldb,
 ldbs,ldd,ldds,ldl,ldws,ldx,ldz,xld,mac,mpy,ldf,clc,sec,xx1,
 cmp,nop,stz,stbs,stf,stb,std,stl,sta,stds,xx2,stws,stml,stmh,
 stmg,stx,stmli,stmhi,stmgi,sty,jsr,jmp,jcc,jcs,jne,jlf,jmf,
 jov,jsi,jze,jle,jlt,jge,jgt,jwf,djne};
enum add_mode {dir,reg,imml,immr,bli,bi,fli,fi};
enum registers { Areg,Breg,BSreg,Dreg,Freg,Lreg,MGreg,MHreg,MLreg,MGIreg,
 MHIreg,MLIreg,Xreg,Yreg,WSreg};
class regs{
private:
 long r;
 int number_of_bits;
 long mask;
public:
regs(int nob);
regs();
void assign(long a);
```

```
long value();
int bits();
void print();
};
regs::regs(int nob){
number_of_bits=nob;
mask=1;
for (int i=0;i<number_of_bits;i++)
mask=mask|(mask<<1);
}
regs::regs(){
r=0;
number_of_bits=24;
mask=0xffffff;
}
void regs::assign(long a){
r=a&mask;
}
long regs::value(){
return (r);
}
int regs::bits(){
return (number_of_bits);
}
void regs::print(){
printf("%ld\n",r);
}
class gsp{
private:
long data,data_address,prog_address;
opcode op;
add_mode address_m;
registers regis;
long instruction;
int jump_flag;
// define the registers
regs A;
regs AC;
regs X,Y,F,B,L,D,W,
```

```
MH,ML,MG,MHI,MLI,MGI,BS,WS;
/ define the flags
regs CF,ZF,OF,SF,MF,WF,LF;
ublic:
sp() : A(24), AC(25),X(24),Y(24),F(24),B(16),L(12),D(8),W(24),
MH(24),ML(24),MG(24),MHI(24),MLI(24),MGI(24),BS(24),WS(24),
      CF(1),ZF(1),OF(1),SF(1),MF(1),WF(1),LF(1){
jump_flag=0;
}
///////////////////////////////////////////////////
/ fetch instruction from program space
///////////////////////////////////////////////////
ong prog_fetch(){
instruction=program[prog_address];
return(instruction);
}
///////////////////////////////////////////////////
/ instruction decode
///////////////////////////////////////////////////
oid decode(){
address_m = (add_mode) (instruction & 0x038000)>>15;
op=(opcode) (instruction & 0xfc0000)>>18;
}
///////////////////////////////////////////////////
/ fetch data from data space
///////////////////////////////////////////////////
oid data_fetch(){
switch (address_m)
{
case dir:{
data_address=instruction & 0x7fff;
data=dataram[data_address];
break;}
case reg:{
regis=(registers) instruction & 0x1f;
switch (regis)
{
case Areg:{data=A.value();break;}
case Breg:{data=B.value();break;}
```

```
case BSreg:{data=BS.value();break;}
case Dreg:{data=D.value();break;}
case Freg:{data=F.value();break;}
case Lreg:{data=L.value();break;}
case MGreg:{data=MG.value();break;}
case MHreg:{data=MH.value();break;}
case MLreg:{data=ML.value();break;}
case MGIreg:{data=MGI.value();break;}
case MHIreg:{data=MHI.value();break;}
case MLIreg:{data=MLI.value();break;}
case Xreg:{data=X.value();break;}
case Yreg:{data=Y.value();break;}
case WSreg:{data=WS.value();break;}
default:{printf("ERROR in opcode\n");}
}
break;}
case imml:{
data_address=(((instruction & 0x7fff)<<9)&0xfffe00);
data=dataram[data_address];
break;}
case immr:{
data_address=(((instruction & 0x7fff)<<9)&0x1ff);
data=dataram[data_address];
break;}
case bli:{
data_address=(instruction & 0x7fff)+B.value()+L.value();
data=dataram[data_address];
break;}
case bi:{
data_address=(instruction & 0x7fff)+B.value();
data=dataram[data_address];
break;}
case fli:{
data_address=(instruction & 0x7fff)+F.value()+L.value();
data=dataram[data_address];
break;}
case fi:{
data_address=(instruction & 0x7fff)+F.value();
data=dataram[data_address];
```

```
reak;}
efault:{printf("ERROR in opcode\n");break;}


oid execute(){
witch (op)

ase asl:{ AC.assign((A.value()<<1) & 0x1fffffe); // zero fill
.assign(AC.value());
reak;}
ase asr:{ long tempCF=A.value()&0x1; // save lsb
 (A.value()&0x800000 != 0) // shift and do sign extension
C.assign((A.value()>>1) | 0x800000);
lse
C.assign((A.value()>>1) & 0x7fffff);
 (tempCF != 0) // set bit 25 in AC
C.assign(AC.value() | 0x1000000); // set it
lse
C.assign(AC.value() & 0xffffff); // clear it
.assign(AC.value());
reak;}
ase rol:{ AC.assign(((A.value()<<1) & 0x1fffffe)+CF.value()); // carry fill
.assign(AC.value());
reak;}
ase ror:{ long tempCF=A.value()&0x1; // save lsb
C.assign((A.value()>>1) & 0x7fffff);
 (CF.value() != 0) // set msb
C.assign(AC.value() | 0x800000); // set it
lse
C.assign(AC.value() & 0x7fffff); // clear it
 (tempCF != 0) // set bit 25 in AC
C.assign(AC.value() | 0x1000000); // set it
lse
C.assign(AC.value() & 0xffffff); // clear it
.assign(AC.value());
reak;}
ase adc:{ AC.assign(A.value()+data+CF.value());
.assign(AC.value());
reak;}
```

```
case add:{ AC.assign(A.value()+data);
A.assign(AC.value());
break;}
case sub:{ A.assign(A.value()-data);break;}
case subc:{A.assign(A.value()-data-CF.value());break;}
case and:{ A.assign(A.value()&data);break;}
case not:{ A.assign(~A.value());break;}
case ora:{ A.assign(A.value()|data);break;}
case eor:{ A.assign(A.value()^data);break;}
case lda:{ AC.assign(data&0xffffff);
A.assign(AC.value());
break;}
case ldb:{ B.assign(data);break;}
case ldbs:{printf("ERROR in opcode\n");break;}
case ldd:{ D.assign(data);break;}
case ldds:{printf("ERROR in opcode\n");break;}
case ldl:{ L.assign(data);break;}
case ldws:{WS.assign(data);break;}
case ldx:{ X.assign(data);break;}
case ldz:{ printf("ERROR in opcode\n");break;}
case xld:{ break;}
case mac:{
Y.assign(data);
MH.assign(MH.value()+X.value()*Y.value());
break;}
case mpy:{
Y.assign(data);
MH.assign(X.value()*Y.value());
break;}
case ldf:{ F.assign(data);break;}
case clc:{ AC.assign(AC.value() & 0xffffff);
A.assign(AC.value());
break;}
case scc:{ AC.assign(AC.value() | 0x1000000);
A.assign(AC.value());
break;}
case xx1:{printf("ERROR in opcode\n");break;}
case cmp:{break;}
case nop:{break;}
```

```
case stz:{printf("ERROR in opcode\n");break;}
case stbs:{dataram[data_address]=BS.value();break;}
case stf:{dataram[data_address]=F.value();break;}
case stb:{dataram[data_address]=B.value();break;}
case std:{dataram[data_address]=D.value();break;}
case stl:{dataram[data_address]=L.value();break;}
case sta:{dataram[data_address]=A.value();break;}
case stds:{printf("ERROR in opcode\n");break;}
case xx2:{printf("ERROR in opcode\n");break;}
case stws:{dataram[data_address]=WS.value();break;}
case stml:{dataram[data_address]=ML.value();break;}
case stmh:{dataram[data_address]=MH.value();break;}
case stmg:{dataram[data_address]=MG.value();break;}
case stx:{dataram[data_address]=X.value();break;}
case stmli:{dataram[data_address]=MLI.value();break;}
case stmhi:{dataram[data_address]=MHI.value();break;}
case stmgi:{dataram[data_address]=MGI.value();break;}
case sty:{dataram[data_address]=Y.value();break;}
case jsr:{break;}
case jmp:{ prog_address=data_address;break;}
case jcc:{ if (CF.value() == 0)
prog_address=data_address;
break;}
case jcs:{ if (CF.value() == 1)
prog_address=data_address;
break;}
case jne:{ if (ZF.value() == 0)
prog_address=data_address;
break;}
case jlf:{ if (LF.value() == 1)
prog_address=data_address;
break;}
case jmf:{ if (MF.value() == 1)
prog_address=data_address;
break;}
case jov:{ if (OF.value() == 1)
prog_address=data_address;
break;}
case jsi:{ if (SF.value() == 1)
```

```
prog_address=data_address;
break;}
case jze:{ if (ZF.value() == 1)
prog_address=data_address;
break;} ·
case jle:{break;}
case jlt:{break;}
case jge:{break;}
case jgt:{break;}
case jwf:{ if (WF.value() == 1)
prog_address=data_address;
break;}
case djnc:{break;}
default:{printf("ERROR in opcode\n");break;}
}
}
////////////////////////////////////////////////////////////
// update the flags,this is cycle 5 operations
////////////////////////////////////////////////////////////
void flag_update()
{
// update program counter
 if (jump_flag==1)
 prog_address=data_address;
 else
 prog_address++;
// the zero flag
 if (A.value() == 0)
 ZF.assign(1);
 else
 ZF.assign(0);
// the sign flag
 if (A.value() & 0x800000 != 0)
 SF.assign(1);
 else
 SF.assign(0);
// the overflow flag
 if (AC.value()&0x1000000 != 0)
 OF.assign(1);
```

```
else
OF.assign(0);
// the carry flag
if (AC.value()&0x1000000 != 0)
CF.assign(1);
else
CF.assign(0);
// the wait flag
if (WS.value() == 0)
WF.assign(1);
else
WF.assign(0);
}
void print_registers(){
printf("A(24),X(24),Y(24),F(24),B(16),L(12),D(8),MGI(8),MHI(24),MLI(24),BS(24),WS(24)\n");
printf("%6x %6x %6x %4x %4x %3x %2x %2x %6x %6x %6x %6x\n",
A.value(),X.value(),Y.value(),F.value(),B.value(),L.value(),D.value(),
MGI.value(),MHI.value(),MLI.value(),BS.value(),WS.value());
}
};
main(){
long program[10],dataram[10];
gsp * gsp1_ptr,*gsp2_ptr,* gsp3_ptr,*gsp4_ptr;
gsp1_ptr->prog_fetch();
gsp1_ptr->decode();
gsp1_ptr->data_fetch();
gsp1_ptr->execute();
gsp1_ptr->flag_update();
gsp1_ptr->print_registers();
}
// stack.cxx
// stack class functions
// Terry Montlick
// 10/20/89
/* source code control: */
static char SccsID[] = "@(#)stack.cxx1.56 10/7/91";
#include "stack.hxx"
//////////////////////////////////////////////////////////////////////
// stack class
```

```
////////////////////////////////////////////////////////////////////
////////////////////////////////////////////////////////////////////
//stack::stack
// Constructor.
////////////////////////////////////////////////////////////////////
stack::stack(){
      st_index = 0;}
////////////////////////////////////////////////////////////////////
//stack::~stack
// Destructor.
////////////////////////////////////////////////////////////////////
stack::~stack()
{}
////////////////////////////////////////////////////////////////////
//stack::push
// Push the given element on the stack.
////////////////////////////////////////////////////////////////////
void stack::push(elem e){
      (* (array*) this)[st_index] = e;
      st_index++;}
////////////////////////////////////////////////////////////////////
//stack::pop
// Pop the top element off the stack.
////////////////////////////////////////////////////////////////////
elem stack::pop(){
      if (st_index){
            st_index--;
            return (* (array*) this)[st_index];}
      else
            return NULL;}
////////////////////////////////////////////////////////////////////
//stack::nth
// Return the nth element up the stack. Returns 0 if no such element.
////////////////////////////////////////////////////////////////////
elem stack::nth(int n){
      if (st_index){
            if ((st_index - n) >= 0)
                  return (* (array*) this)[st_index - n];}
      return NULL;}
```

```
// stack.hxx
// header for stack classes
// T. Montlick
// 11/20/89
/* source code control: @(#)stack.hxx1.56 10/7/91 */
#define STACK_DEF
#ifndef ARRAY_DEF
#include "array.hxx"
#endif
class stack : public array{
        int          st_index;
public:
        stack();
        ~stack();
        void  push(elem);
        elem  pop();
        void  clear()                { st_index = 0; }
        elem  nth(int n);
        int          size()          { return st_index; }
};
/* standard.h
 * standard header definitions
 *
 * T. Montlick
 * 10/2/89
 */
/* source code control: @(#)standard.h1.56 10/7/91 */
#define STANDARD_DEF
#undef NOREF
#defineNOREF(a)a=a                /* needed to fake out C++ compiler */
#define BOOLEANshort
#defineTRUE     1
#defineFALSE    0
// standard.hxx
// standard header definitions
// T. Montlick
// 10/2/89
/* source code control: @(#)standard.hxx1.56 10/7/91 */
#include "standard.h"
```

```
typedefvoid*elem;                // generic element
#ifdef OWC
#ifndef STREAMH
#include<stream.h>
#endif
#else
#ifndef _STREAM_XXX
#include<stream.hxx>
#endif
#endif
/*
$Header: /home/solus/users4/release/CVS/star/lib/starstd.h,v 1.1 1991/08/28 21:28:10 ed Exp $
$Id: starstd.h,v 1.1 1991/08/28 21:28:10 ed Exp $
$Log: starstd.h,v $
 * Revision 1.1 1991/08/28 21:28:10 ed
 * Initial revision
 *
*/
/****************************************************************************
            S T A R S T D . H
      -general header file for STAR software run in DOS environment
*/
#defineOK                  1
#define NO         0
#define NFG        -1
#define FALSE  0
#define TRUE   1
typedef unsigned short ushort;
typedef unsigned char uchar;
/*
** function prototype
*/
int file_find( char *filename, char *filepath );

/* for C++ and SUN compatibility */
#define_MAX_PATH256
#ifdef DEBUG
#undef DEBUG
#endif
```

```
// strg_arr.cxx
// derived class for string array
// Terry Montlick
// 10/10/89
/* source code control: */
static char SccsID[] = "@(#)strg_arr.cxx1.56 10/7/91";
#include "strg_arr.hxx"
strg_array::strg_array()
{}
strg_array::strg_array(int i)
{}
///////////////////////////////////////////////////////////////////////
// strg_array::strg_array
// Constructor with string array as argument.
///////////////////////////////////////////////////////////////////////
strg_array::strg_array(strg_array& a){
	for (int i=0; i<a.size(); i++){
		// create a copy of each source string
		string* s = new string(*a[i]);
		(*this)[i] = s;
	}}
///////////////////////////////////////////////////////////////////////
// strg_array::operator =
// Assigment of array.
///////////////////////////////////////////////////////////////////////
void strg_array::operator = (strg_array& a){
	for (int i=0; i<a.size(); i++){
		// create a copy of each source string
		string* s = new string(*a[i]);
		(*this)[i] = s;
	}}

// strg_arr.hxx
// header for derived string array classes
// T. Montlick
// 10/10/89
/* source code control: @(#)strg_arr.hxx1.56 10/7/91 */
#define STRG_ARRAY_DEF
#ifndef ARRAY_DEF
```

```
#include "array.hxx"
#endif
#ifndef STRING_DEF
#include "string.hxx"
#endif
class strg_array : public array{
public:
    strg_array();
    strg_array(int i);
    strg_array(strg_array&);// constructor from another strg_array
    void operator=(strg_array&);// assignment op from other strg_array
    string*&operator [] (int i) { return (string*&) array::operator[] (i); }
    int                 find(string* ptr) { return array::find(ptr); }
    void           append(string* ptr){ array::append(ptr); }
    strg_array&operator+(strg_array& a)
                                { return (strg_array&) array::operator+((array&) a); }
    strg_array&operator+=(strg_array& a) {a = *this + a; return *this; }
};
// strghash.cxx
// functions for string hash table class
// T. Montlick
// 9/12/89
/* source code control: */
static char SccsID[] = "@(#)strghash.cxx1.56 10/7/91";
#ifndef STRG_HASH_DEF
#include "strghash.hxx"
#endif
// bring in hash functions, customized from our defines
#include "hash.cxx"
// strghash.hxx
// header for string hash table class
// T. Montlick
// 9/12/89
/* source code control: @(#)strghash.hxx1.56 10/7/91 */
#define STRG_HASH_DEF
#ifndef STRING_DEF
#include"string.hxx"
#endif
// define symbols which make a custom hash table class
```

```
#ifdef HASH
#undef HASH
#endif
#define HASH strg_hash
#ifdef HASH_ELEM
#undef HASH_ELEM
#endif
#define HASH_ELEM strg_hash_elem
#ifdef HASH_LIST
#undef HASH_LIST
#endif
#define HASH_LIST strg_hash_list
#ifdef VAL_TYPE
#undef VAL_TYPE
#endif
#define VAL_TYPE string
// use string*, not string
#ifdef USE_POINTER
#undef USE_POINTER
#endif
#define USE_POINTER
#include"hash.hxx"
// string.cxx
// functions for string class
// Copied almost verbatum from Stroustrup, pp. 184-186
// T. Montlick
// 8/28/89
/* source code control: */
static char SccsID[] = "@(#)string.cxx1.56 10/7/91";
#ifndef STRING_DEF
#include "string.hxx"
#endif
string::string(){
	p = new srep;
	p->s = new char[ 1 ];
	strcpy(p->s, "");
	p->n = 1;}
string::string(char *s){
	p = new srep;
```

```
    p->s = new char[ strlen(s)+1 ];
    strcpy(p->s, s);
    p->n = 1;}
string::string(string & x){
    x.p->n++;
    p = x.p;}
string::~string(){
    if (--p->n == 0){
        delete p->s;
        delete p;
    }}
string&string::operator=(char* s){
    if (p->n > 1)
    {                           // disconnect self
        p->n--;
        p = new srep;}
    else if (p->n == 1)
        delete p->s;

    p->s = new char[ strlen(s)+1 ];
    strcpy(p->s, s);
    p->n = 1;
    return *this;}
string& string::operator=(string & x){
    x.p->n++;
    if (--p->n == 0){
        delete p->s;
        delete p;}
    p = x.p;
    return *this;}
int         string::length(){
    return strlen(p->s);}
ostream&operator<<(ostream& s, string& x){
    return s << x.p->s;}
istream&operator>>(istream& s, string& x){
    char  buf[256];
    s >> buf;
    x = buf;
    return s;}
```

```
void error(char* p){
    cerr << p << "\n";
    exit(1);}
char&string::operator[](int i) const{
    if (i<0 || strlen(p->s)<i)
        return p->s[0];
    else
        return p->s[i];}
// concatenate strings
string&string::operator+(string &x){
    char* new_str;
    // create a new string which is concatenation of this this arg
    new_str = new char[ strlen(p->s) + strlen(x.p->s) + 1 ];
    strcpy(new_str, p->s);
    strcat(new_str, x.p->s);
    if (p->n > 1)
    {                                   // disconnect self
        p->n--;
        p = new srep;}
    else if (p->n == 1)
        delete p->s;
    p->s = new_str;
    p->n = 1;
    return *this;}
string&string::operator+(char* s){
    char* new_str;
    // create a new string which is concatenation of this this arg
    new_str = new char[ strlen(p->s) + strlen(s) + 1 ];
    strcpy(new_str, p->s);
    strcat(new_str, s);
    if (p->n > 1)
    {                                   // disconnect self
        p->n--;
        p = new srep;}
    else if (p->n == 1)
        delete p->s;
    p->s = new_str;
    p->n = 1;
```

```
      return *this;}

int   operator==(const string &x, char *s)
      { return strcmp(x.p->s, s) == 0; }
int   operator==(const string &x, const string &y)
      { return strcmp(x.p->s, y.p->s) == 0; }
int   operator!=(const string &x, char *s)
      { return strcmp(x.p->s, s) != 0; }
int   operator!=(const string &x, const string &y)
      { return strcmp(x.p->s, y.p->s) != 0; }

// string.hxx
// header for string class
// Copied almost verbatum from Stroustrup, pp. 184-186
// T. Montlick
// 8/28/89
/* source code control: @(#)string.hxx1.56 10/7/91 */
#define STRING_DEF
#ifndef STANDARD_DEF
#include"standard.hxx"
#endif
#ifndef OWC// objectworks hdr is C++
#ifdef sun
extern "C--"// but otherwise, sun doesn't have C function prototype{
#else
extern "C"{
#endif
#endif
#include<string.h>
#include <stdlib.h>
#ifndef OWC}
#endif
class string{
      struct srep{
            char*       s;          // pointer to data
            int                     n;// reference count
      };
      srep  *p;
```

```
public:
      string(char*);              // string x = "abc"
      string();                   // string x;
      string(string &);  // string x = string ...
      string&operator=(char*);
      string& operator=(string &);
      ~string();
      char&operator[](int i) const;
      string&operator+(string &x);
      string& operator+(char*);
      int         length();

      friend ostream&operator<<(ostream&, string&);
      friendistream&operator>>(istream&, string&);

      friendint   operator==(const string &x, char *s);
      friendint   operator==(const string &x, const string &y);
      friendint   operator!=(const string &x, char *s);
      friendint   operator!=(const string &x, const string &y);
};
// utility.cxx
// C-callable utility routines
// T. Montlick
// 10/31/89
/* source code control: */
static char SccsID[] = "@(#)utility.cxx1.56 10/7/91";
#ifndef UTILITY_DEF
#include "utility.hxx"
#endif
extern "C" {
//////////////////////////////////////////////////////////////////////////
// error_line
// Return the current line # for an error routine.
// If we are into assembly code, we return "instr_line", which is the
// line number where the opcode is, else we use just "line",
// which is the current place in the parse. This is so that
// if there is no assembly line delimiter, we will not have gone
// on the the next line to recognize the instruction.
//////////////////////////////////////////////////////////////////////////
```

```
int     error_line(){
        extern intinstr_line;// use this line if >0 (assembly code)
        extern intline;                 // else use this line
        if (instr_line)
              return instr_line;
        else
              return line;}
//////////////////////////////////////////////////////////////////////
// check_error_count
// Advance error count, and output msg if it just passed max, else exit.
// return TRUE if ok to output error.
//////////////////////////////////////////////////////////////////////
int     check_error_count(){
        error_count++;
        if (error_count == MAX_ERROR_COUNT){
              cerr << "Error count limit has been reached.\n";
              exit(1);}
        return 1;
}
//////////////////////////////////////////////////////////////////////
// out_header
// Output the error or warning header, including current block info,
// if available.
//////////////////////////////////////////////////////////////////////
void out_header(){
        int                error_line();
        string*      filename_ptr;
        if (cur_block){
              // if currently open file, use this filename
              if (in_filename_string)
                    filename_ptr = in_filename_string;
              else
                    filename_ptr = cur_block->get_filename();
              if (no_file_info)
                    cerr << "Block '"<< *cur_block->get_block_name()
                          << "'" << ERR_DELIM;
              else
                    cerr << "Block '"<< *cur_block->get_block_name()
                          << "' in file '" << *filename_ptr
```

```
                << "', line " << error_line() << ERR_DELIM;}
    else if (in_filename_string && (error_line() != NO_LINE)){
        if (no_file_info)
            cerr << ERR_DELIM;
        else
            cerr << "File '" << *in_filename_string
                << "', line " << error_line() << ERR_DELIM;}
    else
        cerr << ERR_DELIM;}
//////////////////////////////////////////////////////////////////////
// out_err_header
// Output the error header, including current block info, if available.
//////////////////////////////////////////////////////////////////////
void out_err_header(char* msg_num){
    if (check_error_count()){
        cerr << ERR_STRING << msg_num << " ";
        out_header();
    }}
//////////////////////////////////////////////////////////////////////
// out_warn_header
// Output the warning header, including current block info, if available.
//////////////////////////////////////////////////////////////////////
void out_warn_header(char* msg_num){
    cerr << WARN_STRING << msg_num << " ";
    out_header();}
//////////////////////////////////////////////////////////////////////
// yyerror
// Error routine called from YACC parser with a pointer to error text.
//////////////////////////////////////////////////////////////////////
int     yyerror(char* s){
    extern char yytext[];
    NOREF(s);

    out_err_header("YAC001");
    cerr << " '" << yytext << "' doesn't make sense here.\n";
    return 1;}
//////////////////////////////////////////////////////////////////////
// error_w_string
// Misc routine called from YACC parser with two pointers to error text,
```

```
// plus a string to insert in the middle.
/////////////////////////////////////////////////////////////////////
int   error_w_string(char* msg_code, char* str1, string* str2, char* str3){
      if (check_error_count()){
            out_err_header(msg_code);
            cerr << str1 << *str2 << str3 << "\n";}
      return 1;}
/////////////////////////////////////////////////////////////////////
// other_error
// Misc routine called from YACC parser with a pointer to error text.
/////////////////////////////////////////////////////////////////////
int   other_error(char* msg_num, char* s){
      if (check_error_count()){
            out_err_header(msg_num);
            cerr << s << "\n";}
      return 1;}
/////////////////////////////////////////////////////////////////////
// warning
// Generate warning message, called with a pointer to warning text.
/////////////////////////////////////////////////////////////////////
int   warning(char *msg_num, char* s){
      out_warn_header(msg_num);
      cerr << s << "\n";
      return (0);}
/////////////////////////////////////////////////////////////////////
// yywrap
// Function called from LEX analyzer when end of text is reached.
// Pops the file stack for nested include files.
/////////////////////////////////////////////////////////////////////
int   yywrap(){
      if (pop_file())
            return 0;
      else
            return 1;}
/////////////////////////////////////////////////////////////////////
// check_0_r
// Check for a 0 real value, which is illegal. If gotten, generate
// an error message and exit.
//
```

```
////////////////////////////////////////////////////////////////////////
double check_0_r(double val){
      int          dummy;

      if (val == 0.0){
            dummy = other_error("UTL001", "Attempt to divide by 0");
            exit(dummy);}
      else
            return val;}
////////////////////////////////////////////////////////////////////////
// check_l0_r
// Check for a <= 0 real value, which is illegal. If gotten, generate
// an error message and exit.
//
////////////////////////////////////////////////////////////////////////
double check_l0_r(double val){
      int          dummy;

      if (val <= 0.0){
            dummy = other_error("UTL002", "Attempt to take a log of a number <= 0");
            exit(dummy);}
      else
            return val;}
////////////////////////////////////////////////////////////////////////
// round
// Round a double to a long.
//
////////////////////////////////////////////////////////////////////////
long round(double x){
      return (long) ( (x >=0.0) ? (x+0.5) : (x-0.5) ) ;}
////////////////////////////////////////////////////////////////////////
// divide
// Compute a / b with value checking.
//
////////////////////////////////////////////////////////////////////////
double divide(double a, double b){
      return ( a / check_0_r(b) );}
////////////////////////////////////////////////////////////////////////
// logn
```

```
// Compute log x to the base n.
//
///////////////////////////////////////////////////////////////////////////
double logn(double x, double n){
      externdoublelog(double);

      return ( log( check_l0_r(x) )
                                        / check_0_r( log( check_l0_r(n) ) ) );}
///////////////////////////////////////////////////////////////////////////
// expn
// Compute x to the power n.
//
///////////////////////////////////////////////////////////////////////////
double expn(double x, double n){
      extern doubleexp(double);
      extern doublelog(double);

      return( exp( n * log( check_l0_r(x) ) ) );}
///////////////////////////////////////////////////////////////////////////
// is_cond_jump_opcode
// Returns TRUE if argument opcode is a conditional jump.
///////////////////////////////////////////////////////////////////////////
BOOLEAN is_cond_jump_opcode(int opcode){
      switch (opcode){
      case JCC_OP:
      case JCS_OP:
      case JEQ_OP:
      case JLF_OP:
      case JMF_OP:
      case JOV_OP:
      case JSI_OP:
      case JLE_OP:
      case JLT_OP:
      case JGE_OP:
      case JGT_OP:
      case JWF_OP:
      case DJNE_OP:
      case LBSJ_OP:
      case JNE_OP:
```

```
        return TRUE;
    default:
        return FALSE;
    }}
////////////////////////////////////////////////////////////////////////
// is_jump_opcode
// Returns TRUE if argument opcode is in the jump class.
//
////////////////////////////////////////////////////////////////////////
BOOLEAN is_jump_opcode(int opcode){
    if (is_cond_jump_opcode(opcode))
        return TRUE;
    else
        return (opcode == JMP_OP);}
////////////////////////////////////////////////////////////////////////
// is_source_op_opcode
// Returns TRUE if argument opcode is in the source operand class.
//
////////////////////////////////////////////////////////////////////////
BOOLEAN is_source_op_opcode(int opcode){
    switch (opcode){
    case ADD_OP:
    case ADC_OP:
    case AND_OP:
    case CMP_OP:
    case EOR_OP:
    case LDA_OP:
    case LDB_OP:
    case LDD_OP:
    case LDF_OP:
    case LDL_OP:
    case LDWS_OP:
    case LDX_OP:
    case LDCC_OP:
    case MAC_OP:
    case MPY_OP:
    case ORA_OP:
    case SUB_OP:
    case SUBC_OP:
```

```
case XLD_OP:
    return TRUE;
default:
    return FALSE;
}}
////////////////////////////////////////////////////////////////////////
// is_dest_op_opcode
// Returns TRUE if argument opcode is in the destination operand class.
//
////////////////////////////////////////////////////////////////////////
BOOLEAN is_dest_op_opcode(int opcode){
    switch (opcode){
    case STA_OP:
    case STB_OP:
    case STD_OP:
    case STF_OP:
    case STL_OP:
    case STML_OP:
    case STMH_OP:
    case STMG_OP:
    case STMLI_OP:
    case STMHI_OP:
    case STMGI_OP:
    case STWS_OP:
    case STBS_OP:
    case STX_OP:
    case STY_OP:
        return TRUE;
    default:
        return FALSE;
    }}
////////////////////////////////////////////////////////////////////////
// is_indexed_mode
// Returns TRUE if argument addressing mode is one of the indexed modes.
//
////////////////////////////////////////////////////////////////////////
BOOLEAN is_indexed_mode(int mode){
    switch (mode){
    case IND_MODE:
```

```
    case IND_LOOP_MODE:
    case IO_IND_MODE:
    case IO_IND_LOOP_MODE:
        return TRUE;
    default:
        return FALSE;
    }}
////////////////////////////////////////////////////////////////////
// is_immediate_mode
// Returns TRUE if argument addressing mode is one of the immediate modes.
//
////////////////////////////////////////////////////////////////////
BOOLEAN is_immediate_mode(int mode){
    switch (mode){
    case IMMEDIATE_MODE:
    case IMMED_L_MODE:
    case IMMED_R_MODE:
        return TRUE;
    default:
        return FALSE;
    }}
////////////////////////////////////////////////////////////////////
// is_direct_mode
// Returns TRUE if argument addressing mode is direct mode.
//
////////////////////////////////////////////////////////////////////
BOOLEAN is_direct_mode(int mode){
    return (mode == ABSOLUTE_MODE);}
////////////////////////////////////////////////////////////////////
// phantom_name
// Returns TRUE if name string follows phantom name convention.
//
////////////////////////////////////////////////////////////////////
BOOLEAN phantom_name(string name)
{
    return (name[0] == PHANTOM_PREFIX); }
////////////////////////////////////////////////////////////////////
// int_to_c_string
// Convert an integer number to a C string, returning a pointer to it.
```

```
// This string should be copied or otherwise used before the next call, since
// as single static area holds the string.
////////////////////////////////////////////////////////////////////////
char* int_to_c_string(int i){
      static char  i_chars[ITOA_LIMIT];
      // get strings for input number
      itoa(i, i_chars, 10);
      return i_chars;}
////////////////////////////////////////////////////////////////////////
// check_ostream
// Make sure there is no error condition in an output stream.
// If there is, output a message and exit immediately.
////////////////////////////////////////////////////////////////////////
void check_ostream(ostream& s){
      int            state;
      state = s.rdstate();
      if (state == _fail || state == _bad){
            cerr << "Fatal error trying to write an output file.\n";
            exit(-1);
      }}
}
/* utility.h
// C-callable utility routines header
// T. Montlick
// 10/31/89
*/
/* source code control: @(#)utility.h1.56 10/7/91 */
#define UTILITY_DEF
#ifndef ERR_STR_DEF
#include "err_str.h"
#endif
/* use function prototypes for C++ */
#ifdef __cplusplus
externint        error_line();
externint        check_error_count();
externvoid  out_header();
externvoid  out_err_header(char* msg_num);
externvoid  out_warn_header(char* msg_num);
externint        yyerror(char* s);
```

```
externint        error_w_string(char* msg_num, char* str1, string* str2,
                          char* str3);
externint        other_error(char* msg_num, char* s);
externint        warning(char* msg_num, char* s);
externint        yywrap();
externdouble check_0_r(double val);
externdouble check_10_r(double val);
externlong round(double x);
externdouble divide(double a, double b);
externdouble logn(double x, double n);
externdouble expn(double x, double n);
externBOOLEAN is_cond_jump_opcode(int opcode);
externBOOLEAN is_jump_opcode(int opcode);
externBOOLEAN is_source_op_opcode(int opcode);
externBOOLEAN is_dest_op_opcode(int opcode);
externBOOLEAN is_indexed_mode(int mode);
externBOOLEAN is_immediate_mode(int mode);
externBOOLEAN is_direct_mode(int mode);
externchar* int_to_c_string(int i);
externvoid check_ostream(ostream& s);
#else
externint        error_line();
externint        check_error_count();
externvoid out_header();
externvoid out_err_header();
externvoid out_warn_header();
externint        yyerror();
externint        error_w_string();
externint        other_error();
externint        warning();
externint        yywrap();
externdouble check_0_r();
externdouble check_10_r();
externlong round();
externdouble divide();
externdouble logn();
externdouble expn();
externBOOLEAN is_cond_jump_opcode();
externBOOLEAN is_jump_opcode();
```

```
externBOOLEAN is_source_op_opcode();
externBOOLEAN is_dest_op_opcode();
externBOOLEAN is_indexed_mode();
externBOOLEAN is_immediate_mode();
externBOOLEAN is_direct_mode();
externchar* int_to_c_string();
externvoid check_ostream();
#endif
externint       line;           /* line number for current place in parse */
externint       instr_line;     /* line # of current instruction */
// utility.hxx
// C-callable utility routines header
// T. Montlick
// 10/31/89
/* source code control: @(#)utility.hxx1.56 10/7/91 */
#define UTILITY_DEF
#ifndef FIELDS_DEF
    #include "fields.h"
#endif
#ifndef STANDARD_DEF
    #include "standard.hxx"
#endif
#ifndef STRING_DEF
    #include "string.hxx"
#endif
#ifndef INTRFACE_DEF
    #include "intrface.hxx"
#endif
#ifndef ERR_STR_DEF
    #include "err_str.h"
#endif
// max # of errors printed
#define MAX_ERROR_COUNT10
#define PHANTOM_PREFIX'_'
extern "C" {
externint       error_line();
externint       check_error_count();
externvoid out_header();
externvoid out_err_header(char* msg_num);
```

```
externvoid out_warn_header(char* msg_num);
externint         yyerror(char* s);
externint         error_w_string(char* msg_num, char* str1, string* str2,
                                  char* str3);
externint         other_error(char* msg_num, char* s);
externint         warning(char* msg_num, char* s);
externint         yywrap();
externdouble check_0_r(double val);
externdouble check_10_r(double val);
externlong round(double x);
externdouble divide(double a, double b);
externdouble logn(double x, double n);
externdouble expn(double x, double n);
externBOOLEAN is_cond_jump_opcode(int opcode);
externBOOLEAN is_jump_opcode(int opcode);
externBOOLEAN is_source_op_opcode(int opcode);
externBOOLEAN is_dest_op_opcode(int opcode);
externBOOLEAN is_indexed_mode(int mode);
externBOOLEAN is_immediate_mode(int mode);
externBOOLEAN is_direct_mode(int mode);
externchar* int_to_c_string(int i);
externvoid check_ostream(ostream& s);
// test to see if name follows phantom name convention
externBOOLEAN phantom_name(string name);}
// zone.hxx
// zone class
// T. Montlick
// 1/29/90
// source code control: @(#)zone.hxx1.56 10/7/91
#define ZONE_DEF
extern "C" {
#include "mystdlib.h"}
#ifndef STANDARD_DEF
#include "standard.hxx"
#endif
#ifndef STRING_DEF
#include "string.hxx"
#endif
#ifndef INT_ARRAY_DEF
```

```
#include "int_arr.hxx"
#endif
#ifndef LONG_ARRAY_DEF
#include "long_arr.hxx"
#endif
#ifndef INST_ARRAY_DEF
#include "inst_arr.hxx"
#endif
#ifndef STRG_ARRAY_DEF
#include "strg_arr.hxx"
#endif
#ifndef INTRFACE_DEF
#include "intrface.hxx"
#endif
#ifndef ZONE_ARRAY_DEF
#include "zone_arr.hxx"
#endif
#ifndef SCHEDULER_DEF
#include "schedule.hxx"
#endif
#ifdef SZ
#undef SZ
#endif
#defineSZ          4                    // default array and hash table size
// define strings for phantom block names and pieces of names
#defineTURNSTILE_STR "_turnstile"
#defineFREE_SEG_STR "_free_seg"
#define COPY_STR"_copy"
#defineWAIT_FOR_FLAGS_STR"_wait_for_flags"
#define JUMP_TO_STR"_jump_to"
#define SEPARATOR_STR"_"
#define IN_FIFO_STR"_in_fifo_"
#define OUT_FIFO_STR"_out_fifo_"
#define IN_PTR_STR"in_ptr"
#define OUT_PTR_STR"out_ptr"
#define LOOP_STR"_$loop"
#define PORT_STR"_%port_"
#defineGSP_START_STR"_$start_gsp"
#defineCOPY_CONSTANT_STR"_copy_constant"
```

```
#defineCOPY_ADDRESS_STR"_copy_address"
#defineWAIT_SEG_FLAG_STR"_wait_seg_flag"
#defineINIT_ARR_PTR_STR"_init_arr_ptr"
#defineZONE_STR     "_zone_"
#define SEG_STR     "_seg_"
#defineSTR_LENGTH (2*ITOA_LIMIT)+20
#define LCOUNTER_STR"_lcounter_"
#define USER_TOP_NAME"top"
//register names in io.sdf:
#defineIN_PORT_BUF_LEN_STR"_%serial_in_port_buf_len_"
#defineIN_PORT_FIFO_IX_STR"_%serial_in_port_fifo_ix_len_"
#defineIN_PORT_FIFO_START_STR"_%serial_in_port_fifo_start_"
#defineIN_PORT_CONFIG_STR"_%serial_in_port_config_"
#defineOUT_PORT_BUF_LEN_STR"_%serial_out_port_buf_len_"
#defineOUT_PORT_FIFO_START_STR"_%serial_out_port_fifo_start_"
#defineOUT_PORT_CONFIG_STR"_%serial_out_port_config_"
#defineOUT_PORT_DECIMATION_STR"_%serial_out_port_decimation_"
#defineOUT_PORT_ENABLE_STR"_%serial_out_port_run_"
#defineOUT_PORT_WAIT_MASK_STR"_%serial_out_port_wait_mask_"
#define PROBE_FIFO_STR"_%probe_fifo_0"
#definePROBE_FIFO_BUF_LEN1
#definePROBE_FIFO_LEN_STR"_%probe_fifo_len_0"
#defineIN_CLOCK_STR"_%serial_in_port_int_clk_"
#defineOUT_CLOCK_STR"_%serial_out_port_int_clk_"
#define IN_CLOCK_VAL_STR"_%in_clk_val_"
#define OUT_CLOCK_VAL_STR"_%out_clk_val_"
#define GPIO_REGISTER"_%gpio_register"
#defineGPIO_OUTPUT_FIELD"_%gpio_output_field"
#defineOUT_CLOCK_DEFAULT7
#define DEPTH_STR"_depth"
#define ARRAY_PREFIX_STR"_arr$"
#define TO_ARRAY_PTR_STR"_tptr$"
#define FR_ARRAY_PTR_STR"_fptr$"
#define TO_PHANT_ARR_STR"_to_phant_array"
#define FR_PHANT_ARR_STR"_fr_phant_array"
#define UP_FR_PH_ARR_STR"_up_fr_ph_array"
#defineDOWN_FR_PH_ARR_STR"_down_fr_ph_array"
#define DUPE_PHANT_ARR_STR"_dupe_ph_array"
#define WAIT_NON0_COMP_STR"_wait_nonz_compute"
```

```
#define POLL_COMP_STR"_poll_compute_line"
#define COMPUTE_CTR_STR"_compute_count"
#define PR_RESET_STR"_pr_reset"
#define PR_SIGNAL_STR"_&probe_signal"
#definePR_SIGNAL_INIT_VAL1
// amount to add to fifo sizes to fix hardware problem
#defineFIFO_SIZE_FUDGE2
// initial value of max_seg_cycles before we examine ports
#define MAX_SEG_CYCLES10000
// class used by zone class to handle processing input wires to a zone
class wire_inputs{
      inst_arraypending_instances;// current input instances for partition
      int_arraypending_wires;// current input wires for partition
      inst_arrayusage_instances;// instances for usage count
      int_arrayusage_wires;// wires for usage count
      int_arrayusage_count;// usage count of # of inputs using wires
      int_arrayusage_loop_flags;// TRUE if above wire need for loop phantom
      inst_arrayloop_source_inst;// instance which generated the loop wire
      int_arrayloop_source_io;// I/O index for this source
public:
      wire_inputs();
      ~wire_inputs();
      instance*pending_instance(int i)
                                    { return pending_instances[i]; }
      int            pending_wire(int i){ return pending_wires[i]; }
      int            pending_size(){ return pending_wires.size(); }
      void      add_input(instance* inst, int wire);
      void      remove_input(instance* inst, int wire);
      void      add_wire_usage_count(instance* inst, int wire, int count);
      void      decrement_usage_count(instance* inst, int wire);
      BOOLEANtest_usage_count(instance* inst, int wire);
      void      set_wire_loop_flag(instance* inst, int wire,
                                    instance* output_inst, int output_io);
      BOOLEANtest_wire_loop_flag(instance* inst, int wire);
      void      free_loop_wires();
      instance*source_for_loop(instance* inst, int wire);
      wire_inputs&operator+=(wire_inputs&);
};
// ports class, which stores common info about input and output ports
```

```
class ports{
      int_arrayport_nums;          // port #s for zone inputs
      int_arraytriggers;           // trigger sources
      long_arrayconfigurations;// configuration words
      strg_arrayfifo_names;        // hierarchical name for start of fifo
      int_arrayfifo_buf_len;// fifo buffer length
      int_arrayfifo_depth;         // fifo depth
      inst_arrayport_instances;// instances for actual ports
public:
      ports();
      ~ports();
      int            size()       { return port_nums.size(); }
      int            which_port(int i){ return port_nums[i]; }
      void      set_port(int i, int port, int trigger, long config);
      void      set_fifo(int i, string* name, int depth);
      void      set_fifo_buf_len(int i, int len)
                                  { fifo_buf_len[i] = len; }
      string*   fifo_name(int i){ return fifo_names[i]; }
      int            fifo_size(int i)
                                  { return fifo_buf_len[i]*fifo_depth[i]*2; }
      int            fifo_buf_length(int i)
                                  { return fifo_buf_len[i]; }
      int            fifo_buffers(int i)
                                  { return fifo_depth[i]; }
      long      get_configuration(int i)
                                  { return configurations[i]; }
      int            get_trigger(int i)
                                  { return triggers[i]; }
      void      set_port_instance(int i, instance* inst)
                                  { port_instances[i] = inst; }
      instance*port_instance(int i)
                                  { return port_instances[i]; }
};
// derived classes from ports
class in_ports : public ports{
      int_arrayinput_is_compute;// TRUE if input is really compute line
      int_arrayinput_fifo_in_ptrs;// index in inst. for in fifo in ptrs
      inst_arrayinput_fifo_in_inst;// instance for above
      int_arrayinput_fifo_out_ptrs;// index in inst. for in fifo out ptrs
```

```
    inst_arrayinput_fifo_out_inst;// instance for above
public:
    in_ports();
    ~in_ports();
    void        set_in_port(int i, int port, int trigger, long config,
                            int fifo_ptr, instance* inst);
    void        set_in_compute(int i, int port);
    void        set_in_fifo(int i, string* fifo_name, int depth,
                            int out_ptr_index, instance* out_ptr_inst);
    BOOLEANadd_input_port(int port, int fifo_ptr, instance* inst,
                            int trigger, long config, int entry_size);
    BOOLEANadd_compute_input(int port);
    BOOLEANis_compute_input(int i){ return input_is_compute[i]; }
    void        fifo_in_ptr(int i, int* ptr, instance** inst);
    void        fifo_out_ptr(int i, int* ptr, instance** inst);
    void        add_in_port_inst(instance* port_inst);
};
class out_ports : public ports{
    int_arrayoutput_fifo_ptrs;// index in instance for out fifo ptrs
    inst_arrayoutput_fifo_inst;// instance for above
    int_arrayoutput_fifo_enable;// index in top inst for fifo flag enable
    inst_arrayoutput_instances;// parent wire instances for output ports
    int_arrayoutput_wires;// wires for output ports
public:
    out_ports();
    ~out_ports();
    void        add_wire(instance* inst, int wire, instance* port_inst);
    BOOLEANadd_output_port(int port, int trigger, long config,
                            int entry_size);
    void        set_out_fifo(int i, string* fifo_name,
                            int depth, int ptr, instance* inst);
    void        fifo_ptr(int i, int* ptr, instance** inst);
    int             fifo_ptr_no_inst(int i)
                            { return output_fifo_ptrs[i]; }
    instance*output_instance(int i)
                            { return output_instances[i]; }
    int             output_wire(int i)
                            { return output_wires[i]; }
    int             get_fifo_enable(int i)
```

```
                         { return output_fifo_enable[i]; }
};
// special trigger value which signals no trigger for signal source
#define NO_TRIGGER-1
// special trigger value which signals trigger wait instance supplied by user
#defineTRIGGER_INST_SUPPLIED-2
// special port value which signals no port (compute line) for signal source
#define NO_PORT-1

// return values for process_zone_io
#defineERROR_STATUS-1
#defineNO_INPUTS-100
// base class of the zone class which handles inputs to the zone
class zone_inputs{
protected:
    in_portsinputs;              // port inputs to zone
    BOOLEANcompute_wait_inst;// TRUE if a compute line wait instantiated
public:
    zone_inputs();
    ~zone_inputs();
    BOOLEANadd_zone_compute_input(int port)
                { return inputs.add_compute_input(port); }
    int         n_zone_inputs(){ return inputs.size(); }
    void     set_zone_input_fifo(int i, string* fifo_name,
                         int depth, int out_ptr_index, instance* ptr_inst)
        {    inputs.set_in_fifo(i, fifo_name, depth, out_ptr_index, ptr_inst); }
    string*  zone_input_fifo_name(int i)
                         { return inputs.fifo_name(i); }
    void     add_input_inst(instance* port_inst)
                         { inputs.add_in_port_inst(port_inst); }
    instance*input_port_instance(int i)
                         { return inputs.port_instance(i); }
    void     set_compute_wait_inst()
                         { compute_wait_inst = TRUE; }
    BOOLEANis_compute_wait_inst_set()
                         { return compute_wait_inst; }
    int         get_input_trigger(int i)
                         { return inputs.get_trigger(i); }
};
```

```
// base class of the zone class which handles outputs from the zone
class zone_outputs{
protected:
      out_portsoutputs;              // port outputs from zone
public:
      zone_outputs();
      ~zone_outputs();
      int               n_zone_outputs(){ return outputs.size(); }
      instance*output_instance(int i)
                                  { return outputs.output_instance(i); }
      int               output_wire(int i){ return outputs.output_wire(i); }
      instance*output_port_instance(int i)
                                  { return outputs.port_instance(i); }
      int               output_size(){ return outputs.size(); }
      void        add_output_wire_and_inst(instance* inst, int wire,
                                  instance* port_inst)
                                  { outputs.add_wire(inst, wire, port_inst); }
      BOOLEANadd_zone_output(int port, int trigger, long config,
                                  int entry_size)
           { return outputs.add_output_port( port, trigger, config, entry_size); }
      int               zone_output_port(int i)
                                  { return outputs.which_port(i); }
      int               zone_output_fifo_ptr(int i)
                                  { return outputs.fifo_ptr_no_inst(i); }
      void        set_zone_output_fifo(int i, string* fifo_name,
                                  int depth, int ptr, instance* inst)
                  { outputs.set_out_fifo(i, fifo_name, depth, ptr, inst); }
      string*     zone_output_fifo_name(int i)
                                  { return outputs.fifo_name(i); }
      int               get_output_trigger(int i)
                                  { return outputs.get_trigger(i); }
};
// base class of the zone class which manages pending wires (wires which are
// inputs for as-yet unpartitioned blocks)
class zone_pending_wires{
protected:
      wire_inputspending_wires;// wire inputs which are pending for zone
public:
      zone_pending_wires();
```

```
        ~zone_pending_wires();
        instance*pending_instance(int i)
                                    { return pending_wires.pending_instance(i); }
        int             pending_wire(int i){ return pending_wires.pending_wire(i); }
        int             pending_size(){ return pending_wires.pending_size(); }
        void        add_input(instance* inst, int wire)
                                    { pending_wires.add_input(inst, wire); }
        void        add_wire_usage_count(instance* inst, int wire, int count)
                                    { pending_wires.add_wire_usage_count(inst, wire,
                                    count); }
};
// base class of the zone class which maintains topological info on the
// connections between zones
class zone_topology{
        zone_arraynext_zones;       // succeeding zones in zone topology
        zone_arrayprevious_zones;// previous zones in zone topology
public:
        zone_topology();
        ~zone_topology();
        void        add_next_zone(zone* z)
                                    { next_zones.append(z); }
        void        add_prev_zone(zone* z)
                                    { previous_zones.append(z); }
        int             n_next_zones(){ return next_zones.size(); }
        zone*       next_zone(int i){ return next_zones[i]; }
        BOOLEANnext_zone_present(zone* z)
                                    { return (next_zones.find(z) >= 0); }
        int             n_prev_zones(){ return previous_zones.size(); }
        zone*       prev_zone(int i){ return previous_zones[i]; }
        BOOLEANprev_zone_present(zone* z)
                                    { return (previous_zones.find(z) >= 0); }
};
class zones;// defined later
class zone : public zone_inputs, public zone_outputs,
            public zone_pending_wires, public zone_topology{
        int             zone_number;
        string*     zone_name;
        double      zone_rate;
        int             seg_number;
```

```
    char        zone_chars[STR_LENGTH];
    char        seg_chars[STR_LENGTH];
    long        max_seg_cycles;
    long_arrayseg_cycles_used;// # cycles used in each segment
    long_arrayoverhead_cycles;// # overhead cycles allowed for
    long        init_cycles;      // once-only cycles for zone
    strg_arrayseg_flag_names;// names for all this zone's seg flags
    long        zone_flags_mask;// timing source for this zone
    BOOLEANuser_triggered;   // TRUE if user supplies wait for flags inst
    BOOLEANderived;          // TRUE if this is a derived sub-zone
    BOOLEANis_master;        // TRUE if has derived sub-zones
    long        repeat_count;     // repeat count for scheduling zone
    BOOLEANforced_boundary;// TRUE to force a zone boundary
    instance*last_in_zone_parent;// parent of last sequenced in zone
    int                 last_in_zone_seq;// child sequence # of last in zone
    BOOLEANdo_compute_polling;// TRUE if must poll compute line
    instance*compute_ctr_inst;// parent instance for compute ctr storage
    int                 compute_ctr_index;// index in parent for compute ctr storage
    zones*      zones_contained_in;// zones class instance which hold this zone
protected:
    void        set_as_sub_zone(){ derived = TRUE; }
    BOOLEANadd_zone_input(int port, int fifo_ptr,instance* inst,
                          int trigger, long config, int entry_size);
    BOOLEANset_zone_rate(double rate, long gsp_rate);
    BOOLEANinit_port(int port_num, int buf_len, int index_len,
                          string* fifo_name, long port_setup, int decim_count,
                          long enable, long wait_mask);
public:
    zone(int zone_num, zones* zones_ptr);
    ~zone();
    virtualchar*get_zone_chars(){ return zone_chars; }
    virtualchar*true_zone_chars(){ return zone_chars; }
    virtualchar*get_seg_chars()  { return seg_chars; }
    virtualvoid bump_segment();
    virtualint          zone_num(){ return zone_number; }
    virtualint          seg_num()  { return seg_number; }
    virtuallong max_cycles()      { return max_seg_cycles; }
    void        set_max_cycles(long i) { max_seg_cycles = i; }
    virtualvoid add_cycles(long i){ seg_cycles_used[seg_number] += i; }
```

```
virtuallong cycles_used()     { return seg_cycles_used[seg_number]; }
virtuallong cycles_used_in_seg(int i)
                              { return seg_cycles_used[i]; }
virtualvoid add_init_cycles(long i)
                              { init_cycles += i; }
virtuallong get_init_cycles(){ return init_cycles; }
virtualvoid set_overhead_allowed_for(long i)
                              { overhead_cycles[seg_number] = i; }
virtuallong overhead_allowed_for_in_seg(int i)
                              { return overhead_cycles[i]; }
virtualint         n_segments(){ return seg_number; }
virtualstring*seg_flag_name(int i);
virtualstring*make_segment_flag(int* index_ptr);
string*      loop_counter_name(int i);
string*      make_loop_counter(int* index_ptr, instance** inst_ptr);
BOOLEANset_zone_name(string* name);
void         override_zone_name(string* name)
                              { zone_name = name; }
string*      get_zone_name() { return zone_name; }
double       get_zone_rate()  { return zone_rate; }
int                process_zone_inputs();
int                process_zone_outputs();
int          do_temporal_partition();
BOOLEANfixup_feedback_inputs(instance* this_inst);
int                evaluate_zone_inputs(instance* this_inst);
BOOLEANevaluate_child_zone_inputs(instance* parent, int which_child,
                              instance* child, int* n_inputs_ptr);
int                evaluate_zone_outputs(instance* this_inst);
BOOLEANget_fifo_ptr_for_port(instance* this_inst, BOOLEAN is_output);
BOOLEANallocate_trigger_source(instance* this_inst);
BOOLEANevaluate_port_timezone(instance* this_inst);
BOOLEANevaluate_timezone_name(instance* this_inst);
BOOLEANevaluate_source_info(instance* this_inst, int* num,
                              int* trigger, long* config, int* entry_size);
string* build_in_fifo_name(int i);
string*      build_in_fifo_out_ptr_name(int i);
string* build_out_fifo_name(int i);
string* build_out_fifo_in_ptr_name(int i);
int                get_in_fifo_buffer_size(int i);
```

```
int              get_out_fifo_buffer_size(int i);
BOOLEANmake_phantom_wires();
BOOLEANmake_phantom_wires(int_array* top_of_next_copy);
BOOLEAN modify_pending_in(int i, instance* this_inst);
long       get_wait_mask(int i, BOOLEAN is_output);
long       get_port_setup(int i, BOOLEAN is_output);
BOOLEANinit_port_registers();
BOOLEAN init_hardware_register(string* reg_name, expr* value);
void       set_zone_mask(long m){ zone_flags_mask = m; }
long       zone_mask()     { return zone_flags_mask; }
void       set_zone_user_triggered() { user_triggered = TRUE; }
BOOLEANis_user_triggered() { return user_triggered; }
int              gsps_used(){ return n_segments() - 1; }
virtual    int                get_gsp_count(double* fractional_count_ptr);
BOOLEANis_sub_zone(){ return derived; }
void       free_pending_loop_wires()
                              { pending_wires.free_loop_wires(); }
BOOLEANis_compute_input(int i){ return inputs.is_compute_input(i); }
int              input_fifo_size(int i)
                              { return inputs.fifo_size(i); }
string*    input_fifo_name(int i)
                              { return inputs.fifo_name(i); }
int              input_fifo_buf_length(int i)
                              { return inputs.fifo_buf_length(i); }
int              input_fifo_depth(int i)
                              { return inputs.fifo_buffers(i); }
int              output_fifo_size(int i)
                              { return outputs.fifo_size(i); }
string*    output_fifo_name(int i)
                              { return outputs.fifo_name(i); }
void       output_fifo_ptr(int i, int* ptr, instance** inst)
                              { outputs.fifo_ptr(i, ptr, inst); }
void       input_fifo_in_ptr(int i, int* ptr, instance** inst)
                              { inputs.fifo_in_ptr(i, ptr, inst); }
void       input_fifo_out_ptr(int i, int* ptr, instance** inst)
                              { inputs.fifo_out_ptr(i, ptr, inst); }
int              which_input_port(int i){ return inputs.which_port(i); }
int              get_output_fifo_enable(int i)
                              { return outputs.get_fifo_enable(i); }
```

```
void        set_as_master_zone(){ is_master = TRUE; }
BOOLEANis_master_zone(){ return is_master; }
void        set_repeat_count(long l){ repeat_count = l; }
long        get_repeat_count(){ return repeat_count; }
virtual     zone*original_zone(double* rel_rate_ptr);
virtual     zone*original_zone();
BOOLEANprocess_gpios(instance* inst);
BOOLEANprocess_rts(instance* inst);
zone&       operator+=(zone&);
virtualvoid force_a_boundary(){ forced_boundary = TRUE; }
virtualBOOLEANboundary_forced(){ return forced_boundary; }
virtualvoid clear_forced_flag(){ forced_boundary = FALSE; }
void        set_last_in_zone(instance* parent, int seq)
                        { last_in_zone_parent = parent; last_in_zone_seq = seq; }
instance*get_last_in_zone(int* seq_ptr)
                        { *seq_ptr = last_in_zone_seq; return last_in_zone_parent; }
BOOLEANanalyze_compute_counter_polling();
virtual     BOOLEANcompute_polling()
                { if (seg_number == 1) return do_compute_polling;
                 else return FALSE; }
virtual     int   get_compute_ctr(instance** i_ptr)
                        { *i_ptr = compute_ctr_inst; return compute_ctr_index; }
zones*      get_zones_which_contains() { return zones_contained_in; }
};
// misc functions called:
block*      find_block(string* prototype_name);
BOOLEAN translate_zone_name(expr* name_expr, instance* this_inst,
                        string** name_ptr);
// derived class of the zone class which handles decimated/interpolated zones
// derived from master zone
class sub_zone : public zone{
zone*       derived_from;    // which zone immediately derived from
int                 decimation_factor;// factor with respect to orginal zone trig.
long        ratio;           // decimation/interpolation ratio for deriv.
BOOLEANdecimating;           // TRUE if decimating from derived
public:
sub_zone(int zone_num, zones* zones_ptr);
~sub_zone();
char*       get_zone_chars()// refer all zone # and seg stuff to orig.
```

```
                        { return original_zone()->get_zone_chars(); }
char*      true_zone_chars(){ return zone::get_zone_chars(); }
char*      get_seg_chars()
                        { return original_zone()->get_seg_chars(); }
void       bump_segment()
                        { original_zone()->bump_segment(); }
int             zone_num()
                        { return original_zone()->zone_num(); }
int             seg_num()
                        { return original_zone()->seg_num(); }
void       add_cycles(long i)
                        { original_zone()->add_cycles(i); }
long       cycles_used()
                        { return original_zone()->cycles_used(); }
long       cycles_used_in_seg(int i)
                        { return original_zone()->cycles_used_in_seg(i); }
void       add_init_cycles(long i)
                        { original_zone()->add_init_cycles(i); }
long       get_init_cycles()
                        { return original_zone()->get_init_cycles(); }
void       set_overhead_allowed_for(long i)
                        { original_zone()->set_overhead_allowed_for(i); }
long       overhead_allowed_for_in_seg(int i)
                        { return original_zone()->overhead_allowed_for_in_seg(i); }
int             n_segments()
                        { return original_zone()->n_segments(); }
string*    seg_flag_name(int i)
                        { return original_zone()->seg_flag_name(i); }
string*    make_segment_flag(int* index_ptr)
                        { return original_zone()->make_segment_flag(index_ptr); }
void       force_a_boundary(){ original_zone()->force_a_boundary(); }
BOOLEANboundary_forced()
                        { return original_zone()->boundary_forced(); }
void       clear_forced_flag(){ original_zone()->clear_forced_flag(); }
void       set_decimation(int i){ decimation_factor = i; }
int             decimation(){ return decimation_factor; }
zone*      derived_from_zone(){ return derived_from; }
void       set_sub_zone(zone* prev_zone, long r, BOOLEAN decim)
                { derived_from = prev_zone; ratio = r; decimating = decim; }
```

```
	BOOLEANis_decimating()	{ return decimating; }
	long	get_ratio()	{ return ratio; }
	zone*	original_zone(double* rel_rate_ptr);
	zone*	original_zone();
	int		get_gsp_count(double* frac_ptr)
			{ return original_zone()->zone::get_gsp_count(frac_ptr); }
	long	max_cycles()
			{ return original_zone()->zone::max_cycles(); }
	BOOLEANcompute_polling()
			{ return original_zone()->zone::compute_polling(); }
	int		get_compute_ctr(instance** i_ptr)
			{ return original_zone()->zone::get_compute_ctr(i_ptr); }
};
// class to do temporal partitioning
class temporal{
	friend	class multi_temporal;
	string*	flag_string;// ptr to name of current segment flag
	zone*	this_zone;	// zone for partitioning
	instance*this_inst;// current instance being partitioned
	BOOLEANadding_init;// TRUE if adding init blocks
	BOOLEANis_multi_temporal;// TRUE if derived multi-temporal class
protected:
	static	zone*last_zone_for_partitioning;
	static	long compute_ctr_wait_mask;// saved copy of wait msk
	string*	loopback_label;// hierarchical label for top of main loop
	BOOLEANmake_phantom_instance(string* prototype_name,
				instance** inst_ptr_ptr);
	BOOLEANmake_phantom_instance(string* prototype_name,
				instance** inst_ptr_ptr, int insert_index);
	BOOLEANmake_phantom_inst_with_args(char* block_name,
			int n_ios, int* io_wires, instance** io_instances,
			int n_params, expr** param_values, instance** inst_ptr_ptr);
	BOOLEANmake_phantom_inst_with_args(char* block_name,
			int n_ios, int* io_wires, instance** io_instances,
			int n_params, expr** param_values, instance** inst_ptr_ptr,
			int insert_index);
	BOOLEANmake_phantom_inst_with_args(char* block_name,
			int n_ios, int* io_wires, instance** io_instances,
			int n_params, expr** param_values)// version without instance
```

```
                  { instance* inst_ptr;
                            return make_phantom_inst_with_args(block_name, n_ios,
                            io_wires, io_instances, n_params, param_values, &inst_ptr);}
     BOOLEANmake_wait_for_flags_block(long wait_mask);
     BOOLEAN make_wait_nonzero_compute_block(long wait_mask,
                            instance* ctr_inst, int ctr_index);
     BOOLEAN make_poll_compute_block(long wait_mask,
                            instance* ctr_inst, int ctr_index);
     BOOLEANmake_turnstile(string* the_flag_string, int seg_number);
     BOOLEANmake_free_segment(string* flag_name);
     BOOLEANmake_copy_blocks();
     BOOLEANmake_phantom_copy_block(int i);
     BOOLEANmake_copy_constant_block(string* flag_name, long constant);
     BOOLEAN make_copy_addr_block(int addr_size,
                            string* addr_name,int ptr_index, instance* ptr_inst);
     BOOLEANmake_init_arr_ptr_block(int addr_size, int addr_index,
                            instance* addr_inst, int ptr_index, instance* ptr_inst);
     BOOLEANmake_init_arr_ptr_block(int addr_size, int addr_index,
                            instance* addr_inst, int ptr_index, instance* ptr_inst,
                            int place);
     BOOLEANmake_wait_seg_flag_block(string* flag_name, long value);
     BOOLEANmake_pr_reset_block();
public:
     temporal(zone* z, instance* i, string* flag_name_ptr, zone* prev_z = NULL);
     ~temporal();
     BOOLEANmake_input_fifo();
     BOOLEANmake_input_fifo_instance(int i);
     BOOLEANadd_input_fifo_info(int depth);
     virtual     BOOLEAN partition(BOOLEAN* ok, int* duration_ptr);
     BOOLEANfind_input_and_create_segment_0();
     virtual     BOOLEANcreate_segment_0();
     virtual BOOLEANinit_for_partition();
     virtual     BOOLEAN create_new_segment(int duration);
     virtual     void out_sample_period_msg(ostream& out);
     BOOLEANverify_inputs();
     BOOLEANverify_end_zone_fit();
     BOOLEANmake_output_fifo();
     BOOLEANadd_parameters(int n_params, static string param_names[],
                            expr* param_vals[]);
```

```
    virtual     BOOLEANadd_output_fifo_info();
    virtual     BOOLEAN make_zone_finish();
    BOOLEAN generate_GSP_init_code(int n_segments, string* zeroth_seg_name,
                                string* loopback_label);
    virtual     BOOLEAN run_time_input_port_init();
    virtual     BOOLEANinit_input_fifo_ptrs();
    virtual     BOOLEANinit_output_fifo_ptrs();
    BOOLEANfixup_feedback_inputs(instance* i)
                                { return this_zone->fixup_feedback_inputs(i); }
    BOOLEANmake_jump_block(string* addr_name);
    virtual     int    ending_overhead();
    virtual     BOOLEANadd_this_block_duration(int* dur_ptr);
    BOOLEANtest_block_duration(int duration);
    virtual     long get_this_block_duration();
    virtual     BOOLEANadd_block_duration(string* prototype_name,
                                instance*& inst_ptr);
    virtual     long end_zone_cycles();
    BOOLEAN end_zone_fits();
};
// misc functions called:
    int                 get_block_duration(char* name);
    int            get_block_duration(char* name, int n_params,
                                expr** param_values);
// derived class from temporal class which does multi-rate temporal partitioning
// with a master zone and its decimated/interpolated sub-zones
// Defines for states used in multi_temporal::analyze_phantom_multi_copies.
// Don't do an enumerated type because this way we can use an ordinary
// integer array to hold values
// common:
#defineNOTHING                0
// bottom_of_last_copy:
#defineNORMAL_COPY_TO_ARRAY1
#define ORDINARY_COPY_TO_WIRE2
// top_of_next_copy:
#defineNORMAL_COPY_FROM_ARRAY1
#defineUPSAMPLE_COPY_FROM_ARRAY2
#defineDOWNSAMPLE_COPY_FROM_ARRAY3
#defineLOOP_BOTTOM_STR       "_loop_bottom"
#define LOOP_RPT_STR"_$rpt_loop"
```

```
class multi_temporal : public temporal{
    static      BOOLEANin_repeat_code;// TRUE if in code blocks being repeated
    static      string*last_loop_counter_name;// name for current loop
    static      zone*top_of_loop_zone;
    static      instance*seg_bound_inst;
    static      int             seg_bound_ind;
    static      int             since_last_poll;// cycles since last poll block
    static      int             loop_counter_index; // = parent wire index for loop ctr
    static instance* loop_counter_instance;// = parent instance for loop ctr
    static      string*loop_label_name;// name for top of curr. loop label
protected:
    BOOLEANmake_loop_top();
    BOOLEANmake_loop_bottom(zone* loop_zone);
public:
    multi_temporal(zone* z, instance* i, string* flag_name_ptr,
                                    zone* prev_z = NULL);
    ~multi_temporal() { }
    BOOLEANinit_for_partition();
    BOOLEANadd_output_fifo_info();
    BOOLEANrun_time_input_port_init();
    BOOLEANinit_input_fifo_ptrs();
    BOOLEANinit_output_fifo_ptrs();
    BOOLEANadd_this_block_duration(int* dur_ptr);
    BOOLEANpoll_block_required(int duration);
    void        poll_block_accounting(int duration);
    BOOLEANsegment_would_follow_poll(int duration);
    BOOLEANsegment_would_follow_boundary(int duration);
    BOOLEANadd_poll_block();
    int             poll_block_cycles();
    long        get_this_block_duration();
    int             ending_overhead();
    long        end_zone_cycles();
    BOOLEANcreate_segment_0();
    BOOLEANcreate_new_segment(int duration);
    BOOLEANcreate_zone_boundary();
    int             boundary_overhead();
    BOOLEAN make_zone_finish();
    BOOLEANpartition(BOOLEAN* ok, int* duration_ptr);
    BOOLEANmake_loop_init_block();
```

```
BOOLEANanalyze_phantom_multi_copies(zone* before_zone,zone* after_zone,
            int_array* bottom_of_last_copy, int_array* top_of_next_copy);
BOOLEANmake_phantom_arrays();
BOOLEANmake_to_phantom_array_ptrs(int_array* bottom_of_last_copy);
BOOLEANmake_from_phantom_array_ptrs(int_array* top_of_next_copy);
BOOLEANmake_non_phantom_arrays(int_array* bottom_of_last_copy);
BOOLEANdupe_phantom_arrays();
BOOLEANn_dupe_phantom_arrays_cycles(int *n_cycles_ptr);
BOOLEANmake_to_phantom_arr_copys(int_array* bottom_of_last_copy,
                    zone* before_zone, zone* after_zone);
BOOLEANn_to_phantom_arr_copy_cycles( int_array* bottom_of_last_copy,
                    int *n_cycles_ptr);
BOOLEANmake_from_phantom_arr_copys(int_array* top_of_next_copy,
                    zone* before_zone, zone* after_zone);
BOOLEANn_from_phantom_arr_copy_cycles(int_array* top_of_next_copy,
                    int *n_cycles_ptr);
BOOLEANmake_normal_to_phantom_arr_copy(int i);
BOOLEANmake_downsample_from_phantom_arr_copy(int i,
                    zone* before_zone, zone* after_zone);
BOOLEANmake_normal_from_phantom_arr_copy(int i);
BOOLEANmake_upsample_from_phantom_arr_copy(int i,
                    zone* before_zone, zone* after_zone);
BOOLEANmake_to_phant_arr_ptr_resets(int_array* bottom_of_last_copy);
BOOLEANn_to_phant_arr_ptr_resets(int_array* bottom_of_last_copy,
                    int *n_cycles_ptr);
BOOLEANmake_to_phant_arr_ptr_reset(int i);
BOOLEANmake_fr_phant_arr_ptr_resets(int_array* top_of_next_copy);
BOOLEANn_fr_phant_arr_ptr_resets(int_array* top_of_next_copy,
                    int *n_cycles_ptr);
BOOLEANmake_fr_phant_arr_ptr_reset(int i);
BOOLEANlevel_for_latest_array(int i, int* level_ptr);
BOOLEANlevel_for_previous_array(int i, int level,
                    int* level_ptr);
void        set_in_repeat_code(){ in_repeat_code = TRUE; }
void        set_not_in_repeat_code(){in_repeat_code = FALSE; }
void        save_segment_boundary(instance* inst, int index);
instance* get_segment_boundary(int* index_ptr);
void        out_sample_period_msg(ostream& out);
BOOLEANadd_block_duration(string* prototype_name, instance*& inst_ptr);
```

```
};
// zone_schedule class
// determines the schedule for a decimated/interpolated time zone
class zone_schedule{
	schedulerthe_scheduler;// scheduler class to compute schedule
	zone*	master_zone;// original zone for signal input
	int		n_zones;	// total # of zones, including dec. & interp.
	zone_arrayzone_ptrs;// ptr to each zone for this scheduling
	long_arrayperiods;// sample period for each task
private:
	void	find_connected_zones();
	void	compute_sample_periods();
	BOOLEANset_scheduler_connections();
public:
	zone_schedule();
	~zone_schedule();
	BOOLEANcompute_schedule(zone* first_zone);
	int		get_n_zones(){ return n_zones; }
	long	get_task_firings_and_zone(int i, zone** zone_ptr_ptr)
				{ *zone_ptr_ptr = zone_ptrs[i];
				return the_scheduler.get_temporal_repeats(i); }
};
// zones class
class zones{
	zone_arraytimezones;
	int		first_sub_zone;// 1st # for sub-zones, which are at end
	long	gpio_reg_value;// configuration val for gpio register
public:
	zones();
	~zones();
	zone*	add_new_zone(string* name, BOOLEAN make_sub_zone);
	int		n_zones()	{ return first_sub_zone; }
	int		n_including_sub_zones()
				{ return timezones.size(); }
	BOOLEANidentify_zones(instance* this_inst, int* n_ptr);
	int		create_and_partition_zones(int* n_zones_ptr,
				int_array* n_gsps_ptr, double* exact_gsps_ptr);
	int		compute_zone_scheduler_repeats();
	int		create_time_zones(int* n_zones_ptr);
```

```
int                partition_created_time_zones(int_array* n_gsps_ptr,
                                double* exact_gsps_ptr);
int                initialize_port_registers();
int                initialize_all_fifo_info();
long         zone_mask(zone* z)
                                { return timezones[timezones.find(z)]->zone_mask(); }
int                decimation(zone* z)
                                {
                                int i = timezones.find(z);
                                if (timezones[i]->is_sub_zone())
                                return ((sub_zone*) timezones[i])->decimation();
                                else
                                return 1; }
string*      get_zone_name(int i)
                                { return timezones[i]->get_zone_name(); }
zone*        get_zone(int i){ return timezones[i]; }
int                find_zone(zone* z){ return timezones.find(z); }
zone*        add_zone_if_not_present(string* name);
int                n_segments(int i)
                                { return timezones[i]->n_segments(); }
long         cycles_used_in_seg(int i, int j)
                                { return timezones[i]->cycles_used_in_seg(j); }
long         max_cycles(int i)
                                { return timezones[i]->max_cycles(); }
long         overhead_allowed_for_in_seg(int i, int j)
                                { return timezones[i]->overhead_allowed_for_in_seg(j); }
zone*        make_sub_zone(zone* in_zone_ptr, long ratio,
                                BOOLEAN decimating);
BOOLEANzones_at_same_rate(zone* zone1, zone* zone2);
BOOLEANlater_zone(zone* zone1, zone* zone2);
BOOLEAN make_probe_fifo();
BOOLEANinit_idle_gsps();
BOOLEANtry_to_collapse_zones(zone* z1, zone* z2);
void         or_with_gpio_reg(long val) { gpio_reg_value |= val; }
};
// related function:
     long         compute_fifo_size(long depth);
     long         compute_probe_fifo_size(long depth);
#define FIRST_FLAG_NAME"_%port_0_flag"
```

```
// class to globally allocate the 24 "wait" flags
class flags{
      int_arrayallocated;          // non-zero for allocated flags
      int            first_flag_index;// wire index for first flag
public:
      flags();
      ~flags();
      BOOLEANallocate(int flag, int* wire, string** name);
      BOOLEANallocate_any(int* flag, int* wire, string** name);
};
// class to globally allocate the gpio and rts i/o bits
class io_bits{
      int_arrayallocated;          // non-zero for allocated bits
public:
      io_bits(){}
      ~io_bits(){}
      BOOLEANallocate(int bit)
            { if (allocated[bit]) return FALSE; else { allocated[bit] = TRUE;
                  return TRUE; } }
};
// class to globally allocate the GSPs
class gsps{
      int            next_gsp;  // next available gsp number
public:
      gsps();
      ~gsps();
      int            get_next_gsp()
                           { return next_gsp++; }
      int            current_gsp()
                           { return next_gsp; }
};
// zone1.cxx
// functions for zone class
// T. Montlick
// 1/29/90
// source code control:
static char SccsID[] = "@(#)zone1.cxx1.56 10/10/91";
#ifndef ZONE_DEF
#include "zone.hxx"
```

```
#endif
#undef DEBUG
//////////////////////////////////////////////////////////////////////
// wire_inputs class
//////////////////////////////////////////////////////////////////////
/*
This class handles processing input wires to a zone.
It keeps a list of wires which are pending for the zone, i.e., wires
which are needed as input to as yet unpartitioned blocks.
These wires must be kept around until no block requires them, so that
phantom wires will get created for each new time zone segment and any
block using this wire will get the correct sample in time for the wire.
A usage count is maintained of the number of block inputs using this wire.
When a block is processed, the appropriate usage counts are decremented.
When a usage count for a wire goes to zero, then that wire can be deleted
from the list of pending wires.
One exception is when a wire is part of a feedback loop. Then, it must
be kept around until the creation of the next segment. This assures that
a first level phantom exists for the wire (unit delayed with respect to the
original). This delayed output can now be used for feedback in a feedback
loop "fixup" pass.
*/
//////////////////////////////////////////////////////////////////////
//////////////////////////////////////////////////////////////////////
// wire_inputs::wire_inputs
// Constructor.
//////////////////////////////////////////////////////////////////////
wire_inputs::wire_inputs()
{}
//////////////////////////////////////////////////////////////////////
// wire_inputs::~wire_inputs
// Destructor.
//////////////////////////////////////////////////////////////////////
wire_inputs::~wire_inputs()
{}
//////////////////////////////////////////////////////////////////////
// wire_inputs::add_input
// Add wire and instance inputs, provided they are not already present.
//////////////////////////////////////////////////////////////////////
```

```
void wire_inputs::add_input(instance* inst, int wire){
	BOOLEANnew_wire = TRUE;
	int		i;
	for (i=0; i<pending_wires.size(); i++){
		if (pending_instances[i] == inst &&
			pending_wires[i] == wire)
		new_wire = FALSE;}
	if (new_wire){
		// wire not here, so add to end of arrays
		i = pending_wires.size();
		pending_instances[i] = inst;
		pending_wires[i] = wire;
#ifdef DEBUG
		string*	hier_name;
		hier_name = inst->prototype()->hier_storage_name_at_index(wire);
		cerr << "added pending input: " << *hier_name << "\n";
#endif
	}}
/////////////////////////////////////////////////////////////////////
// wire_inputs::remove_input
// Remove a set of inputs.
/////////////////////////////////////////////////////////////////////
void wire_inputs::remove_input(instance* inst, int wire){
	int		i;
	// scan pending inputs for this one
	for (i=0; i<pending_wires.size(); i++){
		if ( pending_instances[i] == inst
			&& pending_wires[i] == wire )
		{
			pending_instances.remove(i);
			pending_wires.remove(i);
		}
	}}
/////////////////////////////////////////////////////////////////////
// wire_inputs::add_wire_usage_count
// Add a usage count for a new wire and instance for the wire.
// If the wire and instance already existed, just update the count.
/////////////////////////////////////////////////////////////////////
void wire_inputs::add_wire_usage_count(instance* inst, int wire, int count){
```

```
    BOOLEANnew_wire = TRUE;
    int                 i, index;
    for (i=0; i<usage_wires.size(); i++){
          if (usage_instances[i] == inst &&
                  usage_wires[i] == wire)
          {
                  new_wire = FALSE;
                  index = i;
          }}
    if (new_wire){
          // wire not here, so add to end of arrays
          index = usage_wires.size();
          usage_instances[index] = inst;
          usage_wires[index] = wire;
          usage_loop_flags[index] = FALSE;
          usage_count[index] = 0;}
     usage_count[index] += count;}
/////////////////////////////////////////////////////////////////////
// wire_inputs::decrement_usage_count
// Decrement the usage count for a wire and instance for the wire.
// If the count goes to zero, remove the wire and instance,
// and return TRUE. If the count is currently zero, set a count of -1.
// This is to support feedback loops, where we can use a wire before it was
// generated.
/////////////////////////////////////////////////////////////////////
void wire_inputs::decrement_usage_count(instance* inst, int wire){
      int                 i;
      BOOLEANfound = FALSE;
      for (i=0; i<usage_wires.size(); i++){
            if (usage_instances[i] == inst &&
                    usage_wires[i] == wire)
            {
                    found = TRUE;
                    if (usage_count[i])
                          --usage_count[i];
                    if (usage_count[i] == 0)
                    {
                          // only remove if loop flag not set
                          if (!usage_loop_flags[i])
```

```
                    {
                              // remove the input since usage count is 0
                              remove_input(usage_instances[i], usage_wires[i]);
                    }
               }
               break;
          }}
     if (!found){
          // not found wire, so add it and set count of -1
          add_wire_usage_count(inst, wire, -1);
     }}
//////////////////////////////////////////////////////////////////////
// wire_inputs::test_usage_count
// Returns TRUE if wire has non-zero usage count.
//////////////////////////////////////////////////////////////////////
BOOLEAN wire_inputs::test_usage_count(instance* inst, int wire){
     BOOLEANfound = FALSE;
     int               i, index;
     for (i=0; i<usage_wires.size(); i++){
          if (usage_instances[i] == inst &&
               usage_wires[i] == wire)
          {
               found = TRUE;
               index = i;
          }}
     if (found)
          return (usage_count[index] > 0);
     else
          return FALSE;}
//////////////////////////////////////////////////////////////////////
// wire_inputs::set_wire_loop_flag
// Set the wire loop flag for a wire and instance of the wire.
//////////////////////////////////////////////////////////////////////
void wire_inputs::set_wire_loop_flag(instance* inst, int wire,
                              instance* output_inst, int output_io){
     BOOLEANnew_wire = TRUE;
     int               i, index;
     for (i=0; i<usage_wires.size(); i++){
          if (usage_instances[i] == inst &&
```

```
            usage_wires[i] == wire)
        {
            new_wire = FALSE;
            index = i;
        }}
    if (new_wire){
        // wire not here, so add to end of arrays
        index = usage_wires.size();
        usage_instances[index] = inst;
        usage_wires[index] = wire;
        usage_count[index] = 0;}
    usage_loop_flags[index] = TRUE;
    // remember who generated the loop wire
    loop_source_inst[index] = output_inst;
    loop_source_io[index] = output_io;}
////////////////////////////////////////////////////////////////////
// wire_inputs::test_wire_loop_flag
// Test the wire loop flag for a wire and instance of the wire.
////////////////////////////////////////////////////////////////////
BOOLEAN wire_inputs::test_wire_loop_flag(instance* inst, int wire){
    BOOLEANnew_wire = TRUE;
    int                 i, index;
    for (i=0; i<usage_wires.size(); i++){
        if (usage_instances[i] == inst &&
            usage_wires[i] == wire)
        {
            new_wire = FALSE;
            index = i;
        }}
    if (!new_wire)
        return usage_loop_flags[index];
    else
        return FALSE;}
////////////////////////////////////////////////////////////////////
// wire_inputs::free_loop_wires
// Clear any loop wires that are set, and delete them if the usage count is
// zero.
////////////////////////////////////////////////////////////////////
void wire_inputs::free_loop_wires(){
```

```
    int             i;
    for (i=0; i<usage_wires.size(); i++){
        if (usage_loop_flags[i])
        {
            usage_loop_flags[i] = FALSE;
            if (usage_count[i] == 0)
            {
                // usage count is zero
                // so delete wire as a pending wire input
                remove_input(usage_instances[i], usage_wires[i]);
            }
        }
    }}
//////////////////////////////////////////////////////////////////////
// wire_inputs::source_for_loop
// Return the instance which generated the given loop wire.
// Returns NULL if no such instance.
//////////////////////////////////////////////////////////////////////
instance* wire_inputs::source_for_loop(instance* inst, int wire){
    instance*return_val = (instance*) NULL;
    int             i;
    for (i=0; i<usage_wires.size(); i++){
        if (usage_instances[i] == inst &&
             usage_wires[i] == wire)
        {
            return_val = loop_source_inst[i];
        }}
    return return_val;}
//////////////////////////////////////////////////////////////////////
// operator+=
// Add another set of wire inputs to this set.
// Used when partitioning over multi-rate zones, this function
// adds partitioning state variables from one zone to the current zone.
//////////////////////////////////////////////////////////////////////
wire_inputs& wire_inputs::operator+=(wire_inputs& w){
    // Add his pending instances and wires to ours.
    // Don't calling our intelligent array classes to do the work with
    // there "+" (concatenation) operator because although this is nifty
    // we could have duplicate wires!
```

```
    // Add them individually using the add_input member function so that
    // no duplicates are added.
    for (int i=0; i<w.pending_wires.size(); i++)
        add_input(w.pending_instances[i], w.pending_wires[i]);
    return *this;}
//////////////////////////////////////////////////////////////////////
// ports class
//////////////////////////////////////////////////////////////////////
/*
The ports class is the base class for input and output ports connected to this
time zone.
It keeps port numbers, configuration parameters, and fifo information on
each port.
*/
//////////////////////////////////////////////////////////////////////
//////////////////////////////////////////////////////////////////////
// ports::ports
// Constructor.
//////////////////////////////////////////////////////////////////////
ports::ports()
{}
//////////////////////////////////////////////////////////////////////
// ports::~ports
// Destructor.
//////////////////////////////////////////////////////////////////////
ports::~ports()
{}
//////////////////////////////////////////////////////////////////////
// ports::set_port
// Set a port, consisting of a port number, and a config word for the port.
//////////////////////////////////////////////////////////////////////
void ports::set_port(int i, int port, int trigger, long config){
    port_nums[i] = port;
    triggers[i] = trigger;
    configurations[i] = config;}
//////////////////////////////////////////////////////////////////////
// ports::set_fifo
// Set info for a fifo: its hiearchical name, buffer length,
// and fifo depth.
```

```
//////////////////////////////////////////////////////////////////////
void ports::set_fifo(int i, string* fifo_name, int depth){
      fifo_names[i] = fifo_name;
      fifo_depth[i] = depth;}
//////////////////////////////////////////////////////////////////////
// in_ports class
//////////////////////////////////////////////////////////////////////
/*
This derived class of the ports class maintains a set of input ports for this
time zone.
It adds to the base class capabilities maintainance of input and output
pointers for fifos.
It also permits any inputs to be from compute lines, rather than serial
inputs, in which case fifos and port configuration parameters are not used.
*/
//////////////////////////////////////////////////////////////////////
//////////////////////////////////////////////////////////////////////
// in_ports::in_ports
// Constructor.
//////////////////////////////////////////////////////////////////////
in_ports::;in_ports()
{}
//////////////////////////////////////////////////////////////////////
// in_ports::~in_ports
// Destructor.
//////////////////////////////////////////////////////////////////////
in_ports::~in_ports()
{}
//////////////////////////////////////////////////////////////////////
// in_ports::set_in_port
////
//////////////////////////////////////////////////////////////////////
void in_ports::set_in_port(int i, int port, int trigger, long config,
                                    int fifo_ptr, instance* inst){
      set_port(i, port, trigger, config);
      input_fifo_in_ptrs[i] = fifo_ptr;
      input_fifo_in_inst[i] = inst;
      input_is_compute[i] = FALSE;}
//////////////////////////////////////////////////////////////////////
```

```
// in_ports::set_in_compute
////
////////////////////////////////////////////////////////////////////
void in_ports::set_in_compute(int i, int port){
      set_port(i, port, port, 0);
      input_is_compute[i] = TRUE;}
////////////////////////////////////////////////////////////////////
// in_ports::set_in_fifo
////////////////////////////////////////////////////////////////////
void in_ports::set_in_fifo(int i, string* fifo_name, int depth,
                              int out_ptr_index, instance* out_ptr_inst){
      set_fifo(i, fifo_name, depth);
      input_fifo_out_ptrs[i] = out_ptr_index;
      input_fifo_out_inst[i] = out_ptr_inst;}
////////////////////////////////////////////////////////////////////
// in_ports::add_input
// Add a new input port, consisting of a port number and a fifo pointer
// storage index in the top instance.
// Also add the configuration word for the port.
// Make sure a port is legal to add, making sure there is not already a compute
// line trigger for this time zone.
// Returns error code if the port was already allocated or already a compute
// line trigger.
////////////////////////////////////////////////////////////////////
BOOLEANin_ports::add_input_port(int port, int fifo_ptr, instance* inst,
               int trigger, long config, int entry_size){
      int          i;
      // scan pending inputs for this one
      for (i=0; i<size(); i++){
            if (which_port(i) == port)
            {
                  user_top_instance->out_error("ZON001", cerr, FALSE);
                  cerr << "Attempt to add a second port " << port <<".\n";
                  return FALSE;
            }
            // make sure there is not already a compute line with a trigger
            if (input_is_compute[i] && (which_port(i) != NO_TRIGGER))
            {
                  user_top_instance->out_error("ZON002", cerr, FALSE);
```

```
            cerr << "You cannot have both a port and a compute line "
                << "triggering a timezone.\n";
            return FALSE;
        }}
    // make sure this is a legal input port number
    if ((port < first_in_port) || (port >= (first_in_port+n_in_ports))){
            user_top_instance->out_error("ZON502", cerr, FALSE);
            cerr << "This SPROC chip has no input port " << port << ".\n";
            return FALSE;}
    // port not here, so add to end of arrays
    i = size();
    set_in_port(i, port, trigger, config, fifo_ptr, inst);
    set_fifo_buf_len(i, entry_size);
    return TRUE;}
/////////////////////////////////////////////////////////////////////
// in_ports::add_compute_input
// Add a new compute line input, consisting of a port number.
// Error if there is already another trigger, either a port or a compute
// input.
// Returns FALSE and output an error message we have other trigger.
/////////////////////////////////////////////////////////////////////
BOOLEANin_ports::add_compute_input(int port){
    int         i;
    // just check for conflict if trigger was specified
    if (port != NO_TRIGGER){
        for (i=0; i<size(); i++)
        {
            // its ok if this compute line was already allocated
            if (which_port(i) == port)
                ;
            // make sure there is not already a different compute line
            else if (which_port(i) != NO_TRIGGER)
            {
                if (input_is_compute[i])
                {
                        user_top_instance->out_error("ZON003", cerr, FALSE);
                cerr << "You cannot have more than one compute line triggering "
                        << "a timezone.\n";
                        return FALSE;
```

```
                }
                else
                {
                        user_top_instance->out_error("ZON004", cerr, FALSE);
                        cerr << "You cannot have both a port and a compute line "
                         << "triggering a timezone.\n";
                        return FALSE;
                }
            }
        }}
    // add new compute input port to end of arrays
    i = size();
    set_in_compute(i, port);
    return TRUE;}
////////////////////////////////////////////////////////////////////
// in_ports::fifo_in_ptr
// Return ptr and instance for the fifo in ptr.
////////////////////////////////////////////////////////////////////
void in_ports::fifo_in_ptr(int i, int* ptr, instance** inst){
    *ptr = input_fifo_in_ptrs[i];
    *inst = input_fifo_in_inst[i];}
////////////////////////////////////////////////////////////////////
// in_ports::fifo_out_ptr
// Return ptr and instance for the fifo out ptr.
////////////////////////////////////////////////////////////////////
void in_ports::fifo_out_ptr(int i, int* ptr, instance** inst){
    *ptr = input_fifo_out_ptrs[i];
    *inst = input_fifo_out_inst[i];}
////////////////////////////////////////////////////////////////////
// in_ports::add_in_port_inst
// Add the instance for the port for this input.
////////////////////////////////////////////////////////////////////
void in_ports::add_in_port_inst(instance* port_inst){
    int             i;
    // we lasted added a port, so get last added port inidex
    i = size() - 1;
    // call base class to record instance of this port
    set_port_instance(i, port_inst);}
////////////////////////////////////////////////////////////////////
```

```
// out_ports class
//////////////////////////////////////////////////////////////////////
/*
This derived class of the ports class maintains a set of output ports for this
time zone.
It adds to the base class capabilities maintainance of input
pointers for fifos, as well as the flags which trigger the reading of
the fifos by the serial ports.
It also hold information abount the wires which connect to the output ports.
*/
//////////////////////////////////////////////////////////////////////
//////////////////////////////////////////////////////////////////////
// out_ports::out_ports
// Constructor.
//////////////////////////////////////////////////////////////////////
out_ports::out_ports()
{}
//////////////////////////////////////////////////////////////////////
// out_ports::~out_ports
// Destructor.
//////////////////////////////////////////////////////////////////////
out_ports::~out_ports()
{}
//////////////////////////////////////////////////////////////////////
// out_ports::add_wire
// Add wire and instance outputs, whether or not already present.
// Also add the instance for the port for this output.
//////////////////////////////////////////////////////////////////////
void out_ports::add_wire(instance* inst, int wire, instance* port_inst){
	int			i;
	i = output_instances.size();
	output_instances[i] = inst;
	output_wires[i] = wire;
	// call base class to record instance of this port
	set_port_instance(i, port_inst);}
//////////////////////////////////////////////////////////////////////
// out_ports::add_output_port
// Add a new output port, consisting of a port number.
// Also add the config word for the port.
```

```
// An enable location index in the top instance for this port is derived and
// stored, too.
// Returns FALSE if error.
//////////////////////////////////////////////////////////////////////
BOOLEANout_ports::add_output_port(int port, int trigger, long config,
                                  int entry_size){
    int         i;
    string*     name;
    char*       port_num_str;
    int         index;
    // scan output ports for this one
    for (i=0; i<size(); i++){
        if (which_port(i) == port)
        {
            user_top_instance->out_error("ZON005", cerr, FALSE);
            cerr << "Attempt to add a second output " << port << ".\n";
            return FALSE;
        }}
    // port not here, so add to end of arrays
    i = size();
    set_port(i, port, trigger, config);
    set_fifo_buf_len(i, entry_size);
    // make sure this is a legal output port number
    if ((port < first_out_port) || (port >= (first_out_port+n_out_ports))){
            user_top_instance->out_error("ZON501", cerr, FALSE);
            cerr << "This SPROC chip has no output port " << port << ".\n";
            return FALSE;}
    // synthesize a name for the fifo enable location
    // get a C string for the port number
    port_num_str = int_to_c_string((int) (port - first_out_port));
    name = new string(OUT_PORT_ENABLE_STR);
    *name = *name + port_num_str;
    if (!top_instance->prototype()->look_up_storage_name(name, &index)){
        user_top_instance->out_error("ZON006", cerr, FALSE);
        cerr << "Couldn't find the output enable register named '"
             << *name
             << "'.\n"
             << "Is your 'init.sdl' file current?\n";
        return FALSE;}
```

```
        output_fifo_enable[i] = index;
        return TRUE;}
/////////////////////////////////////////////////////////////////////
// out_ports::set_out_fifo
// Set info for an output fifo: its hiearchical name, buffer length,
// and fifo depth. Also set fifo input ptr.
/////////////////////////////////////////////////////////////////////
void out_ports::set_out_fifo(int i, string* fifo_name,
                                        int depth, int ptr, instance* inst){
        set_fifo(i, fifo_name, depth);
        output_fifo_ptrs[i] = ptr;
        output_fifo_inst[i] = inst;}
/////////////////////////////////////////////////////////////////////
// out_ports::fifo_ptr
// Return ptr and instance for the fifo ptr.
/////////////////////////////////////////////////////////////////////
void out_ports::fifo_ptr(int i, int* ptr, instance** inst){
        *ptr = output_fifo_ptrs[i];
        *inst = output_fifo_inst[i];}
/////////////////////////////////////////////////////////////////////
// flags class
/////////////////////////////////////////////////////////////////////
/*
This class handles allocation of the 24 "wait" flags.
Either a specific flag or any available flag can be requested for allocation.
*/
/////////////////////////////////////////////////////////////////////

/////////////////////////////////////////////////////////////////////
// flags::flags
// Constructor.
/////////////////////////////////////////////////////////////////////
flags::flags(){
        string*         s;
        first_flag_index = 0;
        // record wire number in top level instance for first flag
        if (top_instance){
                s = new string(FIRST_FLAG_NAME);
                top_instance->prototype()->
```

```
                look_up_storage_name(s, &first_flag_index);
        delete s;
    }}
///////////////////////////////////////////////////////////////////////////
// flags::~flags
// Destructor.
///////////////////////////////////////////////////////////////////////////
flags::~flags()
{}
///////////////////////////////////////////////////////////////////////////
// flags::allocate
// Allocate the given flag, returning the wire index in top instance that
// the flag is in, plus the name of the flag.
// Flag numbers are in the range 0-23.
// Returns FALSE if the flag is not available.
///////////////////////////////////////////////////////////////////////////
BOOLEANflags::allocate(int flag, int* wire, string** name){
    // make sure we found the first flag
    if (!first_flag_index)
        return FALSE;
    // chekc for legal flag value & not already allocated
    if (flag < 0 || flag >= flag_locs)
        return FALSE;
    if (allocated[flag])
        return FALSE;
    // flag is available, so allocate it
    allocated[flag] = TRUE;
    // get its index in top level instance
    *wire = first_flag_index + flag;
    *name = top_instance->prototype()->storage_name_at_index(*wire);
    return TRUE;}
///////////////////////////////////////////////////////////////////////////
// flags::allocate_any
// Allocate any available flag, returning the wire index in top instance that
// the flag is in, plus the name of the flag.
// Flag numbers are in the range 0-23.
// Returns FALSE if no flag is available.
///////////////////////////////////////////////////////////////////////////
BOOLEANflags::allocate_any(int* flag, int* wire, string** name){
```

```
    int                 i;
    BOOLEANfound = FALSE;
    // find a free flag
    for (i=0; i< flag_locs; i++){
        if (!allocated[i])
        {
            found = TRUE;
            break;
        }}
    if (found){
        *flag = i;
        return allocate(i, wire, name);}
    else
        return FALSE;}
/////////////////////////////////////////////////////////////////////
// zone_inputs::zone_inputs
// Constructor.
/////////////////////////////////////////////////////////////////////
zone_inputs::zone_inputs(){
    compute_wait_inst = FALSE;}
/////////////////////////////////////////////////////////////////////
// zone_inputs::~zone_inputs
// Destructor.
/////////////////////////////////////////////////////////////////////
zone_inputs::~zone_inputs()
{}
/////////////////////////////////////////////////////////////////////
// zone_outputs::zone_outputs
// Constructor.
/////////////////////////////////////////////////////////////////////
zone_outputs::zone_outputs()
{}
/////////////////////////////////////////////////////////////////////
// zone_outputs::~zone_outputs
// Destructor.
/////////////////////////////////////////////////////////////////////
zone_outputs::~zone_outputs()
{}
/////////////////////////////////////////////////////////////////////
```

```
// zone_pending_wires::zone_pending_wires
// Constructor.
///////////////////////////////////////////////////////////////////////////
zone_pending_wires::zone_pending_wires()
{}
///////////////////////////////////////////////////////////////////////////
// zone_pending_wires::~zone_pending_wires
// Destructor.
///////////////////////////////////////////////////////////////////////////
zone_pending_wires::~zone_pending_wires()
{}
///////////////////////////////////////////////////////////////////////////
// sub_zone::sub_zone
// Constructor.
///////////////////////////////////////////////////////////////////////////
sub_zone::sub_zone(int zone_num, zones* zones_ptr) : zone(zone_num, zones_ptr){
      derived_from = (zone*) NULL;
      set_as_sub_zone();
      decimation_factor = 1;}
///////////////////////////////////////////////////////////////////////////
// sub_zone::~sub_zone
// Destructor.
///////////////////////////////////////////////////////////////////////////
sub_zone::~sub_zone()
{}
///////////////////////////////////////////////////////////////////////////
// zone_topology::zone_topology
// Constructor.
///////////////////////////////////////////////////////////////////////////
zone_topology::zone_topology()
{}
///////////////////////////////////////////////////////////////////////////
// zone_topology::~zone_topology
// Destructor.
///////////////////////////////////////////////////////////////////////////
zone_topology::~zone_topology()
{}
///////////////////////////////////////////////////////////////////////////
// zone class
```

```
/////////////////////////////////////////////////////////////////////
/*
This class supports partitioning and I/O for a time zone.
*/
/////////////////////////////////////////////////////////////////////
/////////////////////////////////////////////////////////////////////
// zone::zone
// Constructor.
/////////////////////////////////////////////////////////////////////
zone::zone(int zone_num, zones* zones_ptr){
        char  i_chars[ITOA_LIMIT];
        // store zone number & ptr to zones class instance which contains us
        zone_number = zone_num;
        zones_contained_in = zones_ptr;
        seg_number = 0;
        max_seg_cycles = MAX_SEG_CYCLES;
        seg_cycles_used[0] = 0;
        init_cycles = 0;
        derived =
        user_triggered =
        is_master = FALSE;
        repeat_count = 1;
        zone_flags_mask = 0L;
        // get string for "_zone_n"
        strcpy(zone_chars, ZONE_STR);
        itoa(zone_num, i_chars, 10);
        strcat(zone_chars, i_chars);
        // get string for "_seg_0"
        strcpy(seg_chars, SEG_STR);
        itoa(0, i_chars, 10);
        strcat(seg_chars, i_chars);
        zone_name = (string*) NULL;
        zone_rate = 0.0;
        forced_boundary = FALSE;
        do_compute_polling = FALSE;}
/////////////////////////////////////////////////////////////////////
// zone::~zone
// Destructor.
/////////////////////////////////////////////////////////////////////
```

```
zone::~zone()
{}
///////////////////////////////////////////////////////////////////////
// zone::bump_segment
// Advance the segment number, creating a new segment string.
///////////////////////////////////////////////////////////////////////
void zone::bump_segment(){
      char  i_chars[ITOA_LIMIT];
      // advance segment number and zero the cycles used
      seg_number++;
      seg_cycles_used[seg_number] = 0;
      // get string for "_seg_n"
      strcpy(seg_chars, SEG_STR);
      itoa(seg_number, i_chars, 10);
      strcat(seg_chars, i_chars);
      // clear the flag to force a new segment in case it was set
      clear_forced_flag(); }
///////////////////////////////////////////////////////////////////////
// zone::set_zone_name
// Sets the zone name. Returns FALSE if already set to something else.
///////////////////////////////////////////////////////////////////////
BOOLEANzone::set_zone_name(string* name){
      if (zone_name){
            if (*name == *zone_name)
                  return TRUE;
            else
                  return FALSE;}
      zone_name = name;
      return TRUE;}
///////////////////////////////////////////////////////////////////////
// zone::set_zone_rate
// Sets the zone rate, adjusting by the effective gsp rate. Returns FALSE
// if already set.
///////////////////////////////////////////////////////////////////////
BOOLEANzone::set_zone_rate(double rate, long gsp_rate){
      if (rate == 0.0)
            return TRUE;
      if (zone_rate){
            if (rate == zone_rate)
```

```
        return TRUE;
    else
        return FALSE;}
  zone_rate = rate;
  max_seg_cycles = (long) ((gsp_rate/zone_rate) * (1.0 - clock_error/100.0));
  return TRUE;}
////////////////////////////////////////////////////////////////////////
// process_zone_inputs
// Process the input blocks for this zone.
// Finds the input blocks creates necessary fifo info.
// Returns nonzero if error.
////////////////////////////////////////////////////////////////////////
int zone::process_zone_inputs(){
  instance*   top;
  int         status = 0;
  // initialize context to top block
  top_instance->push_context();
  // get ptr to our child, which is the user's top level block
  top = top_instance->get_child(users_top_block_index);
  // evaluate the inputs to this zone
  if (!status)
      status = evaluate_zone_inputs(top);
  top_instance->pop_context();
  return status;}
////////////////////////////////////////////////////////////////////////
// process_zone_outputs
// Process the output blocks for this zone.
// Finds the output blocks and creates necessary fifo info.
// Returns nonzero if error.
////////////////////////////////////////////////////////////////////////
int zone::process_zone_outputs(){
  instance*   top;
  int         status = 0;
  // initialize context to top block
  top_instance->push_context();
  // get ptr to our child, which is the user's top level block
  top = top_instance->get_child(users_top_block_index);
  // ditto for outputs
  if (!status)
```

```
        status = evaluate_zone_outputs(top);
    top_instance->pop_context();
    return status;}
////////////////////////////////////////////////////////////////////
// do_temporal_partition
// Called to do temporal partitioning for a zone.
// Returns nonzero if error.
////////////////////////////////////////////////////////////////////
int zone::do_temporal_partition(){
    string*         flag_string = new string("");
    BOOLEAN         dummy_1;
    int                     dummy_2;
    instance*   top;
    BOOLEAN         status = TRUE;
    temporal*   partitioning;// ptr to class to do partitioning
    int                     i;
    int                     child;
    // push top instance context on stack
    top_instance->push_context();
    // get the user's top level block
    top = user_top_instance;
    // copy sequence to partitioned sequence for top instance
    // which does not get done in partitioning
    for (i=0; i<top_instance->get_n_children(); i++){
        child = top_instance->get_sequence(i);
        top_instance->append_partitioned(child);}
    // see if we need to do compute line counter polling, and set up if yes
    status = analyze_compute_counter_polling();
    // create an object of the correct temporal partitioning class
    // depending on if we need to handle multiple sample rates
    if (is_master_zone())
        partitioning = new multi_temporal(this, top, flag_string);
    else
        partitioning = new temporal(this, top, flag_string);
    // create the zero'th segment, which is the extra segment for partitioning
    // which is inserted in instance which has first input to zone
    if (status)
        status = partitioning->find_input_and_create_segment_0();
    // do required initialization before we partition
```

```
	if (status)
		status = partitioning->init_for_partition();
	// do temporal partitioning for this zone
	if (status)
		status = partitioning->partition(&dummy_1, &dummy_2);
	// make sure zone has valid inputs
	if (status)
		status = partitioning->verify_inputs();
	// make sure output fifo blocks and zone finish blocks will fit in segment
	if (status)
		status = partitioning->verify_end_zone_fit();
	if (status)
		status = partitioning->add_output_fifo_info();
	// add phantoms at the end of the zone
	if (status)
		status = partitioning->make_zone_finish();
	if (status)
		status = partitioning->fixup_feedback_inputs(top);
	// done with partitioning class
	delete partitioning;
	// restore previous block context
	top_instance->pop_context();
	return (!status);}
////////////////////////////////////////////////////////////////////
// analyze_compute_counter_polling
// If this (first) zone gets decimated (has a non-unity repeat count)
// and gets a compute line input, then we must set up to poll this compute
// line periodically so we do not lose polls in the multi-period first segment.
// NOTE: This function cannot be properly supported by SPROC1 and so
// a fatal error message will be given.
////////////////////////////////////////////////////////////////////
BOOLEAN zone::analyze_compute_counter_polling(){
	int		i;
	int		compute_ctr_wire;
	BOOLEANstatus = TRUE;
	BOOLEANhas_serial_inputs = FALSE;
	string*	ctr_name;
	if (repeat_count > 1){
		// if there are serial inputs, no need to do compute line polling
```

```
for (i=0; i<inputs.size(); i++)
{
    if (!inputs.is_compute_input(i))
        has_serial_inputs = TRUE;
}
if (!has_serial_inputs)
{
    for (i=0; i<inputs.size(); i++)
    {
        if (inputs.is_compute_input(i))
        {
                // we found a compute input, so declare compute polling
                do_compute_polling = TRUE;
                // make the memory counter to keep track of # of computes

                // make the name
                ctr_name = new string(COMPUTE_CTR_STR);
                // add this counter location to top instance
                status = user_top_instance->add_phantom_storage_name(
                ctr_name, NULL, &compute_ctr_wire, 'i');
                // save counter location
                compute_ctr_inst = user_top_instance;
                compute_ctr_index = compute_ctr_wire;
                if (!status)
                {
                user_top_instance->out_error("ZON088", cerr, FALSE);
                cerr << "A phantom wire named '"
                 << *ctr_name << "' already exists!\n";
                }
                break;
        }
    }
}}
// if need to do compute line polling, issue error message
if (do_compute_polling){
    user_top_instance->out_error("ZON288", cerr, FALSE);
    cerr << "Decimation and/or interpolation without any "
    << "serial input is not\n supported by the SPROC chip.\n";
    status = FALSE;}
```

```
      return status;}
//////////////////////////////////////////////////////////////////////////
// fixup_feedback_inputs
// Scan the zone for any blocks containing feedback. If found, fix up
// the feedback inputs of their children so they use the first phantom for
// their wire, not the original wire.
// This assures that if the writer to the wire is in a different segment,
// he cannot overwrite the value that we want.
// This routine recursively calls itself for children.
//////////////////////////////////////////////////////////////////////////
BOOLEAN zone::fixup_feedback_inputs(instance* this_inst){
      BOOLEANstatus = TRUE;
      int            i, j;
      int            phantom_level;
      instance*child;
      hier_block*hier_ptr;
      instance*which_instance;
      int            which_wire;
      block*      prototype_ptr;
      block*      child_proto;
      block_ref*ref_ptr;
      int            input_seg, output_seg;
      instance*loop_source;
      // save current block context and set instance info in block
      this_inst->push_context();
      // save pointer to block prototype
      prototype_ptr = this_inst->prototype();
      if (prototype_ptr->is_leaf_block())
            ;
      else if (prototype_ptr->does_block_have_loops()){
            // save pointer to our prototype as a hier block pointer
            hier_ptr = (hier_block*) prototype_ptr;

            // we are hierarchical block, so call children
            for (i=0; i<this_inst->get_sequence_size(); i++)
            {
                  child = this_inst->get_child(i);
                  child_proto = child->prototype();
                  ref_ptr = hier_ptr->get_child_block_ref(i);
```

```
// ignore if no ref_ptr (could be phantom block)
if (ref_ptr != (block_ref*) NULL)
{
    // scan the child's I/O to see if any inputs are loop inputs
    for (j=0; j<child_proto->io_table_size(); j++)
    {
            if (!child_proto->io_is_output(j) && ref_ptr->is_loop_io(j))
            {
            // found a loop input!
            // point the loop input to the first phantom, if present
            if (child->get_wire_for_io(i, 1, &which_instance,
            &which_wire))
            phantom_level = 1;
            // no first phantom, so try original
            else if (child->get_wire_for_io(i, 0, &which_instance,
            &which_wire))
            phantom_level = 0;
            else
            {
            // no wire, so error!
            child->out_error("ZON901", cerr, FALSE);
            cerr << "INTERNAL ERROR -- Bad wire while "
             << "fixing up feedback inputs.\n";
            status = FALSE;
            break;
            }
            child->set_phantom_io_level(j, phantom_level);
            // get segment number for loop input
            input_seg = child->get_seg_number();
            // see who generated this loop wire
            // make sure to get original, not phantom
            child->get_wire_for_io(i, 0, &which_instance,
            &which_wire);
            loop_source = pending_wires.source_for_loop(
            which_instance, which_wire);
            if (loop_source)
            {
            // get seg number for loop output
            output_seg = loop_source->get_seg_number();
```

```
                // if not in same segment, output warning
                if (output_seg != input_seg)
                {
                child->out_warning("ZON008", cerr, TRUE);
                cerr << "This partitioning created "
                 << (output_seg - input_seg + 1)
                  << " unit delays to "
                 << "feedback loop input '"
                 << *child_proto->io_name_at_index(j)
                 << "'.\n";
                }
                }
                }
            }
        }
        // call routine recursively
        if (!status)
              status = fixup_feedback_inputs(child);

        // if error, get out
        if (!status)
              break;
    }}
  // restore previous block context
  this_inst->pop_context();
  return status;}
////////////////////////////////////////////////////////////////////////
// add_zone_input
// Call inputs class to add an input to the zone.
////////////////////////////////////////////////////////////////////////
BOOLEAN zone::add_zone_input(int port, int fifo_ptr,instance* inst,
                int trigger, long config, int entry_size)
{
  BOOLEANstatus = TRUE;
  status = inputs.add_input_port(port, fifo_ptr, inst, trigger, config,
                entry_size);
  return status;}
////////////////////////////////////////////////////////////////////////
// evaluate_zone_inputs
```

```
// Find the input blocks
// and evaluate the port info. Set the port info in our time zone, including
// the evaluated sample rate.
// Add the input blocks output wires to the list of pending input wires
// for the zone.
// If no errors, returns 0.
// If error, returns a value of ERROR_STATUS.
// If no inputs for partitioning, returns a value of NO_INPUTS.
////////////////////////////////////////////////////////////////////////
int     zone::evaluate_zone_inputs(instance* this_inst){
        int             i;
        int             n_inputs = 0;
        int             status = TRUE;
        int             no_inputs = FALSE;
        int             which_child;
        instance*child;
        int             zone_trigger = NO_TRIGGER;
        int             input_trigger;
        int             input_for_triggering = NO_TRIGGER;
        // save current block context and set instance info in block
        this_inst->push_context();
        for (i=0; i<this_inst->get_n_children(); i++){
                // get next child in sequence which is in this zone
                which_child = this_inst->get_sequence(i);
                child = this_inst->get_child(which_child);
                if (!(status = evaluate_child_zone_inputs(this_inst, which_child,
                                        child, &n_inputs)))
                        break;}
        // make sure we really found some inputs
        if (status){
                if (n_inputs == 0)
                {
                        if (this_inst->prototype()->is_autosequence())
                        {
                                this_inst->out_error("ZON009", cerr, FALSE);
                                cerr << "Your design has no inputs, so we cannot "
                                                << "partition.\n";
                                status = FALSE;
                        }
```

```
            no_inputs = TRUE;
        }
        else
        {
            // we have at least 1 input, so scan them, making sure there's
            // just one trigger source, and use this as the trigger for the
            // zone
            for (i=0; i<inputs.size(); i++)
            {
                input_trigger = inputs.get_trigger(i);
                if (input_trigger != NO_TRIGGER)
                {
                        // just allow one trigger source for a zone
                        if (zone_trigger != NO_TRIGGER
                         && zone_trigger != input_trigger)
                        {
//***
// For now, allow multiple triggers until we can accomodate another
// field in Orcad.
//                      this_inst->out_error("ZON010", cerr, FALSE);
//                       cerr << "You tried to declare more than one trigger "
//                       << "source for timezone '"
//                       << *zone_name << "'.\n";
//                      status = ERROR_STATUS;
//                      break;
//***

                        }
                        else
                        {
                        zone_trigger = input_trigger;
                        input_for_triggering = i;
                        }
                }
            }
            // if no triggers provided, use any port number available
            if (input_for_triggering == NO_TRIGGER)
            {
                for (i=0; i<inputs.size(); i++)
                {
```

```
                    if (!inputs.is_compute_input(i))
                    {
                    input_trigger = inputs.which_port(i);
                    if (input_trigger != NO_PORT)
                    {
                    input_for_triggering = i;
                    this_inst->out_warning("ZON011", cerr, FALSE);
                    cerr << "No explicit trigger for timezone '"
                     << *zone_name
                     << "' given, so port "
                     << input_trigger
                     << "will be used.\n\n";
                    break;
                    }
                    }
            }
        }
        // if trigger for zone, set it (will check for one later provided
        // this zone is not actually a decimated or interpolated one,
        // in which case it will get collapsed with the derived zone)
        if (input_for_triggering != NO_TRIGGER)
        {
            // user cell may have taken responsibility for trigger
            // so if so, just stick something into zone mask so we
            // know it is triggered
            if (zone_trigger != TRIGGER_INST_SUPPLIED)
                    set_zone_mask(get_wait_mask(input_for_triggering, FALSE));
            else
                    set_zone_user_triggered();
        }
    }}
// restore previous block context
this_inst->pop_context();
if (!status)
    return ERROR_STATUS;
else if (no_inputs)
    return NO_INPUTS;
else return 0;}
////////////////////////////////////////////////////////////////////////
```

```
// evaluate_child_zone_inputs
// Recursively evaluate all zone input info for children.
// Also process gpio and rts.
// Returns FALSE if error.
////////////////////////////////////////////////////////////////////
BOOLEAN zone::evaluate_child_zone_inputs(instance* parent, int which_child,
                                    instance* child, int* n_inputs_ptr){
    BOOLEANstatus = TRUE;
    int             which_grandchild;
    instance*grandchild;
    // save current block context and set instance info in block
    child->push_context();
    // evalute input if a sproc input and if labeled as being in our zone
    if (child->prototype()->is_sproc_input() && child->is_zone_present(this)){
        (*n_inputs_ptr)++;
        // evaluate port's timezone
        // this'sets the integer sample rate value for the zone
        status = evaluate_port_timezone(child);
        if (child->prototype()->is_serial_port())
        {
            // add input block's output wires to pending input wires
            if (status)
                status = modify_pending_in(which_child, parent);
            // evaluate input port and make an input fifo from it
            // also adding it to the time zone
            if (status)
                status = get_fifo_ptr_for_port(child, FALSE);
        }
        else
        {
            // input is a simple signal source, so add trigger to zone
            if (status)
                status = allocate_trigger_source(child);
        }
        // add input port instance to zone
        if (status)
            add_input_inst(child);}
    // take this opportunity to process gpios and rts', both
    // input and output
```

```
if (child->prototype()->has_gpio()){
        if (status)
        status = process_gpios(child);}
if (child->prototype()->has_rts()){
        if (status)
        status = process_rts(child);}
// recursively call ourself for children
if (status){
        for (int i=0; i<child->get_n_children(); i++)
        {
                // get next child in sequence which is in this zone
                which_grandchild = child->get_sequence(i);
                grandchild = child->get_child(which_grandchild);
                if (!(status = evaluate_child_zone_inputs(child,
                                which_grandchild, grandchild, n_inputs_ptr)))
                        break;
        }}
// restore previous block context
child->pop_context();
return status;}
//////////////////////////////////////////////////////////////////////
// evaluate_zone_outputs
// Find the output blocks,
// and evaluate the port info. Set the port info in our time zone, and
// output wires to the zone.
//////////////////////////////////////////////////////////////////////
int     zone::evaluate_zone_outputs(instance* this_inst){
        int             i;
        BOOLEANstatus = TRUE;
        int             which_child;
        instance*child;
        instance*which_instance;
        int             which_wire;
        // save current block context and set instance info in block
        this_inst->push_context();
        for (i=0; i<this_inst->get_n_children(); i++){
                // get next child in sequence which is in this zone
                which_child = this_inst->get_sequence(i);
                child = this_inst->get_child(which_child);
```

```
        if (child->is_zone_present(this))
        {
            if (child->prototype()->is_sproc_output())
            {
                // evaluate output port and allocate a fifo ptr for it
                status = get_fifo_ptr_for_port(child, TRUE);
                if (!status)
                        break;

                // get wire and instance for this output's input wire
                // we assume there's only one I/O and its an input
                if (!child->get_wire_for_io(0, 0, &which_instance,
                        &which_wire))
                {
                        child->out_error("ZON902", cerr, FALSE);
                        cerr << "INTERNAL ERROR -- Bad wire for "
                         << "output block.\n";
                        status = FALSE;
                        break;
                }
                add_output_wire_and_inst(which_instance, which_wire, child);
            }
        }}
    // restore previous block context
    this_inst->pop_context();
    return (!status);}
//////////////////////////////////////////////////////////////////////
// get_fifo_ptr_for_port
// This block is an input or output port, so get a fifo pointer for it.
// Get port info, and set it in the zone.
// Returns FALSE if error.
//////////////////////////////////////////////////////////////////////
BOOLEAN zone::get_fifo_ptr_for_port(instance* this_inst, BOOLEAN is_output){
    int             port_num;   // port characteristics:
    int             trigger;    // hardware trigger source
    long        config;         // configuration word
    int             entry_size; // fifo entry size
    int             flag_index;
    string*     name;
```

```
	BOOLEANstatus = TRUE;
	if (!evaluate_source_info(this_inst, &port_num, &trigger, &config,
				&entry_size))
		return FALSE;
	// allocate port's fifo flag
	if (!fifo_flags->allocate(port_num, &flag_index, &name)){
		this_inst->out_error("ZON013", cerr, TRUE);
		cerr << "Port "
			<< port_num
			<< " has already been used by another input block.\n";
		return FALSE;}
	// add new port #, info, and fifo ptr index to this zone
	if (is_output){
		if (!add_zone_output(port_num, trigger, config, entry_size))
			status = FALSE;}
	else{
		if (!add_zone_input(port_num, flag_index, top_instance, trigger,
				config, entry_size))
			status = FALSE;}
	return status;}
////////////////////////////////////////////////////////////////////////
// allocate_trigger_source
// This block is a signal source triggered by some trigger flag (or
// NO TRIGGER), so get its number.
// It could just refer to a timezone name, which should then be set for
// the timezone.
// Returns FALSE if error.
////////////////////////////////////////////////////////////////////////
BOOLEAN zone::allocate_trigger_source(instance* this_inst){
	int		port_number;
	int		trigger_source;// port characteristics (not used):
	long	config;		// configuration word
	int		entry_size; // fifo entry size
	BOOLEANstatus = TRUE;
	// there must be a timezone for a source
	if (!evaluate_timezone_name(this_inst))
		return FALSE;
	// get trigger source number
	if (!evaluate_source_info(this_inst, &port_number, &trigger_source,
```

```
		&config, &entry_size))
		return FALSE;
	// add the compute input (which could have an unspecified trigger) to the
	// zone
	status = add_zone_compute_input(trigger_source);
	return status;}
//////////////////////////////////////////////////////////////////////
// evaluate_port_timezone
// For this port block, evaluate the timezone and place it into our
// current zone class.
// Returns FALSE if this conflicts with another port's timezone.
//////////////////////////////////////////////////////////////////////
BOOLEANzone::evaluate_port_timezone(instance* this_inst){
	BOOLEANstatus = TRUE;
	expr*	name_expr;
	expr*	rate_expr;
	string*	name;
	double	rate;
	block*	prototype_ptr;
	zone*	zone_ptr;
	// assume we are working with current zone
	zone_ptr = this;
	prototype_ptr = this_inst->prototype();
	// save current block context and set instance info in block
	this_inst->push_context();
	// get timezone info
	if (status){
		if (!prototype_ptr->get_timezone(&name_expr, &rate_expr))
		{
			this_inst->out_error("ZON014", cerr, TRUE);
			cerr << "Serial port does not have a timezone!\n";
			status = FALSE;
		}}
	// evaluate the timezone name
	if (status){
		if (translate_zone_name(name_expr, this_inst, &name))
		{
			if (!set_zone_name(name))
			{
```

```
                // already a zone identified, so add a new one and identify
                // this block as in the zone
                zone_ptr = the_zones->add_zone_if_not_present(name);
                // mark the zone in the child input instance
                this_inst->add_zone(zone_ptr);
            }
        }
        else
        {
            this_inst->out_error("ZON016", cerr, TRUE);
            cerr << "Attempt to define a timezone without a valid name.\n";
            status = FALSE;
        }}
// evaluate the timezone rate
if (status){
        rate = real_value(rate_expr);
        if (rate < 0.0)
        {
            this_inst->out_error("ZON017", cerr, TRUE);
            cerr << "Illegal negative rate of "
                << rate << " for timezone '"
                << *name
                << "'.\n";
            status = FALSE;
        }
        // rate of 0 is ok because it means that some other source cell will set
        else if (rate == 0.0)
            ;
        else if(!zone_ptr->set_zone_rate(rate, chip_gsp_rate))
        {
            this_inst->out_error("ZON018", cerr, TRUE);
            cerr << "Attempt to redefine the rate of timezone '"
                << *name
                << "' from " << get_zone_rate()
                << " to " << rate
                << ".\n";
            status = FALSE;
        }}
// restore previous block context
```

```
    this_inst->pop_context();
    return status;}
///////////////////////////////////////////////////////////////////////
// evaluate_timezone_name
// For this port block, evaluate the timezone and place it into our
// current zone class.
// Returns FALSE if this conflicts with another port's timezone.
///////////////////////////////////////////////////////////////////////
BOOLEANzone::evaluate_timezone_name(instance* this_inst){
    BOOLEANstatus = TRUE;
    expr*       name_expr;
    expr*       rate_expr;
    string*     name;
    block*      prototype_ptr;
    prototype_ptr = this_inst->prototype();
    // save current block context and set instance info in block
    this_inst->push_context();
    // get timezone info
    if (status){
        if (!prototype_ptr->get_timezone(&name_expr, &rate_expr))
        {
            this_inst->out_error("ZON019", cerr, TRUE);
            cerr << "Source does not have a timezone!\n";
            status = FALSE;
        }}
    // evaluate the timezone name and set this as timezone name
    if (status){
        if (translate_zone_name(name_expr, this_inst, &name))
        {
            if (!set_zone_name(name))
            {
                this_inst->out_error("ZON020", cerr, TRUE);
                cerr << "You cannot name this timezone '"
                        << *name
                        << "' because it already\nhas the name '"
                        << *get_zone_name()
                        << "'.\n";
                status = FALSE;
            }
```

```
        }
        else
        {
              this_inst->out_error("ZON021", cerr, TRUE);
              cerr << "Source does not have a valid timezone name!\n";
              status = FALSE;
        }}
   // restore previous block context
   this_inst->pop_context();
   return status;}
///////////////////////////////////////////////////////////////////
// translate_zone_name
// Evaluate the zone name expression in the current instance context
// (which must be set) and return a ptr to the translated name if
// a name could be found. Otherwise return FALSE.
///////////////////////////////////////////////////////////////////
BOOLEAN translate_zone_name(expr* name_expr, instance* this_inst,
              string** name_ptr){
   block*     prototype_ptr;
   string*    name;
   prototype_ptr = this_inst->prototype();
   // zone name cannot evaluate to a real
   if (name_expr->is_real_valued())
         return FALSE;
   // it may be an integer
   if (name_expr->is_int_valued()){
         // is integer, so make a string from it
         int          dummy;
         name = new string(
                  int_to_c_string((int) name_expr->int_value(&dummy,&dummy)));
         *name_ptr = name;
         return TRUE;}
   // else it must translate to a string
   // get string for name expression
   if (name_expr->eval_to_symbol(&name)){
         // translate this string to a name expression, and evaluate
         if (name_expr = prototype_ptr->translation(name))
               name_expr->eval_to_symbol(&name);
         *name_ptr = name;
```

```
		return TRUE;}
	return FALSE;}
/////////////////////////////////////////////////////////////////////
// evaluate_source_info
// For this signal source block, evaluate the source number and trigger.
// Returns FALSE and output error if could not evaluate.
// If port number expression is NULL, then this is a serial port.
// If this block in a serial port, evaluate its configuration info.
/////////////////////////////////////////////////////////////////////
BOOLEANzone::evaluate_source_info(instance* this_inst, int* num, int* trigger,
					long* config, int* entry_size){
	BOOLEANstatus = TRUE;
	BOOLEANis_compute_line = FALSE;
	expr*		expr_ptr;
	int			trigger_num;
	int			port_num;
	block*		prototype_ptr;
	prototype_ptr = this_inst->prototype();
	// save current block context and set instance info in block
	this_inst->push_context();
	if (status){
		// see if port number is present
		// if not, this is a compute line
		expr_ptr = prototype_ptr->port_number_expr();
		if (expr_ptr == (expr*) NULL)
			is_compute_line = TRUE;
		else
		{
			if (!expr_ptr->has_int_value())
			{
				this_inst->out_error("ZON025", cerr, TRUE);
				cerr << "Illegal value of '"
						<< *expr_ptr
						<< "' for a port number.\n";
				status = FALSE;
			}
			else
			{
				port_num = (int) int_value(expr_ptr);
```

```
                *num = port_num;
            }
        }}
// get trigger source #
if (status){
        expr_ptr = prototype_ptr->trigger_source_expr();
        if (expr_ptr == (expr*) NULL)
        {
                this_inst->out_error("ZON022", cerr, TRUE);
                cerr << "Null trigger for this signal source block!\n";
                status = FALSE;
        }
        else if (!expr_ptr->has_int_value())
        {
                this_inst->out_error("ZON023", cerr, TRUE);
                cerr << "Trigger source has an illegal value of '"
                        << *expr_ptr
                        << "' for its port number.\n";
                status = FALSE;
        }}
// make sure trigger number is legal
if (status){
        trigger_num = (int) int_value(expr_ptr);
        *trigger = trigger_num;
        // allow triggers anywhere between first port and last compute line
        if (    (trigger_num >= first_serial_port &&
                        trigger_num <= last_compute_line) ||
                        trigger_num == NO_TRIGGER)
                ;
        // compute line number may also have special value indicating trigger
        // instance supplied by user
        else if ( !is_compute_line
                        || trigger_num != TRIGGER_INST_SUPPLIED )
        {
                this_inst->out_error("ZON024", cerr, TRUE);
                cerr << "Signal source has an illegal trigger number of "
                        << trigger_num
                        << ".\n";
                status = FALSE;
```

```
    }}
if (status){
    // if not compute line, check for legal value of part number
    if (is_compute_line)
        ;
    else if (port_num < first_serial_port || port_num > last_serial_port)
    {
        this_inst->out_error("ZON026", cerr, TRUE);
        cerr << "Serial port has an illegal value of '"
            << port_num
            << "' for its port number.\n";
        status = FALSE;
    }}
// get port configuration
if (status && !is_compute_line){
    expr_ptr = prototype_ptr->port_config_expr();
    if (!expr_ptr->has_int_value())
    {
        this_inst->out_error("ZON027", cerr, TRUE);
        cerr << "Serial port has an illegal configuration word of '"
            << *expr_ptr
            << "'.\n";
        status = FALSE;
    }}
if (status && !is_compute_line)
    *config = int_value(expr_ptr);
// get fifo entry size
if (status && !is_compute_line){
    expr_ptr = prototype_ptr->port_entry_size_expr();
    if (!expr_ptr->has_int_value())
    {
        this_inst->out_error("ZON097", cerr, TRUE);
        cerr << "Serial port has an illegal fifo entry size of '"
            << *expr_ptr
            << "'.\n";
        status = FALSE;
    }}
if (status && !is_compute_line)
    *entry_size = (int) int_value(expr_ptr);
```

```
    // restore previous block context
    this_inst->pop_context();
    return status;}
////////////////////////////////////////////////////////////////////////////
// process_gpios
// Allocate gpios for this block instance, verifying that the numbers
// are legal and have not been multiply allocated.
////////////////////////////////////////////////////////////////////////////
BOOLEANzone::process_gpios(instance* this_inst){
    BOOLEANstatus = TRUE;
    expr*       expr_ptr;
    int             num;
    block*      prototype_ptr;
    BOOLEANis_output;
    int             i;
    long        gpio_config_bits = 0;
    long        gpio_output_field;
    prototype_ptr = this_inst->prototype();
    // save current block context and set instance info in block
    this_inst->push_context();
    // scan for each gpio declared
    for (i=0; i<prototype_ptr->n_gpios(); i++){
        // get expression for gpio number
        expr_ptr = prototype_ptr->gpio_expr(i, &is_output);
        if (expr_ptr == (expr*) NULL)
        {
            this_inst->out_error("ZON022", cerr, TRUE);
            cerr << "Null gpio number for this instance!\n";
            status = FALSE;
            break;
        }
        else if (!expr_ptr->has_int_value())
        {
            this_inst->out_error("ZON023", cerr, TRUE);
            cerr << "Gpio has an illegal value of '"
                << *expr_ptr
                << "' for its number.\n";
            status = FALSE;
            break;
```

```
}
// make sure its a legal number
if (status)
{
	num = (int) int_value(expr_ptr);
	if (num >= 0 && num <= max_gpio_number)
		;
	else
	{
		this_inst->out_error("ZON024", cerr, TRUE);
		cerr << "Illegal gpio number of "
				<< num
				<< ".\n";
		status = FALSE;
		break;
	}
}
// allocate gpio number
if (!gpios->allocate(num))
{
	this_inst->out_error("ZON013", cerr, TRUE);
	cerr << "Gpio "
		<< num
		<< " has already been used by another block.\n";
	status = FALSE;
	break;
}
// set bit for direction of gpio if its an output
if (is_output)
{
	// get bit position for gpio #0
	if (get_config_constant(GPIO_OUTPUT_FIELD, &gpio_output_field))
	{
		status = FALSE;
		break;
	}
	// or-in bit in our copy of the gpio config register
	gpio_config_bits = 1;
	gpio_config_bits = gpio_config_bits << (num+gpio_output_field);
```

```
            get_zones_which_contains()->or_with_gpio_reg(gpio_config_bits);
        }}
    // restore previous block context
    this_inst->pop_context();
    return status;}
////////////////////////////////////////////////////////////////////
// process_rts
// Allocate rts' for this block instance, verifying that the numbers
// are legal and have not been multiply allocated.
////////////////////////////////////////////////////////////////////
BOOLEANzone::process_rts(instance* this_inst){
    BOOLEANstatus = TRUE;
    expr*       expr_ptr;
    int             num;
    block*      prototype_ptr;
    BOOLEANis_output;
    int             i;
    prototype_ptr = this_inst->prototype();
    // save current block context and set instance info in block
    this_inst->push_context();
    // scan for each rts declared
    for (i=0; i<prototype_ptr->n_rts(); i++){
        // get expression for gpio number
        expr_ptr = prototype_ptr->rts_expr(i, &is_output);
        if (expr_ptr == (expr*) NULL)
        {
            this_inst->out_error("ZON022", cerr, TRUE);
            cerr << "Null rts number for this instance!\n";
            status = FALSE;
            break;
        }
        else if (!expr_ptr->has_int_value())
        {
            this_inst->out_error("ZON023", cerr, TRUE);
            cerr << "Rts has an illegal value of '"
                << *expr_ptr
                << "' for its number.\n";
            status = FALSE;
            break;
```

```
        }
        // make sure its a legal number
        if (status)
        {
              num = (int) int_value(expr_ptr);
              if (num >= 0 && num <= max_rts_number)
                    ;
              else
              {
                    this_inst->out_error("ZON024", cerr, TRUE);
                    cerr << "Illegal rts number of "
                                << num
                                << ".\n";
                    status = FALSE;
                    break;
              }
        }
        // allocate rts number
        if (!rts->allocate(num))
        {
              this_inst->out_error("ZON013", cerr, TRUE);
              cerr << "Rts "
                    << num
                    << " has already been used by another block.\n";
              status = FALSE;
                    break;
        }}
    // restore previous block context
    this_inst->pop_context();
    return status;}
//////////////////////////////////////////////////////////////////////////
// get_port_setup
// get a value for the port setup for the given input or output port index.
//////////////////////////////////////////////////////////////////////////
long zone::get_port_setup(int i, BOOLEAN is_output){
    long        result;
    if (is_output)
          result = outputs.get_configuration(i);
    else
```

```
        result = inputs.get_configuration(i);
    return result;}
//////////////////////////////////////////////////////////////////////
// is_output_port_number
// Returns TRUE if the given port number is an output port.
//////////////////////////////////////////////////////////////////////
BOOLEAN is_output_port_number(int port_num){
    return (port_num >= first_out_port
                    && port_num < (first_out_port+n_out_ports));}
//////////////////////////////////////////////////////////////////////
// init_port
// Set initialization for the registers for a serial port.
//////////////////////////////////////////////////////////////////////
BOOLEAN zone::init_port(int port_num, int buf_len, int index_len,
                        string* fifo_name, long port_setup, int decim_count,
                        long enable, long wait_mask){

    string*     name;
    expr*       value;
    char*       port_num_str;
    BOOLEANis_output;
    // determine if input or output based on port number
    // and modify port number for creating register name
    if (is_output = is_output_port_number(port_num))
        port_num = (int) (port_num - first_out_port);
    else
        port_num = (int) (port_num - first_in_port);
    // get a C string for the port number
    port_num_str = int_to_c_string(port_num);
    // create name strings and value expressions and init the registers
    if (is_output){
        name = new string(OUT_PORT_BUF_LEN_STR);
        buf_len = index_len;}
    else
        name = new string(IN_PORT_BUF_LEN_STR);
    *name = *name + port_num_str;
    value = new expr((long) buf_len);
    if (!init_hardware_register(name, value))
        return FALSE;
    if (!is_output){
```

```
        name = new string(IN_PORT_FIFO_IX_STR);
        *name = *name + port_num_str;
        value = new expr((long) index_len);
        if (!init_hardware_register(name, value))
            return FALSE;}
    if (is_output)
        name = new string(OUT_PORT_FIFO_START_STR);
    else
        name = new string(IN_PORT_FIFO_START_STR);
    *name = *name + port_num_str;
    value = new expr(fifo_name);
    if (!init_hardware_register(name, value))
        return FALSE;
    if (is_output)
        name = new string(OUT_PORT_CONFIG_STR);
    else
        name = new string(IN_PORT_CONFIG_STR);
    *name = *name + port_num_str;
    value = new expr((long) port_setup);
    if (!init_hardware_register(name, value))
        return FALSE;
    if (is_output){
        name = new string(OUT_PORT_DECIMATION_STR);
        *name = *name + port_num_str;
        value = new expr((long) decim_count);
        if (!init_hardware_register(name, value))
            return FALSE;
        name = new string(OUT_PORT_ENABLE_STR);
        *name = *name + port_num_str;
        value = new expr((long) enable);
        if (!init_hardware_register(name, value))
            return FALSE;
        name = new string(OUT_PORT_WAIT_MASK_STR);
        *name = *name + port_num_str;
        value = new expr((long) wait_mask);
        if (!init_hardware_register(name, value))
            return FALSE;}
    return TRUE;}
//////////////////////////////////////////////////////////////////
```

```
// init_port_registers
// Set initialization for all port registers in use.
/////////////////////////////////////////////////////////////////
BOOLEAN zone::init_port_registers(){
	int		i;
	int		port_num;
	int		buf_len;
	int		index_len;
	string*	fifo_name;
	long	port_setup;
	int		decim_count;
	long	enable;
	long	wait_mask;
	BOOLEANis_output;
	string*	name;
	string*	value_name;
	expr*	value_expr;
	long	value;
	int		trigger;
	BOOLEANstatus = TRUE;
	// scan all inputs to zone
	is_output = FALSE;
	for (i=0; i<n_zone_inputs(); i++){
		// ignore compute lines
		if (!inputs.is_compute_input(i))
		{
			// get all config info
			port_num = inputs.which_port(i);
			// set buf_len at run-time so input port doesn't start on download
			buf_len = 0;
			index_len = 2;// index length is always 2 = double buffering
			// include user top block instance in fifo name!
			fifo_name = new string(USER_TOP_NAME);
			*fifo_name = *fifo_name + "." + *(inputs.fifo_name(i));
			port_setup = get_port_setup(i, is_output);
			wait_mask = 0;
			decim_count = 0;
			enable = 0;
			if (!init_port(port_num, buf_len, index_len, fifo_name,
```

```
                port_setup, decim_count, enable, wait_mask))
            {
                status = FALSE;
                break;
            }
        }}
    if (!status)
        return status;
    // scan all outputs from zone
    is_output = TRUE;
    for (i=0; i<n_zone_outputs(); i++){
        // get all config info
        port_num = outputs.which_port(i);
        buf_len = outputs.fifo_buf_length(i);
        // for output fifo, index is really fifo length!
        // make sure to add fudge factor to fix hardware - NOT ANYMORE!
//      index_len = outputs.fifo_size(i) + FIFO_SIZE_FUDGE;
        index_len = outputs.fifo_size(i);
        // include user top block instance in fifo name!
        fifo_name = new string(USER_TOP_NAME);
        *fifo_name = *fifo_name + "." + *(outputs.fifo_name(i));
        port_setup = get_port_setup(i, is_output);
        enable = 0;
        // set decimation factor, which is 1 for a master zone
        // but may be >1 for a subzone
        if (is_sub_zone())
            decim_count = ((sub_zone*) this)->decimation();
        else
            decim_count = 1;
        // get any trigger for the output port, else use input trigger for zone
        trigger = outputs.get_trigger(i);
        if (trigger != NO_TRIGGER)
            wait_mask = get_wait_mask(i, TRUE);
        else
            wait_mask = zone_mask();// trigger on mask for zone timing
        if (!init_port(port_num, buf_len, index_len, fifo_name,
            port_setup, decim_count, enable, wait_mask))
        {
            status = FALSE;
```

```
            break;
        }}
    // set default values for the port clock rates
    for (i=0; i<n_ports; i++){
        if (is_output = is_output_port_number(i))
            port_num = (int) (i - first_out_port);
        else
            port_num = (int) (i - first_in_port);
        if (is_output)
            name = new string(OUT_CLOCK_STR);
        else
            name = new string(IN_CLOCK_STR);
        *name = *name + int_to_c_string(port_num);
        // look up values supplied in io.sdf
        if (is_output)
            value_name = new string(OUT_CLOCK_VAL_STR);
        else
            value_name = new string(IN_CLOCK_VAL_STR);
        *value_name = *value_name + int_to_c_string(port_num);
        if (get_config_constant(*value_name, &value))
        {
            status = FALSE;
            break;
        }
        value_expr = new expr(value);
        if (!init_hardware_register(name, value_expr))
        {
            status = FALSE;
            break;
        }}
    return status;}
//////////////////////////////////////////////////////////////////////
// init_hardware_register
// Add the initialization for a hardware register with the given name.
// Called with an expression for the initialization;
//////////////////////////////////////////////////////////////////////
BOOLEAN zone::init_hardware_register(string* reg_name, expr* value){
    int         index;
    if (!top_instance->prototype()->look_up_storage_name(reg_name, &index)){
```

```
        user_top_instance->out_error("ZON036", cerr, FALSE);
        cerr << "Couldn't find the hardware register named '"
              << *reg_name
              << "' to do initialization.\n"
              << "Is your 'init.sdl' file current?\n";
        return FALSE;}
    top_instance->prototype()->add_storage_init(index, value);
    return TRUE;}
//////////////////////////////////////////////////////////////////////
// build_in_fifo_name
// Build the name string for input fifo i.
//////////////////////////////////////////////////////////////////////
string* zone::build_in_fifo_name(int i){
    string*     name;
    name = new string(true_zone_chars());
    *name = *name + IN_FIFO_STR + int_to_c_string(i);
    return name;}
//////////////////////////////////////////////////////////////////////
// build_in_fifo_out_ptr_name
// Build the name string for output ptr for input fifo i.
//////////////////////////////////////////////////////////////////////
string* zone::build_in_fifo_out_ptr_name(int i){
    string*     name;
    name = new string(true_zone_chars());
    *name = *name + IN_FIFO_STR + OUT_PTR_STR + SEPARATOR_STR
                              + int_to_c_string(i);
    return name;}
//////////////////////////////////////////////////////////////////////
// build_out_fifo_name
// Build the name string for output fifo i.
//////////////////////////////////////////////////////////////////////
string* zone::build_out_fifo_name(int i){
    string*     name;
    name = new string(true_zone_chars());
    *name = *name + OUT_FIFO_STR + int_to_c_string(i);
    return name;}
//////////////////////////////////////////////////////////////////////
// build_out_fifo_in_ptr_name
// Build the name string for input pointer to output fifo i.
```

```
////////////////////////////////////////////////////////////////////
string* zone::build_out_fifo_in_ptr_name(int i){
	string*	name;
	name = new string(true_zone_chars());
	*name = *name + OUT_FIFO_STR + IN_PTR_STR + SEPARATOR_STR
				+ int_to_c_string(i);
	return name;}
////////////////////////////////////////////////////////////////////
// get_in_fifo_buffer_size
// Get the size for input fifo i.
// If error, output msg and return 0.
////////////////////////////////////////////////////////////////////
int	zone::get_in_fifo_buffer_size(int i){
	instance*inst;
	block*	proto_ptr;
	int		wire;
	expr*	e;
	int		entry_size;
	// evaluate the fifo input buffer width
	inst = pending_instance(i);
	proto_ptr = inst->prototype();
	wire = pending_wire(i);
	e = proto_ptr->storage_entry_size(wire);
	if (e->has_int_value()){
		entry_size = (int) int_value(e);
		if (entry_size <= 0)
		{
			inst->out_error("ZON037", cerr, FALSE);
			cerr << "Input wire '"
				<< *proto_ptr->storage_name_at_index(wire)
				<< "' has an illegal width of "
				<< entry_size << ".\n";
			return 0;
		}
		else if (entry_size > 1)
		{
			inst->out_error("ZON038", cerr, FALSE);
			cerr << "Input wire '"
				<< *proto_ptr->storage_name_at_index(wire)
```

```
                << "' has a width of "
                << entry_size
                << ".\n Vector inputs are not yet supported.\n";
            return 0;
        }}
    else{
        inst->out_error("ZON039", cerr, FALSE);
        cerr << "Input wire '"
            << *proto_ptr->storage_name_at_index(wire)
            << "' has an unknown width.\n";
        return 0;}
    return entry_size;}
////////////////////////////////////////////////////////////////////
// get_out_fifo_buffer_size
// Get the size for output fifo i.
// If error, output msg and return 0.
////////////////////////////////////////////////////////////////////
int zone::get_out_fifo_buffer_size(int i){
    instance*inst;
    block*      proto_ptr;
    int             wire;
    expr*       e;
    int             entry_size;
    // evaluate the fifo input buffer width
    inst = output_instance(i);
    proto_ptr = inst->prototype();
    wire = output_wire(i);
    e = proto_ptr->storage_entry_size(wire);
    if (e->has_int_value()){
        entry_size = (int) int_value(e);
        if (entry_size <= 0)
        {
            inst->out_error("ZON040", cerr, FALSE);
            cerr << "Output wire '"
                << *proto_ptr->storage_name_at_index(wire)
                << "' has an illegal width of "
                << entry_size << ".\n";
            return 0;
        }
```

```
        else if (entry_size > 1)
        {
            inst->out_error("ZON041", cerr, FALSE);
            cerr << "Output wire '"
                << *proto_ptr->storage_name_at_index(wire)
                << "' has a width of "
                << entry_size
                << ".\n Vector inputs are not yet supported.\n";
            return 0;
        }}
    else{
        inst->out_error("ZON042", cerr, FALSE);
        cerr << "Output wire '"
            << *proto_ptr->storage_name_at_index(wire)
            << "' has an unknown width.\n";
        return 0;}
    return entry_size;}
//////////////////////////////////////////////////////////////////////
// make_phantom_wires
// Make a new level of phantom wire for each pending input.
// Returns FALSE if failed to make phantom wire.
//////////////////////////////////////////////////////////////////////
BOOLEAN zone::make_phantom_wires(){
    int             i;
    int             level;
    instance*inst;
    int             wire;
    int             index;
    int             new_index;
    string*     name;
    string*     new_name;
    BOOLEANstatus = TRUE;
    char        type;
    for (i=0; i<pending_size(); i++){
        inst = pending_instance(i);
        wire = pending_wire(i);
        // get wire index for last phantom for this wire
        index = inst->get_last_phantom(wire , &level);
        // get name of this wire, and type
```

```
        name = inst->prototype()->storage_name_at_index(index);
        type = inst->prototype()->get_storage_type(index);
        // prepend a "_" to the name for the new wire name
        new_name = new string("_");
        *new_name = *new_name + *name;
        // add this wire to the instance
        status = inst->add_phantom_storage_name(new_name, NULL, &new_index,
                                type);
        if (!status)
        {
              inst->out_error("ZON054", cerr, FALSE);
              cerr << "A phantom wire named '"
               << *new_name << "' already exists!\n";
              break;
        }
        // make a link from the previous wire to the new wire
        // also, duplicate any timezone for the wire to its phantom.
        inst->set_phantom_link_and_zone(index, new_index,
                                inst->get_zone_for_wire(index));}
  return status;}
/////////////////////////////////////////////////////////////////////////
// make_phantom_wires
// Make a new level of phantom wire for each pending input,
// but only if used in next code section.
// Returns FALSE if failed to make phantom wire.
/////////////////////////////////////////////////////////////////////////
BOOLEAN zone::make_phantom_wires(int_array* top_of_next_copy){
  int           i;
  int           level;
  instance*inst;
  int           wire;
  int           index;
  int           new_index;
  string*     name;
  string*     new_name;
  BOOLEANstatus = TRUE;
  char        type;
  for (i=0; i<pending_size(); i++){
        if ((*top_of_next_copy)[i] != NOTHING)
```

```
	{
		inst = pending_instance(i);
		wire = pending_wire(i);
		// get wire index for last phantom for this wire
		index = inst->get_last_phantom(wire , &level);

		// get name of this wire, and type
		name = inst->prototype()->storage_name_at_index(index);
		type = inst->prototype()->get_storage_type(index);
		// prepend a "_" to the name for the new wire name
		new_name = new string("_");
		*new_name = *new_name + *name;
		// add this wire to the instance
		status = inst->add_phantom_storage_name(new_name, NULL, &new_index,
				type);
		if (!status)
		{
			inst->out_error("ZON054", cerr, FALSE);
			cerr << "A phantom wire named '"
			 << *new_name << "' already exists!\n";
			break;
		}
		// make a link from the previous wire to the new wire
		// also, duplicate any timezone for the wire to its phantom.
		inst->set_phantom_link_and_zone(index, new_index,
				inst->get_zone_for_wire(index));
	}}
	return status;}
//////////////////////////////////////////////////////////////////////
// find_block
// Find a block prototype name.
// If not found, output an error message and return NULL, else return
// a pointer to the block.
//////////////////////////////////////////////////////////////////////
block*find_block(string* prototype_name){
	block*proto_ptr;
	if (!prototype_blocks.find(*prototype_name, &proto_ptr)){
		user_top_instance->out_error("ZON055", cerr, FALSE);
		cerr << "Unable to find '" << *prototype_name << "' block.\n"
```

```
            << "Is your 'init.sdl' file current?\n";
        return NULL;}
    return proto_ptr;}
////////////////////////////////////////////////////////////////////////
// seg_flag_name
// Return the name of the given segment flag. Names are kept in an array so
// that they don't have to be reconstructed.
////////////////////////////////////////////////////////////////////////
string* zone::seg_flag_name(int i){
    string*     name;
    if (seg_flag_names[i] == (string*) NULL){
        // build the segment name
        name = new string(get_zone_chars());
        *name = *name + SEG_STR + int_to_c_string(i);
        seg_flag_names[i] = name;}
    return seg_flag_names[i];}
////////////////////////////////////////////////////////////////////////
// make_segment_flag
// Make a new segment (turnstile) flag for the given zone and segment, in the
// current instance, and return its string.
// Also return the wire index for the flag in our instance.
// Returns NULL if could not make this flag.
////////////////////////////////////////////////////////////////////////
string* zone::make_segment_flag(int* index_ptr){
    string*     name;
    // get the segment name
    name = seg_flag_name(seg_num());
    // add this flag as a wire to the user's top instance so we can locate it
    // from anywhere!
    if (!user_top_instance->add_phantom_storage_name(name, NULL, index_ptr,
                                    'i')){
        user_top_instance->out_error("ZON056", cerr, FALSE);
        cerr << "A phantom wire named '"
         << *name << "' already exists!\n";
        name = NULL;}
    return name;}
////////////////////////////////////////////////////////////////////////
// loop_counter_name
// Return the name of the given loop counter.
```

```
////////////////////////////////////////////////////////////////////
string* zone::loop_counter_name(int i){
      string*      name;

      // build the loop counter name
      name = new string(get_zone_chars());
      *name = *name + LCOUNTER_STR + int_to_c_string(i);
      return name;}
////////////////////////////////////////////////////////////////////
// make_loop_counter
// Make a new loop counter for the given zone and segment, in the current
// instance, and return its string.
// Also return the wire index for the counter in our instance.
// Returns NULL if could not make this counter.
////////////////////////////////////////////////////////////////////
string* zone::make_loop_counter(int* index_ptr, instance** inst_ptr){
      string*      name;
      static inti=0;
      // get the next loop counter name
      name = loop_counter_name(i++);
      // add this counter as a wire to the user's top instance so we can locate it
      // from anywhere!
      if (!user_top_instance->add_phantom_storage_name(name, NULL, index_ptr,
                                    'i')){
            user_top_instance->out_error("ZON057", cerr, FALSE);
            cerr << "A phantom wire named '"
             << *name << "' already exists!\n";
            name = NULL;}
      // return instance for wire
      *inst_ptr = user_top_instance;
      // return the name
      return name;}
////////////////////////////////////////////////////////////////////
// modify_pending_in
// Call with the index of the child just processed in partitioning, this
// function adds pending inputs as required to the list of pending inputs,
// and removes any which are no longer needed.
// NOTE: If the child is a zone output, its input is left alone so that
// it will be copied until the end of the zone.
```

```
// Returns FALSE if error.
////////////////////////////////////////////////////////////////////////
BOOLEAN zone::modify_pending_in(int i, instance* this_inst){
	int		ii;
	instance*child;
	block*	prototype_ptr;
	hier_block*hier_ptr;
	block*	child_prototype;
	instance*which_instance;
	int		which_wire;
	block_ref*ref_ptr;
	zone*	wire_zone;
	BOOLEANalways_process;
	// add any new outputs to pending list
	child = this_inst->get_child(i);
	child_prototype = child->prototype();
#ifdef DEBUG
	cerr << "modifying pending in: "
		<< *child->hier_name_string()
		<< "\n";
#endif
	// always process all I/Os for an indivisible block
	always_process = child_prototype->is_indivisible_block();
	// save pointer to block prototype
	prototype_ptr = this_inst->prototype();
	// save pointer to our prototype as a hier block pointer
	hier_ptr = (hier_block*) prototype_ptr;
	ref_ptr = hier_ptr->get_child_block_ref(i);
	// if this is an output block, don't modify pending wires
	if (child_prototype->is_sproc_output())
		return TRUE;
	for (ii=0; ii<child->get_io_sizes_size(); ii++){
		// get wire and instance for next child I/O (original, not phantom)
		if (!child->get_wire_for_io(ii, 0, &which_instance, &which_wire))
		{
			child->out_error("ZON059", cerr, FALSE);
			cerr << "INTERNAL ERROR -- Bad input for partitioning\n";
			return FALSE;
		}
```

```
        // if higher level block, only process wire if it is in our zone!
        // process wire with no zone info because these are zone inputs
        wire_zone = which_instance->get_zone_for_wire(which_wire);
//      if ( (wire_zone == this) || (wire_zone == (zone*) NULL) )
        if ( (wire_zone == this) || always_process )
        {
            if (child_prototype->io_is_output(ii))
            {
                // child I/O is an output, so add to pending wires
                add_input(which_instance, which_wire);
#ifdef DEBUG
                cerr << "adding input "
                        << *which_instance->prototype()->
                        hier_storage_name_at_index(which_wire)
                        << "\n";
#endif
                // If the output is part of a loop, set the "wire loop flag"
                // for this wire.
                // This assures us of a phantom wire being created, which we
                // need for the input from the loop.
                // When we hit the next segment, clear all wire loop flags
                // that have been previously set.
                // ignore if no ref_ptr (could be phantom block)
                if (ref_ptr != (block_ref*) NULL)
                {
                        if (ref_ptr->is_loop_io(ii))
                        {
                        // found a loop input!
                        // set a loop flag for him, so the wire will stay around
                        // long enough for a phantom wire to be created which
                        //will provide a unit delay to the input
                        pending_wires.set_wire_loop_flag(which_instance,
                        which_wire, child, ii);
                        }
                }
            }
            else
            {
                // This child I/O is an input, so see if it uses one of our
```

```
                // wires.
                // The idea is to determine if he is the last
                // input which uses this wire or block input. If so,
                // he is removed from pending inputs list.
                pending_wires.decrement_usage_count(which_instance, which_wire);
#ifdef DEBUG
                cerr << "decrementing usage count for "
                        << *which_instance->prototype()->
                        hier_storage_name_at_index(which_wire)
                        << "\n";
#endif
            }
        }}
    return TRUE;}
////////////////////////////////////////////////////////////////////////
// get_wait_mask
// Returns the wait mask for the trigger of the given zone input.
////////////////////////////////////////////////////////////////////////
long zone::get_wait_mask(int i, BOOLEAN is_output){
    int             trigger_num;
    long        mask;
    // get port number for this input or output
    if (is_output)
        trigger_num = outputs.get_trigger(i);
    else
        trigger_num = inputs.get_trigger(i);
    // compute mask such that port 0 = 1, port 1 = 2, port 2 = 4, etc
    mask = 1;
    return (mask << trigger_num);}
////////////////////////////////////////////////////////////////////////
// get_gsp_count
// Returns the integer number of gsps required for this zone.
// Also returns an exact fractional count of the number of gsps required.
////////////////////////////////////////////////////////////////////////
int zone::get_gsp_count(double* fractional_count_ptr){
    int                     i;
    int                     segment_count;
    int                     gsp_count;
    double          exact;
```

```
    // get number of segments used
    segment_count = n_segments();
    // compute exact gsps by summing cycles in each segment
    exact = 0.0;
    for (i=0; i<=segment_count; i++)
        exact += cycles_used_in_seg(i);
    // divide by max cycles/zone to get fractional gsp count
    exact /= max_cycles();

    gsp_count = (int) (exact + 0.99999999);

    // return to info caller
    *fractional_count_ptr = exact;
    return gsp_count;}
//////////////////////////////////////////////////////////////////////
// original_zone
// Returns pointer to original zone (ourself), plus relative rate of 1.0.
// This function gets overloaded in derived sub_zone class.
//////////////////////////////////////////////////////////////////////
zone* zone::original_zone(double* rel_rate_ptr){
    *rel_rate_ptr = 1.0;
    return this;}
//////////////////////////////////////////////////////////////////////
// original_zone
// Same, but without relative rate.
// This function gets overloaded in derived sub_zone class.
//////////////////////////////////////////////////////////////////////
zone* zone::original_zone(){
    double      rel_rate;
    // ignore rate
    return original_zone(&rel_rate);}
//////////////////////////////////////////////////////////////////////
// operator+=
// Add another zone to this zone.
// Used when partitioning over multi-rate zones, this function
// adds partitioning state variables from one zone to the current zone.
//////////////////////////////////////////////////////////////////////
zone& zone::operator+=(zone& z){
    // add his pending wires to ours
```

```
    pending_wires += z.pending_wires;
    return *this;}
////////////////////////////////////////////////////////////////////
// original_zone
// Traces derived sub-zone back through chain of decimation/interpolation
// to its original zone. Returns a pointer to the original zone, plus
// the (floating point) sample rate of this zone relative to the original
// sample rate.
////////////////////////////////////////////////////////////////////
zone* sub_zone::original_zone(double* rel_rate_ptr){
    long        long_ratio;
    double      rel_rate = 1.0;
    zone*       zone_ptr;
    zone_ptr = this;
    while (zone_ptr->is_sub_zone()){
        long_ratio = ((sub_zone*) zone_ptr)->get_ratio();
        if (((sub_zone*) zone_ptr)->is_decimating())
            rel_rate /= long_ratio;
        else
            rel_rate *= long_ratio;
        zone_ptr = ((sub_zone*) zone_ptr)->derived_from_zone();}
    *rel_rate_ptr = rel_rate;
    return zone_ptr;}
////////////////////////////////////////////////////////////////////
// original_zone
// Same, but without relative rate.
////////////////////////////////////////////////////////////////////
zone* sub_zone::original_zone(){
    double      rel_rate;
    // ignore rate
    return original_zone(&rel_rate);}
// zone2.cxx
// functions for zone class
// T. Montlick
// 1/29/90
// source code control:
static char SccsID[] = "@(#)zone2a.cxx1.56 10/7/91";
#ifndef ZONE_DEF
#include "zone.hxx"
```

```
#endif
#undef DEBUG
#ifdef DEBUG
BOOLEANdebug;
#endif
// following should logically be in temporal class, but produces link error then
static int_hash phantom_usage(10);// usage count of phantom prototypes
////////////////////////////////////////////////////////////////////////
// temporal class
////////////////////////////////////////////////////////////////////////
/*
This class does temporal partitioning of an instance over a time zone.
Partitioning is done hierarchically, with temporary temporal objects
created from child instances.
The class scans the sequenced blocks and inserted required phantom blocks and
phantom storage to accomplish temporal partitioning at the given sample
rate.
*/
////////////////////////////////////////////////////////////////////////
// temporal::temporal
// Constructor.
////////////////////////////////////////////////////////////////////////
temporal::temporal(zone* z, instance* i, string* flag_s,
                                        zone* prev_z){
      NOREF(prev_z);// used by derived multi-temporal constructor
      this_zone = z;
      this_inst = i;
      flag_string = flag_s;
      adding_init = FALSE;
      is_multi_temporal = FALSE;}
////////////////////////////////////////////////////////////////////////
// temporal::~temporal
// Destructor.
////////////////////////////////////////////////////////////////////////
temporal::~temporal()
{}
////////////////////////////////////////////////////////////////////////
// partition
// Called recursively to do temporal partitioning for an instance.
```

```
// Passed pointers to a list of input wires, plus the corresponding
// instances which these wires are in. Also cycles used in segment so
// far and max cycles for a segment.
// This function automatically inserts phantom instances and phantom wires
// for all input wires to create extra segments.
// Returns FALSE for the variable "ok" if this is a leaf block and adding
// it would overfill the current segment.
//////////////////////////////////////////////////////////////////////
BOOLEAN temporal::partition(BOOLEAN* ok, int* duration_ptr){
    BOOLEANstatus = TRUE;
    int             i;
    int             which_child;
    instance*child;
    hier_block*hier_ptr;
    instance*which_instance;
    int             which_wire;
    int             count;
    BOOLEANchild_ok;
    block*     prototype_ptr;
    temporal*child_temporal;// ptr to class to do child partitioning
    int             duration;
    // save current block context and set instance info in block
    this_inst->push_context();
    // assume we won't overfill
    *ok = TRUE;
    // save pointer to block prototype
    prototype_ptr = this_inst->prototype();
    // Input wires are specified as a wire index in a parent, and a parent
    // instance pointer.
    // If we introduce a new segment, we must copy these input wires to
    // new phantom wires.
    // We can remove a wire from the input list only
    // if no other child block needs it. We determine this by keeping
    // our own copy of the input count for each wire (the number of inputs
    // from this wire), a decrementing that count when an input from the
    // wire is used. When the count goes to zero, we remove the wire from
    // the input list.
    // There is a similar count for child inputs from our block inputs.
    if (prototype_ptr->is_leaf_block()){
```

```
        // we leaf block, so see if adding us would bump to next segment
        if (*ok = add_this_block_duration(&duration))
        {
#ifdef DEBUG
            string*         hier_name;
            hier_name = this_inst->hier_name_string();
            cerr << "partitioned " << *hier_name << "\n";
#endif
            // child ok for this segment, so mark this for the instance
            this_inst->set_seg_number(this_zone->seg_num());
            // save last zone partitioned
            last_zone_for_partitioning = this_zone;
            // We must set all inputs to use phantom wires as necessary,
            // rather than ordinary wires that this block was compiled with.
            // We do this by getting the current "phantom level" for each
            // input, then recording this in the phantom_level array for
            // this instance.
            for (i=0; i<prototype_ptr->io_table_size(); i++)
            {
                if (!prototype_ptr->io_is_output(i))
                {
                        // get phantom level 0 wire info for this input
                        this_inst->get_wire_for_io(i, 0, &which_instance,
                        &which_wire);
                        // ask this instance current phantom level for wire
                        // and set as phantom I/O level
                        this_inst->set_phantom_io_level(i,
                        which_instance->get_phantom_wire_level(which_wire));
                }
            }
            // if this is a sproc output, must also make output fifo info
            // for it
            if (prototype_ptr->is_sproc_output())
                status = make_output_fifo();
            // ditto for sproc input
            else if (prototype_ptr->is_sproc_input())
                status = make_input_fifo();
        }
        // return block duration used/required
```

```
        *duration_ptr = duration;}
    // not a leaf block, so see if we are otherwise indivisible
    // and block will not fit in segment
    else if (prototype_ptr->is_indivisible_block()
            && !test_block_duration( (int) get_this_block_duration()))
        *ok = FALSE;// return "won't fit" status
    else{
        // save pointer to our prototype as a hier block pointer
        hier_ptr = (hier_block*) prototype_ptr;

        // make copy of wire usage counts from our prototype
        // first tally from ordinary wires
        for (i=0; i<prototype_ptr->storage_table_size(); i++)
        {
            count = hier_ptr->get_wire_use_count(i);
            this_zone->add_wire_usage_count(this_inst, i, count);
        }
        // next tally from this block's I/O (higher level blocks' wires)
        for (i=0; i<prototype_ptr->io_table_size(); i++)
        {
            count = hier_ptr->get_input_use_count(i);
            this_inst->get_wire_for_io(i, 0, &which_instance, &which_wire);
            this_zone->add_wire_usage_count(which_instance, which_wire, count);
        }
#ifdef DEBUG
        cerr << "checking children for zone " << *this_zone->get_zone_name()
         << "\n";
#endif
        // we are hierarchical block, so call children
        for (i=0; i<this_inst->get_sequence_size(); i++)
        {
            // get next child in sequence
            which_child = this_inst->get_sequence(i);
            child = this_inst->get_child(which_child);
            // process child only if he has our time zone
            if (child->needs_partitioning(this_zone))
            {
#ifdef DEBUG
                string*     h_name;
```

```
h_name = child->hier_name_string();
cerr << "trying to partition seq # " << i << ": "
        << *h_name << "\n";
#endif

// Create a temporal object from child in this scope
// so we can partition it.
// create an object of our type
if (is_multi_temporal)
        child_temporal = new multi_temporal(this_zone, child,
        flag_string);
else
        child_temporal = new temporal(this_zone, child,
        flag_string);
// call it, stopping if we need to create a new segment
status = child_temporal->temporal::partition(&child_ok,
        &duration);

// if error, get out
if (!status)
        break;
else if (!child_ok)
{
        // must create a new segment before this child
        status = create_new_segment(duration);
        if (!status)
        break;

        // call child again for the freshly added segment
        status = child_temporal->temporal::partition(&child_ok,
        &duration);
        // if error, get out
        if (!status)
        break;
        else if (!child_ok)
        {
        // swap instance so we can correctly get block
        // duration, which may be overloaded for decim/interp
        which_instance = this_inst;
        this_inst = child;
```

```
                    child->out_error("ZON007", cerr, TRUE);
                    cerr << "The sample rate is too high.\n";
                    out_sample_period_msg(cerr);
                    cerr << ", but this block needs\n"
                     << get_this_block_duration()
                     << " cycles and "
                     << (ending_overhead()
                    + this_zone->cycles_used())
                     << " phantom cycles are needed to finish "
                     << "the segment.\n";
                    status = FALSE;
                    this_inst = which_instance;
                    break;
                    }
        }
        // child has been processed, so dispense with inputs wires
        // as necessary, and add output wires
        status = this_zone->modify_pending_in(which_child, this_inst);
        if (!status)
                    break;
        // done with child partitioning object
        delete child_temporal;
        // append child to end of partitioned sequence
        this_inst->append_partitioned(which_child);
#ifdef DEBUG
        string*     hier_name;
        hier_name = child->hier_name_string();
        cerr << "Appending " << *hier_name
                    << " at position "
                    << this_inst->get_partitioned_size();
        hier_name = this_inst->hier_name_string();
        cerr << " of seq. for " << *hier_name
                    << "\n";
#endif
        // record last child partitioned in zone
        // but only if its a non-hierarchical block
        if (child->prototype()->is_indivisible_block())
                    this_zone->set_last_in_zone(this_inst, i);
        // record fact that child was partitioned in this zone
```

```
                child->set_partitioned(this_zone);
            }
        }}
    // restore previous block context
    this_inst->pop_context();
    return status;}
////////////////////////////////////////////////////////////////////////
// verify_end_zone_fit
// Verify that all the end of zone phantom blocks will fit in the current
// segment. Otherwise, create a new segment.
////////////////////////////////////////////////////////////////////////
BOOLEAN temporal::verify_end_zone_fit(){
    BOOLEANstatus = TRUE;
    int             duration = 0;// for compatibility with partitioning
    // save current block context and set instance info in block
    this_inst->push_context();
    if (!end_zone_fits())
        status = create_new_segment(duration);
    // restore previous block context
    this_inst->pop_context();
    return status;}
////////////////////////////////////////////////////////////////////////
// find_input_and_create_segment_0
// We must create the zero'th segment directly before the first input to the
// zone, so we must hierarchically scan for this input instance.
// Then call create_segment_0 to create the segment within this instance.
// Returns TRUE if segment created by ourselves or from recursive call.
////////////////////////////////////////////////////////////////////////
BOOLEANtemporal::find_input_and_create_segment_0(){
    block*      prototype_ptr;
    int             i;
    int             which_child;
    instance*child;
    BOOLEANstatus = FALSE;
    instance*previous_inst;
    // save current block context and set instance info in block
    this_inst->push_context();
    // call children
    for (i=0; i<this_inst->get_sequence_size(); i++){
```

```
            // get next child in sequence
            which_child = this_inst->get_sequence(i);
            child = this_inst->get_child(which_child);
            // process child only if he has our time zone & not found input yet
            if (child->is_zone_present(this_zone) && !status)
            {
                  // save pointer to child block prototype
                  prototype_ptr = child->prototype();
                  // if this child is sproc input, create the 0'th segment here
                  if (prototype_ptr->is_sproc_input())
                        status = create_segment_0();
                  // else call child if he is hierarchical
                  else if (!prototype_ptr->is_leaf_block())
                  {
                        // first set child instance as current one
                        previous_inst = this_inst;
                        this_inst = child;
                        status = find_input_and_create_segment_0();
                        this_inst = previous_inst;
                  }
            }}
      // restore previous block context
      this_inst->pop_context();
      return status;}
/////////////////////////////////////////////////////////////////////////////
// create_segment_0
// Segment 0 is created at the start of temporal partitioning.
// We must:
// 1. Create a label for loop back from the end of the time zone.
// 2. Create segment flag phantom wires for segments 0 and 1.
// 3. Instantiate a "_turnstile" block to wait for segment 1 free.
// 4. Instantiate a "_free_seg" block to free segment 0.
/////////////////////////////////////////////////////////////////////////////
BOOLEANtemporal::create_segment_0(){
      int               seg_index; // wire index for new segment
      string*     zeroth_flag_string;
      string*     first_flag_string;
      string*     label;
      BOOLEANstatus = TRUE;
```

```
//      // save current block context and set instance info in block
//      this_inst->push_context();
        // create the label for GSP loop back
        // tie it to the next instance, which will be a fifo or flag wait block
                label = new string(LOOP_STR);
                *label = *label + this_zone->get_zone_chars();
        // set this label (hierarchically named) in the temporal class
        loopback_label = new string("");
        *loopback_label = *loopback_label + *this_inst->hier_name_string()
                                                + "." + *label;
        if (!this_inst->add_phantom_label_name(label, this_inst->get_n_children())){
                this_inst->out_error("ZON032", cerr, TRUE);
                cerr << "The phantom label '" << *label << "' already exist!\n";
                status = FALSE;}
        // make a segment flag for the 0th segment
        if (status){
                zeroth_flag_string = this_zone->make_segment_flag(&seg_index);
                if (!zeroth_flag_string)
                        status = FALSE;}
        // make a segment flag for the first segment
        if (status){
                // turnstile code exists in 0'th segment, but account for it in first,
                // since we always have 0'th as an extra segment and it would not get
                // otherwise accounted for (we would not add a segment after the
                // first at the correct number of cycles).
                this_zone->bump_segment();
                first_flag_string = this_zone->make_segment_flag(&seg_index);
                if (!first_flag_string)
                        status = FALSE;}
        // instantiate a turnstile for the first segment
        if (status){
#ifdef DEBUG
                cerr << "making turnstile for zone "
                        << *this_zone->get_zone_name()
                        << "\n";
#endif
                if (!make_turnstile(first_flag_string, 1))
                        status = FALSE;}
        // we have now officially entered the first segment, so
```

```
        // instantiate a free_segment block for segment 0
        if (status){
                if (!make_free_segment(zeroth_flag_string))
                        status = FALSE;}
        // set contents of temporal class' flag string to first flag string
        if (status)
                *flag_string = *first_flag_string;
//      // restore previous block context
//      this_inst->pop_context();
        return status;}
//////////////////////////////////////////////////////////////////////
// init_for_partition
//////////////////////////////////////////////////////////////////////
BOOLEANtemporal::init_for_partition(){
        // insert a make probe reset block at the top of main loop
        if (!make_pr_reset_block())
                return FALSE;
        return TRUE;}
//////////////////////////////////////////////////////////////////////
// create_new_segment
// It was determined that a new segment should be added.
// We must:
// 1. Create a segment flag phantom wire for the new segment.
// 2. Instantiate a "_turnstile" block to end the current segment.
// 3. Create phantom wires for all pending inputs.
// 4. Instantiate "_copy" blocks to copy to these phantom wires.
// 5. Instantiate a "_free_seg" block.
//////////////////////////////////////////////////////////////////////
BOOLEANtemporal::create_new_segment(int duration){
        int             seg_index; // wire index for new segment
        string*         new_flag_string;
        NOREF(duration);
        // set overhead cycles we had to allow for in this segment
        this_zone->set_overhead_allowed_for(ending_overhead());
        // advance to next segment
        this_zone->bump_segment();
        // (1) create a new segment flag, and return its name
        new_flag_string = this_zone->make_segment_flag(&seg_index);
        if (!new_flag_string)
```

```
        return FALSE;
    // (2) instantiate a turnstile for this new segment
    if (!make_turnstile(new_flag_string, this_zone->seg_num()))
        return FALSE;
    // (3) create phantom wires for all pending inputs
    if (!this_zone->make_phantom_wires())
        return FALSE;
    // (4) instantiate copy blocks for wires
    if (!make_copy_blocks())
        return FALSE;
    // free any wires that are hanging around because they are loop inputs
    this_zone->free_pending_loop_wires();
    // (5) instantiate a free_segment block, passing current flag name
    if (!make_free_segment(flag_string))
        return FALSE;
    // set contents of temporal class' flag string to new flag string
    *flag_string = *new_flag_string;
    if (this_zone->cycles_used() > this_zone->max_cycles()){
        this_inst->out_error("ZON033", cerr, TRUE);
        cerr << "The sample rate is too high.\n";
        out_sample_period_msg(cerr);
        cerr << ", but "
            << this_zone->cycles_used()
            << " overhead cycles are required to create a new segment.\n";
        return FALSE;}
    return TRUE;}
////////////////////////////////////////////////////////////////////////
// out_sample_period_msg
// Output a msg giving the cycles in one sample period.
// Overloaded by multi-temporal class to output cycles in N sample periods
// for decimation/interpolation.
////////////////////////////////////////////////////////////////////////
void temporal::out_sample_period_msg(ostream& out){
    out << "One sample period provides "
        << this_zone->max_cycles()
        << " cycles";}
////////////////////////////////////////////////////////////////////////
// make_zone_finish
// Add the turnstile and jump blocks at the end of a zone.
```

```
// Called after the ending fifo blocks are instantiated.
//
////////////////////////////////////////////////////////////////////
BOOLEAN temporal::make_zone_finish(){
	string*	zeroth_seg_name;
	BOOLEANstatus = TRUE;
	int		n_segments;
	// save current block context and set instance info in block
	this_inst->push_context();
	// get # of segments partitioned
	n_segments = this_zone->seg_num();
	// get segment flag string for the 0th segment
	zeroth_seg_name = this_zone->seg_flag_name(0);
	// instantiate a turnstile to wait for the zeroth segment
	// but first advance to next segment
	this_zone->bump_segment();
	if (!make_turnstile(zeroth_seg_name, 0))
		status = FALSE;
	// instantiate a free_segment block, passing current flag name
	if (status){
		if (!make_free_segment(flag_string))
			status = FALSE;}
	if (status){
		if (!make_jump_block(loopback_label))
			status = FALSE;}
	if (status)
		status = generate_GSP_init_code(n_segments, zeroth_seg_name,
					loopback_label);
	// restore previous block context
	this_inst->pop_context();
	return status;}
////////////////////////////////////////////////////////////////////
// generate_GSP_init_code
// Create code to initialize each GSP, including initializing FIFO pointers.
////////////////////////////////////////////////////////////////////
BOOLEAN temporal::generate_GSP_init_code(int n_segments,
				string* zeroth_seg_name, string* loopback_label){
	int		n_gsps;
	double	dummy;
```

```
string*     label;
string*     seg_name;
instance*child;
int             i, j;
BOOLEANstatus = TRUE;
// generate the initialization code for each GSP
// set us in "adding init blocks" mode, so we do separate cycle
// accounting which doesn't count toward gsps or segment limit
adding_init = TRUE;
// get # of gsps required for this zone
n_gsps = this_zone->get_gsp_count(&dummy);
for (i=0; i<n_gsps; i++){
     // create the label
     label = new string(GSP_START_STR);
     // use next available GSP number, allocating this
     *label = *label + int_to_c_string(gsp_allocator->get_next_gsp());
     // tie it to the next child to be added
     if (!this_inst->add_phantom_label_name(label,
               this_inst->get_n_children()))
     {
          this_inst->out_error("ZON034", cerr, TRUE);
          cerr << "Phantom label '" << *label << "' already exist!\n";
          status = FALSE;
          break;
     }
     // create the code
     // First set the number of gsps as the initial value for segment 0
     // turnstile flag. This gets decremented by each successive gsp
     // so that the last one leaves it as zero, and the segment is
     // therefore free.
     if (!(status = make_copy_constant_block(zeroth_seg_name,(long) n_gsps)))
          break;
     // next init the rest of the segment flags to zero
     for (j=1; j<=n_segments; j++)
     {
          seg_name = this_zone->seg_flag_name(j);
          if (!(status = make_copy_constant_block(seg_name, (long) 0)))
               break;
     }
```

```
if (!status)
        break;
// set block as an init block for our info
// block is last child index
child = this_inst->get_child(this_inst->get_n_children()-1);
child->set_init();
// 0th GSP must init all fifo pointers
if (i == 0)
{
        if(!(status = init_input_fifo_ptrs()))
                break;
        if (!(status = init_output_fifo_ptrs()))
                break;

        // do run-time init of input port registers
        if (!(status = run_time_input_port_init()))
                break;
}
else
{
        // every other GSP must wait for its respective flag value
        // which is n_gsps-i
        if (!(status = make_wait_seg_flag_block(zeroth_seg_name,
                        (long) (n_gsps-i))))
                break;
        // set block as an init block
        child = this_inst->get_child(this_inst->get_n_children()-1);
        child->set_init();
}
// finally, initial jump to start of loop
if (!(status = make_jump_block(loopback_label)))
        break;

// set block as an init block
child = this_inst->get_child(this_inst->get_n_children()-1);
child->set_init();}
    return status;}
////////////////////////////////////////////////////////////////////////
// run_time_input_port_init
```

```
// Generate the code for the run-time portion of the input port initialization,
// i.e. initialization that should not be done via a static download.
////////////////////////////////////////////////////////////////////
BOOLEAN temporal::run_time_input_port_init(){
	int		buf_len;
	char*	port_num_str;
	string*	name;
	BOOLEANstatus = TRUE;
	instance*child;
	// scan all inputs to zone
	for (int j=0; j<this_zone->n_zone_inputs(); j++){
		// ignore compute lines
		if (!this_zone->is_compute_input(j))
		{
			// get fifo buffer length for run-time initialization
			buf_len = this_zone->input_fifo_buf_length(j);
			// name name string for the fifo buffer length port register
			name = new string(IN_PORT_BUF_LEN_STR);
			// get a C string for the port number
			port_num_str =
				int_to_c_string((int) (this_zone->which_input_port(j)
						-first_in_port));
			*name = *name + port_num_str;

			// instantiate block to set the fifo buffer length
			if (!(status = make_copy_constant_block(name, (long) buf_len)))
					break;
			// set block as an init block
			child = this_inst->get_child(this_inst->get_n_children()-1);
			child->set_init();
		}}
	return status;}
////////////////////////////////////////////////////////////////////
// init_input_fifo_ptrs
// Generate the initialization code to init the input fifo ptrs.
////////////////////////////////////////////////////////////////////
BOOLEAN temporal::init_input_fifo_ptrs(){
	int		fifo_size;
	string*	fifo_name;
```

```
BOOLEANstatus = TRUE;
int                ptr_index;
instance*ptr_inst;
instance*child;
// scan all inputs to zone
for (int j=0; j<this_zone->n_zone_inputs(); j++){
        // ignore compute lines
        if (!this_zone->is_compute_input(j))
        {
                fifo_size = this_zone->input_fifo_size(j);
                fifo_name = this_zone->input_fifo_name(j);
                if (fifo_name == (string*) NULL)
                {
                        user_top_instance->out_error("ZON903", cerr, FALSE);
                        cerr << "INTERNAL ERROR -- No input fifo "
                                        << "for zone input "
                                        << j << ".\n";
                        status = FALSE;
                        break;
                }
                // make copy fifo addr to input fifo input ptr
                this_zone->input_fifo_in_ptr(j, &ptr_index, &ptr_inst);
                if (!(status = make_copy_addr_block( fifo_size, fifo_name,
                                ptr_index, ptr_inst)))
                                break;
                // set block as an init block
                child = this_inst->get_child(this_inst->get_n_children()-1);
                child->set_init();
                // make copy to input fifo output ptr
                this_zone->input_fifo_out_ptr(j, &ptr_index,
                                &ptr_inst);
                if (!(status = make_copy_addr_block( fifo_size, fifo_name,
                                ptr_index, ptr_inst)))
                        break;
                // set block as an init block
                child = this_inst->get_child(this_inst->get_n_children()-1);
                child->set_init();
        }}
return status;}
```

```
////////////////////////////////////////////////////////////////////////
// init_output_fifo_ptrs
// Generate the initialization code to init the output fifo ptrs.
////////////////////////////////////////////////////////////////////////
BOOLEAN temporal::init_output_fifo_ptrs(){
    int             fifo_size;
    string*     fifo_name;
    BOOLEANstatus = TRUE;
    int             ptr_index;
    instance*ptr_inst;
    instance*child;
    // scan all outputs from zone
    for (int j=0; j<this_zone->n_zone_outputs(); j++){
        fifo_size = this_zone->output_fifo_size(j);
        fifo_name = this_zone->output_fifo_name(j);
        if (fifo_name == (string*) NULL)
        {
            user_top_instance->out_error("ZON904", cerr, FALSE);
            cerr << "INTERNAL ERROR -- No output fifo "
                << "for zone output "
                << j << ".\n";
            status = FALSE;
            break;
        }
        // make copy to output fifo ptr
        this_zone->output_fifo_ptr(j, &ptr_index, &ptr_inst);
        //zero cycles used so we don't get screwed up by init blocks
        if (!(status = make_copy_addr_block(fifo_size,
            fifo_name, ptr_index, ptr_inst)))
                break;
        // set block as an init block
        child = this_inst->get_child(this_inst->get_n_children()-1);
        child->set_init();}
    return status;}
////////////////////////////////////////////////////////////////////////
// make_input_fifo
// Makes an input fifo for the current input block instance.
// Also create buffer input pointers for each fifo.
// Also create buffer output pointers for each fifo.
```

```
// Returns FALSE if failed to make any fifo.
/////////////////////////////////////////////////////////////////////
BOOLEAN temporal::make_input_fifo(){
	int		i;
	string*	fifo_name;
	string*	out_ptr_name;
	BOOLEANstatus = TRUE;
	int		fifo_size;
	expr*	fifo_size_expr;
	int		entry_size;
	int		fifo_wire;
	int		out_ptr_wire;
	int		depth;
	// input fifo depth is repeat count for the zone
	depth = (int) this_zone->get_repeat_count();
	// find the fifo which corresponds to this port instance
	for (i=0; i<this_zone->n_zone_inputs(); i++){
		if (!status)
			break;
		if ( this_zone->input_port_instance(i) == this_inst)
		{
			// make fifo if not a compute line
			if (!this_zone->is_compute_input(i))
			{
				// get the fifo name
				fifo_name = this_zone->build_in_fifo_name(i);
				// get fifo entry size (buffer length) which we found when
				// we evaluated port info
				// we need this only to compute fifo size
				entry_size = this_zone->input_fifo_buf_length(i);
				// make a size expression for the fifo
				fifo_size = entry_size*depth*2;
				fifo_size_expr = new expr((long) fifo_size);
				// add this fifo to our top instance
				status = user_top_instance->add_phantom_storage_name(fifo_name,
						fifo_size_expr, &fifo_wire, 'f');
				if (!status)
				{
						this_inst->out_error("ZON043", cerr, FALSE);
```

```
                cerr << "A phantom wire named '"
                 << *fifo_name << "' already exists!\n";
                break;
            }
            // build the input fifo output ptr name
            out_ptr_name = this_zone->build_in_fifo_out_ptr_name(i);
            // add this to the top instance
            status = user_top_instance->
                add_phantom_storage_name(out_ptr_name,
                (expr*) NULL, &out_ptr_wire, 'h');
            if (!status)
            {
                this_inst->out_error("ZON044", cerr, FALSE);
                cerr << "A phantom wire named '"
                 << *out_ptr_name << "' already exists!\n";
                break;
            }
            // save this and other fifo info
            this_zone->set_zone_input_fifo(i, fifo_name, depth,
                out_ptr_wire, user_top_instance);
        }
        if (status)
            status = make_input_fifo_instance(i);
    }}
  return status;}
//////////////////////////////////////////////////////////////////////
// make_input_fifo_instance
// Instantiate the input fifo instance, or compute line instance.
// If no fifos or compute line inputs, report an error.
// Returns FALSE if error.
//////////////////////////////////////////////////////////////////////
BOOLEAN temporal::make_input_fifo_instance(int i){
  string*    fifo_name;
  BOOLEANstatus = TRUE;
  long       fifo_size;
  int            entry_size;
  instance*inst;
  int            out_ptr_wire;
  string*    out_ptr_name;
```

```
int             in_ptr_wire;
string*     in_ptr_name;
long        wait_mask;
int             depth;
instance*our_inst = this_inst;
if (this_zone->is_compute_input(i)){
        // compute line, so do special thing
        // make sure this is a real trigger number, that trigger instance
        // is not supplied by user, and that this the first compute wait
        // instance to instantiate
//      if (this_zone->which_input_port(i) != NO_TRIGGER
        if (!this_zone->is_user_triggered()
        && !this_zone->is_compute_wait_inst_set())
        {
//              // get mask for this compute line
//              wait_mask = this_zone->get_wait_mask(i, FALSE);
                // get input mask for this zone
                wait_mask = this_zone->zone_mask();
                // if we must do compute line polling, make special block
                if (this_zone->compute_polling())
                {
                        // (just need to do once)
                        if (compute_ctr_wait_mask == 0L)
                        {
                                intctr_index;
                                instance*ctr_inst;
                                compute_ctr_wait_mask = wait_mask;
                                ctr_index = this_zone->get_compute_ctr(&ctr_inst);
                                // make block at same level as us, so must
                                // pop up to parent
                                this_inst = this_inst->parent();
                                if (!make_wait_nonzero_compute_block(wait_mask,
                                ctr_inst, ctr_index))
                                status = FALSE;
                                this_inst = our_inst;
                        }
                }
                else
                {
```

```
                // instantiate a _wait_for_flags block
                this_inst = this_inst->parent();
#ifdef DEBUG
            string*         hier_name;
            hier_name = this_inst->hier_name_string();
            cerr << "making a wait for flags block in " << *hier_name <<"\n";
#endif
                if (!make_wait_for_flags_block(wait_mask))
                        status = FALSE;
                this_inst = our_inst;
                // record fact that we have instantiated a wait for
                // compute line instance so we don't accidentally make
                // another one
                this_zone->set_compute_wait_inst();
            }
        }}
    else{
        // input port
        // get size of one fifo buffer
        entry_size = this_zone->input_fifo_buf_length(i);
        // get depth of fifo
        depth = this_zone->input_fifo_depth(i);
        // compute size for the fifo
        fifo_size = (long) entry_size*depth*2;
        // get input fifo output ptr wire index, then name
        this_zone->input_fifo_out_ptr(i, &out_ptr_wire, &inst);
        out_ptr_name = inst->prototype()->
                        hier_storage_name_at_index(out_ptr_wire);
        // get input fifo input ptr wire index, then name
        this_zone->input_fifo_in_ptr(i, &in_ptr_wire, &inst);
        in_ptr_name = inst->prototype()->
                        hier_storage_name_at_index(in_ptr_wire);
        // get the fifo name
        fifo_name = this_zone->input_fifo_name(i);
        // now create the symbols required by this input block instance
        // create array of parameter expressions
        expr* param_vals[4];
        param_vals[0] = new expr(fifo_size);
        param_vals[1] = new expr(fifo_name);
```

```
        param_vals[2] = new expr(out_ptr_name);
        param_vals[3] = new expr(in_ptr_name);
        // static array of parameter names (no static string arrays allowed)
        static char* names_chars[] =
                { "fifo_size", "fifo", "out_ptr", "in_ptr"};
        string param_names[4];
        param_names[0] = names_chars[0];
        param_names[1] = names_chars[1];
        param_names[2] = names_chars[2];
        param_names[3] = names_chars[3];
        // add parameter names and expressions to override parameter
        if (!add_parameters(4, param_names, param_vals))
            status = FALSE;}
    return status;}
//////////////////////////////////////////////////////////////////////
// verify_inputs
// Make sure there are valid inputs from ports or compute lines.
// Returns FALSE if error.
//////////////////////////////////////////////////////////////////////
BOOLEAN temporal::verify_inputs(){
    int             i;
    BOOLEANstatus = TRUE;
    BOOLEANno_trigger = FALSE;
    int             inputs_count = 0;
    // first scan zone for any compute lines
    for (i=0; i<this_zone->n_zone_inputs(); i++){
        if (this_zone->is_compute_input(i))
        {
            // make sure this is a real trigger number
            if (this_zone->which_input_port(i) != NO_PORT)
                // tally this input
                inputs_count++;
            else
                no_trigger = TRUE;
        }
        else
            // tally this input
            inputs_count++;}
    // check for no inputs to zone
```

```
if (status && (inputs_count == 0)){
      if (no_trigger)
      {
            this_inst->out_error("ZON045", cerr, FALSE);
            cerr << "There is a signal source but no trigger for this"
                  << " block's time zone.\n";
      }
      else
      {
            this_inst->out_error("ZON046", cerr, FALSE);
            cerr << "This block's time zone has no signal source.\n";
      }
      status = FALSE;}
   return status;}
////////////////////////////////////////////////////////////////////////
// add_input_fifo_info
// When manually partitioning:
// Add input fifo info for each pending input.
// Returns FALSE if failed.
////////////////////////////////////////////////////////////////////////
BOOLEAN temporal::add_input_fifo_info(int depth){
   int               i;
   string*      name;
   BOOLEANstatus = TRUE;
   int               out_ptr_wire;
   for (i=0; i<this_zone->pending_size(); i++){
         // add the new fifo info to this zone
         // build the output ptr name
         name = this_zone->build_in_fifo_out_ptr_name(i);
         // look up its wire index
         if (!this_inst->prototype()->look_up_storage_name(name, &out_ptr_wire))
         {
               this_inst->out_error("ZON047", cerr, FALSE);
               cerr << "Unable to find the input fifo out ptr '"
                << *name << "'.\n";
               status = FALSE;
               break;
         }
         // get the fifo name
```

```
            name = this_zone->build_in_fifo_name(i);
            // save this and other fifo info
            this_zone->set_zone_input_fifo(i, name, depth, out_ptr_wire, this_inst);}
        return status;}
////////////////////////////////////////////////////////////////////////
// make_output_fifo
// Makes an output fifo for the current output block instance.
// Also create buffer input pointers for each fifo.
// Returns FALSE if failed to make the fifo.
////////////////////////////////////////////////////////////////////////
BOOLEAN temporal::make_output_fifo(){
        int             i;
        string*         fifo_name;
        string*         fifo_ptr_name;
        BOOLEANstatus = TRUE;
        long            fifo_size;
        expr*           fifo_size_expr;
        int                     entry_size;
        block*          proto_ptr;
        int                     fifo_wire;
        int                     in_ptr_wire;
        int                     depth;
        int                     dummy;
        string*         depth_symbol_name;
        expr*           depth_expr;
        double          exact_gsps;
        int                     out_enable;
        string*         enable_name;
        // depth of output fifos is # of gsps times repeat count for zone
        depth = this_zone->get_gsp_count(&exact_gsps);
        // make sure to count # of cycles that fifos will add
        exact_gsps +=
                    ((double) end_zone_cycles())/this_zone->max_cycles();
        depth = (int) ( (int) (exact_gsps + 0.99999999)
                                    * this_zone->get_repeat_count());
        depth_expr = new expr((long) depth);
        // find the fifo which corresponds to this port instance
        for (i=0; i<this_zone->n_zone_outputs(); i++){
            if (!status)
```

```
        break;
    if ( this_zone->output_port_instance(i) == this_inst)
    {
        // build the fifo name
        fifo_name = this_zone->build_out_fifo_name(i);
        // Add the symbol for the fifo depth, which is used by
        // add_output_fifo_info
        depth_symbol_name = new string("");
        *depth_symbol_name = *depth_symbol_name + *fifo_name + DEPTH_STR;
        // see if symbol exists as override in true top instance
        proto_ptr = top_instance->prototype();
        if (proto_ptr->look_up_symbol_name(depth_symbol_name, &depth_expr))
        {
            int dummy1, dummy2;
            depth = (int) depth_expr->int_value(&dummy1, &dummy2);
        }
        else
        {
            // put it in user top instance
            proto_ptr = user_top_instance->prototype();
            status = proto_ptr->add_symbol_name(depth_symbol_name, &dummy);
            if (status)
                    status = proto_ptr->add_expression_name(depth_symbol_name,
                    depth_expr);
            else
            {
                    if (proto_ptr->look_up_symbol_name(depth_symbol_name,
                    &depth_expr))
                    {
                    int dummy1, dummy2;
                    depth = (int) depth_expr->int_value(&dummy1, &dummy2);
                    }
            }
        }
        // make sure valid fifo depth, since user may have supplied it
        if (depth < 1)
        {
            this_inst->out_error("ZON077", cerr, FALSE);
            cerr << "Depth for fifo '" << *fifo_name << "' is "
```

```
        << depth << ", but it must be at least 1.\n";
        status = FALSE;
        break;
}
// get the output buffer width
if ((entry_size = this_zone->get_out_fifo_buffer_size(i)) == 0)
{
        status = FALSE;
        break;
}
// make a size expr. for the fifo
fifo_size = compute_fifo_size((long) entry_size*depth);
fifo_size_expr = new expr(fifo_size);

// add this fifo to our instance
status = user_top_instance->add_phantom_storage_name(fifo_name,
                fifo_size_expr, &fifo_wire, 'f');
if (!status)
{
        this_inst->out_error("ZON048", cerr, FALSE);
cerr << "Tried to create a second fifo named '"
        << *fifo_name << "'!\n";
        break;
}
// build the output fifo in ptr name
fifo_ptr_name = this_zone->build_out_fifo_in_ptr_name(i);
// add this to the top instance
status = user_top_instance->add_phantom_storage_name(fifo_ptr_name,
                (expr*) NULL, &in_ptr_wire, 'h');
if (!status)
{
        this_inst->out_error("ZON049", cerr, FALSE);
        cerr << "A phantom wire named '"
        << *fifo_ptr_name << "' already exists!\n";
        break;
}
// now create the symbols required by this output block instance
// the last name we need is for the output enable location
out_enable = this_zone->get_output_fifo_enable(i);
```

```
            enable_name = top_instance->prototype()->
                        hier_storage_name_at_index(out_enable);
            // create array of parameter expressions
            expr* param_vals[4];
            param_vals[0] = fifo_size_expr;
            param_vals[1] = new expr(fifo_name);
            param_vals[2] = new expr(fifo_ptr_name);
            param_vals[3] = new expr(enable_name);
            // static array of parameter names (no static string arrays allowed)
            static char* names_chars[] =
                        { "fifo_size", "fifo", "buffer_ptr", "sync_addr" };
            string param_names[4];
            param_names[0] = names_chars[0];
            param_names[1] = names_chars[1];
            param_names[2] = names_chars[2];
            param_names[3] = names_chars[3];
            // add parameter names and expressions to override parameter
            if (!add_parameters(4, param_names, param_vals))
            {
                status = FALSE;
                break;
            }
        }}
    return status;}
//////////////////////////////////////////////////////////////////////
// add_parameters
// Add parameter expressions by name to the current instance.
// Returns FALSE if failed.
//////////////////////////////////////////////////////////////////////
BOOLEAN temporal::add_parameters(int n_params, string param_names[],
                                expr* param_vals[]){
    int         i;
    expr_hash*parameters;
    int         dummy;
    BOOLEANstatus = TRUE;
    // get the hash table of expressions for the parameters
    parameters = this_inst->get_overrides();
    for (i=0; i<n_params; i++){
        // make sure this parameter name is present in prototype
```

```
		if (!this_inst->prototype()->look_up_param_name(param_names[i], &dummy))
		{
			status = FALSE;
			this_inst->out_error("ZON078", cerr, FALSE);
			cerr << "Block doesn't have a parameter named '" << param_names[i]
			<< "', which is required." << "\n Is your library current?\n";
		}
		else parameters->add(param_names[i], param_vals[i]);}
	return status;}
/////////////////////////////////////////////////////////////////////
// add_output_fifo_info
// Add output fifo info for each output.
// Returns FALSE if failed.
/////////////////////////////////////////////////////////////////////
BOOLEAN temporal::add_output_fifo_info(){
	int		i;
	string*	name;
	string*	depth_symbol_name;
	BOOLEANstatus = TRUE;
//	int		entry_size;
	int		in_ptr_wire;
	long	depth;
	// save current block context and set instance info in block
	this_inst->push_context();
	for (i=0; i<this_zone->n_zone_outputs(); i++){
		// add the new fifo info to this zone
//		// first get the buffer size for the fifo
//		if ((entry_size = this_zone->get_out_fifo_buffer_size(i)) == 0)
//		{
//			status = FALSE;
//			break;
//		}
		// build the output ptr name
		name = this_zone->build_out_fifo_in_ptr_name(i);
		// look up its wire index
		if (!this_inst->prototype()->look_up_storage_name(name, &in_ptr_wire))
		{
			this_inst->out_error("ZON052", cerr, FALSE);
			cerr << "Unable to find the output fifo in ptr '"
```

```
            << *name << "'.\n";
            status = FALSE;
            break;
        }
        // build the fifo name
        name = this_zone->build_out_fifo_name(i);
        // Look up the symbol for the fifo depth, which would have been
        // added automatically in partitioning, or supplied by the user
        // for a manual design.
        depth_symbol_name = new string("");
        *depth_symbol_name = *depth_symbol_name + *name + DEPTH_STR;
        if (get_user_config_constant(*depth_symbol_name, &depth))
        {
            status = FALSE;
            break;
        }
        // save this and other fifo info
        this_zone->set_zone_output_fifo(i, name, (int) depth,
                                in_ptr_wire, this_inst);}
    this_inst->pop_context();
    return status;}
//////////////////////////////////////////////////////////////////////
// make_phantom_instance
// Make a block instance within the current instance.
// Passed the block prototype name, this just creates and inserts the instance
// without dealing with I/O or parameters.
// Returns FALSE if failed.
//////////////////////////////////////////////////////////////////////
BOOLEAN temporal::make_phantom_instance(string* prototype_name,
                                instance** inst_ptr_ptr){
    string*     inst_name;
    int             inst_index;
    block*      proto_ptr;
    int             inst_number;
    BOOLEANstatus = TRUE;
    instance*inst_ptr;
    // look up ptr to block prototype
    if (!(proto_ptr = find_block(prototype_name)))
        return FALSE;
```

```
        // get the instantiation count of this phantom to used as unique number
        if (!phantom_usage.find(*prototype_name, &inst_number))
                inst_number = 0;
        // build the instance name
        inst_name = new string(this_zone->get_zone_chars());
        *inst_name = *inst_name + *prototype_name + SEPARATOR_STR
                                        + int_to_c_string(inst_number);
        // increment the instance number & record it
        phantom_usage.add(*prototype_name, ++inst_number);
        // get which index he will be in us
        inst_index = this_inst->get_n_children();
        // create the instance
        inst_ptr = new instance(proto_ptr, *inst_name, this_inst, inst_index);
        // phantoms are already partitioned
        inst_ptr->set_partitioned(this_zone);
        // add him to our children
        this_inst->add_new_child(inst_ptr);
        // insert this block at the end of the partitioned sequence
        this_inst->append_partitioned(inst_index);
#ifdef DEBUG
        string*     hier_name;
        hier_name = inst_ptr->hier_name_string();
        cerr << "Appending phantom " << *hier_name
                << " at position "
                << this_inst->get_partitioned_size();
        hier_name = this_inst->hier_name_string();
        cerr << " of seq. for " << *hier_name
                << "\n";
#endif
        // set fact that this block has phantom blocks
        this_inst->set_has_phantoms();
        // mark this zone for the instance
        inst_ptr->add_zone(this_zone);
        // return instance ptr
        *inst_ptr_ptr = inst_ptr;
        return status;}
////////////////////////////////////////////////////////////////////
// make_phantom_instance
// Make a block instance within the current instance.
```

```
// Inserts at a specific place rather than at end of partitioned sequence.
// Passed the block prototype name, this just creates and inserts the instance
// without dealing with I/O or parameters.
// Returns FALSE if failed.
/////////////////////////////////////////////////////////////////////
BOOLEAN temporal::make_phantom_instance(string* prototype_name,
                                        instance** inst_ptr_ptr, int insert_index){
      string*     inst_name;
      int               inst_index;
      block*      proto_ptr;
      int               inst_number;
      BOOLEANstatus = TRUE;
      instance*inst_ptr;
      // look up ptr to block prototype
      if (!(proto_ptr = find_block(prototype_name)))
            return FALSE;
      // get the instantiation count of this phantom to used as unique number
      if (!phantom_usage.find(*prototype_name, &inst_number))
            inst_number = 0;
      // build the instance name
      inst_name = new string(this_zone->get_zone_chars());
      *inst_name = *inst_name + *prototype_name + SEPARATOR_STR
                                    + int_to_c_string(inst_number);
      // increment the instance number & record it
      phantom_usage.add(*prototype_name, ++inst_number);
      // get which index he will be in us
      inst_index = this_inst->get_n_children();
      // create the instance
      inst_ptr = new instance(proto_ptr, *inst_name, this_inst, inst_index);
      // phantoms are already partitioned
      inst_ptr->set_partitioned(this_zone);
      // add him to our children
      this_inst->add_new_child(inst_ptr);
      // insert this block in the middle of the partitioned sequence
      this_inst->insert_partitioned(insert_index, inst_index);
#ifdef DEBUG
      string*     hier_name;
      hier_name = inst_ptr->hier_name_string();
      cerr << "Inserting phantom " << *hier_name
```

```
            << " at position "
            << insert_index;
        hier_name = this_inst->hier_name_string();
        cerr << " of seq. for " << *hier_name
            << "\n";
#endif
        // set fact that this block has phantom blocks
        this_inst->set_has_phantoms();
        // mark this zone for the instance
        inst_ptr->add_zone(this_zone);
        // return instance ptr
        *inst_ptr_ptr = inst_ptr;
        return status;}
//////////////////////////////////////////////////////////////////////
// make_phantom_inst_with_args
// Create a phantom instance, plus insert its I/O signals and parameters.
// I/O is specified by wire index plus a possible bypass parent instance
// (in case the connection is not actually from the parent but from someone
// higher up). Parameters are specified by name and expression.
// Returns FALSE if failed.
//////////////////////////////////////////////////////////////////////
BOOLEAN temporal::make_phantom_inst_with_args(char* block_name,
                int n_ios, int* io_wires, instance** io_instances,
                int n_params, expr** param_values, instance** inst_ptr_ptr){
        string*     prototype_name;
        instance*inst_ptr;
        block*      proto_ptr;          // ptr to block prototype
        expr_hash*parameters;
        string*     param_name;
        static intinst_number = 0;
        int                 i;
        // create name for block prototype
        prototype_name = new string(block_name);
        if (!make_phantom_instance(prototype_name, &inst_ptr))
                return FALSE;
        // iterate on I/O signals
        for (i=0; i<n_ios; i++){
                // set his I/O to point to given wire
                inst_ptr->set_io_to_wire_in_parent(i, io_wires[i]);
```

```
        // if there is a "bypass parent" instance, set it too
        if (io_instances != (instance**) NULL)
        {
              if (io_instances[i] != (instance*) NULL)
                    inst_ptr->set_bypass_parent(i, io_instances[i]);
        }}
  // next, iterate on parameters, if present
  if (n_params){
        // get ptr to block prototype, which we name for setting parameters
        proto_ptr = inst_ptr->prototype();
        // create a hash table of expressions for the parameters
        parameters = new expr_hash(n_params);
        for (i=0; i<n_params; i++)
        {
              // get parameter name for this parameter index
              // from the prototype (must of course specify parameters
              // in their declared order)
              param_name = proto_ptr->param_name_at_index(i);
              parameters->add(*param_name, param_values[i]);
        }
        // set parameter table as override symbol table for this instance
        inst_ptr->set_overrides(parameters);}
  // evaluate and add duration after everything added
  if (!add_block_duration(prototype_name, inst_ptr))
        return FALSE;
  // return instance ptr
  *inst_ptr_ptr = inst_ptr;
  return TRUE;}
////////////////////////////////////////////////////////////////////////
// make_phantom_inst_with_args
// Create a phantom instance, plus insert its I/O signals and parameters.
// Version which inserts in a specific place in partition sequence.
// I/O is specified by wire index plus a possible bypass parent instance
// (in case the connection is not actually from the parent but from someone
// higher up). Parameters are specified by name and expression.
// Returns FALSE if failed.
////////////////////////////////////////////////////////////////////////
BOOLEAN temporal::make_phantom_inst_with_args(char* block_name,
                int n_ios, int* io_wires, instance** io_instances,
```

```
        int n_params, expr** param_values, instance** inst_ptr_ptr,
        int insert_index){
string*     prototype_name;
instance*inst_ptr;
block*      proto_ptr;          // ptr to block prototype
expr_hash*parameters;
string*     param_name;
static intinst_number = 0;
int             i;
// create name for block prototype
prototype_name = new string(block_name);
if (!make_phantom_instance(prototype_name, &inst_ptr, insert_index))
    return FALSE;
// iterate on I/O signals
for (i=0; i<n_ios; i++){
    // set his I/O to point to given wire
    inst_ptr->set_io_to_wire_in_parent(i, io_wires[i]);
    // if there is a "bypass parent" instance, set it too
    if (io_instances != (instance**) NULL)
    {
        if (io_instances[i] != (instance*) NULL)
            inst_ptr->set_bypass_parent(i, io_instances[i]);
    }}
// next, iterate on parameters, if present
if (n_params){
    // get ptr to block prototype, which we name for setting parameters
    proto_ptr = inst_ptr->prototype();
    // create a hash table of expressions for the parameters
    parameters = new expr_hash(n_params);
    for (i=0; i<n_params; i++)
    {
        // get parameter name for this parameter index
        // from the prototype (must of course specify parameters
        // in their declared order)
        param_name = proto_ptr->param_name_at_index(i);
        parameters->add(*param_name, param_values[i]);
    }
    // set parameter table as override symbol table for this instance
    inst_ptr->set_overrides(parameters);}
```

```
    // evaluate and add duration after everything added
    if (!add_block_duration(prototype_name, inst_ptr))
        return FALSE;
    // return instance ptr
    *inst_ptr_ptr = inst_ptr;
    return TRUE; }
/////////////////////////////////////////////////////////////////////
// make_wait_for_flags_block
// Make a block to wait for flags for this GSP.
// Returns FALSE if failed.
/////////////////////////////////////////////////////////////////////
BOOLEAN temporal::make_wait_for_flags_block(long wait_mask){
    // create array of parameter expressions
    expr* param_vals[1];
    param_vals[0] = new expr(wait_mask);
    return make_phantom_inst_with_args(WAIT_FOR_FLAGS_STR, 0, (int*) NULL,
                                       (instance**) NULL, 1, param_vals); }
/////////////////////////////////////////////////////////////////////
// make_wait_nonzero_compute_block
// Make a block to wait for a non-zero compute count.
// Returns FALSE if failed.
/////////////////////////////////////////////////////////////////////
BOOLEAN temporal::make_wait_nonzero_compute_block(long wait_mask,
                                       instance* ctr_inst, int ctr_index){
    // create array of parameter expressions
    expr* param_vals[1];
    param_vals[0] = new expr(wait_mask);
    // create array of I/O wire indices
    int ios[1];
    ios[0] = ctr_index;
    // create array of I/O wire instance pointers
    instance* io_insts[1];
    io_insts[0] = ctr_inst;
    return make_phantom_inst_with_args(WAIT_NON0_COMP_STR, 1, ios,
                                       io_insts, 1, param_vals); }
/////////////////////////////////////////////////////////////////////
// make_poll_compute_block
// Make a block to poll compute count.
// Returns FALSE if failed.
```

```
////////////////////////////////////////////////////////////////////////
BOOLEAN temporal::make_poll_compute_block(long wait_mask,
                                  instance* ctr_inst, int ctr_index){
      // create array of parameter expressions
      expr* param_vals[1];
      param_vals[0] = new expr(wait_mask);
      // create array of I/O wire indices
      int ios[1];
      ios[0] = ctr_index;
      // create array of I/O wire instance pointers
      instance* io_insts[1];
      io_insts[0] = ctr_inst;
      return make_phantom_inst_with_args(POLL_COMP_STR, 1, ios,
                                  io_insts, 1, param_vals);}
////////////////////////////////////////////////////////////////////////
// make_jump_block
// Make a block to jump to the given address name.
// Returns FALSE if failed.
////////////////////////////////////////////////////////////////////////
BOOLEAN temporal::make_jump_block(string* addr_name){
      // create array of parameter expressions
      expr* param_vals[1];
      param_vals[0] = new expr(addr_name);
      return make_phantom_inst_with_args(JUMP_TO_STR, 0, (int*) NULL,
                                  (instance**) NULL, 1, param_vals);}
////////////////////////////////////////////////////////////////////////
// make_copy_constant_block
// Make a copy_constant block to initialize the given segment flag.
// The segment flag must exist before calling.
// Returns FALSE if failed.
////////////////////////////////////////////////////////////////////////
BOOLEAN temporal::make_copy_constant_block(string* flag_name, long constant){
      int              wire_index;
      instance*wire_instance;
      // locate segment flag for him
      if (!this_inst->find_wire_name(flag_name, &wire_index, &wire_instance)){
            this_inst->out_error("ZON906", cerr, FALSE);
            cerr << "INTERNAL ERROR -- Unable to find the location '"
                  << *flag_name << "'.\n";
```

```
        return FALSE;}
    // create array of I/O wire indices
    int ios[1];
    ios[0] = wire_index;
    // create array of I/O wire instance pointers
    instance* io_insts[1];
    io_insts[0] = (instance*) wire_instance;
    // create array of parameter expressions
    expr* param_vals[1];
    param_vals[0] = new expr(constant);
    return make_phantom_inst_with_args(COPY_CONSTANT_STR, 1, ios,
                                io_insts, 1, param_vals);}
////////////////////////////////////////////////////////////////////////
// make_copy_addr_block
// Make a copy_address block to copy an address to a pointer location.
// This is used to copy a fifo address to a fifo pointer.
// The address must exist before calling.
// Returns FALSE if failed.
////////////////////////////////////////////////////////////////////////
BOOLEAN temporal::make_copy_addr_block(int addr_size,
                                string* addr_name, int ptr_index, instance* ptr_inst){
    int             wire_index;
    instance*wire_instance;
    // locate address to copy
    if (!this_inst->find_wire_name(addr_name, &wire_index, &wire_instance)){
        this_inst->out_error("ZON907", cerr, FALSE);
        cerr << "INTERNAL ERROR -- Unable to find the fifo '"
            << *addr_name << "'.\n";
        return FALSE;}
    // create array of I/O wire indices
    int ios[2];
    ios[0] = wire_index;
    ios[1] = ptr_index;
    // create array of I/O wire instance pointers
    instance* io_insts[2];
    io_insts[0] = wire_instance;
    io_insts[1] = ptr_inst;
    // create array of parameter expressions
    expr* param_vals[1];
```

```
    param_vals[0] = new expr((long) addr_size);
    return make_phantom_inst_with_args(COPY_ADDRESS_STR, 2, ios,
                                       io_insts, 1, param_vals);}
////////////////////////////////////////////////////////////////////////
// make_init_arr_ptr_block
// Instantiate a "init_arr_ptr" block.
// Returns FALSE if failed.
////////////////////////////////////////////////////////////////////////
BOOLEAN temporal::make_init_arr_ptr_block(int addr_size, int addr_index,
                                   instance* addr_inst, int ptr_index, instance* ptr_inst){
    // create array of I/O wire indices
    int ios[2];
    ios[0] = addr_index;
    ios[1] = ptr_index;
    // create array of I/O wire instance pointers
    instance* io_insts[2];
    io_insts[0] = addr_inst;
    io_insts[1] = ptr_inst;
    // create array of parameter expressions
    expr* param_vals[1];
    param_vals[0] = new expr((long) addr_size);
    return make_phantom_inst_with_args(INIT_ARR_PTR_STR, 2, ios,
                                       io_insts, 1, param_vals);}
////////////////////////////////////////////////////////////////////////
// make_init_arr_ptr_block
// Instantiate a "init_arr_ptr" block.
// Version for insertion at a specific spot in partitioned sequence.
// Returns FALSE if failed.
////////////////////////////////////////////////////////////////////////
BOOLEAN temporal::make_init_arr_ptr_block(int addr_size, int addr_index,
                                   instance* addr_inst, int ptr_index, instance* ptr_inst,
                                   int place){
    instance*dummy_inst;
    // create array of I/O wire indices
    int ios[2];
    ios[0] = addr_index;
    ios[1] = ptr_index;
    // create array of I/O wire instance pointers
    instance* io_insts[2];
```

```
io_insts[0] = addr_inst;
io_insts[1] = ptr_inst;
// create array of parameter expressions
expr* param_vals[1];
param_vals[0] = new expr((long) addr_size);
return make_phantom_inst_with_args(INIT_ARR_PTR_STR, 2, ios,
                                   io_insts, 1, param_vals, &dummy_inst, place);}
/////////////////////////////////////////////////////////////////////////
// make_wait_seg_flag_block
// Make a wait_seg_flag block to wait for a value of the given segment flag.
// The segment flag must exist before calling.
// Returns FALSE if failed.
/////////////////////////////////////////////////////////////////////////
BOOLEAN temporal::make_wait_seg_flag_block(string* flag_name, long value){
      int          wire_index;
      instance*wire_instance;
      // locate segment flag for him
      if (!this_inst->find_wire_name(flag_name, &wire_index, &wire_instance)){
            this_inst->out_error("ZON908", cerr, FALSE);
            cerr << "INTERNAL ERROR -- Unable to find the segment flag '"
                  << *flag_name << "'.\n";
            return FALSE;}
      // create array of I/O wire indices
      int ios[1];
      ios[0] = wire_index;
      // create array of I/O wire instance pointers
      instance* io_insts[1];
      io_insts[0] = wire_instance;
      // create array of parameter expressions
      expr* param_vals[1];
      param_vals[0] = new expr(value);
      return make_phantom_inst_with_args(WAIT_SEG_FLAG_STR, 1, ios,
                                   io_insts, 1, param_vals);}
/////////////////////////////////////////////////////////////////////////
// make_pr_reset_block
// Make a block to copy to the given fifo from an output.
// Called after phantom wires have been created.
// Returns FALSE if failed.
/////////////////////////////////////////////////////////////////////////
```

```
BOOLEAN temporal::make_pr_reset_block(){
    // all block instances use the same probe signal, which we allocate
    static instance* probe_signal_inst = (instance*) NULL;
    static int                    probe_signal_index = 0;
    // if probe signal not allocated, create it
    if (probe_signal_inst == (instance*) NULL){
        string*      probe_signal_name;
        BOOLEANstatus;
        expr*        init_value_expr;
        probe_signal_inst = user_top_instance;
        probe_signal_name = new string(PR_SIGNAL_STR);
        // add this to the top instance
        status = user_top_instance->add_phantom_storage_name(probe_signal_name,
                            (expr*) NULL, &probe_signal_index, 'h');
        if (!status)
        {
            user_top_instance->out_error("ZON089", cerr, FALSE);
            cerr << "A phantom wire named '"
             << *probe_signal_name << "' already exists!\n";
            return status;
        }
        // set the initialization for the probe signal
        init_value_expr = new expr((long) PR_SIGNAL_INIT_VAL);
        user_top_instance->set_storage_override_init(probe_signal_index,
                            init_value_expr);}
    // create array of I/O wire indices
    int ios[1];
    ios[0] = probe_signal_index;
    // create array of I/O wire instance pointers
    instance* io_insts[1];
    io_insts[0] = probe_signal_inst;
    return make_phantom_inst_with_args(PR_RESET_STR, 1, ios, io_insts,
                            0, (expr**) NULL);}
/////////////////////////////////////////////////////////////////////////
// make_copy_blocks
// Make a copy block for each pending input.
// Called after phantom wires have been created.
// Returns FALSE if failed.
/////////////////////////////////////////////////////////////////////////
```

```
BOOLEAN temporal::make_copy_blocks(){
    int              i;
    BOOLEANstatus = TRUE;
    for (i=0; i<this_zone->pending_size(); i++){
        status = make_phantom_copy_block(i);
        if (!status)
            break;}
    return status;}
//////////////////////////////////////////////////////////////////////
// make_phantom_copy_block
// Make a copy block for the given pending input index.
// Called after phantom wires have been created.
// Returns FALSE if failed.
//////////////////////////////////////////////////////////////////////
BOOLEAN temporal::make_phantom_copy_block(int i){
    int              to_wire_level;
    int              from_wire_level;
    instance*inst;
    int              wire;
    int              wire_index;
    instance*inst_ptr;
    BOOLEANstatus = TRUE;
    // get instance and wire within instance for next pending wire
    inst = this_zone->pending_instance(i);
    wire = this_zone->pending_wire(i);
    // get last phantom level for wire, which is "to" wire level
    to_wire_level = inst->get_phantom_wire_level(wire);
    // if "to" level was the first level (0), there's nothing to do!
    if (to_wire_level > 0){
        // "from" wire is level before "to" wire
        from_wire_level = to_wire_level - 1;
        // get wire index for original wire
        wire_index = inst->get_phantom(wire , 0);
        // create array of I/O wire indices
        // which is same wire, but different phantom levels, as set below
        int ios[2];
        ios[0] = wire_index;
        ios[1] = wire_index;
        // create array of I/O wire instance pointers
```

```
        instance* io_insts[2];
        io_insts[0] = inst;
        io_insts[1] = inst;

        if (!make_phantom_inst_with_args(COPY_STR, 2, ios,
                                io_insts, 0, (expr**) NULL, &inst_ptr))
            status = FALSE;
        // set phantom levels for "from" and "to" wires
        inst_ptr->set_phantom_io_level(0, from_wire_level);
        inst_ptr->set_phantom_io_level(1, to_wire_level);}
    return status;}
//////////////////////////////////////////////////////////////////////
// make_turnstile
// Make a turnstile block for the given segment.
// The segment flag wire must exist before calling.
// Returns FALSE if failed.
//////////////////////////////////////////////////////////////////////
BOOLEAN temporal::make_turnstile(string* the_flag_string, int seg_number){
    int             wire_index;
    instance*wire_instance;
    static      string turnstile_string(TURNSTILE_STR);
    // set the phantom usage count to be the segment number so this
    // segment appears in this instance of the turnstile block
    phantom_usage.add(turnstile_string, seg_number);
    // locate segment flag for him
    if (!this_inst->find_wire_name(the_flag_string, &wire_index,&wire_instance)){
        this_inst->out_error("ZON909", cerr, FALSE);
        cerr << "INTERNAL ERROR -- Unable to find the segment flag '"
              << *the_flag_string << "'.\n";
        return FALSE;}
    // set his 1 I/O to point to the segment flag wire
    // create array of I/O wire indices
    int ios[1];
    ios[0] = wire_index;
    // create array of I/O wire instance pointers
    instance* io_insts[1];
    io_insts[0] = wire_instance;
    return make_phantom_inst_with_args(TURNSTILE_STR, 1, ios,
                                io_insts, 0, (expr**) NULL);}
```

```
////////////////////////////////////////////////////////////////////////////
// make_free_segment
// Make a free_segment block for the previous segment.
// The segment flag wire must exist before calling.
// Returns FALSE if failed.
////////////////////////////////////////////////////////////////////////////
BOOLEAN temporal::make_free_segment(string* flag_name){
      int               wire_index;
      instance*wire_instance;
      int               seg_number;
      static      string free_seg_string(FREE_SEG_STR);
      seg_number = this_zone->seg_num() - 1;
      // set the phantom usage count to be the segment number so this
      // segment number appears in the instance
      phantom_usage.add(free_seg_string, seg_number);
      // locate segment flag for him
      if (!this_inst->find_wire_name(flag_name, &wire_index, &wire_instance)){
            this_inst->out_error("ZON910", cerr, FALSE);
            cerr << "INTERNAL ERROR -- Unable to find the segment flag '"
                  << *flag_name << "'.\n";
            return FALSE;}
      // set his 1 I/O to point to the segment flag wire
      // create array of I/O wire indices
      int ios[1];
      ios[0] = wire_index;
      // create array of I/O wire instance pointers
      instance* io_insts[1];
      io_insts[0] = wire_instance;
      return make_phantom_inst_with_args(FREE_SEG_STR, 1, ios,
                                    io_insts, 0, (expr**) NULL);}

////////////////////////////////////////////////////////////////////////////
// ending_overhead
// Compute number of phantom block overhead cycles for ending the current
// segment.
// Exits if error.
////////////////////////////////////////////////////////////////////////////
int temporal::ending_overhead(){
      static int turnstile_cycles = UNKNOWN_DURATION;
```

```
static intcopy_cycles = UNKNOWN_DURATION;
static intfree_seg_cycles = UNKNOWN_DURATION;
int                 n_wires;
// if we don't have # of cycles for blocks, look them up
if (copy_cycles == UNKNOWN_DURATION)
      if ((copy_cycles = get_block_duration(COPY_STR))
             == UNKNOWN_DURATION)
            exit(1);
if (free_seg_cycles == UNKNOWN_DURATION)
      if ((free_seg_cycles = get_block_duration(FREE_SEG_STR))
             == UNKNOWN_DURATION)
            exit(1);
if (turnstile_cycles == UNKNOWN_DURATION)
      if ((turnstile_cycles = get_block_duration(TURNSTILE_STR))
             == UNKNOWN_DURATION)
            exit(1);
n_wires = this_zone->pending_size();
return free_seg_cycles + (copy_cycles*n_wires) + turnstile_cycles;}
//////////////////////////////////////////////////////////////////////
// add_this_block_duration
// Try to add the current block's duration to this zone. If it would
// overfill the zone, don't add it and return FALSE.
//////////////////////////////////////////////////////////////////////
BOOLEAN temporal::add_this_block_duration(int* dur_ptr){
      long          this_duration;
      // call our member function to get block duration
      this_duration = get_this_block_duration();
      *dur_ptr = (int) this_duration;
      // if we are in "adding init blocks" mode, tally cycles separately
      if (adding_init)
            this_zone->add_init_cycles(this_duration);
      else{
      // test if blocks will fit, or if signal from above to force
      // a new zone boundary
            if ( test_block_duration(*dur_ptr) && !this_zone->boundary_forced() )
            {
                  // ok, so add this block to current segment
                  this_zone->add_cycles(this_duration);
                  return TRUE;
```

```
        }
        else
            return FALSE;}
    return TRUE;}
////////////////////////////////////////////////////////////////////
// test_block_duration
// Test if the given duration will fit in this zone. If it would
// overfill the zone, return FALSE.
////////////////////////////////////////////////////////////////////
BOOLEAN temporal::test_block_duration(int duration){
    int             overhead_cycles;
    overhead_cycles = ending_overhead();
    // test if blocks will fit
    if ( (this_zone->cycles_used() + duration
    + overhead_cycles) > this_zone->max_cycles() )
        return FALSE;
    else
        return TRUE;}
////////////////////////////////////////////////////////////////////
// get_this_block_duration
// Returns the current block's duration.
////////////////////////////////////////////////////////////////////
long temporal::get_this_block_duration(){
    return this_inst->get_duration();}
////////////////////////////////////////////////////////////////////
// add_block_duration
// Evaluate and add the new block's duration to the zone.
// Returns FALSE if failed.
////////////////////////////////////////////////////////////////////
BOOLEAN temporal::add_block_duration(string* prototype_name,instance*& inst_ptr){
    BOOLEANstatus = TRUE;
    instance*current_inst;
    int             duration;
    // evaluate contents so block duration will get filled in
    if (inst_ptr->compute_contents()){
        this_inst->out_error("ZON905", cerr, FALSE);
        cerr << "INTERNAL ERROR -- Phantom block '"
            << *prototype_name
            << "' doesn't have valid contents.\n";
```

```
        status = FALSE;
    }
    // add this block's duration to the zone
    // save our current instance and set the pass-in instance
    current_inst = this_inst;
    this_inst = inst_ptr;
    if (!add_this_block_duration(&duration)){
        this_inst->out_error("ZON053", cerr, FALSE);
        cerr << "The sample rate is too high, with only "
            << this_zone->max_cycles()
            << " cycles in a sample period!\n"
        << "Could not add a required phantom block ("
            << *prototype_name
            << ").\n";
        status = FALSE;}
    // restore our instance
    this_inst = current_inst;
    return status;}
////////////////////////////////////////////////////////////////////////
// end_zone_cycles
// Called when all user blocks have been instantiated, this function determines
// the number of cycles to finish the zone.
// Exits if error.
////////////////////////////////////////////////////////////////////////
long temporal::end_zone_cycles(){
    static intjump_block_cycles = UNKNOWN_DURATION;
    long        cycles_required;
    // if we don't have # of cycles for blocks, look them up
    if (jump_block_cycles == UNKNOWN_DURATION)
        if ((jump_block_cycles = get_block_duration(JUMP_TO_STR))
            == UNKNOWN_DURATION)
            exit(1);
    // add overhead for ending a block
    cycles_required = ending_overhead();
    // add jump block cycles
    cycles_required += jump_block_cycles;
    return cycles_required;}
////////////////////////////////////////////////////////////////////////
// end_zone_fits
```

```
// Called when all user blocks have been instantiated, this function determines
// if the end of zone overhead blocks will fit in the current segment.
// Returns FALSE if no.
// Exits if error.
////////////////////////////////////////////////////////////////////
BOOLEAN temporal::end_zone_fits(){
    // see if there is enough time
    if ( (this_zone->cycles_used() + end_zone_cycles())
            > this_zone->max_cycles())
        return FALSE;
    else
        return TRUE;}
////////////////////////////////////////////////////////////////////
// get_block_duration
// Get constant block duration for an ASM block.
////////////////////////////////////////////////////////////////////
int get_block_duration(char* name){
    string*     prototype_name;
    asm_block*proto_ptr;
    expr*       expr_ptr;
    int                 blk_duration;
    int                 dummy1, dummy2;
    prototype_name = new string(name);
    // make sure we have ptr to block prototype
    if (!(proto_ptr = (asm_block*) find_block(prototype_name)))
        return UNKNOWN_DURATION;
    // make sure block is an asm block
    if (!proto_ptr->is_leaf_block()){
        out_err_header("ZON057");
        cerr << "Block '"
            << *prototype_name << "' needs to be an asm block.\n";
        return UNKNOWN_DURATION;}
    // get expression for duration
    expr_ptr = proto_ptr->get_duration_expr();
    // make sure its a constant
    if (!expr_ptr->has_int_value()){
        out_err_header("ZON058");
        cerr << "Block '"
            << *prototype_name << "' needs to have a constant duration.\n";
```

```
        return UNKNOWN_DURATION;}
    // get integer value of expression and return as duration
    blk_duration = (int) expr_ptr->int_value(&dummy1, &dummy2);
    return blk_duration;}
//////////////////////////////////////////////////////////////////////
// get_block_duration
// Get variable block duration for an ASM block.
// Passed parameters which are required to evaluate the variable duration of
// the asm block.
//////////////////////////////////////////////////////////////////////
int get_block_duration(char* name, int n_params, expr** param_values){
    string*     prototype_name;
    asm_block*proto_ptr;
    expr*       expr_ptr;
    int                 blk_duration;
    int                 dummy1, dummy2;
    expr_hash*parameters;
    string*     param_name;
    prototype_name = new string(name);
    // make sure we have ptr to block prototype
    if (!(proto_ptr = (asm_block*) find_block(prototype_name)))
        return UNKNOWN_DURATION;
    // make sure block is an asm block
    if (!proto_ptr->is_leaf_block()){
        out_err_header("ZON057");
        cerr << "Block '"
            << *prototype_name << "' needs to be an asm block.\n";
        return UNKNOWN_DURATION;}
    // get expression for duration
    expr_ptr = proto_ptr->get_duration_expr();
    // next, iterate on parameters, if present
    if (n_params){
        // create a hash table of expressions for the parameters
        parameters = new expr_hash(n_params);
        for (int i=0; i<n_params; i++)
        {
            // get parameter name for this parameter index
            // from the prototype (must of course specify parameters
            // in their declared order)
```

```
            param_name = proto_ptr->param_name_at_index(i);
            parameters->add(*param_name, param_values[i]);
        }}
    // Create a temporary instance for this block so that we
    // can set a temporory parameter table for the purpose of
    // evaluating the duration.
    // First clear out any junk instance ptr in prototype so we don't
    // get into any initialization problems!
    proto_ptr->set_instance((instance*) NULL);
    string      temp_string("temp");
    instancetemp_instance(proto_ptr, temp_string, (instance*) NULL, 0);
    // set parameter table as override symbol table for this instance
    if (n_params)
        temp_instance.set_overrides(parameters);
    // now push the context for this instance so the instance info
    // is within the block's environment{
        temp_instance.push_context();
        // make sure duration expression now evaluates to an integer value
        if (!expr_ptr->has_int_value())
        {
            out_err_header("ZON076");
            cerr << "Block '"
                 << *prototype_name << "' has an uncomputable duration.\n";
            blk_duration = UNKNOWN_DURATION;
        }
        else
            // get integer value of expression and return as duration
            blk_duration = (int) expr_ptr->int_value(&dummy1, &dummy2);
        temp_instance.pop_context();}
    return blk_duration;}
//////////////////////////////////////////////////////////////////////////
// Here are the overloaded multi_temporal (multi-rate) versions of temporal
// class member functions.
//////////////////////////////////////////////////////////////////////////
//////////////////////////////////////////////////////////////////////////
// multi_temporal::multi_temporal
// Constructor.
// This constructor is passed a possible previous zone for partitioning
// a multi-rate sub-zone. Partitioning info from this zone is carried over
```

```
// for the this temporal partitioning.
////////////////////////////////////////////////////////////////////
multi_temporal::multi_temporal(zone* z, instance* i, string* flag_s,
                                        zone* prev_z)
      : temporal(z, i, flag_s, prev_z){
      is_multi_temporal = TRUE;
      if (prev_z != (zone*) NULL){
            // carry over partitioning info by "adding" it (via the "+" operator,
            // of course!) from the old zone to the new zone.
            *z += *prev_z;
      }}
////////////////////////////////////////////////////////////////////
// init_for_partition
// Overloaded function from temporal class to do initialization before
// we start partitioning.
////////////////////////////////////////////////////////////////////
BOOLEANmulti_temporal::init_for_partition(){
      BOOLEANstatus = TRUE;
      // instantiate the loop init block using repeat count for zone
      status = make_loop_init_block();
      // Create top-of-loop for the new segment.
      if (status)
            status = make_loop_top();
      // we are in looped code, so set this
      set_in_repeat_code();
      return status;}
////////////////////////////////////////////////////////////////////
// add_output_fifo_info
// Overloaded function from temporal class which calls the base function
// for each successive multi-rate zone derived from the master zone.
// Output fifos are created for each subzone which has outputs.
// This is called when all the zone's blocks have been processed.
////////////////////////////////////////////////////////////////////
BOOLEAN multi_temporal::add_output_fifo_info(){
      int               i;
      BOOLEANstatus = TRUE;
      zone*       next;
      for (i=0; i<the_zones->n_including_sub_zones(); i++){
            // do all zones with our zone as the original
```

```
        next = the_zones->get_zone(i);
        if (next->original_zone() == this_zone)
        {
            // Create a temporary multi-temporal object for next zone.
            multi_temporal t(next, this_inst, flag_string, this_zone);
            // call base class
            if (!(status = t.temporal::add_output_fifo_info()))
                break;
        }}
    return status;}
////////////////////////////////////////////////////////////////////////
// run_time_input_port_init
// Generate the code for the run-time portion of the input port initialization,
// i.e. initialization that should not be done via a static download.
////////////////////////////////////////////////////////////////////////
BOOLEAN multi_temporal::run_time_input_port_init(){
    int             i;
    BOOLEANstatus = TRUE;
    zone*       next;
    for (i=0; i<the_zones->n_including_sub_zones(); i++){
        // do all zones with our zone as the original
        next = the_zones->get_zone(i);
        if (next->original_zone() == this_zone)
        {
            // create a temporary multi-temporal object for next zone
            multi_temporal t(next, this_inst, flag_string);

            // call base class
            if (!(status = t.temporal::run_time_input_port_init()))
                break;
        }}
    return status;}
////////////////////////////////////////////////////////////////////////
// init_input_fifo_ptrs
// Overloaded function from temporal class which calls the base function
// for each successive multi-rate zone derived from the master zone.
// Create the init blocks to set the input fifo pointers.
////////////////////////////////////////////////////////////////////////
BOOLEAN multi_temporal::init_input_fifo_ptrs(){
```

```
    int             i;
    BOOLEANstatus = TRUE;
    zone*       next;
    for (i=0; i<the_zones->n_including_sub_zones(); i++){
        // do all zones with our zone as the original
        next = the_zones->get_zone(i);
        if (next->original_zone() == this_zone)
        {
            // create a temporary multi-temporal object for next zone
            multi_temporal t(next, this_inst, flag_string);

            // call base class
            if (!(status = t.temporal::init_input_fifo_ptrs()))
                break;
        }}
    return status;}
////////////////////////////////////////////////////////////////////
// init_output_fifo_ptrs
// Overloaded function from temporal class which calls the base function
// for each successive multi-rate zone derived from the master zone.
// Create the init blocks to set the output fifo pointers.
////////////////////////////////////////////////////////////////////
BOOLEAN multi_temporal::init_output_fifo_ptrs(){
    int             i;
    BOOLEANstatus = TRUE;
    zone*       next;
    for (i=0; i<the_zones->n_including_sub_zones(); i++){
        // do all zones with our zone as the original
        next = the_zones->get_zone(i);
        if (next->original_zone() == this_zone)
        {
            // create a temporary multi-temporal object for next zone
            multi_temporal t(next, this_inst, flag_string);

            // call base class
            if (!(status = t.temporal::init_output_fifo_ptrs()))
            break;
        }}
    return status;}
```

```
//////////////////////////////////////////////////////////////////////
// partition
// Overloaded function from temporal class which calls the base function
// for each successive multi-rate zone derived from the master zone.
//////////////////////////////////////////////////////////////////////
BOOLEAN multi_temporal::partition(BOOLEAN* ok, int* duration_ptr){
    int             i;
    BOOLEANstatus = TRUE;
    zone*       next;
    // partition our zone
    if (!(status = temporal::partition(ok, duration_ptr)))
        return status;
    for (i=0; i<the_zones->n_including_sub_zones(); i++){
        // partition all other zones with our zone as the original
        next = the_zones->get_zone(i);
        if ((next->original_zone() == this_zone) && (next != this_zone))
        {
            // Create a temporary multi-temporal object for next zone.
            multi_temporal t(next, this_inst, flag_string, this_zone);
            // We must force a new zone boundary because different rates must be
            // on different loops. This will take effect when we try to
            // partition.
            next->force_a_boundary();

            // don't recursively call ourself, but call base class
            if (!(status = t.temporal::partition(ok, duration_ptr)))
                break;
            // just in case no partitioning done, clear flag (it
            // will get set again for another sub-zone)
            next->clear_forced_flag();
        }}
    return status;}
//////////////////////////////////////////////////////////////////////
// add_this_block_duration
// Overloaded function from temporal class.
// Try to add the current block's duration to this zone. If it would
// overfill the zone, don't add it and return FALSE.
// This overloaded version also checks for insertions of a poll block,
// if required.
```

```
/////////////////////////////////////////////////////////////////////
BOOLEAN multi_temporal::add_this_block_duration(int* dur_ptr){
    BOOLEANstatus;
    int         this_duration;
    // call our member function to get block duration
    this_duration = (int) get_this_block_duration();
    *dur_ptr = this_duration;
    // first call to check for new segment required
    if (!test_block_duration(this_duration) || this_zone->boundary_forced() )
        return FALSE;
    // no new segment, so see if poll block required
    if (status = !poll_block_required(this_duration)){
        // no poll block required
        // so add block duration
        status = temporal::add_this_block_duration(dur_ptr);
        // do poll block accounting for duration
        poll_block_accounting(this_duration);}
    return status;}
/////////////////////////////////////////////////////////////////////
// poll_block_required
// Returns TRUE if need a poll block before inserting block of given duration
// in the current zone.
/////////////////////////////////////////////////////////////////////
BOOLEAN multi_temporal::poll_block_required(int duration){
    int         repeat_count;
    int         since_temp;
    int         max_cycles;
    since_temp = since_last_poll;
    if (this_zone->compute_polling()){
        // doing compute polling, so see if we need to insert a
        // poll block before adding this block
        repeat_count = (int) this_zone->original_zone()->get_repeat_count();
        max_cycles = (int) (this_zone->max_cycles() / repeat_count);
        // divide duration by zone repeat count to get true duration
        if (in_repeat_code)
            duration = duration / repeat_count;
        if ( (duration + since_last_poll) > max_cycles )
            return TRUE;}
    return FALSE;}
```

```
//////////////////////////////////////////////////////////////////////
// poll_block_accounting
// Tally the given block duration for poll block accounting.
//////////////////////////////////////////////////////////////////////
void multi_temporal::poll_block_accounting(int duration){
      if (this_zone->compute_polling()){
            // divide duration by zone repeat count to get true duration
            if (in_repeat_code)
                  duration = (int) (duration / this_zone->get_repeat_count());
            since_last_poll += duration;
      }}
//////////////////////////////////////////////////////////////////////
// segment_would_follow_poll
// Returns TRUE if a segment would immediately follow a new poll block.
//////////////////////////////////////////////////////////////////////
BOOLEAN multi_temporal::segment_would_follow_poll(int duration){
      int               repeat_count;
      int               poll_cycles;
      int               overhead_cycles;
      long        used;
      long        max_cycles;
      repeat_count = (int) this_zone->get_repeat_count();
      poll_cycles = poll_block_cycles();
      if (in_repeat_code)
            poll_cycles *= repeat_count;
      overhead_cycles = ending_overhead();
      used = this_zone->cycles_used();
      max_cycles = this_zone->max_cycles();
      // if adding poll block would require a new segment, or if after adding
      // poll block we cannot add the given block's duration, then
      // return TRUE
      if ( ((used + poll_cycles + overhead_cycles) > max_cycles)
      || ((used + poll_cycles + duration + overhead_cycles) > max_cycles) )
            return TRUE;
      else
            return FALSE;}
//////////////////////////////////////////////////////////////////////
// segment_would_follow_boundary
// Returns TRUE if a segment would immediately follow a rate boundary.
```

```
////////////////////////////////////////////////////////////////////////
BOOLEAN multi_temporal::segment_would_follow_boundary(int duration){
    int         boundary_cycles;
    int         overhead_cycles;
    long    used;
    long    max_cycles;
    boundary_cycles = boundary_overhead();
    overhead_cycles = ending_overhead();
    used = this_zone->cycles_used();
    max_cycles = this_zone->max_cycles();
    // if adding boundary would require a new segment, or if after adding
    // boundary we cannot add the given block's duration, then
    // return TRUE
    if ( ((used + boundary_cycles + overhead_cycles) > max_cycles)
    || ((used + boundary_cycles + duration + overhead_cycles) > max_cycles) )
        return TRUE;
    else
        return FALSE;}
////////////////////////////////////////////////////////////////////////
// add_poll_block
// Add a poll compute line block.
////////////////////////////////////////////////////////////////////////
BOOLEAN multi_temporal::add_poll_block(){
    int         ctr_index;
    instance*ctr_inst;
    BOOLEANstatus = TRUE;
    static long wait_mask = 0;
    // clear cycles since last poll block
    since_last_poll = 0;
    // get args for poll block and insert
    ctr_index = this_zone->get_compute_ctr(&ctr_inst);
    if (!make_poll_compute_block(compute_ctr_wait_mask, ctr_inst, ctr_index))
        status = FALSE;
    return status;}
////////////////////////////////////////////////////////////////////////
// poll_block_cycles
// This function determines the number of cycles for a poll block.
// Exits if error.
////////////////////////////////////////////////////////////////////////
```

```
int multi_temporal::poll_block_cycles(){
      static intpoll_bl_cycles = UNKNOWN_DURATION;
      // if we don't have # of cycles for block, look them up
      if (poll_bl_cycles == UNKNOWN_DURATION)
            if ((poll_bl_cycles = get_block_duration(POLL_COMP_STR))
                  == UNKNOWN_DURATION)
                  exit(1);
      return poll_bl_cycles;}
////////////////////////////////////////////////////////////////////////
// get_this_block_duration
// Overloaded function from temporal class.
// Returns the current block's duration, adjusted by a possible repeat count
// for looped code.
////////////////////////////////////////////////////////////////////////
long multi_temporal::get_this_block_duration(){
      // if we're in a repeated code portion, scale the block duration
      // by the repeat count
      if (in_repeat_code)
            return this_inst->get_duration() * this_zone->get_repeat_count();
      else
            return this_inst->get_duration();}
////////////////////////////////////////////////////////////////////////
// ending_overhead
// Overloaded function from temporal class.
// Compute number of phantom block overhead cycles for ending the current
// segment.
// Exits if error.
////////////////////////////////////////////////////////////////////////
int multi_temporal::ending_overhead(){
      static int turnstile_cycles = UNKNOWN_DURATION;
      static intfree_seg_cycles = UNKNOWN_DURATION;
      static intloop_bottom_cycles = UNKNOWN_DURATION;
      static intloop_init_cycles = UNKNOWN_DURATION;
      int               dupe_ph_array_cycles;
      int               to_ph_array_cycles;
      int               fr_ph_array_cycles;
      int               to_ph_array_reset_cycles;
      int               fr_ph_array_reset_cycles;
      zone*       before_zone = this_zone;// zone before segment edge
```

```
zone*       after_zone = this_zone; // zone after segment edge
int_arraybottom_of_last_copy;// type of copy for each wire, last loop
int_arraytop_of_next_copy;// type of copy for each wire, next loop
int                 n_cycles;
int                 before_segment_repeats;
int                 after_segment_repeats;

before_segment_repeats = (int) before_zone->get_repeat_count();
after_segment_repeats = (int) after_zone->get_repeat_count();
// analyze the type of copies to do for each phantom wire for the bottom
// of previous loop, between loops, and top of next loop
if (!analyze_phantom_multi_copies(before_zone, after_zone,
                                  &bottom_of_last_copy, &top_of_next_copy))
      exit(1);
// if we don't have # of cycles for blocks, look them up
// compute number of cycles for each to phantom array copy block
if (!n_to_phantom_arr_copy_cycles(&bottom_of_last_copy,&to_ph_array_cycles))
      exit(1);
// compute number of cucles for loop bottom block
if (loop_bottom_cycles == UNKNOWN_DURATION)
      if ((loop_bottom_cycles = get_block_duration(LOOP_BOTTOM_STR))
            == UNKNOWN_DURATION)
            exit(1);
if (turnstile_cycles == UNKNOWN_DURATION)
      if ((turnstile_cycles = get_block_duration(TURNSTILE_STR))
            == UNKNOWN_DURATION)
            exit(1);
// compute number of cycles for each dupe phantom array block
if (!n_dupe_phantom_arrays_cycles(&dupe_ph_array_cycles))
      exit(1);
// to phantom array reset blocks
if (!n_to_phant_arr_ptr_resets(&bottom_of_last_copy,
                               &to_ph_array_reset_cycles))
      exit(1);
// from phantom array reset blocks
if (!n_fr_phant_arr_ptr_resets(&top_of_next_copy,
                               &fr_ph_array_reset_cycles))
      exit(1);
// free segment cycles
```

```
if (free_seg_cycles == UNKNOWN_DURATION)
      if ((free_seg_cycles = get_block_duration(FREE_SEG_STR))
            == UNKNOWN_DURATION)
            exit(1);
// loop init block
if (loop_init_cycles == UNKNOWN_DURATION)
      if ((loop_init_cycles = get_block_duration(COPY_CONSTANT_STR))
            == UNKNOWN_DURATION)
            exit(1);
// compute number of cycles for each from phantom array copy block
if (!n_from_phantom_arr_copy_cycles(&top_of_next_copy, &fr_ph_array_cycles))
      exit(1);
n_cycles = loop_bottom_cycles*before_segment_repeats + loop_init_cycles
            + free_seg_cycles + turnstile_cycles
            + to_ph_array_reset_cycles + fr_ph_array_reset_cycles
            + dupe_ph_array_cycles
            + to_ph_array_cycles*before_segment_repeats
            + fr_ph_array_cycles*after_segment_repeats;
return n_cycles;}
////////////////////////////////////////////////////////////////////////
// end_zone_cycles
// Overloaded function from temporal class.
// Called when all user blocks have been instantiated, this function determines
// the number of cycles to finish the zone.
// Exits if error.
////////////////////////////////////////////////////////////////////////
long multi_temporal::end_zone_cycles(){
      static intjump_block_cycles = UNKNOWN_DURATION;
      long        cycles_required;
      // if we don't have # of cycles for blocks, look them up
      if (jump_block_cycles == UNKNOWN_DURATION)
            if ((jump_block_cycles = get_block_duration(JUMP_TO_STR))
                  == UNKNOWN_DURATION)
                  exit(1);
      // add overhead for ending a block
      cycles_required = ending_overhead();
      // add jump block cycles
      cycles_required += jump_block_cycles;
      return cycles_required;}
```

```
///////////////////////////////////////////////////////////////////////
// create_segment_0
// Segment 0 is created at the start of temporal partitioning.
// We must:
// 1. Create a label for loop back from the end of the time zone.
// 2. Create segment flag phantom wires for segments 0 and 1.
// 3. Instantiate a "_turnstile" block to wait for segment 1 free.
// 4. Instantiate a "_free_seg" block to free segment 0.
///////////////////////////////////////////////////////////////////////
BOOLEANmulti_temporal::create_segment_0(){
    int           seg_index; // wire index for new segment
    string*       zeroth_flag_string;
    string*       first_flag_string;
    string*       label;
    BOOLEANstatus = TRUE;
//  // save current block context and set instance info in block
//  this_inst->push_context();
    // we are not get in looped code
    set_not_in_repeat_code();
    // create the label for GSP loop back
    // tie it to the next instance to be added, which will be a fifo or flag
    // wait block
        label = new string(LOOP_STR);
        *label = *label + this_zone->get_zone_chars();
    // set this label (hierarchically named) in the temporal class
    loopback_label = new string("");
    *loopback_label = *loopback_label + *this_inst->hier_name_string()
                            + "." + *label;
    if (!this_inst->add_phantom_label_name(label, this_inst->get_n_children())){
        this_inst->out_error("ZON032", cerr, TRUE);
        cerr << "The phantom label '" << *label << "' already exist!\n";
        status = FALSE;}
    // make a segment flag for the 0th segment
    if (status){
        zeroth_flag_string = this_zone->make_segment_flag(&seg_index);
        if (!zeroth_flag_string)
            status = FALSE;}
    // make a segment flag for the first segment
    if (status){
```

```
        // turnstile code exists in 0'th segment, but account for it in first,
        // since we always have 0'th as an extra segment and it would not get
        // otherwise accounted for (we would not add a segment after the
        // first at the correct number of cycles).
        this_zone->bump_segment();
        first_flag_string = this_zone->make_segment_flag(&seg_index);
        if (!first_flag_string)
            status = FALSE;}
    // instantiate a turnstile for the first segment
    if (status){
        if (!make_turnstile(first_flag_string, 1))
            status = FALSE;}
    // (10) Mark this segment boundary for possible next segment insertion of
    //      "reset_from_phant_arr_ptr"s. Save the instance and child index
    // for the spot we are inserting at.
    save_segment_boundary(this_inst, this_inst->get_partitioned_size());
    // we have now officially entered the first segment, so
    // instantiate a free_segment block for segment 0
    if (status){
        if (!make_free_segment(zeroth_flag_string))
            status = FALSE;}
    // set contents of temporal class' flag string to first flag string
    if (status)
        *flag_string = *first_flag_string;
//  // restore previous block context
//  this_inst->pop_context();
    return status;}
////////////////////////////////////////////////////////////////////
// create_new_segment
// Overloaded function from temporal class.
// It was determined that a new segment should be added.
// The multi-temporal class must handle iterated code segment loops and
// phantom arrays in addition to the normal turnstile and phantom wires
// of a new segment.
// We must (* was added beyond base class function):
// 1. Create a segment flag phantom wire for the new segment.
// 2. Create phantom wires for all pending inputs.
// 3. *Create phantom arrays for all pending inputs.
// 4. *Instantiate "to_phantom_arr_copy"s for all required pending inputs.
```

```
// 5. *Instantiate bottom-of-loop code for the current segment.
// 6. Instantiate a "_turnstile" block to end the current segment.
// 7. *Instantiate "dupe_phantom_arr"s for all pending inputs.
// 8. *Instantiate "reset_to_phant_arr_ptr"s for all required pending inputs
//     (instantiated at previous segment boundary).
// 9. *Instantiate "reset_from_phant_arr_ptr"s for all required pending inputs.
// 10.*Mark this segment boundary for possible next segment insertion of
//          "reset_from_phant_arr_ptr"s.
// 11. Instantiate a "_free_seg" block.
// 12.*Instantiate the loop init block using repeat count for zone
// 13.*Create top-of-loop code for the new segment.
// 14.*Instantiate "_from_phantom_arr_copy"s to copy to these phantom wires
//          for the next segment.
/////////////////////////////////////////////////////////////////////
BOOLEANmulti_temporal::create_new_segment(int duration){
    int              seg_index; // wire index for new segment
    string*     new_flag_string;
    zone*       before_zone = this_zone;// zone before segment edge
    zone*       after_zone = this_zone; // zone after segment edge
    int_arraybottom_of_last_copy;// type of copy for each wire, last loop
    int_arraytop_of_next_copy;// type of copy for each wire, next loop
    // see if we must create a new segment regardless
    if (test_block_duration(duration)){
        // no, so check for any other cases
        // if we force a boundary, don't actually create a new segment, but
        // make zone boundary instead
        if (this_zone->boundary_forced())
        {
            this_zone->clear_forced_flag();
            // Make sure that a new segment will not immediately follow
            // zone boundary. If so, don't make a boundary but just
            // make a new segment.
            if (!segment_would_follow_boundary(duration))
                return create_zone_boundary();
        }
        // must also check if poll block required, in which case we do not
        // want a new segment unless a new one would immediately follow poll
        // block anyway
        if (poll_block_required(duration))
```

```
        {
            if (!segment_would_follow_poll(duration))
                return add_poll_block();
        }}
    // go ahead and create new segment, since that's the only thing left to do
    // set overhead cycles we had to allow for in this segment
    this_zone->set_overhead_allowed_for(ending_overhead());
    // get zone for previous block partitioned
    if (last_zone_for_partitioning != (zone*) NULL)
        before_zone = last_zone_for_partitioning;
    // advance to next segment
    this_zone->bump_segment();
#ifdef DEBUG
    cerr << "making new segment\n";
    debug = TRUE;
#endif
    // analyze the type of copies to do for each phantom wire for the bottom
    // of previous loop, between loops, and top of next loop
    if (!analyze_phantom_multi_copies(before_zone, after_zone,
                                      &bottom_of_last_copy, &top_of_next_copy))
        return FALSE;
#ifdef DEBUG
    debug = FALSE;
#endif
    // (1) create a new segment flag, and return its name
    new_flag_string = this_zone->make_segment_flag(&seg_index);
    if (!new_flag_string)
        return FALSE;
    // (1.5) create non-phantom arrays, which are the destinations for
    // new wires in repeated code
    if (!make_non_phantom_arrays(&bottom_of_last_copy))
        return FALSE;
    // (2) create phantom wires for all pending inputs
    if (!this_zone->make_phantom_wires())
        return FALSE;
    // (3) create phantom arrays, which are the signal sources for
    // phantom wires
    if (!make_phantom_arrays())
        return FALSE;
```

```
// (3.5) make ptrs to and from phantom arrays
if (!make_to_phantom_array_ptrs(&bottom_of_last_copy))
      return FALSE;
if (!make_from_phantom_array_ptrs(&top_of_next_copy))
      return FALSE;
// (4) Instantiate "to_phantom_arr_copy"s for all pending inputs
// which require it.
// Each time through the previous segment's loop, a new value is copied
// to the next array position for new wires.
if (!make_to_phantom_arr_copys(&bottom_of_last_copy,
                              before_zone, after_zone))
      return FALSE;
// (5) Instantiate bottom-of-loop code for the current segment.
if (!make_loop_bottom(before_zone))
      return FALSE;
// bottom of previous segment
///////////////////////////////////////
// between segments
// we are no longer in looped code
set_not_in_repeat_code();
// (6) instantiate a turnstile for this new segment
if (!make_turnstile(new_flag_string, this_zone->seg_num()))
      return FALSE;
// (7) instantiate "dupe_phantom_arr"s for all pending inputs.
if (!dupe_phantom_arrays())
      return FALSE;
// (8) Instantiate "reset_to_phant_arr_ptr"s for all required pending inputs
//      (inserted at previous segment boundary).
if (!make_to_phant_arr_ptr_resets(&bottom_of_last_copy))
      return FALSE;
// (9) Instantiate "reset_from_phant_arr_ptr"s for all required pending
// inputs. This initializes "from_phantom_arr" pointer to make
// samples available for the new segment.
if (!make_fr_phant_arr_ptr_resets(&top_of_next_copy))
      return FALSE;
// (10) Mark this segment boundary for possible next segment insertion of
//      "reset_from_phant_arr_ptr"s. Save the instance and child index
// for the spot we are inserting at.
save_segment_boundary(this_inst, this_inst->get_partitioned_size());
```

```
// free any wires that are hanging around because they are loop inputs
this_zone->free_pending_loop_wires();
// (11) instantiate a free_segment block, passing current flag name
if (!make_free_segment(flag_string))
      return FALSE;
// (12) instantiate the loop init block using repeat count for zone
if (!make_loop_init_block())
      return FALSE;
// between segments
///////////////////////////////////////
// top of next segment
// we are back in looped code
set_in_repeat_code();
// (13) Create top-of-loop for the new segment.
if (!make_loop_top())
      return FALSE;
// (14) *Instantiate "_from_phantom_arr_copy"s to copy to these phantom
// wires from the phantom arrays.
// Each time through the next segment's loop, a new value is copied to
// the new phantom wire from the next position in the corresponding
// phantom array.
if (!make_from_phantom_arr_copys(&top_of_next_copy,
                        before_zone, after_zone))
      return FALSE;
// set contents of temporal class' flag string to first flag string
*flag_string = *new_flag_string;
if (this_zone->cycles_used() > this_zone->max_cycles()){
      this_inst->out_error("ZON033", cerr, TRUE);
      cerr << "The sample rate is too high.\n";
      out_sample_period_msg(cerr);
      cerr << ", but "
            << this_zone->cycles_used()
            << " overhead cycles are required to create a new segment.\n";
      return FALSE;}
return TRUE;}
//////////////////////////////////////////////////////////////////////
// create_zone_boundary
// Overloaded function from temporal class.
// It was determined that a new segment should be added.
```

```
// The multi-temporal class must handle iterated code segment loops and
// phantom arrays in addition to the normal turnstile and phantom wires
// of a new segment.
// We must (* was added beyond base class function):
// 1. Create a segment flag phantom wire for the new segment.
// 2. Create phantom wires for all pending inputs.
// 3. *Create phantom arrays for all pending inputs.
// 4. *Instantiate "to_phantom_arr_copy"s for all required pending inputs.
// 5. *Instantiate bottom-of-loop code for the current segment.
// 6. Instantiate a "_turnstile" block to end the current segment.
// 7. *Instantiate "dupe_phantom_arr"s for all pending inputs.
// 8. *Instantiate "reset_to_phant_arr_ptr"s for all required pending inputs
//     (instantiated at previous segment boundary).
// 9. *Instantiate "reset_from_phant_arr_ptr"s for all required pending inputs.
// 10.*Mark this segment boundary for possible next segment insertion of
//          "reset_from_phant_arr_ptr"s.
// 11. Instantiate a "_free_seg" block.
// 12.*Instantiate the loop init block using repeat count for zone
// 13.*Create top-of-loop code for the new segment.
// 14.*Instantiate "_from_phantom_arr_copy"s to copy to these phantom wires
//          for the next segment.
//////////////////////////////////////////////////////////////////
BOOLEANmulti_temporal::create_zone_boundary(){
      zone*      before_zone = this_zone;// zone before segment edge
      zone*      after_zone = this_zone; // zone after segment edge
      int_arraybottom_of_last_copy;// type of copy for each wire, last loop
      int_arraytop_of_next_copy;// type of copy for each wire, next loop
      // get zone for previous block partitioned
      if (last_zone_for_partitioning != (zone*) NULL)
            before_zone = last_zone_for_partitioning;
#ifdef DEBUG
      cerr << "making new zone boundary\n";
      debug = TRUE;
#endif
      // analyze the type of copies to do for each phantom wire for the bottom
      // of previous loop, between loops, and top of next loop
      if (!analyze_phantom_multi_copies(before_zone, after_zone,
                                    &bottom_of_last_copy, &top_of_next_copy))
            return FALSE;
```

```
#ifdef DEBUG
    debug = FALSE;
#endif
    // (1.5) create non-phantom arrays, which are the destinations for
    // new wires in repeated code
    if (!make_non_phantom_arrays(&bottom_of_last_copy))
        return FALSE;
    // (2) create phantom wires for all pending inputs
    // but only if we need them in the next section
    if (!this_zone->make_phantom_wires(&top_of_next_copy))
        return FALSE;
    // (3) don't create phantom arrays (copies of non-phantom arrays)
    // (3.5) just make ptrs from phantom arrays
    if (!make_from_phantom_array_ptrs(&top_of_next_copy))
        return FALSE;
    // (4) Instantiate "to_phantom_arr_copy"s for all pending inputs
    // which require it.
    // Each time through the previous segment's loop, a new value is copied
    // to the next array position for new wires.
    if (!make_to_phantom_arr_copys(&bottom_of_last_copy,
                                    before_zone, after_zone))
        return FALSE;
    // (5) Instantiate bottom-of-loop code for the current segment.
    if (!make_loop_bottom(before_zone))
        return FALSE;
    // bottom of previous segment
    //////////////////////////////////////
    // between segments
    // we are no longer in looped code
    set_not_in_repeat_code();
    // (7) do not "dupe_phantom_arr"s
    // (8) Instantiate "reset_to_phant_arr_ptr"s for all required pending inputs
    //      (inserted at previous segment boundary).
    if (!make_to_phant_arr_ptr_resets(&bottom_of_last_copy))
        return FALSE;
    // (9) Instantiate "reset_from_phant_arr_ptr"s for all required pending
    // inputs. This initializes "from_phantom_arr" pointer to make
    // samples available for the new segment.
    if (!make_fr_phant_arr_ptr_resets(&top_of_next_copy))
```

```
        return FALSE;
    // (10) Mark this boundary for possible next segment insertion of
    //      "reset_from_phant_arr_ptr"s. Save the instance and child index
    // for the spot we are inserting at.
    save_segment_boundary(this_inst, this_inst->get_partitioned_size());
    // (12) instantiate the loop init block using repeat count for zone
    if (!make_loop_init_block())
        return FALSE;
    // between segments
    ////////////////////////////////////
    // top of next segment
    // we are back in looped code
    set_in_repeat_code();
    // (13) Create top-of-loop for the new segment.
    if (!make_loop_top())
        return FALSE;
    // (14) *Instantiate "_from_phantom_arr_copy"s to copy to these phantom
    // wires from the phantom arrays.
    // Each time through the next segment's loop, a new value is copied to
    // the new phantom wire from the next position in the corresponding
    // phantom array.
    if (!make_from_phantom_arr_copys(&top_of_next_copy,
                                before_zone, after_zone))
        return FALSE;
    return TRUE;}
/////////////////////////////////////////////////////////////////////
// boundary_overhead
// Compute number of phantom block overhead cycles for creating a new
// zone boundary.
// Exits if error.
/////////////////////////////////////////////////////////////////////
int multi_temporal::boundary_overhead(){
    static intloop_bottom_cycles = UNKNOWN_DURATION;
    static intloop_init_cycles = UNKNOWN_DURATION;
    int             to_ph_array_cycles;
    int             fr_ph_array_cycles;
    int             to_ph_array_reset_cycles;
    int             fr_ph_array_reset_cycles;
    zone*       before_zone = this_zone;// zone before segment edge
```

```
zone*      after_zone = this_zone; // zone after segment edge
int_arraybottom_of_last_copy;// type of copy for each wire, last loop
int_arraytop_of_next_copy;// type of copy for each wire, next loop
int              n_cycles;
int              before_segment_repeats;
int              after_segment_repeats;
before_segment_repeats = (int) before_zone->get_repeat_count();
after_segment_repeats = (int) after_zone->get_repeat_count();
// analyze the type of copies to do for each phantom wire for the bottom
// of previous loop, between loops, and top of next loop
if (!analyze_phantom_multi_copies(before_zone, after_zone,
                        &bottom_of_last_copy, &top_of_next_copy))
    exit(1);
// if we don't have # of cycles for blocks, look them up
// compute number of cycles for each to phantom array copy block
if (!n_to_phantom_arr_copy_cycles(&bottom_of_last_copy,&to_ph_array_cycles))
    exit(1);
// compute number of cycles for loop bottom block
if (loop_bottom_cycles == UNKNOWN_DURATION)
    if ((loop_bottom_cycles = get_block_duration(LOOP_BOTTOM_STR))
        == UNKNOWN_DURATION)
        exit(1);
// to phantom array reset blocks
if (!n_to_phant_arr_ptr_resets(&bottom_of_last_copy,
                        &to_ph_array_reset_cycles))
    exit(1);
// from phantom array reset blocks
if (!n_fr_phant_arr_ptr_resets(&top_of_next_copy,
                        &fr_ph_array_reset_cycles))
    exit(1);
// loop init block
if (loop_init_cycles == UNKNOWN_DURATION)
    if ((loop_init_cycles = get_block_duration(COPY_CONSTANT_STR))
        == UNKNOWN_DURATION)
        exit(1);
// compute number of cycles for each from phantom array copy block
if (!n_from_phantom_arr_copy_cycles(&top_of_next_copy, &fr_ph_array_cycles))
    exit(1);
n_cycles = loop_bottom_cycles*before_segment_repeats + loop_init_cycles
```

```
                + to_ph_array_reset_cycles + fr_ph_array_reset_cycles
                + to_ph_array_cycles*before_segment_repeats
                + fr_ph_array_cycles*after_segment_repeats;
    return n_cycles;}
/////////////////////////////////////////////////////////////////////////
// make_zone_finish
// Multi-rate version of make_zone_finish.
// Add the turnstile and jump blocks at the end of a zone.
// Called after the ending fifo blocks are instantiated.
/////////////////////////////////////////////////////////////////////////
BOOLEAN multi_temporal::make_zone_finish(){
    string*     zeroth_seg_name;
    BOOLEANstatus = TRUE;
    int             n_segments;
    zone*       before_zone;    // zone before segment edge
    zone*       after_zone;     // zone after segment edge = same
    int_arraybottom_of_last_copy;// type of copy for each wire, last loop
    int_arraytop_of_next_copy;// type of copy for each wire, next loop
    // this function gets called at the top level multi_temporal object
    // rather than during partitioning, so us the saved top of loop zone
    if (top_of_loop_zone != (zone*) NULL)
        before_zone = top_of_loop_zone;
    else
        before_zone = this_zone;
    after_zone = before_zone;
    // save current block context and set instance info in block
    this_inst->push_context();
    // get # of segments partitioned
    n_segments = this_zone->seg_num();
    // get segment flag string for the 0th segment
    zeroth_seg_name = this_zone->seg_flag_name(0);
    // instantiate a turnstile to wait for the zeroth segment
    // but first advance to next segment
    this_zone->bump_segment();
    // (5) Instantiate bottom-of-loop code for the current segment.
    if (status){
        if (!make_loop_bottom(before_zone))
            status = FALSE;}
    // bottom of previous segment
```

```
//////////////////////////////////////
// between segments
// we are no longer in looped code
set_not_in_repeat_code();
// instantiate a turnstile to wait for the zeroth segment
if (status){
      if (!make_turnstile(zeroth_seg_name, 0))
            status = FALSE;}
// (8) Instantiate "reset_to_phant_arr_ptr"s for all required pending inputs
//      (inserted at previous segment boundary).
if (status){
      if (!make_to_phant_arr_ptr_resets(&bottom_of_last_copy))
            status = FALSE;}
if (status){
      // instantiate a free_segment block, passing current flag name
      if (!make_free_segment(flag_string))
            status = FALSE;}
if (status){
      if (!make_jump_block(loopback_label))
            status = FALSE;}
if (status)
      status = generate_GSP_init_code(n_segments, zeroth_seg_name,
                              loopback_label);
// restore previous block context
this_inst->pop_context();
return status;}
//////////////////////////////////////////////////////////////////////////
// analyze_phantom_multi_copies
// Analyze all phantom wires (pending inputs) and characterize the types
// of multiple copy operations to perform at the bottom of the previous
// segment loop, top of next segment loop, and between segment loops.
// Returns FALSE if failed.
//////////////////////////////////////////////////////////////////////////
BOOLEANmulti_temporal::analyze_phantom_multi_copies(zone* before_zone,
            zone* after_zone, int_array* bottom_of_last_copy,
            int_array* top_of_next_copy){
      instance*inst;
      int            wire;
      zone*      wire_zone;
```

```
long        wire_zone_repeats;
long        before_segment_repeats;
long        after_segment_repeats;
int              i;
int              index, level;

before_segment_repeats = before_zone->get_repeat_count();
after_segment_repeats = after_zone->get_repeat_count();
for (i=0; i<this_zone->pending_size(); i++){
      // pre-initialize arrays
      (*bottom_of_last_copy)[i] = NOTHING;
      (*top_of_next_copy)[i] = NOTHING;
      // get zone for next wire
      inst = this_zone->pending_instance(i);
      wire = this_zone->pending_wire(i);
      wire_zone = inst->get_zone_for_wire(wire);
      // also get level for wire
      // if level 0, this is just-generated wire, so we need to save its
      // value
      index = inst->get_last_phantom(wire , &level);
      // if wire just generated in "before" zone, assume we need to copy it
      if (level == 0 && before_zone == wire_zone)
      {
            (*bottom_of_last_copy)[i] = ORDINARY_COPY_TO_WIRE;
#ifdef DEBUG
            if (debug)
                  cerr << "Assume level 0 ordinary copy to wire\n";
#endif
      }
#ifdef DEBUG
      if (debug)
      {
            inst->push_context();
            string*          hier_name;
            int level;
            int index = inst->get_last_phantom(wire , &level);
            hier_name = inst->prototype()->hier_storage_name_at_index(index);
            cerr << "analyzing phantom multi_copy for " << *hier_name << "\n";
            inst->pop_context();
```

```
        }
#endif
        // also need repeat count for this zone
        if (wire_zone != (zone*) NULL)
        {
            wire_zone_repeats = wire_zone->get_repeat_count();
#ifdef DEBUG
            if (debug)
            {
                cerr << "wire zone repeats: " << wire_zone_repeats
                << " before repeats: " << before_segment_repeats
                << " after repeats: " << after_segment_repeats << "\n";
            }
#endif
            // if repeat count is 1, then we don't need an array, so skip
            // remaining code
            if (wire_zone_repeats > 1)
            {
                if (wire_zone_repeats == before_segment_repeats)
                {
                        // wire zone rate is compatible with before segment
                        // but generate copy to array only if level 0 wire
                        // which was generated in before zone
                        if (level == 0 && before_zone == wire_zone)
                        {
                        (*bottom_of_last_copy)[i] = NORMAL_COPY_TO_ARRAY;
#ifdef DEBUG
                        if (debug)
                        cerr << "Normal copy to array\n";
#endif
                        }
                        if (before_segment_repeats == after_segment_repeats)
                        {
                        // wire zone rate compatible with after segment, so
                        // do copy from array at top of after segment
                        (*top_of_next_copy)[i] = NORMAL_COPY_FROM_ARRAY;
#ifdef DEBUG
                        if (debug)
                        cerr << "Normal copy from array\n";
```

```
#endif
                    }
            }
            else if (wire_zone_repeats == after_segment_repeats)
            {
                    // wire may be used in this zone, so make a local copy
                    // available
                    (*top_of_next_copy)[i] = NORMAL_COPY_FROM_ARRAY;
#ifdef DEBUG
                    if (debug)
                    cerr << "Normal copy from array\n";
#endif
            }
            // Wire may be used in later zone which is at "before"
            // repeat rate, or in "after" segment right before an
            // interpolator or decimator.
            // If it is used by an interpolator in "after" segment,
            // we must make an upsampled copy available of it,
            // or if used by a decimator in "after" segment,
            // must
            if (wire_zone_repeats < after_segment_repeats)
            {
                    (*top_of_next_copy)[i] = UPSAMPLE_COPY_FROM_AR-
RAY;
#ifdef DEBUG
                    if (debug)
                    cerr << "Upsample copy from array\n";
#endif
            }
            else if (wire_zone_repeats > after_segment_repeats)
            {
                    (*top_of_next_copy)[i] = DOWNSAMPLE_COPY_FRO-
M_ARRAY;
#ifdef DEBUG
                    if (debug)
                    cerr << "Downsample copy from array\n";
#endif
            }
        }
```

```
    }}
    return TRUE;}
////////////////////////////////////////////////////////////////////////
// make_loop_init_block
// Make a loop init block to initialize the given loop counter.
// Do this by calling make_copy_constant_block.
// This function first creates the loop counter. It gets the loop count
// from the repeat count for the current zone.
// Returns FALSE if failed.
////////////////////////////////////////////////////////////////////////
BOOLEAN multi_temporal::make_loop_init_block(){
    int             loop_count;
    // first save the zone for the top of the loop
    // which we will need when be make the loop bottom
    top_of_loop_zone = this_zone;
    // loop count is repeat count for the current zone
    loop_count = (int) this_zone->get_repeat_count();

    // don't bother if loop count is 1, which isn't a loop
    if (loop_count > 1)
    {
        // create the loop counter, and get its name
        last_loop_counter_name = this_zone->make_loop_counter(
                        &loop_counter_index, &loop_counter_instance);
        if (!last_loop_counter_name)
            return FALSE;
        return make_copy_constant_block(last_loop_counter_name,
                        (long) loop_count);}
    else
        return TRUE;}
////////////////////////////////////////////////////////////////////////
// make_phantom_arrays
// Make a new level of phantom array for each pending input.
// Phantom arrays are used to buffer phantom wire values for repeated code
// segments.
// Returns FALSE if failed to make phantom array.
////////////////////////////////////////////////////////////////////////
BOOLEAN multi_temporal::make_phantom_arrays(){
    int             i;
```

```
int             level;
instance*inst;
int             wire;
zone*     wire_zone;
long      wire_zone_repeats;
expr*     arr_size_expr;
int             prev_index;
int             index;
string*   prev_name;
string*   name;
char      type;
string*   arr_name;
int             arr_wire;
BOOLEANstatus = TRUE;
for (i=0; i<this_zone->pending_size(); i++){
      // get wire and zone for next wire
      inst = this_zone->pending_instance(i);
      wire = this_zone->pending_wire(i);
      wire_zone = inst->get_zone_for_wire(wire);
      // also need repeat count for this zone
      if (wire_zone != (zone*) NULL)
            wire_zone_repeats = wire_zone->get_repeat_count();
      else
            wire_zone_repeats = 1;
#ifdef DEBUG
            string*         n;
            // get level for last phantom for this wire
            index = inst->get_last_phantom(wire , &level);
                  n = inst->prototype()->
                              hier_storage_name_at_index(index);
                  cerr << "making phantom arrays for wire " << *n << "\n";
#endif
      // if repeat count is 1, then we don't need an array, so skip
      // remaining code
      if (wire_zone_repeats > 1)
      {
            // make an expression for the array size from it
            arr_size_expr = new expr(wire_zone_repeats);
            // get level for last phantom for this wire
```

```
                index = inst->get_last_phantom(wire , &level);
                // we also want previous wire level
                level--;
                prev_index = inst->get_phantom(wire , level);
                // get name of wires that we need
                name = inst->prototype()->storage_name_at_index(index);
                prev_name = inst->prototype()->storage_name_at_index(prev_index);
                type = inst->prototype()->get_storage_type(index);
                // we must always created a new phantom array to hold the values
                // for the new segment
                arr_name = new string(ARRAY_PREFIX_STR);
                *arr_name = *arr_name + *name;
                // add this array to wire instance
                status = inst->add_phantom_storage_name(arr_name,
                                arr_size_expr, &arr_wire, type);
                if (!status)
                {
                      inst->out_error("ZON062", cerr, FALSE);
                      cerr << "A phantom array named '"
                       << *arr_name << "' already exists!\n";
                      break;
                }
#ifdef DEBUG
                else
                {
                      string*     hier_name;
                      hier_name =
                                inst->prototype()->hier_storage_name_at_index(arr_wire);
                      cerr << "making phantom array " << *hier_name << "\n";
                }
#endif
           }}
      return status;}
//////////////////////////////////////////////////////////////////////
// make_to_phantom_array_ptrs
// Make "to" pointers into the phantom arrays as required.
// Called after new phantom wires have been created.
// Returns FALSE if failed to make phantom array.
//////////////////////////////////////////////////////////////////////
```

```
BOOLEAN multi_temporal::make_to_phantom_array_ptrs(
                                        int_array* bottom_of_last_copy){
    int             i;
    int             level;
    instance*inst;
    int             wire;
    zone*       wire_zone;
    long        wire_zone_repeats;
    int             prev_index;
    int             index;
    string*     prev_name;
    string*     ptr_name;
    int             ptr_wire;
    BOOLEANstatus = TRUE;
    for (i=0; i<this_zone->pending_size(); i++){
        // get wire and zone for next wire
        inst = this_zone->pending_instance(i);
        wire = this_zone->pending_wire(i);
        wire_zone = inst->get_zone_for_wire(wire);
        // also need repeat count for this zone
        if (wire_zone != (zone*) NULL)
            wire_zone_repeats = wire_zone->get_repeat_count();
        else
            wire_zone_repeats = 1;
#ifdef DEBUG
            string*         n;
            // get level for last phantom for this wire
            index = inst->get_last_phantom(wire , &level);
                n = inst->prototype()->
                        hier_storage_name_at_index(index);
                cerr << "making to phantom array pointers for wire " << *n << "\n";
#endif
        // if repeat count is 1, then we don't need an array, so skip
        // remaining code
        if ( wire_zone_repeats > 1 && (*bottom_of_last_copy)[i] != NOTHING )
        {
            // get level for last phantom for the corresponding array
            if (!level_for_latest_array(i, &level))
            {
```

```
status = FALSE;
break;
}
index = inst->get_phantom(wire, level);
// we want previous wire level
if (level >= 1)
      level--;
prev_index = inst->get_phantom(wire , level);
// get name of wire that we need
prev_name = inst->prototype()->storage_name_at_index(prev_index);
// prepend a special prefix to create name for "to" array ptr
ptr_name = new string(TO_ARRAY_PTR_STR);
*ptr_name = *ptr_name + *prev_name;
// add this to our instance
status = inst->add_phantom_storage_name(ptr_name,
                  (expr*) NULL, &ptr_wire, 'h');
if (!status)
{
      // there may already be a "to" array pointer because
      // it was already created for a decimator output wire
      status = TRUE;
}
#ifdef DEBUG
else
{
      string*     hier_name;
      hier_name = inst->prototype()->
                  hier_storage_name_at_index(ptr_wire);
      cerr << "making 'to' array ptr " << *hier_name << "\n";
}
#endif
      }}
   return status;}
//////////////////////////////////////////////////////////////////////
// make_from_phantom_array_ptrs
// Make "from" pointers for the phantom arrays as required.
// Called after new phantom wires have been created.
// Returns FALSE if failed to make phantom array.
//////////////////////////////////////////////////////////////////////
```

```
BOOLEAN multi_temporal::make_from_phantom_array_ptrs(
                                        int_array* top_of_next_copy){
    int             i;
    int             level;
    instance*inst;
    int             wire;
    zone*       wire_zone;
    long        wire_zone_repeats;
    int             index;
    string*     name;
    string*     ptr_name;
    int             ptr_wire;
    BOOLEANstatus = TRUE;
    for (i=0; i<this_zone->pending_size(); i++){
        // get wire and zone for next wire
        inst = this_zone->pending_instance(i);
        wire = this_zone->pending_wire(i);
        wire_zone = inst->get_zone_for_wire(wire);
        // also need repeat count for this zone
        if (wire_zone != (zone*) NULL)
            wire_zone_repeats = wire_zone->get_repeat_count();
        else
            wire_zone_repeats = 1;
#ifdef DEBUG
            string*         n;
            // get level for last phantom for this wire
            index = inst->get_last_phantom(wire , &level);
                n = inst->prototype()->
                        hier_storage_name_at_index(index);
                cerr << "making from phantom array pointers for wire " << *n << "\n";
#endif
        // if repeat count is 1, then we don't need an array, so skip
        // remaining code
        if (wire_zone_repeats > 1 && (*top_of_next_copy)[i] != NOTHING)
        {
            // get level for last phantom for the corresponding array
            if (!level_for_latest_array(i, &level))
            {
                status = FALSE;
```

```
			break;
		}
		index = inst->get_phantom(wire, level);
		// get name of wire that we need
		name = inst->prototype()->storage_name_at_index(index);
		// prepend a special prefix to create name for "from" array ptr
		ptr_name = new string(FR_ARRAY_PTR_STR);
		*ptr_name = *ptr_name + *name;
		// add this to wire instance
		status = inst->add_phantom_storage_name(ptr_name,
				(expr*) NULL, &ptr_wire, 'h');
		if (!status)
			status = TRUE;
#ifdef DEBUG
		else
		{
			string*	hier_name;
			hier_name = inst->prototype()->
					hier_storage_name_at_index(ptr_wire);
			cerr << "making 'from' array ptr " << *hier_name << "\n";
		}
#endif
	}}
	return status;}
//////////////////////////////////////////////////////////////////////////
// make_non_phantom_arrays
// If a new wire, then make an initial non-phantom array to hold its
// output values if it is in repeated code.
// Also create its "to" ptr.
// Called BEFORE new phantom wires have been created.
// Returns FALSE if failed to make an array.
//////////////////////////////////////////////////////////////////////////
BOOLEAN multi_temporal::make_non_phantom_arrays(int_array* bottom_of_last_copy){
	int		i;
	int		level;
	instance*inst;
	int		wire;
	zone*	wire_zone;
	long	wire_zone_repeats;
```

```
	expr*	arr_size_expr;
	int		index;
	string*	name;
	char	type;
	string*	arr_name;
	int		arr_wire;
	BOOLEANstatus = TRUE;
	for (i=0; i<this_zone->pending_size(); i++){
		// get wire and zone for next wire
		inst = this_zone->pending_instance(i);
		wire = this_zone->pending_wire(i);
		wire_zone = inst->get_zone_for_wire(wire);
		// also need repeat count for this zone
		if (wire_zone != (zone*) NULL)
			wire_zone_repeats = wire_zone->get_repeat_count();
		else
			wire_zone_repeats = 1;
#ifdef DEBUG
			string*		n;
			// get level for last phantom for this wire
			index = inst->get_last_phantom(wire , &level);
				n = inst->prototype()->
					hier_storage_name_at_index(index);
				cerr << "making non-phantom arrays for wire " << *n << "\n";
#endif
		// if repeat count is 1, then we don't need an array, so skip
		// remaining code
		// and make array only of we need to copy from the previous section
		if (wire_zone_repeats > 1 && (*bottom_of_last_copy)[i] != NOTHING)
		{
			// make an expression for the array size from it
			arr_size_expr = new expr(wire_zone_repeats);
			// get level for last phantom for this wire
			index = inst->get_last_phantom(wire , &level);
			// get name of wires that we need
			name = inst->prototype()->storage_name_at_index(index);
			type = inst->prototype()->get_storage_type(index);
			// prepend a special prefix to create name for array
			arr_name = new string(ARRAY_PREFIX_STR);
```

```
*arr_name = *arr_name + *name;
// add this array to wire instance
status = inst->add_phantom_storage_name(arr_name,
                arr_size_expr, &arr_wire, type);
if (!status)
{
        inst->out_error("ZON059", cerr, FALSE);
        cerr << "An array named '"
         << *arr_name << "' already exists!\n";
        break;
}
#ifdef DEBUG
else
{
        string*     hier_name;
        hier_name = inst->prototype()->
                hier_storage_name_at_index(arr_wire);
        cerr << "making non-phantom array " << *hier_name << "\n";
}
#endif
// prepend special prefix to create name for "to" array ptr
arr_name = new string(TO_ARRAY_PTR_STR);
*arr_name = *arr_name + *name;
// add this to our instance
status = inst->add_phantom_storage_name(arr_name,
                (expr*) NULL, &arr_wire, 'h');
if (!status)
{
        inst->out_error("ZON079", cerr, FALSE);
        cerr << "A phantom 'to' array pointer named '"
         << *arr_name << "' already exists!\n";
        break;
}
#ifdef DEBUG
else
{
        string*     hier_name;
        hier_name = inst->prototype()->
                hier_storage_name_at_index(arr_wire);
```

```
                    cerr << "making 'to' array ptr " << *hier_name << "\n";
            }
#endif
        }}
    return status;}
////////////////////////////////////////////////////////////////////////
// dupe_phantom_arrays
// Duplicate the pending phantom arrays for the segment boundary.
// Returns FALSE if failed.
////////////////////////////////////////////////////////////////////////
BOOLEAN multi_temporal::dupe_phantom_arrays(){
    int             i;
    int             level;
    instance*inst;
    int             wire;
    zone*       wire_zone;
    long        wire_zone_repeats;
    expr*       arr_size_expr;
    int             prev_index;
    int             index;
    string*     prev_name;
    string*     name;
    string*     arr_name;
    int             src_index;
    instance*src_inst;
    int             dest_index;
    instance*dest_inst;
    BOOLEANstatus = TRUE;
    for (i=0; i<this_zone->pending_size(); i++){
        // get zone for next wire
        inst = this_zone->pending_instance(i);
        wire = this_zone->pending_wire(i);
        wire_zone = inst->get_zone_for_wire(wire);
        // also need repeat count for this zone
        if (wire_zone != (zone*) NULL)
            wire_zone_repeats = wire_zone->get_repeat_count();
        else
            wire_zone_repeats = 1;
        // if repeat count is 1, then we don't need an array, so skip
```

```
// remaining code
if (wire_zone_repeats > 1)
{
    // make an expression for the array size from it
    arr_size_expr = new expr(wire_zone_repeats);

    // get level for last phantom for the corresponding array
    if (!level_for_latest_array(i, &level))
    {
        status = FALSE;
        break;
    }
    index = inst->get_phantom(wire, level);
    // get level for previous phantom
    if (!level_for_previous_array(i, level, &level))
    {
        status = FALSE;
        break;
    }
    // get corresponding wire index
    prev_index = inst->get_phantom(wire , level);
    // get name of wires that we need
    name = inst->prototype()->storage_name_at_index(index);
    prev_name = inst->prototype()->storage_name_at_index(prev_index);
    // create name for source array
    arr_name = new string(ARRAY_PREFIX_STR);
    *arr_name = *arr_name + *prev_name;
    // look up index and instance for the source array using
    // original wire parent instance
    if (!inst->find_wire_name(arr_name, &src_index, &src_inst))
    {
        this_inst->out_error("ZON067", cerr, FALSE);
        cerr << "Unable to find the source array '"
                << *arr_name << "'.\n";
        status = FALSE;
        break;
    }
    // create name for destination array
    arr_name = new string(ARRAY_PREFIX_STR);
```

```
        *arr_name = *arr_name + *name;
        // look up index and instance for the destination array
        if (!inst->find_wire_name(arr_name, &dest_index, &dest_inst))
        {
              this_inst->out_error("ZON068", cerr, FALSE);
              cerr << "Unable to find the destination array '"
                          << *arr_name << "'.\n";
              status = FALSE;
              break;
        }
        // create array of I/O wire indices
        int ios[2];
        ios[0] = src_index;
        ios[1] = dest_index;
        // create array of I/O wire instance pointers
        instance* io_insts[2];
        io_insts[0] = src_inst;
        io_insts[1] = dest_inst;
        // create array of parameter expressions
        expr* param_vals[1];
        param_vals[0] = arr_size_expr;
        if (!make_phantom_inst_with_args(DUPE_PHANT_ARR_STR, 2, ios,
                    io_insts, 1, param_vals))
        {
              status = FALSE;
              break;
        }
    }}
  return status;}
////////////////   '//////////////////////////////////////////////
// n_dupe_ph     n_arrays_cycles
// Compute t     nber of cylces to duplicate the pending phantom arrays for
// the segmer     dary.
// Returns FAL     failed.
//////////////////     ///////////////////////////////////////
BOOLEAN mul..._emporal::n_dupe_phantom_arrays_cycles(int *n_cycles_ptr){
  int           i;
  instance*inst;
  int           wire;
```

```
zone*       wire_zone;
long        wire_zone_repeats;
BOOLEANstatus = TRUE;
int              dupe_ph_array_cycles;
int              n_cycles = 0;
for (i=0; i<this_zone->pending_size(); i++){
      // get zone for next wire
      inst = this_zone->pending_instance(i);
      wire = this_zone->pending_wire(i);
      wire_zone = inst->get_zone_for_wire(wire);
      // also need repeat count for this zone
      if (wire_zone != (zone*) NULL)
            wire_zone_repeats = wire_zone->get_repeat_count();
      else
            wire_zone_repeats = 1;
      // if repeat count is 1, then we don't need an array, so skip
      // remaining code
      if (wire_zone_repeats > 1)
      {
            // create array of parameter expressions
            expr* param_vals[1];
            param_vals[0] = new expr(wire_zone_repeats);// repeat count is param
            // always recompute dupe_ph_array cycles because its variable
            if ((dupe_ph_array_cycles = get_block_duration(DUPE_PHANT_ARR_STR,
                              1, param_vals)) == UNKNOWN_DURATION)
                  return FALSE;
      }
      else        // if not repeated, no phantom array
            dupe_ph_array_cycles = 0;
      // tally count of cycles
      n_cycles += dupe_ph_array_cycles;}
  *n_cycles_ptr = n_cycles;
  return TRUE;}
//////////////////////////////////////////////////////////////////////
// make_to_phantom_arr_copys
// Make a "to phantom arr copy" block for each pending input which has
// one specified in the "bottom_of_last_copy" array.
// This block copies from a wire to its corresponding phantom array, which
// acts as a buffer for wire value to the wire phantom.
```

```
// Two types of blocks can be created: normal array copy blocks and
// downsampling array copy blocks, depending on bottom_of_last_copy.
// Called after phantom wires and phantom arrays have been created.
// Returns FALSE if failed.
//////////////////////////////////////////////////////////////////////
BOOLEAN multi_temporal::make_to_phantom_arr_copys(
        int_array* bottom_of_last_copy, zone* before_zone, zone* after_zone){
    int             i;
    int             copy_status;
    int             status = TRUE;
    NOREF(before_zone); NOREF(after_zone);
    for (i=0; i<this_zone->pending_size(); i++){
        copy_status = (*bottom_of_last_copy)[i];
        switch (copy_status)
        {
            case NORMAL_COPY_TO_ARRAY:
                status = make_normal_to_phantom_arr_copy(i);
                break;
            case ORDINARY_COPY_TO_WIRE:
            // if no array involved, just make ordinary phantom wire copy
                status = make_phantom_copy_block(i);
                break;
            default:
            // else do nothing
                break;
        }
        if (!status)
            break;}
    return status;}
//////////////////////////////////////////////////////////////////////
// n_to_phantom_arr_copy_cycles
// Computes the cycles for all to phantom array copies.
// Returns FALSE if error.
//////////////////////////////////////////////////////////////////////
BOOLEAN multi_temporal::n_to_phantom_arr_copy_cycles(
                int_array* bottom_of_last_copy, int *n_cycles_ptr){
    int             i;
    int             copy_status;
    int             status = TRUE;
```

```
static int to_phant_arr_cycles = UNKNOWN_DURATION;
static intcopy_cycles = UNKNOWN_DURATION;
int                 n_cycles = 0;
// if we don't have # of cycles for blocks, look them up
if (to_phant_arr_cycles == UNKNOWN_DURATION)
      if ((to_phant_arr_cycles = get_block_duration(TO_PHANT_ARR_STR))
             == UNKNOWN_DURATION)
            return FALSE;
if (copy_cycles == UNKNOWN_DURATION)
      if ((copy_cycles = get_block_duration(COPY_STR))
             == UNKNOWN_DURATION)
            return FALSE;
for (i=0; i<this_zone->pending_size(); i++){
      copy_status = (*bottom_of_last_copy)[i];
      switch (copy_status)
      {
            case NORMAL_COPY_TO_ARRAY:
                  n_cycles += to_phant_arr_cycles;
                  break;
            default:
            // if no array involved, just ordinary phantom wire copy
                  n_cycles += copy_cycles;
                  break;
      }}
*n_cycles_ptr = n_cycles;
return TRUE;}
////////////////////////////////////////////////////////////////////////////
// make_from_phantom_arr_copys
// Make a "from phantom arr copy" block for each pending input which has
// one specified in the "top_of_next_copy" array.
// This block copies from a phantom array to its corresponding wire, which
// acts as a buffer for wire value to the wire.
// Two types of blocks can be created: normal array copy blocks and
// upsampling array copy blocks, depending on top_of_next_copy.
// Called after phantom wires and phantom arrays have been created.
// Returns FALSE if failed.
////////////////////////////////////////////////////////////////////////////
BOOLEAN multi_temporal::make_from_phantom_arr_copys(
            int_array* top_of_next_copy, zone* before_zone, zone* after_zone){
```

```
int              i;
int              copy_status;
int              status = TRUE;
for (i=0; i<this_zone->pending_size(); i++){
    copy_status = (*top_of_next_copy)[i];
    switch (copy_status)
    {
        case NORMAL_COPY_FROM_ARRAY:
            status = make_normal_from_phantom_arr_copy(i);
            break;
        case UPSAMPLE_COPY_FROM_ARRAY:
            status = make_upsample_from_phantom_arr_copy(i, before_zone,
                    after_zone);
            break;
        case DOWNSAMPLE_COPY_FROM_ARRAY:
            status = make_downsample_from_phantom_arr_copy(i, before_zone,
                    after_zone);
            break;
        default:
            break;
    }
    if (!status)
        break;}
return status;}
////////////////////////////////////////////////////////////////////
// n_from_phantom_arr_copy_cycles
// Computes the cycles for all from phantom array copies.
// Returns FALSE if error.
////////////////////////////////////////////////////////////////////
BOOLEAN multi_temporal::n_from_phantom_arr_copy_cycles(
                int_array* top_of_next_copy, int *n_cycles_ptr){
    int              i;
    int              copy_status;
    int              status = TRUE;
    static int fr_phant_arr_cycles = UNKNOWN_DURATION;
    static intup_fr_ph_arr_cycles = UNKNOWN_DURATION;
    int              n_cycles = 0;
    // if we don't have # of cycles for blocks, look them up
    if (fr_phant_arr_cycles == UNKNOWN_DURATION)
```

```
        if ((fr_phant_arr_cycles = get_block_duration(FR_PHANT_ARR_STR))
             == UNKNOWN_DURATION)
            return FALSE;
    if (up_fr_ph_arr_cycles == UNKNOWN_DURATION)
        if ((up_fr_ph_arr_cycles = get_block_duration(UP_FR_PH_ARR_STR))
             == UNKNOWN_DURATION)
            return FALSE;
    for (i=0; i<this_zone->pending_size(); i++){
        copy_status = (*top_of_next_copy)[i];
        switch (copy_status)
        {
            case NORMAL_COPY_FROM_ARRAY:
                n_cycles += fr_phant_arr_cycles;
                break;
            case UPSAMPLE_COPY_FROM_ARRAY:
                n_cycles += up_fr_ph_arr_cycles;
                break;
            default:
                break;
        }}
    *n_cycles_ptr = n_cycles;
    return TRUE;}
////////////////////////////////////////////////////////////////////////
// make_normal_to_phantom_arr_copy
// Make a normal "to_phant_arr" block
// This block copies from a wire to its corresponding phantom array, which
// acts as a buffer for wire value to the wire phantom.
// Called after phantom wires and phantom arrays have been created.
// Returns FALSE if failed.
////////////////////////////////////////////////////////////////////////
BOOLEAN multi_temporal::make_normal_to_phantom_arr_copy(int i){
    int             level;
//  int             from_wire_level;
    instance*inst;
    int             wire;
    int             wire_index;
    int             index;
    int             to_ptr_index;
    instance*to_ptr_instance;
```

```
string*     name;
string*     ptr_name;
instance*inst_ptr;
BOOLEANstatus = TRUE;
inst = this_zone->pending_instance(i);
wire = this_zone->pending_wire(i);
// get level for last phantom for this wire
index = inst->get_last_phantom(wire , &level);

// we actually want previous wire level, which is for prev. segment
level--;
index = inst->get_phantom(wire , level);
// synthesize name of "to" array ptr by getting name of phantom wire
name = inst->prototype()->storage_name_at_index(index);
// prepend a special prefix to create name for "to" array pointer
ptr_name = new string(TO_ARRAY_PTR_STR);
*ptr_name = *ptr_name + *name;
if (!inst->find_wire_name(ptr_name, &to_ptr_index, &to_ptr_instance)){
      this_inst->out_error("ZON065", cerr, FALSE);
      cerr << "Unable to find the 'to' array pointer '"
            << *ptr_name << "'.\n";
      return FALSE;}
// now set I/O for source of copy, which is previous phantom wire
// get previous phantom level for wire, which is one before current
// get wire index for original wire
wire_index = inst->get_phantom(wire , 0);
// create array of I/O wire indices
// which is same wire, but different phantom levels, as set below
int ios[2];
ios[0] = to_ptr_index;
ios[1] = wire_index;
// create array of I/O wire instance pointers
instance* io_insts[2];
io_insts[0] = to_ptr_instance;
io_insts[1] = inst;
if (!make_phantom_inst_with_args(TO_PHANT_ARR_STR, 2, ios,
                        io_insts, 0, (expr**) NULL, &inst_ptr))
      return FALSE;
// set phantom level for "from" wires
```

```
	inst_ptr->set_phantom_io_level(1, level);
	return TRUE;}
////////////////////////////////////////////////////////////////////////
// make_downsample_from_phantom_arr_copy
// Make a downsampled "from_phant_arr" block
// This block copies from a wire to its corresponding phantom array, which
// acts as a buffer for wire value to the wire phantom.
// It downsamples from the block rate to the lower rate in the
// next time zone.
// Called after phantom wires and phantom arrays have been created.
// Returns FALSE if failed.
////////////////////////////////////////////////////////////////////////
BOOLEAN multi_temporal::make_downsample_from_phantom_arr_copy(int i,
					zone* before_zone, zone* after_zone){
	int		level;
	instance*inst;
	int		wire;
	int		index;
	int		array_index;
	int		fr_ptr_index;
	instance*fr_ptr_instance;
	string*	name;
	string*	ptr_name;
	instance*inst_ptr;
	BOOLEANstatus = TRUE;
	long	decim_factor;
	long	before_segment_repeats;
	long	after_segment_repeats;
	zone*	wire_zone;

	NOREF(before_zone);
#ifdef DEBUG
	string*	hier_name;
	hier_name = this_inst->hier_name_string();
	cerr << "making downsample from phantom arr copy in " << *hier_name << "\n";
#endif
	inst = this_zone->pending_instance(i);
	wire = this_zone->pending_wire(i);
	wire_zone = inst->get_zone_for_wire(wire);
```

```
// get zone repeat counts to compute downsampling factor
before_segment_repeats = wire_zone->get_repeat_count();
after_segment_repeats = after_zone->get_repeat_count();
decim_factor = before_segment_repeats/after_segment_repeats;
if ( ((before_segment_repeats % after_segment_repeats) != 0)
      || (decim_factor <= 1) ){
      this_inst->out_error("ZON071", cerr, FALSE);
      cerr << "Illegal downsampling rates: "
            << before_segment_repeats << " downsampled to "
            << after_segment_repeats << "'.\n";
      return FALSE;}
// get level for last phantom for this wire
index = inst->get_last_phantom(wire , &level);
// synthesize name of "from" array ptr by getting name of phantom wire
// get level for last phantom for the corresponding array
if (!level_for_latest_array(i, &level))
      return FALSE;
array_index = inst->get_phantom(wire, level);
name = inst->prototype()->storage_name_at_index(array_index);
// prepend a special prefix to create name for "from" array pointer
ptr_name = new string(FR_ARRAY_PTR_STR);
*ptr_name = *ptr_name + *name;
if (!inst->find_wire_name(ptr_name, &fr_ptr_index, &fr_ptr_instance)){
      this_inst->out_error("ZON072", cerr, FALSE);
      cerr << "Unable to find the 'from' array pointer '"
            << *ptr_name << "'.\n";
      return FALSE;}
// create array of I/O wire indices
int ios[2];
ios[0] = fr_ptr_index;
ios[1] = index;
// create array of I/O wire instance pointers
instance* io_insts[2];
io_insts[0] = fr_ptr_instance;
io_insts[1] = inst;
// create array of parameter expressions
expr* param_vals[1];
param_vals[0] = new expr(decim_factor);
if (!make_phantom_inst_with_args(DOWN_FR_PH_ARR_STR, 2, ios,
```

```
io_insts, 1, param_vals, &inst_ptr))
        return FALSE;
    return TRUE;}
////////////////////////////////////////////////////////////////////////
// make_normal_from_phantom_arr_copy
// Make a normal "from_phant_arr" block
// This block copies from a phantom array to its corresponding wire.
// Called after phantom wires and phantom arrays have been created.
// Returns FALSE if failed.
////////////////////////////////////////////////////////////////////////
BOOLEAN multi_temporal::make_normal_from_phantom_arr_copy(int i){
    int             level;
    instance*inst;
    int             wire;
    int             index;
    int             array_index;
    int             fr_ptr_index;
    instance*fr_ptr_instance;
    string*     name;
    string*     ptr_name;
    instance*inst_ptr;
    BOOLEANstatus = TRUE;
    inst = this_zone->pending_instance(i);
    wire = this_zone->pending_wire(i);
    // get level for last phantom for this wire
    index = inst->get_last_phantom(wire , &level);
    // synthesize name of "from" array ptr by getting name of phantom wire
    // get level for last phantom for the corresponding array
    if (!level_for_latest_array(i, &level))
        return FALSE;
    array_index = inst->get_phantom(wire, level);
    name = inst->prototype()->storage_name_at_index(array_index);
    // prepend a special prefix to create name for "from" array pointer
    ptr_name = new string(FR_ARRAY_PTR_STR);
    *ptr_name = *ptr_name + *name;
    if (!inst->find_wire_name(ptr_name, &fr_ptr_index, &fr_ptr_instance)){
        this_inst->out_error("ZON066", cerr, FALSE);
        cerr << "Unable to find the 'from' array pointer '"
            << *ptr_name << "'.\n";
```

```
        return FALSE;}
    // now set I/O for dest of copy, which is last phantom wire
    // create array of I/O wire indices
    int ios[2];
    ios[0] = fr_ptr_index;
    ios[1] = index;
    // create array of I/O wire instance pointers
    instance* io_insts[2];
    io_insts[0] = fr_ptr_instance;
    io_insts[1] = inst;
    if (!make_phantom_inst_with_args(FR_PHANT_ARR_STR, 2, ios,
                        io_insts, 0, (expr**) NULL, &inst_ptr))
        return FALSE;
    return TRUE;}
//////////////////////////////////////////////////////////////////////
// make_upsample_from_phantom_arr_copy
// Make an upsampled "from_phant_arr" block
// This block copies from a phantom array to its corresponding wire.
// Called after phantom wires and phantom arrays have been created.
// Returns FALSE if failed.
//////////////////////////////////////////////////////////////////////
BOOLEAN multi_temporal::make_upsample_from_phantom_arr_copy(int i,
                zone* before_zone, zone* after_zone){
    int             level;
    instance*inst;
    int             wire;
    int             index;
    int             array_index;
    int             fr_ptr_index;
    instance*fr_ptr_instance;
    string*     name;
    string*     ptr_name;
    instance*inst_ptr;
    BOOLEANstatus = TRUE;
    long        interp_factor;
    long        before_segment_repeats;
    long        after_segment_repeats;
    zone*       wire_zone;
```

```
NOREF(before_zone);

inst = this_zone->pending_instance(i);
wire = this_zone->pending_wire(i);
wire_zone = inst->get_zone_for_wire(wire);
// get zone repeat counts to compute upsampling factor
before_segment_repeats = wire_zone->get_repeat_count();
after_segment_repeats = after_zone->get_repeat_count();
interp_factor = after_segment_repeats/before_segment_repeats;
if ( ((after_segment_repeats % before_segment_repeats) != 0)
      || (interp_factor <= 1) ){
      this_inst->out_error("ZON073", cerr, FALSE);
      cerr << "Illegal upsampling rates: "
            << before_segment_repeats << " upsampled to "
            << after_segment_repeats << "'.\n";
      return FALSE;}
// get level for last phantom for this wire
index = inst->get_last_phantom(wire , &level);

// synthesize name of "from" array ptr by getting name of phantom wire
// get level for last phantom for the corresponding array
if (!level_for_latest_array(i, &level))
      return FALSE;
array_index = inst->get_phantom(wire, level);
name = inst->prototype()->storage_name_at_index(array_index);
// prepend a special prefix to create name for "from" array pointer
ptr_name = new string(FR_ARRAY_PTR_STR);
*ptr_name = *ptr_name + *name;
if (!inst->find_wire_name(ptr_name, &fr_ptr_index, &fr_ptr_instance)){
      this_inst->out_error("ZON074", cerr, FALSE);
      cerr << "Unable to find the 'from' array pointer '"
            << *ptr_name << "'.\n";
      return FALSE;}
// create array of I/O wire indices
int ios[2];
ios[0] = fr_ptr_index;
ios[1] = index;
// create array of I/O wire instance pointers
instance* io_insts[2];
```

```
    io_insts[0] = fr_ptr_instance;
    io_insts[1] = inst;
    // create array of parameter expressions
    expr* param_vals[1];
    param_vals[0] = new expr(interp_factor);
    if (!make_phantom_inst_with_args(UP_FR_PH_ARR_STR, 2, ios,
                                     io_insts, 1, param_vals, &inst_ptr))
        return FALSE;
    return TRUE;}
////////////////////////////////////////////////////////////////////
// make_to_phant_arr_ptr_resets
// Make a "to phantom arr ptr reset" block for each pending input which has
// one specified in the "bottom_of_last_copy" array.
// This block initializes the pointer to be used for "to phantom array copies".
// The init block is inserted at the previous segment.
// Called after phantom wires and phantom arrays have been created.
// Returns FALSE if failed.
////////////////////////////////////////////////////////////////////
BOOLEAN multi_temporal::make_to_phant_arr_ptr_resets(
                                     int_array* bottom_of_last_copy){
    int             i;
    int             copy_status;
    int             status = TRUE;
    for (i=0; i<this_zone->pending_size(); i++){
        copy_status = (*bottom_of_last_copy)[i];
        switch (copy_status)
        {
            case NORMAL_COPY_TO_ARRAY:
                status = make_to_phant_arr_ptr_reset(i);
                break;
            default:
                break;
        }
        if (!status)
            break;}
    return status;}
////////////////////////////////////////////////////////////////////
// n_to_phant_arr_ptr_resets
// Return the number of "to phantom arr ptr reset" block cycles required.
```

```
// Returns FALSE if failed.
/////////////////////////////////////////////////////////////////////
BOOLEAN multi_temporal::n_to_phant_arr_ptr_resets(
                                    int_array* bottom_of_last_copy, int *n_cycles_ptr){
    int             i;
    int             copy_status;
    int             status = TRUE;
    static int to_phant_arr_reset_cycles = UNKNOWN_DURATION;
    int             n_cycles = 0;
    // if we don't have # of cycles for blocks, look them up
    if (to_phant_arr_reset_cycles == UNKNOWN_DURATION)
        if ((to_phant_arr_reset_cycles = get_block_duration(INIT_ARR_PTR_STR))
            == UNKNOWN_DURATION)
        return FALSE;
    for (i=0; i<this_zone->pending_size(); i++){
        copy_status = (*bottom_of_last_copy)[i];
        switch (copy_status)
        {
            case NORMAL_COPY_TO_ARRAY:
                n_cycles += to_phant_arr_reset_cycles;
                break;
            default:
                break;
        }
        if (!status)
            break;}
    *n_cycles_ptr = n_cycles;
    return status;}
/////////////////////////////////////////////////////////////////////
// make_to_phant_arr_ptr_reset
// Make a "to phantom arr ptr reset" block.
// This block initializes the pointer to be used for "to phantom array copies".
// The init block is inserted at the previous segment.
// Called after phantom wires and phantom arrays have been created.
// Returns FALSE if failed.
/////////////////////////////////////////////////////////////////////
BOOLEAN multi_temporal::make_to_phant_arr_ptr_reset(int i){
    instance*inst;
    int             wire;
```

```
int             level;
string*     name;
string*     ptr_name;
instance*wire_instance;
int             wire_index;
int             index;
string*     arr_name;
int             arr_size;
instance*arr_instance;
int             arr_index;
instance*insert_instance;// parent instance in which to insert
int             insert_index;// index in parent for insert
instance*current_instance;
zone*       wire_zone;
instance*child_inst;
int             place;
int             status = TRUE;
inst = this_zone->pending_instance(i);
wire = this_zone->pending_wire(i);
// get zone for this wire
wire_zone = inst->get_zone_for_wire(wire);
// repeat count for this zone gives us the array size
arr_size = (int) wire_zone->get_repeat_count();
// get level for last phantom for this wire
index = inst->get_last_phantom(wire , &level);
// we actually want previous wire level, which is for prev. segment
level--;
index = inst->get_phantom(wire , level);
// synthesize name of "to" array ptr by getting name of phantom wire
name = inst->prototype()->storage_name_at_index(index);
// prepend a special prefix to create name for "to" array pointer
ptr_name = new string(TO_ARRAY_PTR_STR);
*ptr_name = *ptr_name + *name;
// need to get instance of wire (child if parent instance)
// so we can find name of array in parent
child_inst = inst->get_child(wire);
if (!child_inst->find_wire_name(ptr_name, &wire_index, &wire_instance)){
      this_inst->out_error("ZON063", cerr, FALSE);
      cerr << "Unable to find the 'to' array pointer '"
```

```
                << *ptr_name << "'.\n";
            return FALSE;}
    // make name for array
    arr_name = new string(ARRAY_PREFIX_STR);
    *arr_name = *arr_name + *name;
    // get index and parent instance for array
    if (!child_inst->find_wire_name(arr_name, &arr_index, &arr_instance)){
            this_inst->out_error("ZON064", cerr, FALSE);
            cerr << "Unable to find the array '"
                << *arr_name << "'.\n";
            return FALSE;}
    insert_instance = get_segment_boundary(&insert_index);
    // replace current instance context by context for prev segment boundary
    current_instance = this_inst;
    this_inst = insert_instance;
    place = insert_index - 1;
    // get the child instance index of this position in the sequence
    int child_index = this_inst->get_part_sequence(place);
    // reattach any label attached to this position to the instance index
    // of the new block we are about the create
    this_inst->reattach_phantom_labels(child_index,this_inst->get_n_children());
    // insert a "init_arr_ptr" block in this spot
    status = make_init_arr_ptr_block(arr_size, arr_index, arr_instance,
                                wire_index, wire_instance, place);
    // restore instance context
    this_inst = current_instance;
    return status;}
//////////////////////////////////////////////////////////////////////
// make_fr_phant_arr_ptr_resets
// Make a "from phantom arr ptr reset" block for each pending input which has
// one specified in the "top_of_next_copy" array.
// This block initializes the pointer to be used for "from phantom array
// copies".
// Called after phantom wires and phantom arrays have been created.
// Returns FALSE if failed.
//////////////////////////////////////////////////////////////////////
BOOLEAN multi_temporal::make_fr_phant_arr_ptr_resets(
                                int_array* top_of_next_copy){
    int                 i;
```

```
int             copy_status;
int             status = TRUE;
for (i=0; i<this_zone->pending_size(); i++){
      copy_status = (*top_of_next_copy)[i];
      switch (copy_status)
      {
            case NORMAL_COPY_FROM_ARRAY:
            case UPSAMPLE_COPY_FROM_ARRAY:
            case DOWNSAMPLE_COPY_FROM_ARRAY:
                  status = make_fr_phant_arr_ptr_reset(i);
                  break;
            default:
                  break;
      }
      if (!status)
            break;}
return status;}
//////////////////////////////////////////////////////////////////////
// n_fr_phant_arr_ptr_resets
// Return the number of "from phantom arr ptr reset" block cycles required.
// Returns FALSE if failed.
//////////////////////////////////////////////////////////////////////
BOOLEAN multi_temporal::n_fr_phant_arr_ptr_resets(
                              int_array* top_of_next_copy, int *n_cycles_ptr){
      int             i;
      int             copy_status;
      int             status = TRUE;
      static int fr_phant_arr_reset_cycles = UNKNOWN_DURATION;
      int             n_cycles = 0;
      // if we don't have # of cycles for blocks, look them up
      if (fr_phant_arr_reset_cycles == UNKNOWN_DURATION)
            if ((fr_phant_arr_reset_cycles = get_block_duration(INIT_ARR_PTR_STR))
                  == UNKNOWN_DURATION)
            return FALSE;
      for (i=0; i<this_zone->pending_size(); i++){
            copy_status = (*top_of_next_copy)[i];
            switch (copy_status)
            {
                  case NORMAL_COPY_FROM_ARRAY:
```

```
            case UPSAMPLE_COPY_FROM_ARRAY:
            case DOWNSAMPLE_COPY_FROM_ARRAY:
                  n_cycles += fr_phant_arr_reset_cycles;
                  break;
            default:
                  break;
      }
      if (!status)
            break;}
  *n_cycles_ptr = n_cycles;
  return status;}
////////////////////////////////////////////////////////////////////
// make_fr_phant_arr_ptr_reset
// Make a "from phantom arr ptr reset" block.
// This block initializes the pointer to be used for "from phantom array
// copies".
// Called after phantom wires and phantom arrays have been created.
// Returns FALSE if failed.
////////////////////////////////////////////////////////////////////
BOOLEAN multi_temporal::make_fr_phant_arr_ptr_reset(int i){
  instance*inst;
  int          wire;
  int          level;
  string*    name;
  string*    ptr_name;
  instance*wire_instance;
  int          wire_index;
  int          index;
  string*    arr_name;
  int          arr_size;
  instance*arr_instance;
  int          arr_index;
  zone*      wire_zone;
  instance*child_inst;
  int          status = TRUE;
  inst = this_zone->pending_instance(i);
  wire = this_zone->pending_wire(i);
  // get zone for this wire
  wire_zone = inst->get_zone_for_wire(wire);
```

```
        // repeat count for this zone gives us the array size
        arr_size = (int) wire_zone->get_repeat_count();
        // get level for last phantom for the corresponding array
        if (!level_for_latest_array(i, &level))
                return FALSE;
        index = inst->get_phantom(wire, level);

        // synthesize name of "from" array ptr by getting name of phantom wire
        name = inst->prototype()->storage_name_at_index(index);
        // prepend a special prefix to create name for "from" array pointer
        ptr_name = new string(FR_ARRAY_PTR_STR);
        *ptr_name = *ptr_name + *name;
        // need to get instance of wire (child if parent instance)
        // so we can find name of array in parent
        child_inst = inst->get_child(wire);
        if (!child_inst->find_wire_name(ptr_name, &wire_index, &wire_instance)){
                this_inst->out_error("ZON069", cerr, FALSE);
                cerr << "Unable to find the 'from' array pointer '"
                        << *ptr_name << "'.\n";
                return FALSE;}
        // make name for array
        arr_name = new string(ARRAY_PREFIX_STR);
        *arr_name = *arr_name + *name;
        // get index and parent instance for array
        if (!child_inst->find_wire_name(arr_name, &arr_index, &arr_instance)){
                this_inst->out_error("ZON070", cerr, FALSE);
                cerr << "Unable to find the array '"
                        << *arr_name << "'.\n";
                return FALSE;}
        // insert a "init_arr_ptr" block
        status = make_init_arr_ptr_block(arr_size, arr_index, arr_instance,
                                        wire_index, wire_instance);
        return status;}
/////////////////////////////////////////////////////////////////////
// level_for_latest_array
// The latest array may not be at the same level as its latest wire, so
// this function returns the level for the latest array for a given
// pending input i.
// Returns FALSE if failed.
```

```
////////////////////////////////////////////////////////////////////
BOOLEANmulti_temporal::level_for_latest_array(int i, int* level_ptr){
    BOOLEANfound;
    instance*arr_instance;
    int         arr_index;
    string*     arr_name;
    instance*inst;
    int         wire;
    int         level;
    string*     name;
    int         index;
    instance*child_inst;
    found = FALSE;
    arr_name = new string("");
    // get the instance and wire for this pending wire
    inst = this_zone->pending_instance(i);
    wire = this_zone->pending_wire(i);
    // get level for last phantom for this wire
    index = inst->get_last_phantom(wire, &level);

    // need to get instance of wire (child if parent instance)
    // so we can find name of array in parent
    child_inst = inst->get_child(wire);
    // find the last phantom array available for this wire
    do{
        index = inst->get_phantom(wire, level);
        // synthesize name of "from" array ptr by getting name of phantom wire
        name = inst->prototype()->storage_name_at_index(index);
        // make name for array
        *arr_name = ARRAY_PREFIX_STR;
        *arr_name = *arr_name + *name;
        // see if this array exists
        if (child_inst->find_wire_name(arr_name, &arr_index, &arr_instance))
            found = TRUE;
        else
            level--;}
    while ((!found) && level >= 0);
    delete arr_name;
    if (found){
```

```
        *level_ptr = level;
        return TRUE;}
    else{
        this_inst->out_error("ZON080", cerr, FALSE);
        cerr << "Unable to find the array '"
            << *arr_name << "'.\n";
        return FALSE;
    }}
//////////////////////////////////////////////////////////////////////
// level_for_previous_array
// The previous level array may not be at the same level as its wire, so
// this function returns the level for the previous level array for a given
// pending input i.
// Returns FALSE if failed.
//////////////////////////////////////////////////////////////////////
BOOLEANmulti_temporal::level_for_previous_array(int i, int level,
                                    int* level_ptr){
    BOOLEANfound;
    instance*arr_instance;
    int             arr_index;
    string*     arr_name;
    instance*inst;
    int             wire;
    string*     name;
    int             index;
    instance*child_inst;
    found = FALSE;
    arr_name = new string("");
    // get the instance and wire for this pending wire
    inst = this_zone->pending_instance(i);
    wire = this_zone->pending_wire(i);
    // need to get instance of wire (child if parent instance)
    // so we can find name of array in parent
    child_inst = inst->get_child(wire);
    // use previous level
    level--;
    // find the last phantom array available for this wire
    do{
        index = inst->get_phantom(wire, level);
```

```
		// synthesize name of "from" array ptr by getting name of phantom wire
		name = inst->prototype()->storage_name_at_index(index);
		// make name for array
		*arr_name = ARRAY_PREFIX_STR;
		*arr_name = *arr_name + *name;
		// see if this array exists
		if (child_inst->find_wire_name(arr_name, &arr_index, &arr_instance))
			found = TRUE;
		else
			level--;}
	while ((!found) && level >= 0);
	delete arr_name;
	if (found){
		*level_ptr = level;
		return TRUE;}
	else{
		this_inst->out_error("ZON081", cerr, FALSE);
		cerr << "Unable to find the array '"
			<< *arr_name << "'.\n";
		return FALSE;
	}}
/////////////////////////////////////////////////////////////////////
// make_loop_top
// Create the loop top label and insert it for the current repeated code
// portion.
// Returns FALSE if failed.
/////////////////////////////////////////////////////////////////////
BOOLEAN multi_temporal::make_loop_top(){
	string*		local_label_name;// local (non-hierarchical) loop label name
	int			index;
	static inti=0;
	// create the label for the top of repeat loop
		local_label_name = new string(LOOP_RPT_STR);
		*local_label_name = *local_label_name + this_zone->get_zone_chars()
			+ int_to_c_string(i);
		i++;
	// tie it to the next child instance
	if (!this_inst->add_phantom_label_name(local_label_name,
				this_inst->get_n_children())){
```

```
        this_inst->out_error("ZON032", cerr, TRUE);
        cerr << "The phantom label '" << *loop_label_name
              << "' already exist!\n";
        return FALSE;}
    if (!make_phantom_inst_with_args("_dummy", 0, (int*) NULL,
                              (instance**) NULL, 0, (expr**) NULL))
        return FALSE;
    // insert a make probe reset block at the top of every loop
    if (!make_pr_reset_block())
        return FALSE;
    // now need to save global (hierarchical) name for label so we can reference
    // it from anywhere
    // loop up its index
    if (!this_inst->prototype()->label_name_to_index(local_label_name, &index)){
        this_inst->out_error("ZON075", cerr, TRUE);
        cerr << "Could not find newly added label '" << *local_label_name
              << "'!\n";
        return FALSE;}
    // and derive full name from this
    loop_label_name = this_inst->prototype()->hier_label_name_at_index(index);
    return TRUE;}
////////////////////////////////////////////////////////////////////////////////
// make_loop_bottom
// Make a block for the bottom of the current repeated code portion.
// Returns FALSE if failed.
////////////////////////////////////////////////////////////////////////////////
BOOLEAN multi_temporal::make_loop_bottom(zone* loop_zone){
    long        segment_repeats;

    segment_repeats = loop_zone->get_repeat_count();
    // only make loop if segment repeats itself
    if (segment_repeats > 1){
        // create array of I/O wire indices
        int ios[1];
        ios[0] = loop_counter_index;// only I/O is current loop counter
        // create array of I/O wire instance pointers
        instance* io_insts[1];
        io_insts[0] = loop_counter_instance;
        // create array of parameter expressions
```

```
        expr* param_vals[1];
        param_vals[0] = new expr(loop_label_name);// set label name as param
#ifdef DEBUG
        cerr << "inserting loop bottom for counter "
             << *last_loop_counter_name
             << "\n";
#endif
        return make_phantom_inst_with_args(LOOP_BOTTOM_STR, 1, ios,
                                io_insts, 1, param_vals);}
    else return TRUE;}
//////////////////////////////////////////////////////////////////////////
// save_segment_boundary
// Save latest segment boundary for possible later pointer initialization.
//////////////////////////////////////////////////////////////////////////
void multi_temporal::save_segment_boundary(instance* inst, int index){
    seg_bound_inst = inst;
    seg_bound_ind = index;}
//////////////////////////////////////////////////////////////////////////
// get_segment_boundary
//////////////////////////////////////////////////////////////////////////
instance* multi_temporal::get_segment_boundary(int* index_ptr){
    *index_ptr = seg_bound_ind;
    return seg_bound_inst;}
//////////////////////////////////////////////////////////////////////////
// out_sample_period_msg
// Output a msg giving the cycles in one or more sample periods.
// Overloaded from temporal class to output cycles in N sample periods
// for decimation/interpolation.
//////////////////////////////////////////////////////////////////////////
void multi_temporal::out_sample_period_msg(ostream& out){
    if (this_zone->get_repeat_count() > 1){
        out << this_zone->get_repeat_count()
            << " sample periods for a decimation loop provide "
            << this_zone->max_cycles()
            << " cycles";}
    else{
        out << "One sample period provides "
            << this_zone->max_cycles()
            << " cycles";
```

```
	}}
////////////////////////////////////////////////////////////////////
// add_block_duration
// Evaluate and add the new block's duration to the zone.
// Overloaded from base class, this checks for possible requirement for
// poll block.
// Returns FALSE if failed.
////////////////////////////////////////////////////////////////////
BOOLEAN multi_temporal::add_block_duration(string* prototype_name,
					instance*& inst_ptr){
	BOOLEANstatus = TRUE;
	instance*current_inst;
	int		duration;
	BOOLEANsample_rate_ok = FALSE;
	// evaluate contents so block duration will get filled in
	if (inst_ptr->compute_contents()){
		this_inst->out_error("ZON905", cerr, FALSE);
		cerr << "INTERNAL ERROR -- Phantom block '"
			<< *prototype_name
			<< "' doesn't have valid contents.\n";
		status = FALSE;
	}
	// add this block's duration to the zone
	// save our current instance and set the pass-in instance
	current_inst = this_inst;
	this_inst = inst_ptr;
	if (!add_this_block_duration(&duration)){
		// could not add the block, but before we declare an error, see if
		// we merely have to add a poll block
		// first call to check for new segment required
		if (!test_block_duration(duration) || this_zone->boundary_forced())
			// new segment, so its a valid error
			;
		else if (poll_block_required(duration))
		{
			// just need to add poll block
			this_inst = current_inst;
			status = add_poll_block();
			this_inst = inst_ptr;
```

```
            if (status)
                  status = add_this_block_duration(&duration);
            sample_rate_ok = TRUE;
        }
        if (!sample_rate_ok)
        {
            this_inst->out_error("ZON053", cerr, FALSE);
            cerr << "The sample rate is too high, with only "
                  << this_zone->max_cycles()
                  << " cycles in a sample period!\n"
             << "Could not add a required phantom block ("
                  << *prototype_name
                  << ").\n";
            status = FALSE;
        }}
    // restore our instance
    this_inst = current_inst;
    return status;}
// zone2.cxx
// functions for zone class
// T. Montlick
// 1/29/90
// source code control:
static char SccsID[] = "@(#)zone2b.cxx1.56 10/7/91";
#ifndef ZONE_DEF
#include "zone.hxx"
#endif
// zone_schedule class
////////////////////////////////////////////////////////////////////////
// zone_schedule::zone_schedule
// Constructor.
////////////////////////////////////////////////////////////////////////
zone_schedule::zone_schedule(){
    master_zone = (zone*) NULL;
    n_zones = 0;}
////////////////////////////////////////////////////////////////////////
// zone_schedule::~zone_schedule
// Destructor.
////////////////////////////////////////////////////////////////////////
```

```
zone_schedule::~zone_schedule()
{}
////////////////////////////////////////////////////////////////////
// find_connected_zones
// Starting from the master zone, which must have been set, find all connecting
// zones and record their zone pointers.
////////////////////////////////////////////////////////////////////
void zone_schedule::find_connected_zones(){
    zone*       z;
    zone*       z_next;
    int             i, j;
    if (master_zone != NULL){
        zone_ptrs[0] = master_zone;
        n_zones = 1;
        for (i=0; i<n_zones; i++)
        {
            z = zone_ptrs[i];
            for (j=0; j<z->n_next_zones(); j++)
            {
                z_next = z->next_zone(j);
                // if next zone not already present, add it
                if (zone_ptrs.find(z_next) < 0)
                {
                        zone_ptrs[n_zones] = z_next;
                        n_zones++;
                }
            }
        }
    }}
////////////////////////////////////////////////////////////////////
// compute_sample_periods
// Based on the relative sample rates, compute relative sample periods.
////////////////////////////////////////////////////////////////////
void zone_schedule::compute_sample_periods(){
    int             i, j;
    long        base_period = 1;
    long        rel_base;
    zone*       z;
    double      rel_period = 1.0;
```

```
for (i=0; i<n_zones; i++){
	z = zone_ptrs[i];
	// get relative sample period w/respect to original sample period
	z->original_zone(&rel_period);
	// if rel period is < 1, then we must increase base period
	if (rel_period < 1.0)
	{
		rel_base = round(base_period / rel_period);
		base_period = base_period * rel_base;
		// go back and adjust previous periods by new base
		for (j=0; j< i; j++)
			periods[j] = periods[j] * rel_base;
	}
	// Set this zone's period, adjusted by base
	// (make sure to round off is upward to the next integer,
	// since PC doesn't always do multiplication acurately).
	periods[i] = round(rel_period * base_period);
}	}
//////////////////////////////////////////////////////////////////////
// set_scheduler_connects
// Tell the scheduler about all our zone's connections.
//////////////////////////////////////////////////////////////////////
BOOLEAN zone_schedule::set_scheduler_connections(){
	zone*	z;
	zone*	z_next;
	int		i, j;
	for (i=0; i<n_zones; i++){
		z = zone_ptrs[i];
		for (j=0; j<z->n_next_zones(); j++)
		{
			z_next = z->next_zone(j);
			// get task number from zone pointer and add connection
			if (!the_scheduler.add_connection(i, zone_ptrs.find(z_next)))
			{
				out_err_header("ZSC001");
				cerr << "Zone " << *z->get_zone_name() << " and zone "
					<< *z_next->get_zone_name()
					<< " have incompatible rates.\n";
				return FALSE;
```

```
		}
	}}
    return TRUE;}
//////////////////////////////////////////////////////////////////////
// compute_schedule
// This function is passed the master zone in an interconnected set if
// decimated/interpolated zones. It finds these connecting zones and,
// based on their sample rates, computes the temporal partitioning
// schedule for them, which is the number of times each should be fired.
//////////////////////////////////////////////////////////////////////
BOOLEAN zone_schedule::compute_schedule(zone* first_zone){
#define MINESCULE_DURATION0.000001
    int         i;
    // record the master zone for scheduling
    master_zone = first_zone;
    // find all the sub-zones derived from this master zone
    find_connected_zones();
    // compute the relative sample period for each zone
    compute_sample_periods();
    // set 0 headroom in the scheduler to force temporal partitioning
    the_scheduler.set_headroom(0.0);
    // add sample periods, giving an insignificant duration since in
    // pure temporal partitioning we don't need to determine gsp
    // boundaries
    for (i=0; i<n_zones; i++)
        the_scheduler.add_sample_period_and_duration(periods[i],
                                MINESCULE_DURATION);
    // pass the scheduler info on which zone connects to which
    if (!set_scheduler_connections())
        return FALSE;
    // finally, compute the scheduler periods
    the_scheduler.compute_periods();
    return TRUE;}
// zones class
//////////////////////////////////////////////////////////////////////
// zones::zones
// Constructor.
//////////////////////////////////////////////////////////////////////
zones::zones(){
```

```
    gpio_reg_value = 0;
    first_sub_zone = 0;}
/////////////////////////////////////////////////////////////////
// zones::~zones
// Destructor.
/////////////////////////////////////////////////////////////////
zones::~zones()
{}
/////////////////////////////////////////////////////////////////
// add_new_zone
// Add a new time zone with the given name.
/////////////////////////////////////////////////////////////////
zone* zones::add_new_zone(string* name, BOOLEAN make_sub_zone){
    int         i;
    i = n_including_sub_zones();
    if (make_sub_zone)
        timezones[i] = new sub_zone(i, this);
    else
        timezones[i] = new zone(i, this);
    timezones[i]->set_zone_name(name);
    // if not a sub-zone (added at end), then set this # as less
    // than 1st sub-zone #
    if (!make_sub_zone)
        first_sub_zone = i+1;
    return timezones[i];}
/////////////////////////////////////////////////////////////////
// create_and_partition_zones
// Find time zones and do temporal partitioning.
// If no errors, returns 0.
// If error, returns a value of ERROR_STATUS.
// If no inputs for partitioning, returns a value of NO_INPUTS.
/////////////////////////////////////////////////////////////////
int    zones::create_and_partition_zones(int* n_zones_ptr, int_array* n_gspn_ptr,
                                         double* exact_gsps_ptr){
    int         status;
    if (status = create_time_zones(n_zones_ptr))
        return status;
    if (status = compute_zone_scheduler_repeats())
        return status;
```

```
	if (status = partition_created_time_zones(n_gspn_ptr, exact_gsps_ptr))
		return status;
	if (status = initialize_port_registers())
		return status;
	return 0;}
////////////////////////////////////////////////////////////////////////
// compute_zone_scheduler_repeats
// For each master zone (zone with derived interpolated or decimated sub-zones)
// run the scheduler to determine the number of temporal partitioning repeats
// for the zone.
// If no errors, returns 0.
////////////////////////////////////////////////////////////////////////
int	zones::compute_zone_scheduler_repeats(){
	int		i, j;
	int		n_zones;
	zone*zone_ptr;
	long	firings;
	// scan all master zones
	for (i=0; i<timezones.size(); i++){
		if (timezones[i]->is_master_zone())
		{
			// create a temporary zone_schedule object to compute the
			// temporal partitioning schedule
			zone_schedulethe_z_sched;
			the_z_sched.compute_schedule(timezones[i]);
			n_zones = the_z_sched.get_n_zones();
			for (j=0; j<n_zones; j++)
			{
				// get # of zone firings in schedule and set in each zone
				firings =
					the_z_sched.get_task_firings_and_zone(j, &zone_ptr);
				zone_ptr->set_repeat_count(firings);
				// adjust cycles for zone segment by repeat count
				zone_ptr->set_max_cycles( firings * zone_ptr->max_cycles() );
			}
		}}
	return 0;}
////////////////////////////////////////////////////////////////////////
// create_time_zones
```

```
// Find and create all time zones (including decimated and interpolated), but
// don't do any temporal partitioning.
// If no errors, returns 0.
// If error, returns a value of ERROR_STATUS.
// If no inputs for partitioning, returns a value of NO_INPUTS.
////////////////////////////////////////////////////////////////////
int	zones::create_time_zones(int* n_zones_ptr){
	int		i;
	int		status = 0;
	int		n_inputs = 0;
	// create the initial (non-decimated or interpolated) time zones
	if (!identify_zones(user_top_instance, &n_inputs))
		return ERROR_STATUS;
	// Evaluate input info for each zone.
	// This includes determining the sample rate for each input zone, which is
	// required to compute rates for any decimated or interpolated zones.
	for (i=0; i<n_zones(); i++){
		if (status = timezones[i]->process_zone_inputs())
			return status;}
	// label wires with these zones
	// (this function also generates decimated/interpolated sub-zones)
	if (!user_top_instance->set_wire_zones())
		return ERROR_STATUS;
	// label instances connected to the wires
	// (this function also collapses supposedly ordinary but non-triggered
	// zones with decimated/interpolated sub-zones)
	if (!user_top_instance->set_instance_zones(NO_TIME_ZONE))
		return ERROR_STATUS;
	// scan for leftover non-triggered zones
	for (i=0; i<n_zones(); i++){
		if ( timezones[i]->zone_mask() == 0L
				&& !timezones[i]->is_user_triggered() )
		{
			user_top_instance->out_error("ZON012", cerr, FALSE);
			cerr << "No trigger source for timezone '"
				<< *get_zone_name(i)
				<< "'.\n";
			status = ERROR_STATUS;
			return status;
```

```
            }
            // also check for rate never set
            if ( timezones[i]->get_zone_rate() == 0.0 )
            {
                user_top_instance->out_error("ZON088", cerr, FALSE);
                cerr << "You never specified a rate for timezone '"
                     << *get_zone_name(i)
                     << "'.\n";
                status = ERROR_STATUS;
                return status;
            }}
        // Evaluate output info for each zone. We must do this after zones
        // have been labeled for outputs or we don't know which output belongs
        // to which zone.
        // Make sure to include sub-zones, because outputs may be in these
        // rather than original zones derived from inputs
        for (i=0; i<n_including_sub_zones(); i++){
            if (status = timezones[i]->process_zone_outputs())
                return status;}
        // return the final number of time zones
        *n_zones_ptr = n_zones();
        return 0;}
//////////////////////////////////////////////////////////////////////
// partition_created_time_zones
// Do temporal partitioning.
// Called after time zones have been created.
// If no errors, returns 0.
// If error, returns a value of ERROR_STATUS.
// If no inputs for partitioning, returns a value of NO_INPUTS.
//////////////////////////////////////////////////////////////////////
int     zones::partition_created_time_zones(int_array* n_gspn_ptr,
                                     double* exact_gsps_ptr){
        int                          i;
        int                          status = 0;
        for (i=0; i<n_zones(); i++){
            if (timezones[i]->do_temporal_partition())
                return ERROR_STATUS;
            else
                (*n_gspn_ptr)[i] = timezones[i]->get_gsp_count(&exact_gsps_ptr[i]);}
```

```
if (n_zones() > 0){
    if (!make_probe_fifo())
        return ERROR_STATUS;
    if (!init_idle_gsps())
        return ERROR_STATUS;}
return 0;}
//////////////////////////////////////////////////////////////////////
// make_probe_fifo
// Create the fifo for the probing D/A converter.
//////////////////////////////////////////////////////////////////////
BOOLEAN zones::make_probe_fifo(){
    string*     name;
    BOOLEANstatus = TRUE;
    long        fifo_size;
    expr*       fifo_size_expr;
    int             fifo_wire;
    block*      proto_ptr;
    int             dummy;
    instance*this_inst;
    long        depth = 1;
    long        temp;
    int             i;
    // build the fifo name
    name = new string(PROBE_FIFO_STR);

    // fifo depth is max of zone repeat counts
    for (i=0; i<timezones.size(); i++){
        temp = timezones[i]->get_repeat_count();
        if (temp > depth)
            depth = temp;}
    // make a size expression for the fifo, including fudge factor
    fifo_size = compute_probe_fifo_size(PROBE_FIFO_BUF_LEN*depth);
    fifo_size_expr = new expr(fifo_size);
    // get ptr to our child, which is the user's top level block
    this_inst = top_instance->get_child(users_top_block_index);
    // add this fifo to our instance
    status = this_inst->add_phantom_storage_name(name, fifo_size_expr,
                                &fifo_wire, 'f');
    if (!status){
```

```
        this_inst->out_error("ZON050", cerr, FALSE);
        cerr << "Tried to create a second fifo named '"
              << *name << "'!\n";}
    // also add fifo size as symbol
    proto_ptr = this_inst->prototype();
    name = new string(PROBE_FIFO_LEN_STR);
    if (status)
        status = proto_ptr->add_symbol_name(name, &dummy);
    fifo_size_expr = new expr((long) fifo_size);
    if (status)
        status = proto_ptr->add_expression_name(name, fifo_size_expr);
    if (!status){
        this_inst->out_error("ZON051", cerr, FALSE);
        cerr << "Tried to create a second fifo size named '"
              << *name << "'!\n";}
    return status;}
//////////////////////////////////////////////////////////////////////
// compute_fifo_size
// Compute fifo size from depth.
//////////////////////////////////////////////////////////////////////
long compute_fifo_size(long depth){
    // fifo size is 2X depth (no fudge factor required for ordinary fifo)
    return (depth*2);}
//////////////////////////////////////////////////////////////////////
// compute_probe_fifo_size
// Compute probe fifo size from depth.
//////////////////////////////////////////////////////////////////////
long compute_probe_fifo_size(long depth){
    // fifo size is 2X depth, plus Keith's fudge factor
    return (depth*2 + FIFO_SIZE_FUDGE);}
//////////////////////////////////////////////////////////////////////
// init_idle_gsps
// Set the unused gsps to just loop.
//////////////////////////////////////////////////////////////////////
BOOLEAN zones::init_idle_gsps(){
    int             i;
    string*         label;
    instance*       child;
    BOOLEAN         status = TRUE;
```

```
instance*   this_inst;
string*         flag_string = new string("");
// push top instance context on stack
top_instance->push_context();
// get ptr to our child, which is the user's top level block
this_inst = top_instance->get_child(users_top_block_index);
// save current block context and set instance info in block
this_inst->push_context();
// create a temporal object for this instance and zone
temporal this_temporal(timezones[0], this_inst, flag_string);
// generate benign code for the rest of the GSPs
for (i=gsp_allocator->current_gsp(); i<=n_gsps; i++){
      // create the label
      label = new string(GSP_START_STR);
      *label = *label + int_to_c_string(i);
      // attach label to next instance in sequence
      if (!this_inst->add_phantom_label_name(label,
                              this_inst->get_n_children()))
      {
            this_inst->out_error("ZON035", cerr, TRUE);
            cerr << "Phantom label '" << *label
                  << "' already exist!\n";
            status = FALSE;
            break;
      }
      // create the code, which is just a jump to oneself
      if (!this_temporal.make_jump_block(label))
      {
            status = FALSE;
            break;
      }
      // set block as an init block
            child = this_inst->get_child(this_inst->get_n_children()-1);
      child->set_init();}
// restore previous block context
this_inst->pop_context();
return status;}
//////////////////////////////////////////////////////////////////////
// initialize_port_registers
```

```
// Called after time zones have been created and fifos info has been
// initialized.
// If no errors, returns 0.
// If error, returns a value of ERROR_STATUS.
// If no inputs for partitioning, returns a value of NO_INPUTS.
/////////////////////////////////////////////////////////////////////
int   zones::initialize_port_registers(){
      int                           i;
      expr*         value_expr;
      string*       name;
      for (i=0; i<n_including_sub_zones(); i++){
            // create initialization for ports
            if (!timezones[i]->init_port_registers())
                  return ERROR_STATUS;}
      // set the initial value for gpio register which has been accumulated
      // in this class' gpio_reg_value variable
      value_expr = new expr(gpio_reg_value);
      name = new string(GPIO_REGISTER);
      if (n_including_sub_zones() > 0) // make sure we have at least 1 zone!{
            if (!timezones[0]->init_hardware_register(name, value_expr))
                  return ERROR_STATUS;}
      return 0;}
/////////////////////////////////////////////////////////////////////
// initialize_all_fifo_info
// Called if not automatically partitioned, this routine initializes
// all fifo info for the zone.
// If no errors, returns 0.
/////////////////////////////////////////////////////////////////////
int   zones::initialize_all_fifo_info(){
      int                           i;
      zone*         the_zone;
      string*       flag_string = new string("");
      for (i=0; i<n_including_sub_zones(); i++){
            the_zone = timezones[i];
            // create a temporal object to handle fifo initialization
            {
                  temporal the_temporal(the_zone, user_top_instance, flag_string);
                  if (!the_temporal.add_input_fifo_info(1))
                        return ERROR_STATUS;
```

```
            if (!the_temporal.add_output_fifo_info())
                  return ERROR_STATUS;
        }}
    return 0;}
/////////////////////////////////////////////////////////////////////
// identify_zones
// Find the input blocks to the design, and allocate a timezone for
// each unique zone name. Also mark the zone in the input block
// instance.
// The function will also create sub-zones for interpolated/decimated blocks.
// Called with a pointer to the top instance, it recursively calls itself.
// If no errors, returns TRUE.
/////////////////////////////////////////////////////////////////////
BOOLEAN zones::identify_zones(instance* this_inst, int* n_ptr){
    BOOLEANstatus = TRUE;
    expr*       name_expr;
    expr*       rate_expr;
    string*     name;
    zone*       zone_ptr;
    int               i;
    int               which_child;
    instance*child;
    block*      our_proto;
    // save current block context and set instance info in block
    this_inst->push_context();
    our_proto = this_inst->prototype();
    if (our_proto->is_sproc_input()){
          // found an inputs, so add to caller's tally
          (*n_ptr)++;
          // make sure we can get timezone for it
          if (!our_proto->get_timezone(&name_expr, &rate_expr))
          {
                this_inst->out_error("ZON060", cerr, FALSE);
                cerr << "This signal source does not have a "
                      << "timezone name.\n";
                status = FALSE;
          }
//        // make sure this is a top level input
//        if (status)
```

```
//          {
//                if (!this_inst->parent()->is_top_level())
//                {
//                      this_inst->out_error("ZON161", cerr, FALSE);
//                      cerr << "Design inputs in other than top level cells are not "
//                                  << "supported.\n";
//                      status = FALSE;
//                }
//          }
            // evaluate the timezone name
            if (status)
            {
                  if (translate_zone_name(name_expr, this_inst, &name))
                  {
                        // name now has a zone name
                        // if its new, allocate a new zone
                        zone_ptr = add_zone_if_not_present(name);
                        // mark the zone in our instance
                        this_inst->add_zone(zone_ptr);
                        // also make sure ancestors have zone, in case we're not
                        // at top level!
                        this_inst->add_zone_in_ancestors(zone_ptr);
                  }
                  else
                  {
                        this_inst->out_error("ZON086", cerr, TRUE);
                        cerr << "Timezone does not have a valid name.\n";
                        status = FALSE;
                  }
            }}
      // recursively call all our children
      for (i=0; i<this_inst->get_n_children(); i++){
            // get next child in sequence
            which_child = this_inst->get_sequence(i);
            child = this_inst->get_child(which_child);
            // call child
            if (!(status = identify_zones(child, n_ptr)))
                  break;}
      // make sure we really found some inputs for the top level
```

```
        if (status){
                if (this_inst->is_top_level() && ((*n_ptr) == 0) )
                {
                        if (this_inst->prototype()->is_autosequence())
                        {
                                this_inst->out_error("ZON061", cerr, FALSE);
                                cerr << "Top level block has no inputs, so we cannot "
                                                << "partition.\n";
                                status = FALSE;
                        }
                }}
        // restore previous block context
        this_inst->pop_context();
        return status;}
/////////////////////////////////////////////////////////////////////////
// add_zone_if_not_present
// If zone name not present among zones, create a new zone.
// Returns a pointer to the zone, old or new.
/////////////////////////////////////////////////////////////////////////
zone* zones::add_zone_if_not_present(string* name){
        BOOLEANfound_name;
        int                     j;
        zone*           zone_ptr;
        found_name = FALSE;
        for (j=0; j<n_zones(); j++){
                if (*(timezones[j]->get_zone_name()) == *name)
                {
                        found_name = TRUE;
                        zone_ptr = timezones[j];
                }}
        if (!found_name)
        // new timezone, so allocate it and set name for zone
        zone_ptr = add_new_zone(name, FALSE);
        return zone_ptr;}
/////////////////////////////////////////////////////////////////////////
// make_sub_zone
// Create a sub-zone decimated or interpolated from another zone.
// Passed the original zone ptr, the interpolation/decimation ratio, and
// a flag as to whether interpolating or decimating.
```

```
// Returns the ptr of the newly created time zone.
//////////////////////////////////////////////////////////////////////
zone* zones::make_sub_zone(zone* in_zone_ptr, long ratio, BOOLEAN decimating){
	char*	ratio_str;
	string*	name;
	zone*	new_zone_ptr;
	double	rel_sample_rate;
	long	trigger_mask;
	int		trigger_decim_factor;
	zone*	orig_zone;
	// get a C string for the ratio number
	ratio_str = int_to_c_string((int) ratio);
	// create a name from the original zone name of the form xxxx_dnnn for
	// decimation or xxxx_innn for interpolation, which nnn is the
	// decimation or interpolation ratio
	name = new string("");
	*name = *name + *in_zone_ptr->get_zone_name();
	if (decimating)
		*name = *name + "_d";
	else
		*name = *name + "_i";
	*name = *name + ratio_str;
	// add the new sub-zone to the set of zones
	new_zone_ptr = add_new_zone(name, TRUE);
	// record decimation/interpolation info for this sub-zone
	((sub_zone*) new_zone_ptr)->
			set_sub_zone(in_zone_ptr, ratio, decimating);
	// also set the mask and decimation info for probing wires in this zone
	// but do so only if not interpolated with respect the the original
	// zone
	orig_zone = new_zone_ptr->original_zone(&rel_sample_rate);
	if (rel_sample_rate <= 1.0){
		// make sure decimating by an integer factor
		trigger_decim_factor = (int) round(1.0/rel_sample_rate);
		trigger_mask = in_zone_ptr->zone_mask();
		new_zone_ptr->set_zone_mask(trigger_mask);
		((sub_zone*) new_zone_ptr)->set_decimation(trigger_decim_factor);}
	// mark original zone as a master zone
	orig_zone->set_as_master_zone();
```

```
    return new_zone_ptr;}
////////////////////////////////////////////////////////////////////////
// zones_at_same_rate
// Returns TRUE if the given two zones are at the sample rate, that is,
// if they operate from the same timing source at the same sample rate.
////////////////////////////////////////////////////////////////////////
BOOLEANzones::zones_at_same_rate(zone* zone1, zone* zone2){
    zone*orig_zone_1;
    zone*orig_zone_2;
    doublezone_1_fraction;
    doublezone_2_fraction;
    // trace zones back to its origin, computing decimation/interpolation
    // factors
    orig_zone_1 = zone1->original_zone(&zone_1_fraction);
    orig_zone_2 = zone2->original_zone(&zone_2_fraction);
    // both must be equal to be at the same rate
    return (orig_zone_1 == orig_zone_2
        && zone_1_fraction == zone_2_fraction );}
////////////////////////////////////////////////////////////////////////
// later_zone
// Returns TRUE if the first zone was created later than the second zone.
// Later created zones have a higher array index.
////////////////////////////////////////////////////////////////////////
BOOLEANzones::later_zone(zone* zone1, zone* zone2){
    int         index1, index2;
    index1 = timezones.find(zone1);
    index2 = timezones.find(zone2);
    return (index1 > index2);}
////////////////////////////////////////////////////////////////////////
// try_to_collapse_zones
// See if one zone has no trigger and the other zone is a sub-zone.
// If so, collapse the non-triggered zone into the sub-zone.
// Returns FALSE if unable to collapse zones.
////////////////////////////////////////////////////////////////////////
BOOLEANzones::try_to_collapse_zones(zone* z1, zone* z2){
    zone*temp;
    if (z2->zone_mask() == 0L){
        // swap zones so that z1 can get potentially collapsed
        temp = z1;
```

```
        z1 = z2;
        z2 = temp;}
    if (z1->zone_mask() == 0L){
        // z1 is collapsible because it is non-triggered
        // is z2 a sub-zone?
        if (z2->is_sub_zone())
        {
            // z1 can be collapsed into z2
            // give derived zone same name as collaped zone
            z2->override_zone_name(z1->get_zone_name());
            // change all references to collaped zone
            top_instance->change_zone(z1, z2);
            // remove collapsed zone
            timezones.remove(timezones.find(z1));
            first_sub_zone--;
            return TRUE;
        }}
    return FALSE;}
////////////////////////////////////////////////////////////////////////
// gsps::gsps
// Constructor.
////////////////////////////////////////////////////////////////////////
gsps::gsps(){
    next_gsp = 1;}
////////////////////////////////////////////////////////////////////////
// gsps::~gsps
// Destructor.
////////////////////////////////////////////////////////////////////////
gsps::~gsps()
{}
// bref_arr.cxx
// derived class for block_ref array
// Terry Montlick
// 10/10/89
/* source code control: */
static char SccsID[] = "@(#)zone_arr.cxx1.56 10/7/91";
#include "bref_arr.hxx"
// zone_arr.hxx
// header for derived zone array class
```

```
// T. Montlick
// 3/14/90
/* source code control: @(#)zone_arr.hxx1.56 10/7/91 */
#define ZONE_ARRAY_DEF
#ifndef ARRAY_DEF
#include "array.hxx"
#endif
class zone;
class zone_array : public array{
public:
    zone*&operator [] (int i)
                        { return (zone*&) array::operator[] (i); }
    int         find(zone* ptr) { return array::find(ptr); }
    void        append(zone* ptr){ array::append(ptr); }
    zone_array&operator+(zone_array& a)
                        { return (zone_array&) array::operator+((array&) a); }
    zone_array&operator+=(zone_array& a) {a = *this + a; return *this; }
};
```

We claim:

1. Apparatus for providing program code for a real time signal processor means having a memory means, and for concurrently generating memory access code for use by a host processor means so that the host processor means can change the contents of the memory of the signal processor means, wherein object code for the signal processor means and the host processor means are separately compiled by a respective signal processor compiler and a host processor compiler, and the signal processor means and the host processor means each include means for interfacing with each other, said apparatus comprising:

means for describing a block diagram representing a processing task for the signal processor means with a plurality of high level signal processing functional block means and a plurality of connections between said high level signal processing functional block means, each functional block means having a name, at least one of said functional block means having a parameter, and at least one of said functional block means having an indication of being accessible by the host processor means;

signal processor cell library means containing a plurality of source code blocks, each source code block representing at least a portion of a corresponding high level signal processing functional block means, at least one of said source code blocks containing a named variable for receiving a value for said parameter; and signal processor compiler means coupled to said means for describing and to said signal processor cell library means, for analyzing said block diagrm, for obtaining code blocks from said signal processor cell library means needed to implement said block diagram, for associating said named variable with said parameter, and for compiling said code blocks to provide program code and data code for the memory means of the signal processing means, and a correspondence table associating at least one signal processor means memory location with said named cell variable, said correspondence table being for the host processor means such that said correspondence table of a translation thereof is used by the host processor compiler in the compiling of the object code for the host processor means, and the object code for the host processor means causes the host processor means to access the memory location of the signal processor means via the interface means of the host processor means and the signal processor means so that the host processor means can change said parameter value, wherein said program code and data code will cause the signal processor means to implement said processing task for the signal processor means, with said program code controlling the functioning of the real time signal processor means, and said data code providing initial parameter values for the signal processor means and initial sample data values for memory locations in the memory means of the signal processor means, and wherein said parameter values represent values of parameters of said functional block means.

2. Apparatus according to claim 1, wherein:

said means for describing a block diagram comprises a high-level computer screen entry system means for choosing, entry, parameterization, and connection of a plurality of said functional block means.

3. Apparatus according to claim 2, wherein:

said means for describing a block diagram further comprises a text editor means.

4. Apparatus according to claim 1, wherein:

said means for describing a block diagram comprises means for representing a processing task for the host processor means with a plurality of high level host processor functional block means and a plurality of connections between said plurality of high level host processor functional block means, each host processor functional block means having a name, wherein said means for describing further comprises means for distinguishing between portions of said block diagram intended for compilation by the signal processor means and portions of said block diagram intended for compilation by the host processor means.

5. Apparatus according to claim 1, further comprising:

means for generating from said program code and said data code signal processor means boot code suitable for compilation by the compiler of the host processor means, wherein the host processor means can use said boot code to boot up the signal processor means.

6. Apparatus according to claim 1, further comprising:

correspondence table translation means for translating said correspondence table generated by the signal processor compiler means into code suitable for compilation by the compiler for the host processor means.

7. Apparatus according to claim 5, further comprising:

correspondence table translation means for translating said correspondence table generated by said signal processor compiler means into code suitable for compilation by the compiler for the host processor means.

8. Apparatus according to claim 1, further comprising:

the signal processor means.

9. Apparatus according to claim 8, wherein:

said signal processor means receives real time data signals from means other than the host processor and external said apparatus, and said signal processor means processes said real time data signals thereby generating processed real time data signals which are available external to said signal processor means, and said signal processor means comprises at least one real time data signal receiving means for receiving said real time data signals, each real time data signal receiving means including means for writing data to desired first address locations in a multiported central memory unit in a repeated sequential fashion;

said multiported central memory unit coupled to said at least one real time data signal receiving means, said multiported central memory unit for storing said received data signals and said data code and comprising the memory means;

a digital processor means coupled to said multiported central memory unit, for obtaining said real time data signals from said first addresses of said multiported central memory unit, for processing said real time data signals and thereby generating processed data signals, and for sending said processed data signals for storage in second address locations of said multiported central memory unit;

at least one data output means coupled to said multiported central memory unit, for obtaining in a repeated sequential fashion said processed data signals from said second address locations of said multiported central memory unit, and for making said processed data signals available external to said signal processor means as real time processed data signals, said memory means further including program memory means coupled to said digital processor means for storing said program code, wherein said digital processor means processes said real time data signals according to said program code, wherein substantially all signal data received by said signal processor means flows through said multiported central memory unit, and wherein said real time data signal receiving means and said output means handle data flow into and out of said signal processor means and permit said digital processor means to function substantially free of data input interrupts.

10. Apparatus according to claim 9, wherein:

said signal processor means further comprises a parallel host port coupled to said program memory means and to said multiported central memory means, wherein said host port comprises the interface to the host processor means.

11. Apparatus according to claim 8, further comprising:

the host processor means.

12. Apparatus according to claim 1, further comprising:

the host processor means.

13. Apparatus according to claim 12 wherein:

said host processor means comprises a microprocessor.

14. Method for providing program code for a real time signal processor means having a memory means, and for concurrently generating memory access code for use by a host processor means so that said host processor means can change the contents of the memory of said signal processor means, wherein object code for said signal processor means and said host processor means are separately compiled, and said signal processor means and said host processor means each include means for interfacing with each other, said method comprising:

describing and representing a processing task for said signal processor means in a block diagram with a plurality of high level signal processing functional block means and a plurality of connections between said high level signal processing functional block means, each functional block means having a name, at least one of said functional block means having a parameter, and at least one of said functional block means having an indication of being accessible by the host processor means;

providing a signal processor cell library means containing a plurality of source code blocks, each source code block representing at least a portion of a corresponding high level signal processing functional block means, at least one of said source code blocks containing a named variable for receiving a value for said parameter; and analyzing said block digram in order to obtain needed code blocks from said signal processor cell library means for implementing said block diagram;

associating said named variable with said parameter, and compiling said code blocks to provide program code and data code for the memory means of the signal processing means, and a correspondence table associating at least one signal processor memory location with said named cell variable, providing said correspondence table or a translation thereof for compilation as object code for said host processor means, wherein said correspondence table permits said host processor means to change a parameter value stored as a variable in said memory of said signal processor means.

15. A method according to claim 14, further comprising:

providing said program code and data code to said signal processor, thereby implementing said tasks for said signal processor means, with said program code controlling how said signal processor means functions, and said data code providing initial parameter values for the signal processor means and initial sample data values for memory locations in the memory means of said signal processor means.

16. A method according to claim 14, further comprising:

generating from said program code and said data code signal processor means boot code suitable for compilation by said compiler of said host processor or for direct storage in said host processor.

17. A method according to claim 14, further comprising:

compiling said correspondence table or a translation thereof in said host processor compiler;

18. A method according to claim 16, further comprising:

compiling said correspondence table or a translation thereof in said host processor compiler;

storing said boot code in said host processor; and booting up said signal processor by providing said boot code stored in said host processor to said signal processor.

19. An apparatus for coupling a host processor and a programmable signal processor having a memory for storing a program and data so that the host processor has intelligent access to the signal processor memory, said apparatus comprising:

a) high level programming means for defining signal processor functions, said programming means including means for symbolically indicating host processor access to signal processor functions;

b) signal processor program compiling means coupled to said programming means for generating signal processor program code which causes said signal processor to implement said signal processor functions and for generating memory access code for the host processor, said memory access code including a correspondence table correlating symbolic indications indicated in said programming means with memory addresses in the signal processor memory;

c) host processor compiling means for generating host processor program code including reference to at least one of said memory addresses in said correspondence table, said host processor compiling means including means for receiving at least a portion of said memory access code; and d) interface means coupling the host processor and the signal processor memory, wherein said host processor program code causes the host processor to access the signal processor memory according to said symbolic indications indicated in said programming means.

20. Apparatus according to claim 19, wherein:

said host processor access to the signal processor memory is selected from the group consisting of reading a parameter value, writing a parameter value, reading a data value, writing a data value, reading signal processor program code and writing signal processor program code.

21. Apparatus according to claim 19, wherein:

said symbolic indications of host processor access are selected from the group consisting of reading a parameter value, writing a parameter value, reading a data value, writing a data value, reading signal processor program code, and writing signal processor program code.

22. An apparatus according to claim 19, further comprising:

the host processor.

23. An apparatus according to claim 19, further comprising:

the programmable signal processor.

24. An apparatus according to claim 19, further comprising:

the host processor; and the programmable signal processor.

25. Apparatus for defining access of a host processor which is interfaced with a programmable signal processor to permit the host processor to partially control the programmable signal processor, where the object codes of the host processor and the signal processor are separately compiled, and the programmable signal processor has a memory for storing the signal processor object code and data, said apparatus comprising:

a) high level programming means for defining processing tasks for the signal processor, said programming means including means for indicating host processor access to at least a portion of one of said processing tasks; and b) signal processor program compiling means coupled to said high level programing means for generating the signal processor object code which implements said processing tasks, and for generating a memory address list for the host processor, said memory address list indicating memory addresses corresponding to the host processor access to said tasks indicated by said high level programming means, said memory address list being read or received by a host processor compiling means.

26. Apparatus according to claim 25, wherein:

said processing tasks include at least one function having a parameter and said host processor access includes supplying a value for said parameter.

27. Apparatus according to claim 25, wherein:

said processing tasks include at least one function having an input and said host processor access includes supplying a value for said input.

28. Apparatus according to claim 26, wherein:

said processing tasks include at least one function having an output and said host processor access includes reading said output and supplying said value of said parameter based on a value of said output.

29. Apparatus according to claim 27, wherein:

said processing tasks include at least one function having an output and said host processor access includes reading said output and supplying said value of said input based on a value of said output.

30. An apparatus according to claim 25, further comprising:

the host processor.

31. An apparatus according to claim 25, further comprising:

the programmable signal processor.

32. An apparatus according to claim 25, further comprising:

the host processor; and the programmable signal processor.

* * * * *